US011289668B2

(12) United States Patent
Kwak et al.

(10) Patent No.: US 11,289,668 B2
(45) Date of Patent: Mar. 29, 2022

(54) ORGANIC LIGHT-EMITTING DEVICE

(71) Applicant: Samsung Electronics Co., Ltd., Suwon-si (KR)

(72) Inventors: Seungyeon Kwak, Suwon-si (KR); Hyun Koo, Seongnam-si (KR); Sangdong Kim, Seoul (KR); Jiwhan Kim, Seoul (KR); Sunghun Lee, Hwaseong-si (KR); Hyeonho Choi, Seoul (KR); Seokhwan Hong, Seoul (KR); Kyuyoung Hwang, Anyang-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 693 days.

(21) Appl. No.: 16/120,932

(22) Filed: Sep. 4, 2018

(65) Prior Publication Data

US 2019/0074468 A1 Mar. 7, 2019

(30) Foreign Application Priority Data

Sep. 5, 2017 (KR) ........................ 10-2017-0113561
Sep. 4, 2018 (KR) ........................ 10-2018-0105124

(51) Int. Cl.

*H01L 51/50* (2006.01)
*C09K 11/06* (2006.01)
*H01L 51/00* (2006.01)

(52) U.S. Cl.

CPC .......... *H01L 51/5028* (2013.01); *C09K 11/06* (2013.01); *H01L 51/0059* (2013.01); *H01L 51/502* (2013.01); *H01L 51/5016* (2013.01); *H01L 51/5064* (2013.01); *H01L 51/0053* (2013.01); *H01L 51/0054* (2013.01);
(Continued)

(58) Field of Classification Search

None
See application file for complete search history.

(56) References Cited

U.S. PATENT DOCUMENTS

| | | | |
|---|---|---|---|
| 8,815,411 | B2 | 8/2014 | Forrest et al. |
| 2013/0200357 | A1 | 8/2013 | Ludemann et al. |

(Continued)

FOREIGN PATENT DOCUMENTS

| | | | |
|---|---|---|---|
| JP | 2012167028 | A | 9/2012 |
| JP | 2016119487 | A | 6/2016 |

(Continued)

OTHER PUBLICATIONS

Dandan Song et al. "Causes of efficiency roll-off in phosphorescent organic light emitting devices: Triplet-triplet annihilation versus triplet-polaron quenching", Applied Physics Letters 2010, 97(24), 243304 (3 pp.).
H. Van Eersel et al. "Monte Carlo study of efficiency roll-off of phosphorescent organic light-emitting diodes: Evidence for dominant role of triplet-polaron quenching", Applied Physics Letters 2014, 105(14), 143303 (5 pp.).

(Continued)

*Primary Examiner* — Gregory D Clark
(74) *Attorney, Agent, or Firm* — Cantor Colburn LLP

(57) ABSTRACT

An organic light-emitting device including a first electrode, a second electrode facing the first electrode, and an emission layer disposed between the first electrode and the second electrode, wherein the emission layer comprises a host and a dopant, wherein the emission layer emits a phosphorescent light, wherein the dopant is an organometallic compound, and wherein the emission layer satisfies certain parameters described in the specification.

20 Claims, 5 Drawing Sheets

(52) U.S. Cl.
CPC ...... *H01L 51/0067* (2013.01); *H01L 51/0072* (2013.01); *H01L 51/0087* (2013.01); *H01L 2251/5384* (2013.01); *H01L 2251/55* (2013.01)

(56) References Cited

U.S. PATENT DOCUMENTS

| | | | | |
|---|---|---|---|---|
| 2015/0171359 | A1 | 6/2015 | Forrest et al. | |
| 2016/0126472 | A1* | 5/2016 | Oh | C07D 405/04 257/40 |
| 2016/0240800 | A1 | 8/2016 | Ma et al. | |
| 2017/0025630 | A1 | 1/2017 | Seo et al. | |
| 2017/0162802 | A1 | 6/2017 | Weaver et al. | |
| 2018/0013078 | A1* | 1/2018 | Lee | C07F 15/0086 |
| 2018/0159062 | A1 | 6/2018 | Shitagaki et al. | |
| 2018/0233680 | A1 | 8/2018 | Che et al. | |

FOREIGN PATENT DOCUMENTS

| | | | |
|---|---|---|---|
| JP | 2017011275 | A | 1/2017 |
| JP | 2017168803 | A | 9/2017 |
| JP | 2018002722 | A | 1/2018 |
| KR | 2014-0140075 | A | 12/2014 |
| KR | 2015-0070964 | A | 6/2015 |
| KR | 2016-0125140 | A | 10/2016 |
| KR | 1020180033177 | A | 4/2018 |

OTHER PUBLICATIONS

Jason D. A. Lin, et al., "Systematic study of exciton diffusion length in organic semiconductors by six experimental methods", Materials Horizons, 2014, 1(2), 280 (6 pp.).

Sebastian Reineke et al. "Triplet-exciton quenching in organic phosphorescent light-emitting diodes with Ir-based emitters", Physical Review 2007, B 75, 125328 (13 pp.).

Stephen R. Forrest et al. "Excitons and the lifetime of organic semiconductor devices", Philosophical Transactions of the Royal Society A: Mathematical, Physical and Engineering Sciences 2015, 373(2044), Mar. 20, 2014 (7 pp.).

Yifan Zhang et al. "Tenfold increase in the lifetime of blue phosphoresent organic light-emitting diodes", Nature Communications, 2014, 5(1), (7 pp.).

Bin Wang et al. "Strongly phosphorescent platinum(II) complexes supported by tetradentate benzazole-containing ligands", J. Mater. Chem. C., 2015, 3, 8212 (7 pp).

Extended European Search Report issued by the European Patent Office dated Jan. 22, 2019, in the examination of the European Patent Application No. 18192792.2-1211.

Shiu-Lun Lai et al. "High Efficiency White Organic Light-Emitting Devices Incorporating Yellow Phosphorescent Platinum(II) Complex and Composite Blue Host", Adv. Funct. Mater. 2013, 23, 5168 (9 pp).

JP OA dated Jan. 4, 2022 of JP Patent Application No. 2018-166152.

* cited by examiner

ORGANIC LIGHT-EMITTING DEVICE

CROSS-REFERENCE TO RELATED APPLICATION

This application claims priority to Korean Patent Applications Nos. 10-2017-0113561, filed on Sep. 5, 2017 and 10-2018-0105124, filed on Sep. 4, 2018, in the Korean Intellectual Property Office, and all the benefits accruing therefrom under 35 U.S.C. § 119, the content of which is incorporated herein in its entirety by reference.

BACKGROUND

1. Field

The present disclosure relates to an organic light-emitting device.

2. Description of the Related Art

Organic light-emitting devices (OLEDs) are self-emission devices which produce full-color images. In addition, OLEDs have wide viewing angles and exhibit excellent driving voltage and response speed characteristics.

OLEDs include an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

Various types of organic light emitting devices are known. However, there still remains a need in OLEDs having low driving voltage, high efficiency, high brightness, and long lifespan.

SUMMARY

Provided is an organic light-emitting device satisfying certain parameters, and thus having a long lifespan.

Additional aspects will be set forth in part in the description which follows and, in part, will be apparent from the description, or may be learned by practice of the presented embodiments.

According to an aspect of an embodiment, an organic light-emitting device may include a first electrode;

a second electrode facing the first electrode; and an emission layer disposed between the first electrode and the second electrode, wherein the emission layer may include a host and a dopant, the emission layer may emit a phosphorescent light, the dopant may be an organometallic compound, a photoluminescent quantum yield (PLQY) of the dopant may be about 0.8 or greater and about 1.0 or less, a decay time of the dopant may be about 0.1 microseconds or greater and about 2.9 microseconds or less, 0.1 electron volts≤HOMO (dopant)−HOMO (host)≤about 0.4 electron volts, wherein the HOMO (dopant) represents a highest occupied molecular orbital (HOMO) energy level (expressed in electron volts) of the dopant, and the HOMO (host) represents, in a case where the host included in the emission layer includes one type of host, a HOMO energy level (expressed in electron volts) of the one type of host; or in a case where the host included in the emission layer is a mixture of two or more different types of host, a highest HOMO energy level from among HOMO energy levels (expressed in electron volts) of the two or more different types of host, the PLQY of the dopant may be a PLQY of Film 1, the decay time of the dopant may be calculated from a time-resolved photoluminescence (TRPL) spectrum with respect to Film 1, Film 1 is a film having a thickness of 40 nanometers obtained by vacuum-deposition of the host and the dopant included in the emission layer in a weight ratio of 90:10 on a quartz substrate at a vacuum degree of $10^{-7}$ torr.

the HOMO (dopant) may be a negative value measured by using a photoelectron spectrometer in an ambient atmosphere with respect to a film having a thickness of 40 nanometers obtained by vacuum-deposition of 1,4-bis(triphenylsilyl)benzene and the dopant included in the emission layer in a weight ratio of 85:15 on an indium tim oxide (ITO) substrate at a vacuum degree of $10^{-7}$ torr, and the HOMO (host) may be, i) in a case where the host includes one type of host, a negative value measured by using a photoelectron spectrometer in an ambient atmosphere with respect to a film having a thickness of 40 nanometers obtained by vacuum-deposition of the one type of host on an ITO substrate at a vacuum degree of $10^{-7}$ torr; or ii) in a case where the host is a mixture of two or more different types of host, a largest negative value from among negative values measured by using a photoelectron spectrometer in an ambient atmosphere with respect to films having a thickness of 40 nanometers obtained by vacuum-deposition of each of the two or more different types of host on an ITO substrate at a vacuum degree of $10^{-7}$ torr.

According to an aspect of other embodiment, an organic light-emitting device may include:

a first electrode;

a second electrode facing the first electrode;

emission units in the number of m stacked between the first electrode and the second electrode and comprising at least one emission layer; and charge generating layers in the number of m−1 disposed between each two adjacent emission units from among the m emission units, the each m−1 charge generating layers comprising an n-type charge generating layer and a p-type charge generating layer, wherein m is an integer of 2 or greater, a maximum emission wavelength of light emitted from at least one of the emission units in the number of m differs from that of light emitted from at least one of the other emission units, the emission layer comprises a host and a dopant, the emission layer emits a phosphorescent light, the dopant is an organometallic compound, a photoluminescence quantum yield (PLQY) of the dopant is about 0.8 or greater and about 1.0 or less, a decay time of the dopant is about 0.1 microseconds or greater and about 2.9 microseconds or less, 0.1 electron volts≤HOMO (dopant)−HOMO (host)≤about 0.4 electron volts, wherein the HOMO (dopant) represents a highest occupied molecular orbital (HOMO) energy level (expressed in electron volts) of the dopant, and the HOMO (host) represents, in a case where the host comprised in the emission layer comprises one type of host, a HOMO energy level (expressed in electron volts) of the one type of host; or in a case where the host comprised in the emission layer is a mixture of two or more different types of host, a highest HOMO energy level from among HOMO energy levels (expressed in electron volts) of the two or more different types of host, the PLQY of the dopant is a PLQY of Film 1, the decay time of the dopant is calculated from a time-resolved photoluminescence (TRPL) spectrum with respect to Film 1, Film 1 is a film having a thickness of 40 nanometers obtained by vacuum-deposition of the host and the dopant comprised in the emission layer in a weight ratio of 90:10 on a quartz substrate at a vacuum degree of $10^{-7}$ torr, the HOMO (dopant) is a negative value measured by using a photoelectron spectrometer in an ambient atmosphere with respect to a film having a thickness of 40 nanometers obtained by vacuum-deposition of 1,4-bis(triphenylsilyl)benzene and the dopant comprised in the emission layer in a weight ratio of 85:15 on an ITO substrate at a vacuum degree of $10^{-7}$ torr, and the HOMO (host) is, i) in a case where the host comprises one type of host, a negative value measured by using a photoelectron spectrometer in an ambient atmosphere with respect to a film having a thickness of 40 nanometers obtained by vacuum-deposition of the one type of host on an ITO substrate at a vacuum degree of $10^{-7}$ torr; or ii) in a case where the host is a mixture of two or more different types of host, a largest negative value from among negative values measured by using a photoelectron spectrometer in an ambient atmosphere with respect to films having a thickness of 40 nanometers obtained by vacuum-deposition of each of the two or more different types of host on an ITO substrate at a vacuum degree of $10^{-7}$ torr.

According to an aspect of other embodiment, an organic light-emitting device may include:

a first electrode;

a second electrode facing the first electrode; and emission layers in the number of m stacked between the first electrode and the second electrode, wherein m is an integer of 2 or greater, a maximum emission wavelength of light emitted from at least one of the emission layers in the number of m differs from that of light emitted from at least one of the other emission layers, the emission layer comprises a host and a dopant, the emission layer emits a phosphorescent light, the dopant is an organometallic compound, a photoluminescence quantum yield (PLQY) of the dopant is about 0.8 or greater and about 1.0 or less, a decay time of the dopant is about 0.1 microseconds or greater and about 2.9 microseconds or less, 0.1 electron volts≤HOMO (dopant)−HOMO (host)≤about 0.4 electron volts, wherein the HOMO (dopant) represents a highest occupied molecular orbital (HOMO) energy level (expressed in electron volts) of the dopant, and the HOMO (host) represents, in a case where the host comprised in the emission layer comprises one type of host, a HOMO energy level (expressed in electron volts) of the one type of host; or in a case where the host comprised in the emission layer is a mixture of two or more different types of host, a highest HOMO energy level from among HOMO energy levels (expressed in electron volts) of the two or more different types of host, the PLQY of the dopant is a PLQY of Film 1, the decay time of the dopant is calculated from a time-resolved photoluminescence (TRPL) spectrum with respect to Film 1, Film 1 is a film having a thickness of 40 nm obtained by vacuum-deposition of the host and the dopant comprised in the emission layer in a weight ratio of 90:10 on a quartz substrate at a vacuum degree of $10^{-7}$ torr, the HOMO (dopant) is a negative value measured by using a photoelectron spectrometer in an ambient atmosphere with respect to a film having a thickness of 40 nanometers obtained by vacuum-deposition of 1,4-bis(triphenylsilyl)benzene and the dopant comprised in the emission layer in a weight ratio of 85:15 on an ITO substrate at a vacuum degree of $10^{-7}$ torr, and the HOMO (host) is, i) in a case where the host comprises one type of host, a negative value measured by using a photoelectron spectrometer in an ambient atmosphere with respect to a film having a thickness of 40 nanometers obtained by vacuum-deposition of the one type of host on an ITO substrate at a vacuum degree of $10^{-7}$ torr; or ii) in a case where the host is a mixture of two or more different types of host, a largest negative value from among negative values measured by using a photoelectron spectrometer in an ambient atmosphere with respect to films having a thickness of 40 nanometers obtained by vacuum-deposition of each of the two or more different types of host on an ITO substrate at a vacuum degree of $10^{-7}$ torr.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
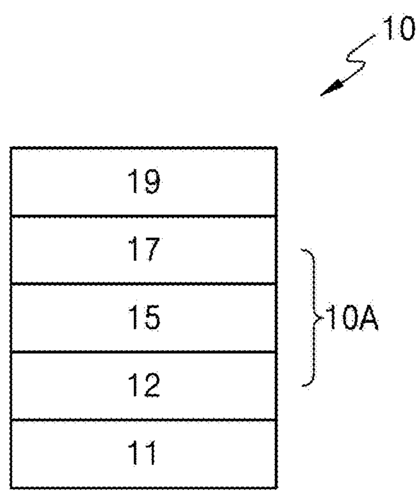
FIG. 1 illustrates a schematic view of an organic light-emitting device 10 according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organic light-emitting device is provided. As shown in FIG. 1, the organic light-emitting device 10 includes a first electrode 11, a second electrode 19 facing the first electrode 11, and an organic layer 10A disposed between the first electrode 11 and the second electrode 19.

In FIG. 1, the organic layer 10A includes an emission layer 15, a hole transport region 12 disposed between the first electrode 11 and an emission layer 15, and an electron transport region 17 disposed between the emission layer 15 and the second electrode 19.

In FIG. 1, a substrate may be additionally placed under the first electrode 11 or above the second electrode 19. The substrate may be a glass substrate or a plastic substrate, each having excellent mechanical strength, thermal stability, transparency, surface smoothness, ease of handling, and water resistance.

First Electrode 11

The first electrode 11 may be formed by depositing or sputtering, onto the substrate, a material for forming the first electrode 11. When the first electrode 11 is an anode, the material for forming the first electrode 11 may be selected from materials with a high work function that facilitate hole injection.

The first electrode 11 may be a reflective electrode, a semi-transmissive electrode, or a transmissive electrode. When the first electrode 11 is a transmissive electrode, a material for forming the first electrode 11 may be selected from indium tin oxide (ITO), indium zinc oxide (IZO), tin oxide ($SnO_2$), zinc oxide (ZnO), and any combinations thereof, but embodiments are not limited thereto. In some embodiments, when the first electrode 11 is a semi-transmissive electrode or a reflective electrode, as a material for forming the first electrode 11, at least one of magnesium (Mg), silver (Ag), aluminum (Al), aluminum-lithium (Al—Li), calcium (Ca), magnesium-indium (Mg—In), magnesium-silver (Mg—Ag), and any combination thereof may be used, but embodiments are not limited thereto.

The first electrode 11 may have a single-layered structure, or a multi-layered structure including two or more layers.

Emission Layer 15

The emission layer 15 may include a host and a dopant.

The emission layer 15 may emit a phosphorescent light. That is, the dopant may emit a phosphorescent light. The emission layer 15 emitting a phosphorescent light is distinct from an emission layer emitting a fluorescent light by including a general fluorescent dopant and/or a thermal activated delayed fluorescence (TADF) dopant.

The dopant may be an organometallic compound.

An emission energy of a maximum emission wavelength of an emission spectrum of the dopant may be about 2.31 electron volts (eV) or greater and about 2.48 eV or less. In some embodiments, an emission energy of a maximum emission wavelength of an emission spectrum of the dopant may be about 2.31 eV or greater and about 2.48 eV or less, about 2.31 eV or greater and about 2.40 eV or less, about 2.31 eV or greater and about 2.38 eV or less, about 2.31 eV or greater and about 2.36 eV or less, about 2.32 eV or greater and about 2.36 eV or less, or about 2.33 eV or greater and about 2.35 eV or less, but embodiments are not limited thereto. The term "maximum emission wavelength" refers to a wavelength at which the emission intensity is the maximum and can also be referred to as "peak emission wavelength".

A photoluminescence quantum yield (PLQY) of the dopant may be about 0.8 or greater and about 1.0 or less. In some embodiments, a PLQY of the dopant may be about 0.9 or greater and about 1.0 or less, about 0.92 or greater and about 1.0 or less, about 0.94 or greater and about 1.0 or less, about 0.95 or greater and about 1.0 or less, about 0.96 or greater and about 1.0 or less, about 0.972 or greater and about 0.995 or less, about 0.974 or greater and about 0.995 or less, about 0.975 or greater and about 1.0 or less, about 0.975 or greater and about 0.995 or less, about 0.975 or greater and about 0.990 or less, about 0.978 or greater and about 0.985 or less, or about 0.978 or greater and about 0.980 or less, but embodiments are not limited thereto.

A decay time of the dopant may be about 0.1 microseconds (μs) or greater and about 2.9 μs or less. In some embodiments, a decay time of the dopant may be about 1.0 μs or greater and about 2.9 μs or less, about 1.5 μs or greater and about 2.9 μs or less, about 1.6 μs or greater and about 2.7 μs or less, about 1.5 μs or greater and about 2.6 μs or less, about 1.7 μs or greater and about 2.5 μs or less, about 1.8 μs or greater and about 2.5 μs or less, or about 2.0 μs or greater and about 2.5 μs or less, but embodiments are not limited thereto.

Figure 2:
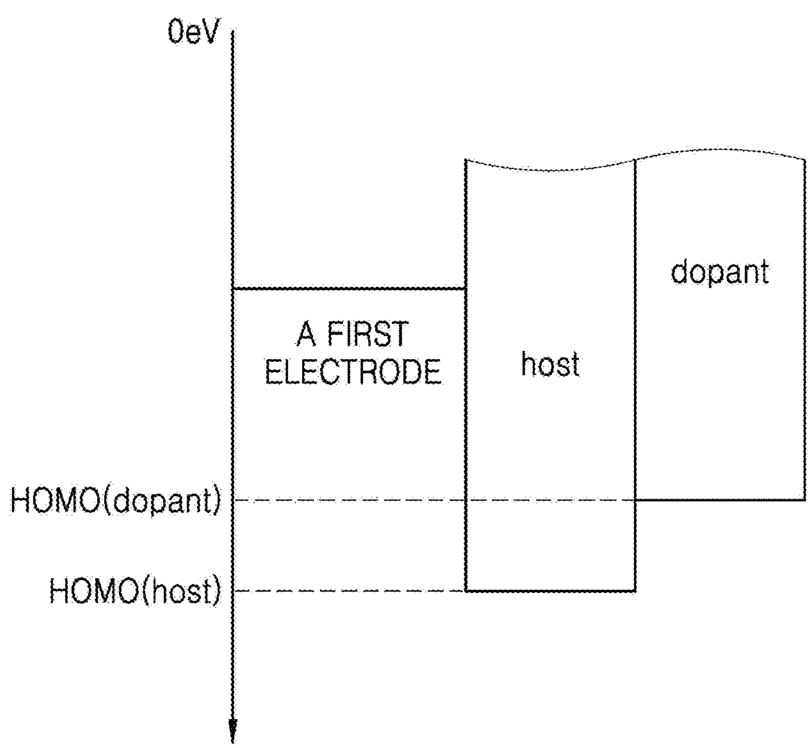
FIG. 2 is a diagram showing an organic light-emitting device according to an embodiment in terms of HOMO (dopant) and HOMO (host)

The host and the dopant included in the emission layer may satisfy about 0.1 eV≤HOMO (dopant)−HOMO (host) ≤about 0.4 eV. The HOMO (dopant) represents a highest occupied molecular orbital (HOMO) energy level (expressed in electron volts) of the dopant. The HOMO (host) represents, in a case where the host included in the emission layer includes one type of host (for example, the host included in the emission layer consists of one type of host), a HOMO energy level (expressed in electron volts) of the one type of host; or in a case where the host included in the emission layer is a mixture of two or more different types of host, a highest HOMO energy level from among HOMO energy levels (expressed in electron volts) of the two or more different types of host. FIG. 2 is a diagram showing the relationship between the HOMO (dopant) and the HOMO (host).

In some embodiments, the host and the dopant included in the emission layer may satisfy about 0.1 eV≤HOMO (dopant)−HOMO (host)≤about 0.3 eV, about 0.1 eV≤HOMO (dopant)−HOMO (host)≤about 0.25 eV, or about 0.15 eV≤HOMO (dopant)−HOMO (host)≤about 0.25 eV, but embodiments are not limited thereto.

In an embodiment, in the emission layer 15, a PLQY of the dopant may be about 0.975 or greater and about 1.0 or less, a decay time of the dopant may be about 2.0 μs or greater and about 2.5 μs or less, and the host and the dopant may satisfy that about 0.15 eV≤HOMO (dopant)−HOMO (host)≤about 0.25 eV, but embodiments are not limited thereto.

In an embodiment, in the emission layer 15, an emission energy of a maximum emission wavelength of an emission spectrum of the dopant may be about 2.31 eV or greater and about 2.36 eV or less, a PLQY of the dopant may be about 0.975 or greater and about 1.0 or less, a decay time of the dopant may be about 2.0 μs or greater and about 2.5 μs or less, and the host and the dopant may satisfy that about 0.15 eV≤HOMO (dopant)−HOMO (host)≤about 0.25 eV, but embodiments are not limited thereto.

The emission energy of a maximum emission wavelength of an emission spectrum of the dopant may be calculated from a maximum emission wavelength of an emission spectrum with respect to Film 1.

The PLQY of the dopant may be a PLQY of Film 1.

The decay time of the dopant may be calculated from a TRPL spectrum with respect to Film 1.

Film 1 is a film having a thickness of 40 nanometers (nm) obtained by vacuum-deposition of the host and the dopant included in the emission layer in a weight ratio of 90:10 on a quartz substrate at a vacuum degree of $10^{-7}$ torr.

The HOMO (dopant) may be a negative value measured by using a photoelectron spectrometer (for example, AC3 available from Riken Keiki Co., Ltd.) in an ambient atmosphere with respect to a film having a thickness of 40 nm obtained by vacuum-deposition of 1,4-bis(triphenylsilyl) benzene and the dopant included in the emission layer in a weight ratio of 85:15 on an ITO substrate at a vacuum degree of $10^{-7}$ torr.

The HOMO (host) may be, i) in a case where the host includes one type of host (for example, the host included in the emission layer consists of one type of host), a negative value measured by using a photoelectron spectrometer in an ambient atmosphere with respect to a film having a thickness of 40 nm obtained by vacuum-deposition of the one type of host on an ITO substrate at a vacuum degree of $10^{-7}$ torr; or ii) in a case where the host is a mixture of two or more different types of host, a largest negative value from among negative values measured by using a photoelectron spectrometer in an ambient atmosphere with respect to films having a thickness of 40 nm obtained by vacuum-deposition of each of the two or more different types of host on an ITO substrate at a vacuum degree of $10^{-7}$ torr.

Evaluation methods of an emission energy of a maximum emission wavelength energy of an emission spectrum of the dopant, a PLQY of the dopant, a decay time of the dopant, HOMO (dopant), and HOMO (host) may be understood by referring to the descriptions for those provided herein with reference to Examples.

While not wishing to be bound by theory, it is understood that when the host and the dopant in the emission layer 15 satisfy "all" of the above described the PLQY range of the dopant, the decay time range of the dopant, and the HOMO (dopant)−HOMO (host) range "at the same time", the organic light-emitting device 10 may have long lifespan characteristics. Furthermore, while not wishing to be bound by theory, it is understood that when the host and the dopant in the emission layer 15 additionally satisfy the above described emission energy range of maximum emission wavelength of an emission spectrum of the dopant, the organic light-emitting device 10 may have longer lifespan characteristics.

"t (5%)" refers to time required for the luminance of the organic light-emitting device 10 under given driving conditions to reduce from the initial luminance (100%) to 95% thereof, i.e., time taken for 5% of lifespan change. "R (5%)" refers to a rate required for the luminance of the organic light-emitting device 10 under given driving conditions to reduce from the initial luminance (100%) to 95%, i.e., a rate required for 5% of lifespan change. In this case, R (5%)=1/t (5%).

R (5%) may increase as an emission energy of excitons produced by a dopant included in the emission layer 15 increases, a density of the excitons increases, and a diffusion length for excitons to collide with polarons increases.

When an emission energy of a maximum emission wavelength of the dopant, i.e., excitons, included in the emission layer 15 excessively increases, polarons may be transitioned to a high energy level by exciton-polaron quenching. By this, various chemical bonds included in the host and/or the dopant molecules included in the emission layer 15 may be broken to thereby increase the possibility of decomposition of the host and/or the dopant molecules included in the emission layer 15. Therefore, a relationship between an emission energy (E) of a maximum emission wavelength of the dopant, i.e., excitons, included in the emission layer 15 and R(5%) may be shown as follows: R(5%) ∝exp[−($E_d$−E)/kT]. Here, $E_d$ indicates carbon-nitrogen binding energy which is relatively weak bond among chemical bonds between atoms, 3.16 eV. kT indicates Boltzmann constant (e.g., kT is 25.7 millielectron volts (meV) at a temperature of 25° C. (298 Kelvins (K))).

Next, PLQY (ϕ) is a property that is directly related to luminescence ability of a dopant included in the emission layer 15. When PLQY (ϕ) of the dopant included in the emission layer 15 is low, luminescence efficiency of the organic light-emitting device 10 may be deteriorated. Thus, the organic light-emitting device 10 needs to be driven with a high current to achieve the predetermined luminance, which may result in deterioration of lifespan of the organic light-emitting device 10. Thus, a relationship between PLQY of the dopant included in the emission layer 15 and R(5%) may be shown as follows: $R(5\%)\propto\phi^{-1}$.

A diffusion length of excitons in the emission layer 15 is proportional to a square root of decay time (τ) of excitons i.e., the dopant in the emission layer 15. Thus, a relationship between decay time of the dopant in the emission layer 15 and R(5%) may be shown as follows: $R(5\%)\propto\tau^{0.5}$.

A density of excitons in the emission layer 15 may be determined by a HOMO energy level difference (ΔH) between the host and the dopant included in the emission layer 15. When the HOMO energy level difference (ΔH) between the host and the dopant is relatively high, holes provided to the emission layer 15 may be trapped thereinto, and excitons may be greatly produced in a region near to the hole transport region 12 in the emission layer 15, thereby increasing the density of excitons in the emission layer 15. When the HOMO energy level difference (ΔH) between the host and the dopant is relatively small, most holes provided to the emission layer 15 may be stacked in a region near to the electron transport region 17, and excitons may be greatly produced in the region, thereby increasing the density of excitons in the emission layer 15. Therefore, a relationship between a density of excitons and R(5%) may be shown as follows: $R(5\%)\propto\exp(|\Delta H-\Delta H_{opt}|/kT)$. Here, $\Delta H_{opt}$ indicates a HOMO energy level difference that can reduce the density of excitons, and kT indicates Boltzmann constant.

That is, a) when a dopant in the emission layer 15 satisfies a PLQY range described herein, relatively low current driving conditions may be selected to achieve a high luminance of the organic light-emitting device 10, b) when a dopant in the emission layer 15 satisfies a decay time range described herein, a diffusion length of excitons in the emission layer 15 may be decreased, and c) when a host and a dopant in the emission layer 15 satisfies the HOMO (dopant)−HOMO (host) range described herein, excitons produced in the emission layer 15 are not concentrated either in a region near the hole transport region 12 or a region near the electron transport region 17 in the emission layer 15, and a density of excitons in the emission layer 15 may be decreased.

Thus, when the host and the dopant in the emission layer 15 satisfy "all" of the PLQY range of the dopant, the decay time range of the dopant, and the HOMO (dopant)−HOMO (host) range described herein "at the same time", the organic light-emitting device 10 may have significantly improved lifespan characteristics.

Furthermore, when a dopant in the emission layer 15 satisfies the emission energy range of a maximum emission wavelength of an emission spectrum described herein, the possibility of decomposition of the host and/or the dopant molecules included in the emission layer 15, through breaking of various chemical bonds included in the host and/or the dopant molecules included in the emission layer 15 by polarons transitioned to a high energy level by exciton-polaron quenching, may be decreased. Thus, when the host and the dopant in the emission layer 15 additionally satisfy the emission energy range of the maximum emission wavelength of an emission spectrum of the dopant, the organic light-emitting device 10 may have significantly improved lifespan characteristics.

Dopant in Emission Layer 15

The dopant in the emission layer 15 may be a phosphorescent compound. Thus, the organic light-emitting device 10 is quite different from an organic light-emitting device that emits a fluorescent light through a fluorescence mechanism.

The dopant may be an organometallic compound.

In one or more embodiments, the dopant may be an organometallic compound including a transition metal, thallium (Tl), lead (Pb), bismuth (Bi), indium (In), tin (Sn), antimony (Sb), or tellurium (Te).

In some embodiments, the dopant may be an organometallic compound including a Group 1 (the first row) transition metal, a Group 2 (the second row) transition metal, or a Group 3 (the third row) transition metal of periodic table of elements.

In an embodiment, the dopant may be an iridium-free organometallic compound.

In one or more embodiments, the dopant may be an organometallic compound including platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au). In some embodiments, the dopant may be an organometallic compound including platinum (Pt) or palladium (Pd), but embodiments are not limited thereto.

In one or more embodiments, the dopant may be a platinum (Pt)-containing organometallic compound.

In one or more embodiments, a dopant in the emission layer 15 may be an organometallic compound having a square-planar coordination.

In one or more embodiments, a dopant in the emission layer 15 may satisfy T1 (dopant)≤$E_{gap}$ (dopant)≤T1 (dopant)+0.5 eV, and in some embodiments, T1 (dopant)≤$E_{gap}$ (dopant)≤T1 (dopant)+0.36 eV, but embodiments are not limited thereto.

$E_{gap}$ (dopant) represents a difference between a HOMO energy level and a LUMO energy level of a dopant included in the emission layer 15, and HOMO (dopant) represents a HOMO energy level of a dopant included in the emission layer 15. The method of measuring HOMO (dopant) is as described herein.

When $E_{gap}$ (dopant) is within any of these ranges, a dopant in the emission layer 15, e.g., an organometallic compound having a square-planar coordination, may have a high radiative decay rate despite weak spin-orbital coupling (SOC) with a singlet energy level which is close to a triplet energy level.

In one or more embodiments, the dopant may include a metal M and an organic ligand, and the metal M and the organic ligand may form one, two, or three cyclometalated rings. The metal M may be platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au). In some embodiments, the dopant may include a metal M, and the metal M may be Pt, Pd, or Au, but embodiments are not limited thereto.

In one or more embodiments, the dopant may include a metal M and a tetradentate organic ligand, and the metal M and the tetradentate organic ligand are capable of together forming three or four (e.g., three) cyclometalated rings. The metal M may be defined the same as described herein. The tetradentate organic ligand may include, for example, a benzimidazole group and a pyridine group, but embodiments are not limited thereto.

In one or more embodiments, the dopant may include a metal M and at least one of ligands represented by Formulae 1-1 to 1-4:

Formula 1-1

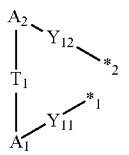

Formula 1-2

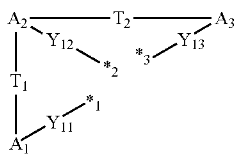

Formula 1-3

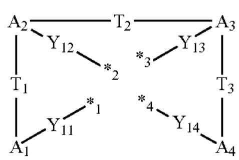

Formula 1-4

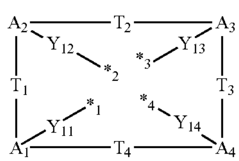

wherein, in Formulae 1-1 to 1-4, $A_1$ to $A_4$ may each independently be selected from a substituted or unsubstituted $C_5$-$C_{30}$ carbocyclic group, a substituted or unsubstituted $C_1$-$C_{30}$ heterocyclic group, and a non-cyclic group, $Y_{11}$ to $Y_{14}$ may each independently be a chemical bond, O, S, $N(R_{91})$, $B(R_{91})$, $P(R_{91})$, or $C(R_{91})(R_{92})$, $T_1$ to $T_4$ may each independently be selected from a single bond, a double bond, $*—N(R_{93})—*'$, $*—B(R_{93})—*'$, $*—P(R_{93})—*'$, $*—C(R_{93})(R_{94})—*'$, $*—Si(R_{93})(R_{94})—*'$, $*—Ge(R_{93})(R_{94})—*'$, $*—S—*'$, $*—O—*'$, $*—C(=O)—'$, $*—S(=O)—*'$, $*—S(=O)_2—*'$, $*—C(R_{93})=*'$, $*=C(R_{93})—*'$, $*—C(R_{93})=C(R_{94})—*'$, $*—C(=S)—*'$, and $*—C\equiv C—*'$, a substituent of the substituted $C_5$-$C_{39}$ carbocyclic group, a substituent of the substituted $C_1$-$C_{39}$ heterocyclic group, and $R_{91}$ to $R_{94}$ may each independently be selected from hydrogen, deuterium, —F, —Cl, —Br, —I, $—SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{69}$ alkynyl group, a substituted or unsubstituted $C_1$-$C_{69}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, $—B(Q_6)(Q_7)$, and $—P(=O)(Q_5)(Q_9)$, provided that the substituent of the substituted $C_5$-$C_{30}$ carbocyclic group and the substituent of the substituted $C_1$-$C_{30}$ heterocyclic group are not a hydrogen, $*_1$, $*_2$, $*_3$ and $*_4$ each indicate a binding site to the metal M of the dopant, and wherein $Q_1$ to $Q_9$ are the same as defined below.

In some embodiments, in Formulae 1-1 to 1-4, $A_1$ to $A_4$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, a azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, each unsubstituted or substituted with at least one selected from deuterium, —F, —Cl, —Br, —I, $—SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_8$)($Q_7$), and —P(═O)($Q_8$)($Q_9$), but embodiments are not limited thereto. Here, the substituents of $A_1$ to $A_4$ will be described in detail with regard to $R_1$ in Formula 1A.

For example, the dopant may include a ligand represented by Formula 1-3, and two of $A_1$ to $A_4$ in Formula 1-3 may each be a substituted or unsubstituted benzimidazole group and a substituted or unsubstituted pyridine group, but embodiments are not limited thereto.

In one or more embodiments, the dopant may be an organometallic compound represented by Formula 1A:

Formula 1A

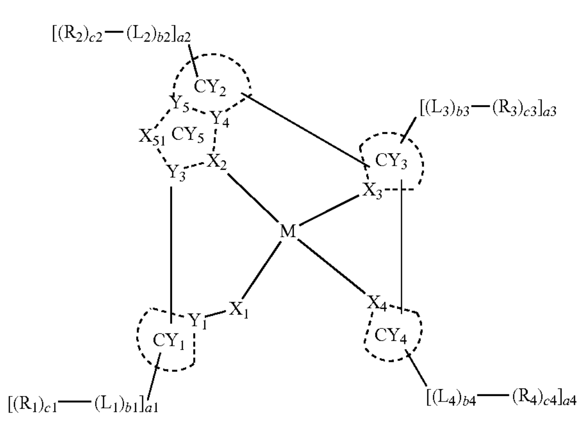

wherein, in Formula 1A,

M may be selected from beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), and gold (Au), X, may be O or S, a bond between $X_1$ and M may be a covalent bond, $X_2$ to $X_4$ may each independently be selected from carbon (C) and nitrogen (N), one bond selected from a bond between $X_2$ and M, a bond between $X_3$ and M, and a bond between $X_4$ and M may be a covalent bond, while the remaining bonds are each a coordinate bond, $Y_1$ and $Y_3$ to $Y_5$ may each independently be C or N, a bond between $X_2$ and $Y_3$, a bond between $X_2$ and $Y_4$, a bond between $Y_4$ and $Y_5$, a bond between $Y_5$ and $X_{51}$, and a bond between $X_{51}$ and $Y_3$ may each be a chemical bond, $CY_1$ to $CY_5$ may each independently be selected from a $C_5$-$C_{30}$ carbocyclic group and a $C_1$-$C_{30}$ heterocyclic group, $CY_4$ may not be a benzimidazole group, a cyclometalated ring formed by $CY_5$, $CY_2$, $CY_3$, and M may be a 6-membered ring, $X_{51}$ may be selected from O, S, N-[$(L_7)_{b7}$-$(R_7)_{c7}$], C($R_7$)($R_8$), Si($R_7$)($R_8$), Ge($R_7$)($R_8$), C(═O), N, C($R_7$), Si($R_7$), and Ge($R_7$), R7 and $R_8$ may optionally be bound via a first linking group to form a substituted or unsubstituted $C_5$-$C_{30}$ carbocyclic group or a substituted or unsubstituted $C_1$-$C_{30}$ heterocyclic group, $L_1$ to $L_4$ and $L_7$ may each independently be selected from a substituted or unsubstituted $C_5$-$C_{30}$ carbocyclic group and a substituted or unsubstituted $C_1$-$C_{30}$ heterocyclic group, $b_1$ to $b_4$ and $b_7$ may each independently be an integer from 0 to 5, $R_1$ to $R_4$, $R_7$, and $R_5$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$), c1 to c4 may each independently be an integer from 1 to 5, a1 to a4 may each independently be 0, 1, 2, 3, 4 or 5, at least two adjacent groups $R_1$ selected from a plurality of groups $R_1$ may optionally be bound to form a substituted or unsubstituted $C_5$-$C_{30}$ carbocyclic group or a substituted or unsubstituted $C_1$-$C_{30}$ heterocyclic group, at least two adjacent groups $R_2$ selected from a plurality of groups $R_2$ may optionally be bound to form a substituted or unsubstituted $C_5$-$C_{30}$ carbocyclic group or a substituted or unsubstituted $C_1$-$C_{30}$ heterocyclic group, at least two adjacent groups $R_3$ selected from a plurality of groups $R_3$ may optionally be bound to form a substituted or unsubstituted $C_5$-$C_{30}$ carbocyclic group or a substituted or unsubstituted $C_1$-$C_{30}$ heterocyclic group, at least two adjacent groups $R_4$ selected from a plurality of groups $R_4$ may optionally be bound to form a substituted or unsubstituted $C_5$-$C_{30}$ carbocyclic group or a substituted or unsubstituted $C_1$-$C_{30}$ heterocyclic group, and at least two adjacent groups selected from $R_1$ to $R_4$ may optionally be bound to form a substituted or unsubstituted $C_5$-$C_{30}$ carbocyclic group or a substituted or unsubstituted $C_1$-$C_{30}$ heterocyclic group.

In Formulae 1-1 to 1-4 and 1A, a $C_5$-$C_{30}$ carbocyclic group, a $C_1$-$C_{30}$ heterocyclic group, and a $CY_1$ to $CY_4$ may each independently be selected from a) a first ring, b) a condensed ring in which at least two first rings are condensed, or c) a condensed ring in which at least one first ring and at least one second ring are condensed, wherein the first ring may be selected from a cyclohexane group, a cyclohexene group, an adamantane group, a norbonane group, a norbonene group, a benzene group, a pyridine group, a pyrimidine group, a pyrazine group, a pyridazine group, and a triazine group, and the second ring may be selected from a cyclopentane group, a cyclopentene group, a cyclopentadiene group, a furan group, a thiophene group, a silole group, a pyrrole group, a pyrazole group, an imidazole group, a triazole group, an oxazole group, an iso-oxazole group, a thiazole group, an isothiazole group, an oxadiazole group, and a thiadiazole group.

The non-cyclic group in Formulae 1-1 to 1-4 may each be *—C(═O)—*', *—O—C(═O)—*', *—S—C(═O)—*', *—O—C(═S)—*', or *—S—C(═S)—*', but embodiments are not limited thereto.

In Formulae 1-1 to 1-4 and 1A, a substituent of the substituted $C_5$-$C_{30}$ carbocyclic group, a substituent of the substituted $C_1$-$C_{30}$ heterocyclic group, $R_{91}$ to $R_{94}$, $R_1$ to $R_4$, $R_7$, and $R_8$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and $—Si(Q_{33})(Q_{34})(Q_{35})$; and $—N(Q_1)(Q_2)$, $—Si(Q_3)(Q_4)(Q_5)$, $—B(Q_6)(Q_7)$, and $—P(═O)(Q_8)(Q_9)$, wherein $Q_1$ to $Q_9$ and $Q_{33}$ to $Q_{35}$ may each independently be selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In one or more embodiments, $X_{51}$ may be N-[$(L_7)_{b7}$-$(R_7)_{c7}$], but embodiments are not limited thereto.

In one or more embodiments, the dopant may be an organometallic compound represented by Formula 1A, wherein in Formula 1A, $X_2$ and $X_3$ may each independently be C or N, $X_4$ may be N, and in cases where i) M is Pt, ii) $X_1$ is O, iii) $X_2$ and $X_4$ are each N, $X_3$ is C, a bond between $X_2$ and M and a bond between $X_4$ and M are each a coordinate bond, and a bond between $X_3$ and M is a covalent bond, iv) $Y_1$ to $Y_5$ are each C, v) a bond between $Y_5$ and $X_{51}$ and a bond between $Y_3$ and $X_{51}$ are each a single bond, vi) $CY_1$, $CY_2$, and $CY_3$ are each a benzene group, and $CY_4$ is a pyridine group, vii) $X_{51}$ is O, S, or N-[$(L_7)_{b7}$-$(R_7)_{c7}$], and viii) b7 is 0, c7 is 1, and $R_7$ is a substituted or unsubstituted $C_1$-$C_{60}$ alkyl group, a1 to a4 may each independently be 1, 2, 3, 4, or 5, and at least one selected from $R_1$ to $R_4$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, the dopant may be represented by Formula 1A-1:

Formula 1A-1

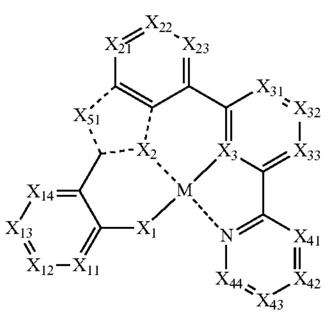

wherein, in Formula 1A-1,

M, $X_1$ to $X_3$, and $X_{51}$ may be defined the same as those described herein, $X_{11}$ may be N or C-[$(L_{11})_{b11}$-$(R_{11})_{c11}$], $X_{12}$ may be N or C-[$(L_{12})_{b12}$-$(R_{12})_{c12}$], $X_{13}$ may be N or C-[$(L_{13})_{b13}$-$(R_{13})_{c13}$], $X_{14}$ may be N or C-[$(L_{14})_{b14}$-$(R_{14})_{c14}$], $L_{11}$ to $L_{14}$, b11 to b14, $R_{11}$ to $R_{14}$, and c11 to c14 may each be defined the same as $L_1$, b1, $R_1$, and c1 described herein, respectively, $X_{21}$ may be N or C-[$(L_{21})_{b21}$-$(R_{21})_{c21}$], $X_{22}$ may be N or C-[$(L_{22})_{b22}$-$(R_{22})_{c22}$], $X_{23}$ may be N or C-[$(L_{23})_{b23}$-$(R_{23})_{c23}$], $L_{21}$ to $L_{23}$, b21 to b23, $R_{21}$ to $R_{23}$, and c21 to c23 may each be defined the same as $L_2$, b2, $R_2$, and c2 described herein, respectively, $X_{31}$ may be N or C-[$(L_{31})_{b31}$-$(R_{31})_{c31}$], X32 may be N or C-[$(L_{32})_{b32}$-$(R_{32})_{c32}$], $X_{33}$ may be N or C-[$(L_{33})_{b33}$-$(R_{33})_{c33}$], $L_{31}$ to $L_{33}$, b31 to b33, $R_{31}$ to $R_{33}$, and c31 to c33 may each be defined the same as $L_3$, b3, $R_3$, and c3 described herein, respectively, $X_{41}$ may be N or C-[$(L_{41})_{b41}$-$(R_{41})_{c41}$], $X_{42}$ may be N or C-[$(L_{42})_{b42}$-$(R_{42})_{c42}$], $X_{43}$ may be N or C-[$(L_{43})_{b43}$-$(R_{43})_{c43}$], $X_{44}$ may be N or C-[$(L_{44})_{b44}$-$(R_{44})_{c44}$], $L_{41}$ to $L_{44}$, b41 to b44, $R_{41}$ to $R_{44}$, and c41 to c44 may each be defined the same as $L_4$, b4, $R_4$, and c4 described herein, respectively, two selected from $R_{11}$ to $R_{14}$ may optionally be bound to form a substituted or unsubstituted $C_5$-$C_3O$ carbocyclic group or a substituted or unsubstituted $C_1$-$C_{30}$ heterocyclic group, two selected from $R_{21}$ to $R_{23}$ may optionally be bound to form a substituted or unsubstituted $C_5$-$C_{30}$ carbocyclic group or a substituted or unsubstituted $C_1$-$C_{30}$ heterocyclic group, two selected from $R_{31}$ to $R_{33}$ may optionally be bound to form a substituted or unsubstituted $C_5$-$C_{30}$ carbocyclic group or a substituted or unsubstituted $C_1$-$C_{30}$ heterocyclic group, and two selected from $R_{41}$ to $R_{44}$ may optionally be bound to form a substituted or unsubstituted $C_5$-$C_{30}$ carbocyclic group or a substituted or unsubstituted $C_1$-$C_{30}$ heterocyclic group.

In some embodiments, the dopant may be selected from Compounds 1-1 to 1-91, 2-1 to 2-47, and 3-1 to 3-582, but embodiments are not limited thereto:

1-1

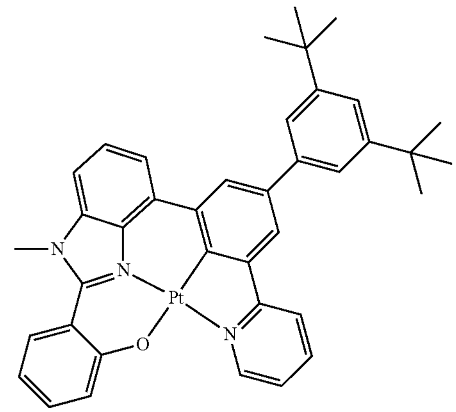

1-2

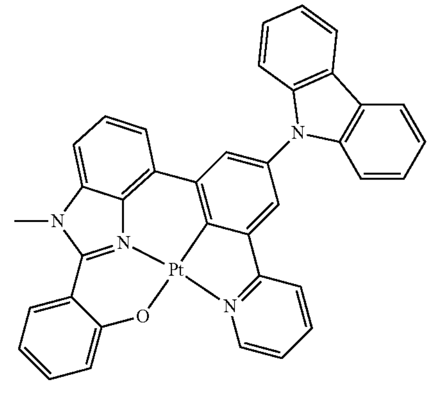

-continued
1-3
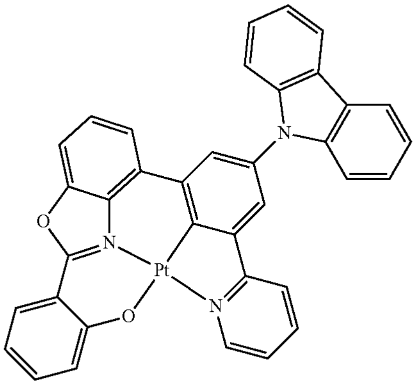
1-4
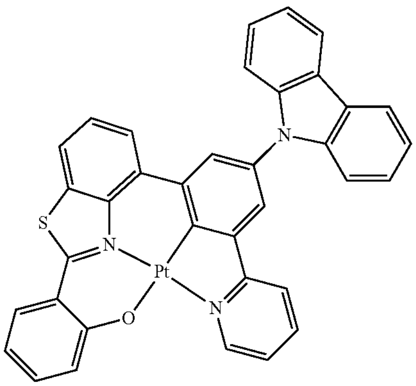
1-5
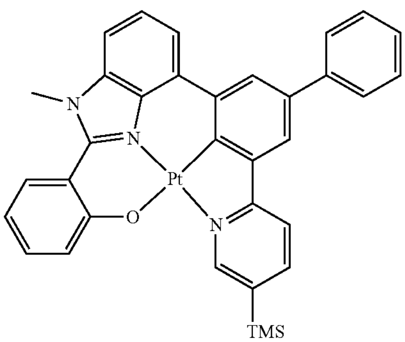
1-6
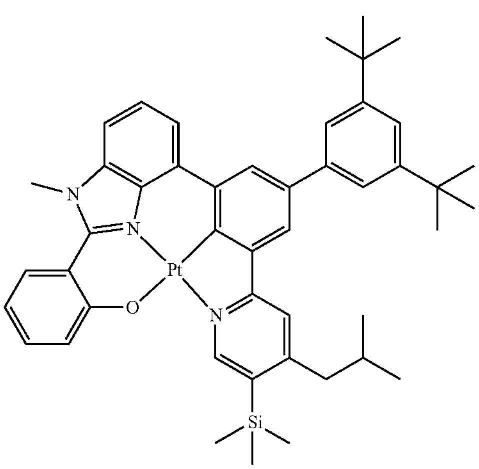
-continued
1-7
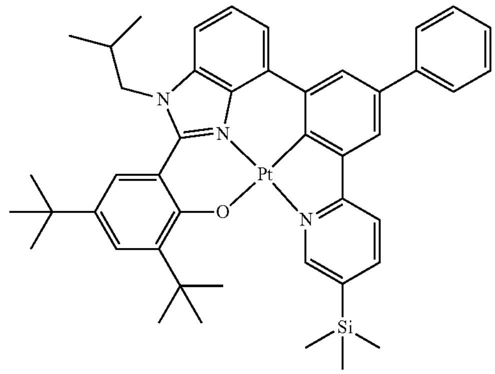
1-8
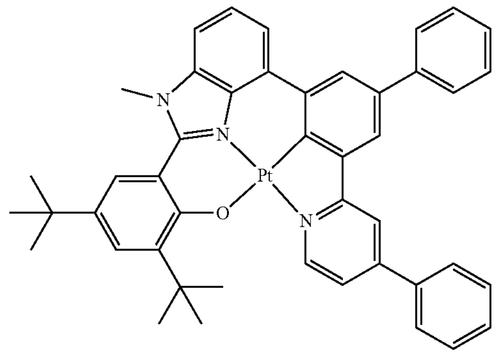
1-9
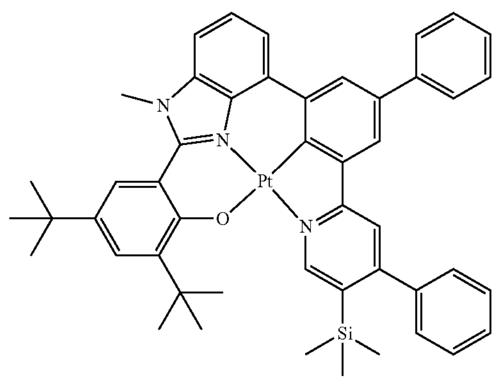
1-10
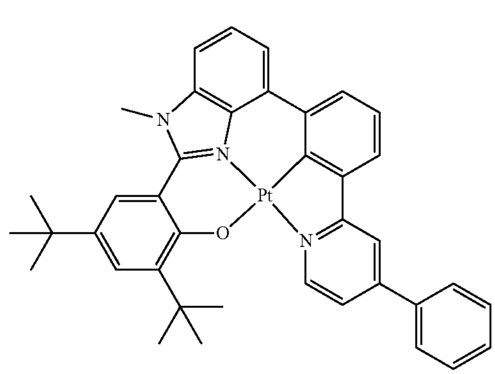

1-11
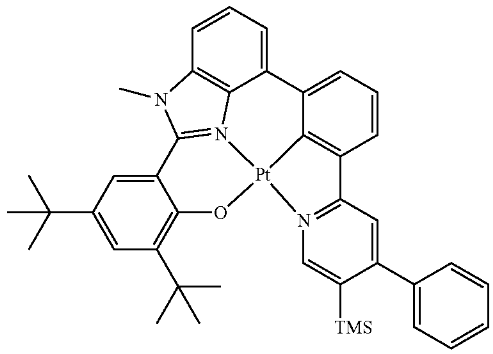
1-12
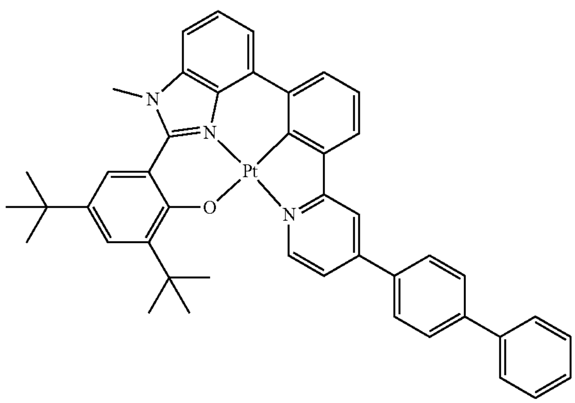
1-13
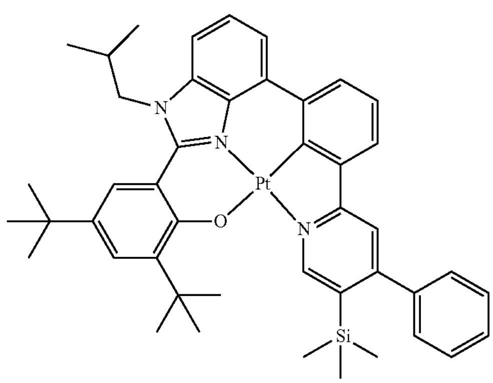
1-14
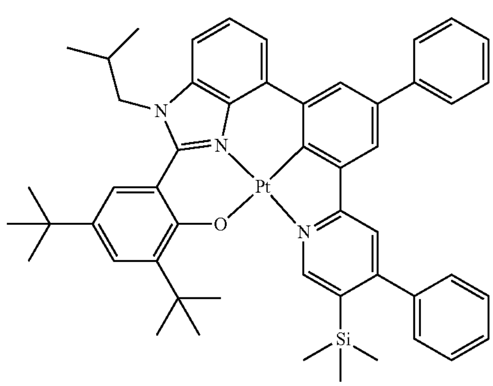
1-15
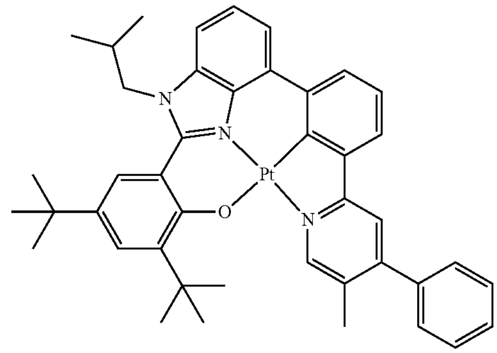
1-16
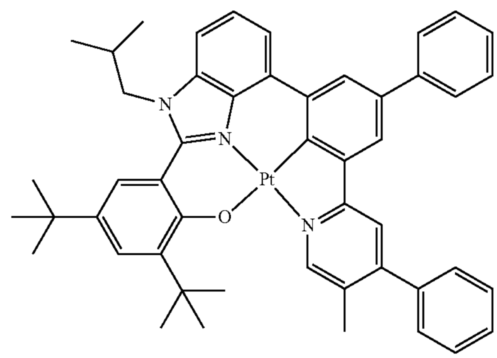
1-17
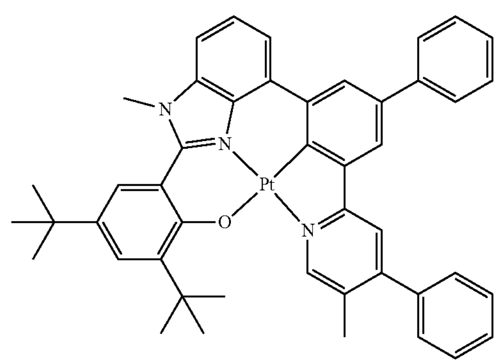
1-18
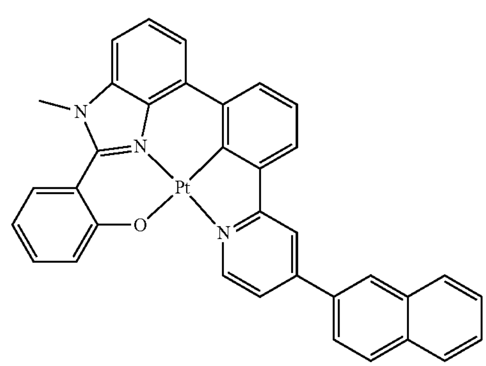

-continued
1-19
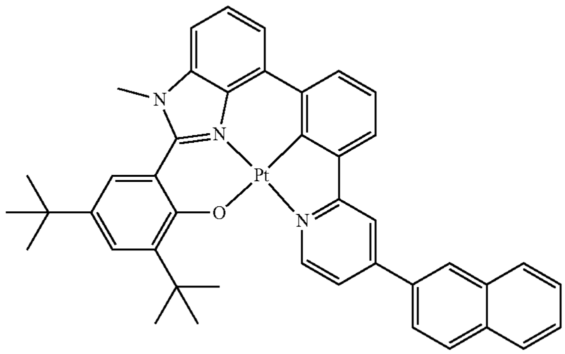
1-20
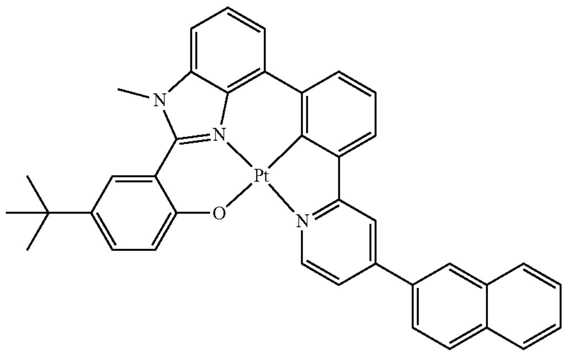
1-21
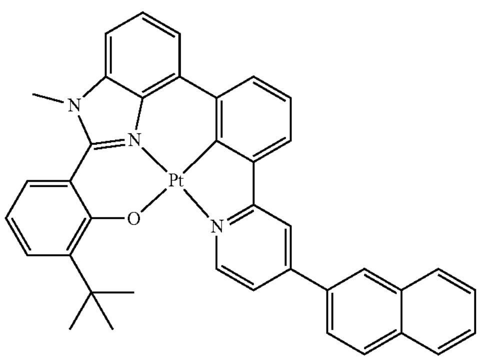
1-22
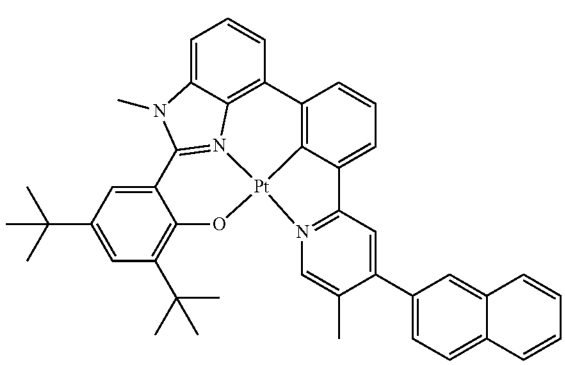
-continued
1-23
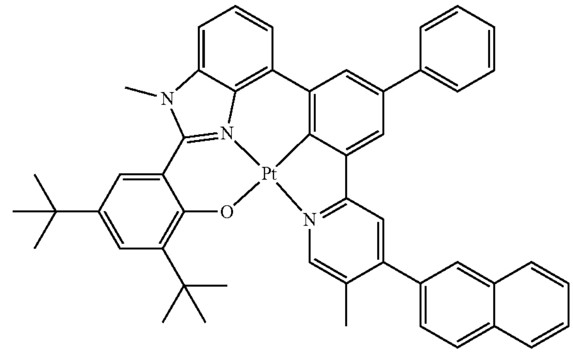
1-24
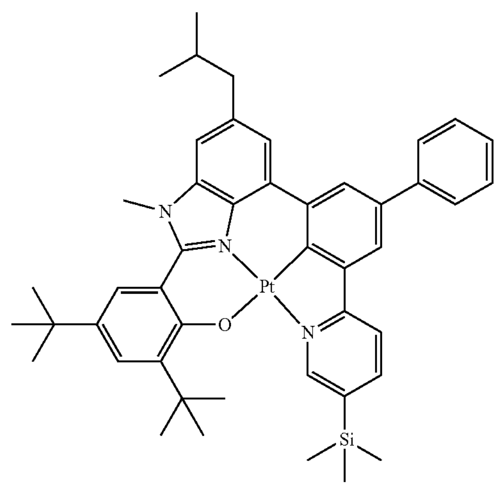
1-25
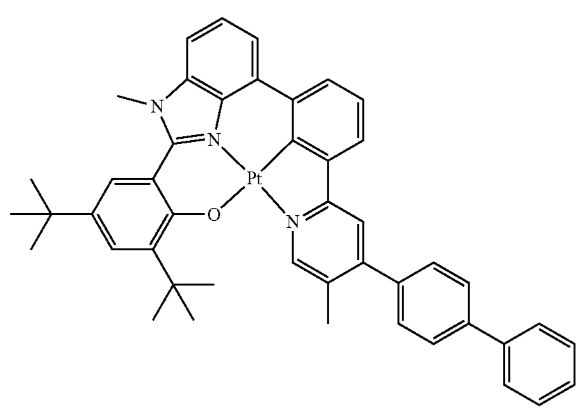

-continued
1-26
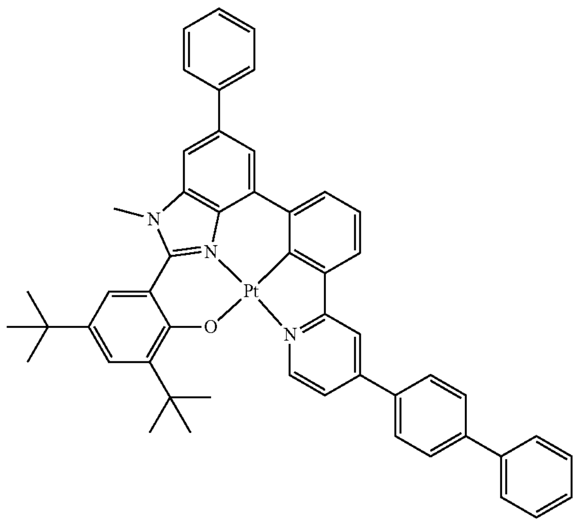
1-27
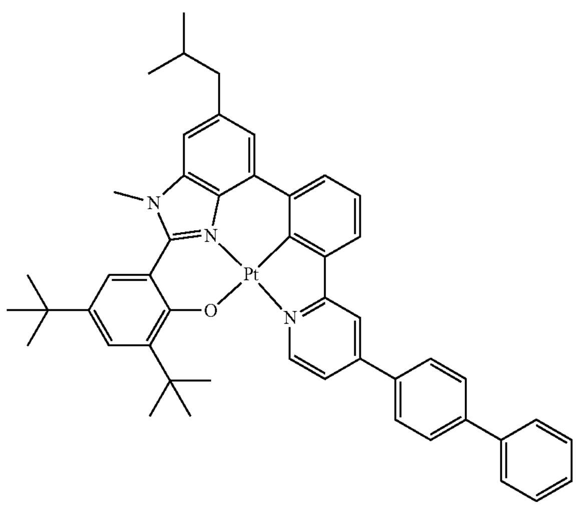
1-28
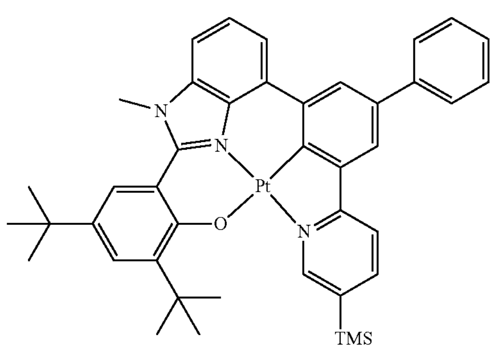
-continued
1-29
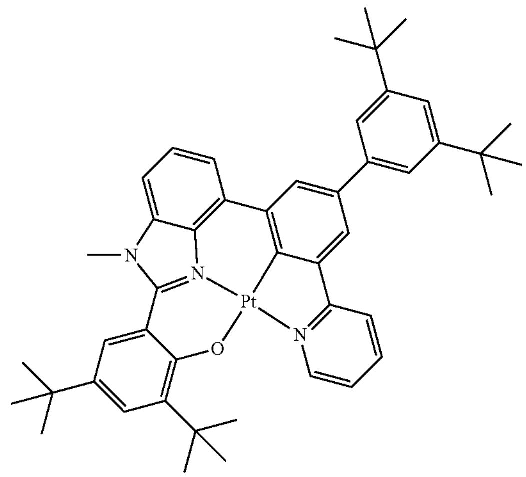
1-30
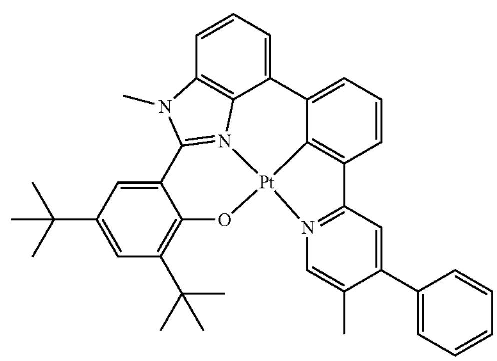
1-31
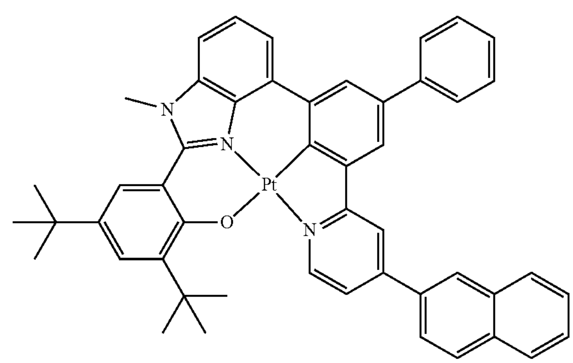

1-32
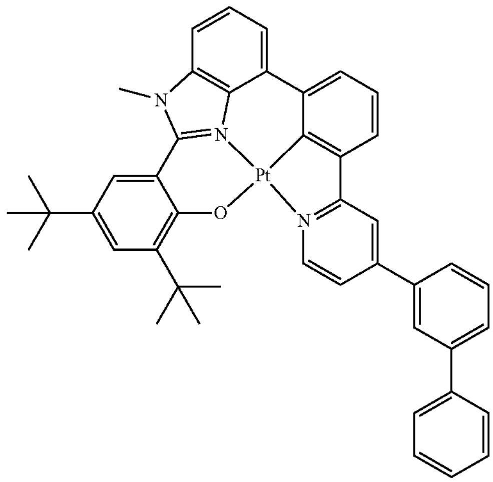
1-33
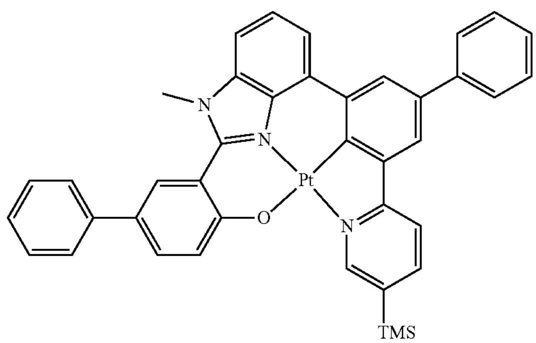
1-34
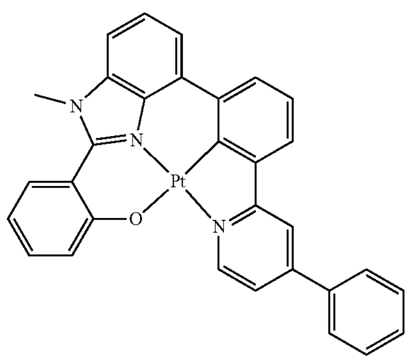
1-35
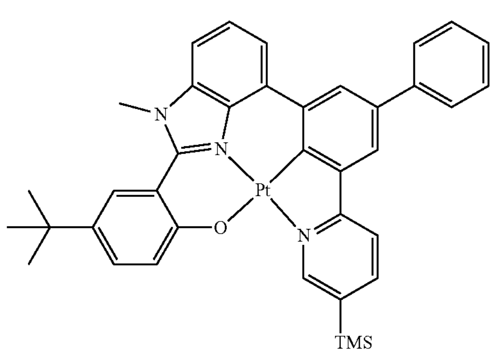
1-36
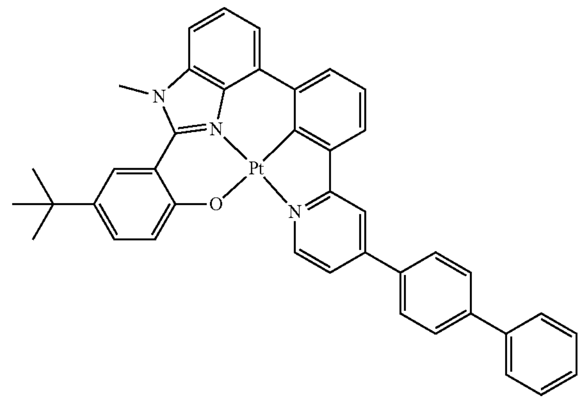
1-37
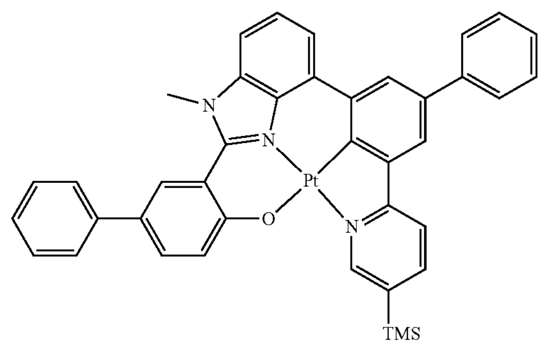
1-38
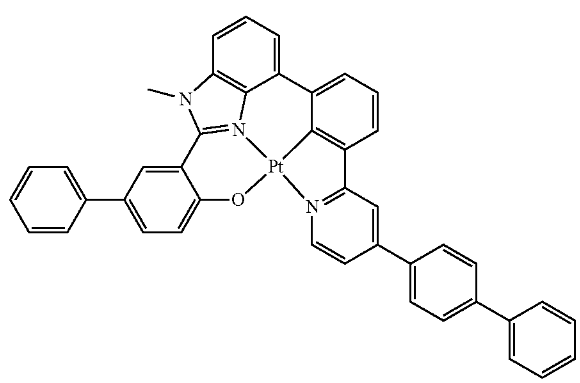
1-39
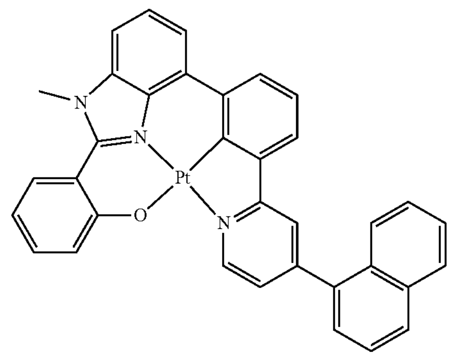

-continued
1-40
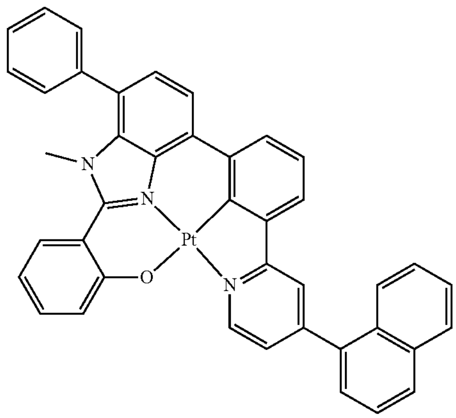
1-41
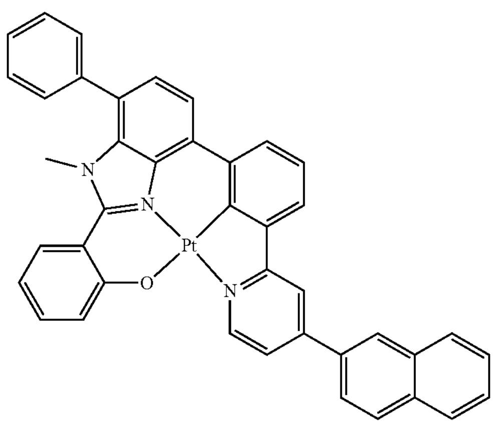
1-42
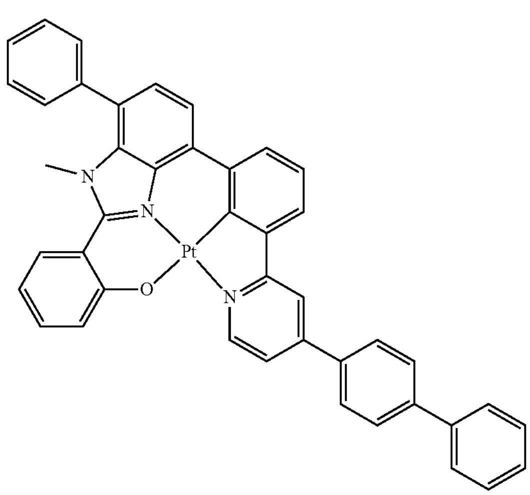
-continued
1-43
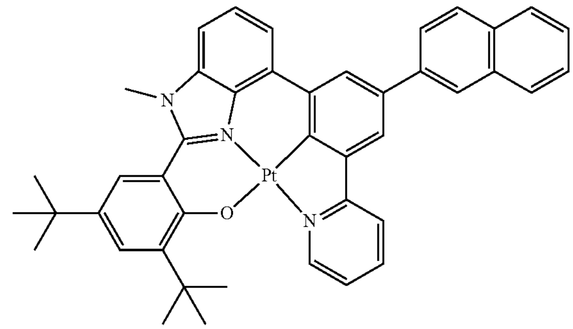
1-44
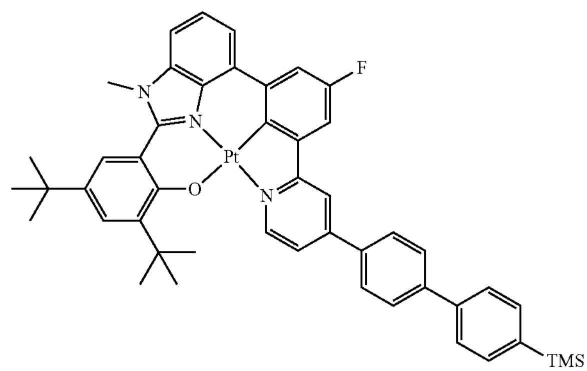
1-45
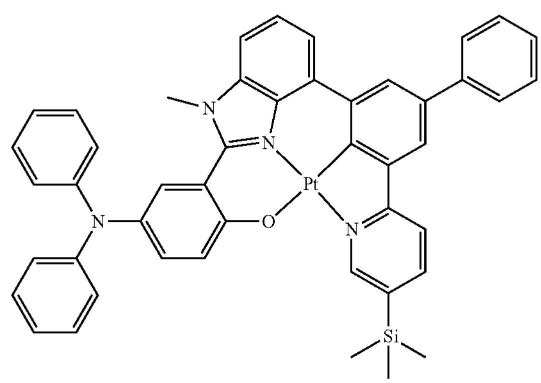
1-46
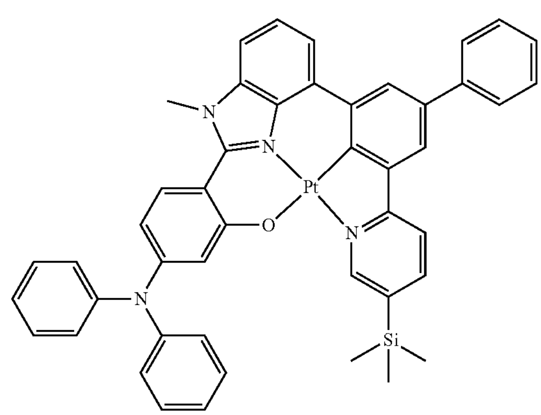

-continued
1-47
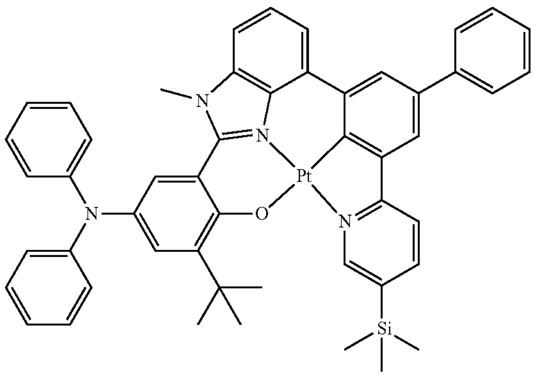
1-48
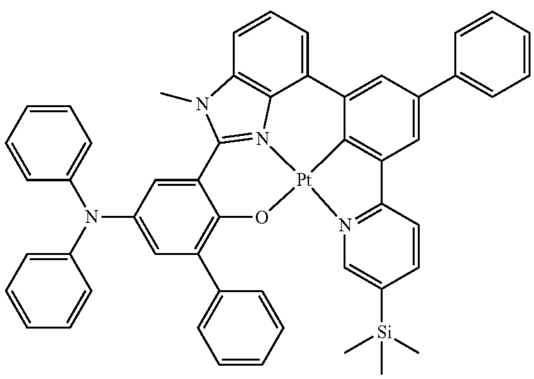
1-49
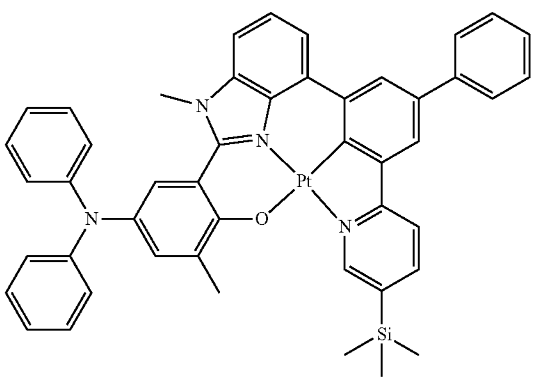
1-50
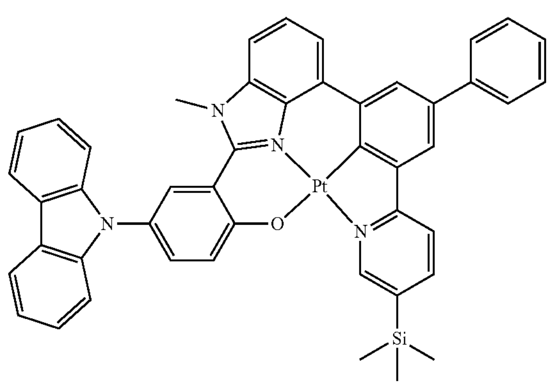
-continued
1-51
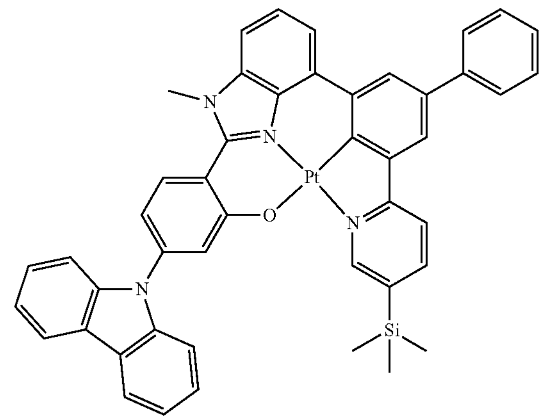
1-52
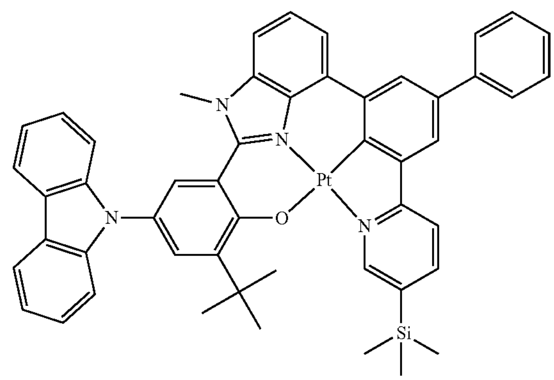
1-53
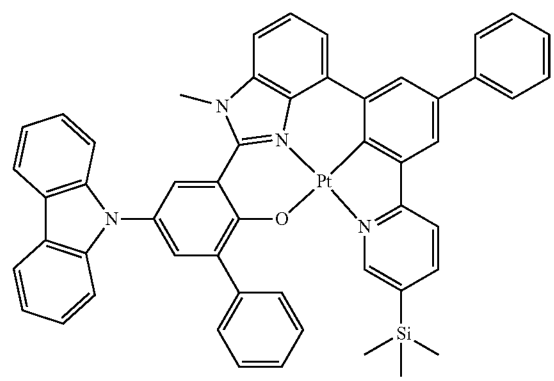
1-54
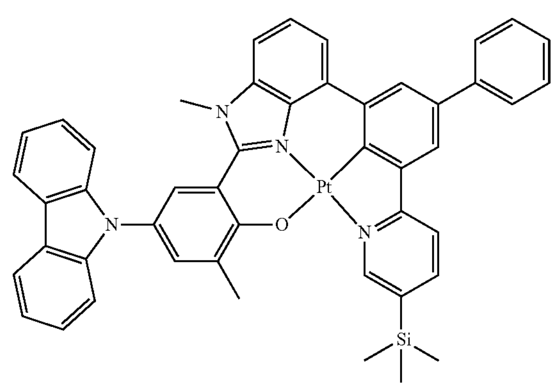

-continued
1-55
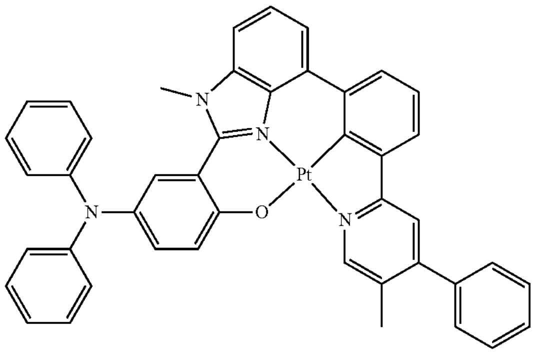
1-56
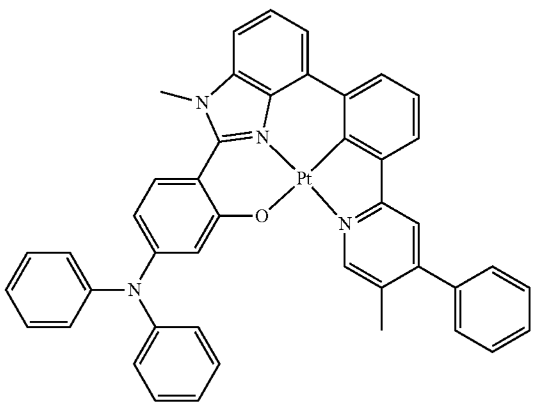
1-57
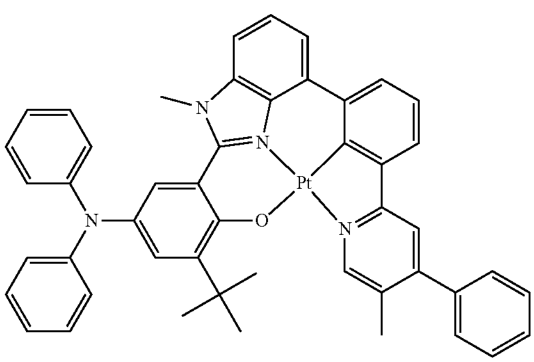
1-58
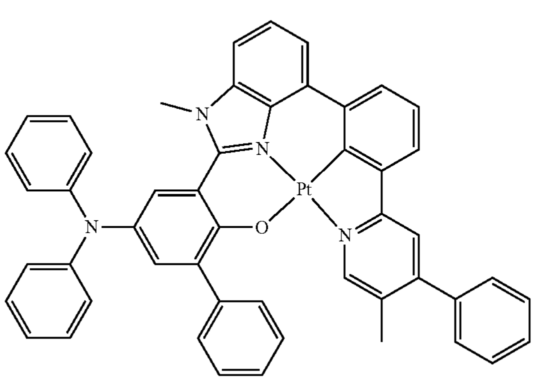
-continued
1-59
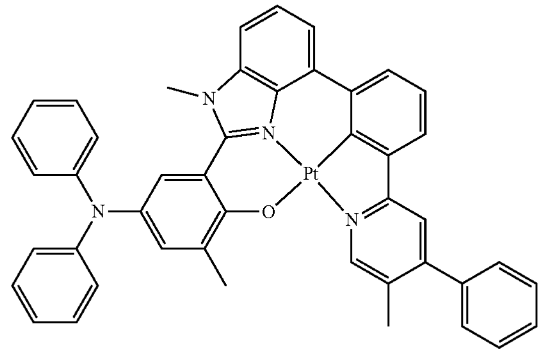
1-60
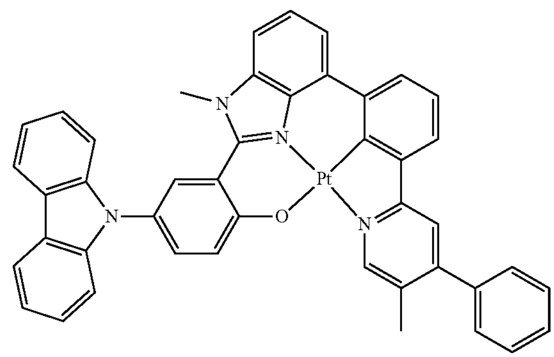
1-61
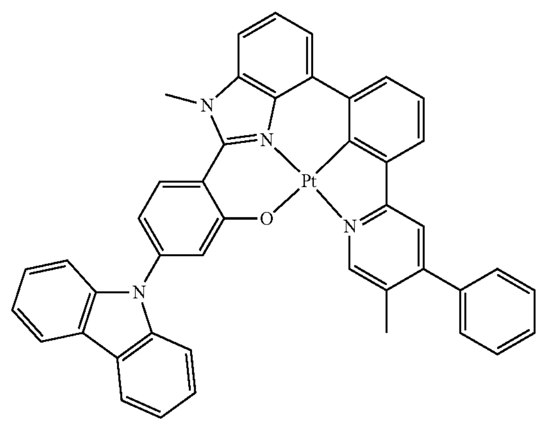
1-62
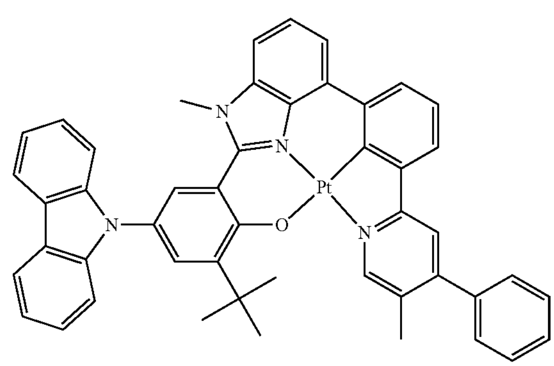

-continued
1-63
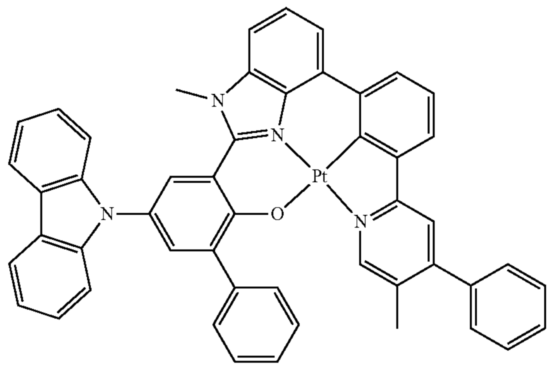
1-64
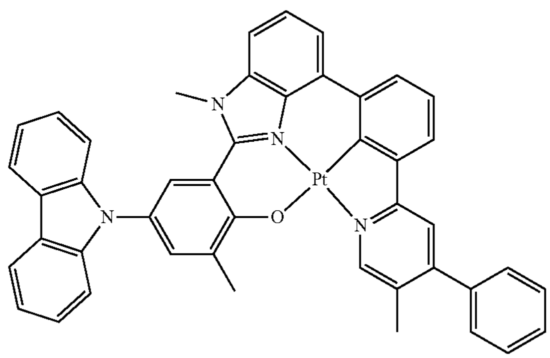
1-65
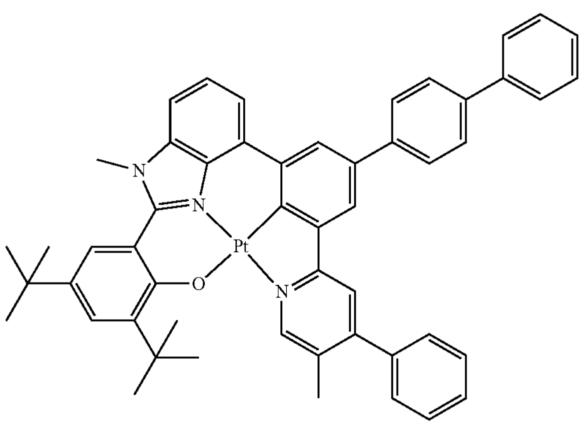
1-66
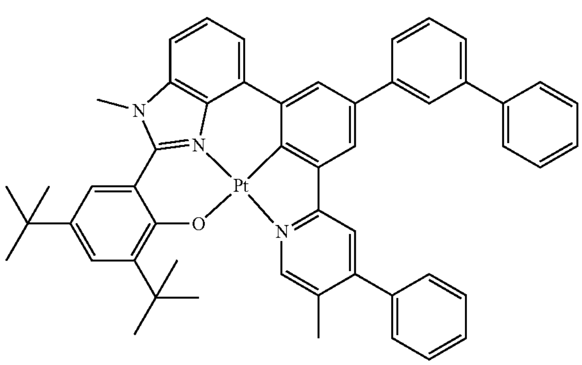
-continued
1-67
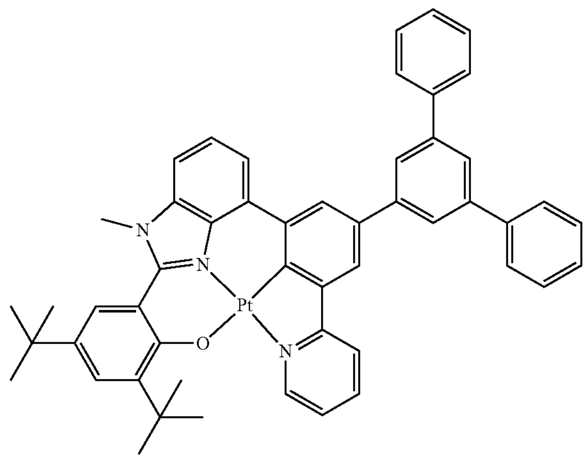
1-68
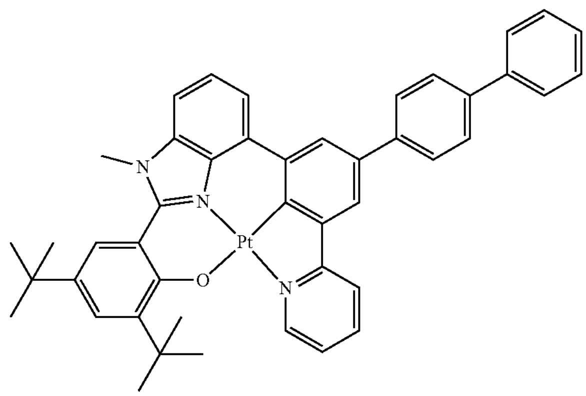
1-69
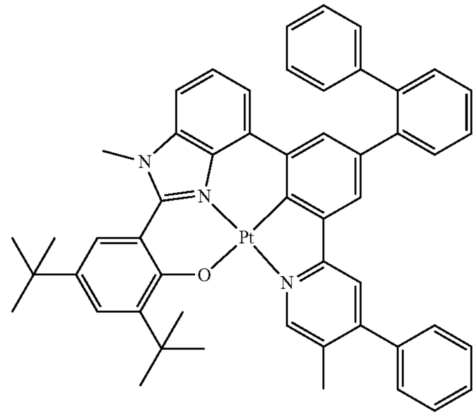

-continued
1-70
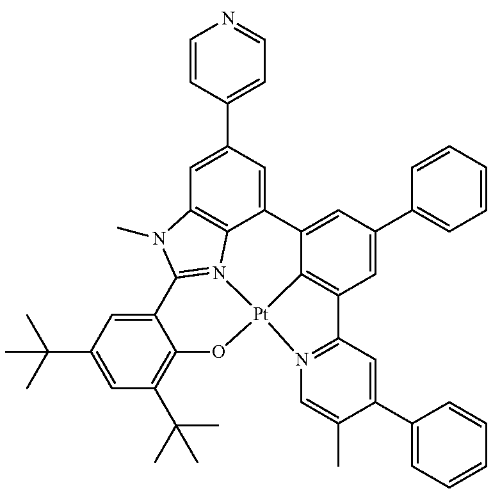
1-71
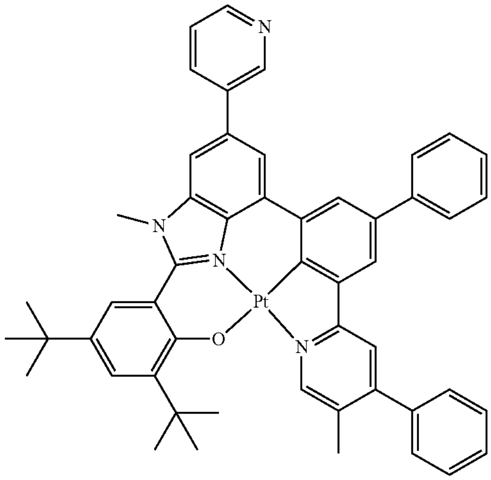
1-72
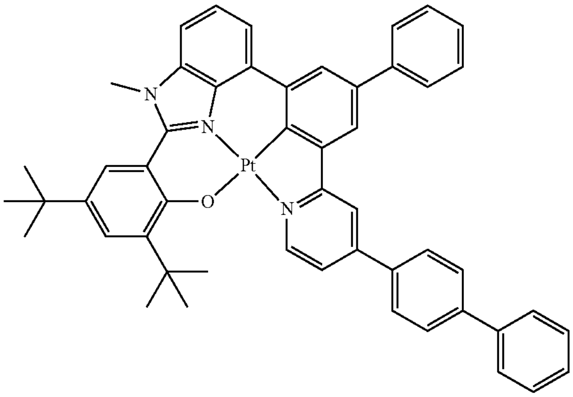
-continued
1-73
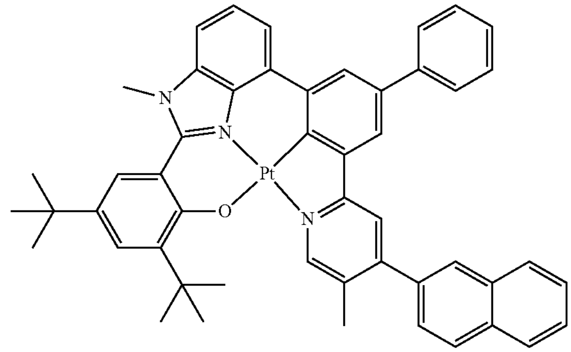
1-74
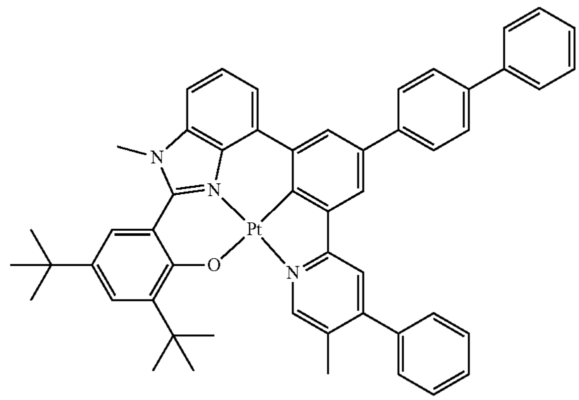
1-75
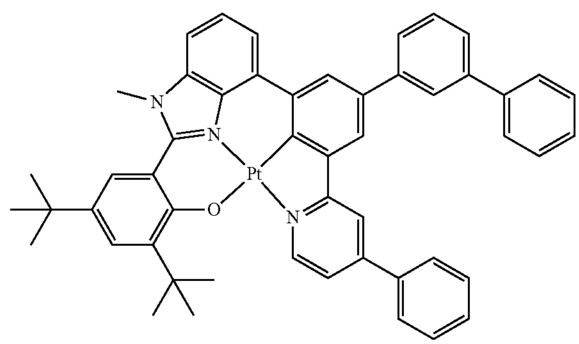
1-76
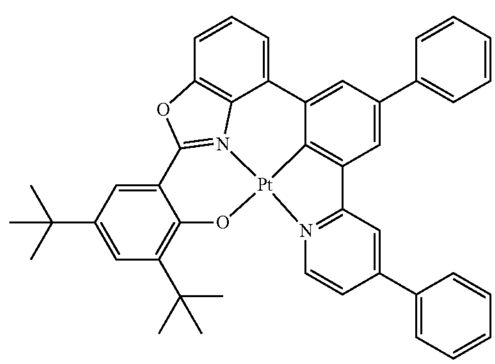

1-77
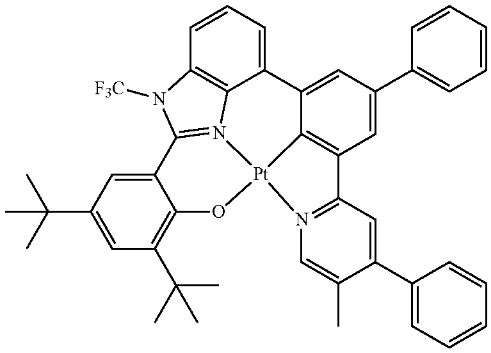
1-78
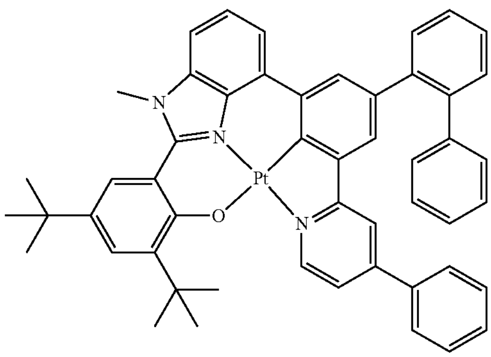
1-79
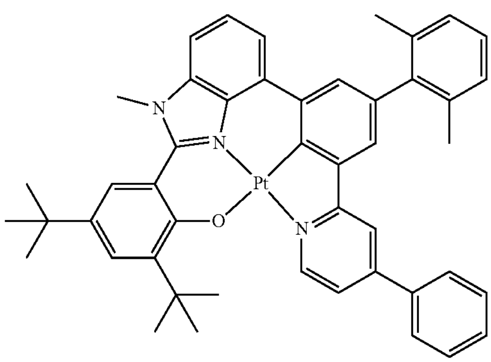
1-80
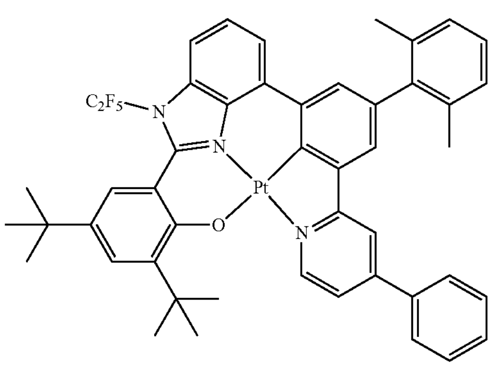
1-81
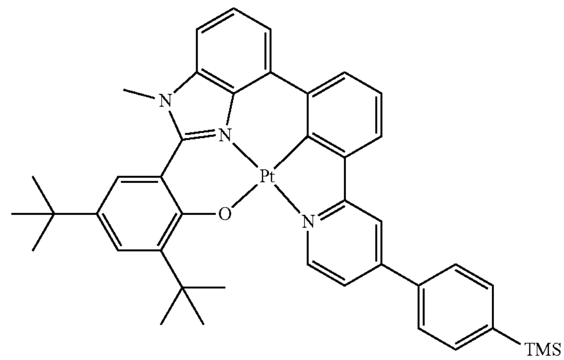
1-82
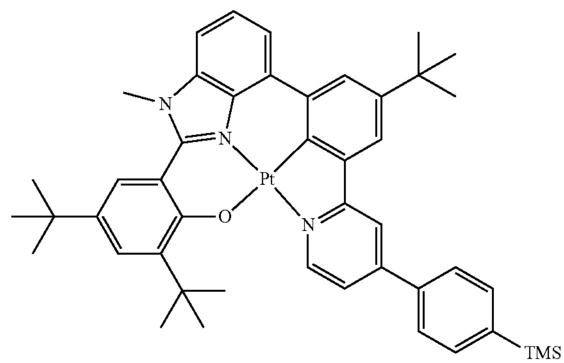
1-83
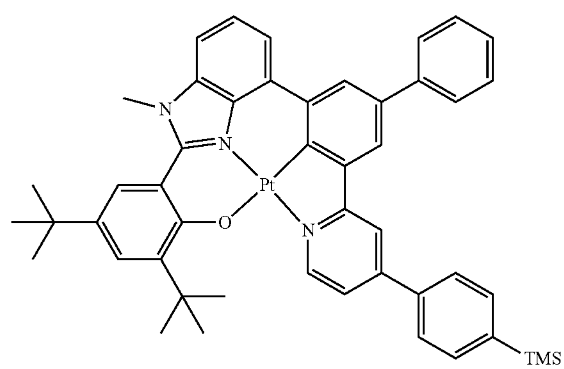
1-84
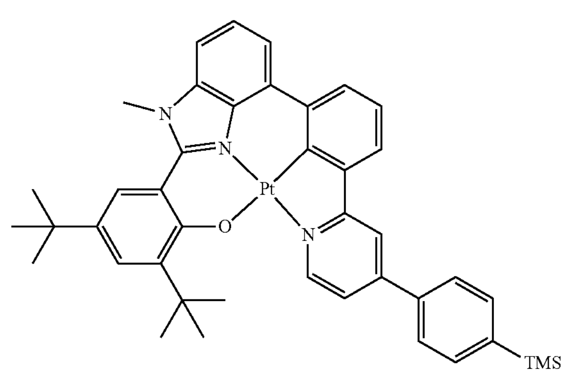

1-85
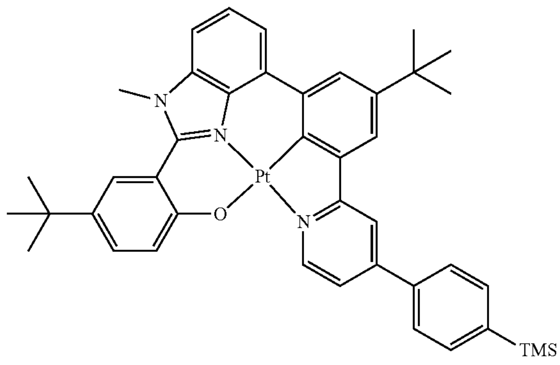
1-86
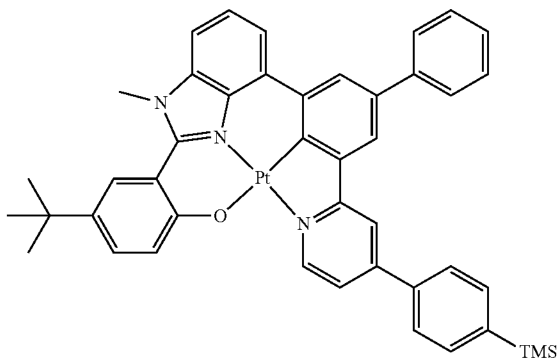
1-87
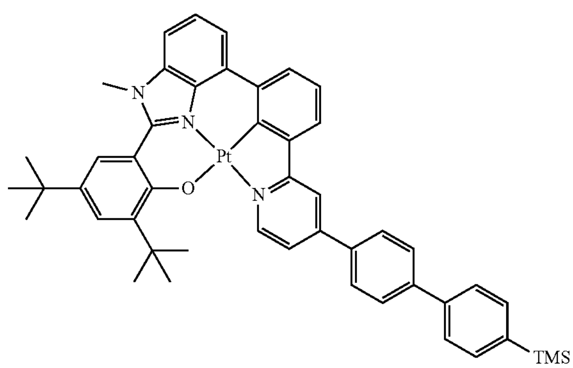
1-88
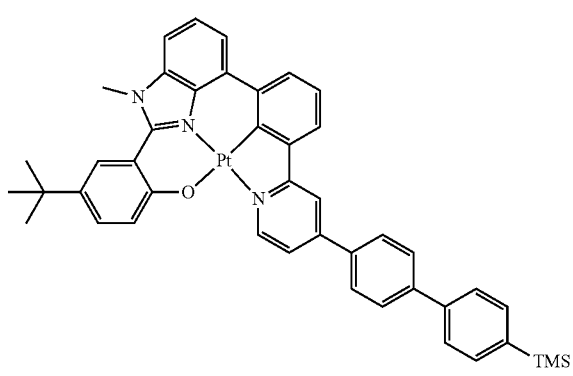
1-89
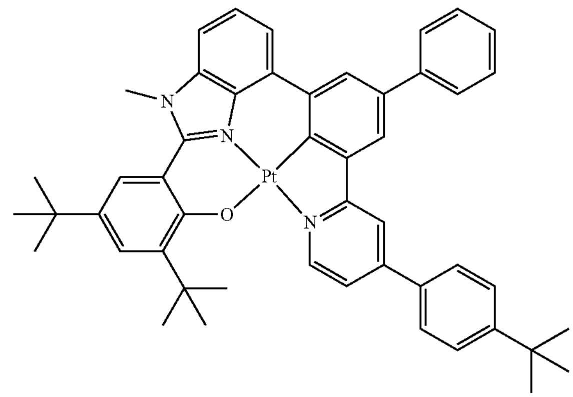
1-90
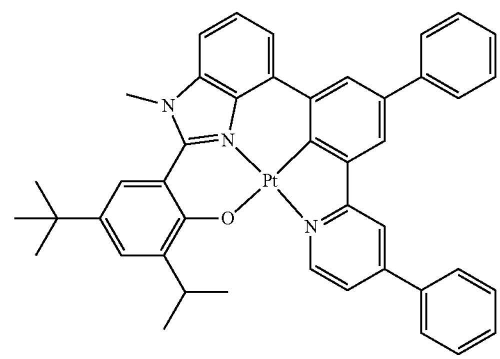
1-91
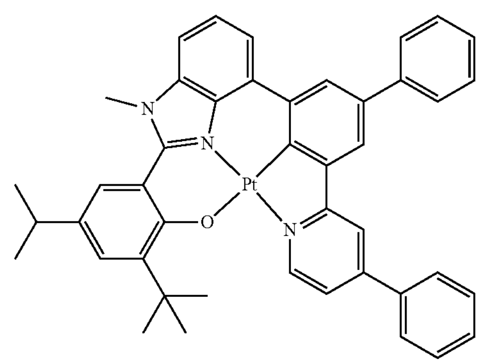
2-1
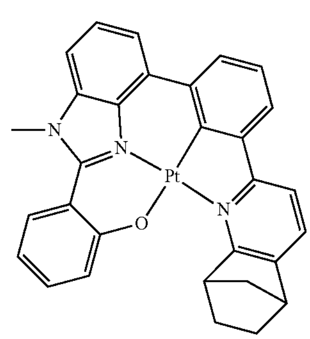

-continued
2-2
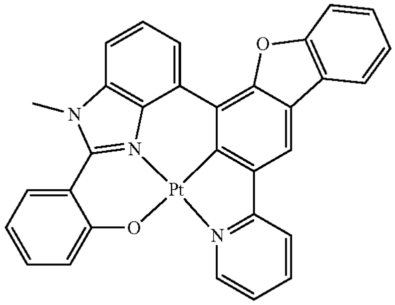
2-3
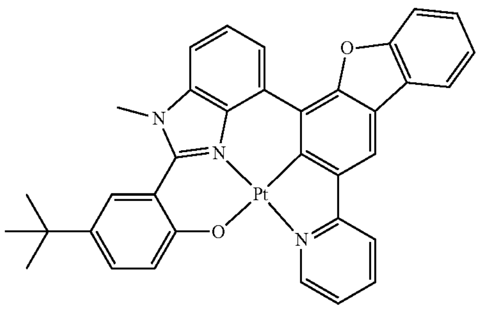
2-4
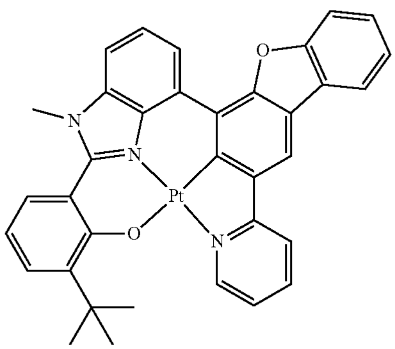
2-5
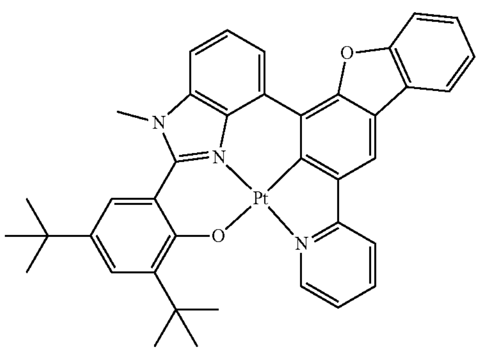
2-6
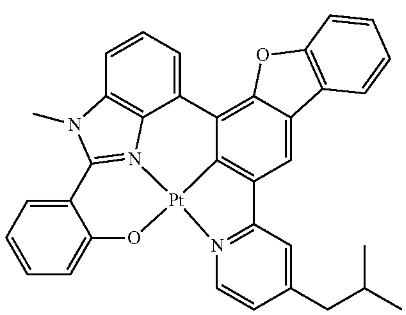
-continued
2-7
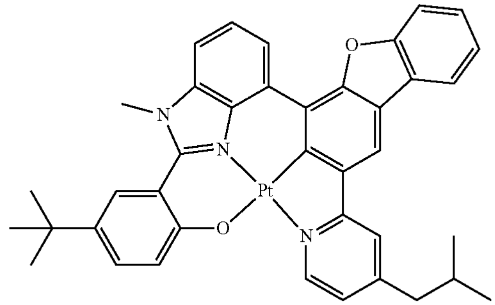
2-8
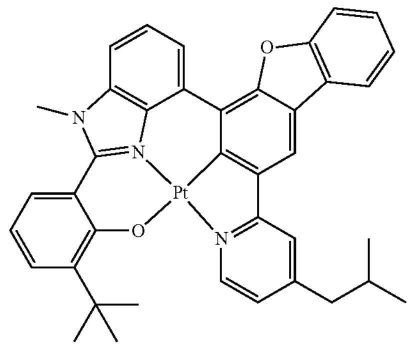
2-9
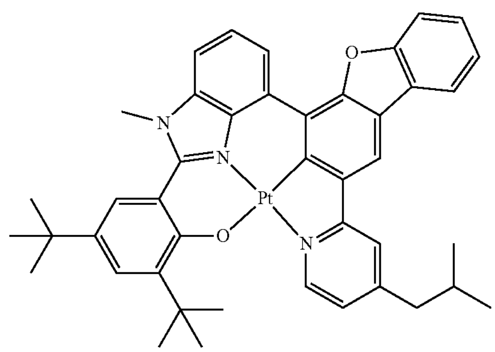
2-10
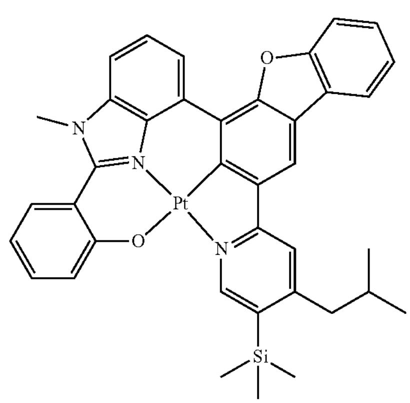

2-11
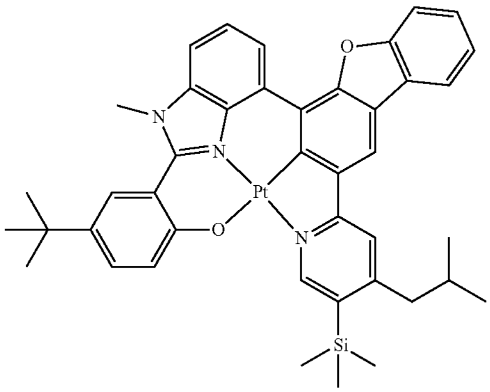
2-12
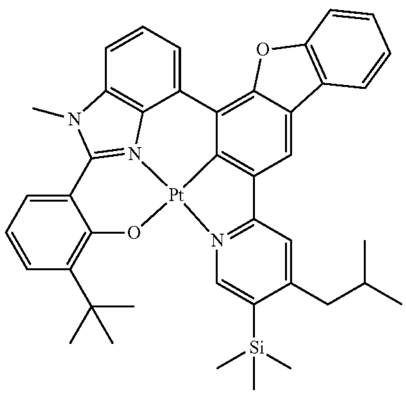
2-13
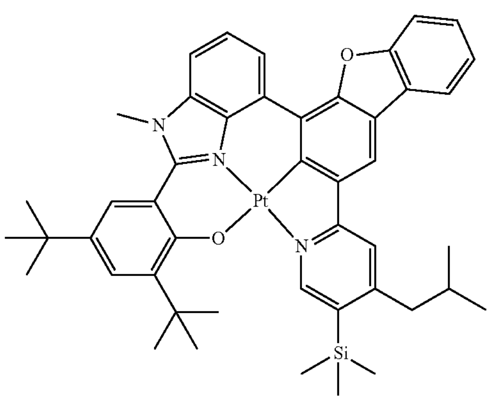
2-14
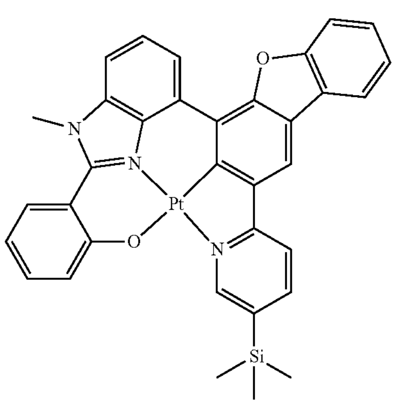
2-15
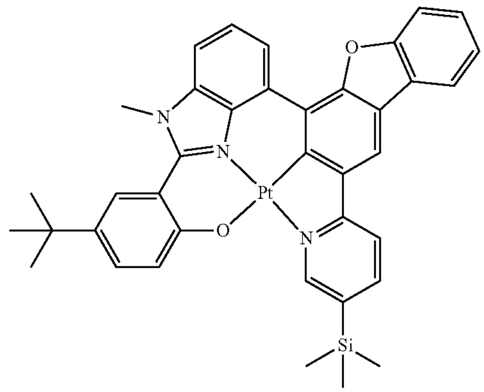
2-16
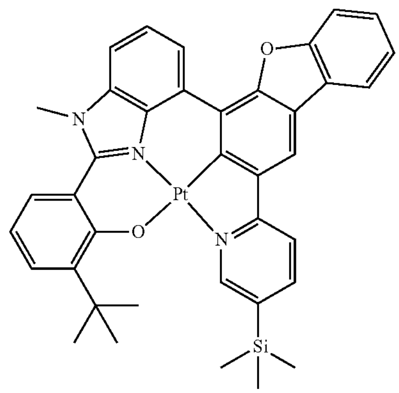
2-17
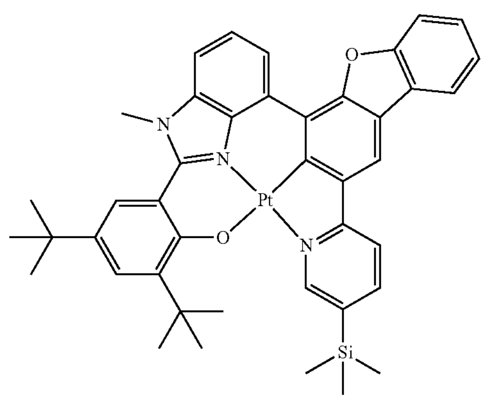
2-18
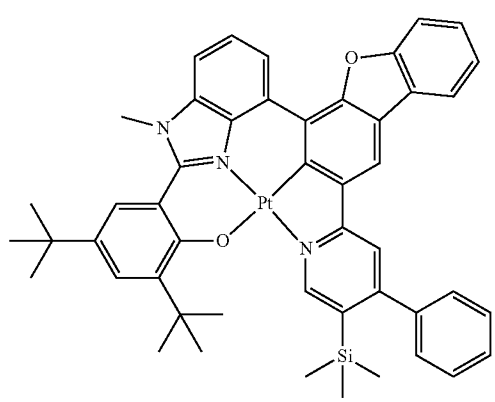

-continued
2-19
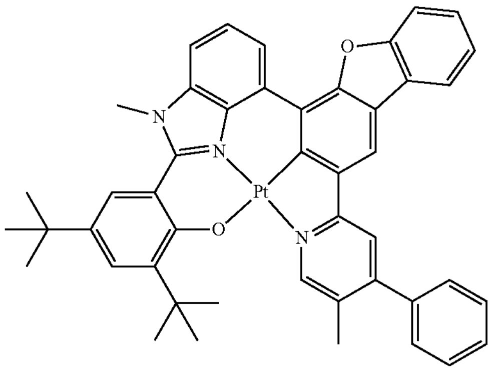
2-20
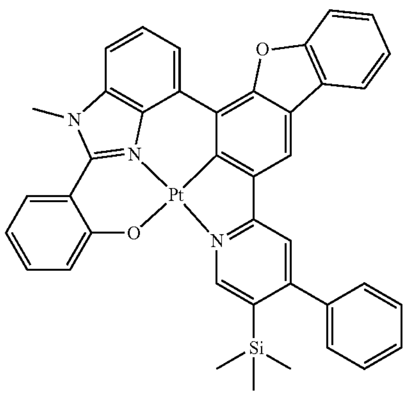
2-21
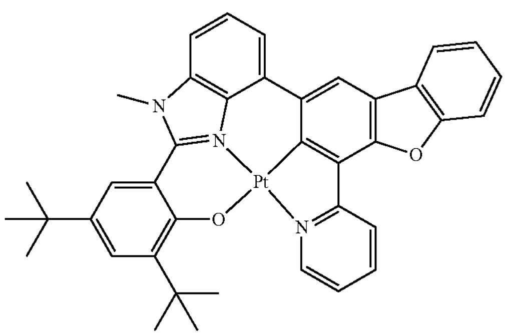
2-22
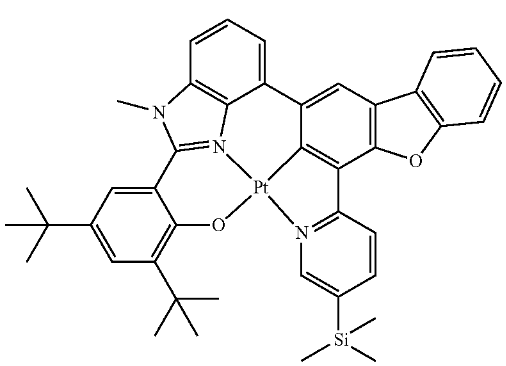
-continued
2-23
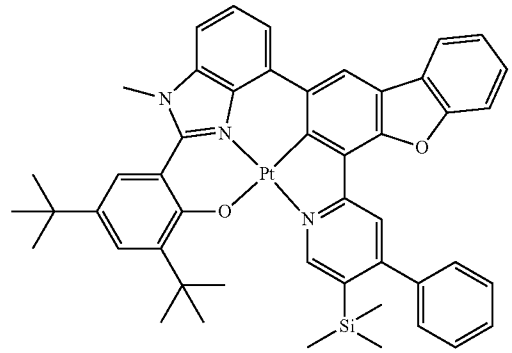
2-24
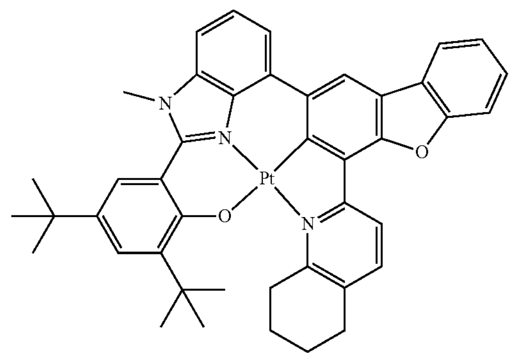
2-25
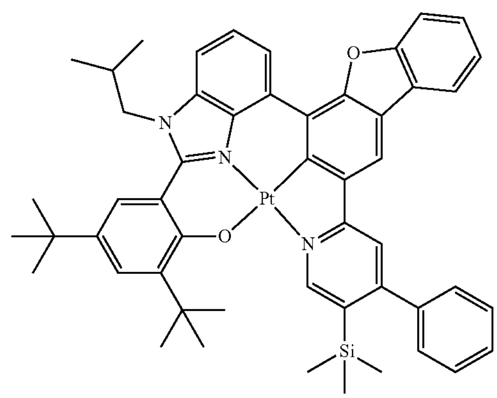
2-26
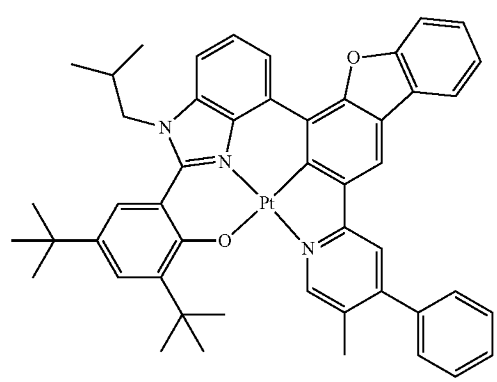

-continued
2-27
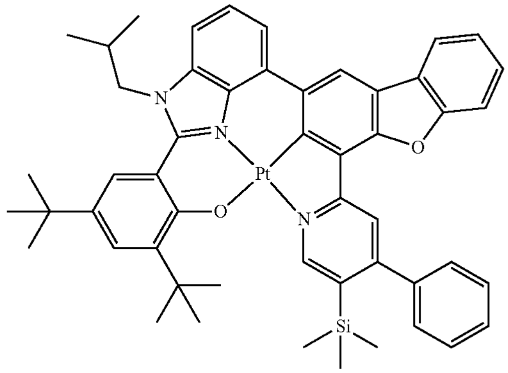
2-28
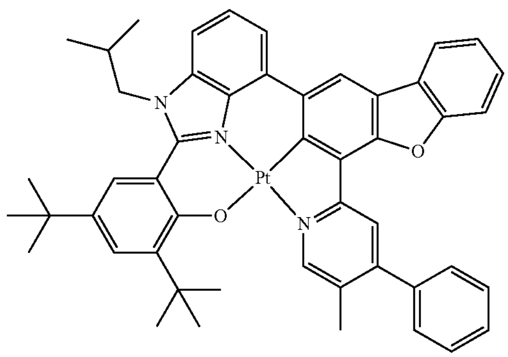
2-29
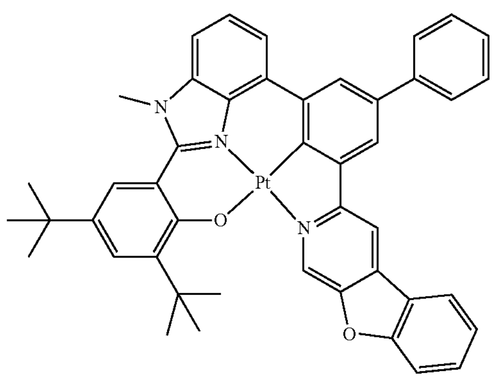
2-30
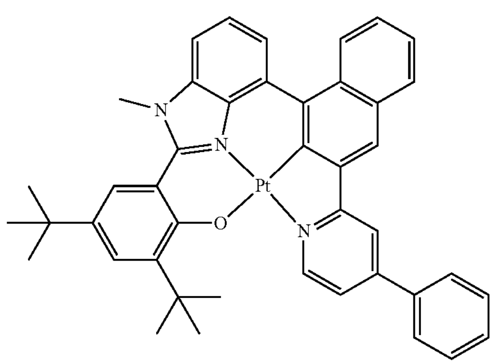
-continued
2-31
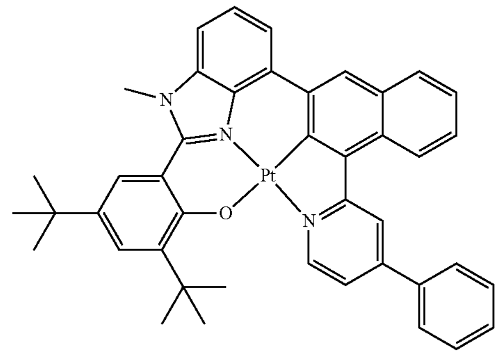
2-32
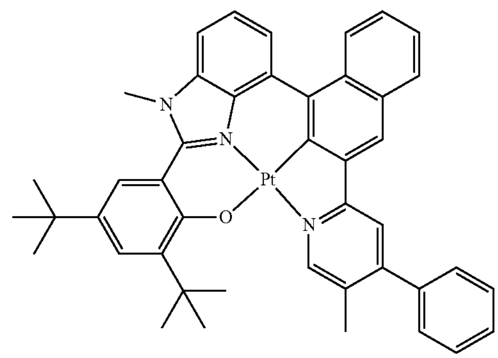
2-33
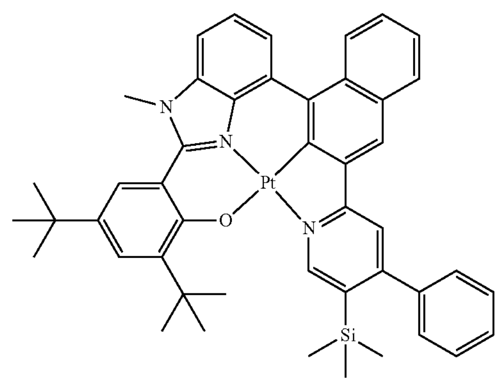
2-34
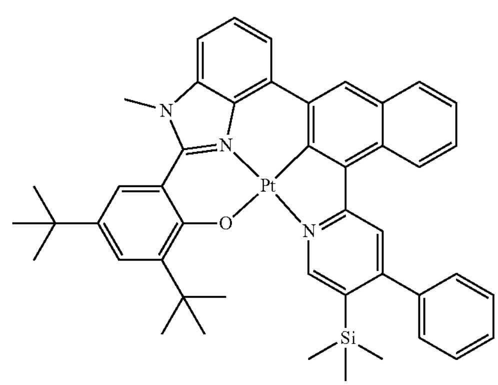

-continued
2-35
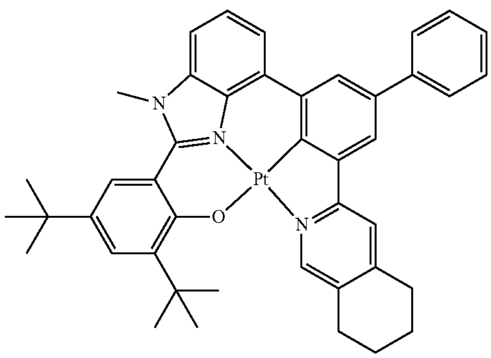
2-36
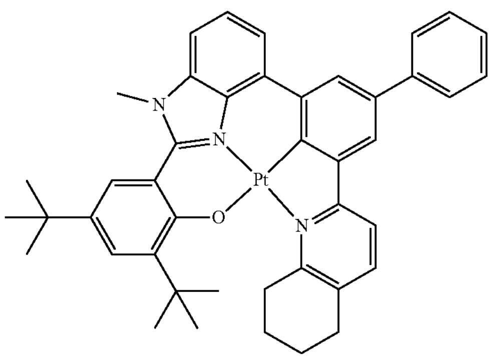
2-37
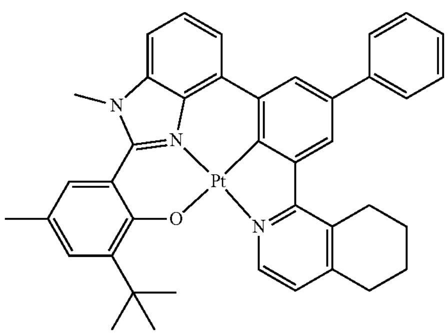
2-38
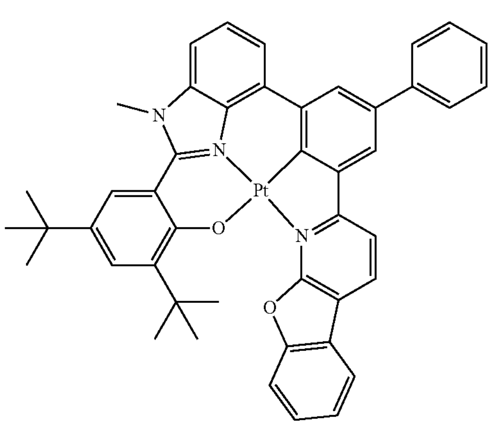
-continued
2-39
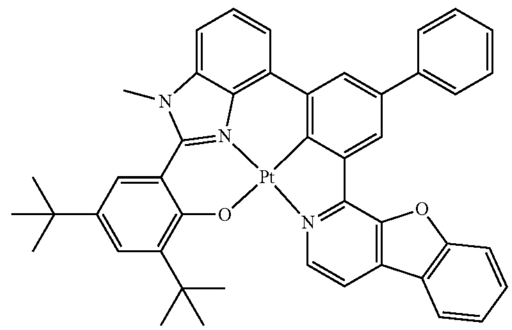
2-40
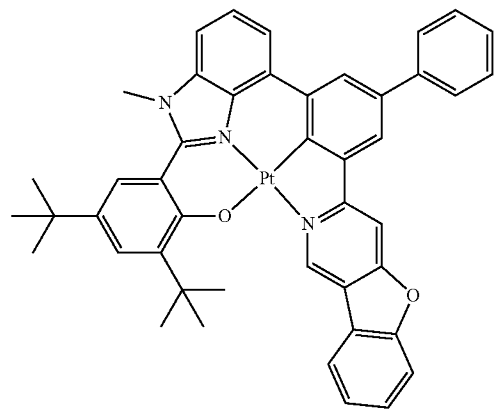
2-41
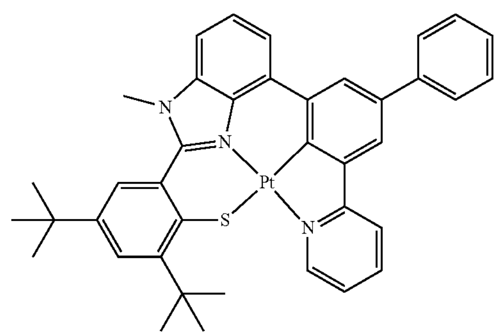
2-42
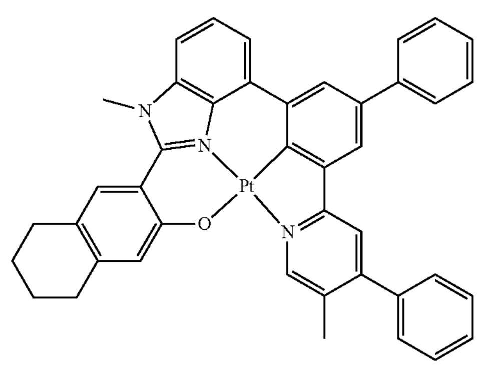

-continued
2-43
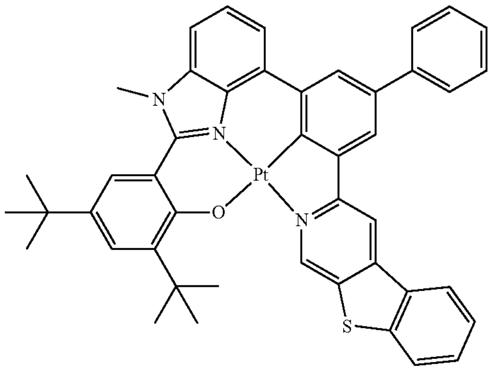
2-44
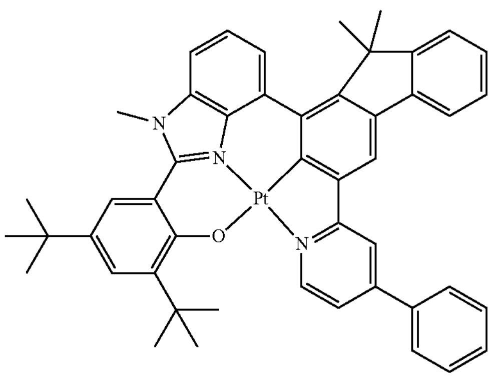
2-45
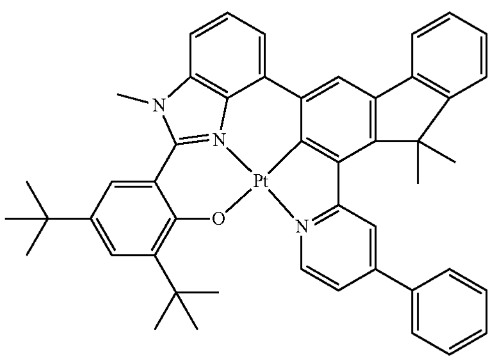
2-46
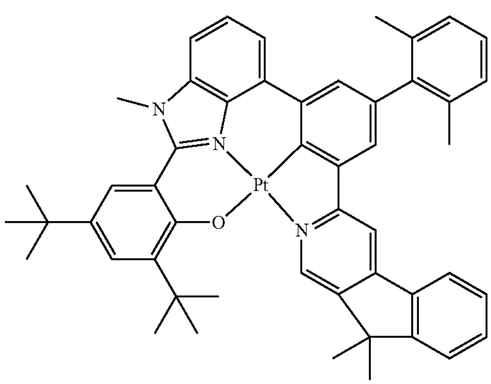
-continued
2-47
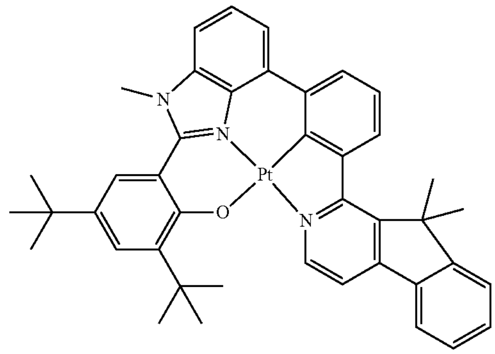
3-1
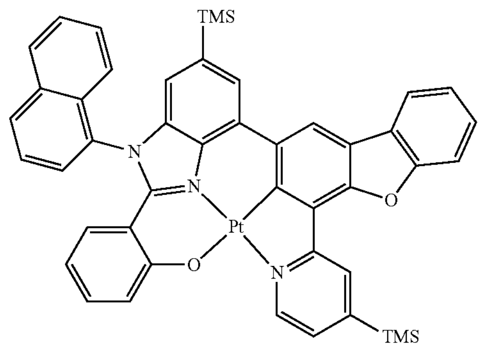
3-2
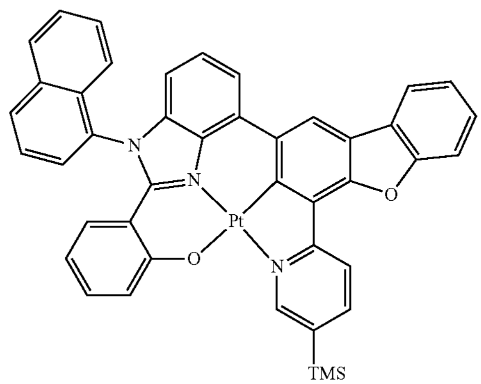
3-3
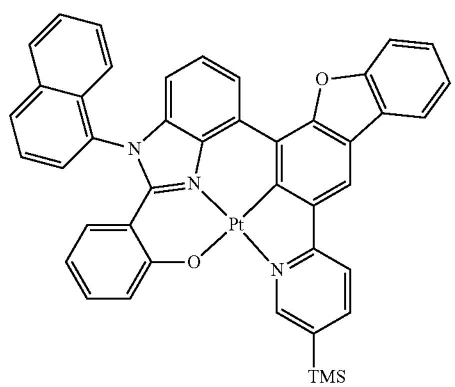

-continued
3-4
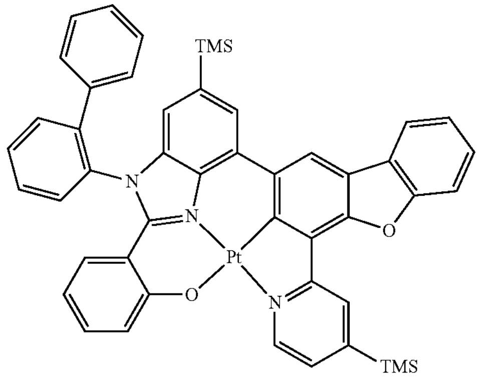
3-5
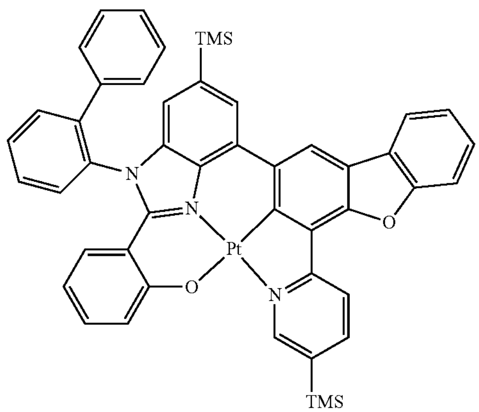
3-6
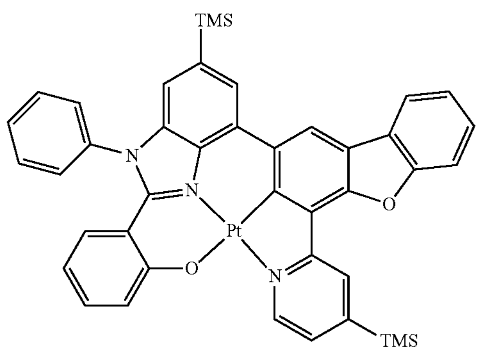
3-7
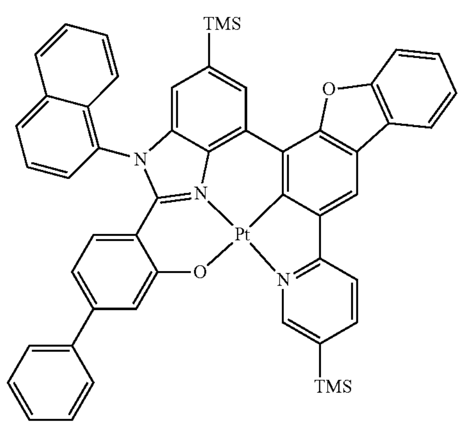
-continued
3-8
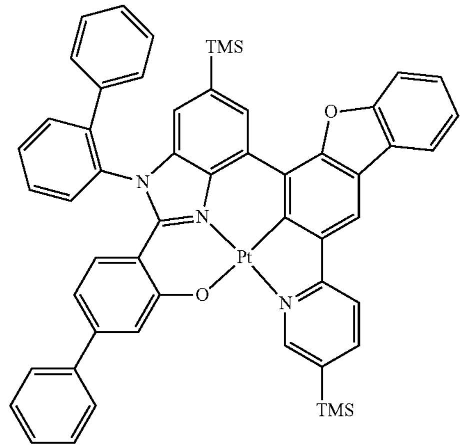
3-9
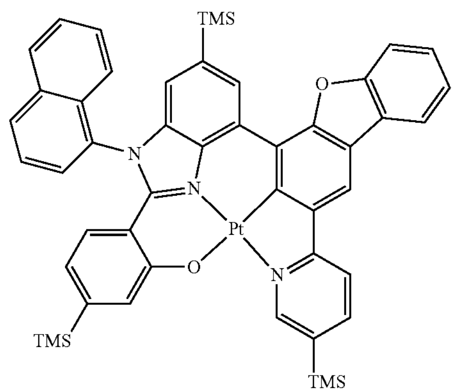
3-10
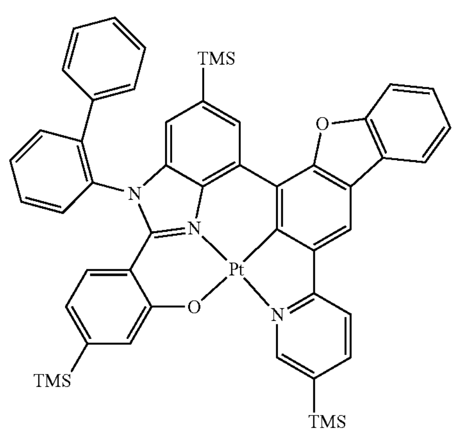

-continued
3-11
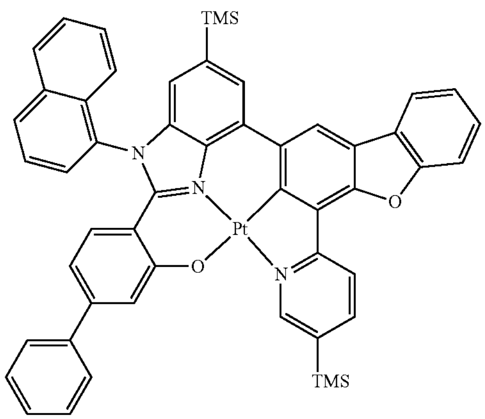
3-12
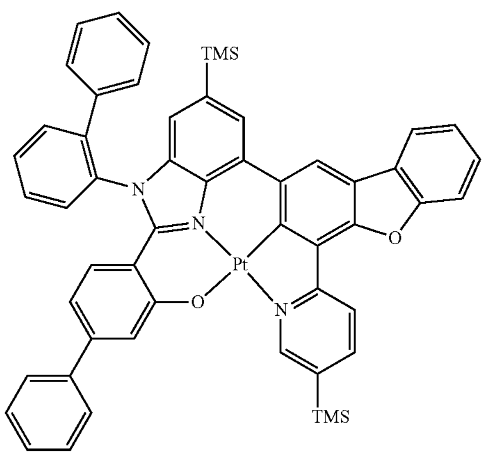
3-13
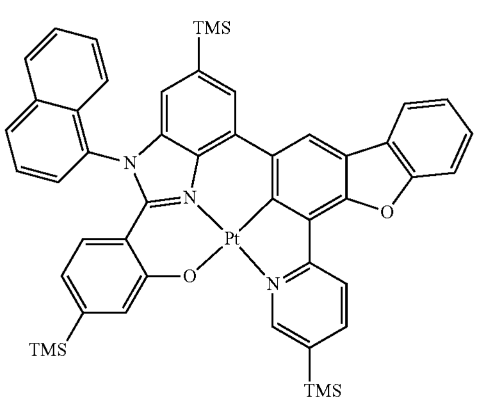
-continued
3-14
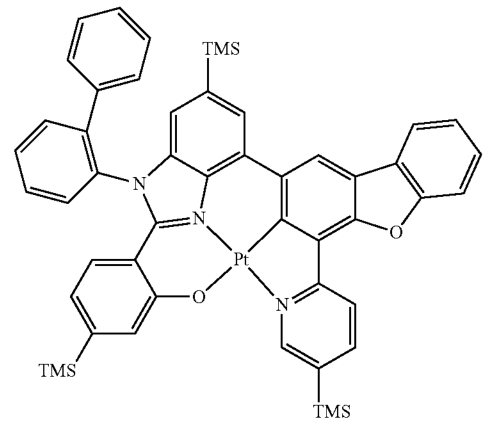
3-15
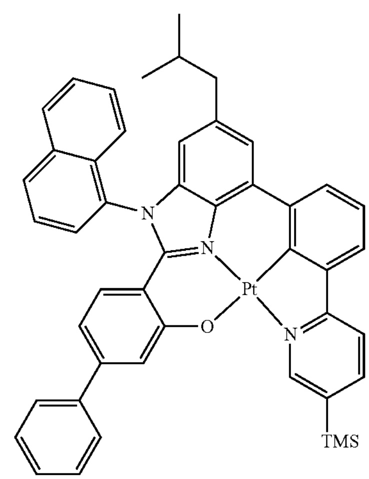
3-16
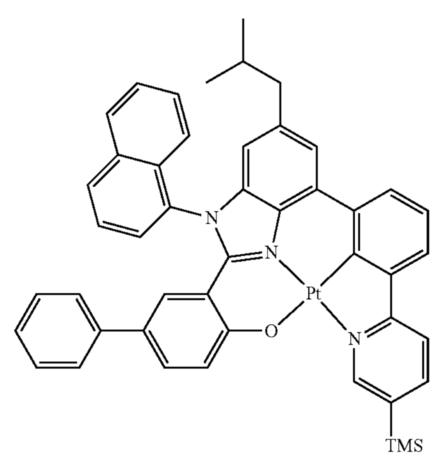

-continued
3-17
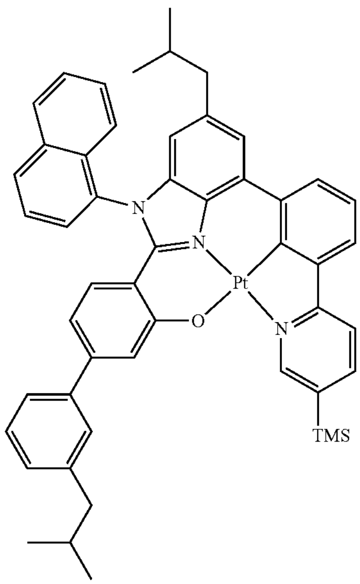
3-18
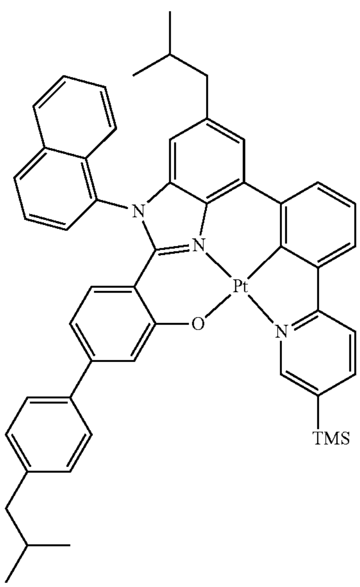
3-19
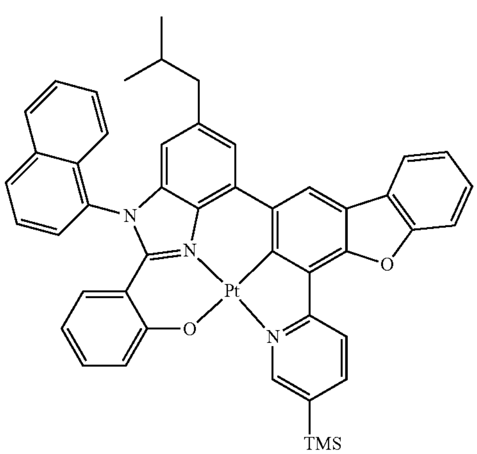
-continued
3-20
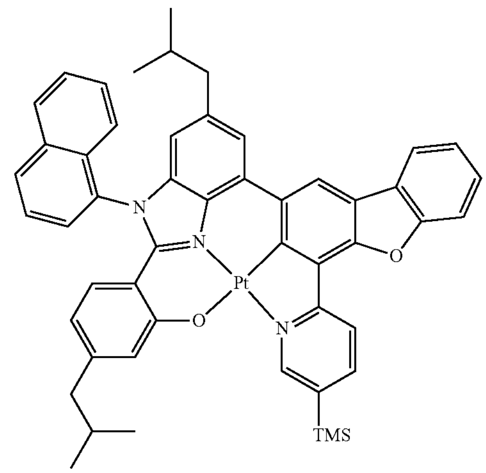
3-21
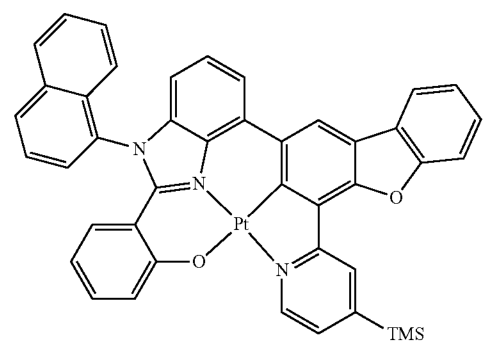
3-22
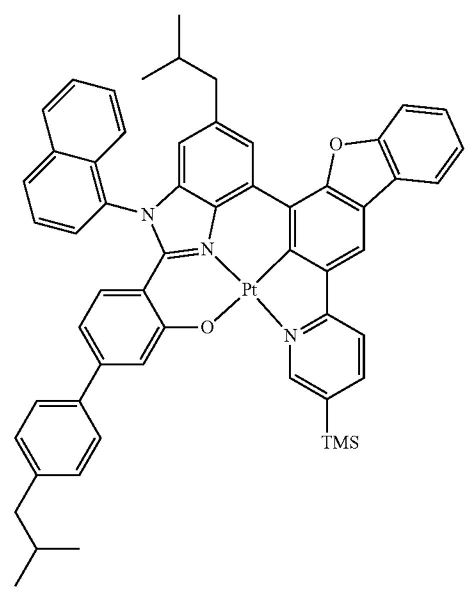

-continued
3-23
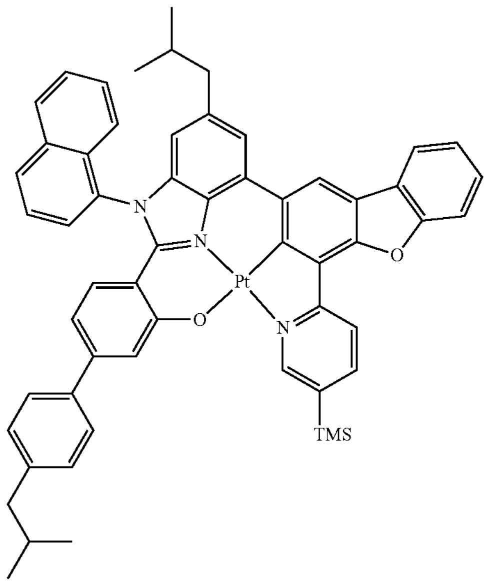
3-24
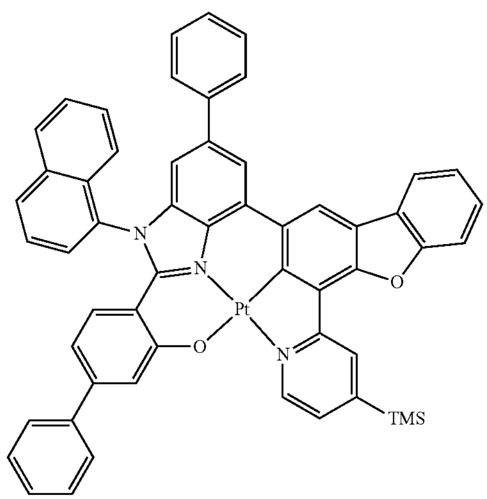
3-25
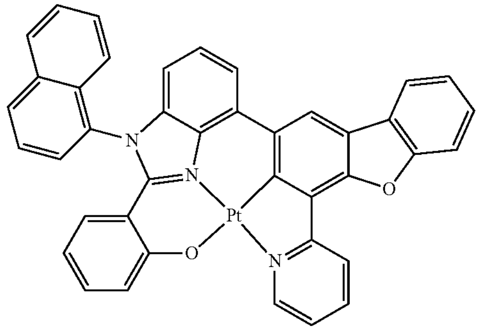
-continued
3-26
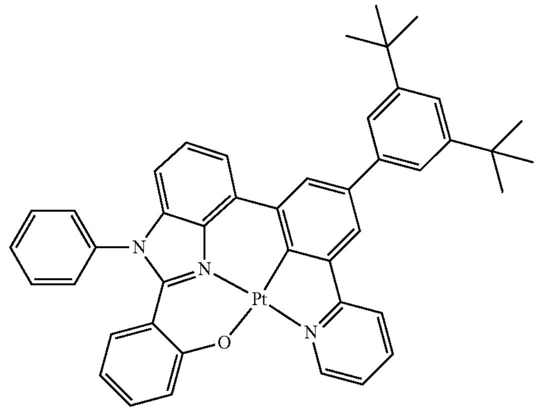
3-27
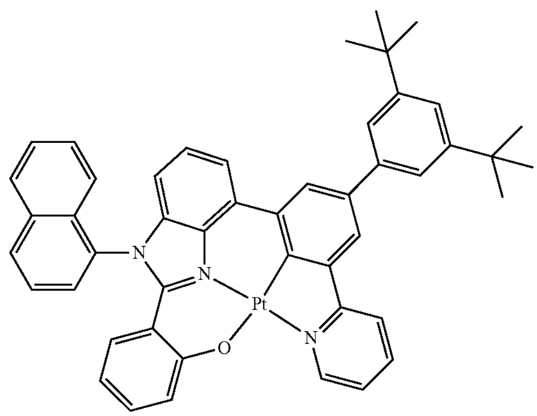
3-28
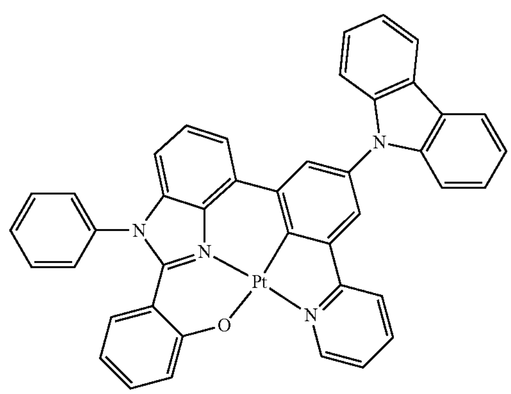

-continued
3-29
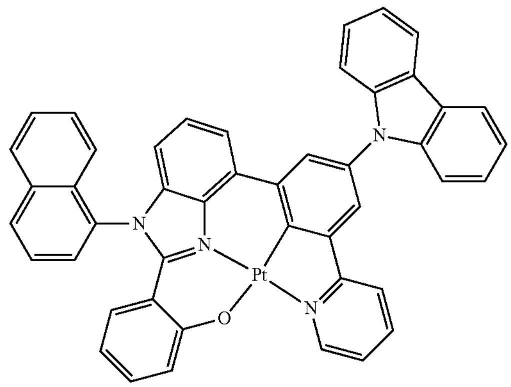
3-30
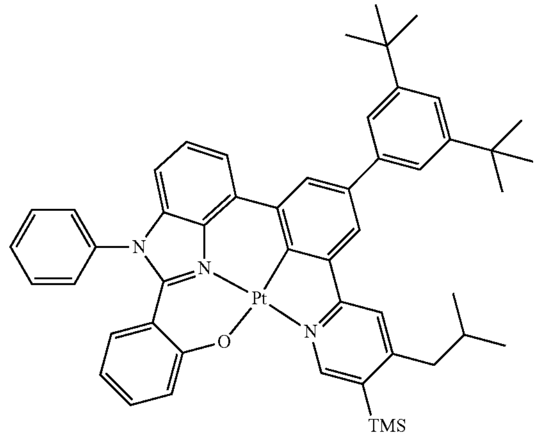
3-31
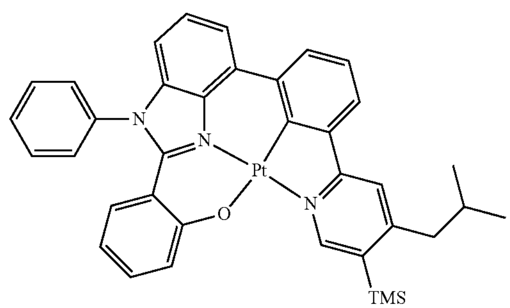
3-32
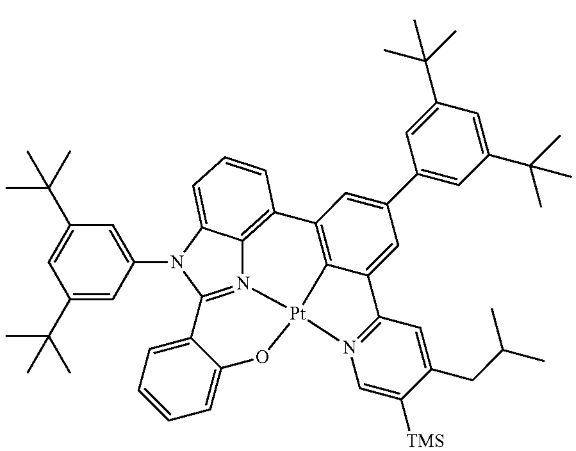
-continued
3-33
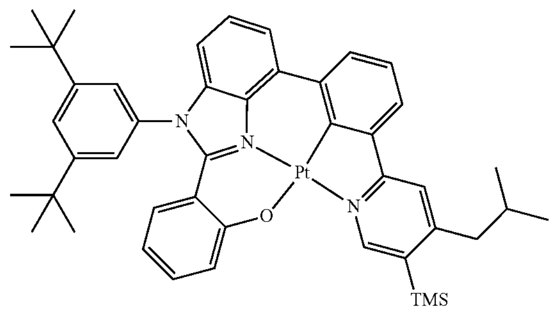
3-34
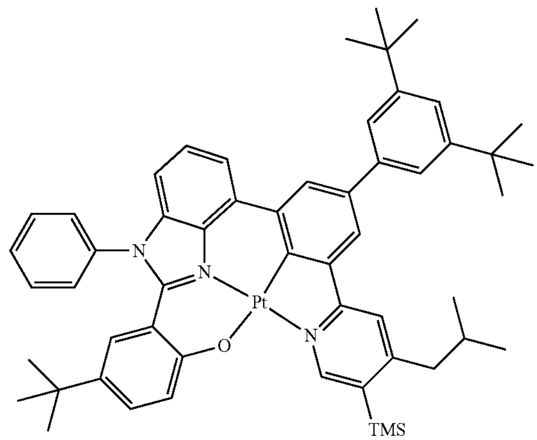
3-35
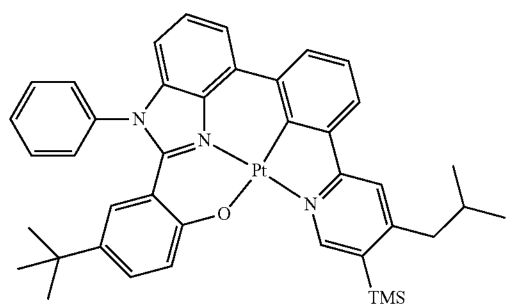
3-36
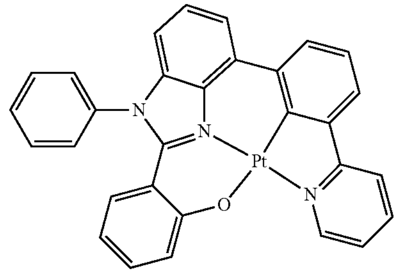

-continued
3-37
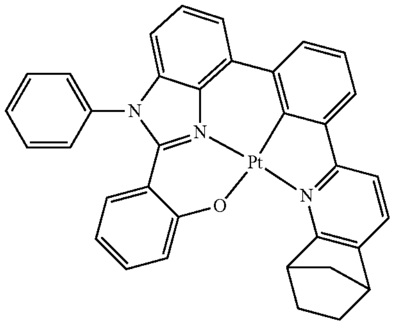
3-38
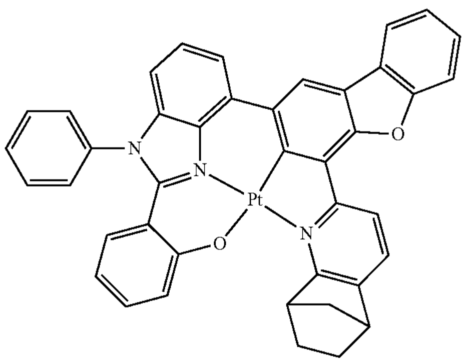
3-39
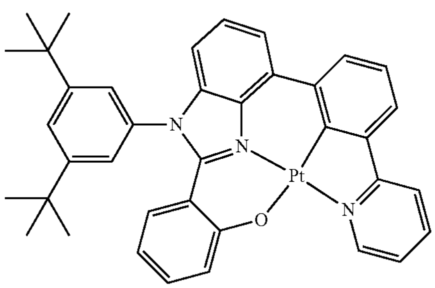
3-40
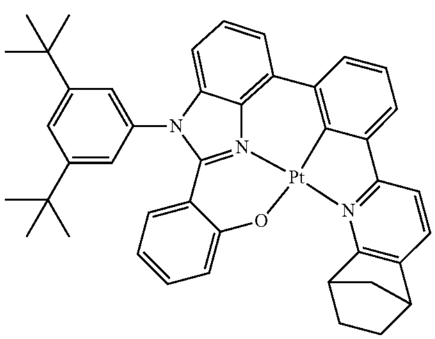
-continued
3-41
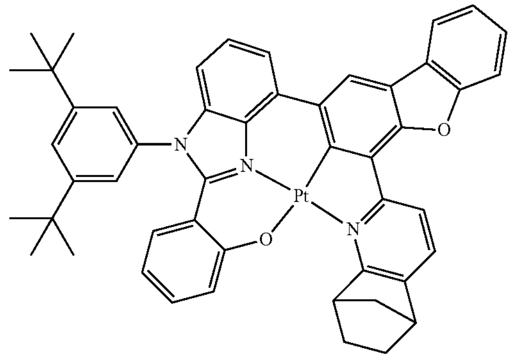
3-42
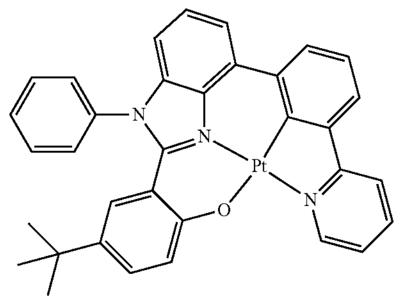
3-43
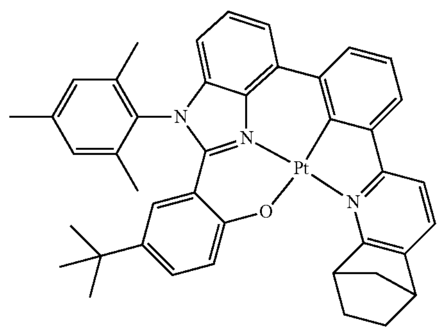
3-44
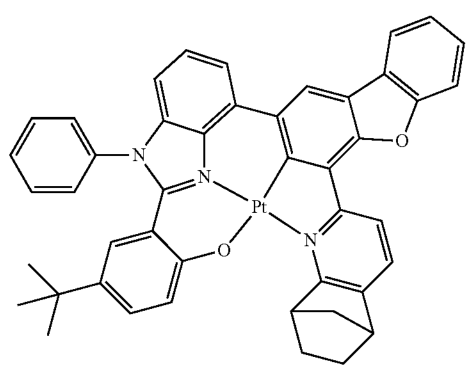

-continued
3-45
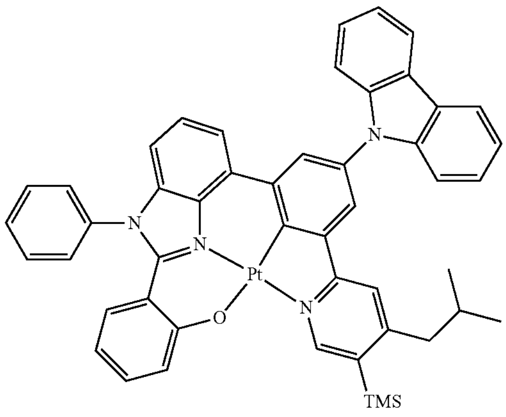
3-46
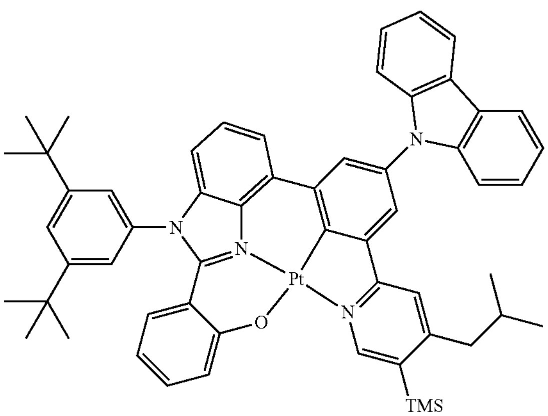
3-47
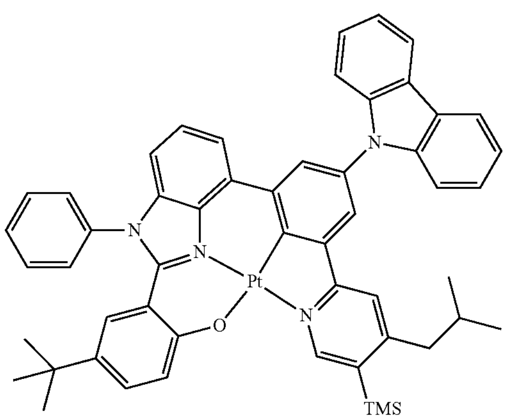
-continued
3-48
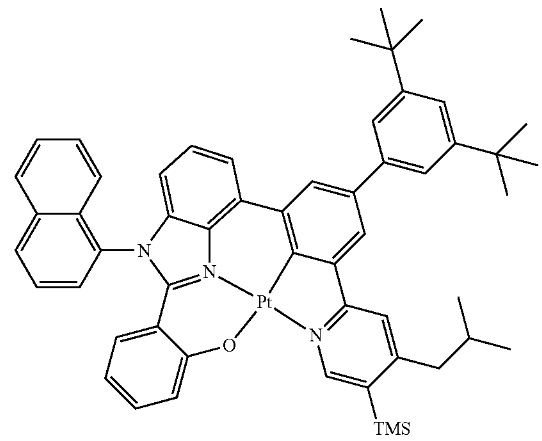
3-49
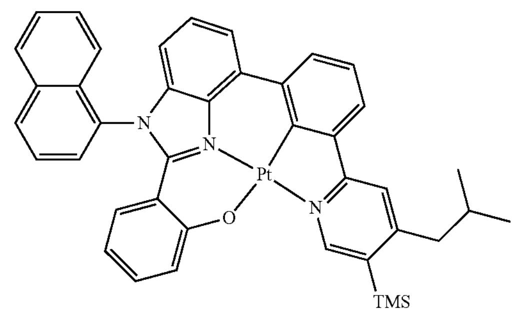
3-50
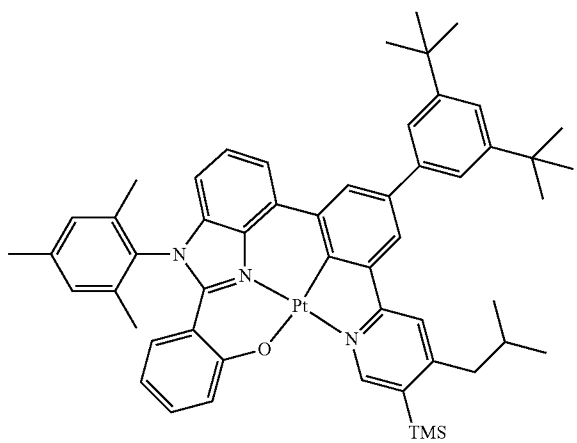
3-51
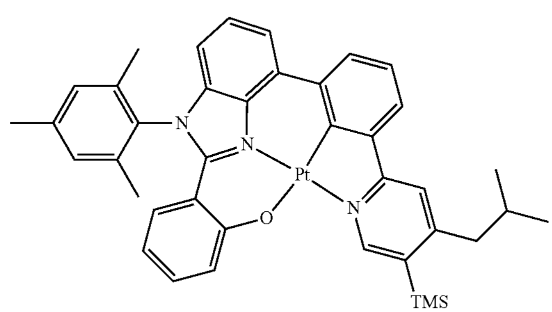

3-52
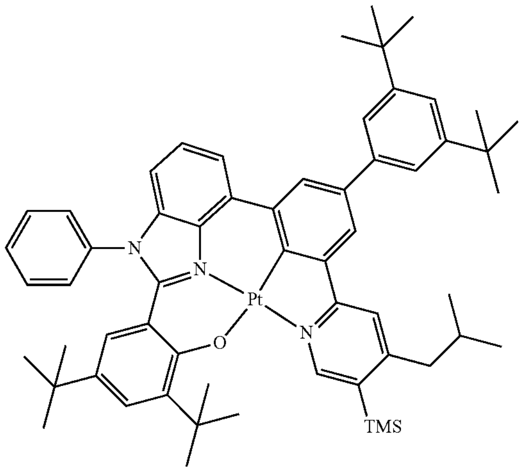
3-53
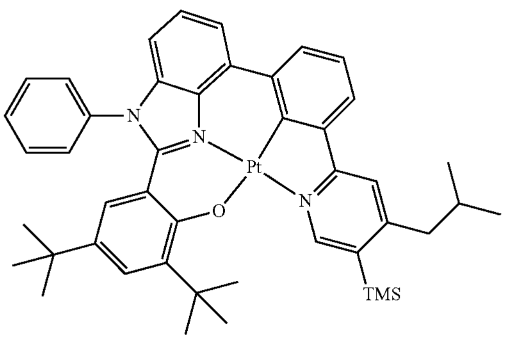
3-54
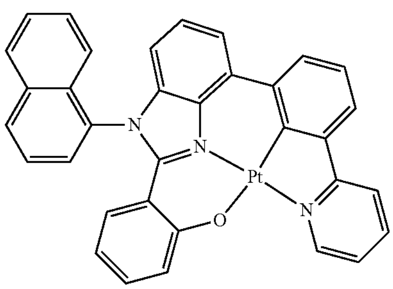
3-55
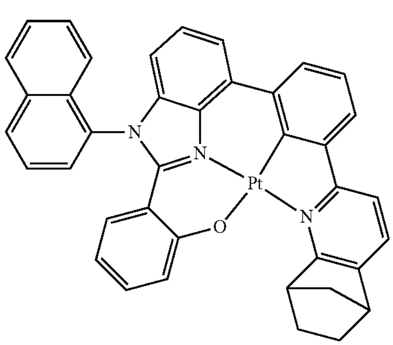
3-56
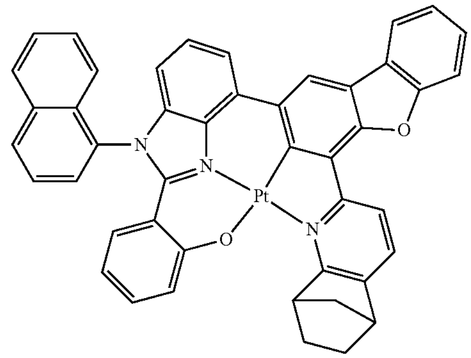
3-57
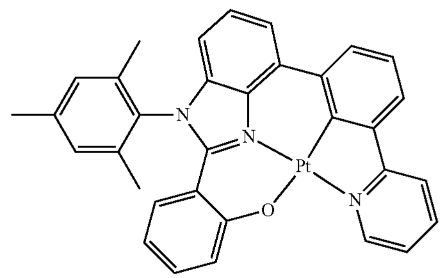
3-58
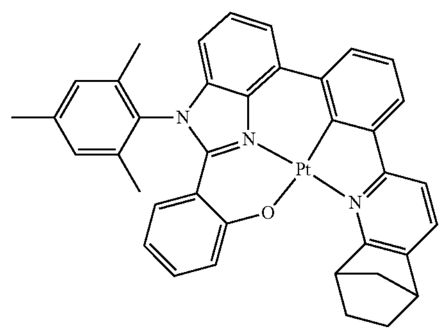
3-59
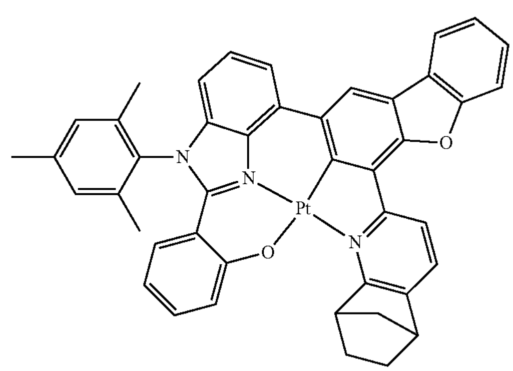

-continued
3-60
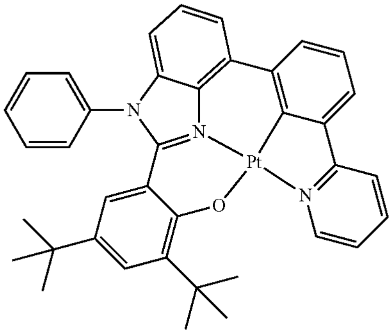
3-61
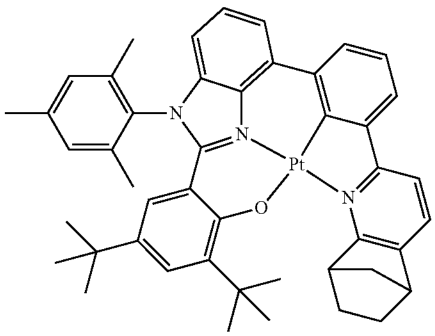
3-62
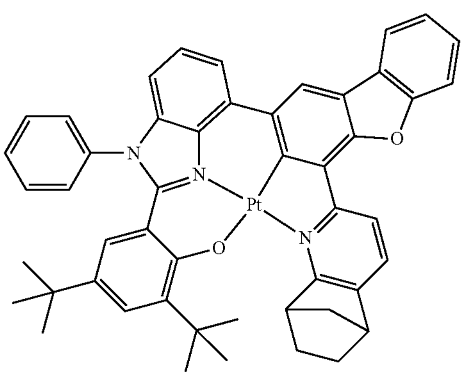
3-63
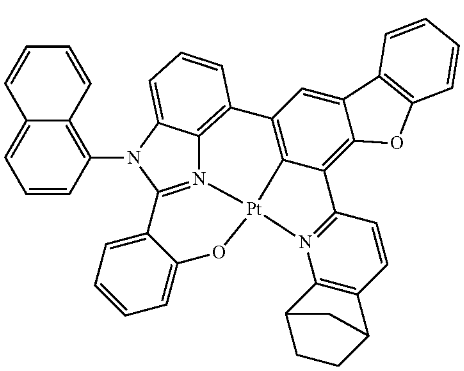
-continued
3-64
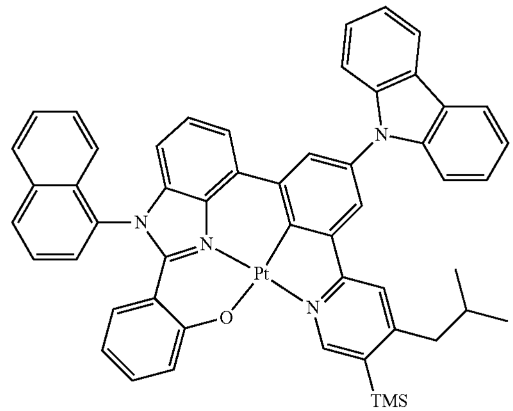
3-65
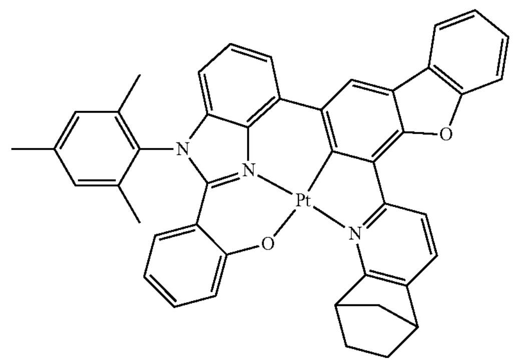
3-66
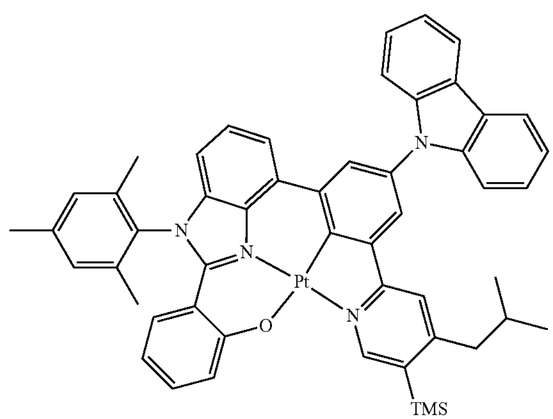
3-67
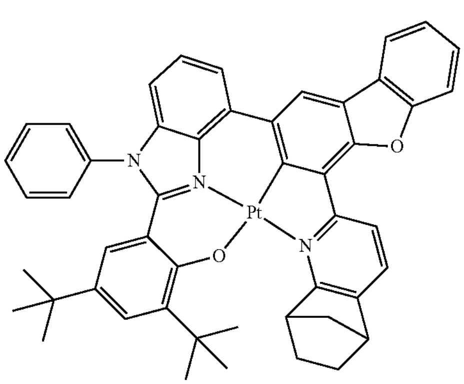

-continued
3-68
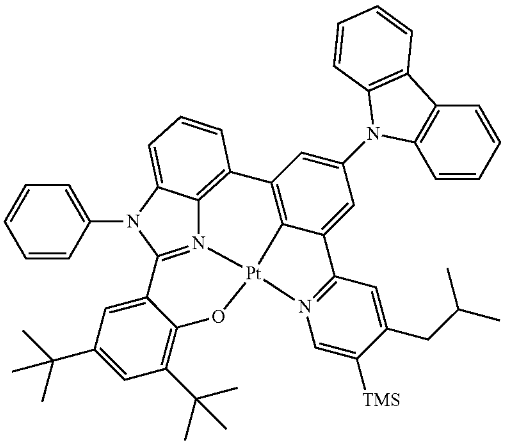
3-69
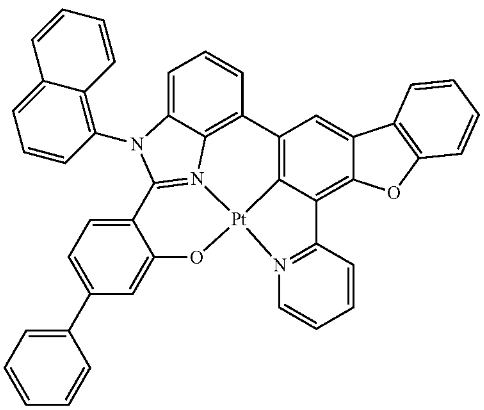
3-70
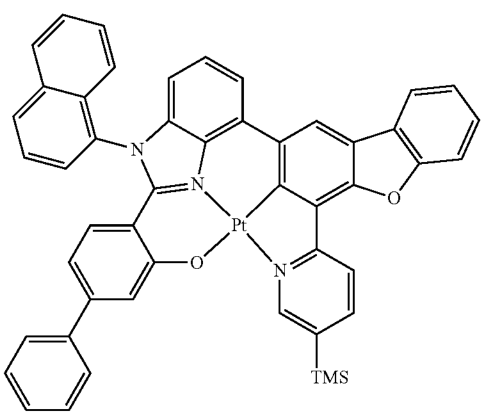
3-71
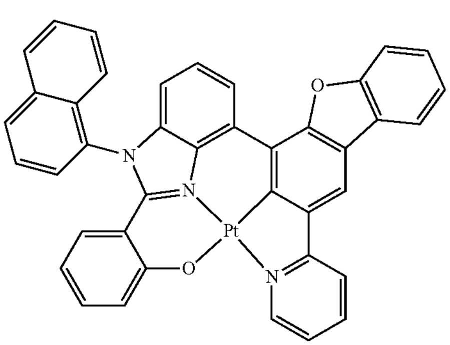
-continued
3-72
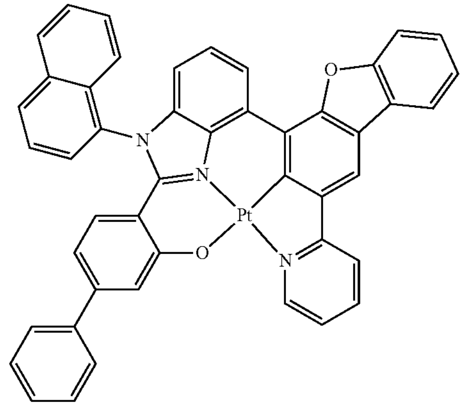
3-73
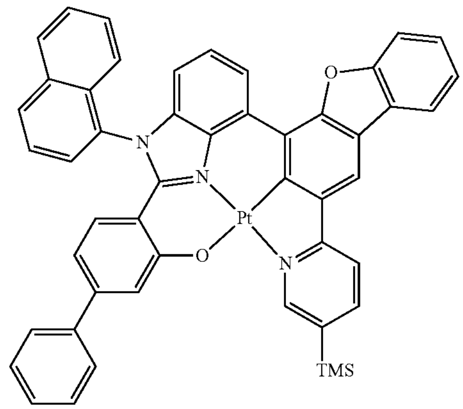
3-74
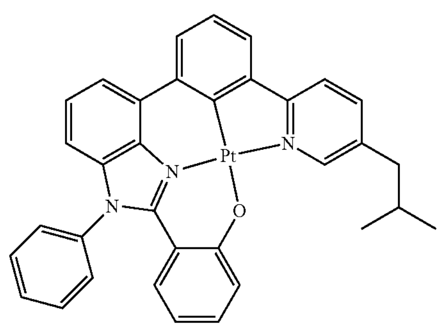
3-75
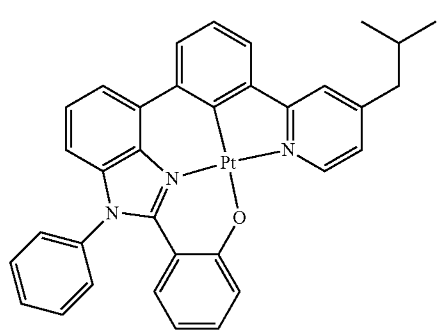

-continued
3-76
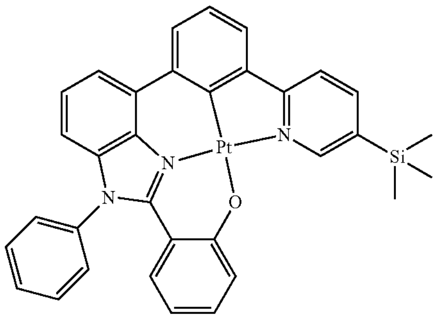
3-77
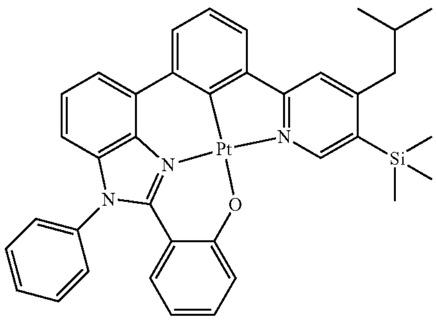
3-78
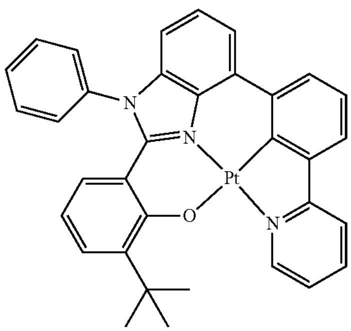
3-79
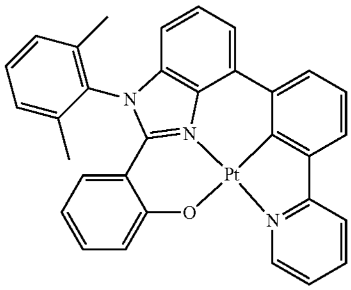
3-80
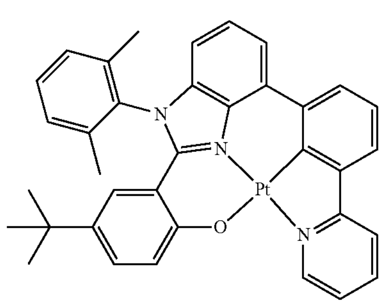
-continued
3-81
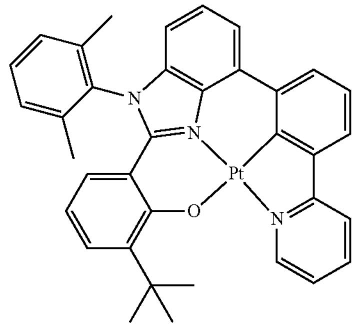
3-82
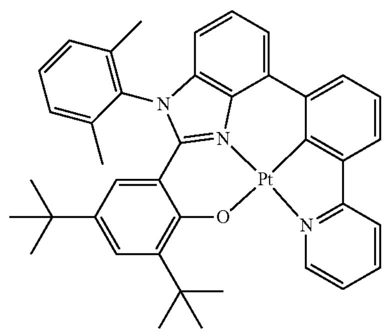
3-83
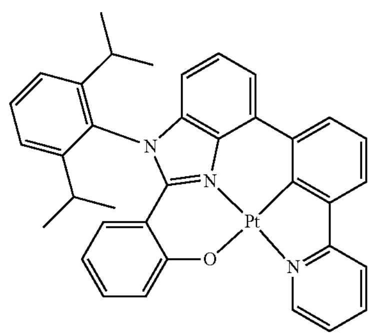
3-84
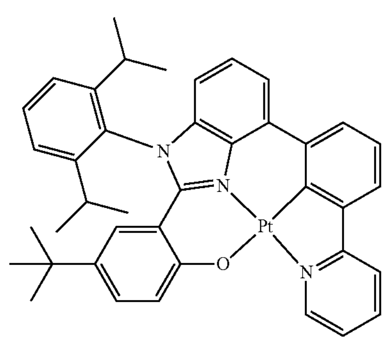

-continued
3-85
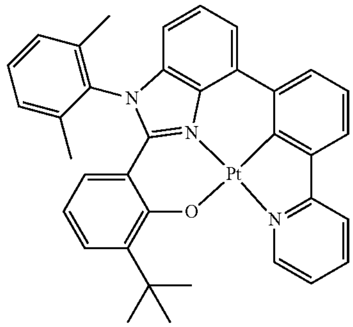
3-86
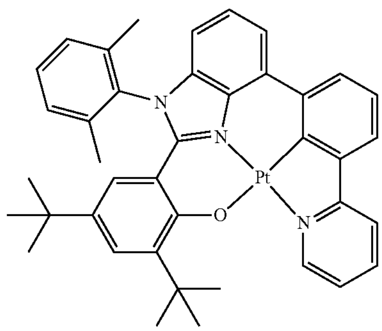
3-87
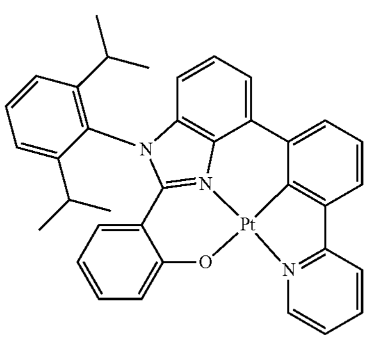
3-88
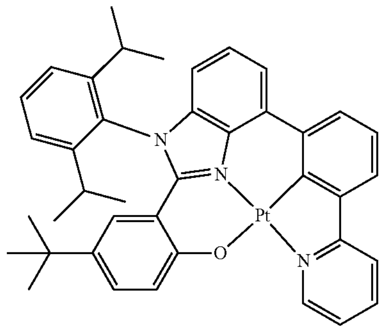
-continued
3-89
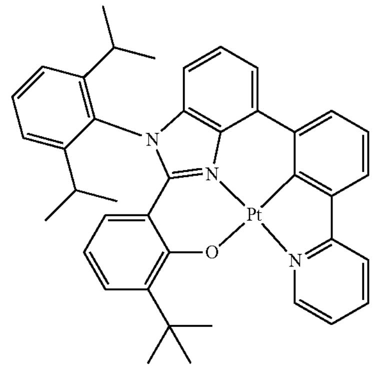
3-90
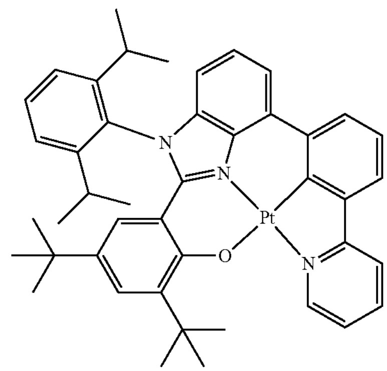
3-91
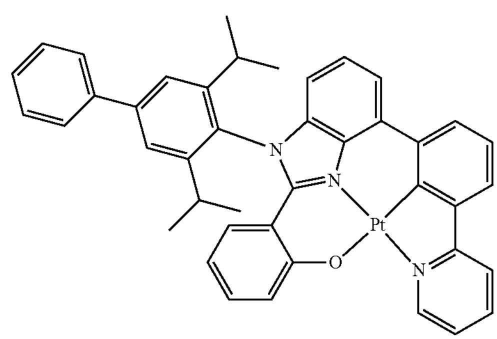
3-92
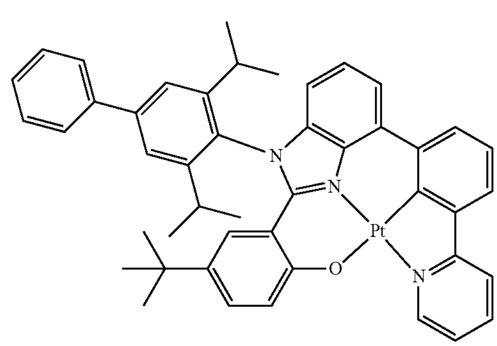

-continued
3-93
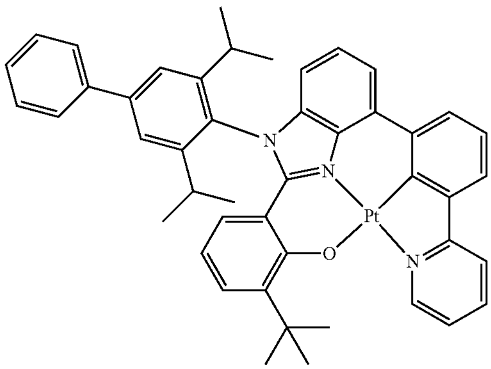
3-94
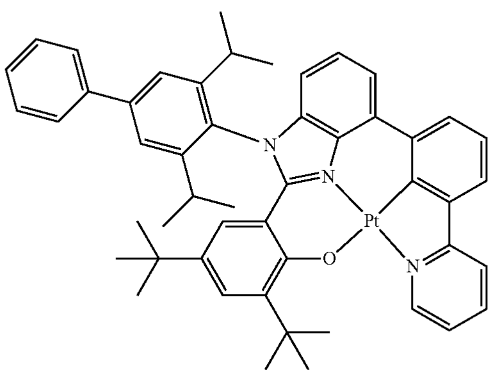
3-95
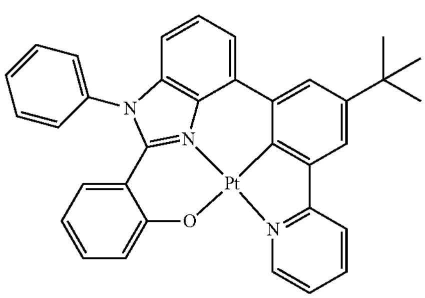
3-96
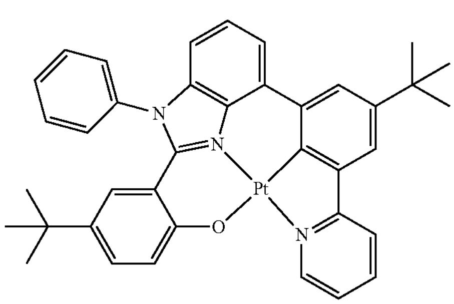
-continued
3-97
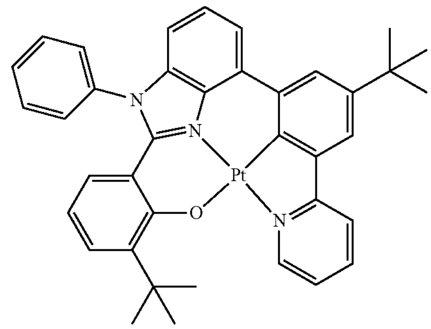
3-98
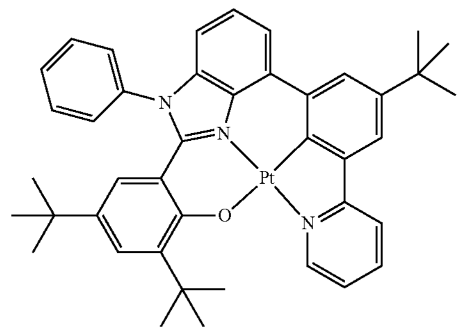
3-99
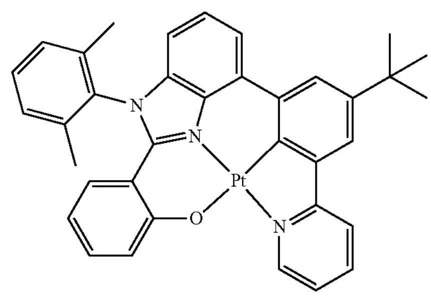
3-100
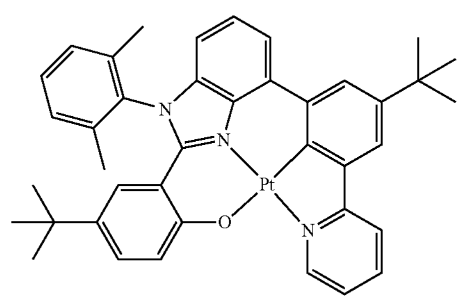
3-101
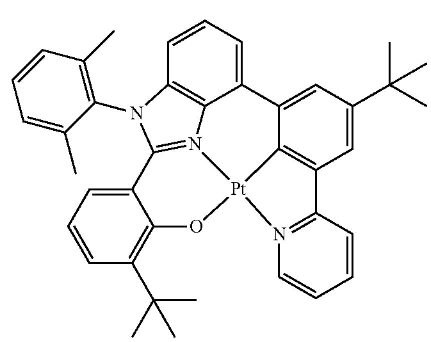

-continued
3-102
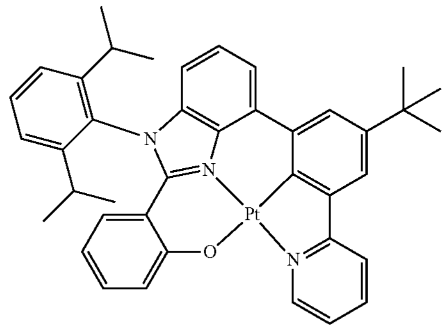
3-103
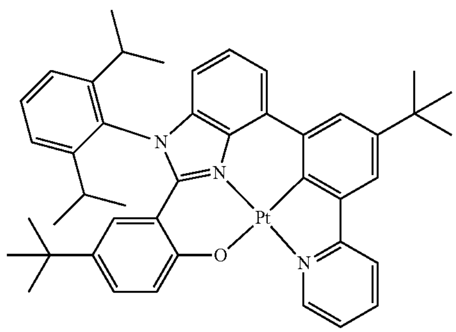
3-104
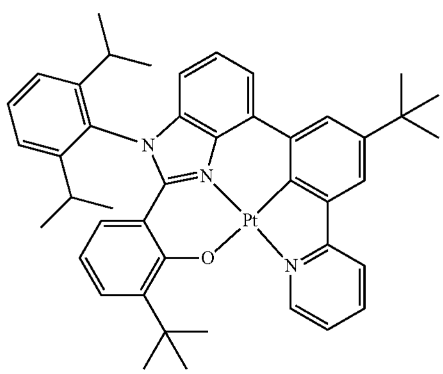
3-105
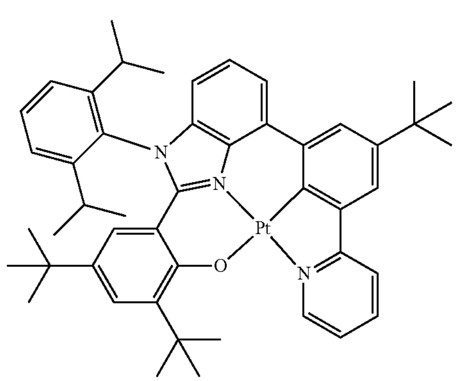
-continued
3-106
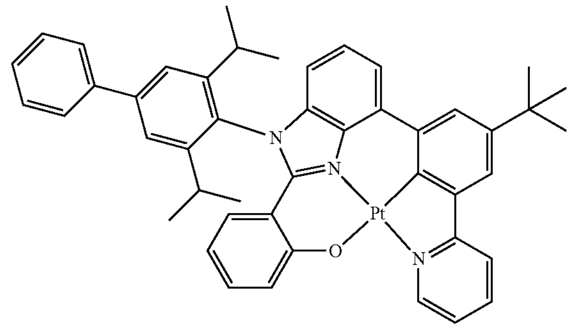
3-107
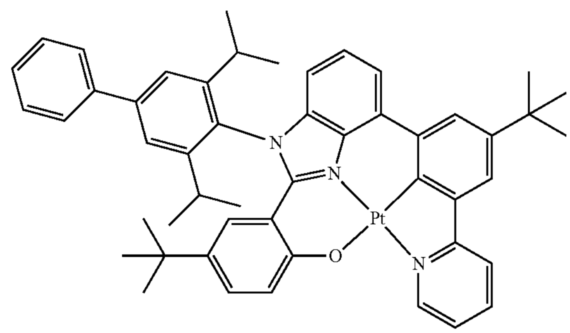
3-108
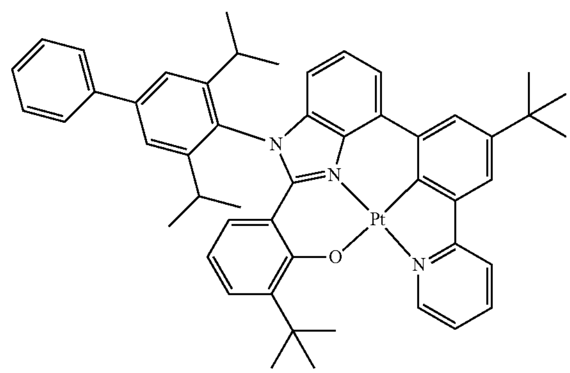
3-109
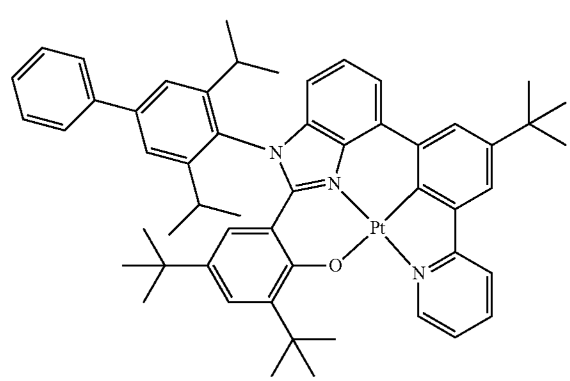

-continued
3-110
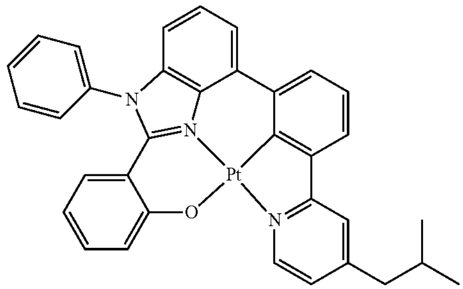
3-111
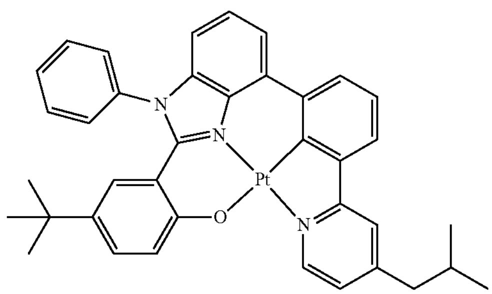
3-112
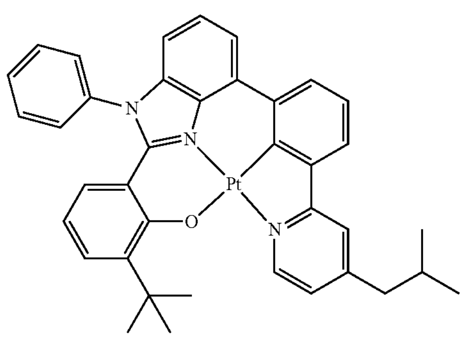
3-113
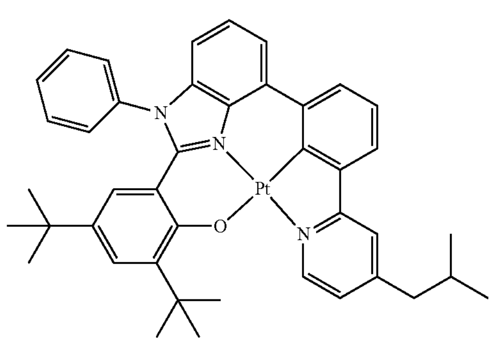
-continued
3-114
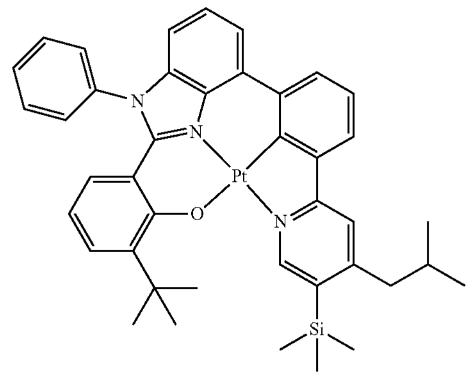
3-115
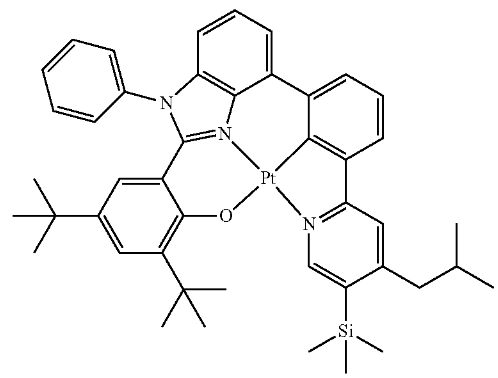
3-116
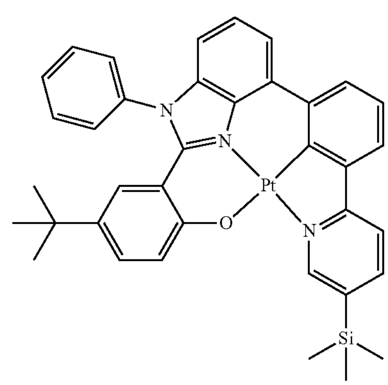
3-117
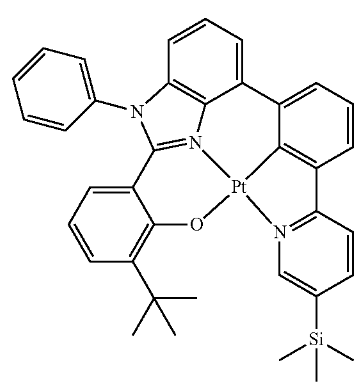

3-118
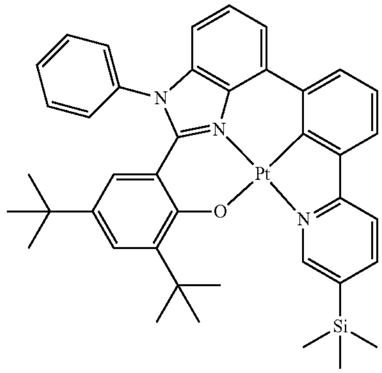
3-119
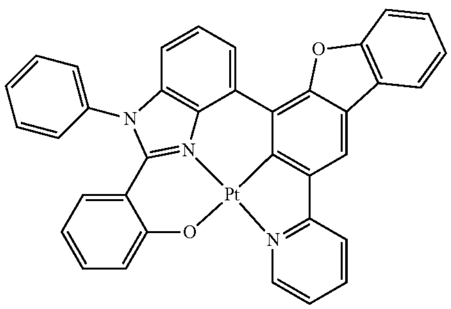
3-120
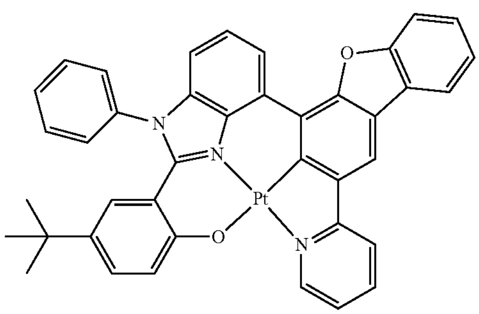
3-121
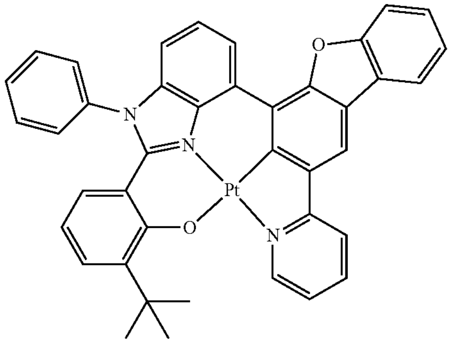
3-122
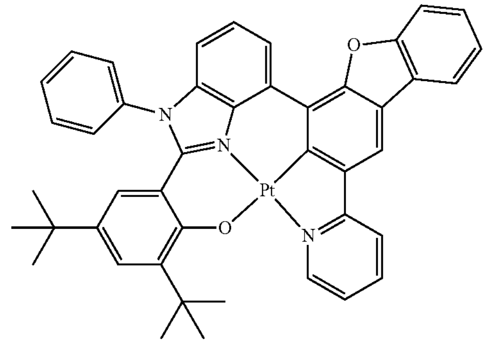
3-123
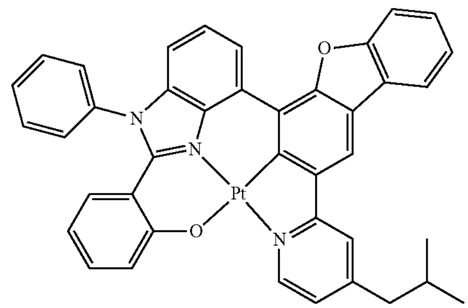
3-124
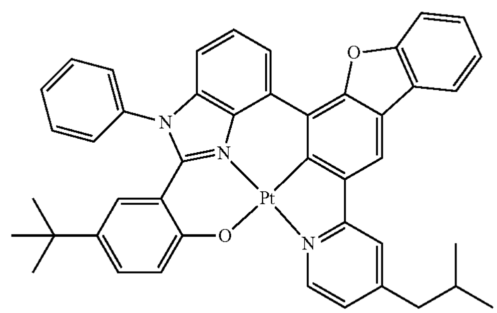
3-125
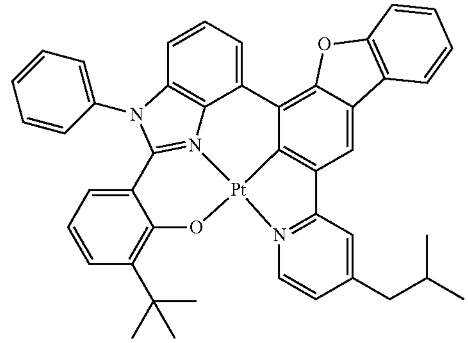

-continued
3-126
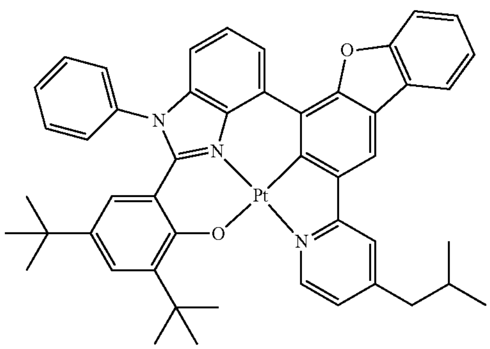
3-127
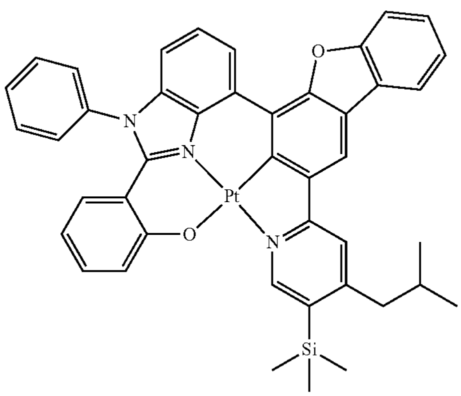
3-128
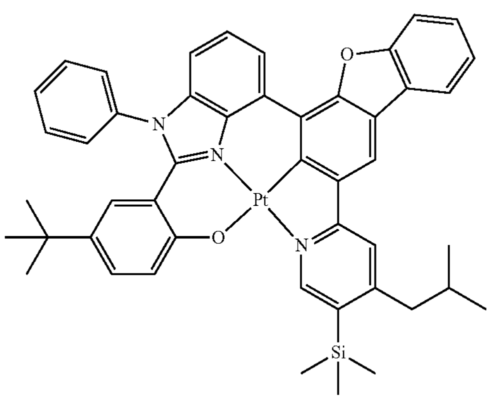
3-129
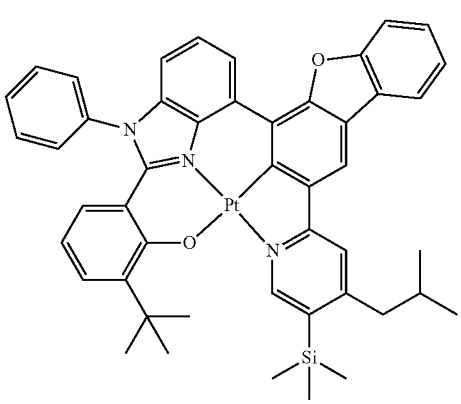
-continued
3-130
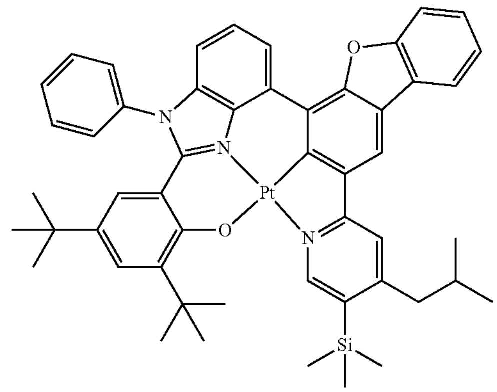
3-131
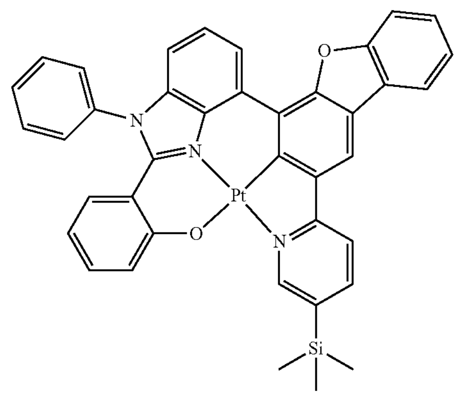
3-132
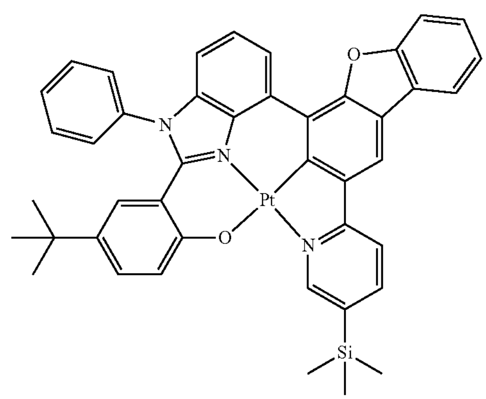
3-133
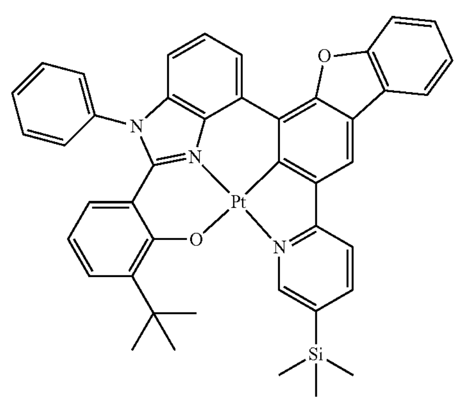

-continued
3-134
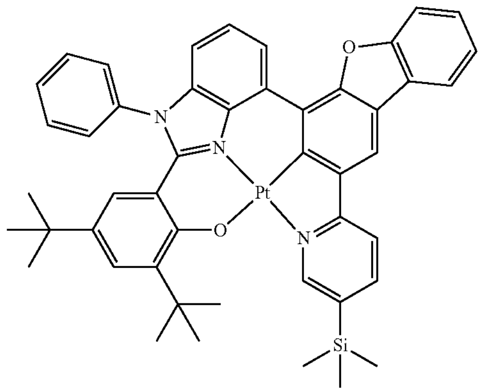
3-135
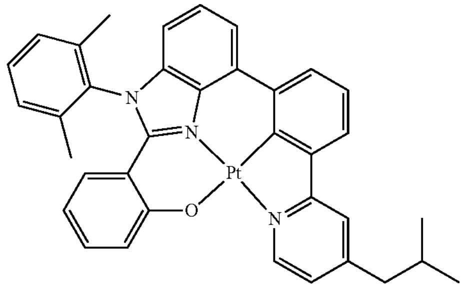
3-136
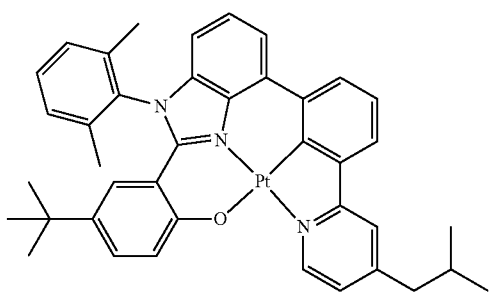
3-137
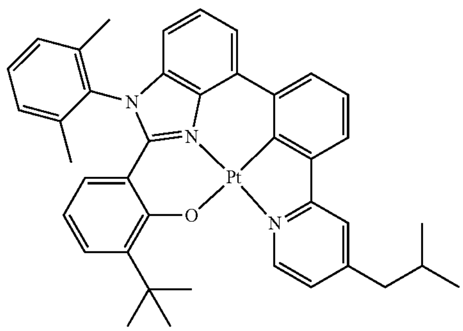
-continued
3-138
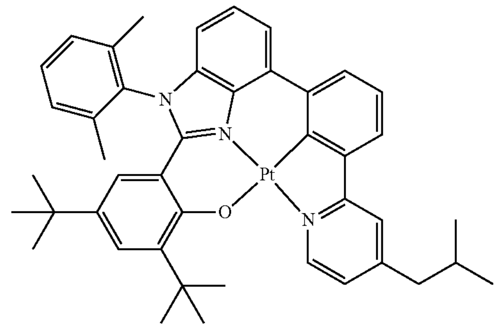
3-139
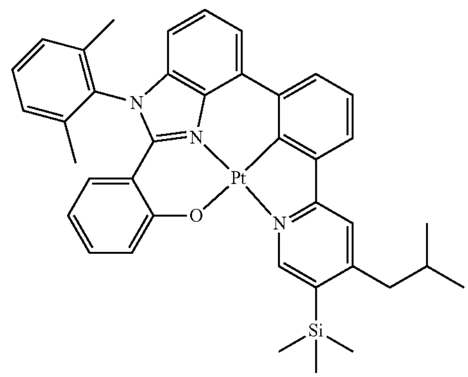
3-140
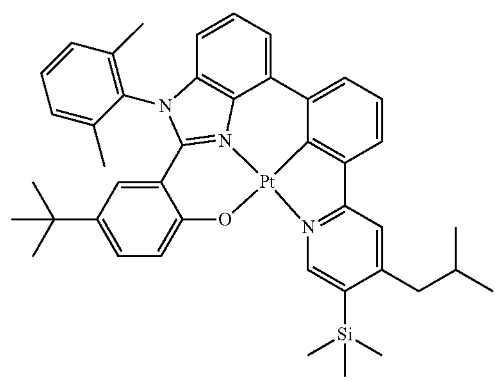
3-141
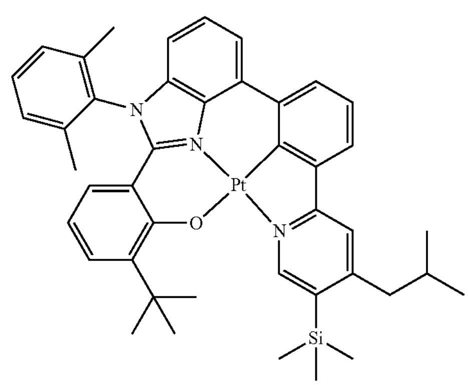

-continued
3-142
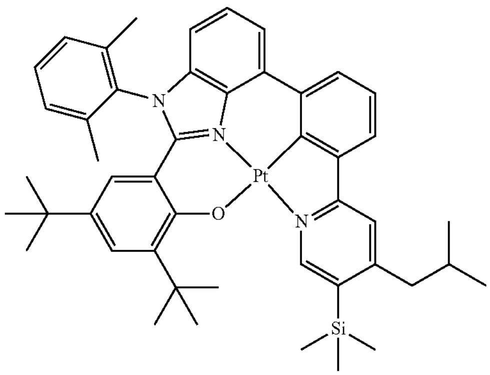
3-143
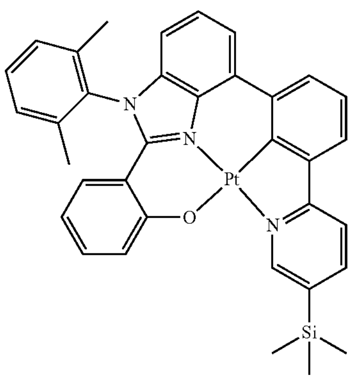
3-144
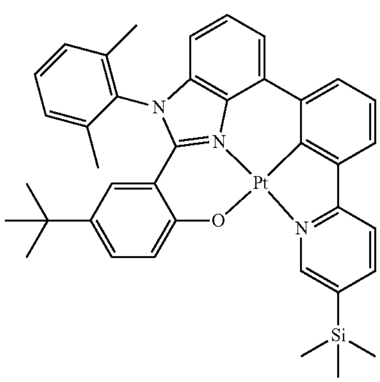
3-145
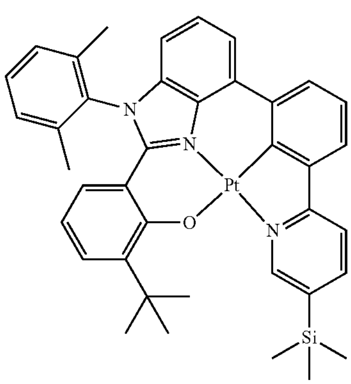
-continued
3-146
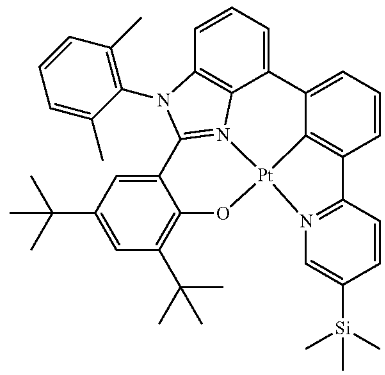
3-147
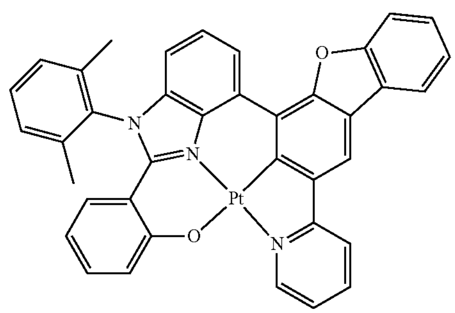
3-148
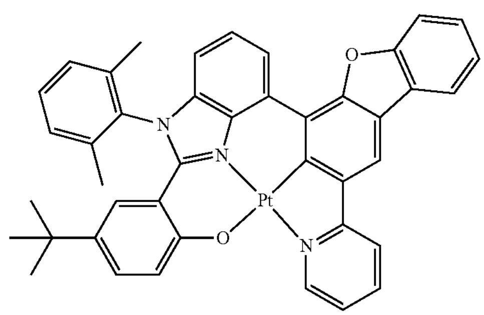
3-149
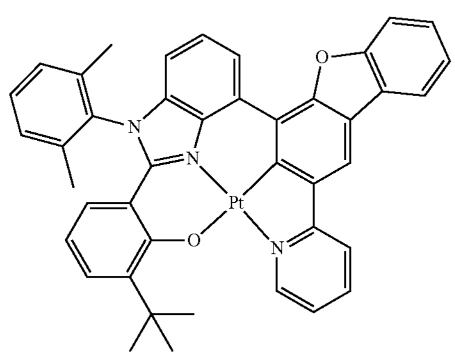

-continued
3-150
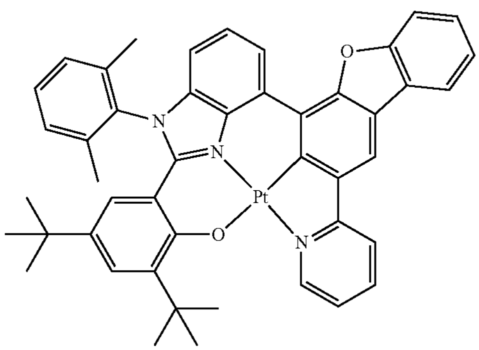
3-151
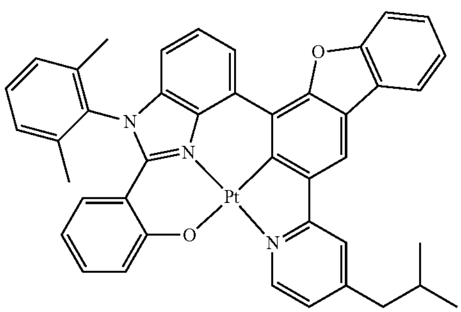
3-152
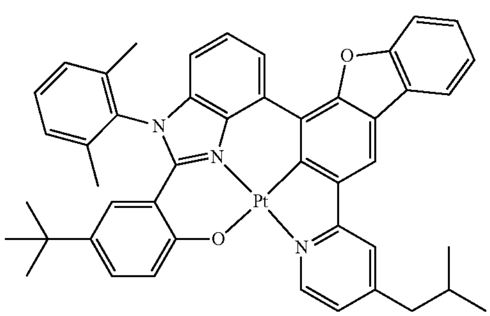
3-153
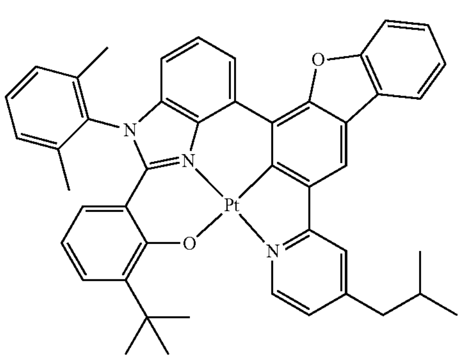
-continued
3-154
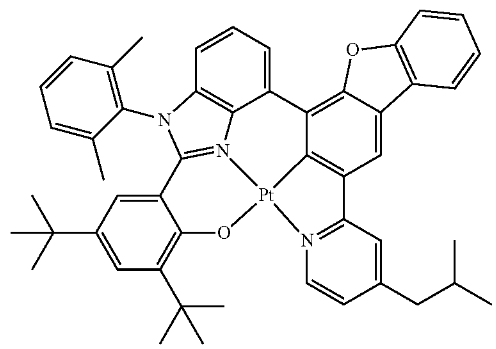
3-155
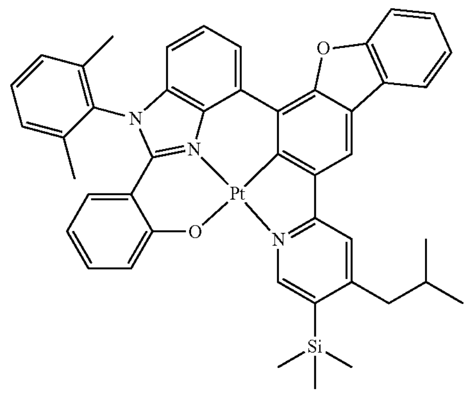
3-156
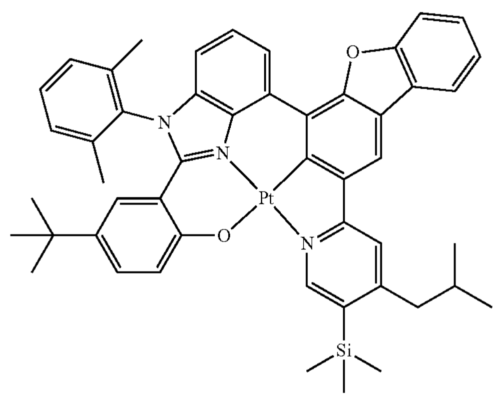
3-157
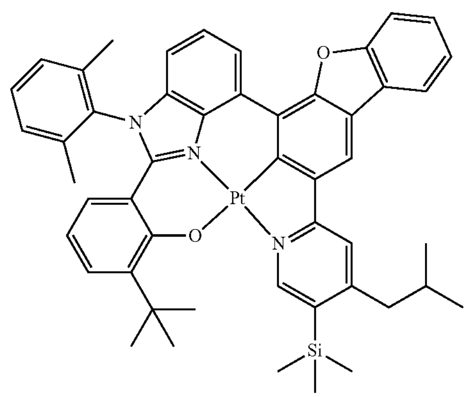

-continued
3-158
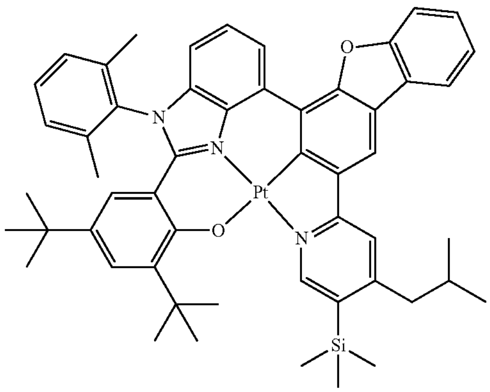
3-159
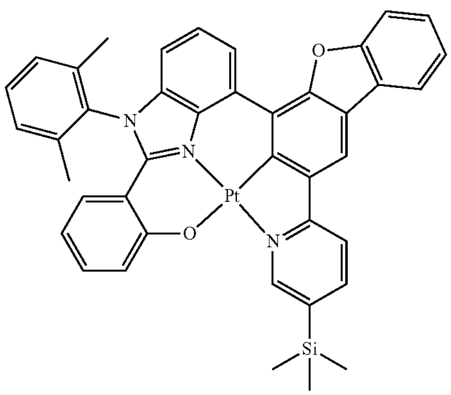
3-160
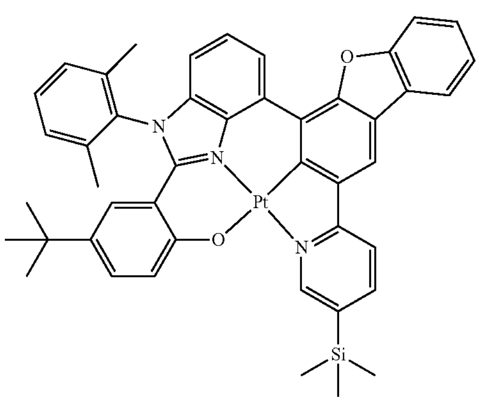
3-161
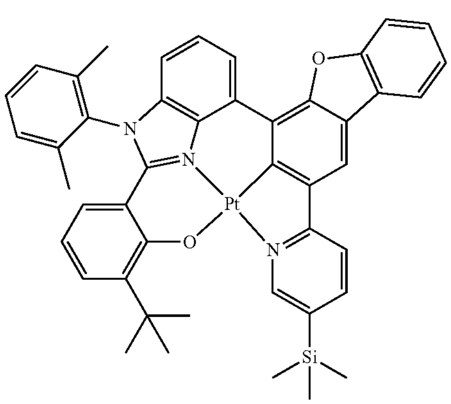
-continued
3-162
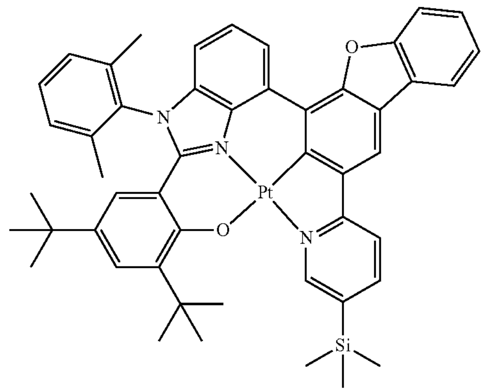
3-163
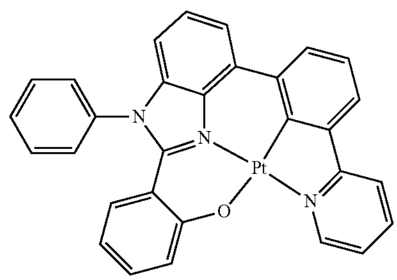
3-164
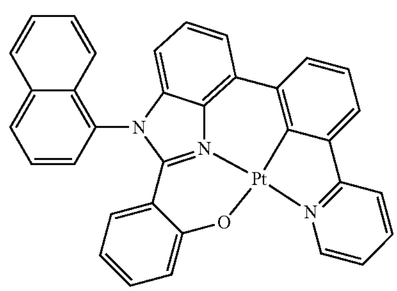
3-165
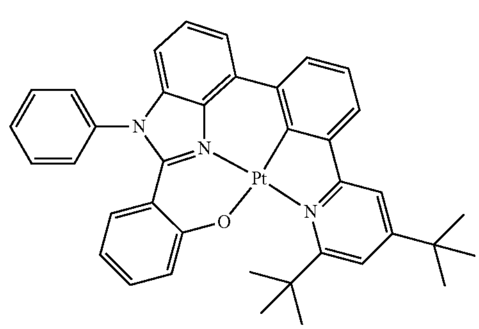

-continued
3-166
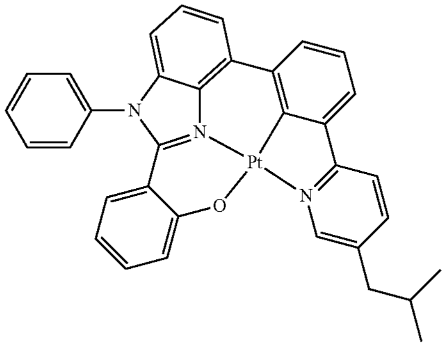
3-167
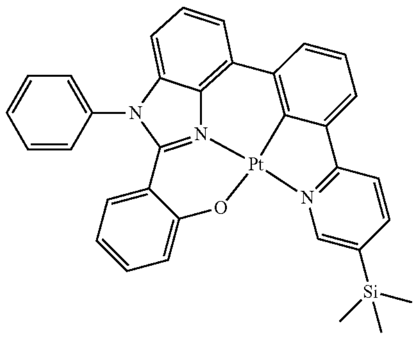
3-168
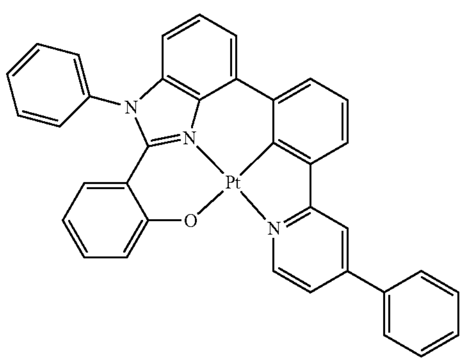
3-169
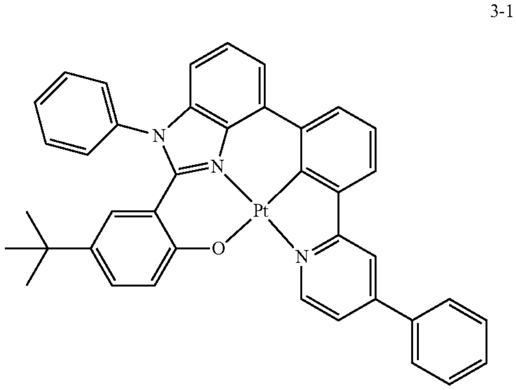
-continued
3-170
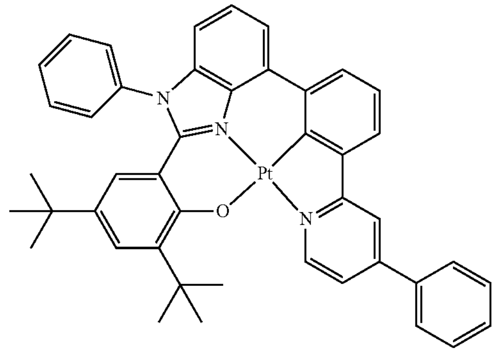
3-171
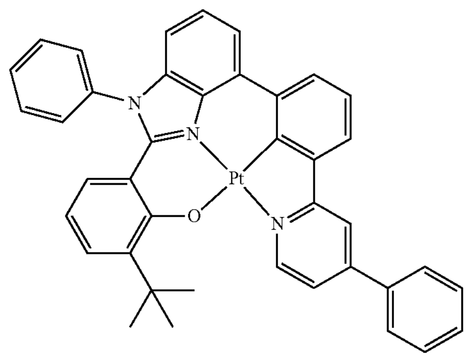
3-172
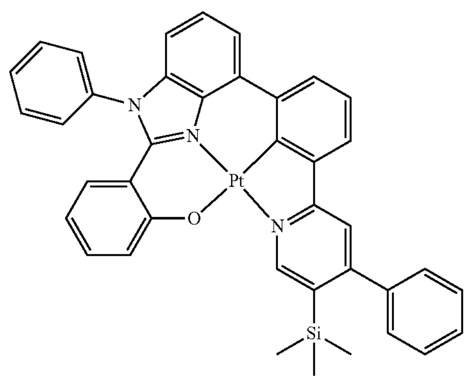
3-173
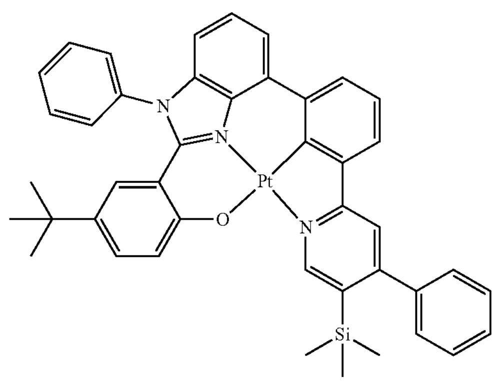

3-174
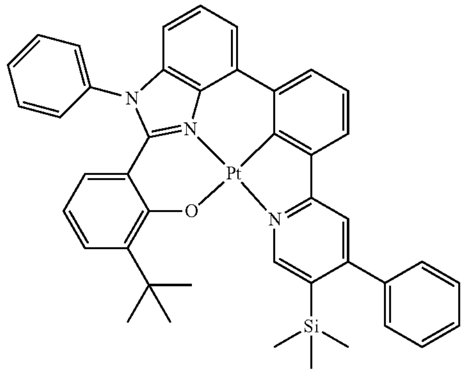
3-175
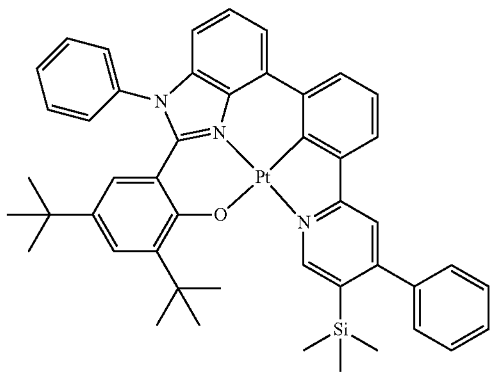
3-176
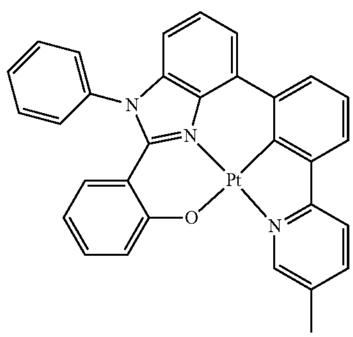
3-177
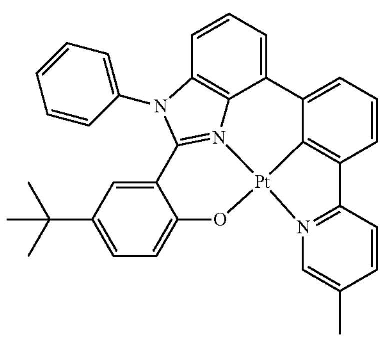
3-178
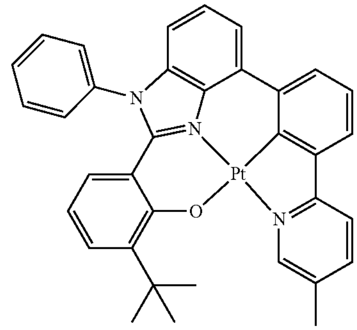
3-179
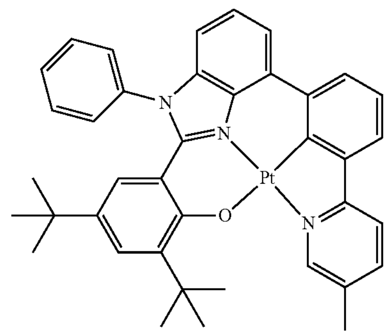
3-180
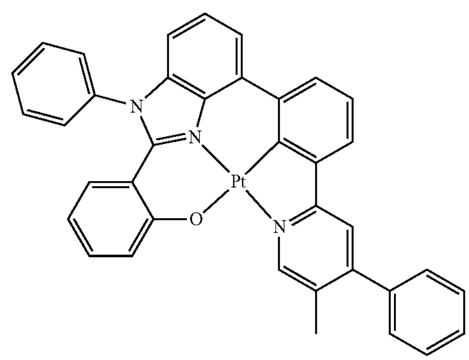
3-181
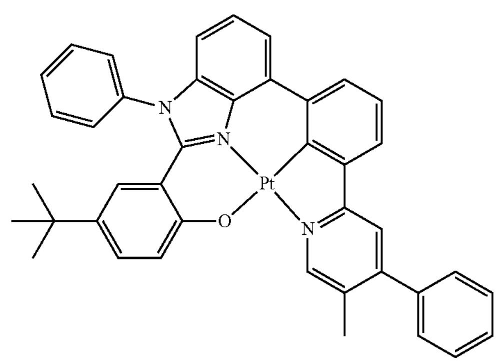

-continued
3-182
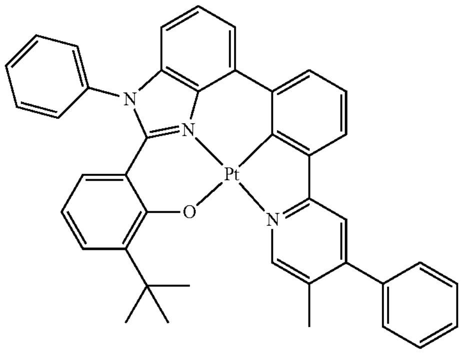
3-183
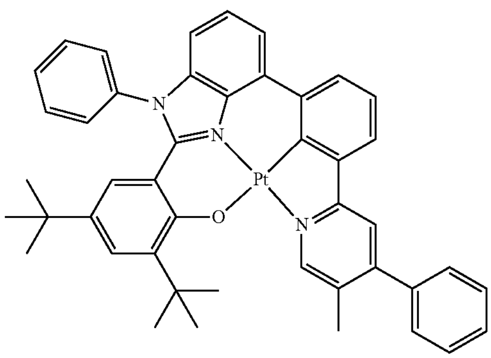
3-184
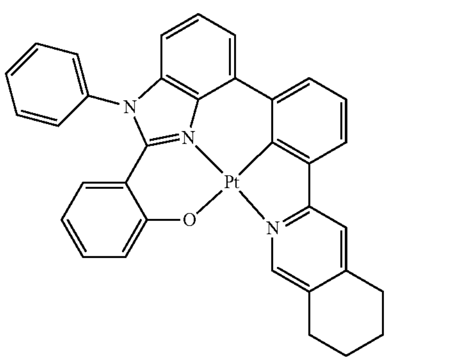
3-185
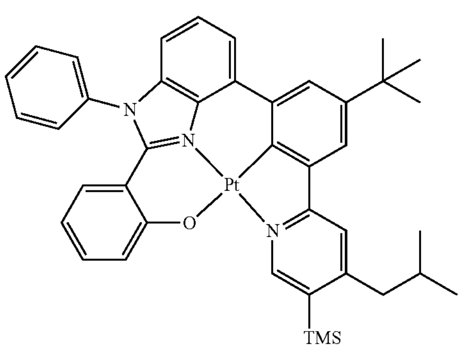
-continued
3-186
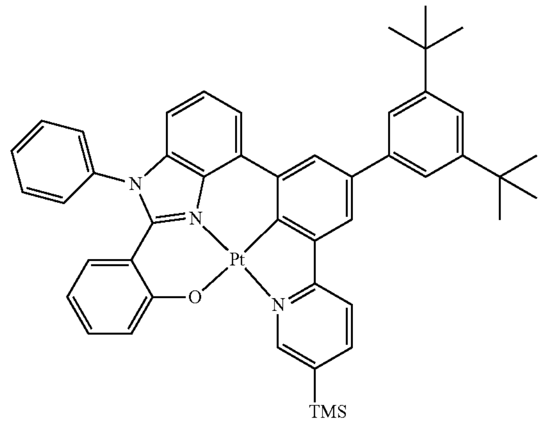
3-187
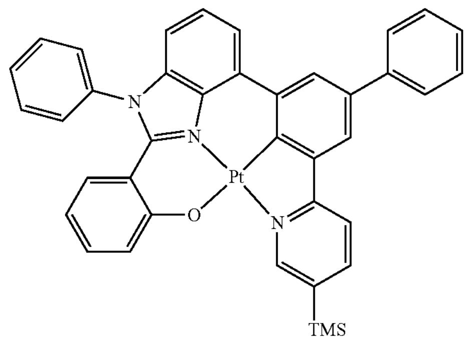
3-188
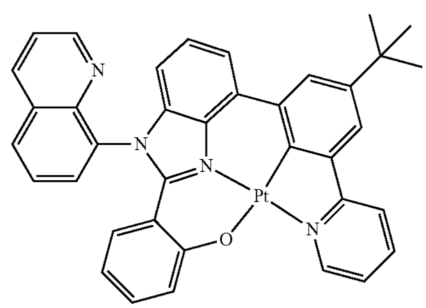
3-189
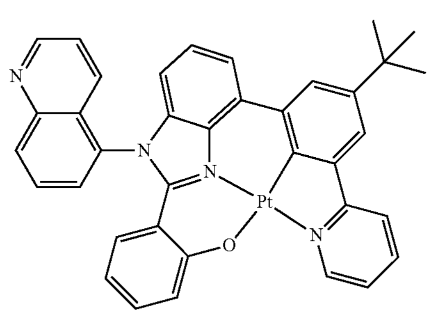

-continued
3-190
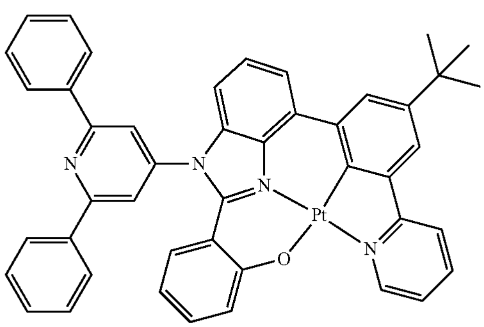
3-191
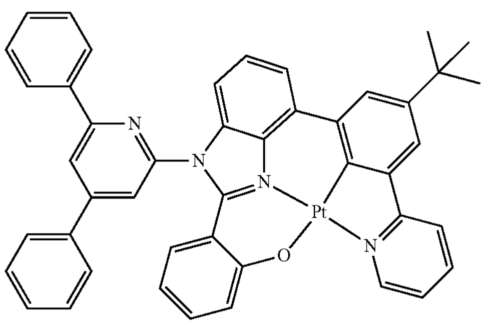
3-192
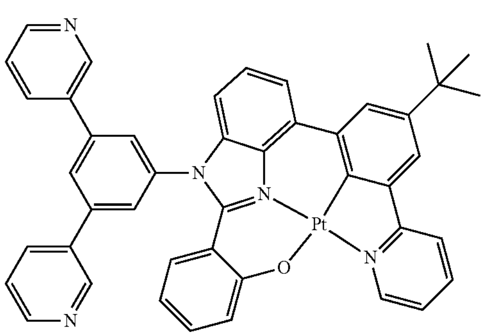
3-193
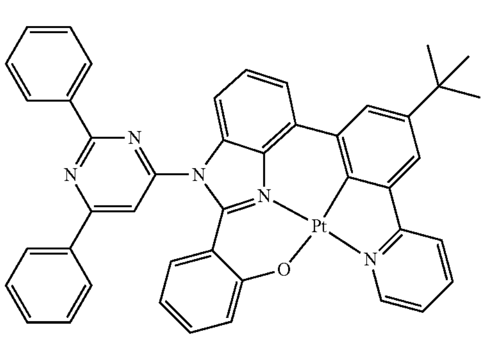
-continued
3-194
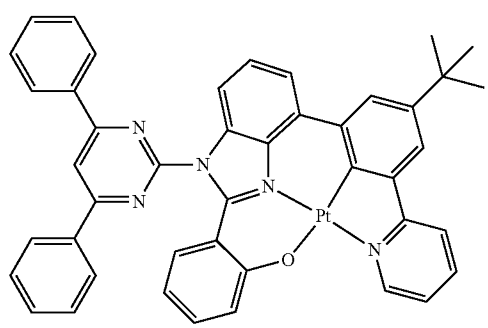
3-195
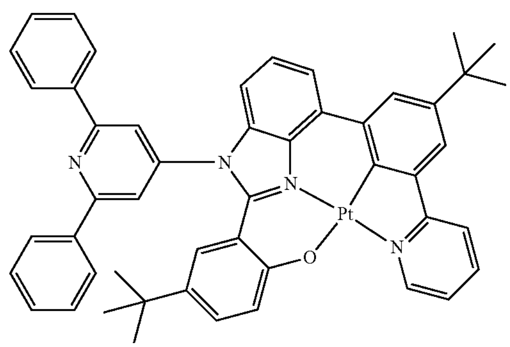
3-196
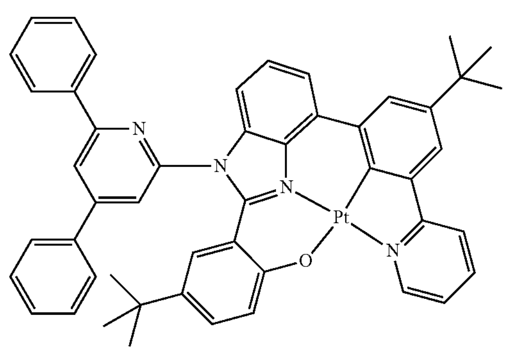
3-197
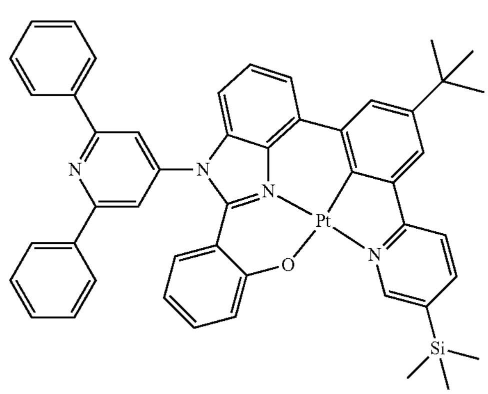

-continued
3-198
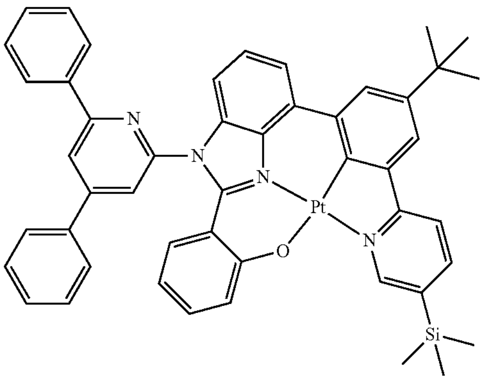
3-199
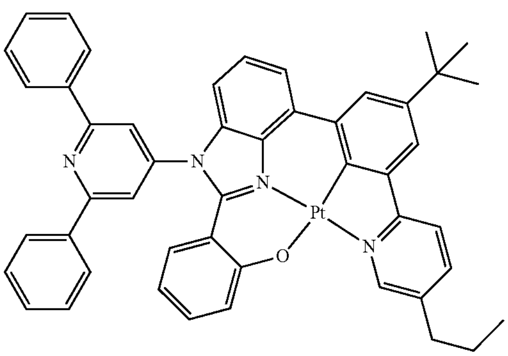
3-200
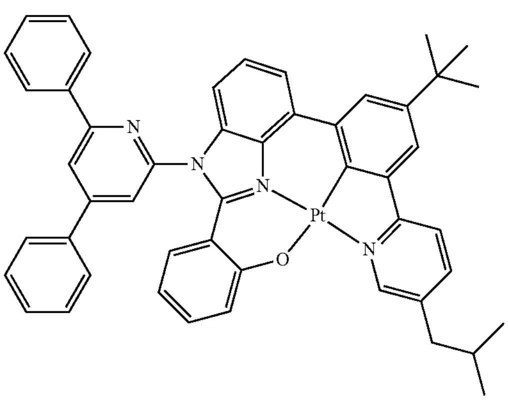
3-201
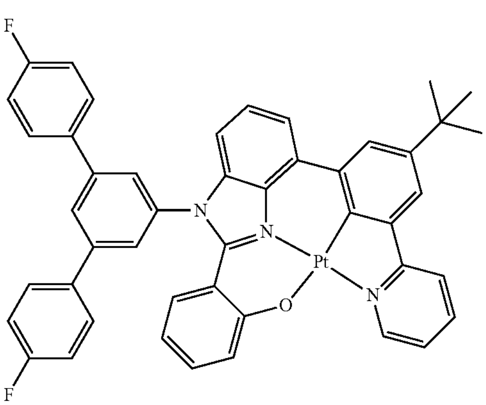
-continued
3-202
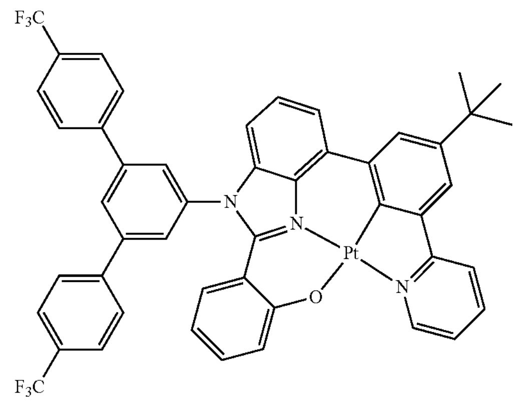
3-203
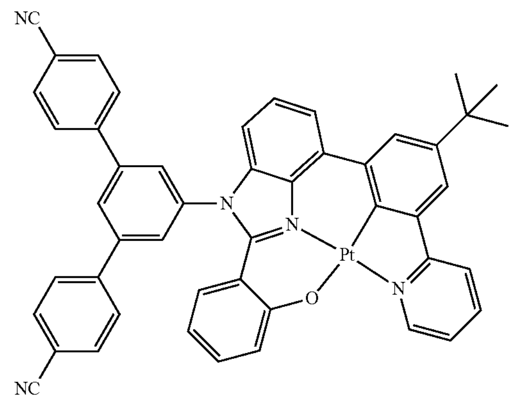
3-204
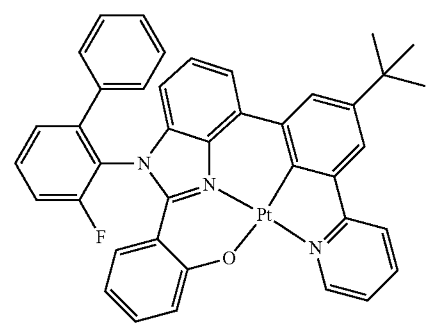
3-205
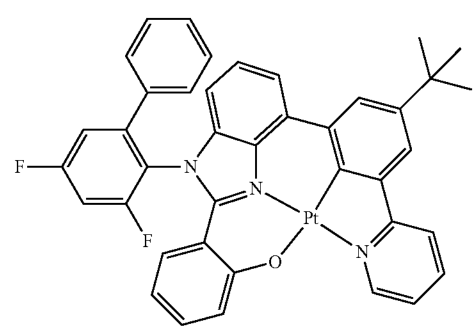

-continued
3-206
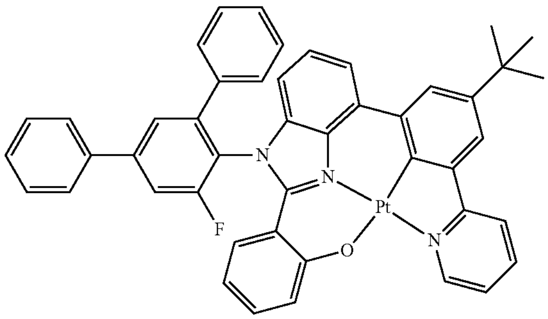
3-207
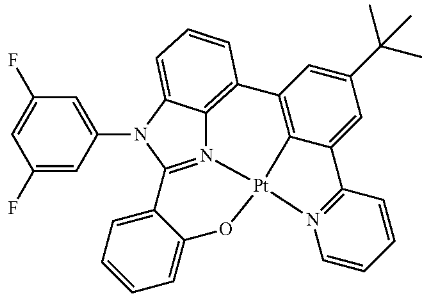
3-208
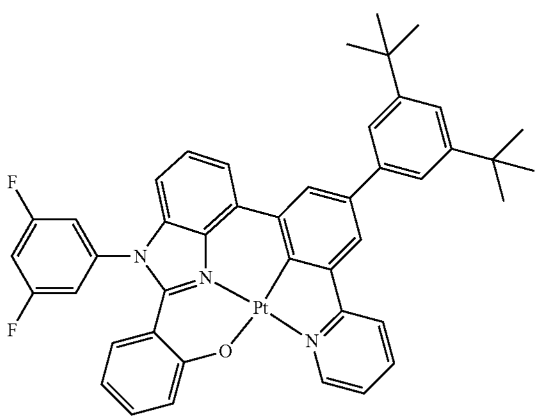
3-209
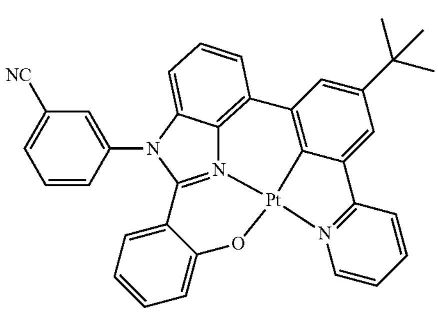
-continued
3-210
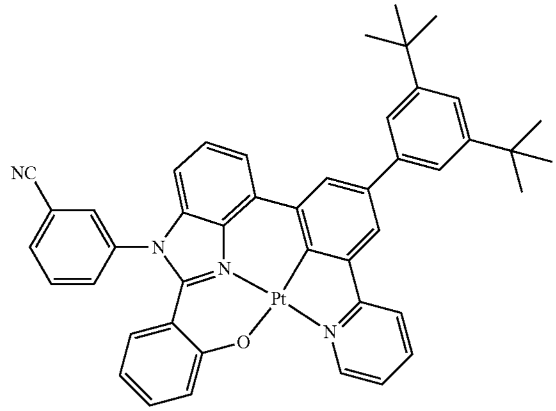
3-211
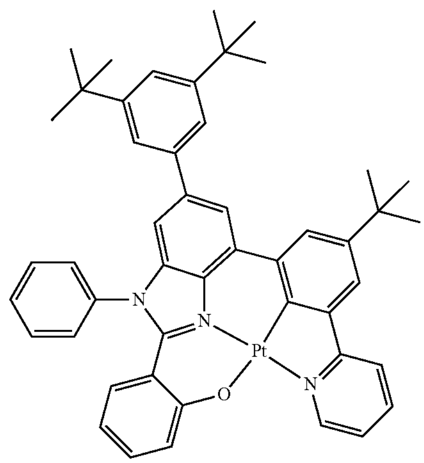
3-212
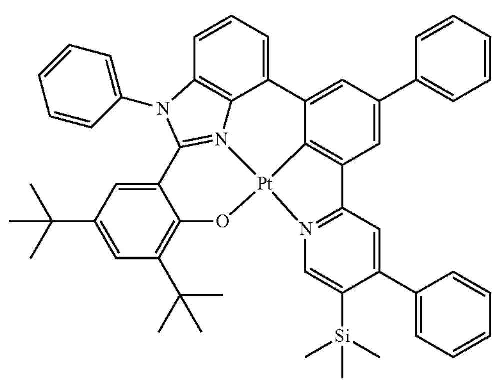

-continued
3-213
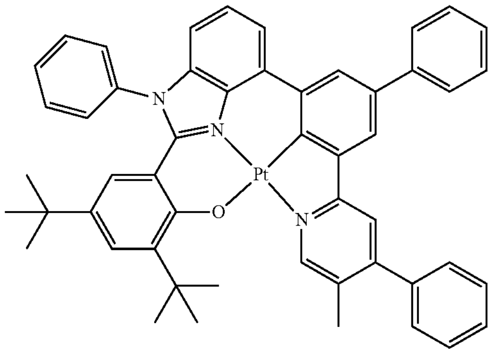
3-214
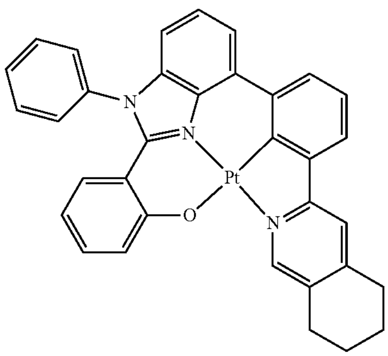
3-215
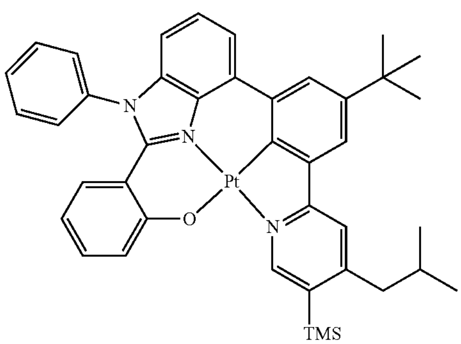
3-216
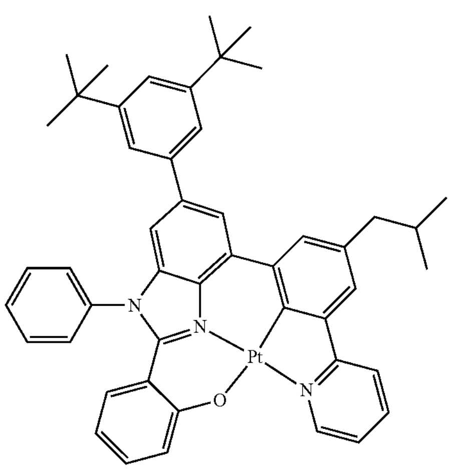
-continued
3-217
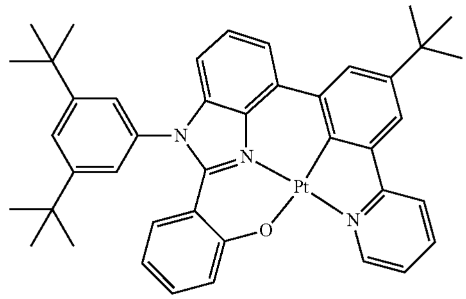
3-218
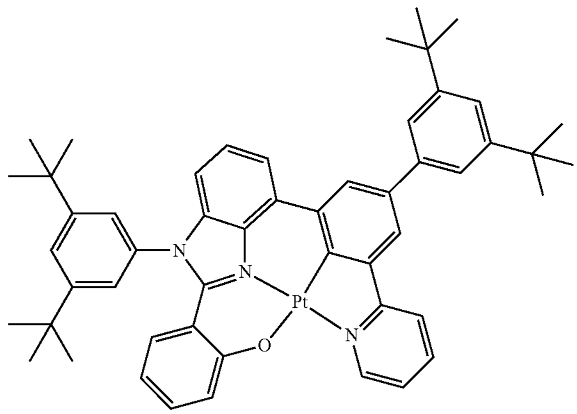
3-219
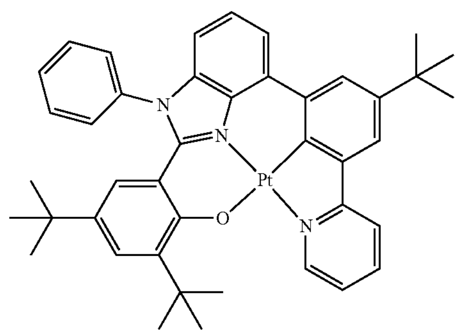
3-220
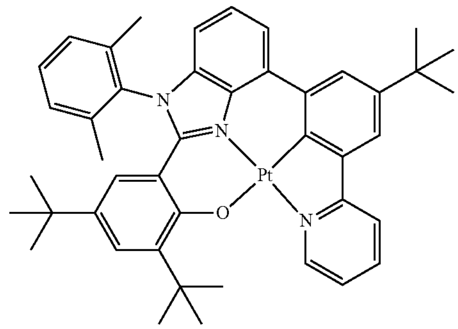

-continued
3-221
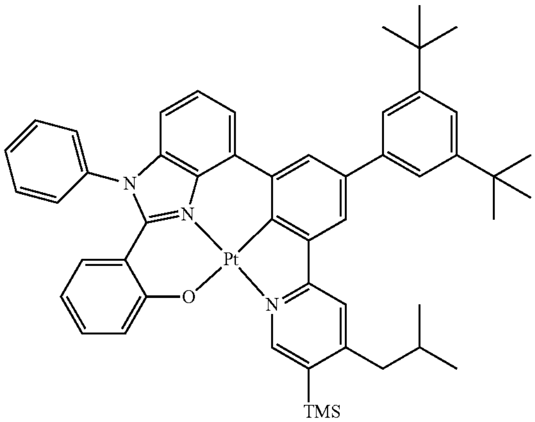
3-222
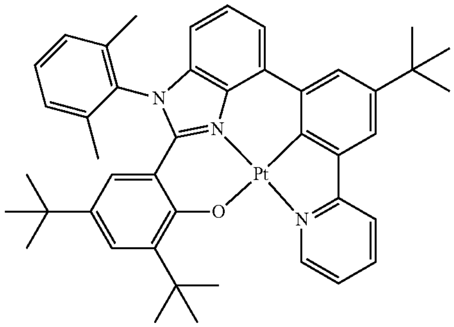
3-223
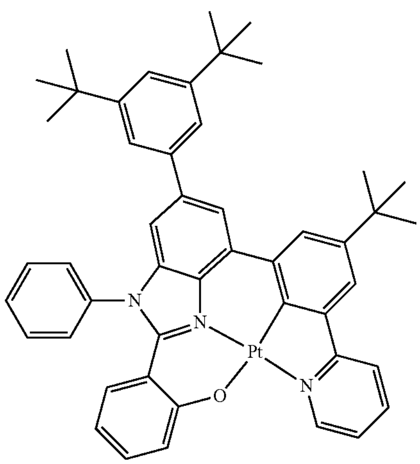
3-224
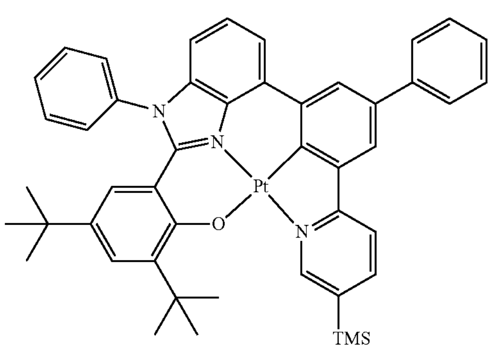
-continued
3-225
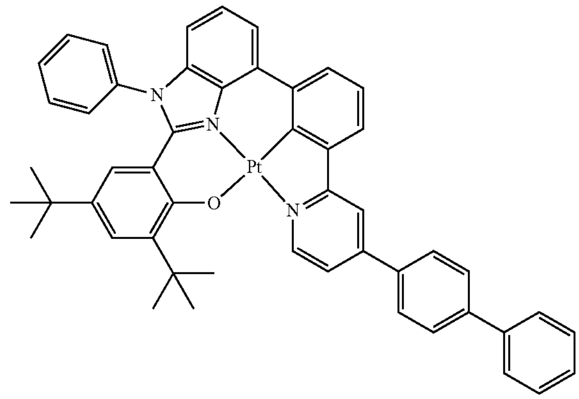
3-226
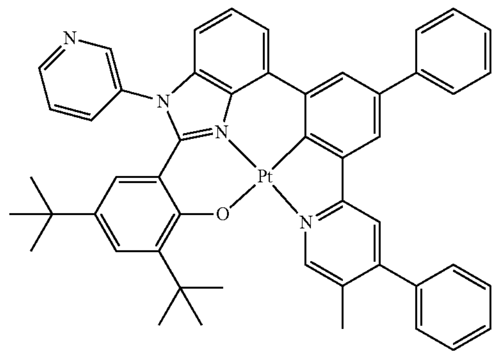
3-227
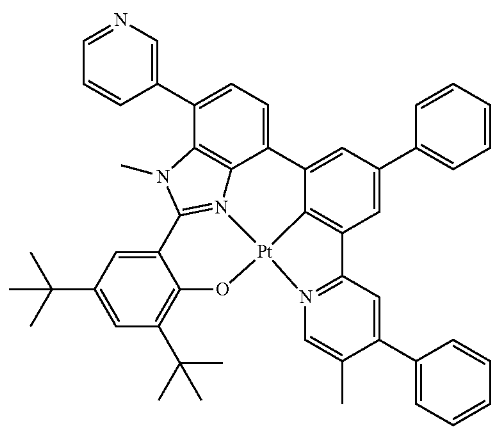
3-228
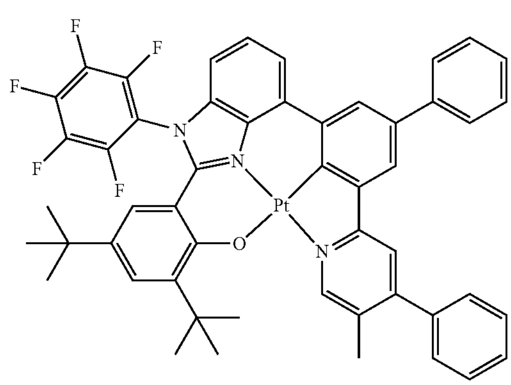

3-229
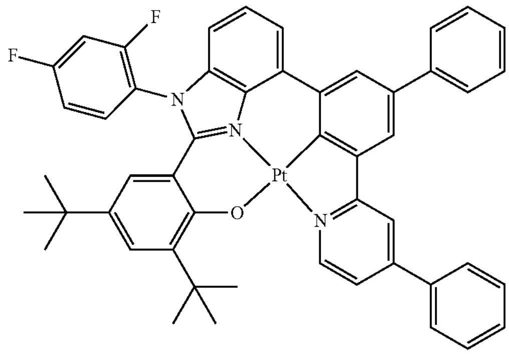
3-230
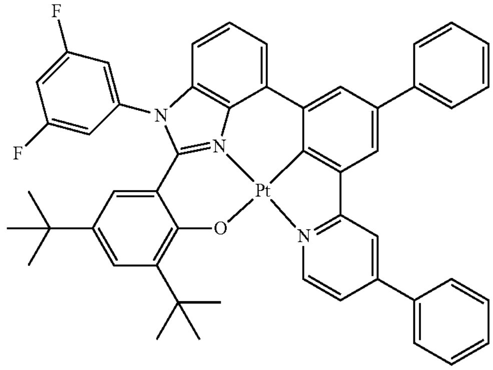
3-231
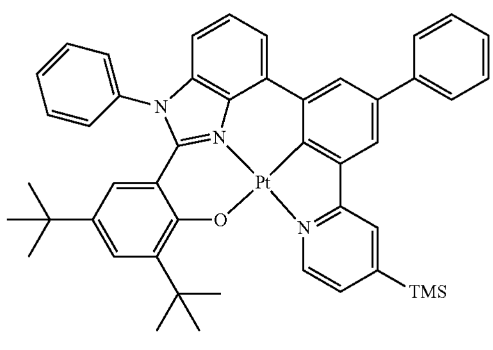
3-232
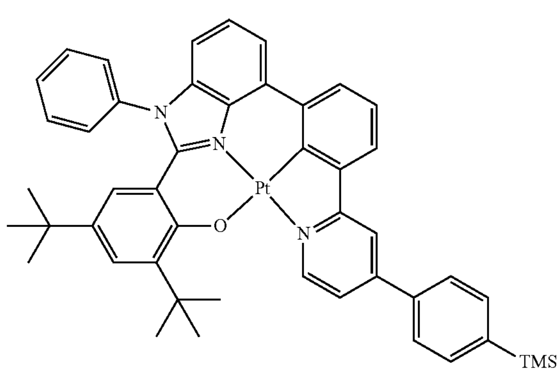
3-233
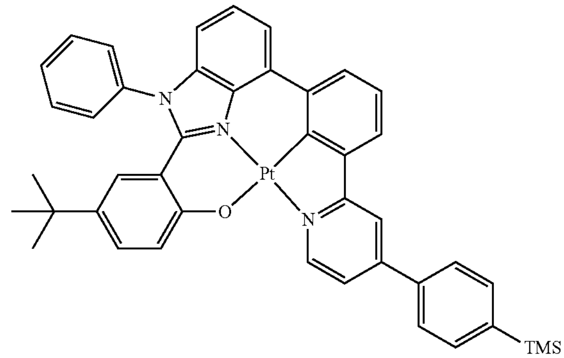
3-234
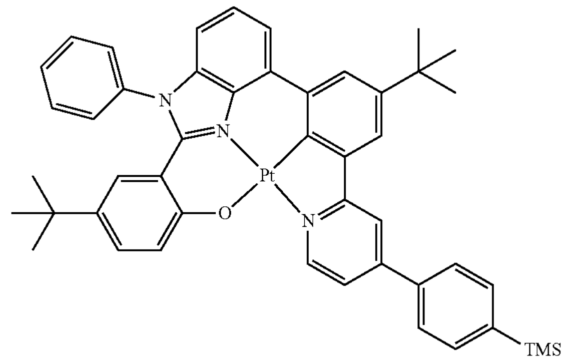
3-235
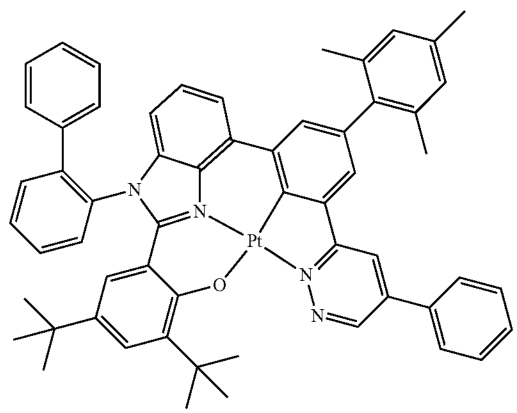
3-236
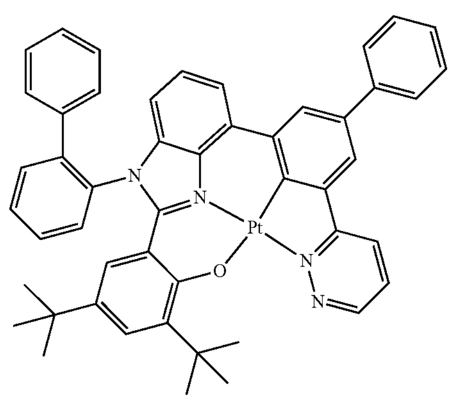

-continued
3-237
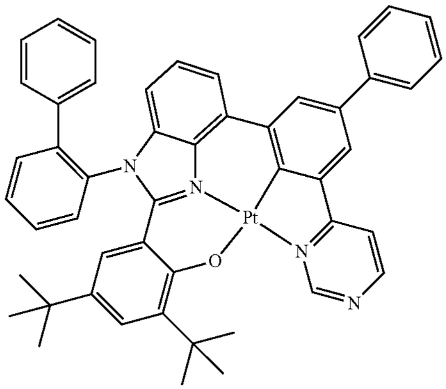
3-238
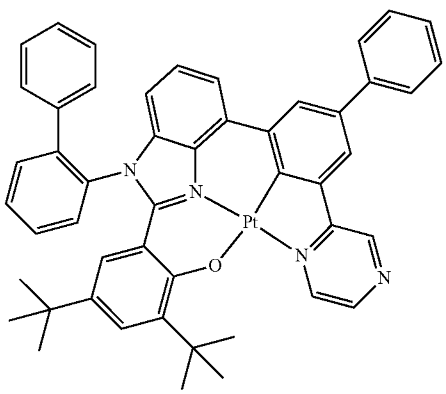
3-239
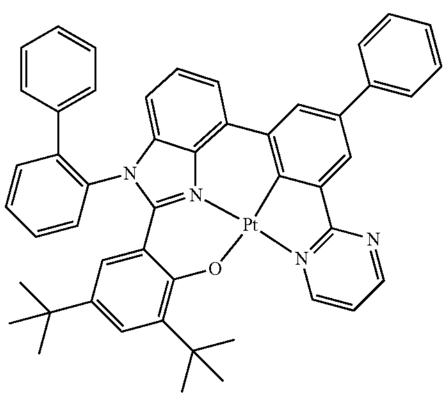
3-240
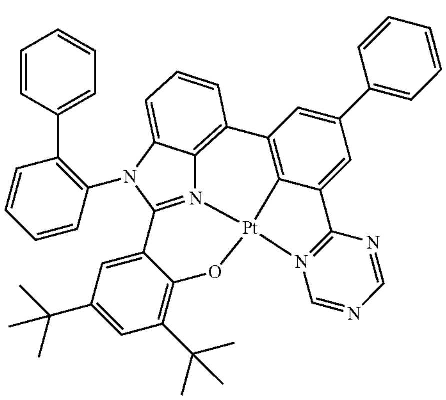
-continued
3-241
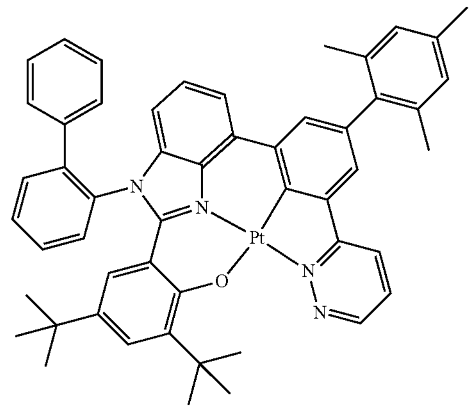
3-242
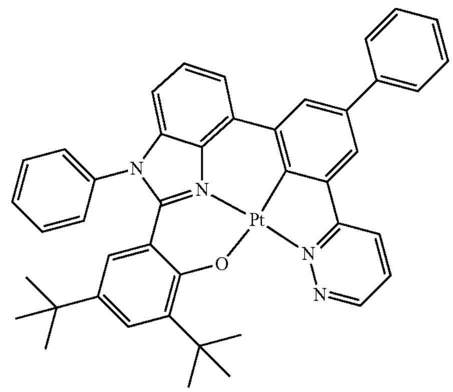
3-243
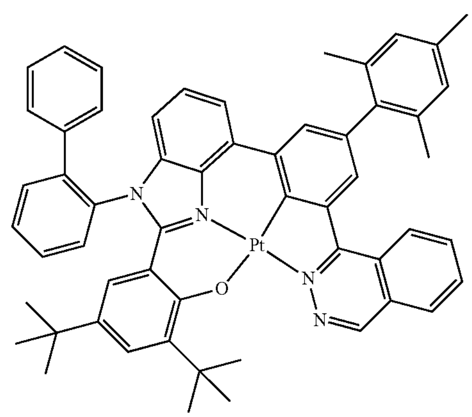
3-244
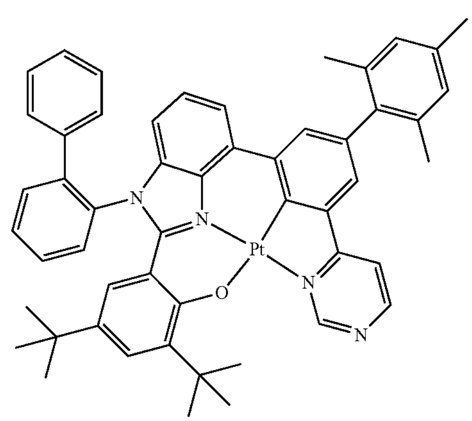

-continued
3-245
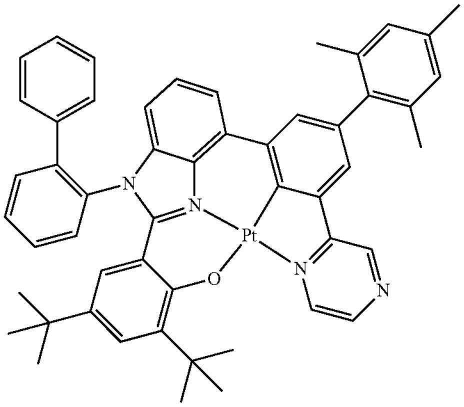
3-246
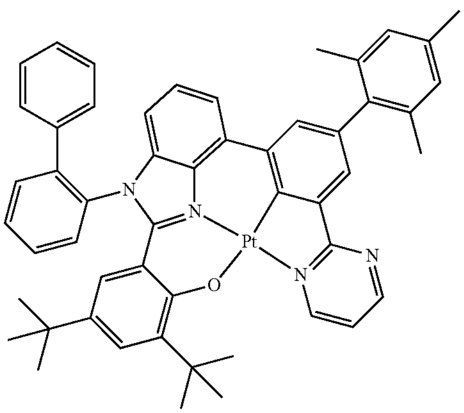
3-247
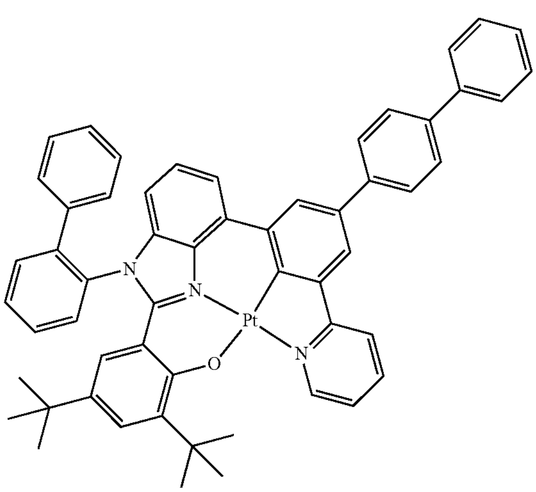
-continued
3-248
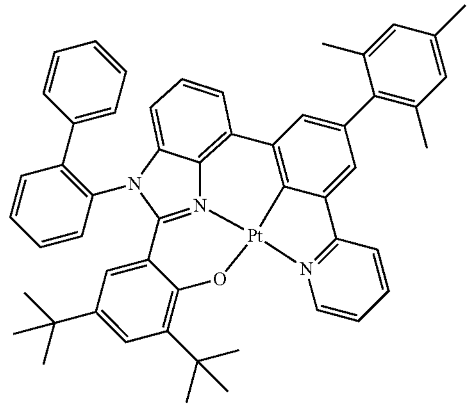
3-249
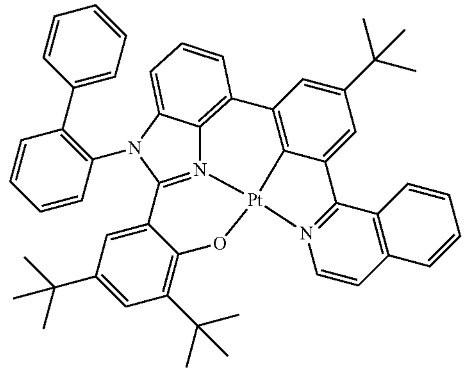
3-250
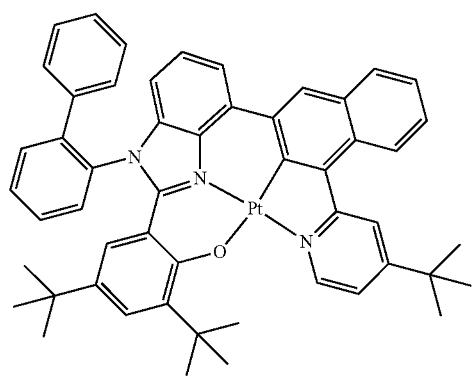
3-251
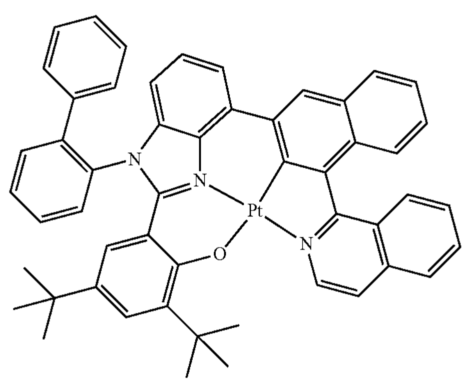

3-252
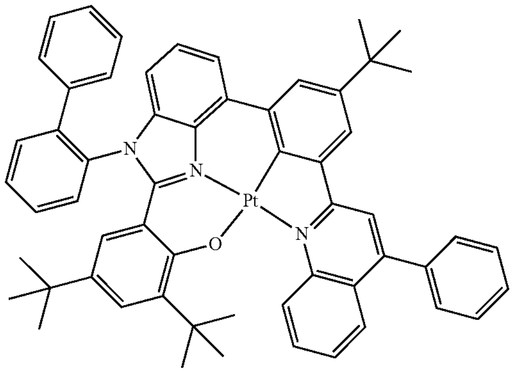
3-253
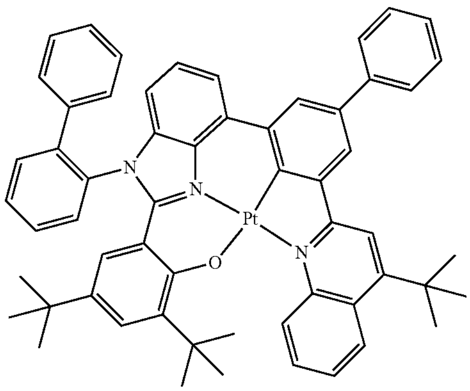
3-254
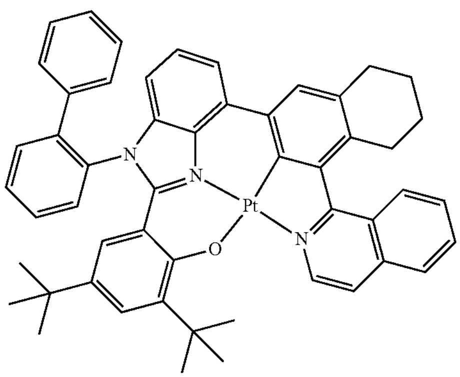
3-255
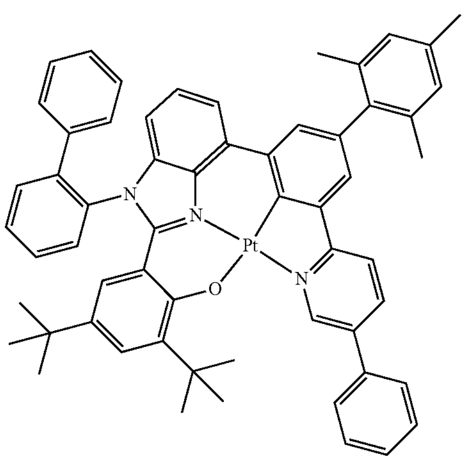
3-256
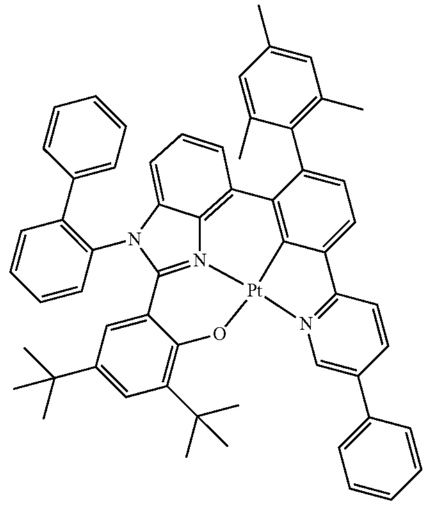
3-257
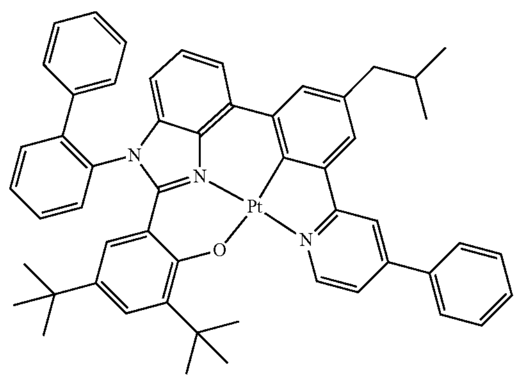
3-258
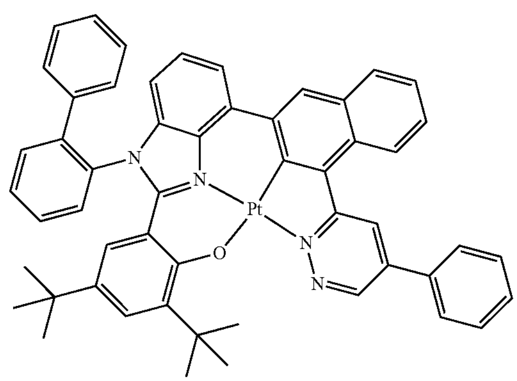

-continued
3-259
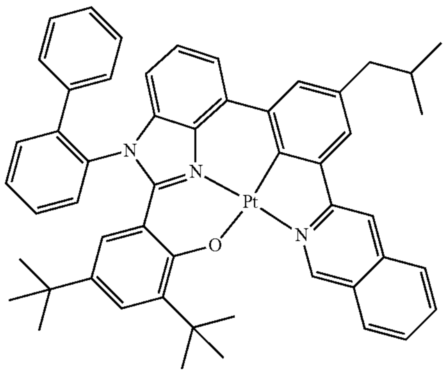
3-260
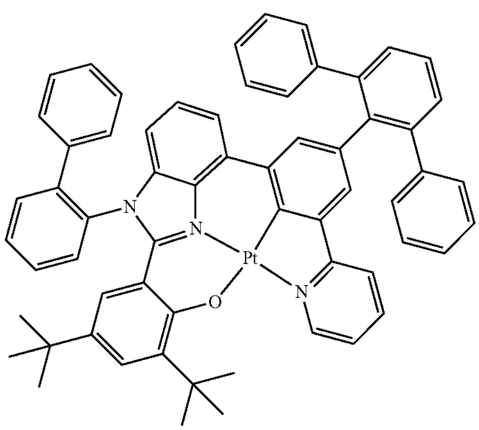
3-261
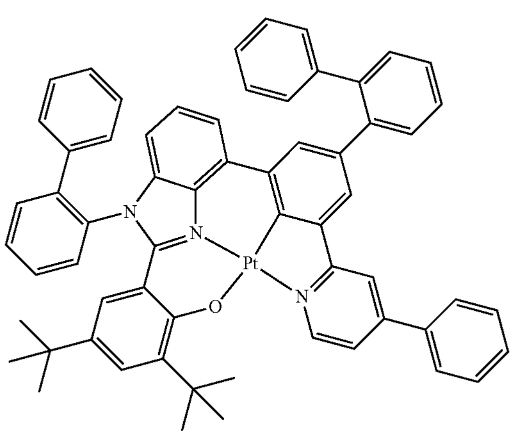
-continued
3-262
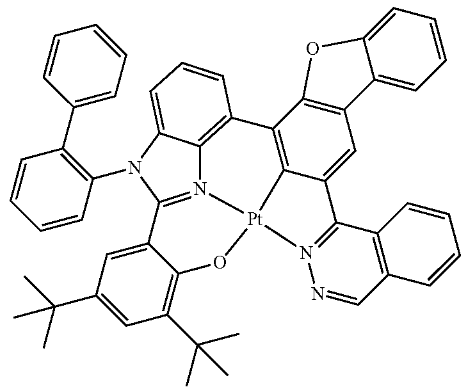
3-263
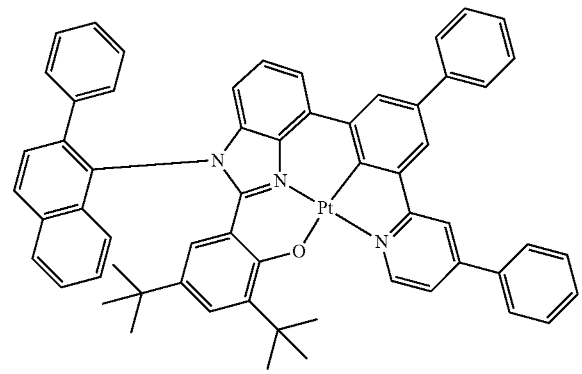
3-264
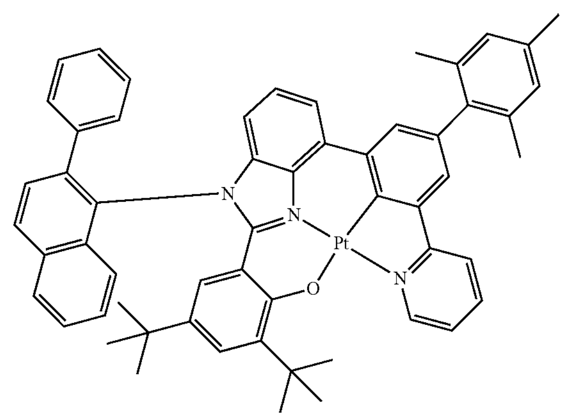
3-265
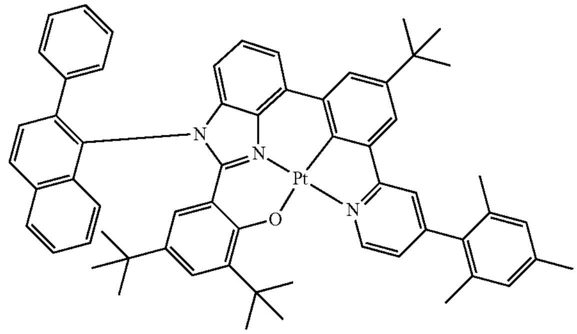

-continued
3-266
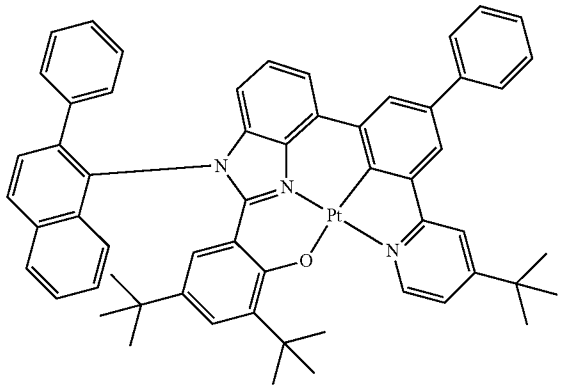
3-267
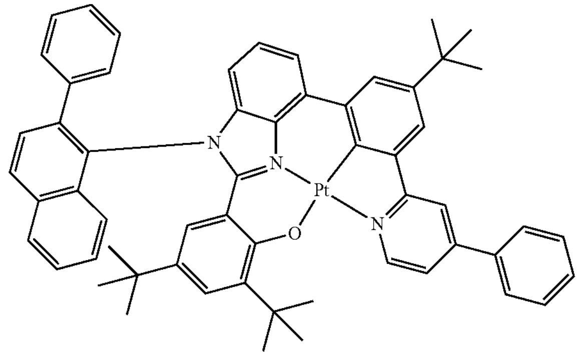
3-268
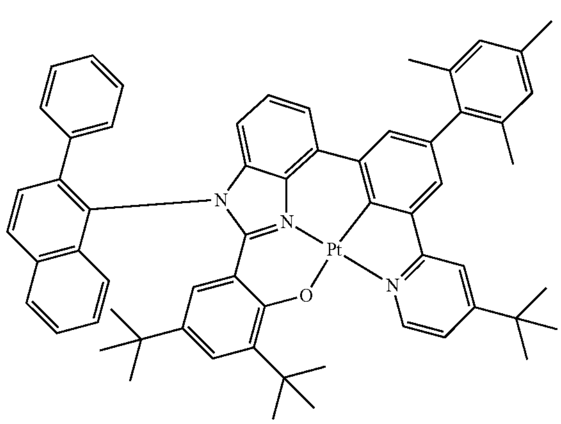
-continued
3-269
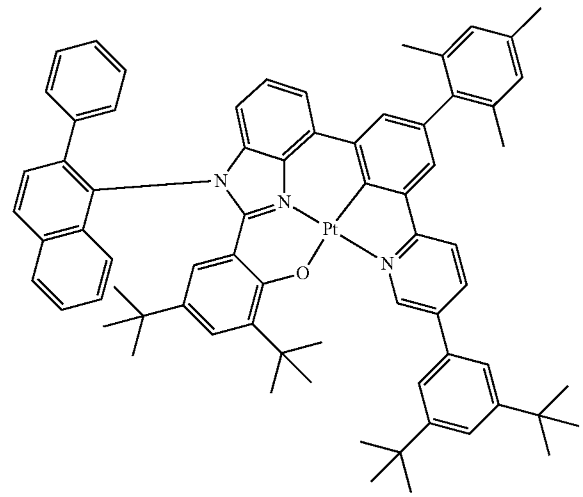
3-270
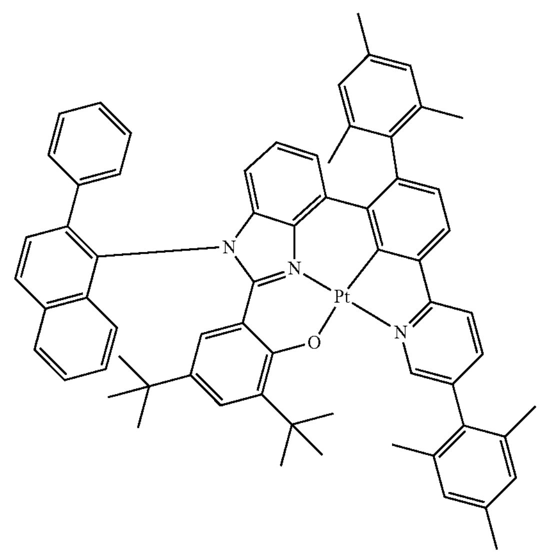
3-271
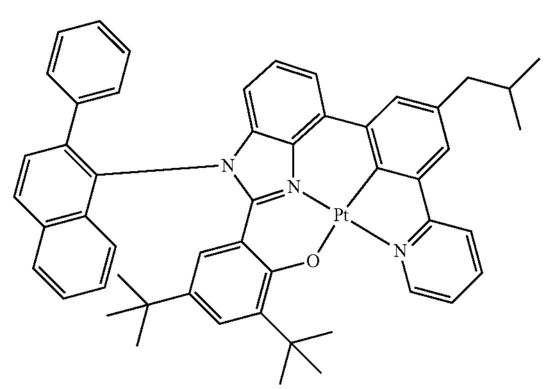

-continued
3-272
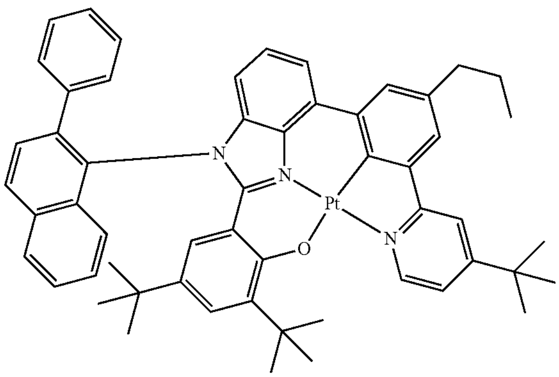
3-273
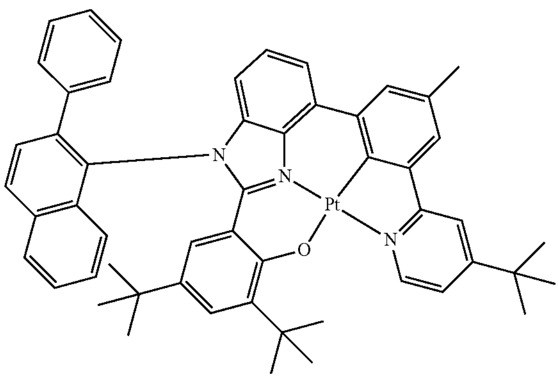
3-274
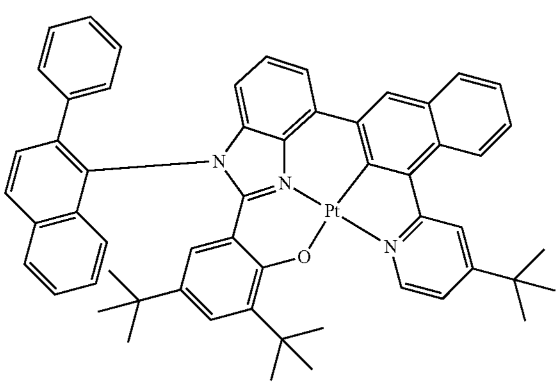
3-275
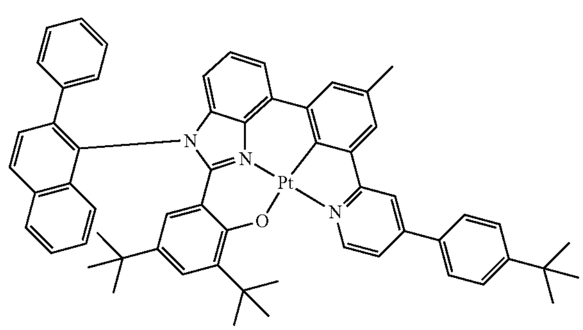
-continued
3-276
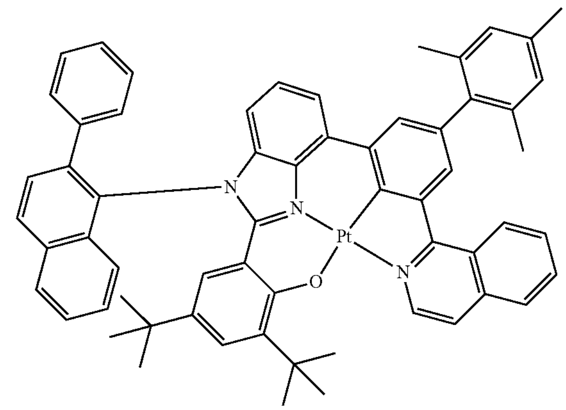
3-277
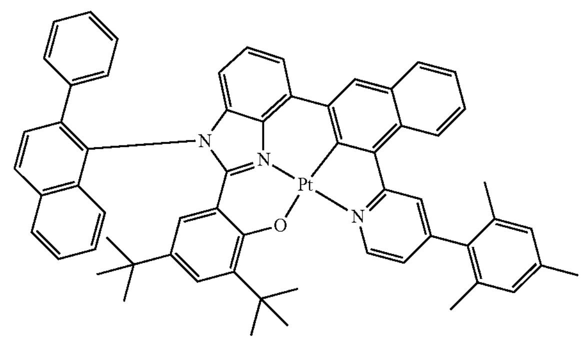
3-278
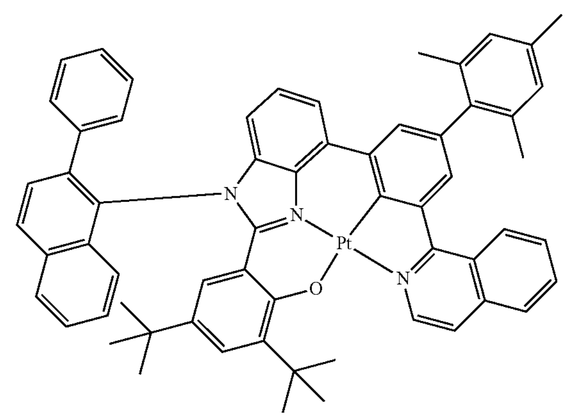
3-279
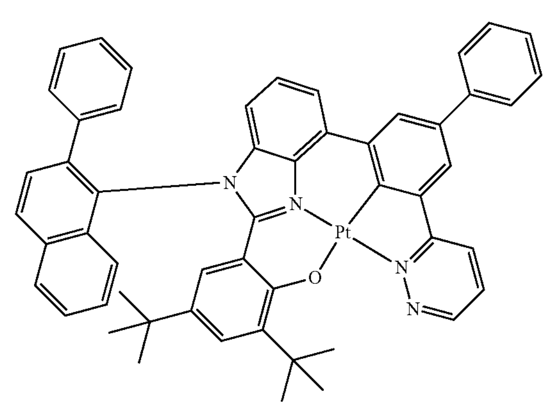

-continued
3-280
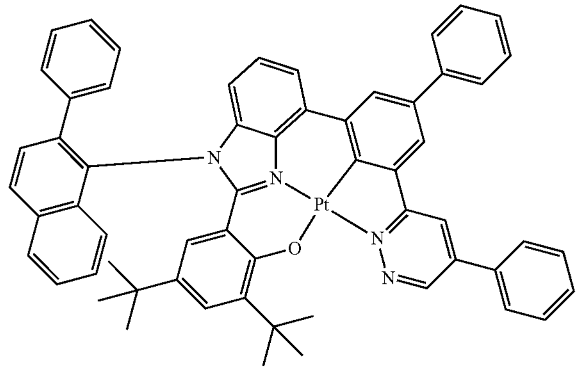
3-281
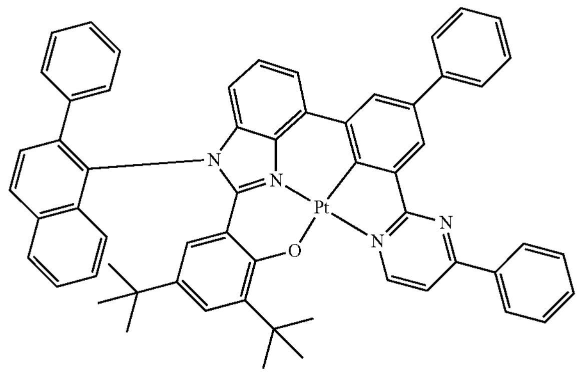
3-282
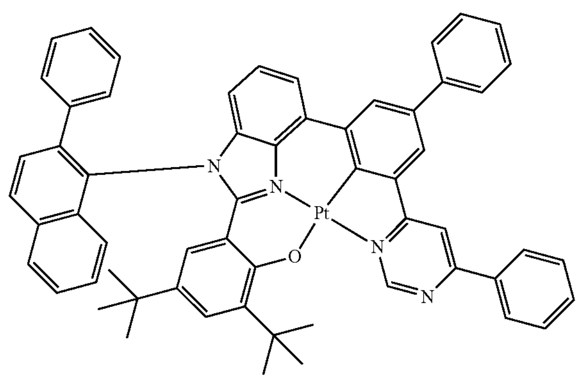
3-283
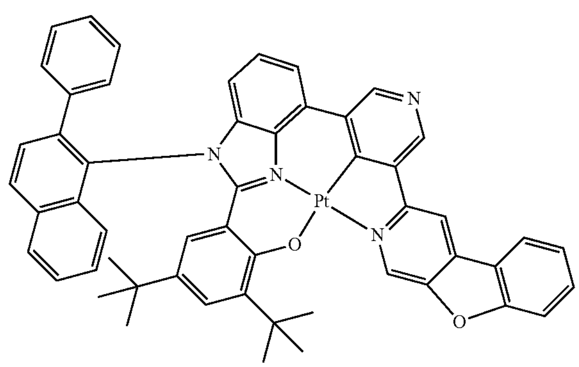
-continued
3-284
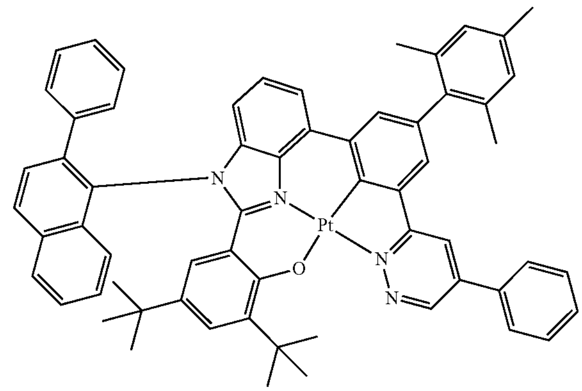
3-285
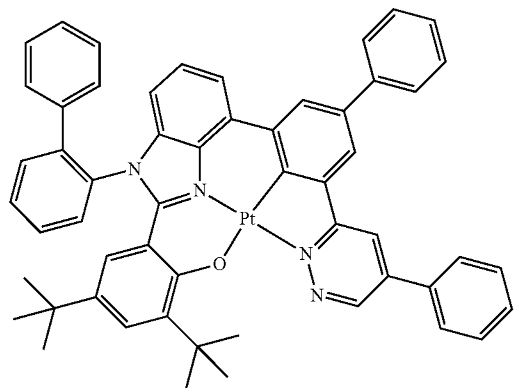
3-286
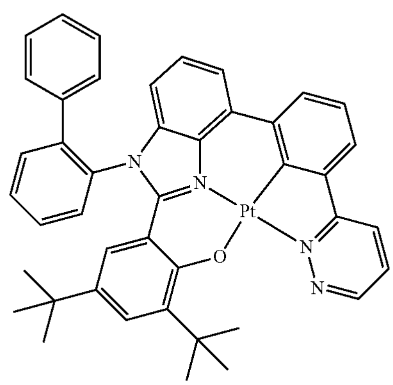
3-287
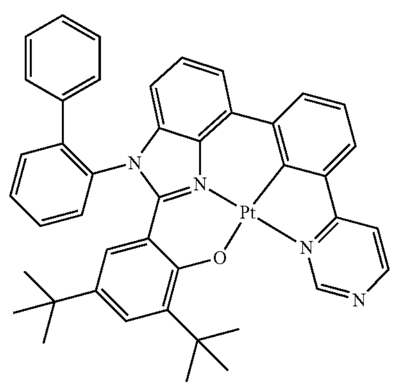

-continued
3-288
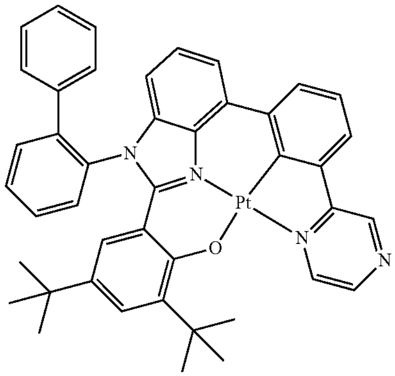
3-289
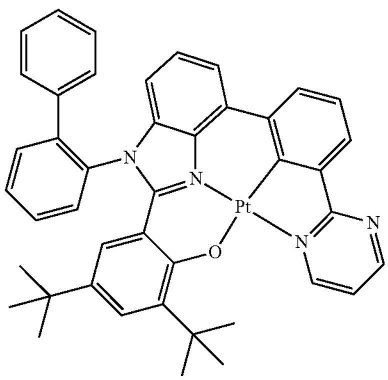
3-290
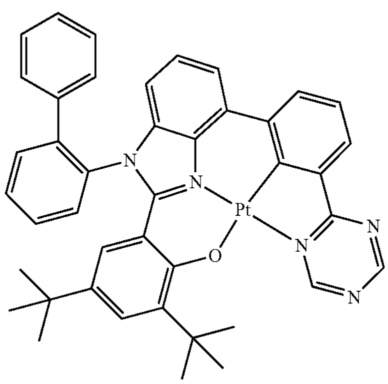
3-291
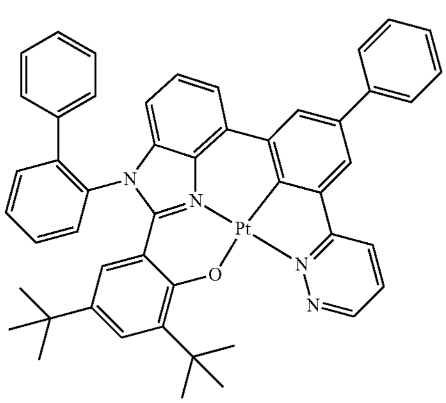
-continued
3-292
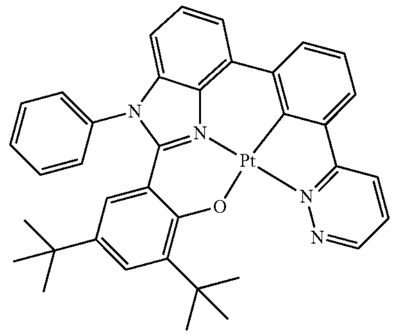
3-293
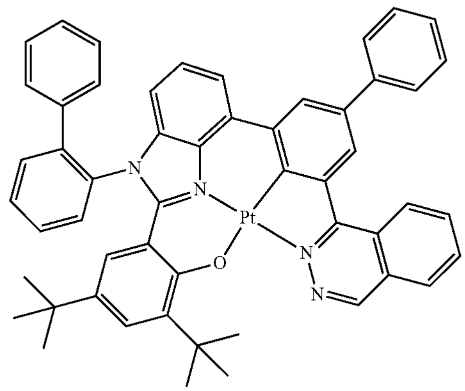
3-294
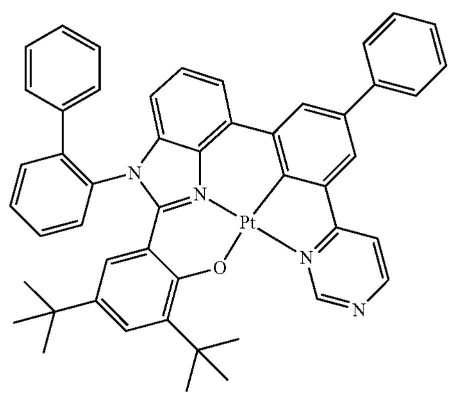
3-295
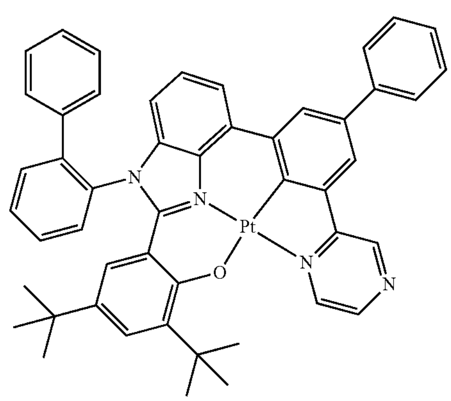

-continued
3-296
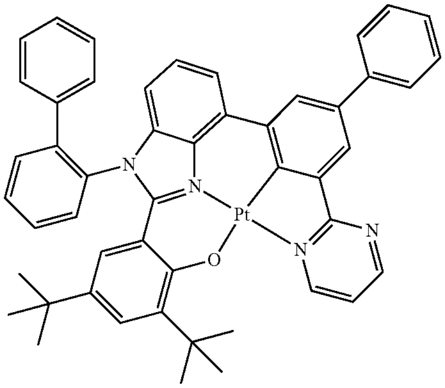
3-297
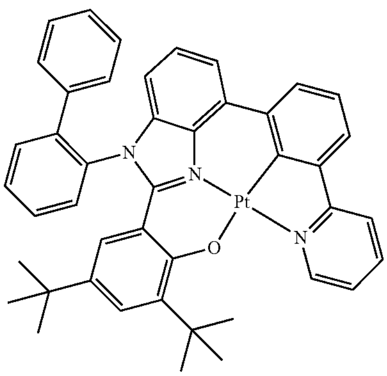
3-298
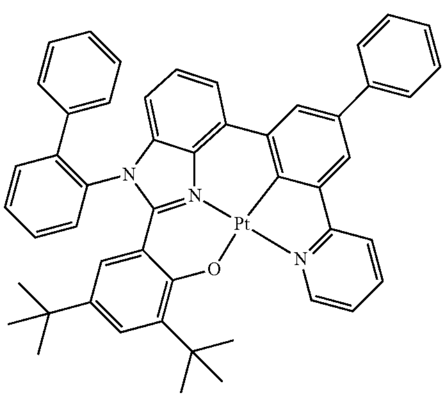
3-299
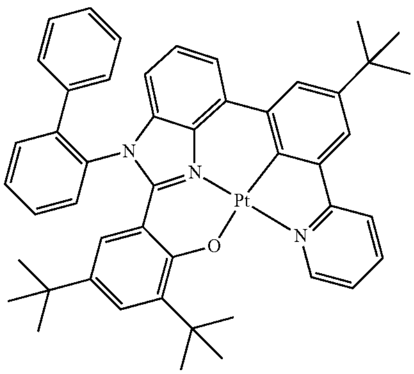
-continued
3-300
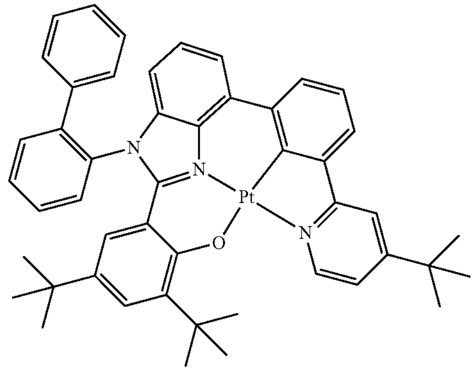
3-301
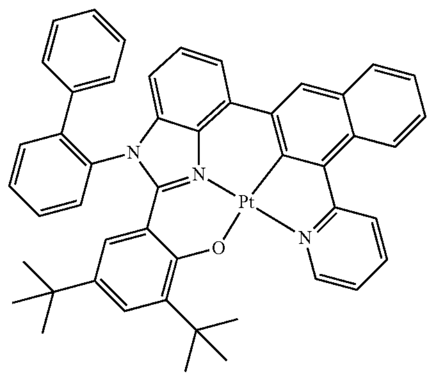
3-302
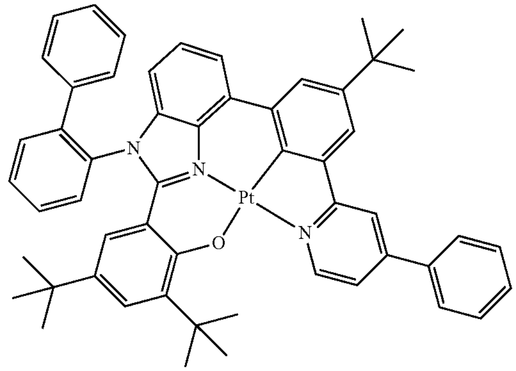
3-303
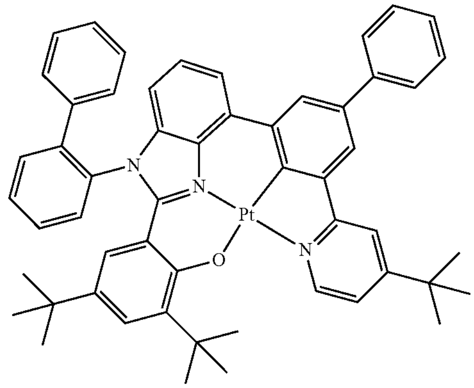

-continued
3-304
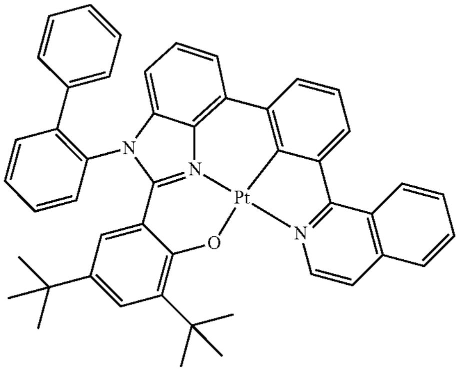
3-305
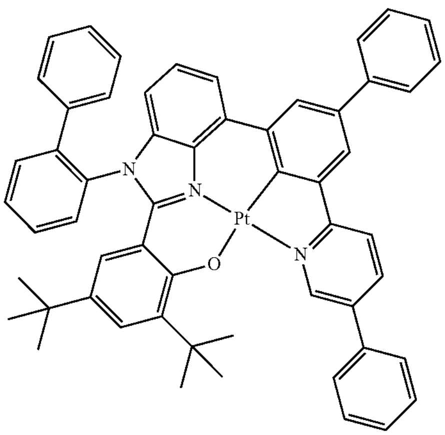
3-306
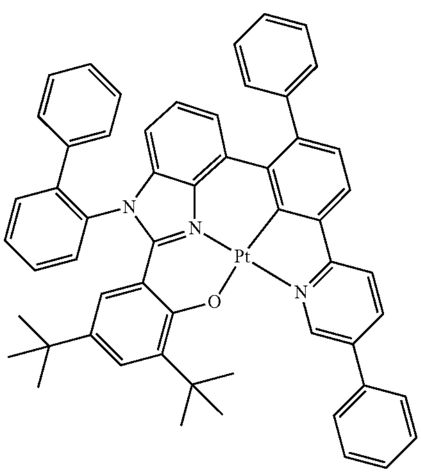
3-307
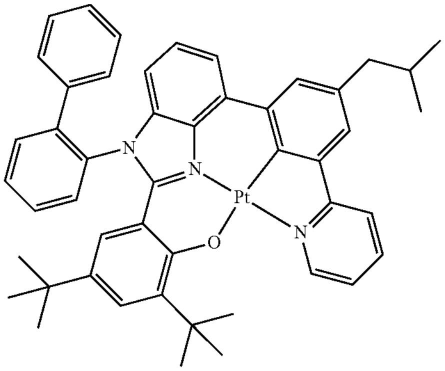
-continued
3-308
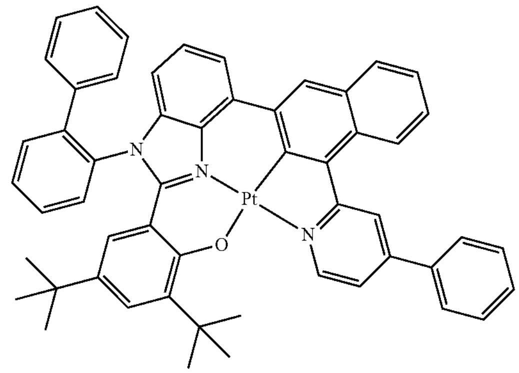
3-309
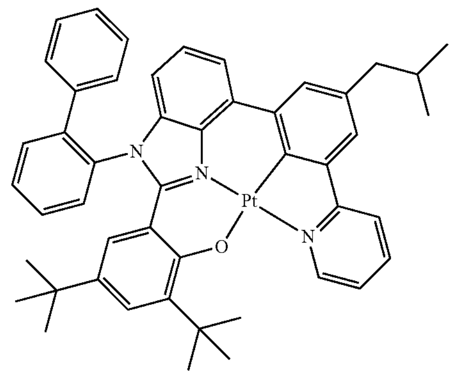
3-310
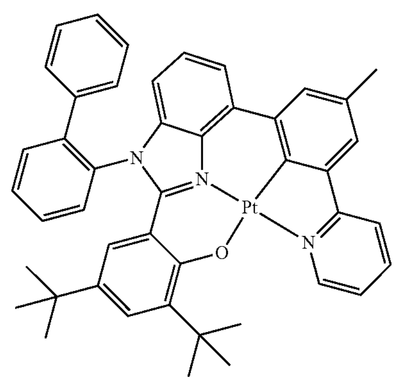
3-311
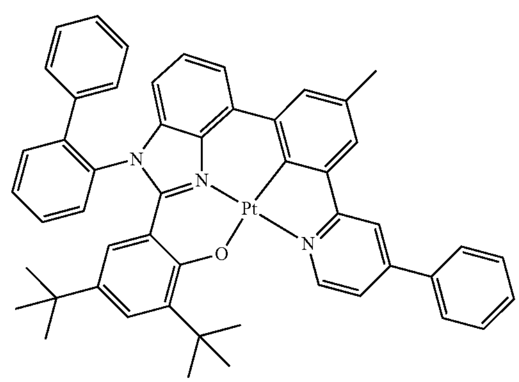

-continued
3-312
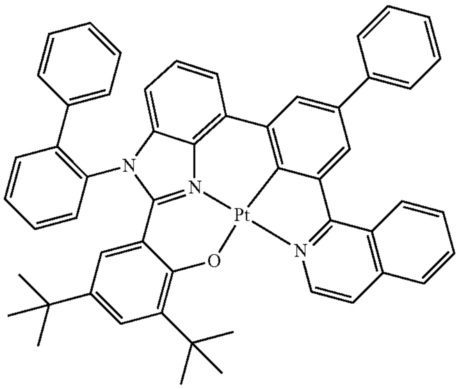
3-313
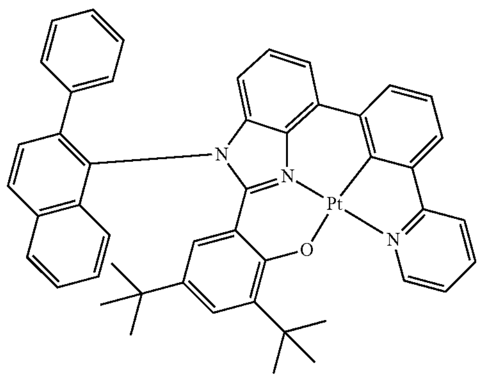
3-314
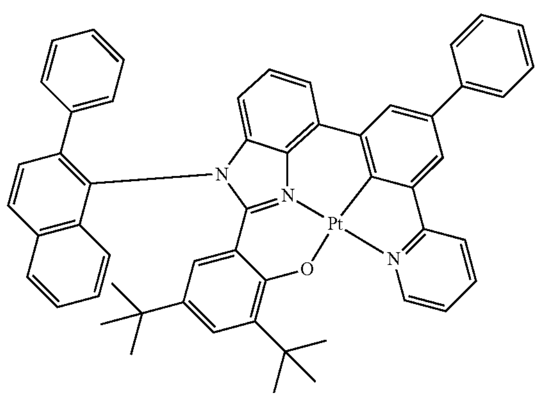
3-315
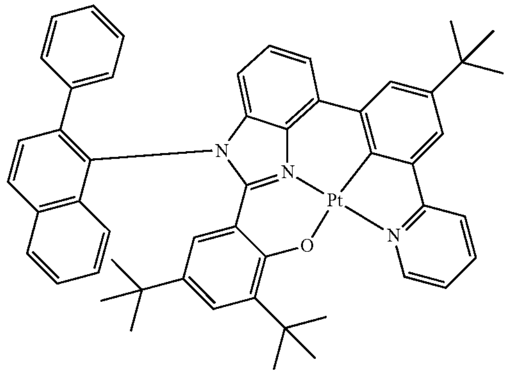
-continued
3-316
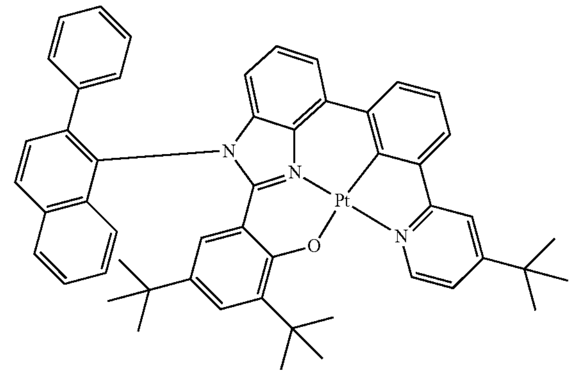
3-317
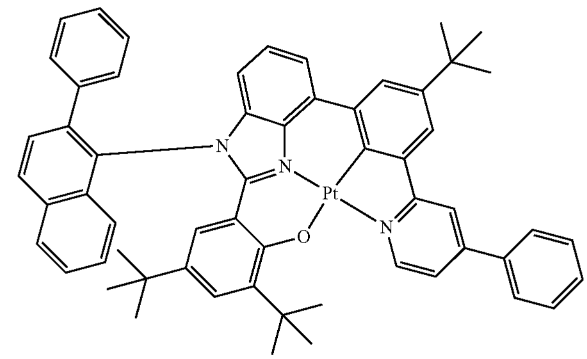
3-318
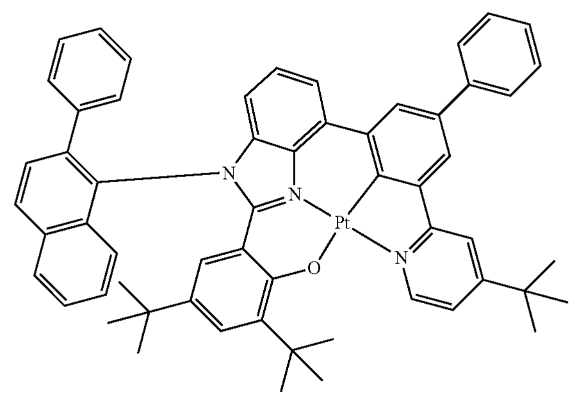
3-319
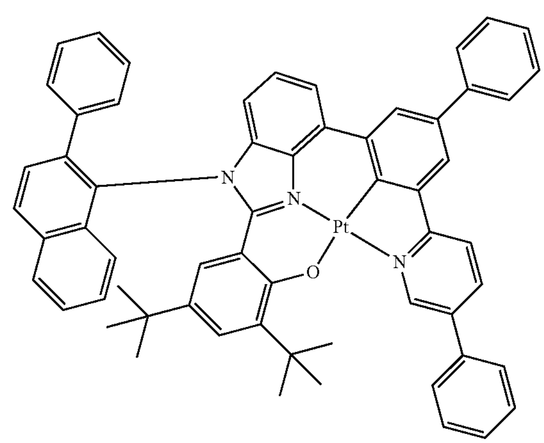

-continued
3-320
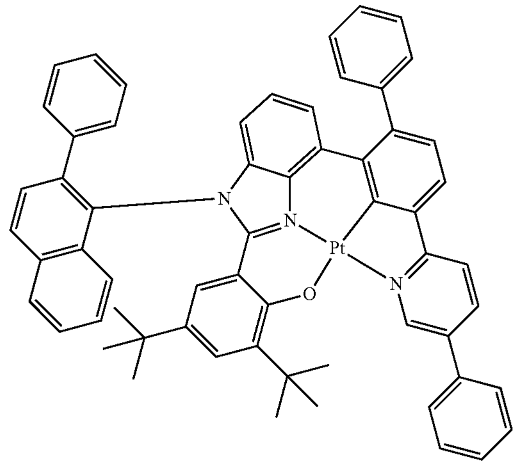
3-321
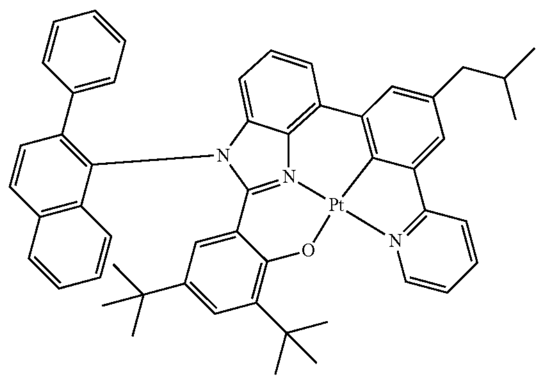
3-322
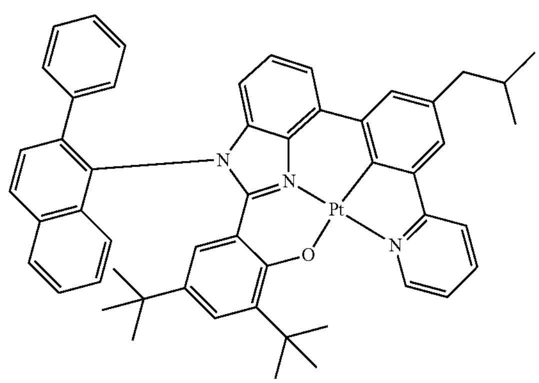
-continued
3-323
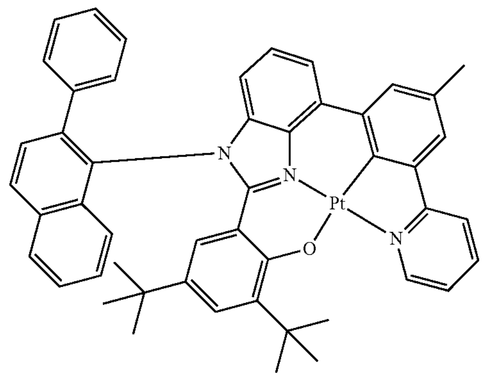
3-324
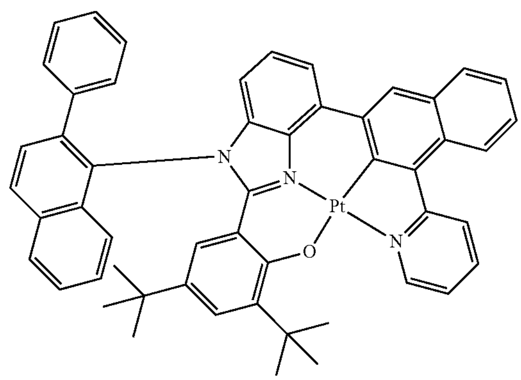
3-325
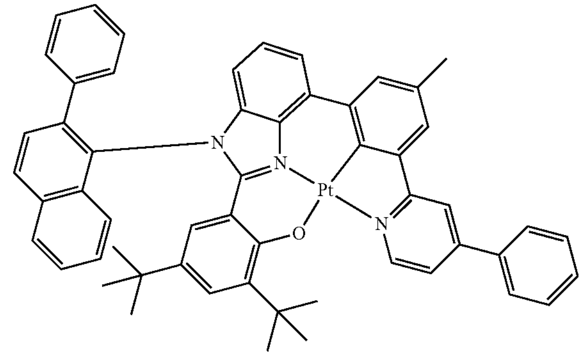
3-326
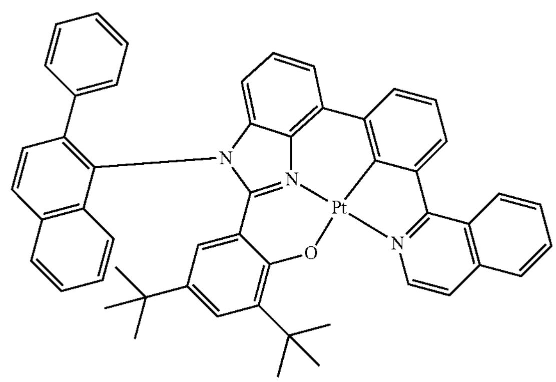

-continued
3-327
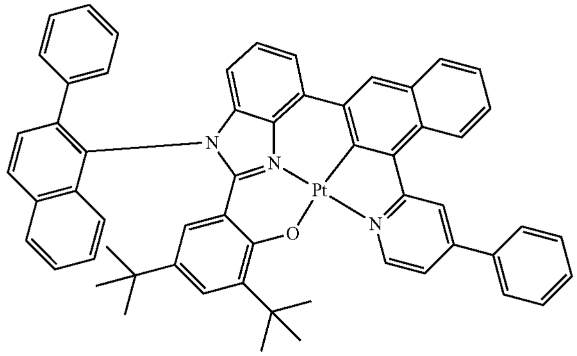
3-328
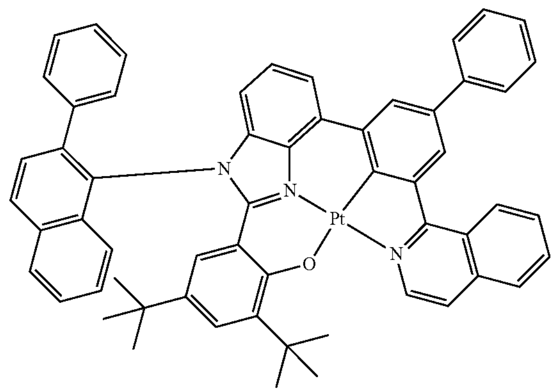
3-329
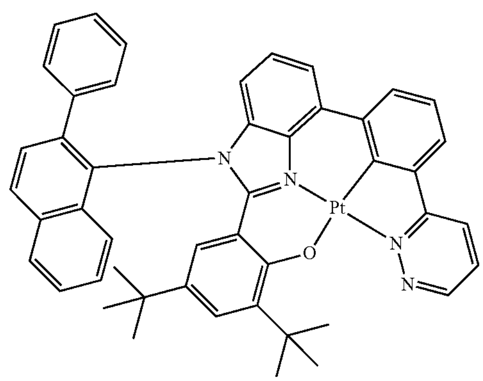
3-330
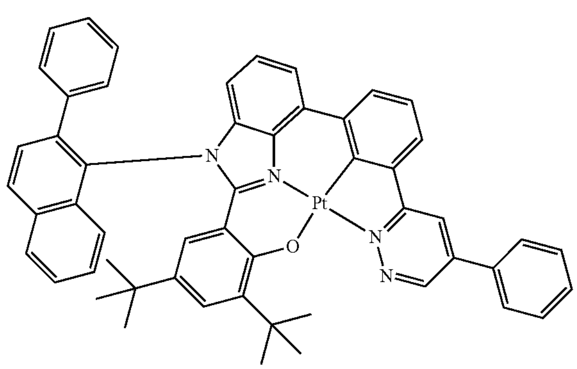
-continued
3-331
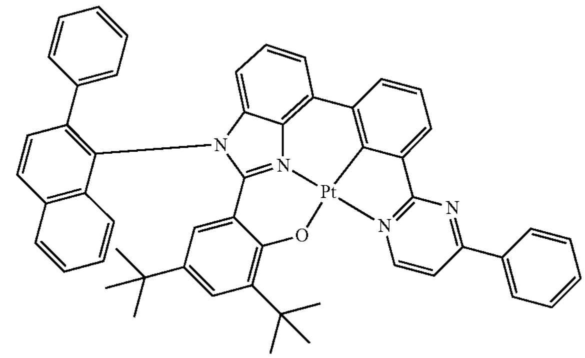
3-332
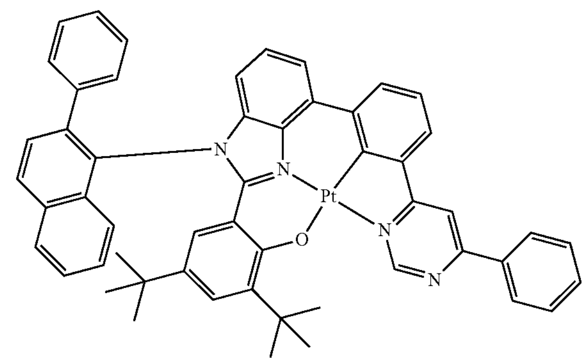
3-333
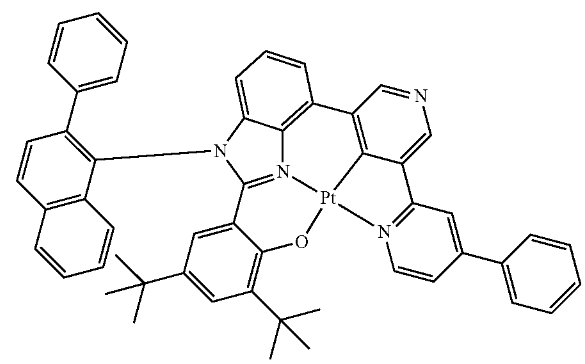
3-334
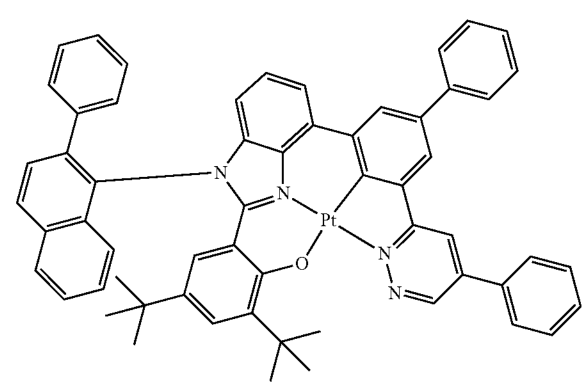

-continued
3-335
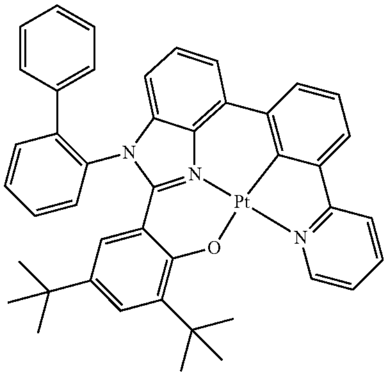
3-336
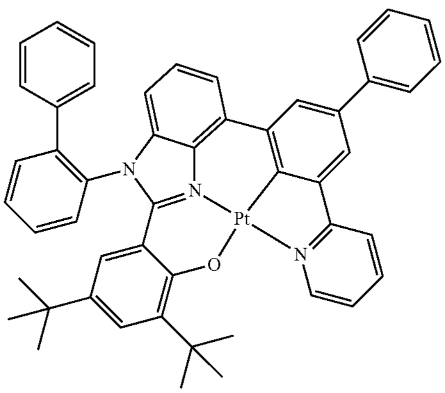
3-337
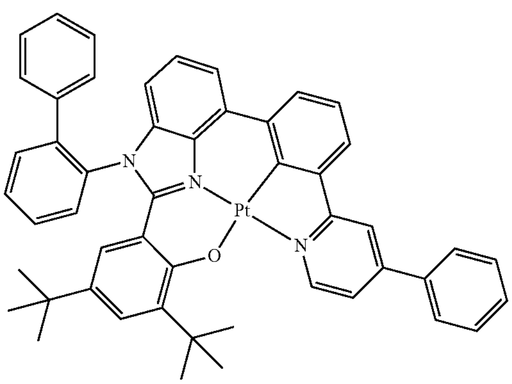
3-338
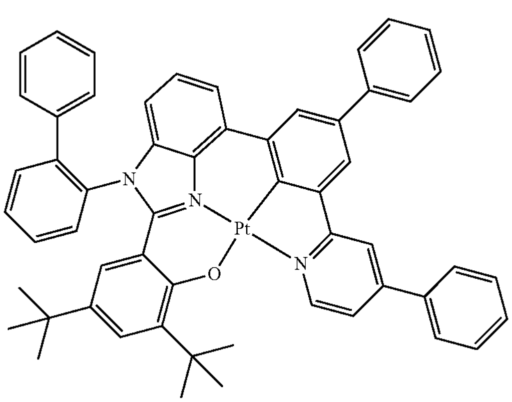
-continued
3-339
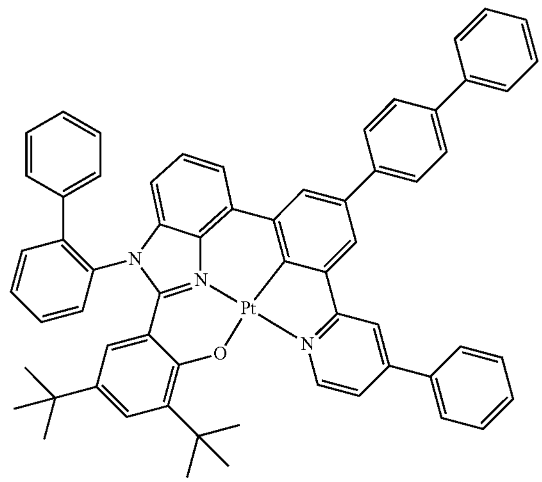
3-340
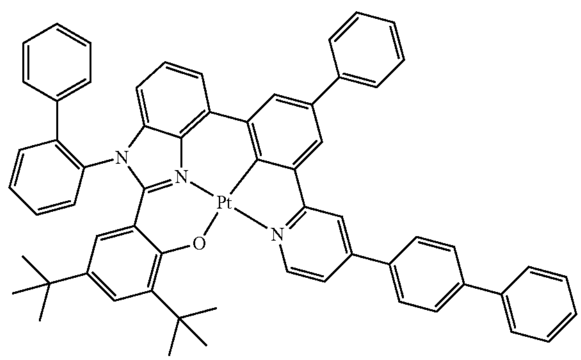
3-341
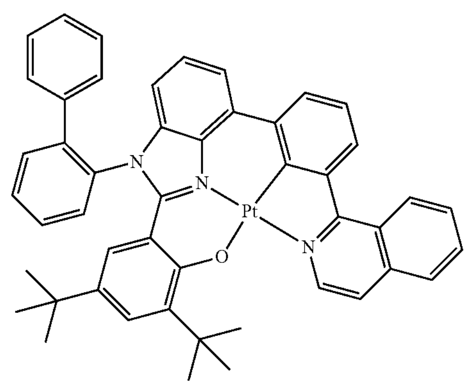
3-342
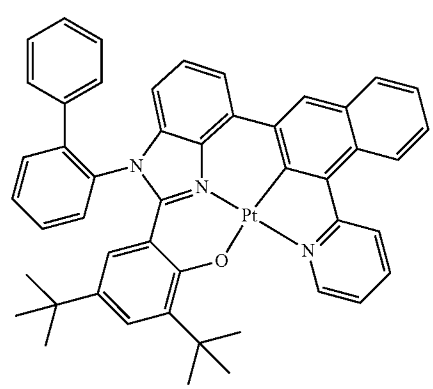

-continued
3-343
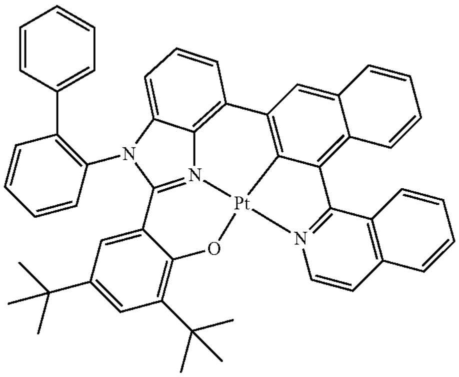
3-344
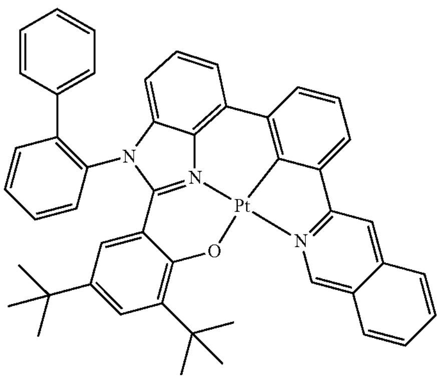
3-345
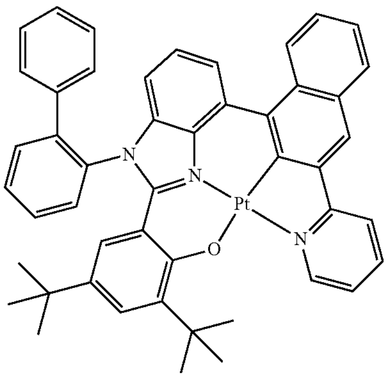
3-346
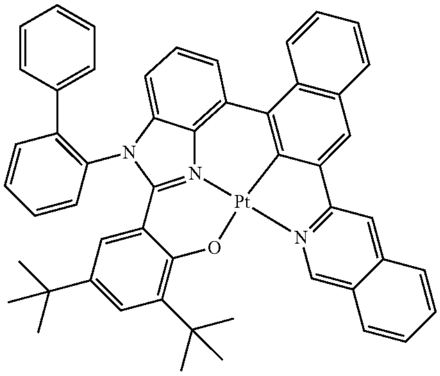
-continued
3-347
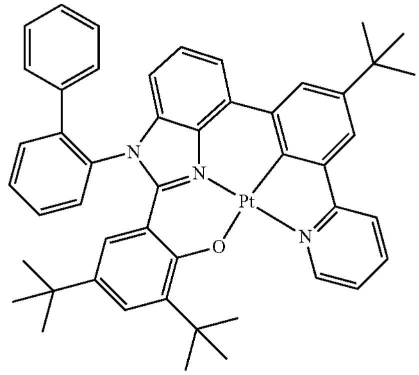
3-348
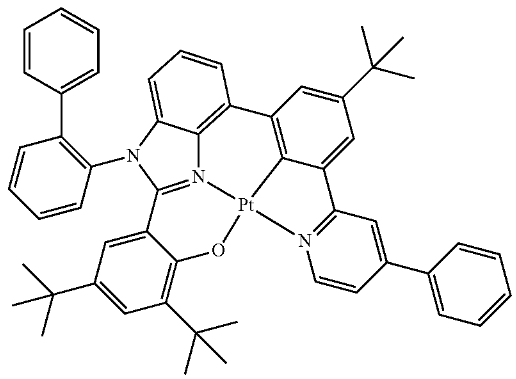
3-349
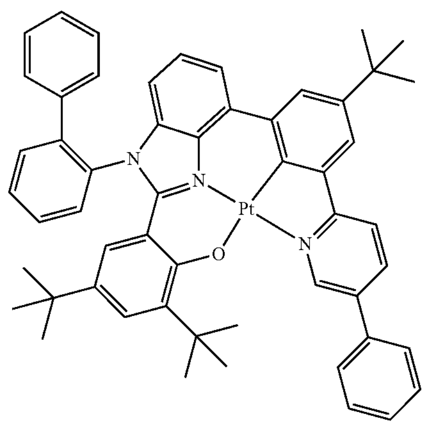
3-350
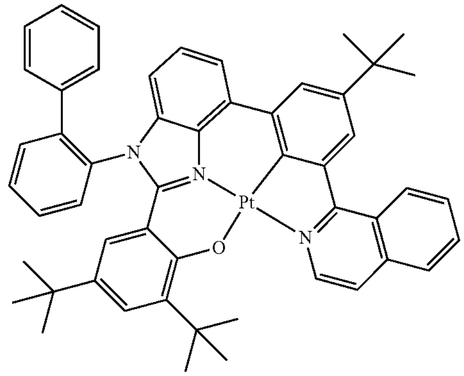

-continued
3-351
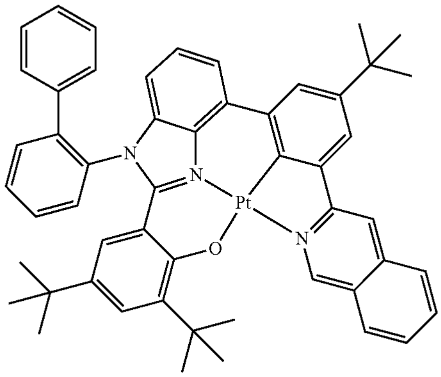
3-352
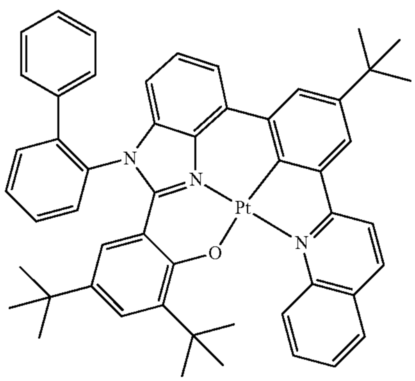
3-353
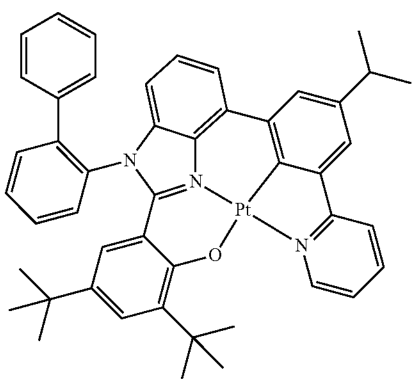
3-354
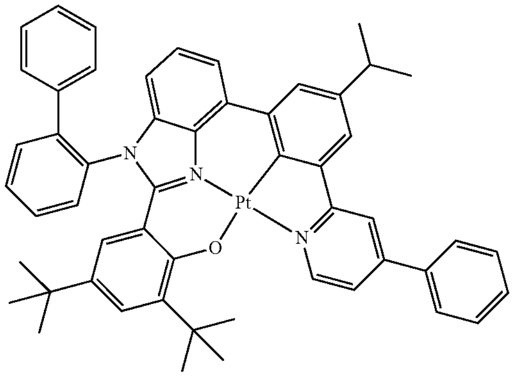
-continued
3-355
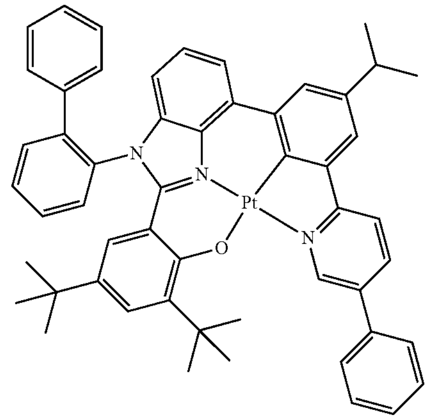
3-356
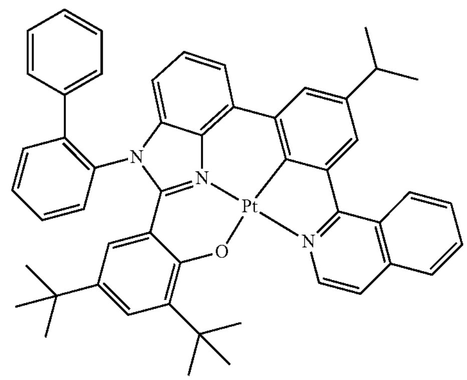
3-357
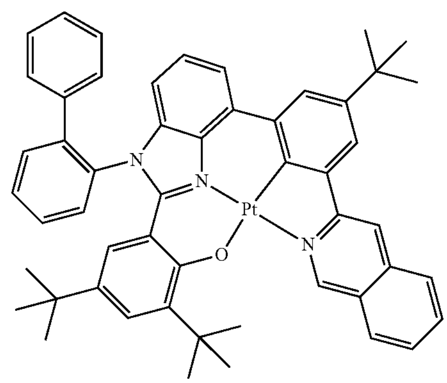
3-358
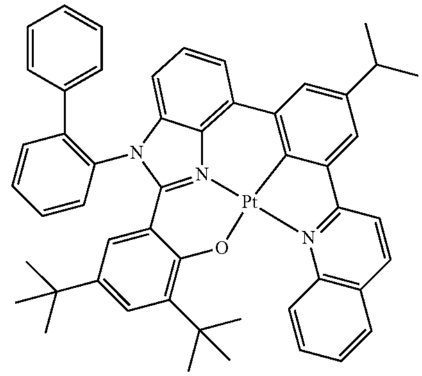

3-359
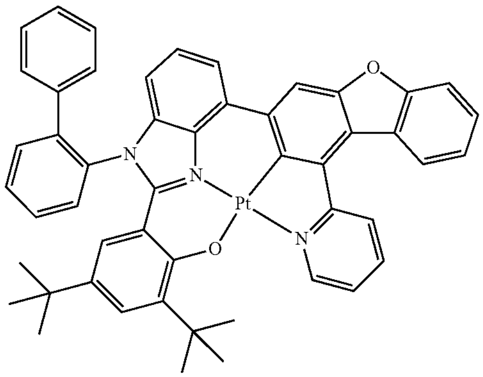
3-360
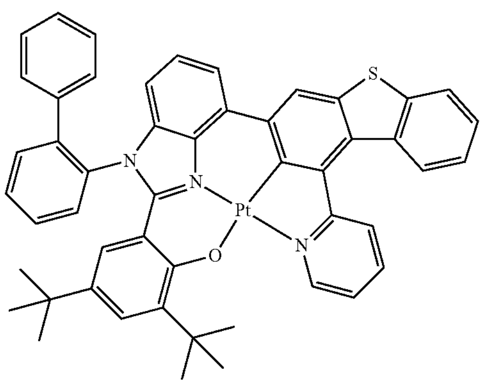
3-361
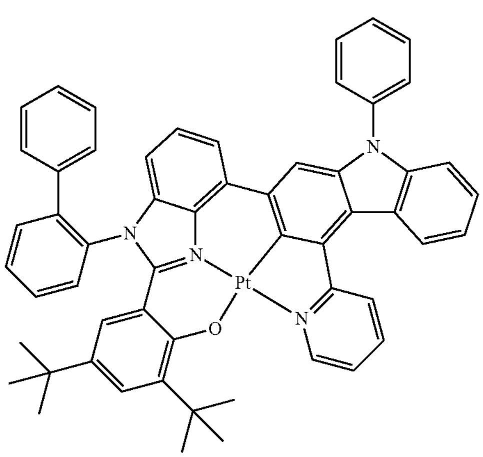
3-362
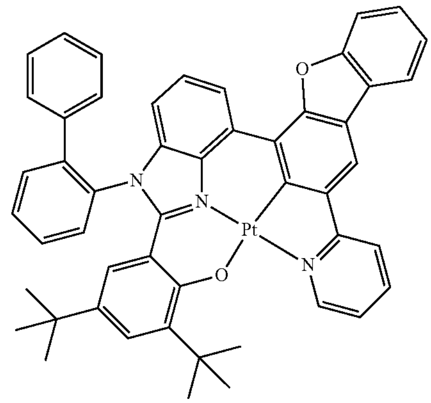
3-363
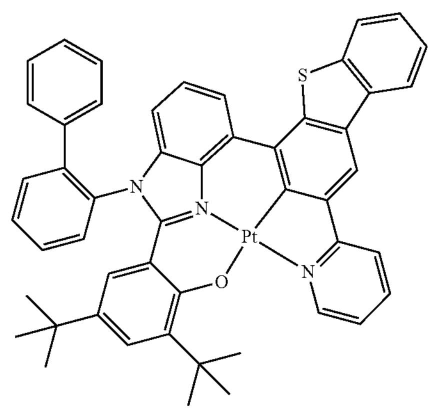
3-364
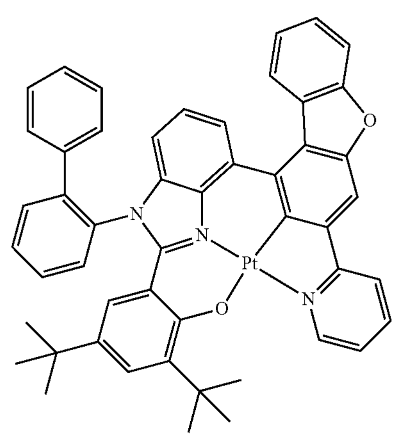

-continued
3-365
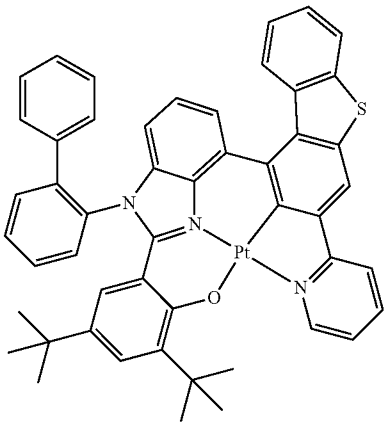
3-366
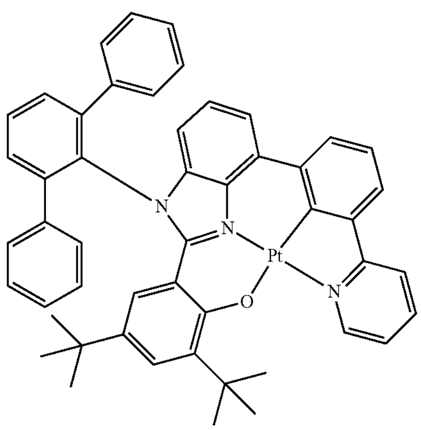
3-367
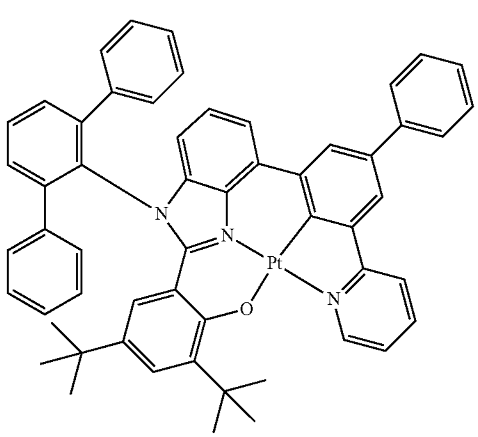
-continued
3-368
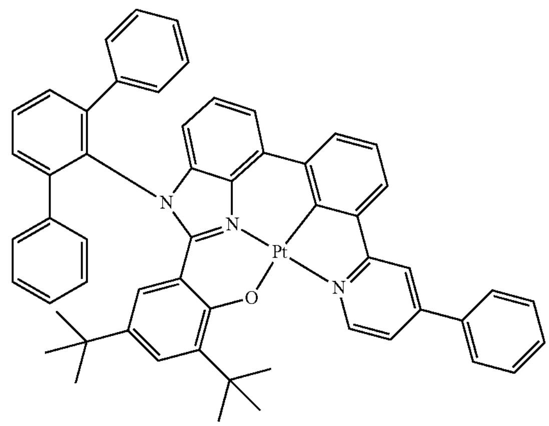
3-369
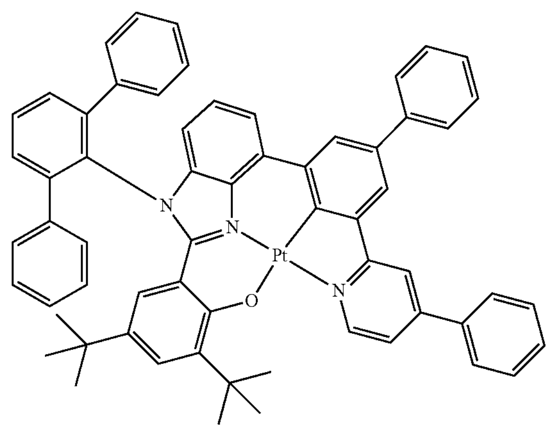
3-370
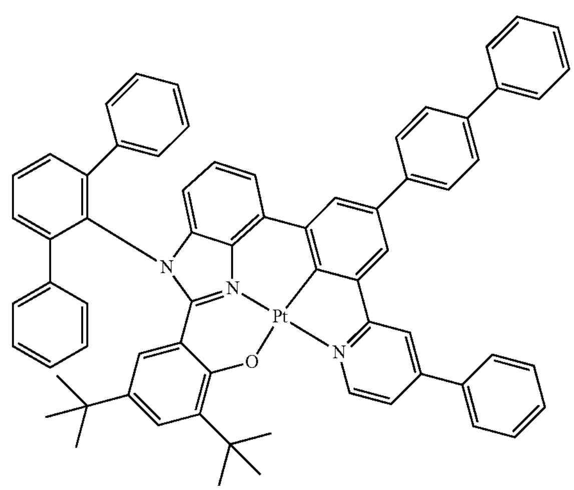

-continued
3-371
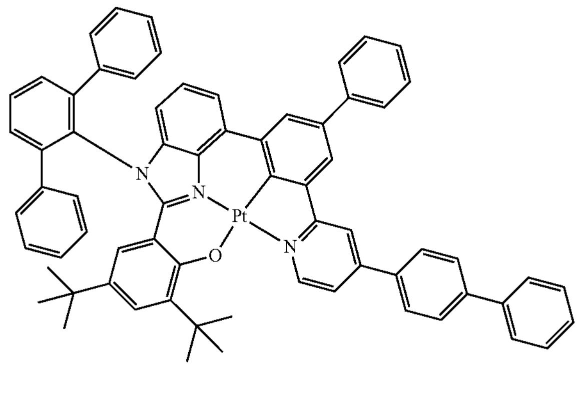
3-372
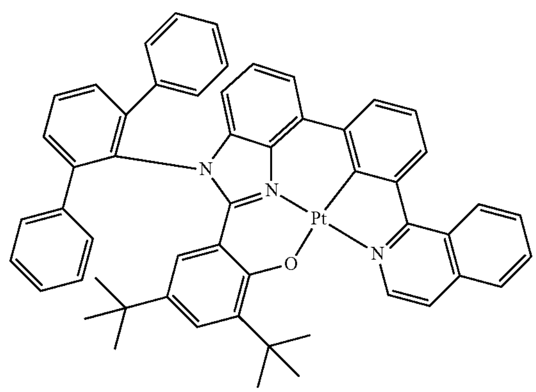
3-373
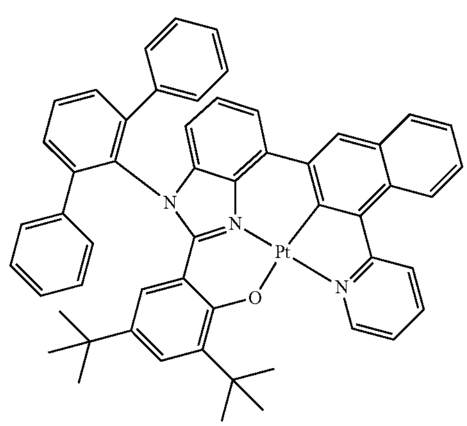
-continued
3-374
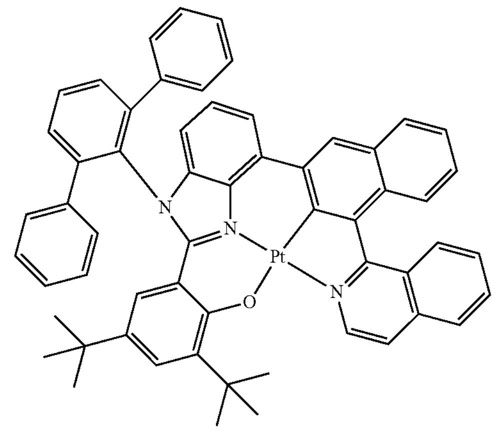
3-375
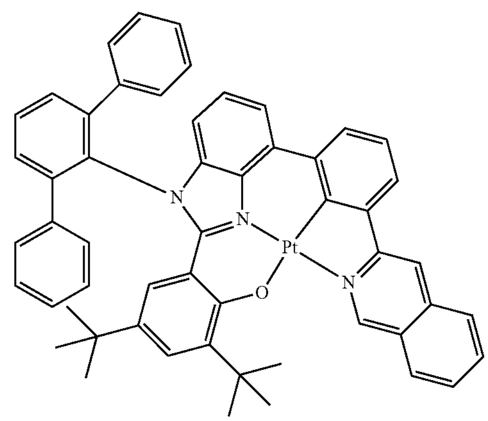
3-376
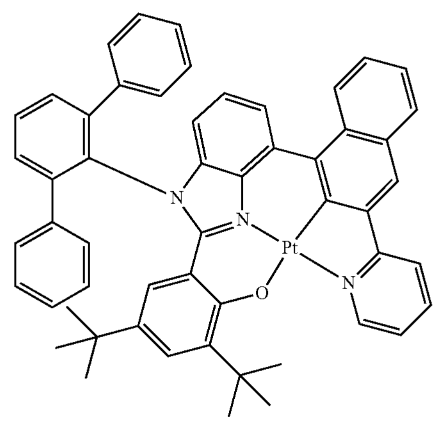

-continued
3-377
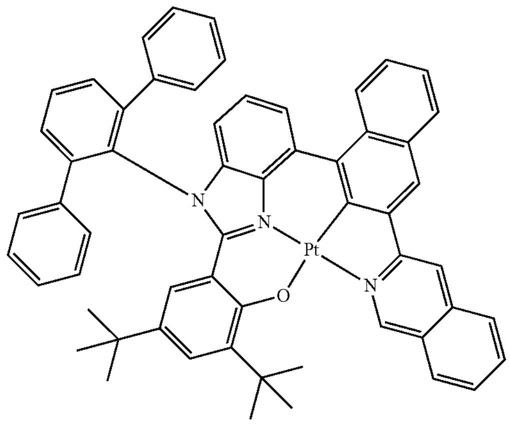
3-378
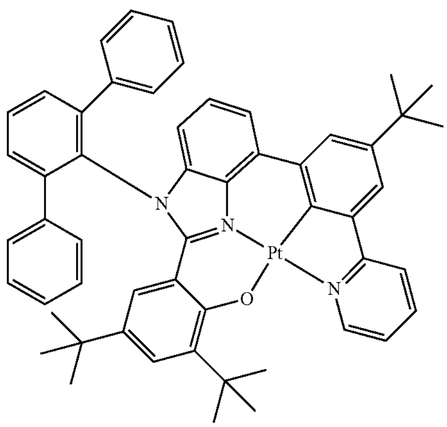
3-379
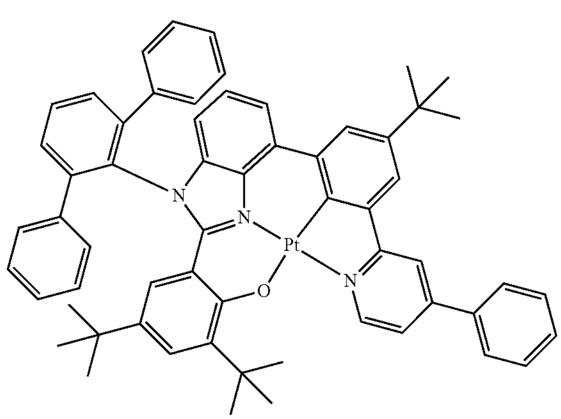
-continued
3-380
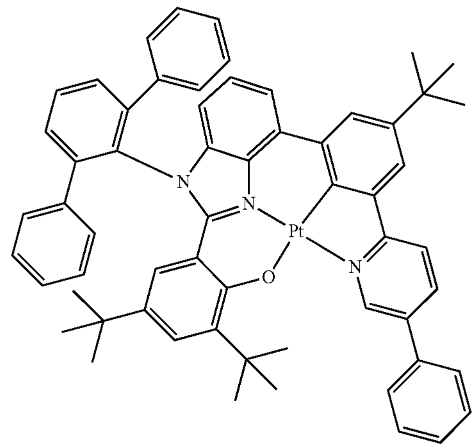
3-381
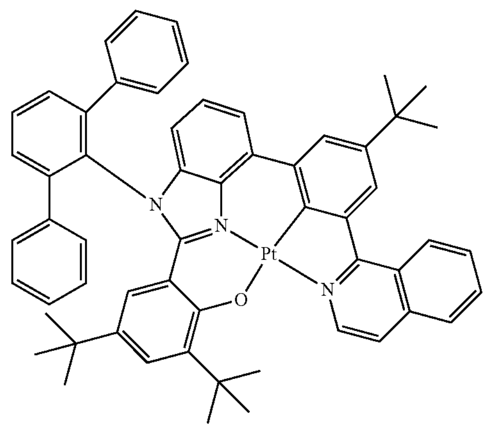
3-382
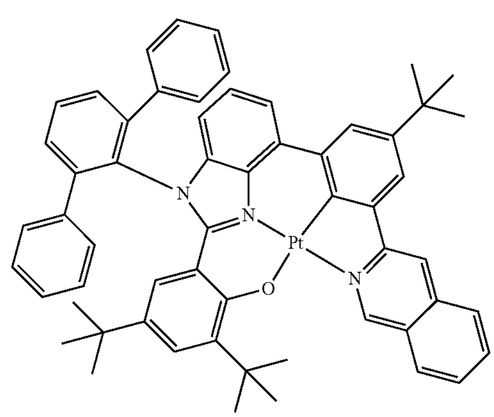

-continued
3-383
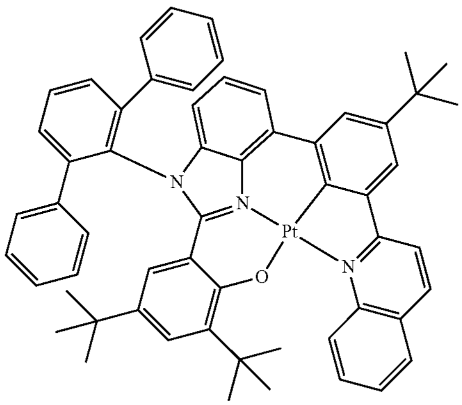
3-384
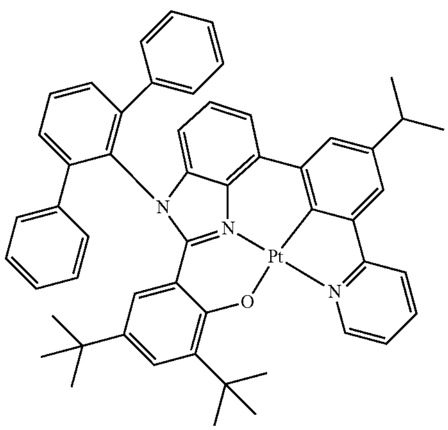
3-385
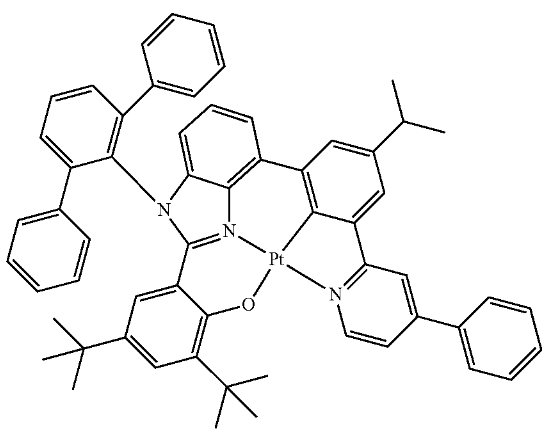
-continued
3-386
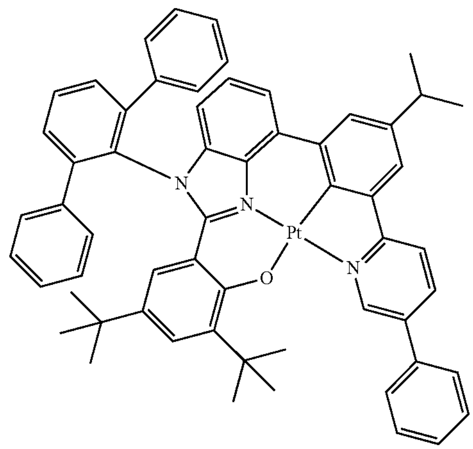
3-387
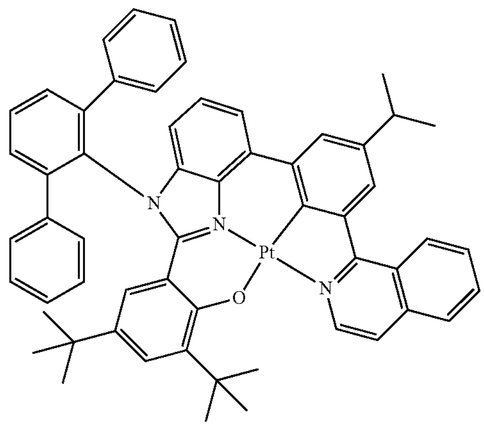
3-388
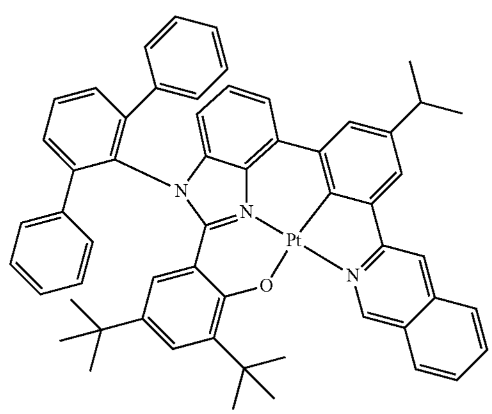

-continued
3-389
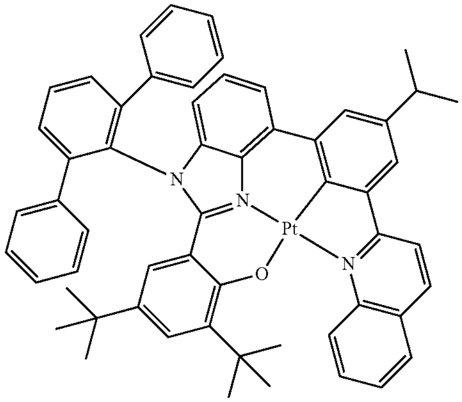
3-390
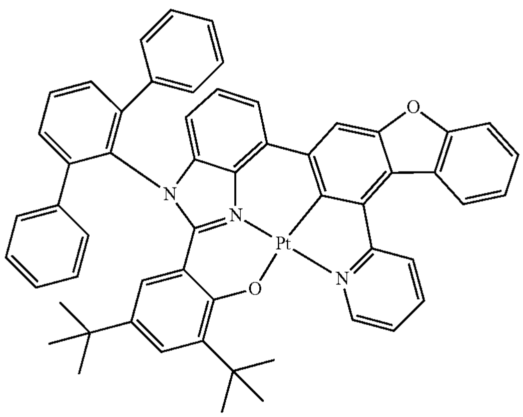
3-391
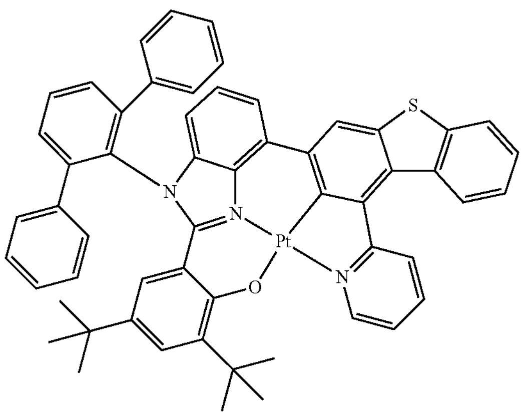
-continued
3-392
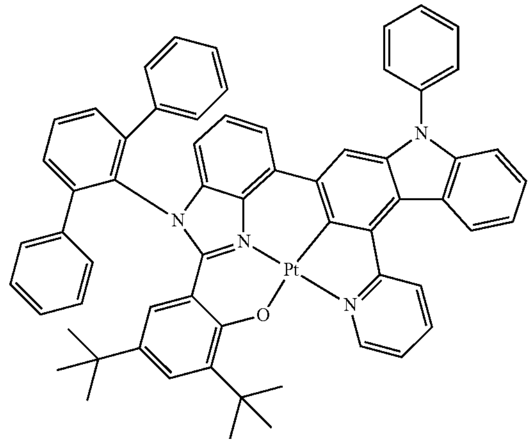
3-393
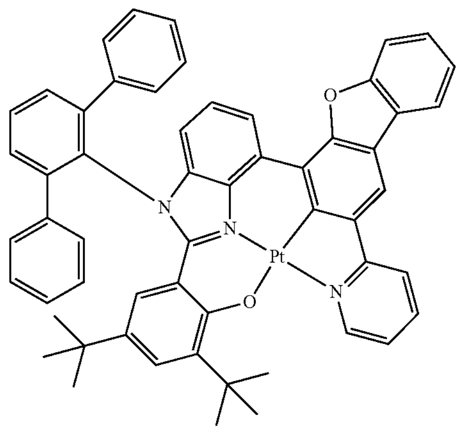
3-394
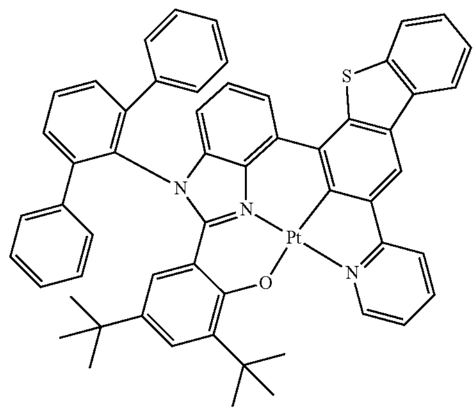

-continued
3-395
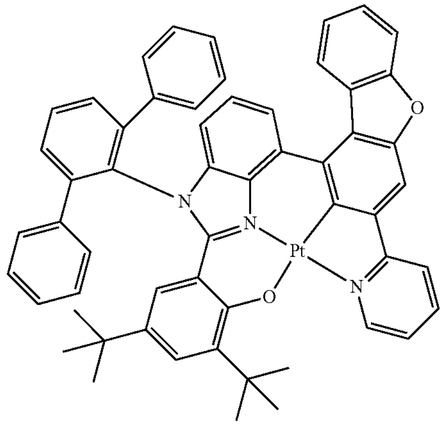
3-396
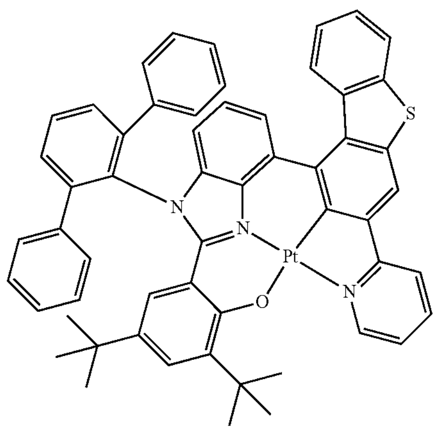
3-397
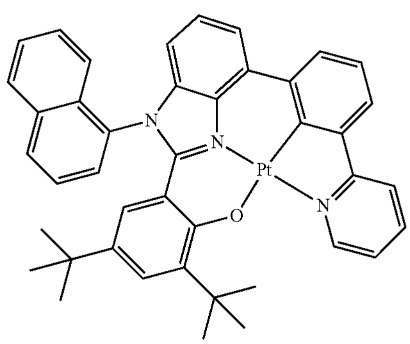
3-398
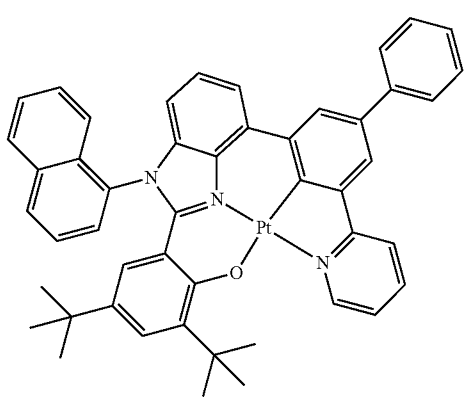
-continued
3-399
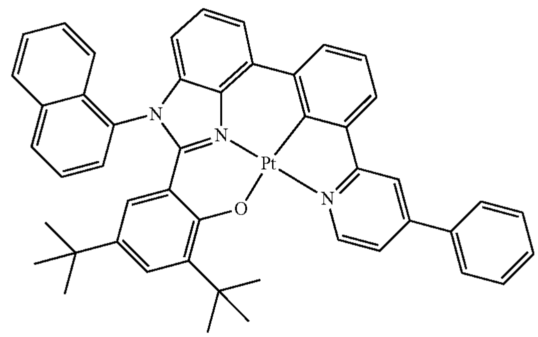
3-400
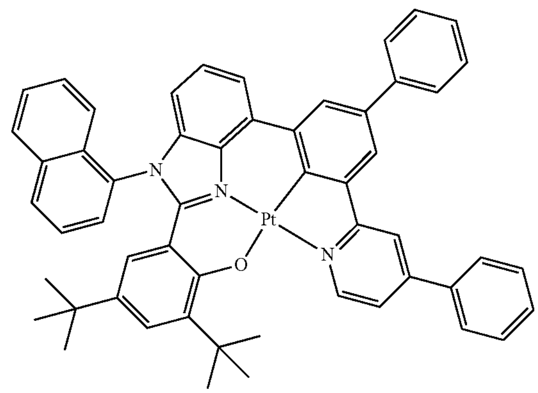
3-401
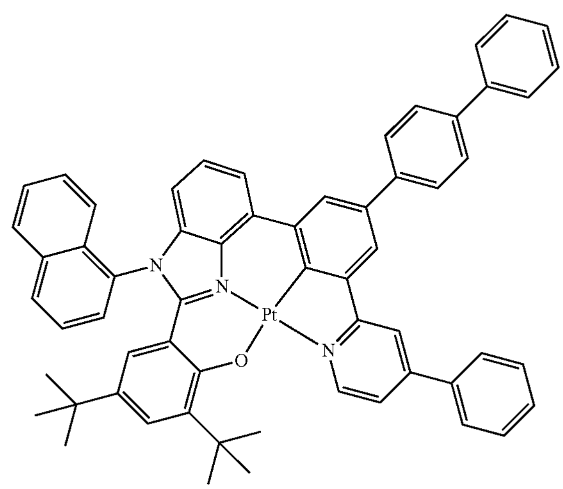
3-402
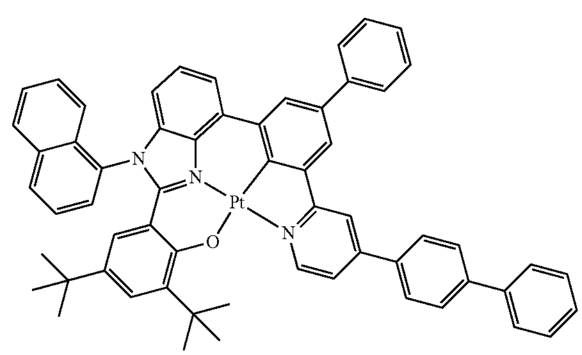

3-403
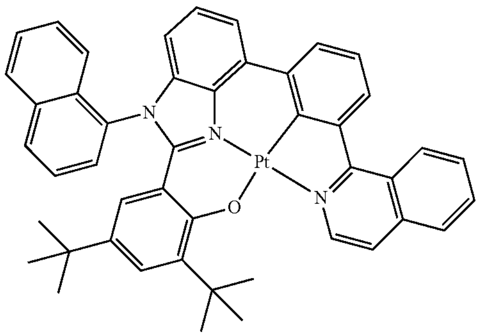
3-404
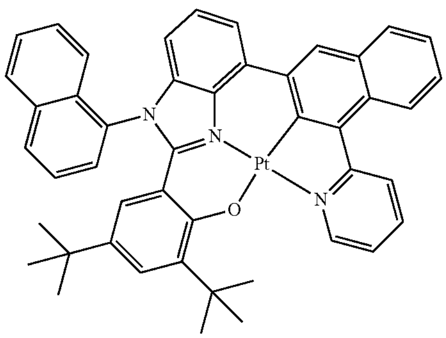
3-405
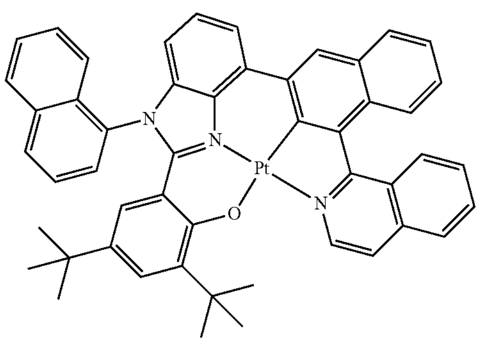
3-406
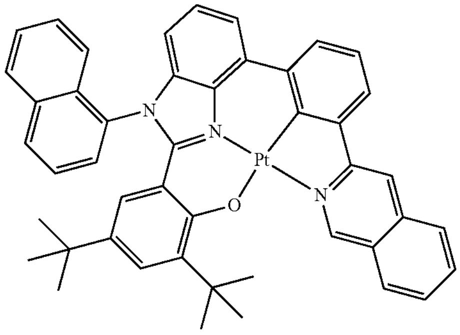
3-407
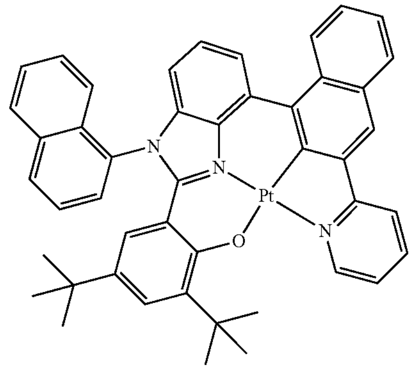
3-408
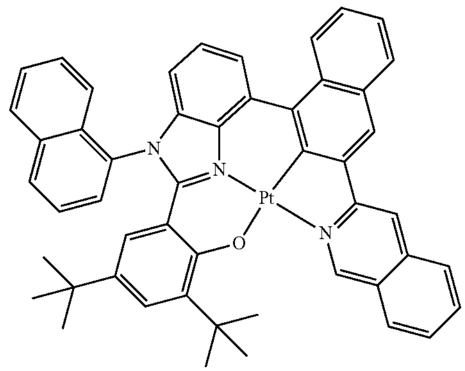
3-409
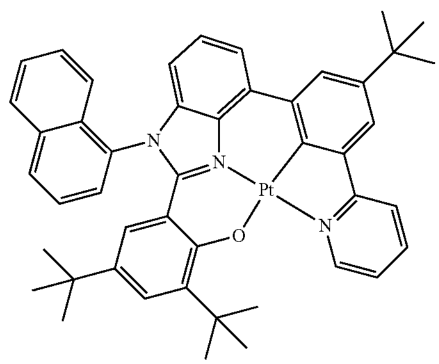
3-410
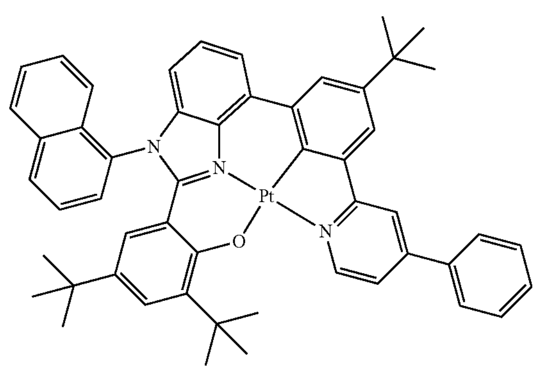

-continued
3-411
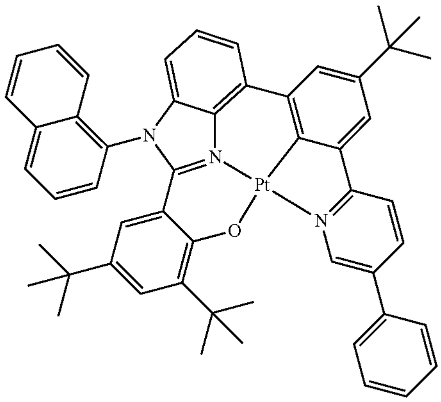
3-412
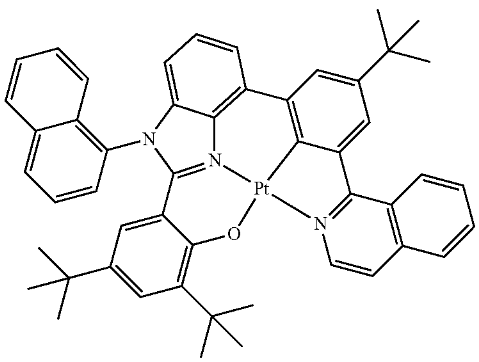
3-413
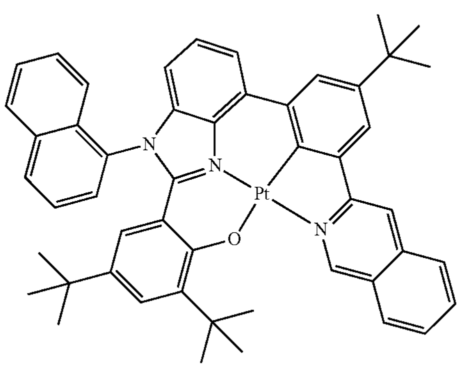
3-414
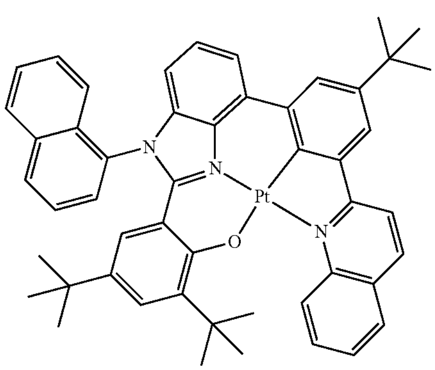
-continued
3-415
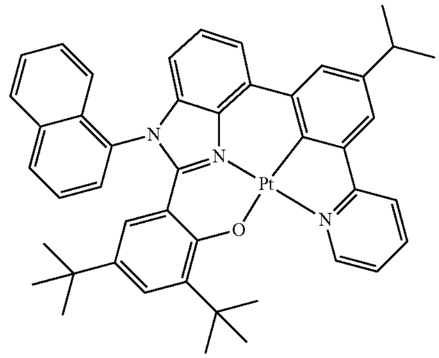
3-416
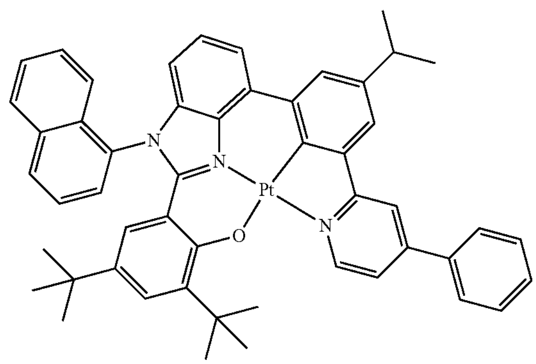
3-417
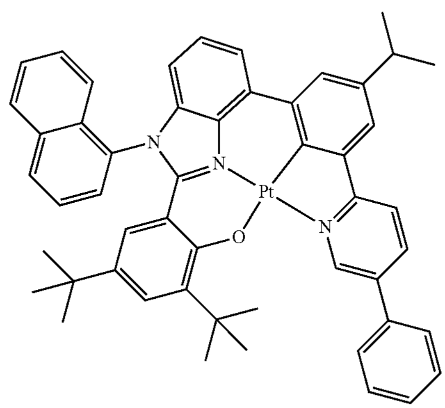
3-418
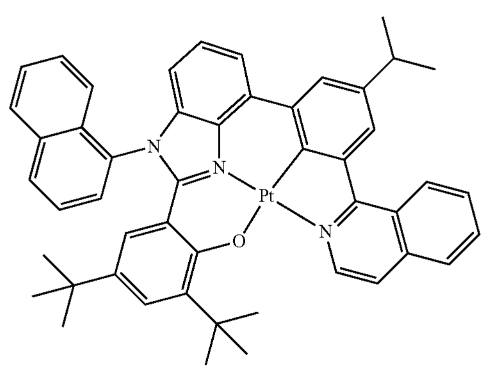

-continued
3-419
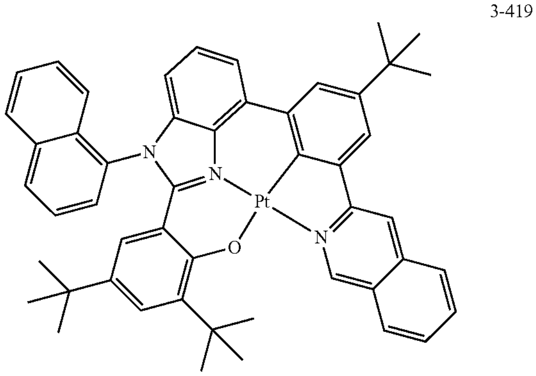
3-420
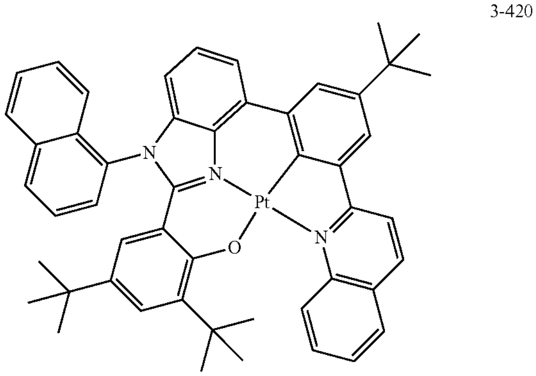
3-421
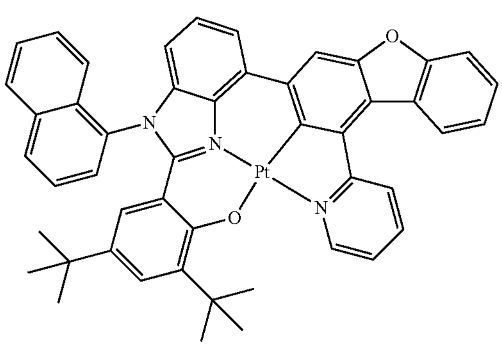
3-422
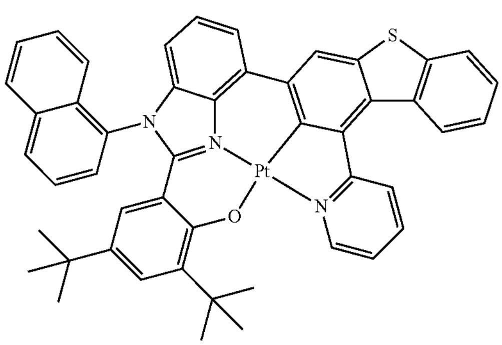
-continued
3-423
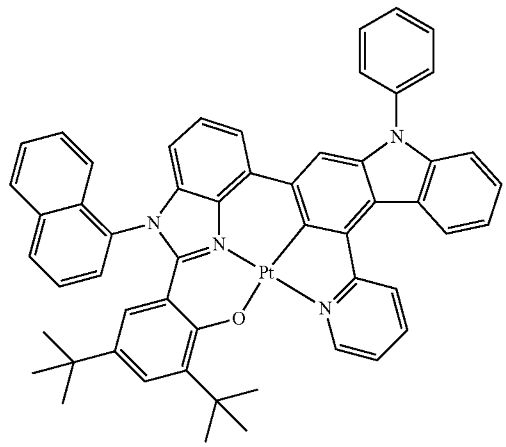
3-424
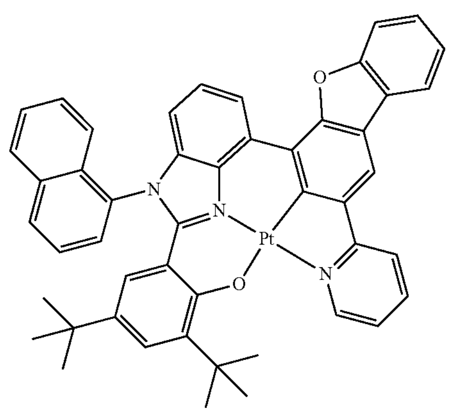
3-425
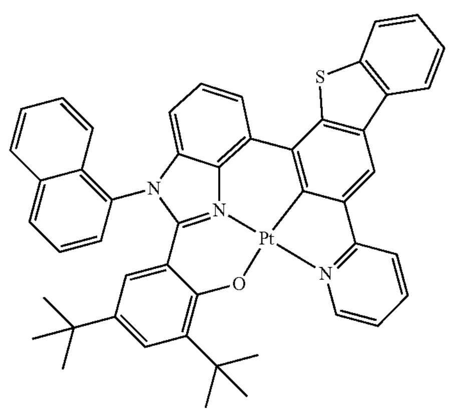

-continued
3-426
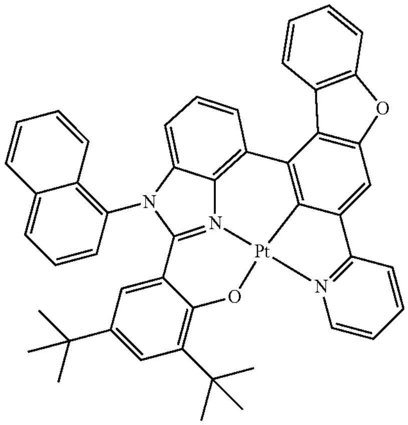
3-427
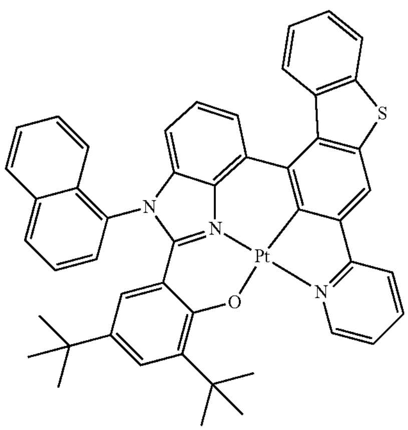
3-428
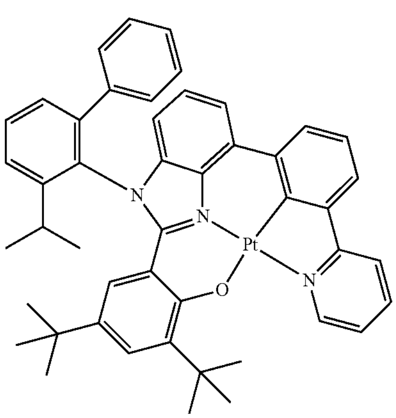
-continued
3-429
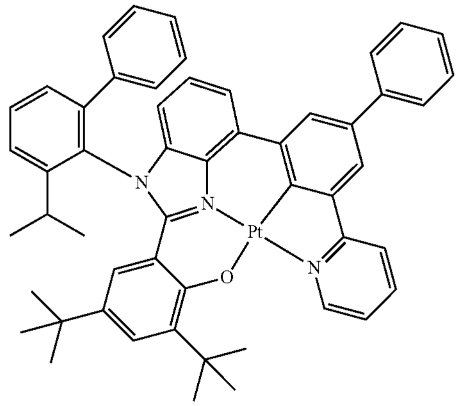
3-430
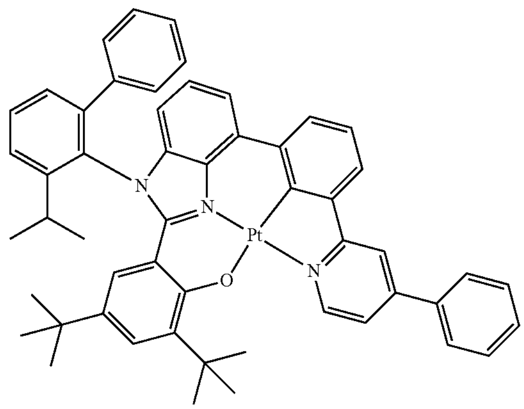
3-431
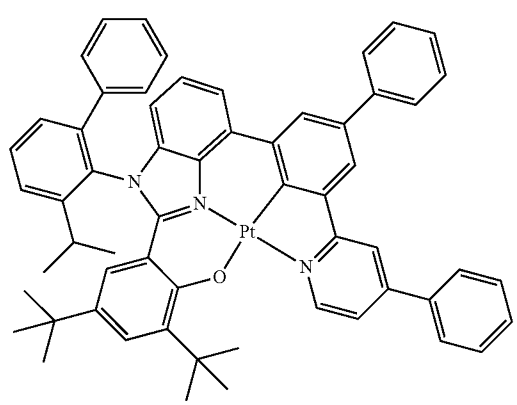

-continued
3-432
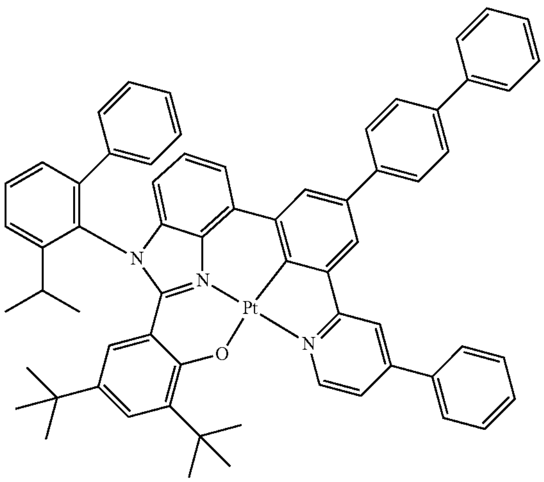
3-433
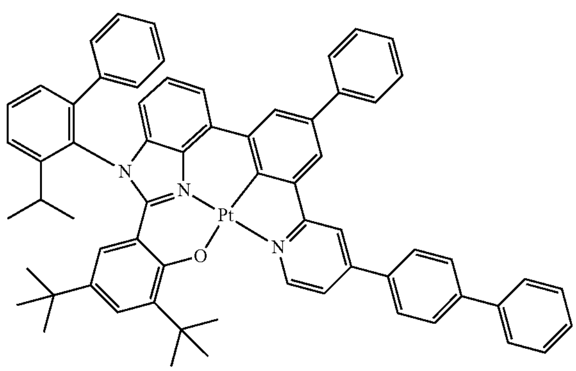
3-434
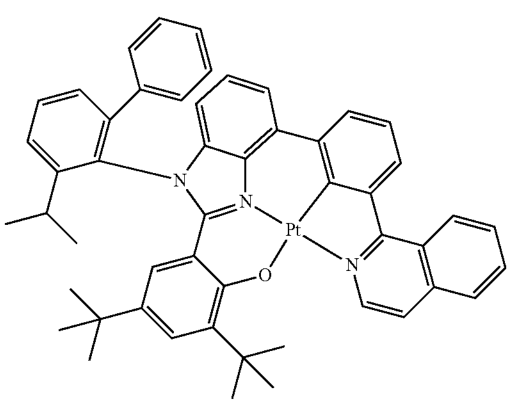
-continued
3-435
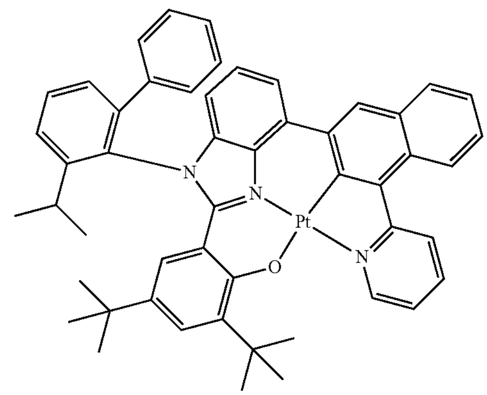
3-436
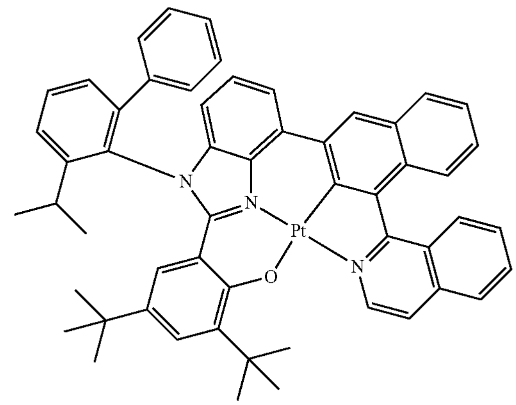
3-437
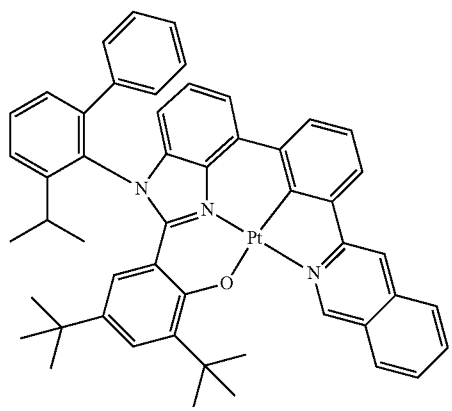
3-438
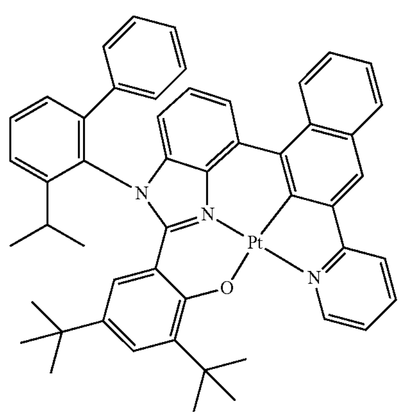

-continued
3-439
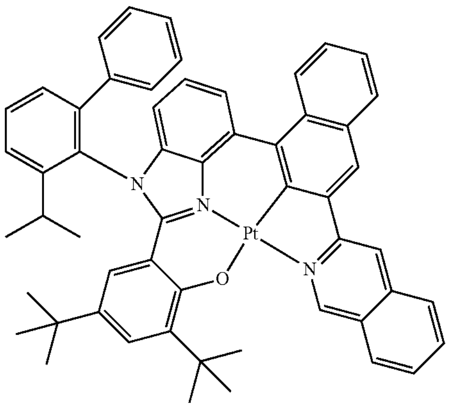
3-440
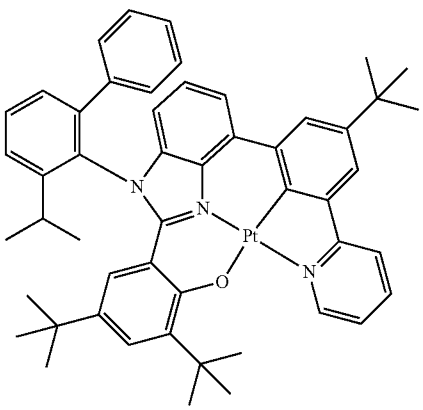
3-441
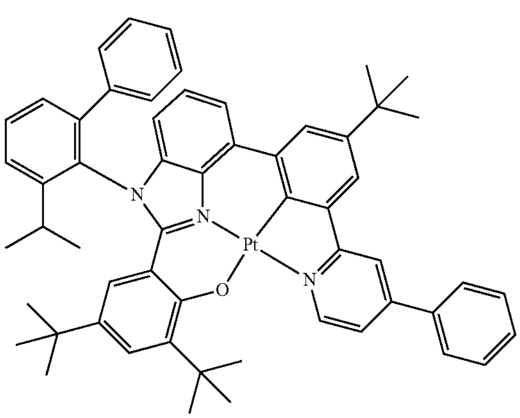
-continued
3-442
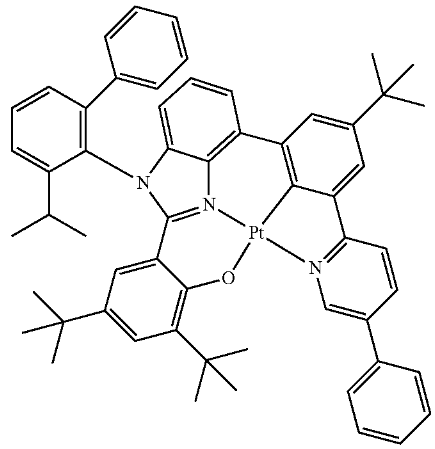
3-443
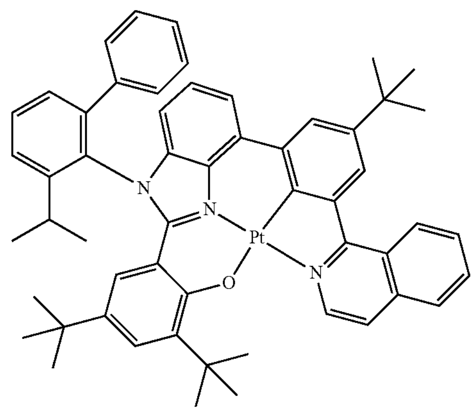
3-444
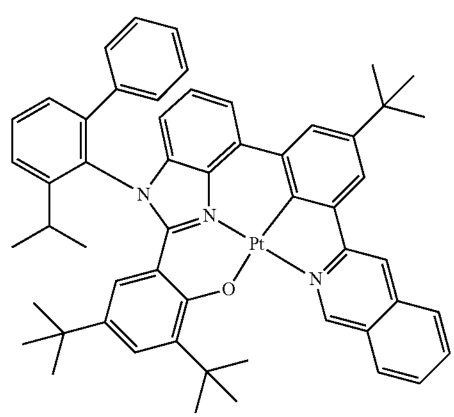

-continued
3-445
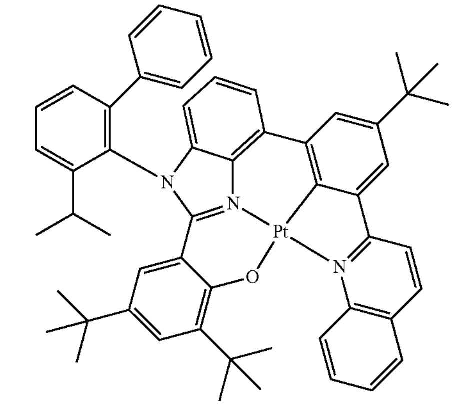
3-446
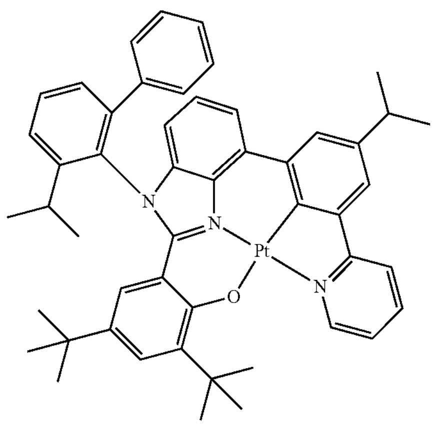
3-447
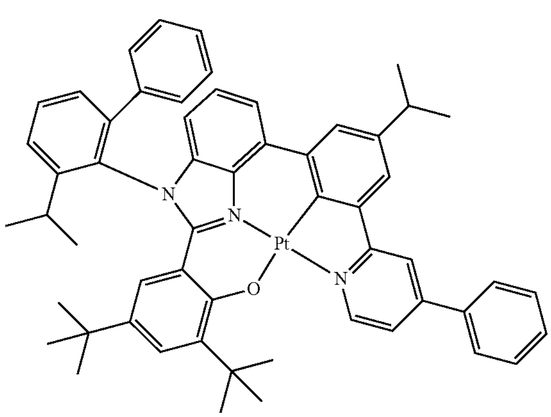
-continued
3-448
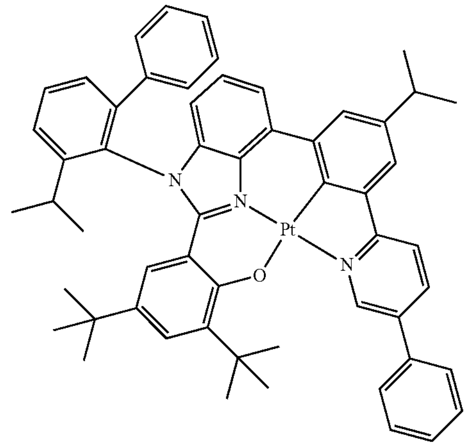
3-449
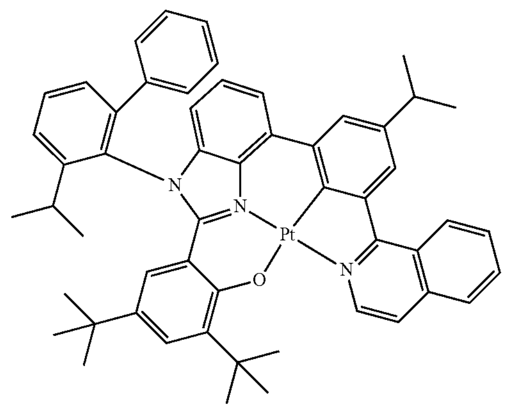
3-450
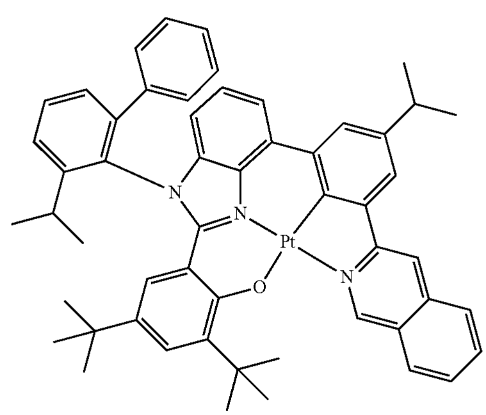

3-451
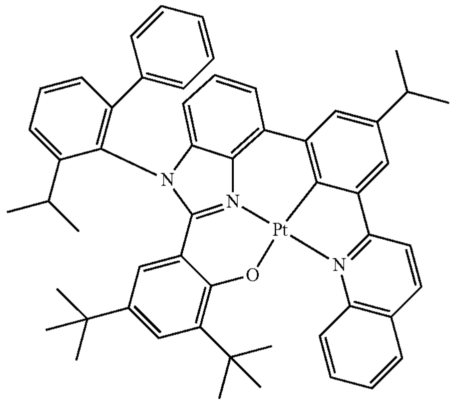
3-452
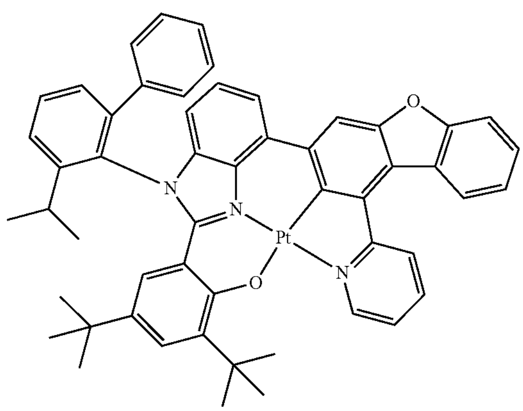
3-453
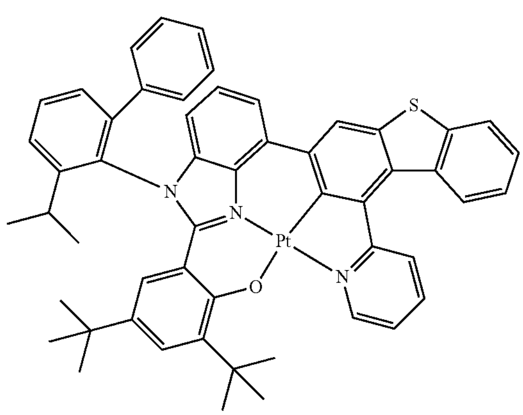
3-454
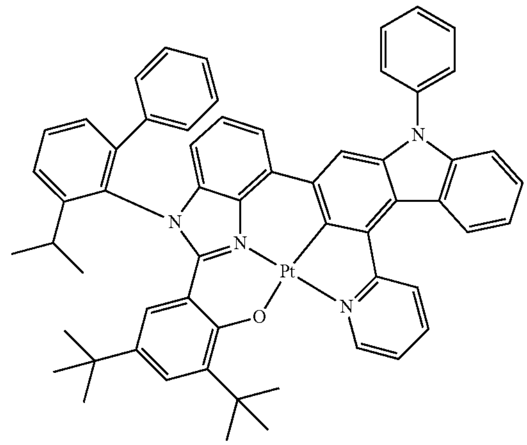
3-455
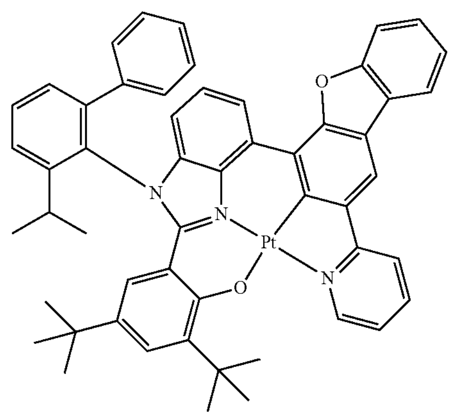
3-456
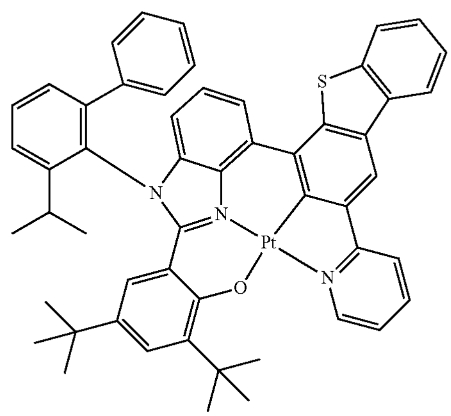

3-457
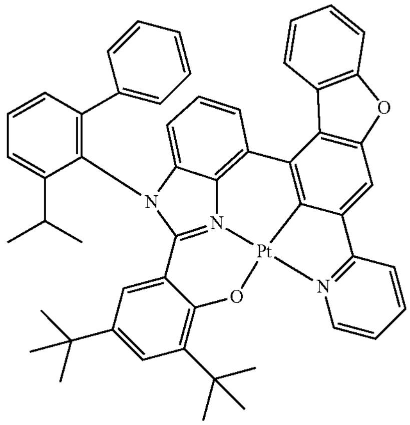
3-458
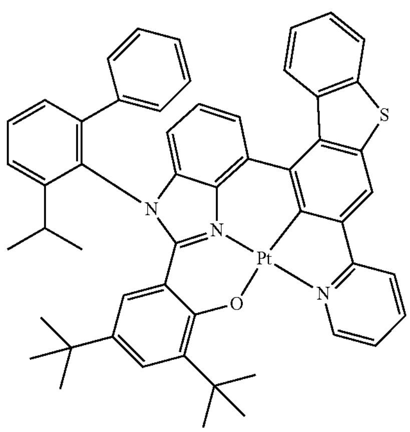
3-459
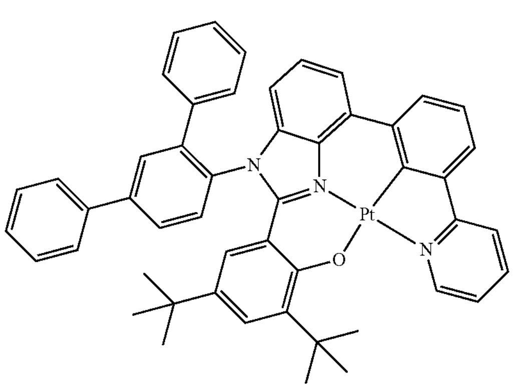
3-460
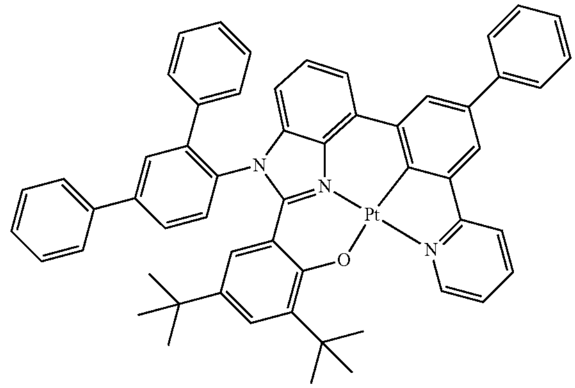
3-461
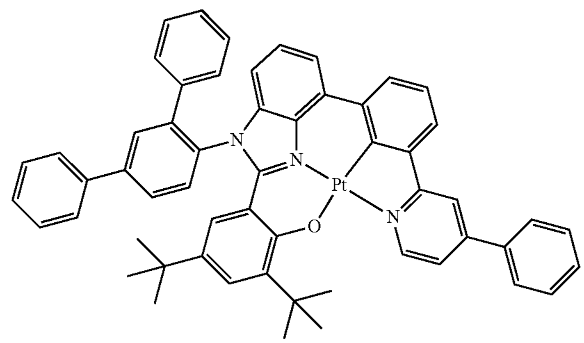
3-462
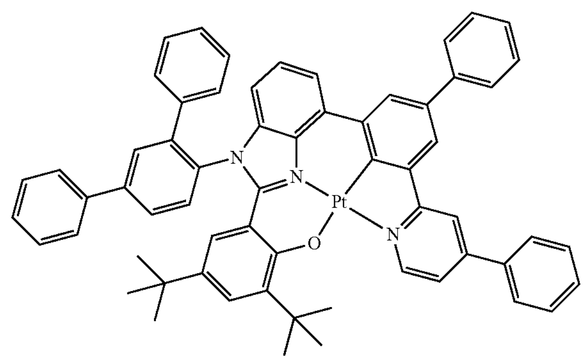
3-463
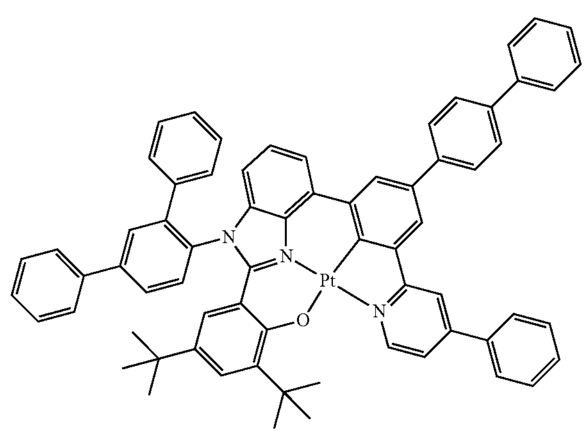

-continued
3-464
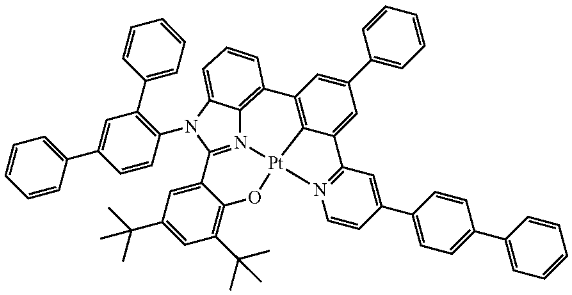
3-465
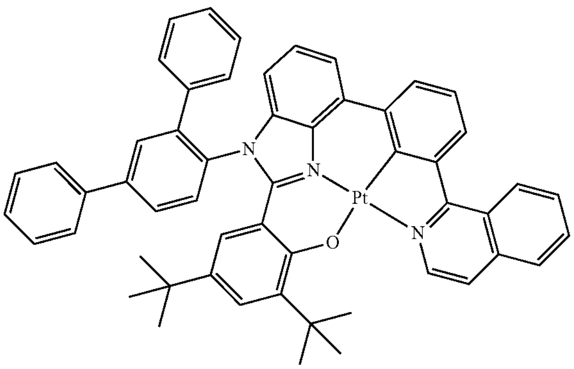
3-466
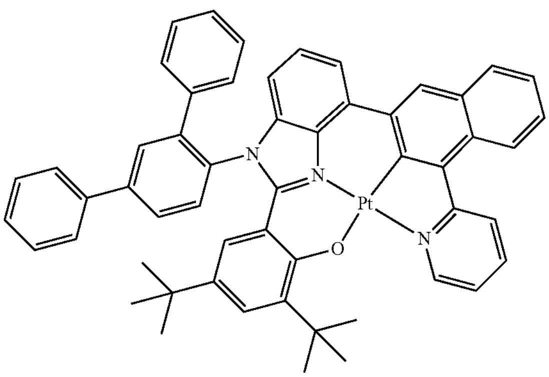
3-467
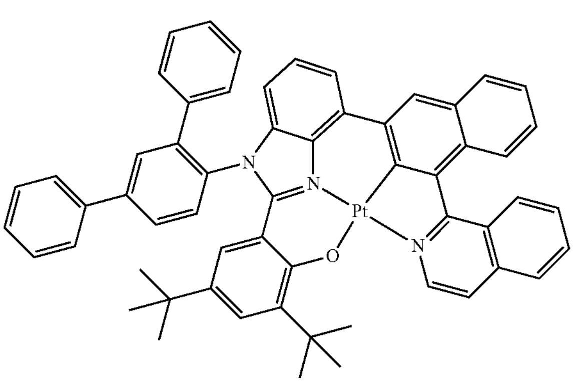
-continued
3-468
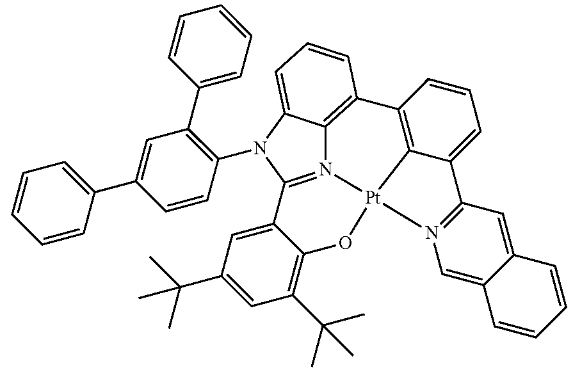
3-469
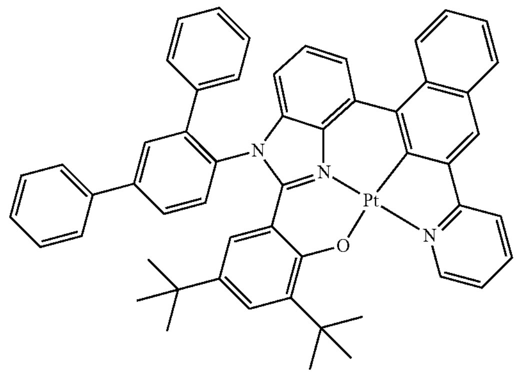
3-470
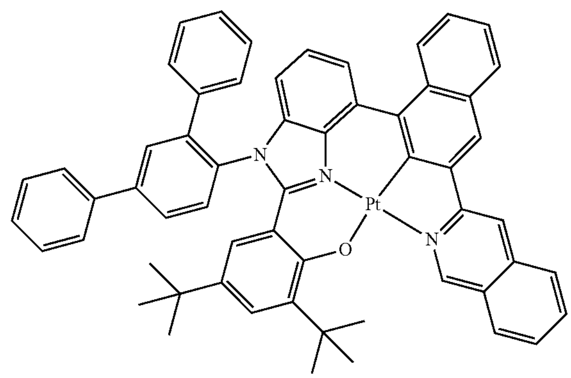
3-471
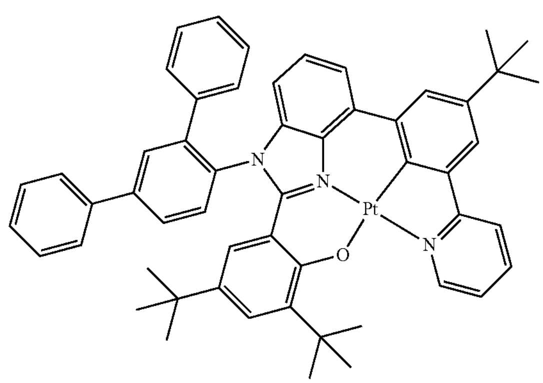

-continued
3-472
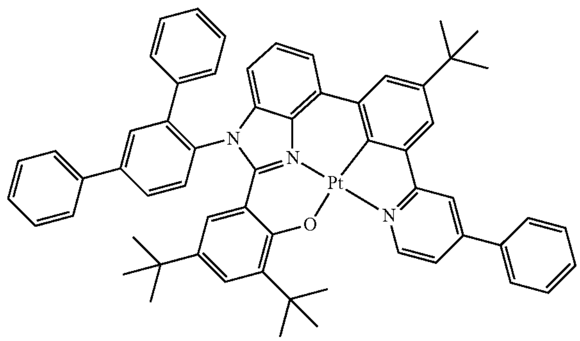
3-473
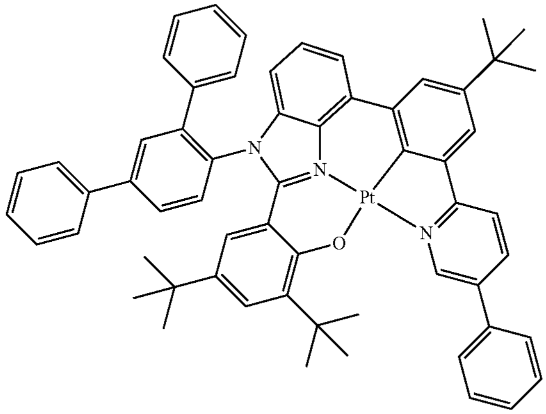
3-474
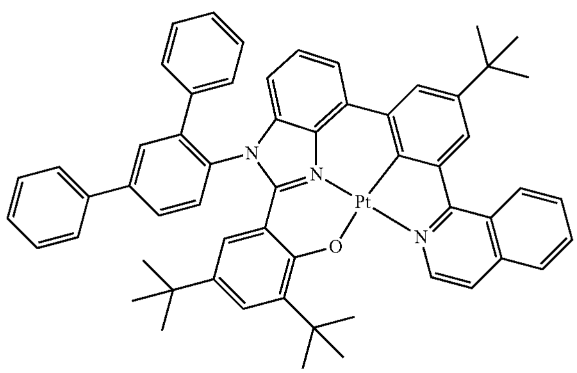
3-475
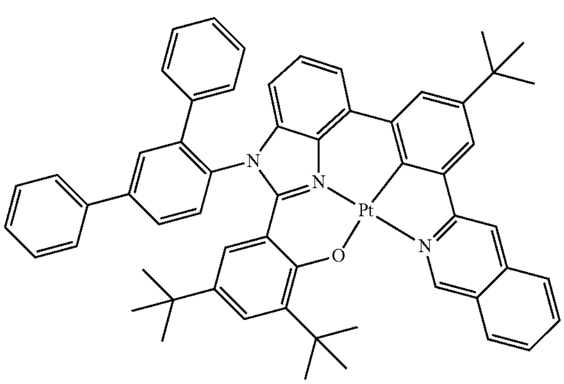
-continued
3-476
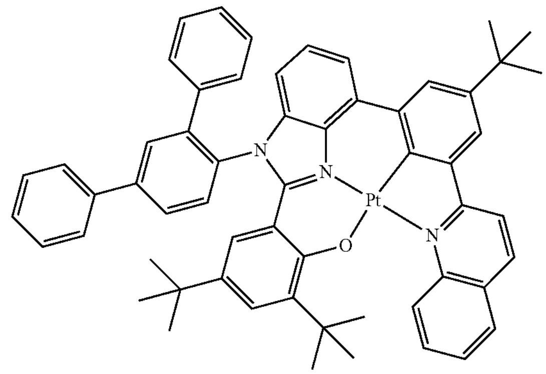
3-477
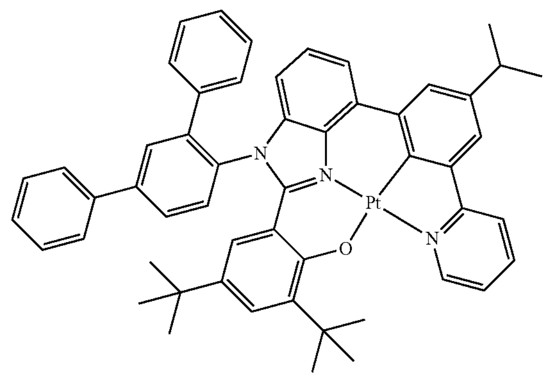
3-478
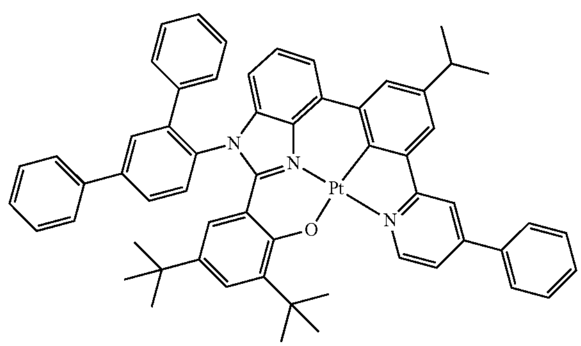
3-479
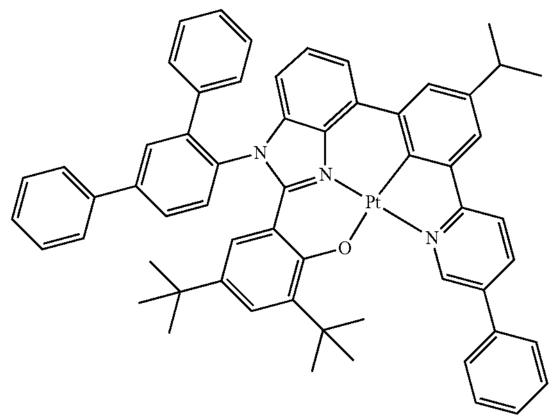

3-480
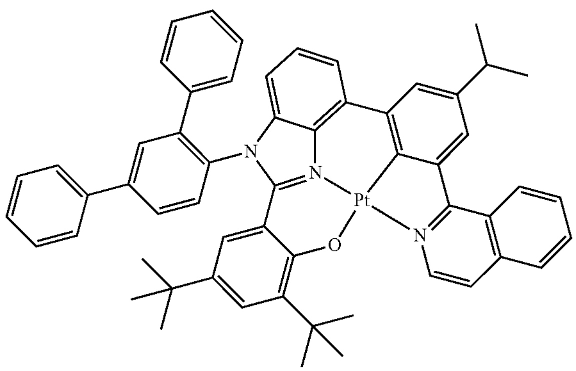
3-481
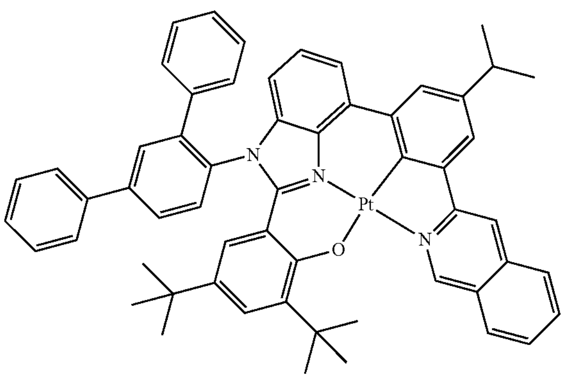
3-482
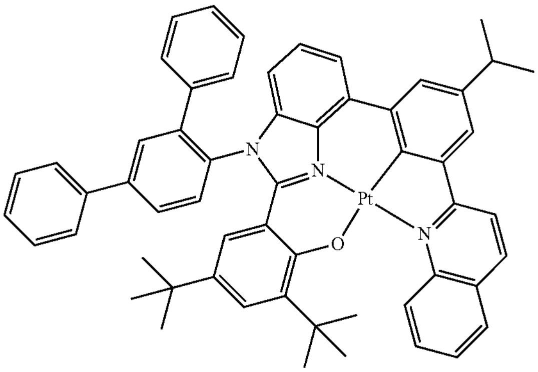
3-483
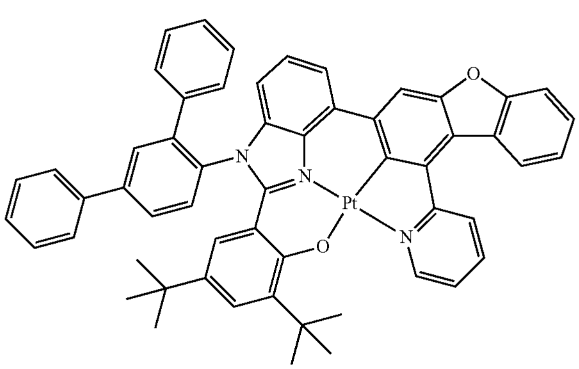
3-484
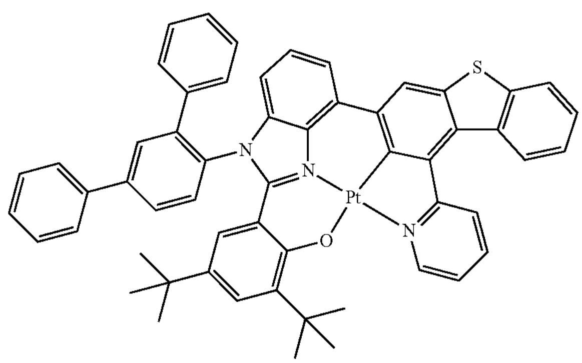
3-485
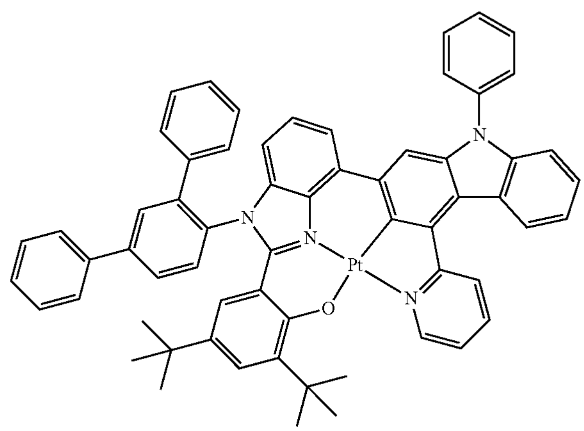
3-486
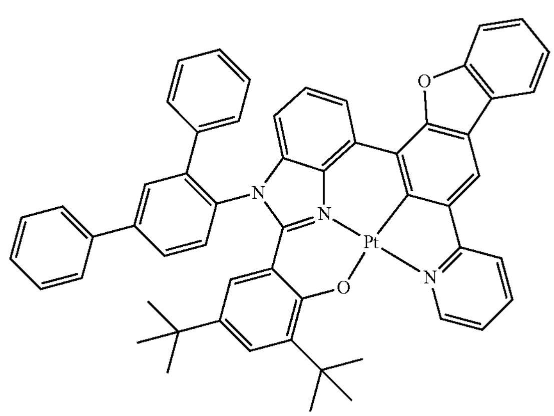

-continued
3-487
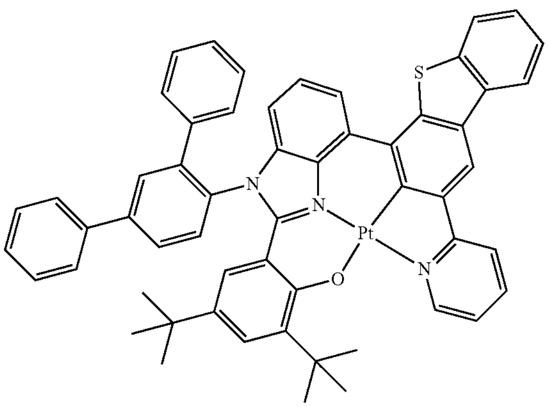
3-488
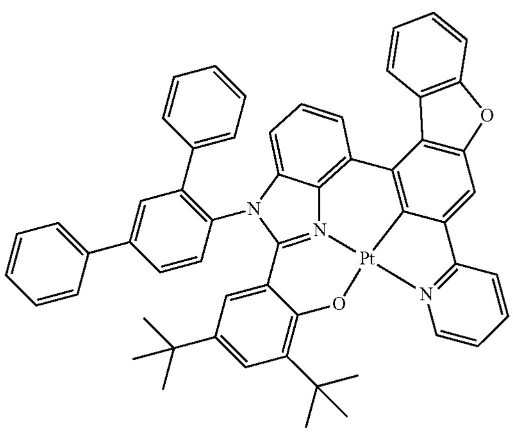
3-489
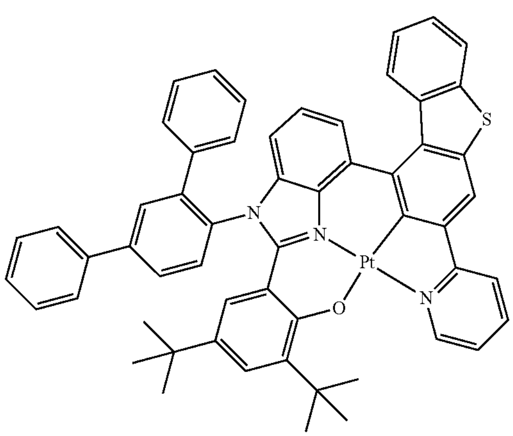
-continued
3-490
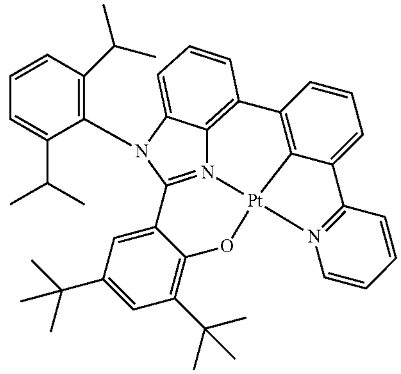
3-491
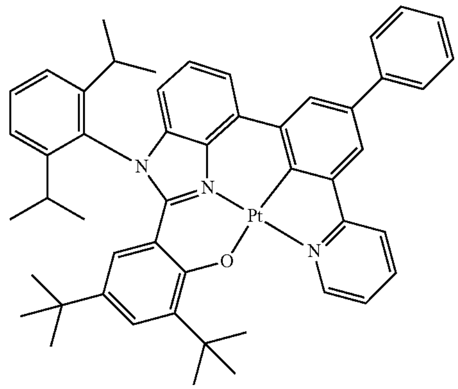
3-492
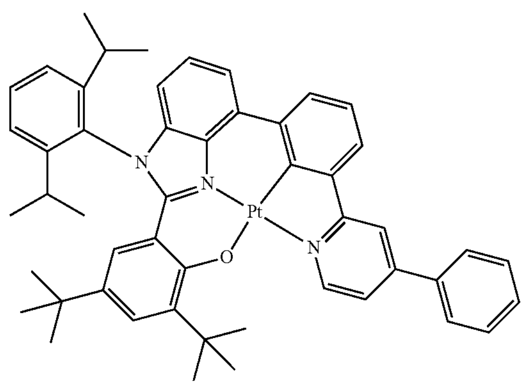
3-493
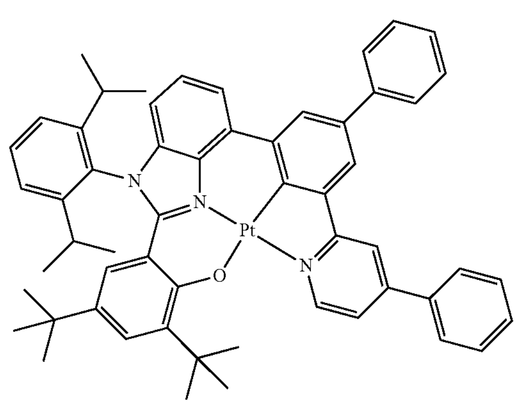

-continued
3-494
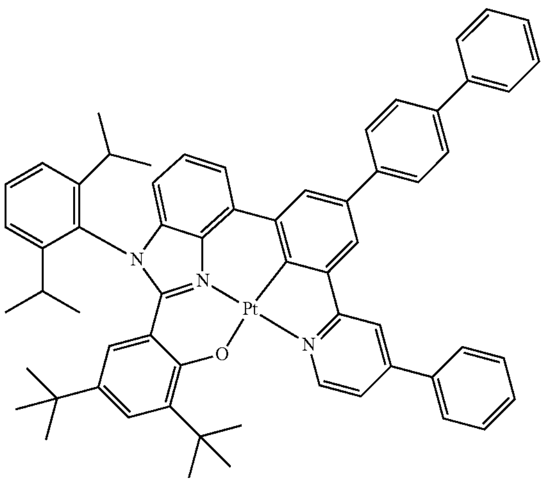
3-495
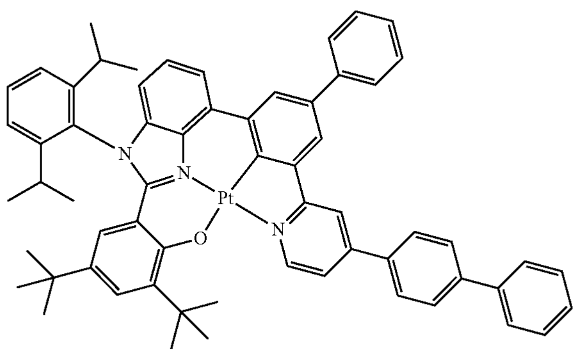
3-496
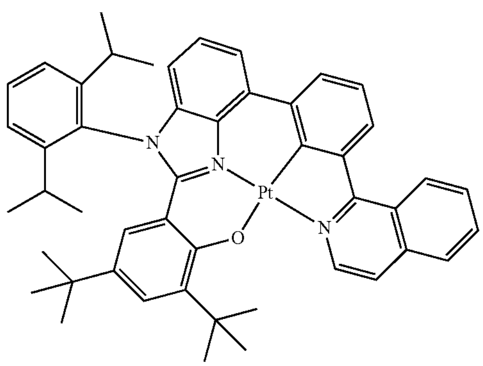
3-497
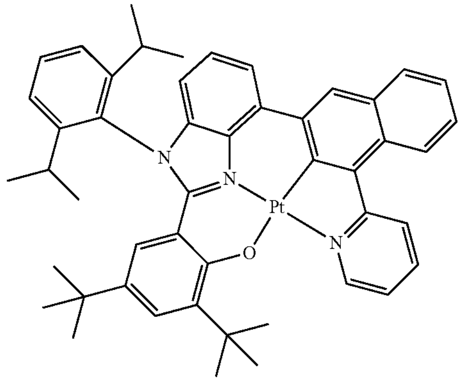
-continued
3-498
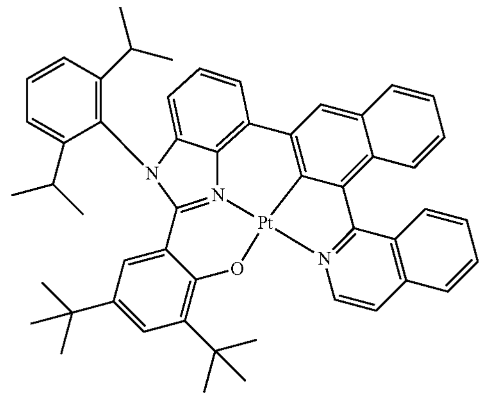
3-499
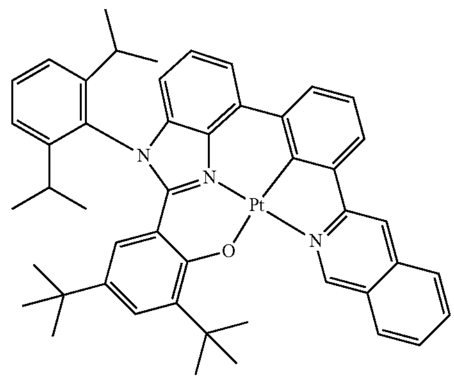
3-500
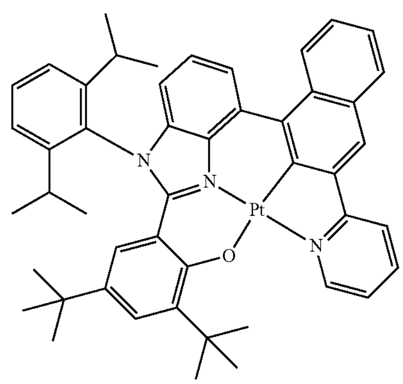
3-501
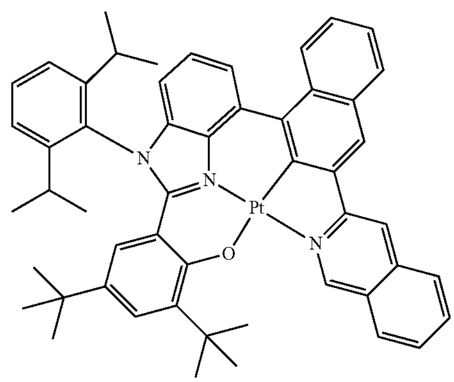

-continued
3-502
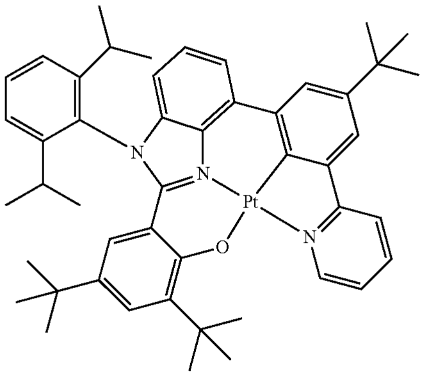
3-503
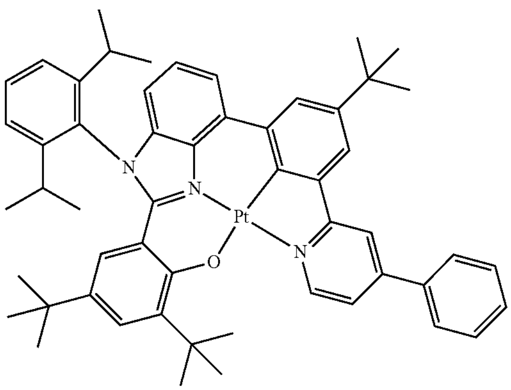
3-504
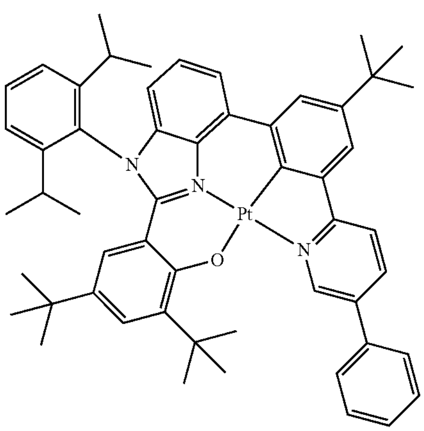
3-505
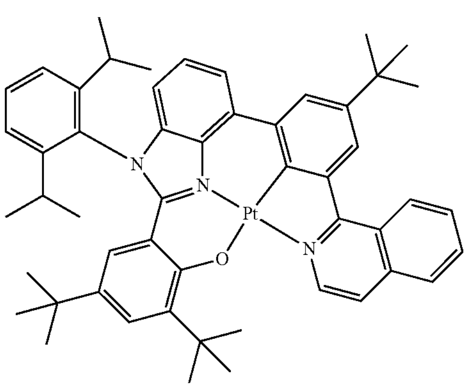
-continued
3-506
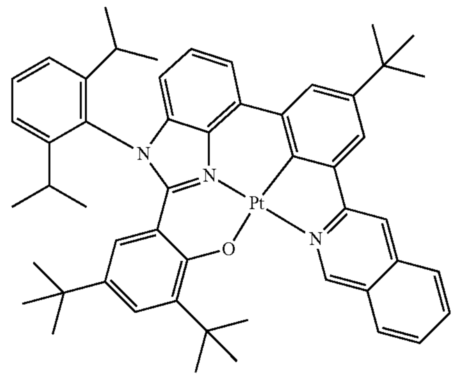
3-507
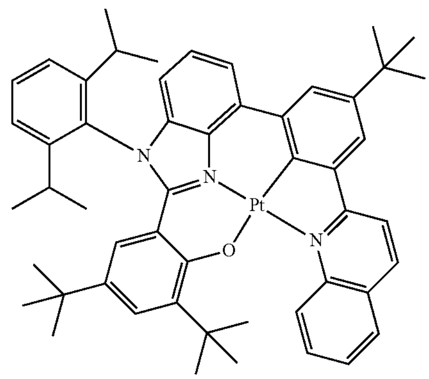
3-508
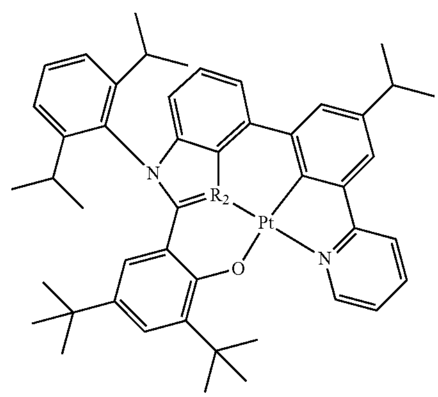
3-509
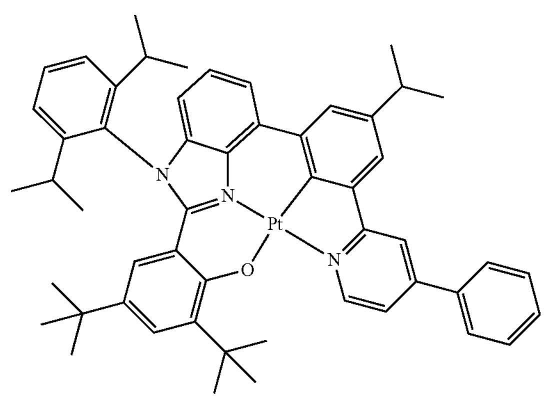

-continued
3-510
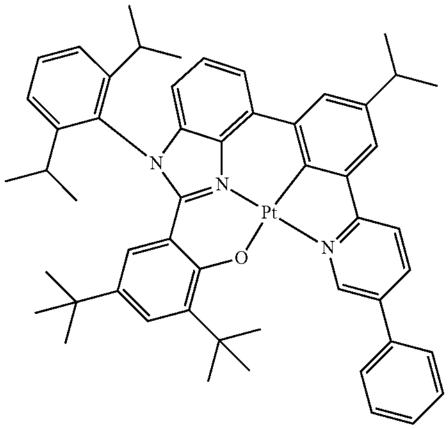
3-511
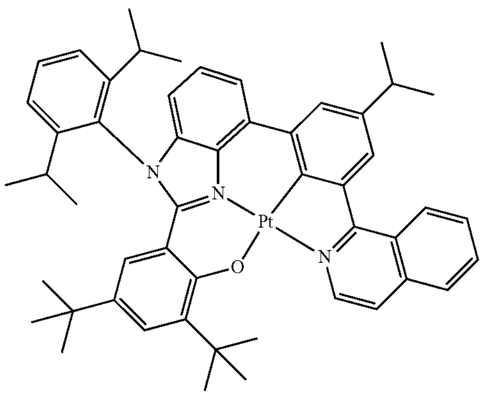
3-512
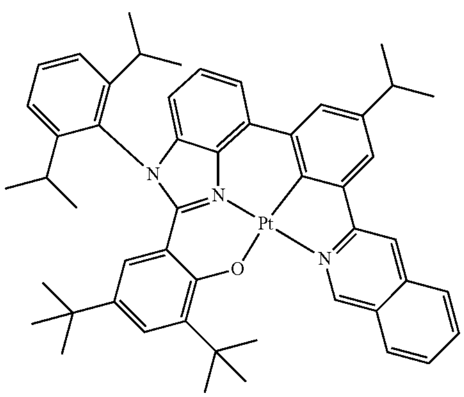
3-513
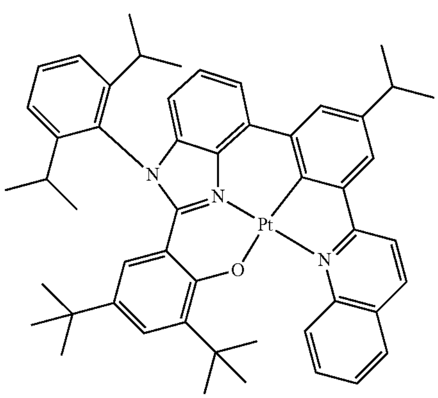
-continued
3-514
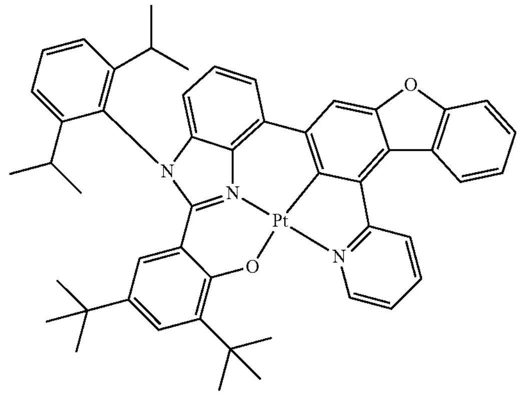
3-515
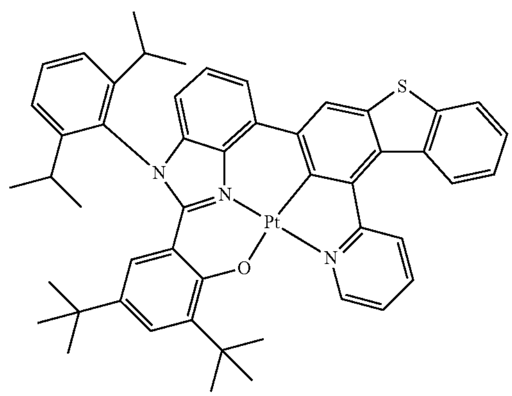
3-516
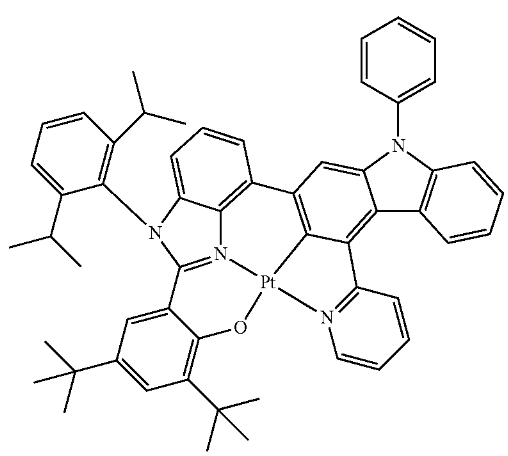

-continued
3-517
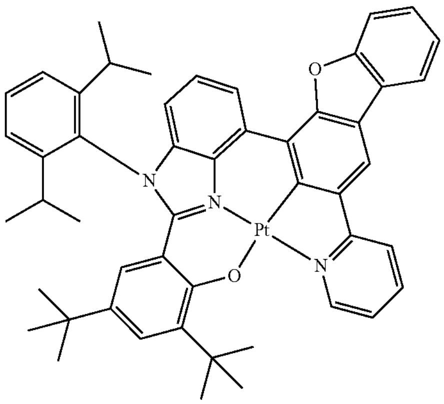
3-518
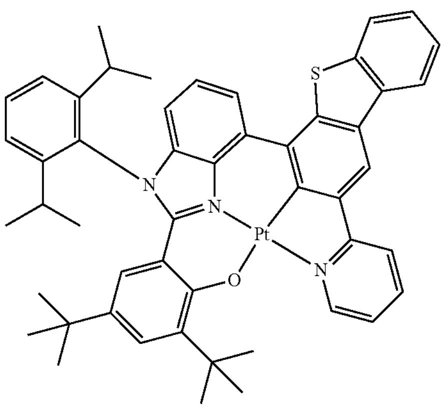
3-519
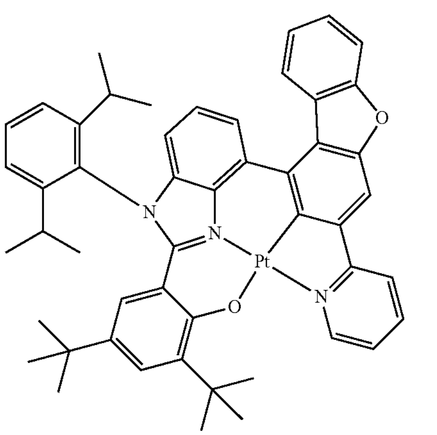
-continued
3-520
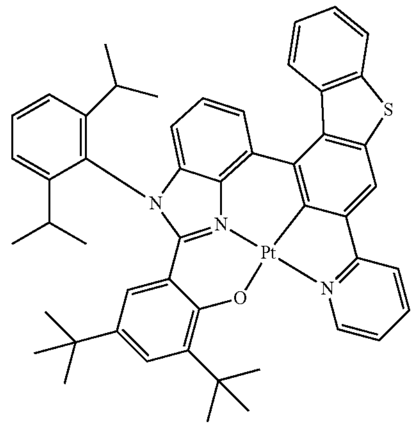
3-521
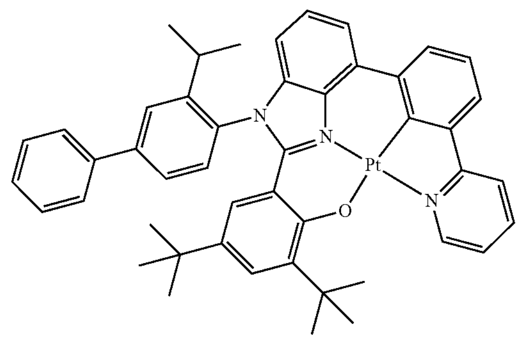
3-522
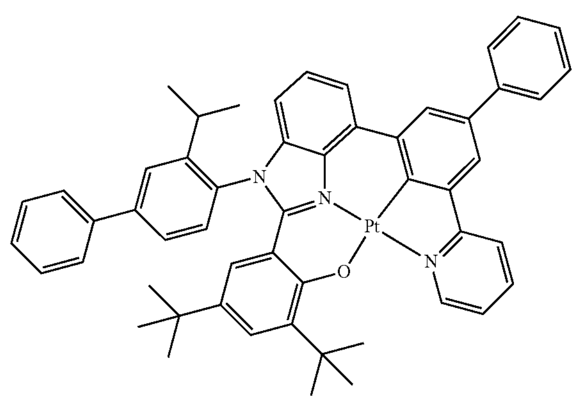
3-523
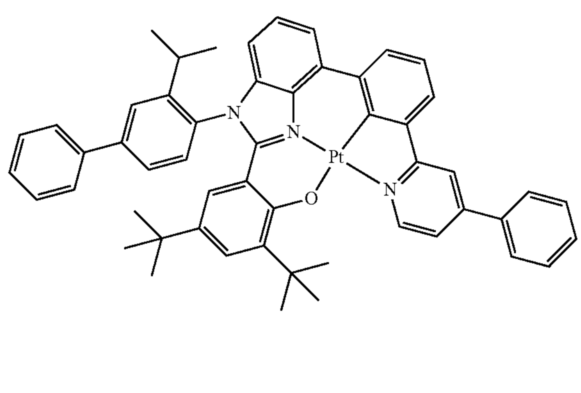

3-524
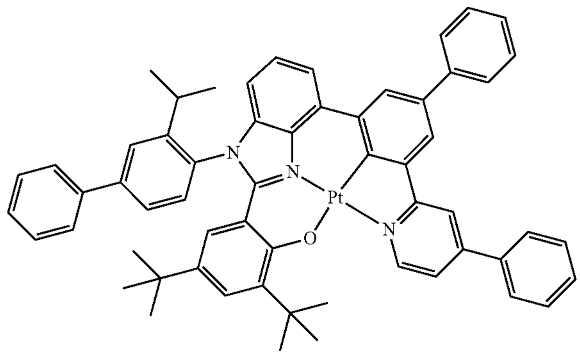
3-525
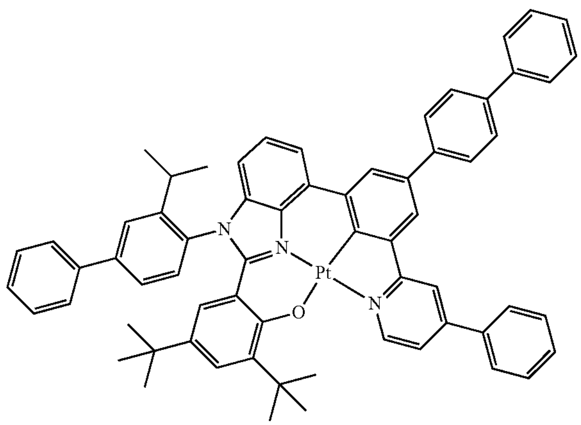
3-526
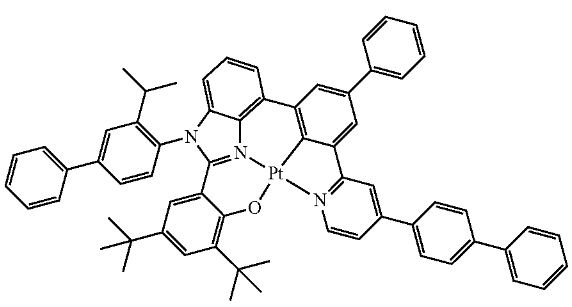
3-527
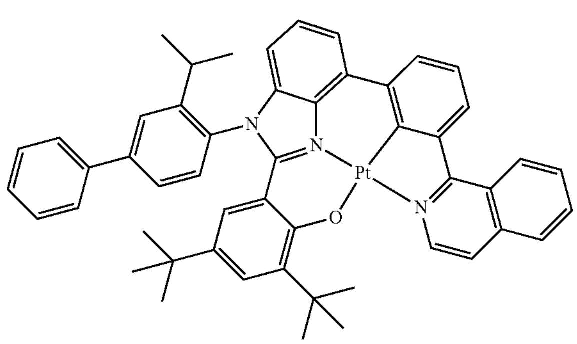
3-528
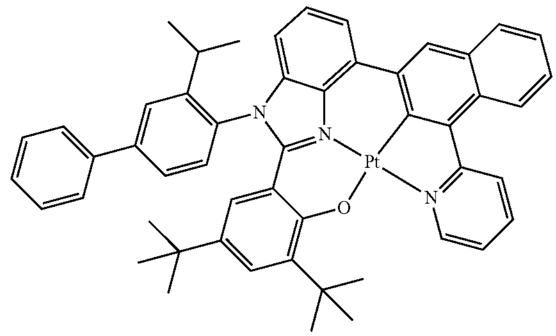
3-529
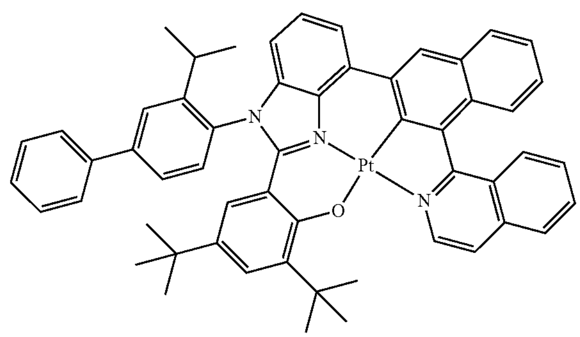
3-530
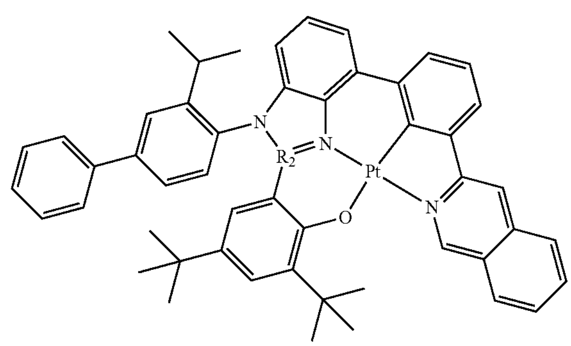
3-531
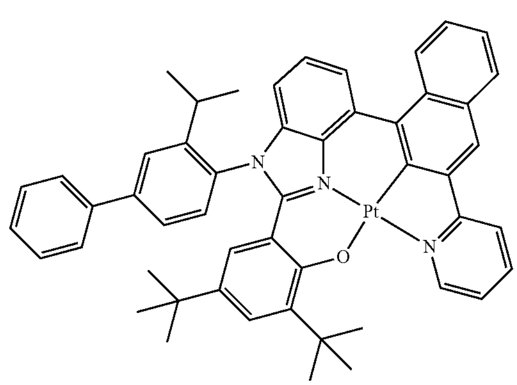

-continued
3-532
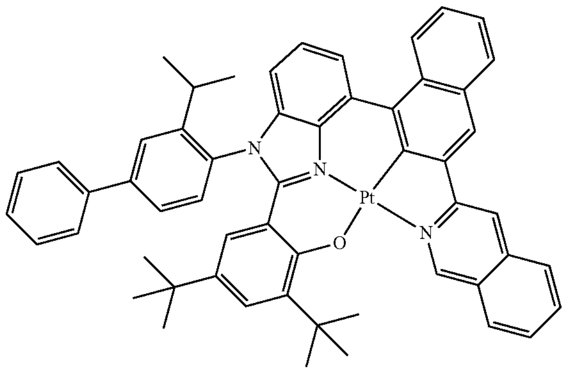
3-533
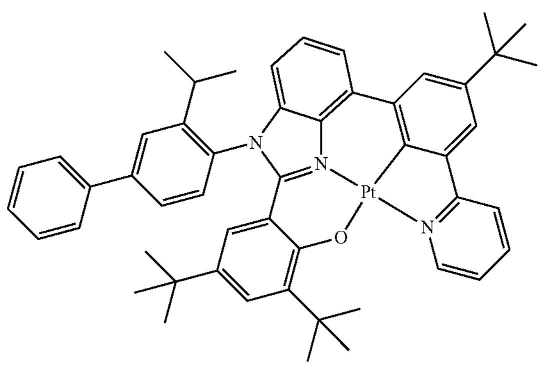
3-534
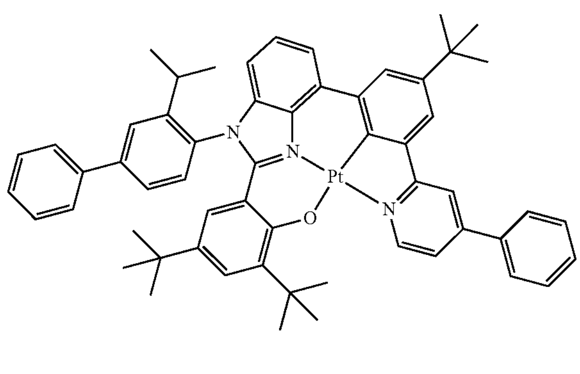
3-535
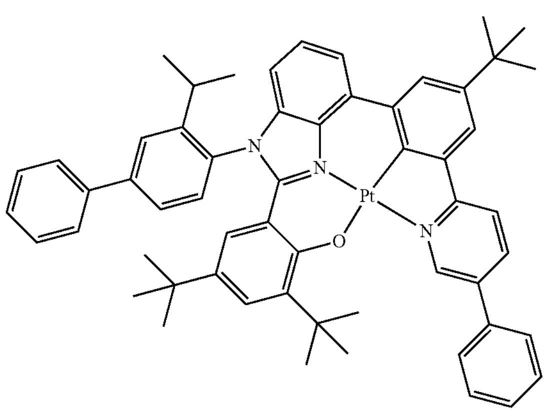
-continued
3-536
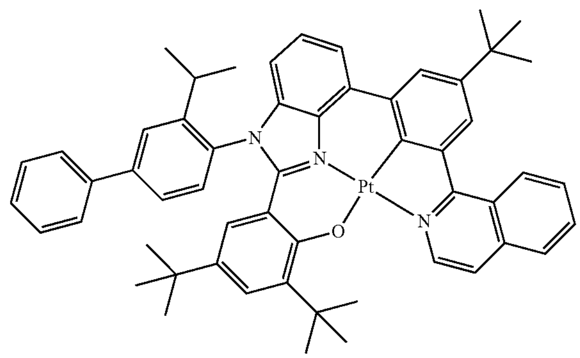
3-537
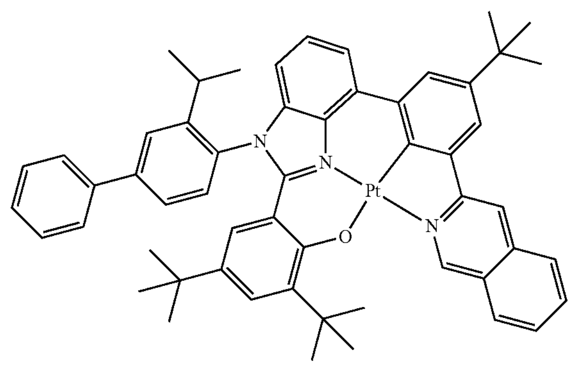
3-538
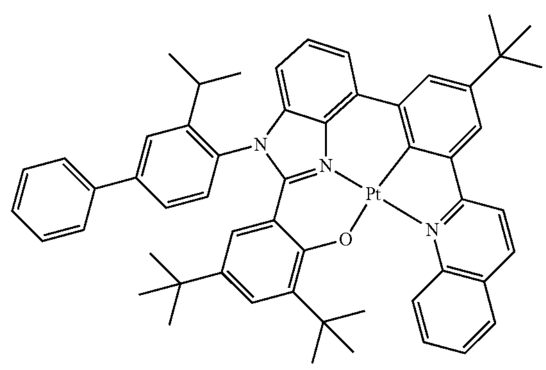
3-539
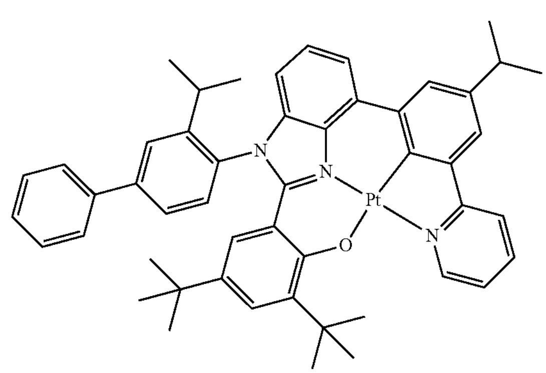

-continued
3-540
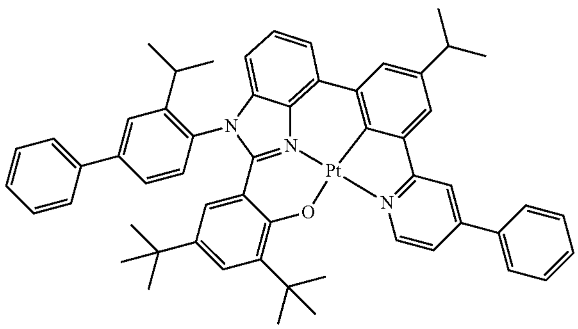
3-541
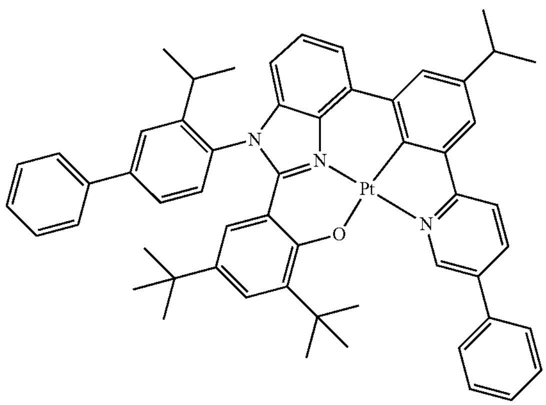
3-542
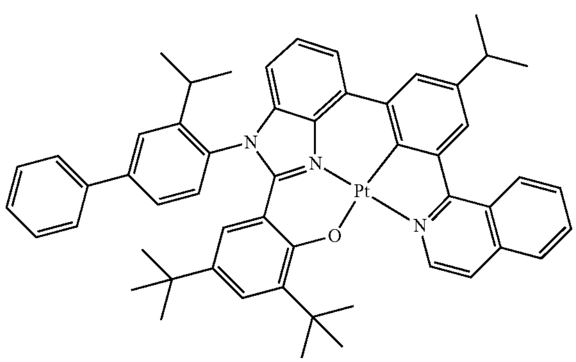
3-543
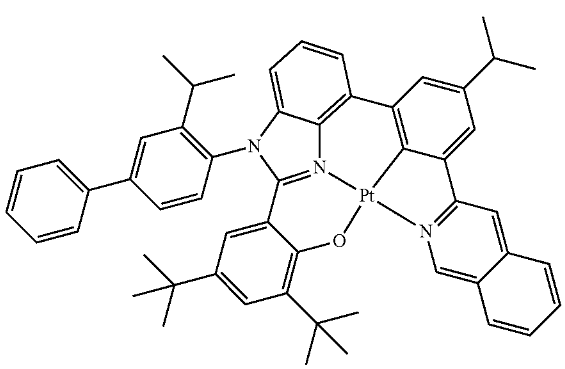
-continued
3-544
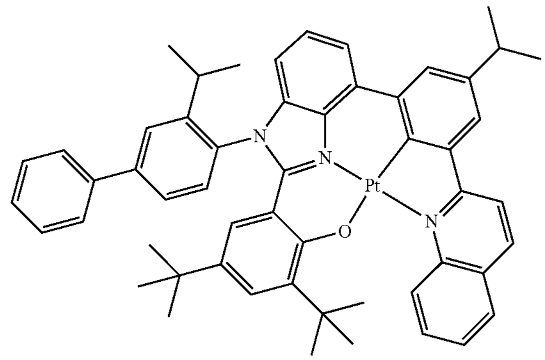
3-545
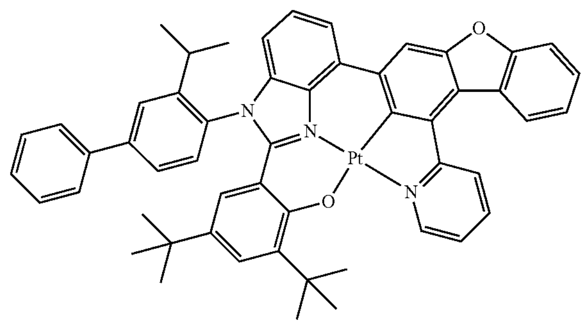
3-546
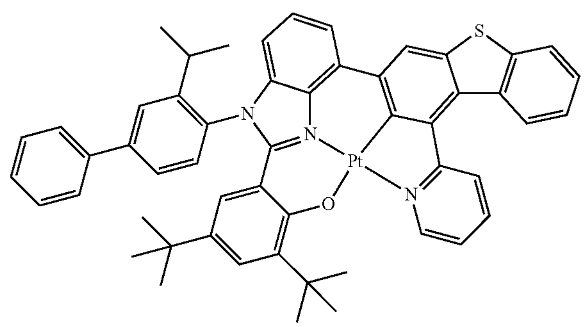
3-547
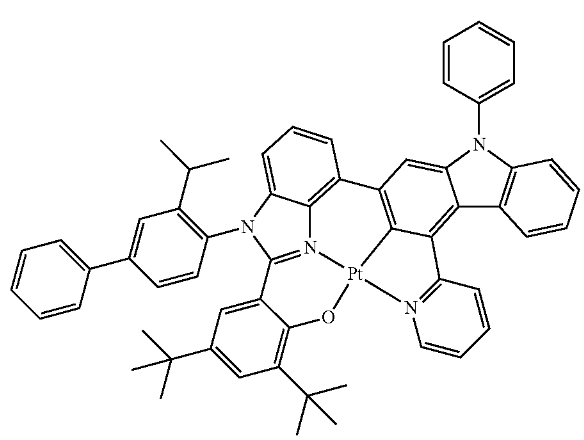

-continued
3-548
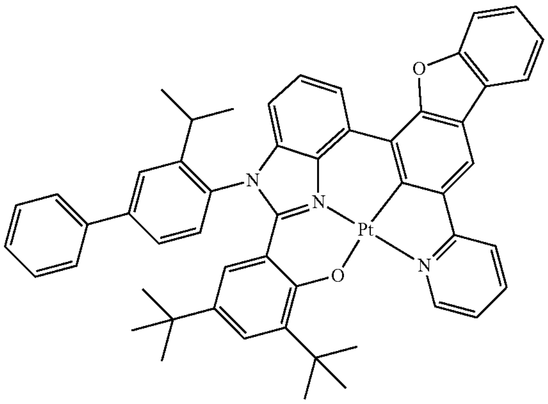
3-549
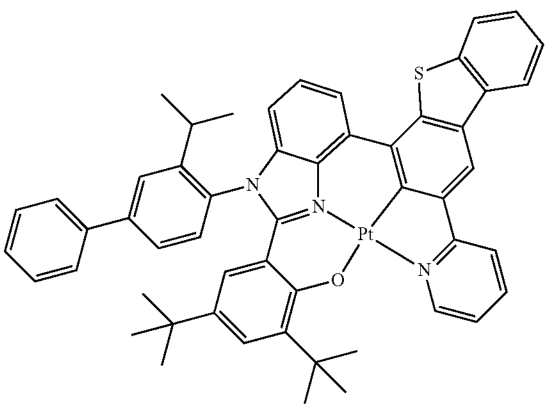
3-550
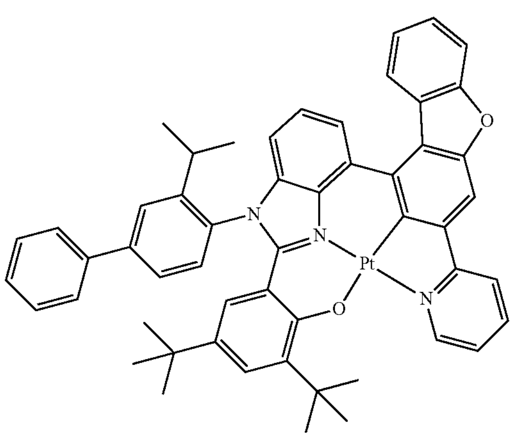
-continued
3-551
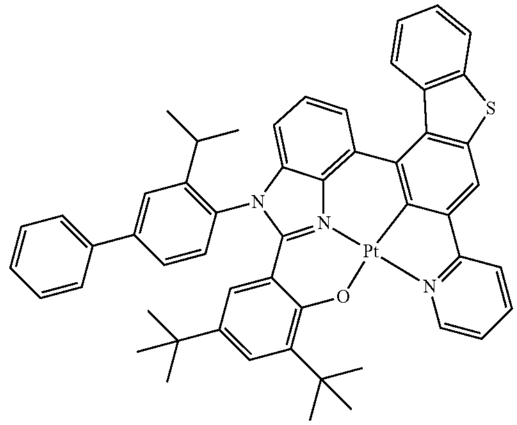
3-552
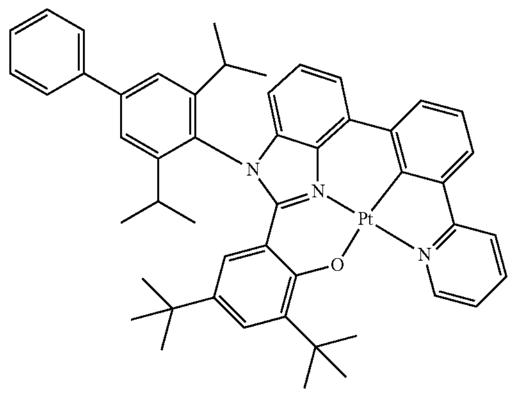
3-553
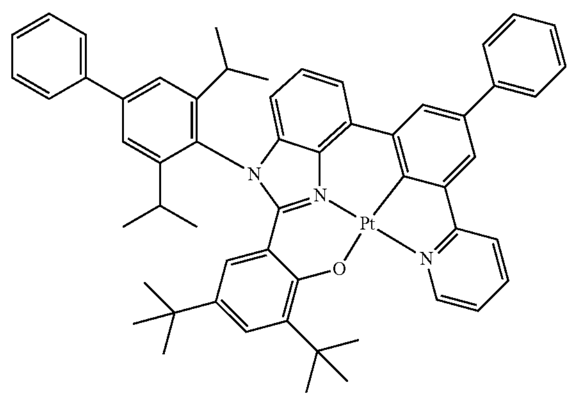
3-554
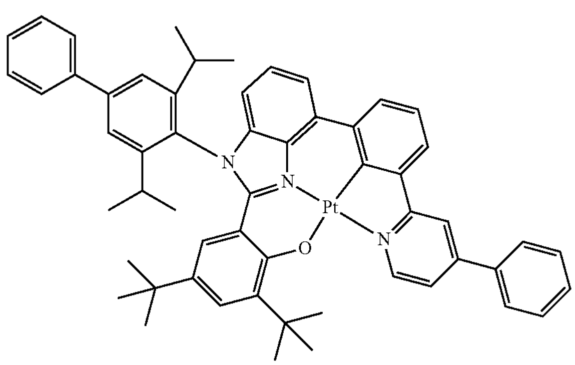

-continued
3-555
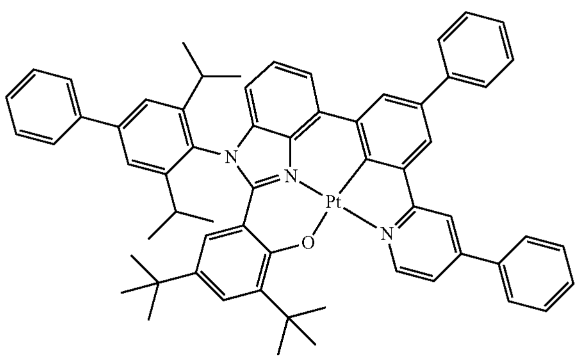
3-556
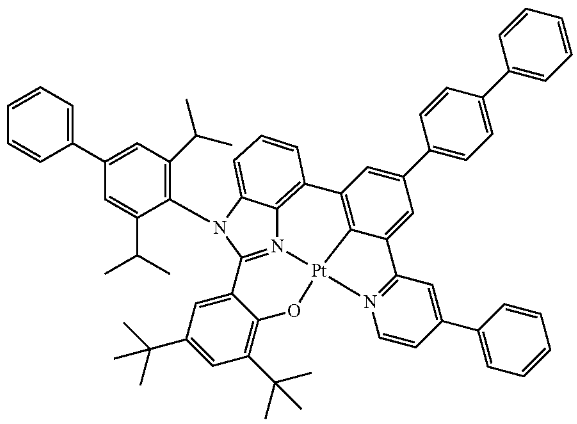
3-557
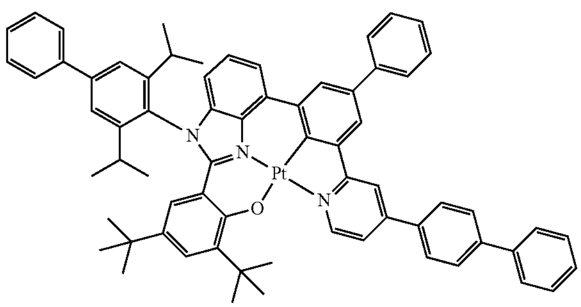
3-558
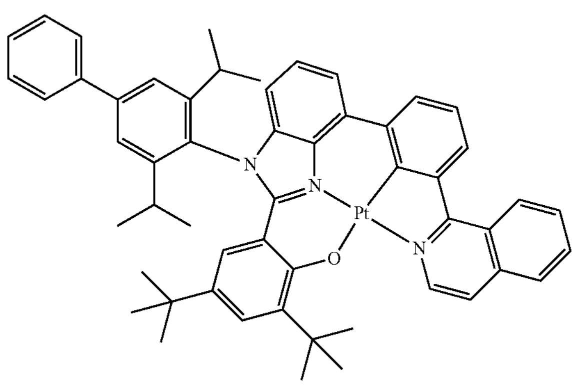
-continued
3-559
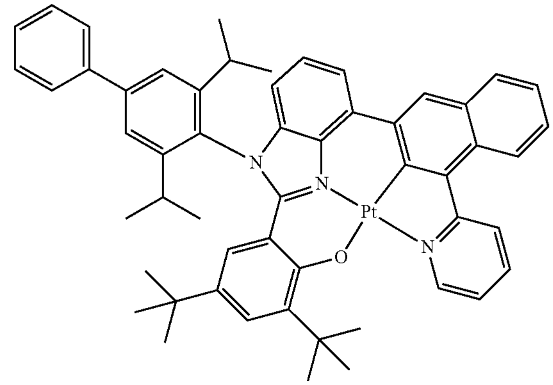
3-560
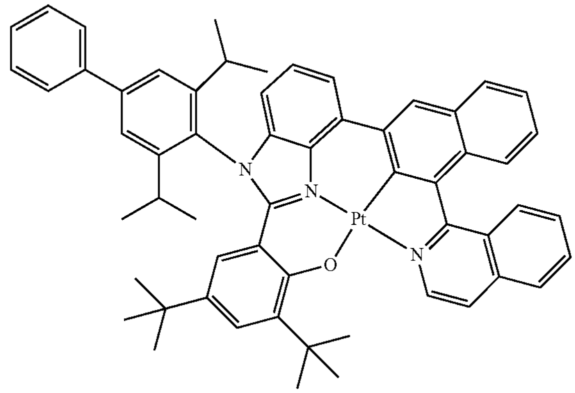
3-561
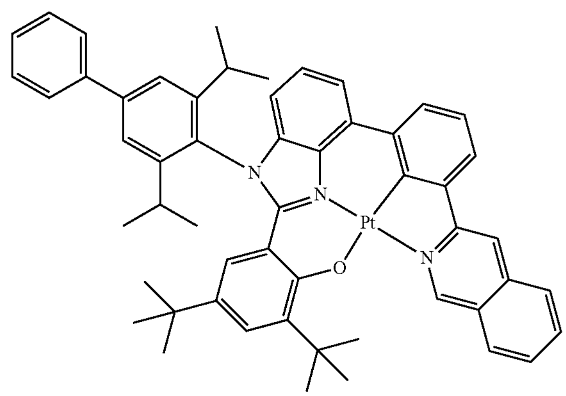
3-562
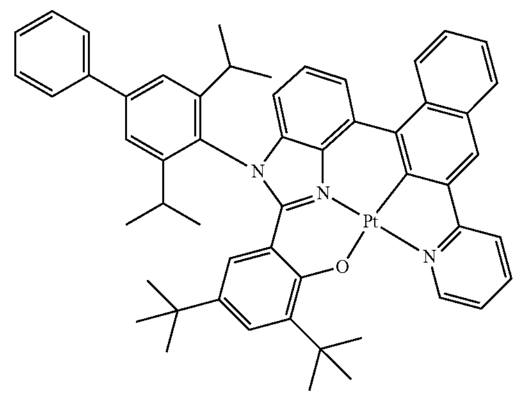

3-563
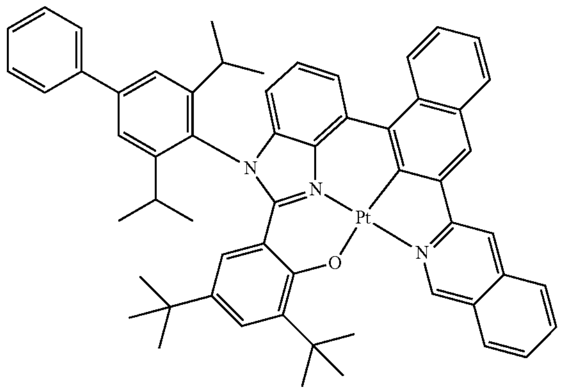
3-564
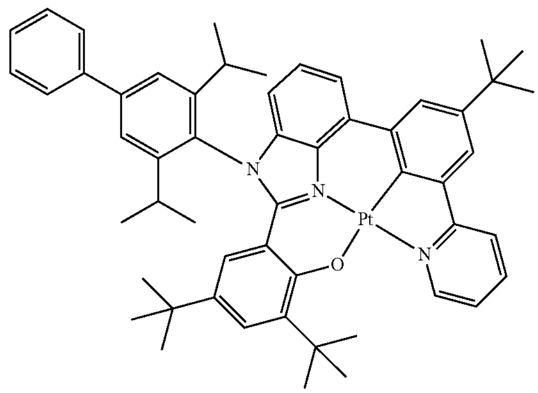
3-565
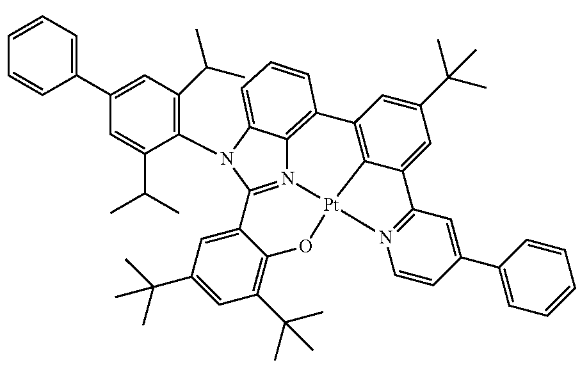
3-566
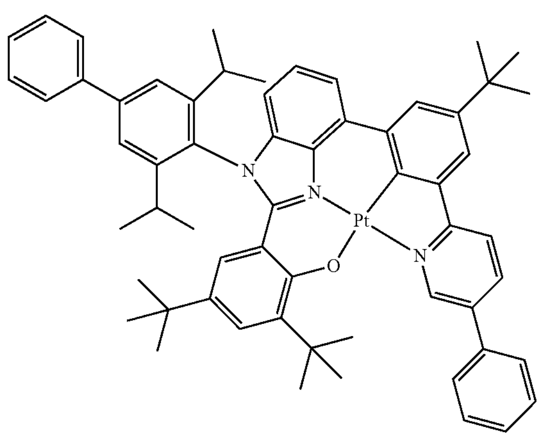
3-567
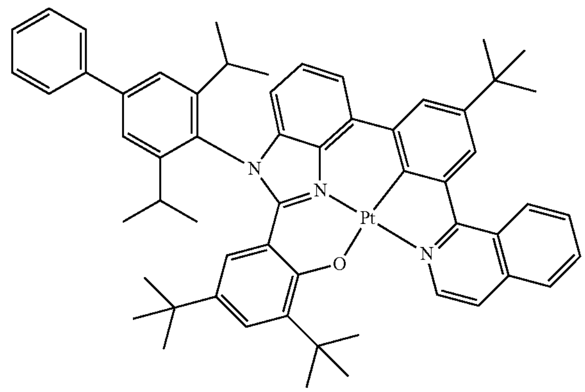
3-568
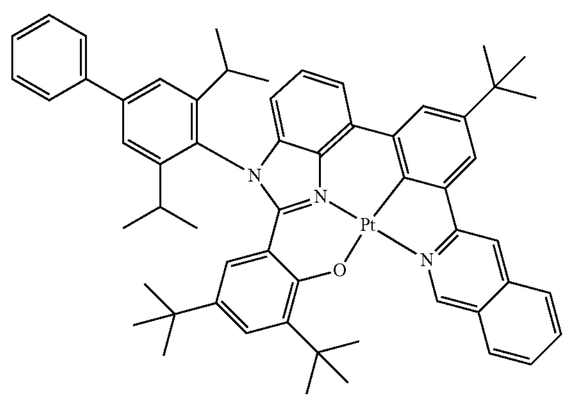
3-569
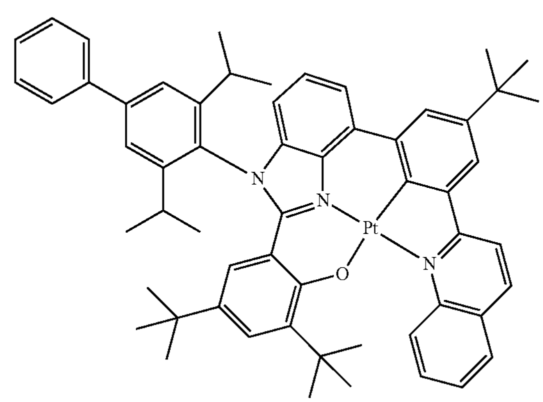

-continued
3-570
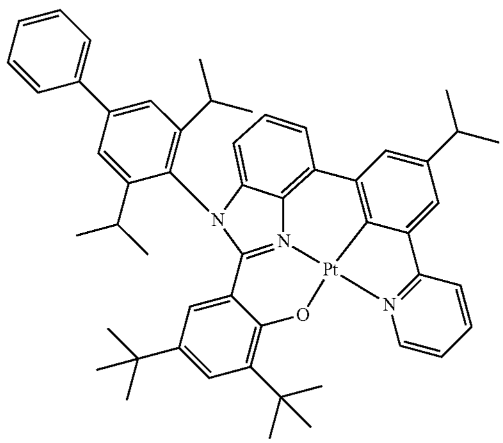
3-571
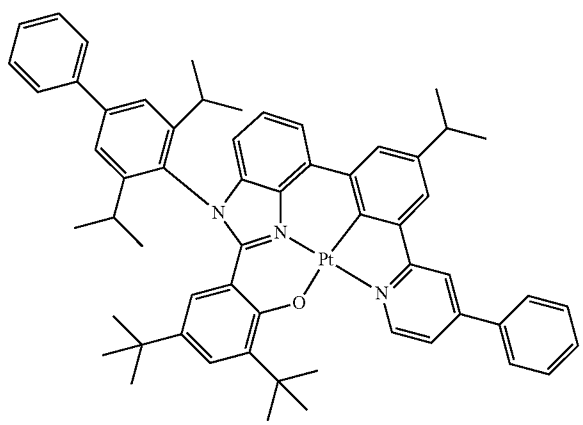
3-572
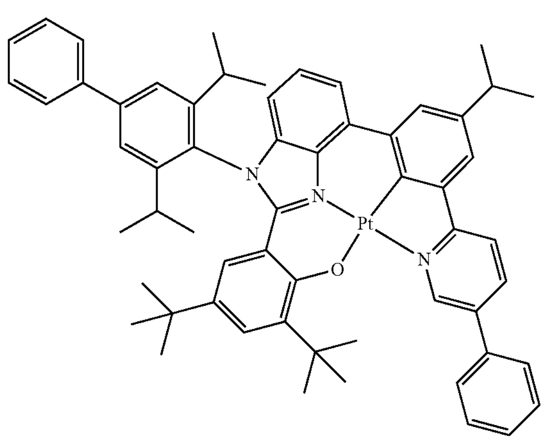
-continued
3-573
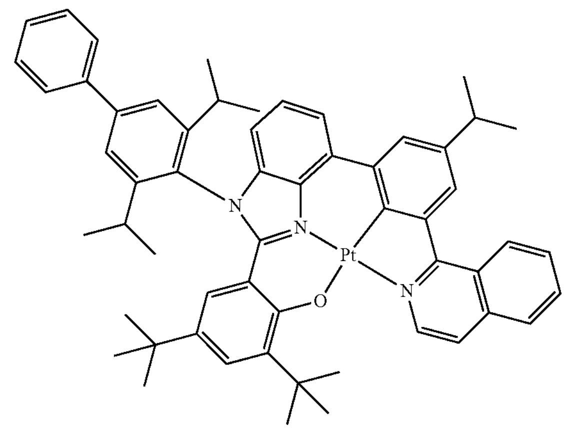
3-574
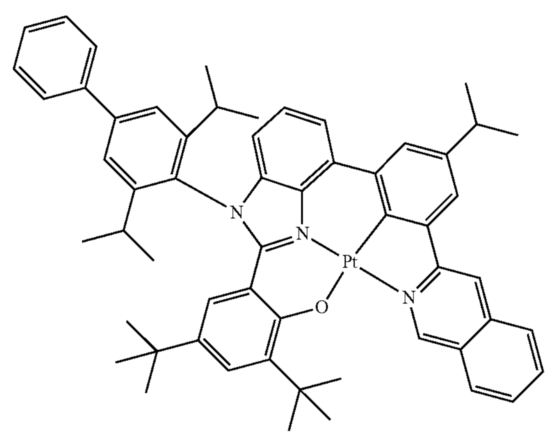
3-575
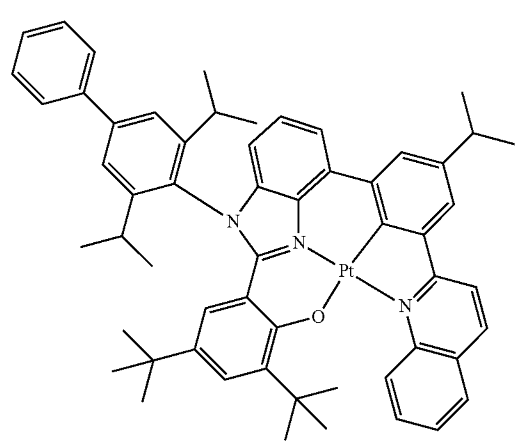

-continued
3-576
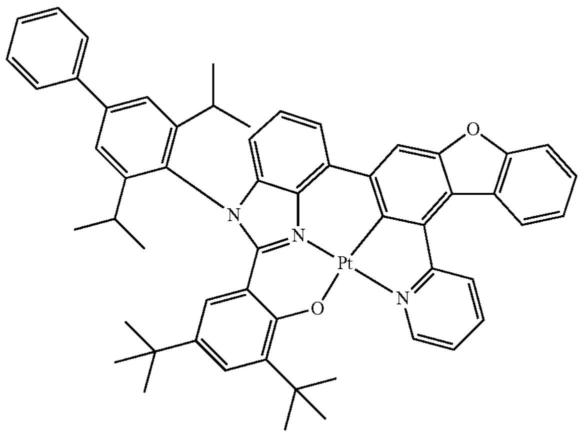
3-577
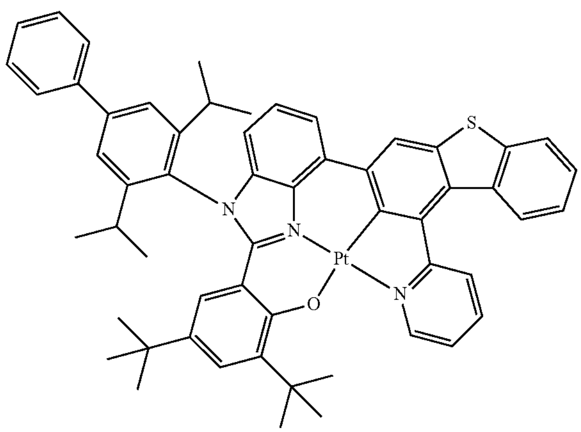
3-578
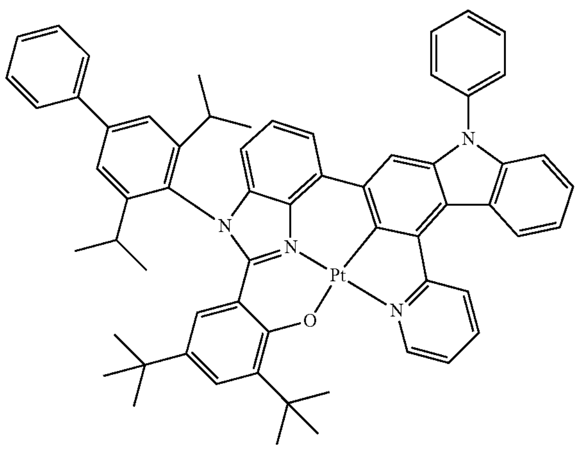
-continued
3-579
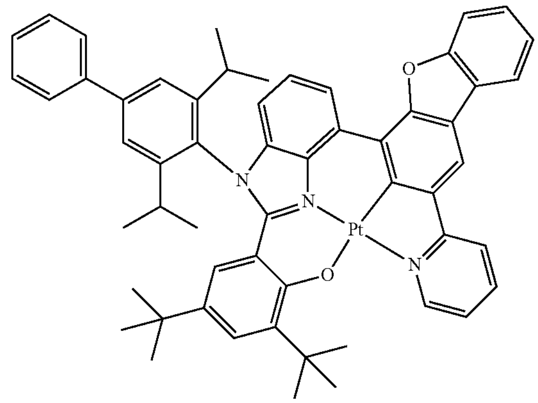
3-580
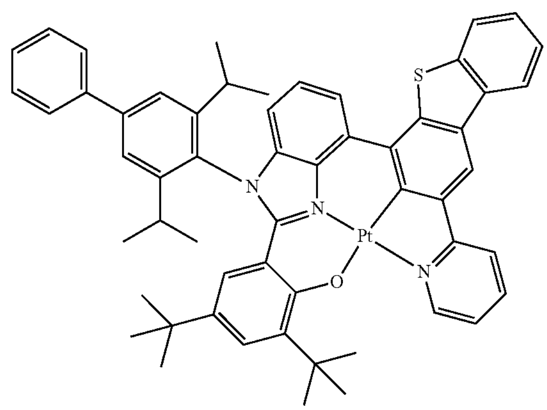
3-581
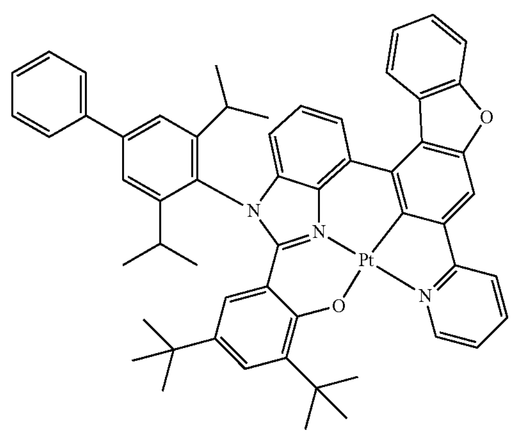

-continued 3-582

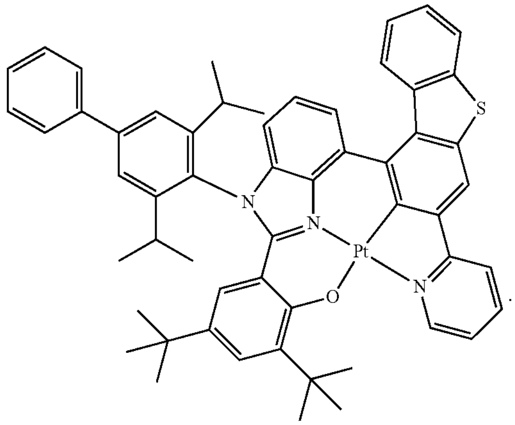

Host in Emission Layer 15

A host in the emission layer 15 may be any suitable host that satisfies the HOMO (dopant]-HOMO (host) range described herein.

A content of the host in the emission layer 15 may be greater than that of the dopant in the emission layer 15.

In an embodiment, the host may consist of one type of host. When the host consists of one type of host, the one type of host may be selected from an electron transporting host and a hole transporting host described herein.

In one or more embodiments, the host may be a mixture of two or more types of hosts. In some embodiments, the host may be a mixture of an electron transporting host and a hole transporting host, a mixture of two different types of electron transporting hosts or a mixture of two different types of hole transporting hosts. The electron transporting host and the hole transporting host may be understood by referring to the descriptions for those provided herein.

The electron transporting host may include at least one electron transporting moiety, and the hole transporting host may not include an electron transporting moiety.

The at least one electron transporting moiety may be selected from a cyano group, a π electron-depleted nitrogen-containing cyclic group, and a group represented by one of following Formulae:

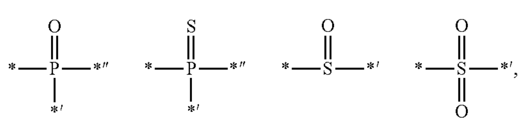

wherein, in Formulae above, *, *', and *" may each indicate a binding site to an adjacent atom.

In an embodiment, an electron transporting host in the emission layer 15 may include at least one of a cyano group and a π electron-depleted nitrogen-containing cyclic group.

In one or more embodiments, an electron transporting host in the emission layer 15 may include at least one cyano group.

In one or more embodiments, an electron transporting host in the emission layer 15 may include a cyano group and at least one π electron-depleted nitrogen-containing cyclic group.

In one or more embodiments, an electron transport host in the emission layer 15 may have a lowest anion decomposition energy of 2.5 eV or higher. While not wishing to be bound by theory, it is understood that when the lowest anion decomposition energy of the electron transport host is within the range described above, the decomposition of the electron transport host due to charges and/or excitons may be substantially prevented. The lowest anion decomposition energy may be measured according to Equation 1:

$$E_{lowest\ anion\ decomposition\ energy}=E_{[A\text{-}B]^-}-[E_{A^-}+E_{B^-}(\text{or } E_{A^-}+E_{B^-})] \quad \text{Equation 1}$$

1. A density function theory (DFT) and/or ab initio method was used for quantum computation of the ground state of a neutral molecule.

2. A neutral molecular structure under an excess electron condition was used for quantum computation of the anionic state ($E_{[A\text{-}B]^-}$) of the molecule.

3. An anionic state being the most stable structure (global minimum) was used for quantum-computation of the energy of the decomposition process:

$$[A\text{-}B]^- A^x \text{ and } B^y\ ([E_{A^-}+E_{B.}(\text{or } E_{A.}+E_{B^-})]).$$

Figure 5:
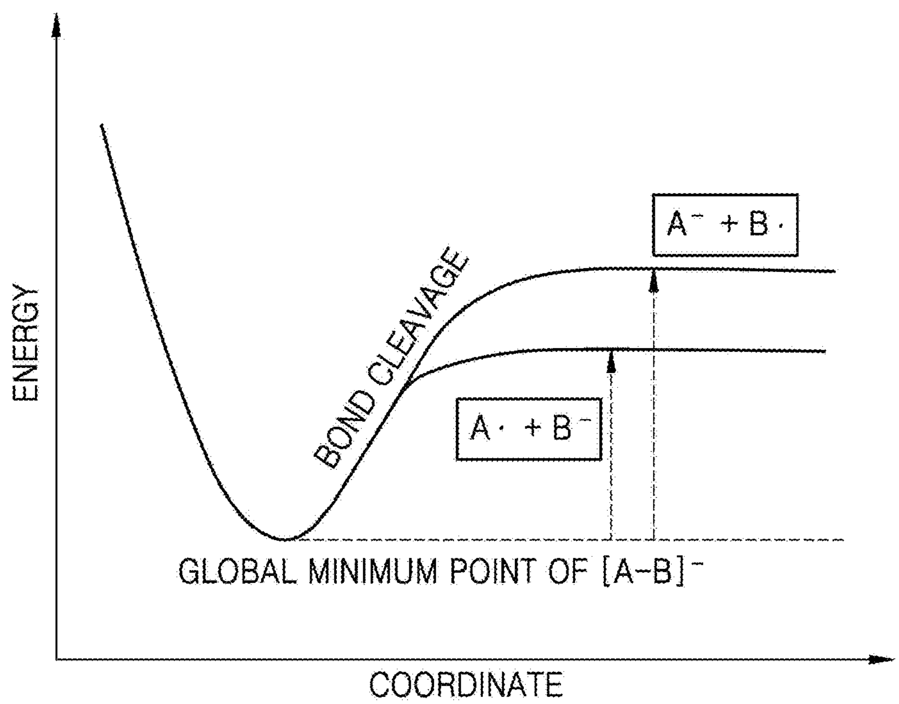
FIG. 5 is graphs for two decomposition modes i) $A^{-}$+B or ii) A.+$B^{-}$ for Equation 1.

In this regard, the decomposition may produce i) $A^-$+B or ii) A.+$B^-$, as shown in FIG. 5, and from these two decomposition modes i and ii, the decomposition mode having a smaller decomposition energy value was selected for the computation.

In one or more embodiments, the electron transporting host may include at least one π electron-depleted nitrogen-free cyclic group and at least one electron transporting moiety, and the hole transporting host may include at least one π electron-depleted nitrogen-free cyclic group and may not include an electron transporting moiety. Here, the at least one electron transporting moiety may be a cyano group or a π electron-depleted nitrogen-containing cyclic group.

The term "π electron-depleted nitrogen-containing cyclic group" as used herein refers to a group including a cyclic group having at least one *—N═*' moiety, e.g., an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, or a condensed ring group in which at least one of the foregoing groups is condensed with at least one cyclic group (e.g., a condensed ring group in which a triazole group is condensed with a naphthalene group).

The π electron-depleted nitrogen-free cyclic group may be a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, or a triindolobenzene group, but embodiments are not limited thereto.

In some embodiments, the electron transporting host may be selected from Compounds represented by Formula E-1, and the hole transporting host may be selected from Compounds represented by Formula H-1, but embodiments are not limited thereto:

$$[Ar_{301}]_{xb11}\text{-}[(L_{301})_{xb1}\text{-}R_{301}]_{xb21}$$ Formula E-1 wherein, in Formula E-1, $Ar_{301}$, may be selected from a substituted or unsubstituted $C_5$-$C_{60}$ carbocyclic group and a substituted or unsubstituted $C_1$-$C_{60}$ heterocyclic group, xb11 may be 1, 2, or 3, $L_{301}$ may each independently be selected from a single bond, groups represented by one of following Formulae, a substituted or unsubstituted $C_5$-$C_{60}$ carbocyclic group, and a substituted or unsubstituted $C_1$-$C_{60}$ heterocyclic group, wherein in the following Formulae, *, *', and *" may each indicate a binding site to an adjacent atom:

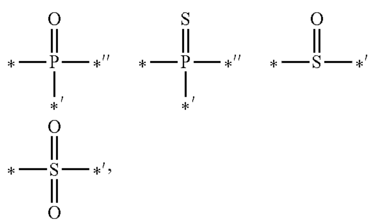

wherein, in Formulae above, xb1 may be an integer from 1 to 5, $R_{301}$ may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), —S(═O)($Q_{301}$), —P(═O)($Q_{301}$)($Q_{302}$), and —P(═S)($Q_{301}$)($Q_{302}$), xb21 may be an integer from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, and at least one of Conditions 1 to 3 may be satisfied:

Condition 1

At least one selected from $Ar_{301}$, $L_{301}$, and $R_{301}$ in Formula E-1 may each independently include a π electron-depleted nitrogen-containing cyclic group.

Condition 2

At least one selected from $L_{301}$ in Formula E-1 may be a group represented by one of following Formulae:

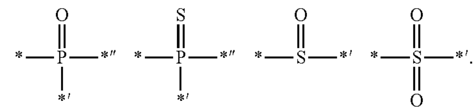

Condition 3

At least one selected from $R_{301}$ in Formula E-1 may be selected from a cyano group, —S(═O)$_2$($Q_{301}$), —S(═O)($Q_{301}$), —P(═O)($Q_{301}$)($Q_{302}$), and —P(═S)($Q_{301}$)($Q_{302}$).

Formula H-1

$$Ar_{401}—(L_{401})_{xd1}—(Ar_{402})_{xd11}$$

Formula 11

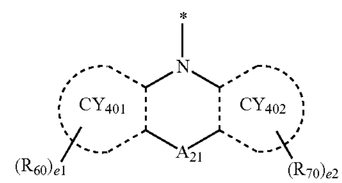

Formula 12

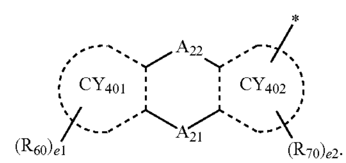

In Formulae H-1, 11, and 12, $L_{401}$ may be selected from a single bond; and a π electron-depleted nitrogen-free cyclic group (e.g., a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group) unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and —Si($Q_{401}$)($Q_{402}$)($Q_{403}$), xd1 may be an integer from 1 to 10; and when xd1 is 2 or greater, at least two $L_{401}$ groups may be identical to or different from each other, $Ar_{401}$ may be selected from groups represented by Formulae 11 and 12, $Ar_{402}$ may be selected from groups represented by Formulae 11 and 12 and a π electron-depleted nitrogen-free cyclic group (e.g., a phenyl group, a naphthyl group, a fluorenyl group, a carbazolyl group, a dibenzofuranyl group, a dibenzothiophenyl group, a biphenyl group, a terphenyl group, and a triphenylenyl group); and a π electron-depleted nitrogen-free cyclic group (e.g., a phenyl group, a naphthyl group, a fluorenyl group, a carbazolyl group, a dibenzofuranyl group, a dibenzothiophenyl group, a biphenyl group, a terphenyl group, and a triphenylenyl group) substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, a terphenyl group, and a triphenylenyl group, $CY_{401}$ and $CY_{402}$ may each independently be selected from a π electron-depleted nitrogen-free cyclic group (e.g., a benzene group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonapthothiophene group, and a benzonaphthosilole group), $A_{21}$ may be selected from a single bond, O, S, N($R_{51}$), C($R_{51}$)($R_{52}$), and Si($R_{51}$)($R_{52}$), $A_{22}$ may be selected from a single bond, O, S, N($R_{53}$), C($R_{53}$)($R_{54}$), and Si($R_{53}$)($R_{54}$), at least one selected from $A_{21}$ and $A_{22}$ in Formula 12 may not be a single bond, $R_{51}$ to $R_{54}$, $R_{60}$, and $R_{70}$ may each independently be selected from hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, and a dibenzothiophenyl group;

a π electron-depleted nitrogen-free cyclic group (e.g., a phenyl group, a naphthyl group, a fluorenyl group, a carbazolyl group, a dibenzofuranyl group, a dibenzothiophenyl group, a biphenyl group, a terphenyl group, and a triphenylenyl group);

a π electron-depleted nitrogen-free cyclic group (e.g., a phenyl group, a naphthyl group, a fluorenyl group, a carbazolyl group, a dibenzofuranyl group, a dibenzothiophenyl group, a biphenyl group, a terphenyl group, and a triphenylenyl group) substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, and a biphenyl group, —Si($Q_{404}$)($Q_{405}$)($Q_{406}$), e1 and e2 may each independently be an integer from 0 to 10, wherein $Q_{401}$ to $Q_{406}$ may each independently be selected from hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, a biphenyl group, a terphenyl group, and a triphenylenyl group, and

* indicates a binding site to an adjacent atom.

In an embodiment, in Formula E-1, $Ar_{301}$ and $L_{401}$ may each independently be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), at least one selected from $L_{301}$ in the number of xb1 may be selected from an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $R_{301}$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a tetraphenyl group, a naphthyl group, a cyano group-containing phenyl group, a cyano group-containing biphenyl group, a cyano group-containing terphenyl group, a cyano group-containing tetraphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

In some embodiments, $Ar_{301}$ may be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$; and groups represented by Formulae 5-1 to 5-3 and 6-1 to 6-33, and $L_{301}$ may be selected from groups represented by Formulae 5-1 to 5-3 and 6-1 to 6-33:

Formula 5-1

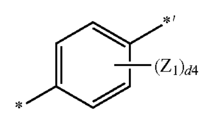

Formula 5-2

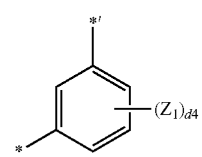

Formula 5-3

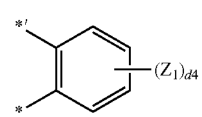

Formula 6-1

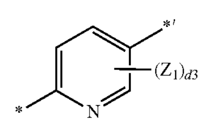

Formula 6-2

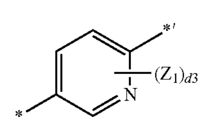

Formula 6-3

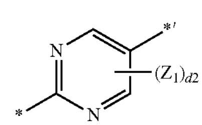

-continued
Formula 6-4
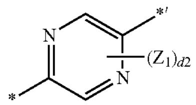
Formula 6-5
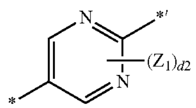
Formula 6-6
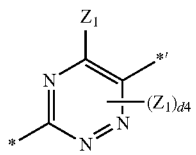
Formula 6-7
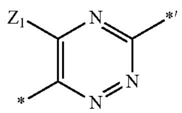
Formula 6-8
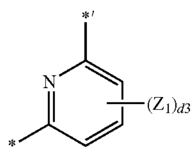
Formula 6-9
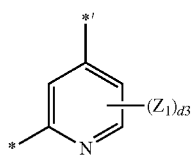
Formula 6-10
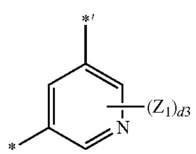
Formula 6-11
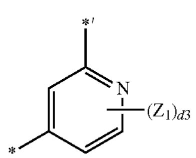
Formula 6-12
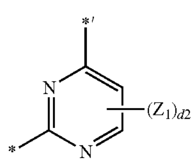
Formula 6-13
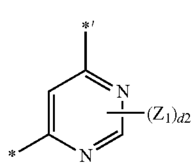
Formula 6-14
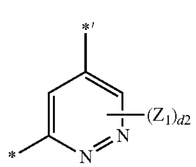
-continued
Formula 6-15
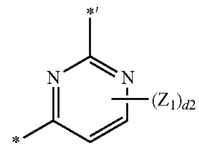
Formula 6-16
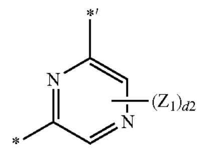
Formula 6-17
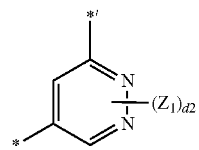
Formula 6-18
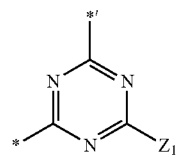
Formula 6-19
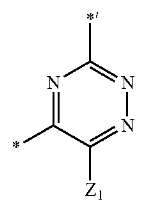
Formula 6-20
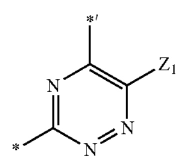
Formula 6-21
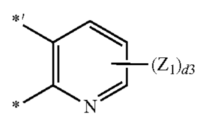
Formula 6-22
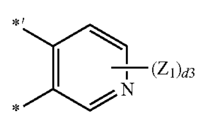
Formula 6-23
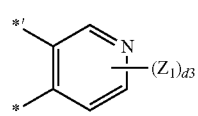
Formula 6-24
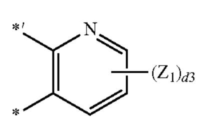
Formula 6-25
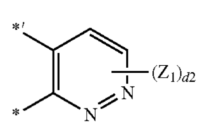

-continued

Formula 6-26

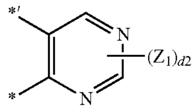

Formula 6-27

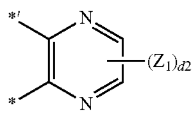

Formula 6-28

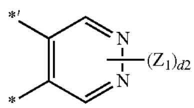

Formula 6-29

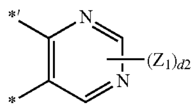

Formula 6-30

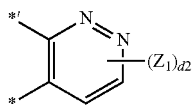

Formula 6-31

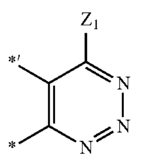

Formula 6-32

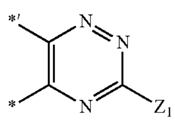

Formula 6-33

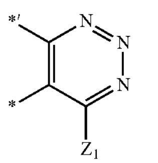

wherein, in Formulae 5-1 to 5-3 and 6-1 to 6-33, $Z_1$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl) triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), d4 may be 0, 1, 2, 3, or 4, d3 may be 0, 1, 2, or 3, d2 may be 0, 1, or 2, and

* and *' each indicate a binding site to an adjacent atom, wherein $Q_{31}$ to $Q_{33}$ may be understood by referring to the descriptions for those provided herein.

In one or more embodiments, $L_{301}$ may be selected from groups represented by Formulae 5-2, 5-3, and 6-8 to 6-33.

In one or more embodiments, $R_{301}$ may be selected from a cyano group and groups represented by Formulae 7-1 to 7-18, at least one selected from $Ar_{402}$ in the number of xd11 may be selected from groups represented by Formulae 7-1 to 7-18, but embodiments are not limited thereto:

7-1

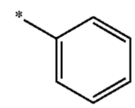

7-2

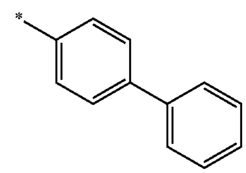

7-3

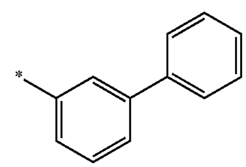

7-4

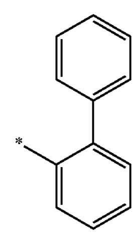

7-5

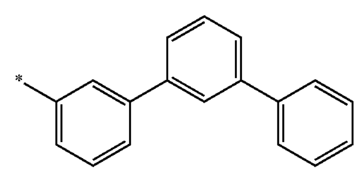

7-6

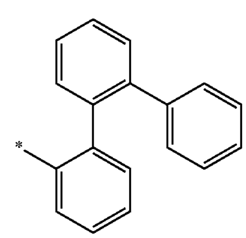

7-7

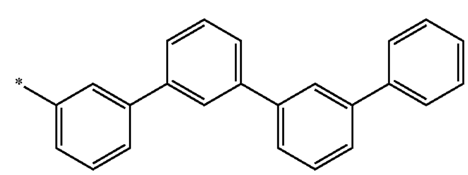

-continued 7-8

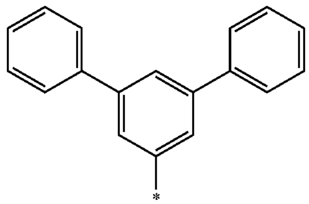

7-9

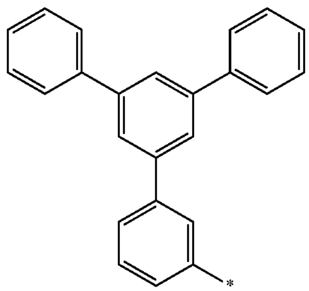

7-10

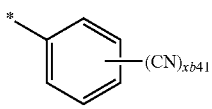

7-11

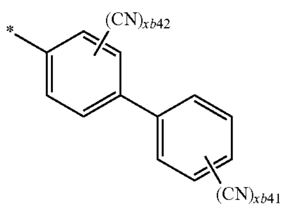

7-12

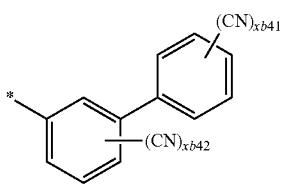

7-13

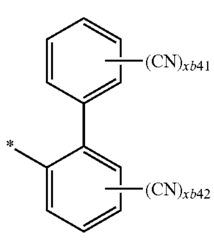

7-14

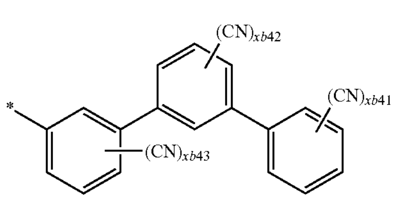

-continued 7-15

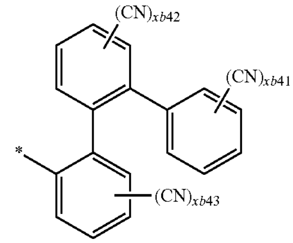

7-16

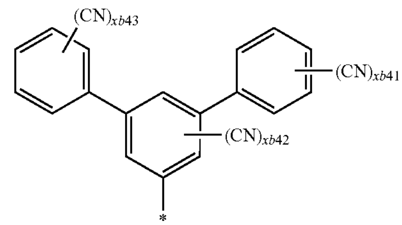

7-17

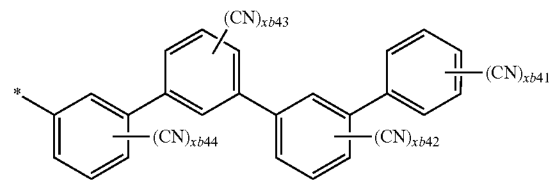

7-18

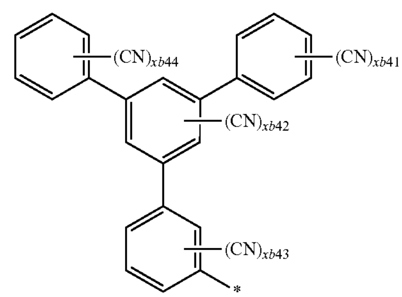

wherein, in Formulae 7-1 to 7-18, xb41 to xb44 may each be 0, 1, or 2, provided that xb41 in Formula 7-10 may not be 0, xb41+xb42 in Formulae 7-11 to 7-13 may not be 0, xb41+xb42+xb43 in Formulae 7-14 to 7-16 may not be 0, xb41+xb42+xb43+xb44 in Formulae 7-17 and 7-18 may not be 0, and * indicates a binding site to an adjacent atom.

In Formula E-1, at least two groups $Ar_{301}$ may be identical to or different from each other, and at least two groups $L_{301}$ may be identical to or different from each other. In Formula H-1, at least two groups $L_{401}$ may be identical to or different from each other, and at least two groups $Ar_{402}$ may be identical to or different from each other.

In an embodiment, the electron transporting host may include i) at least one selected from a cyano group, a pyrimidine group, a pyrazine group, and a triazine group and ii) a triphenylene group, and the hole transporting host may include a carbazole group.

In one or more embodiments, the electron transporting host may include at least one cyano group.

In some embodiments, the electron transporting host may be selected from following compounds, but embodiments are not limited thereto:

H-E1
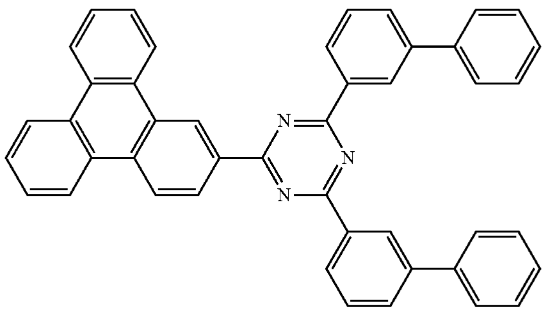
H-E2
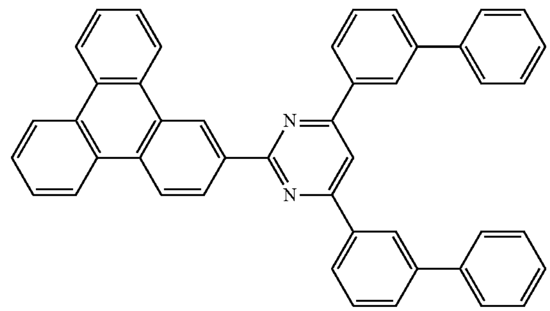
H-E3
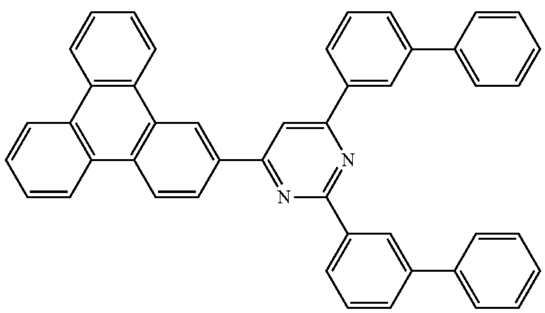
H-E4
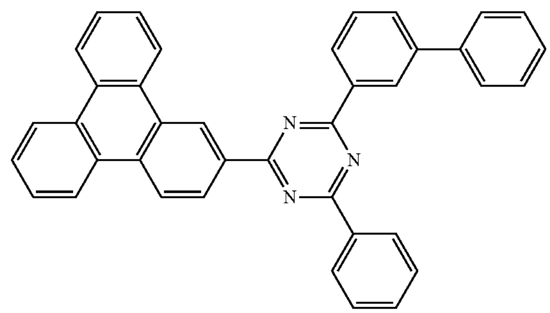
H-E5
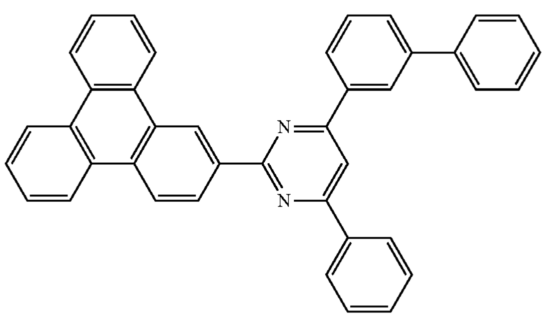
H-E6
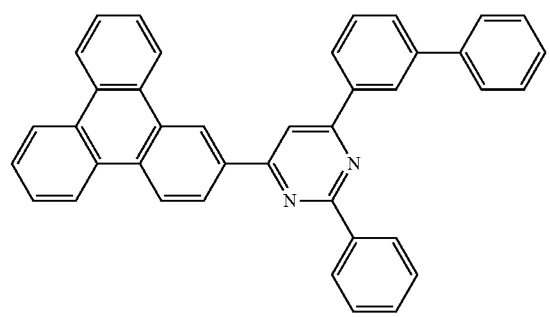
H-E7
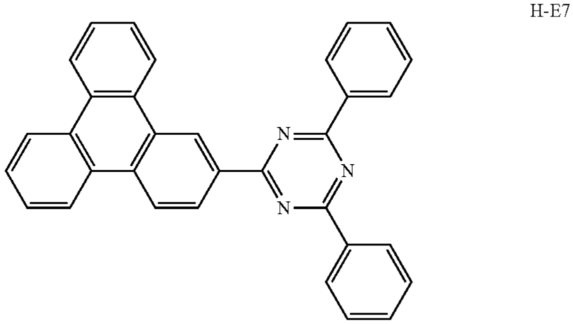
H-E8
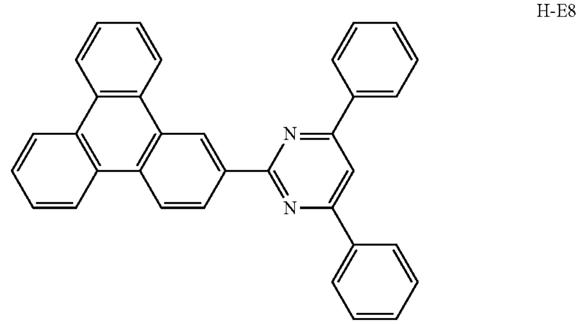
H-E9
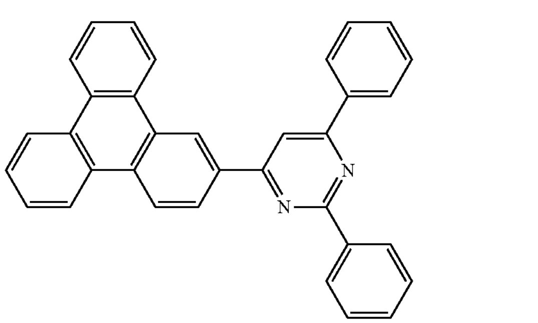
H-E10
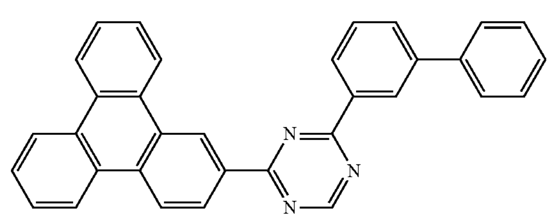

-continued
H-E11
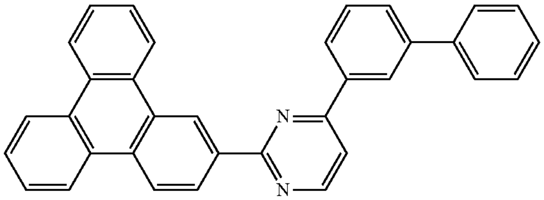
H-E12
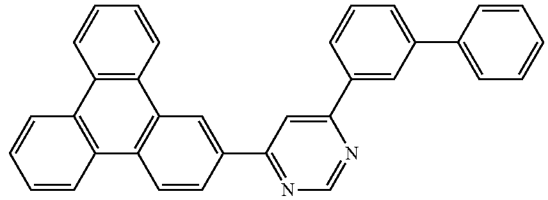
H-E13
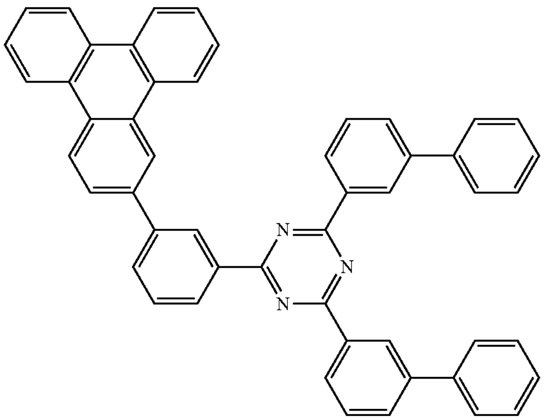
H-E14
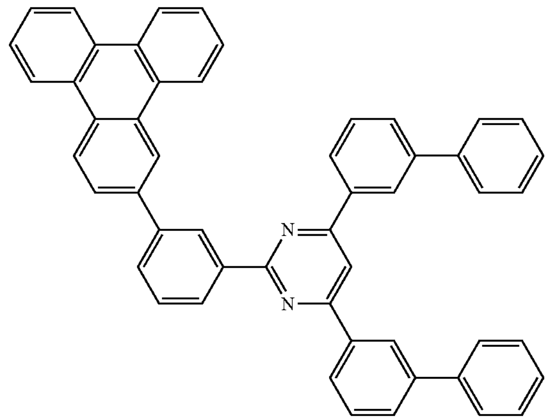
H-E15
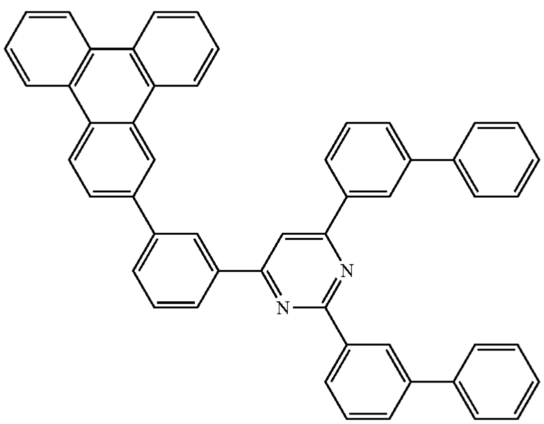
H-E16
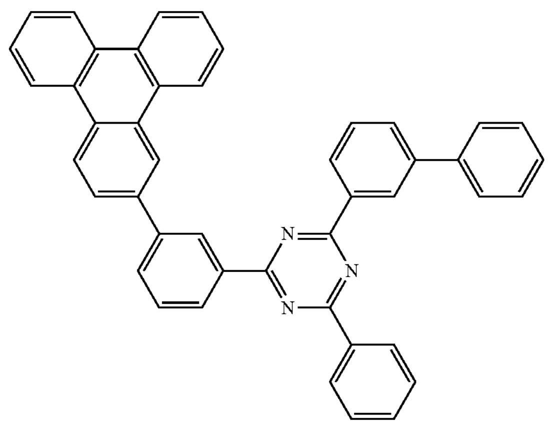
H-E17
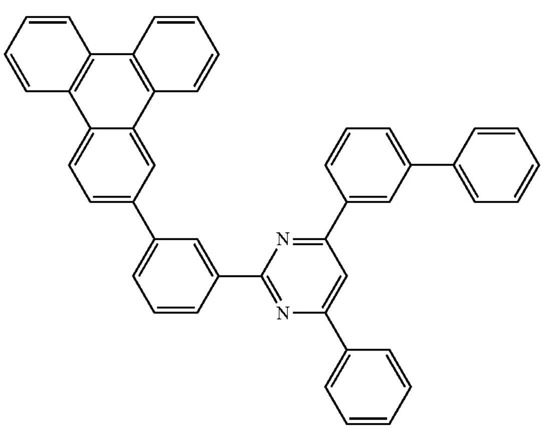
H-E18
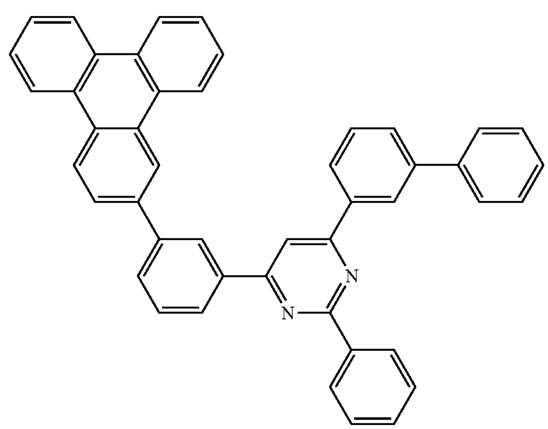

-continued
H-E19
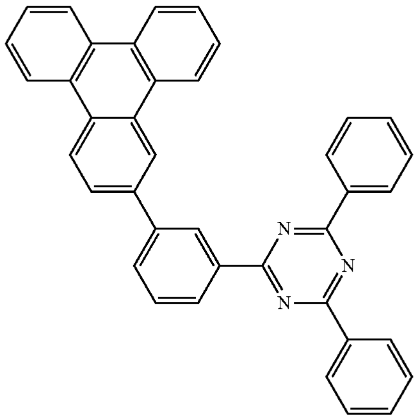
H-E20
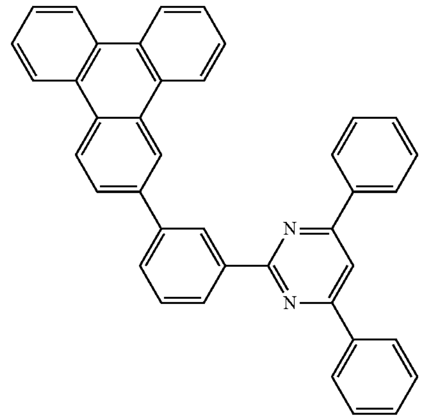
H-E21
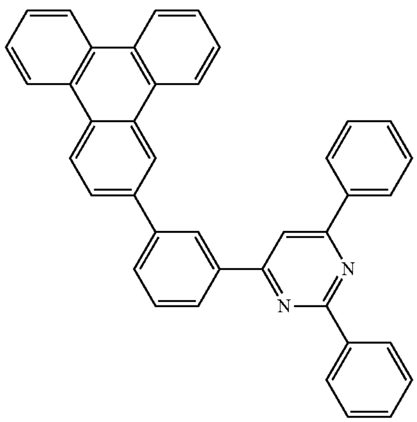
H-E22
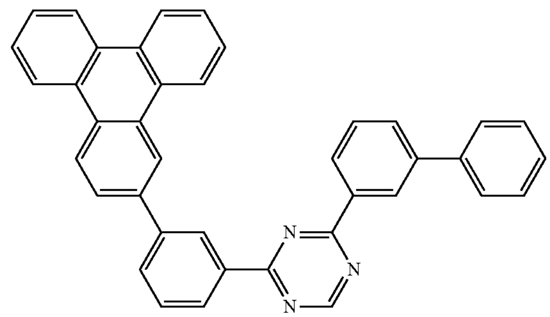
H-E23
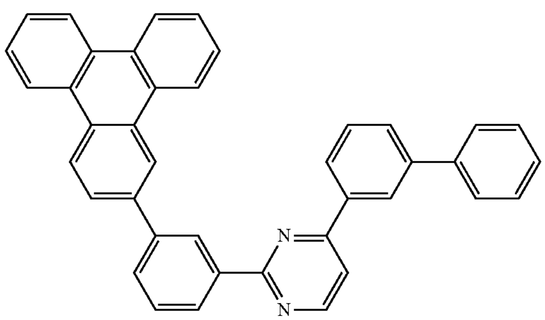
H-E24
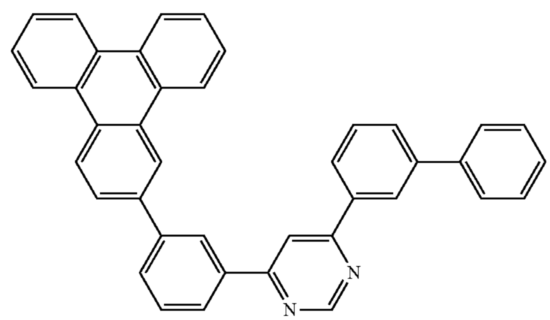
H-E25
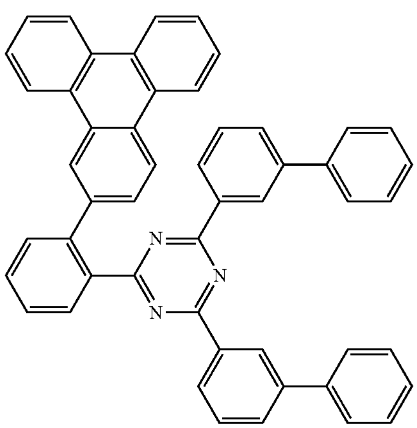
H-E26
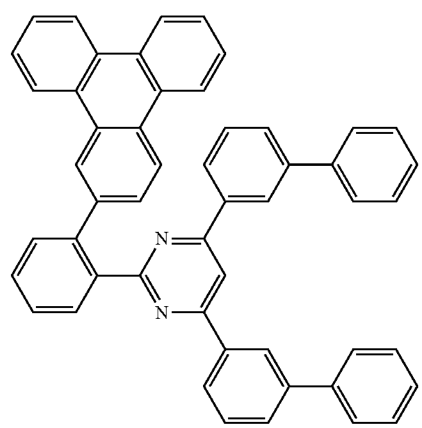

-continued
H-E27
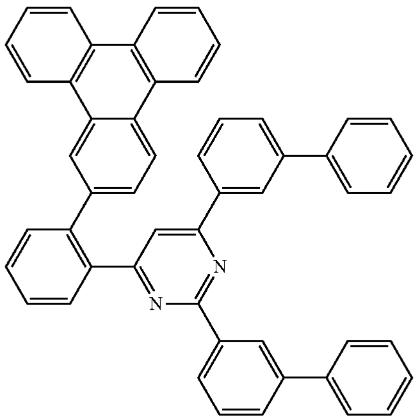
H-E28
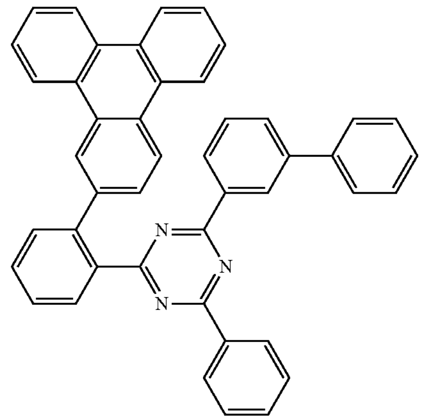
H-E29
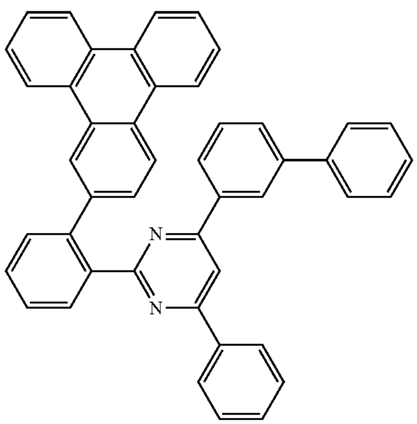
H-E30
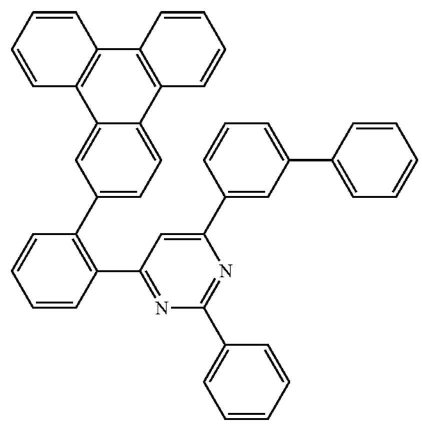
H-E31
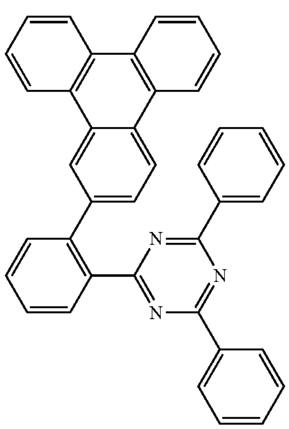
H-E32
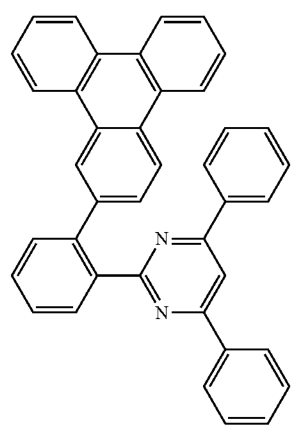

-continued
H-E33
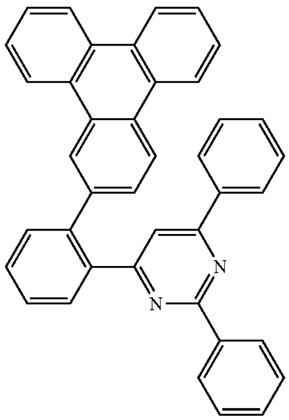
H-E34
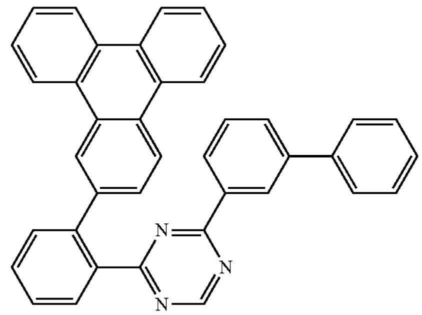
H-E35
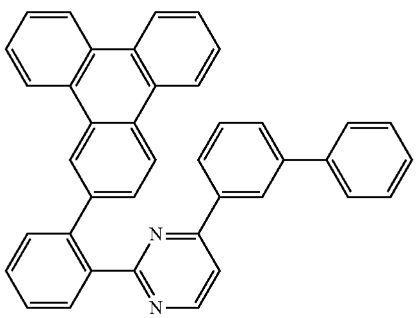
H-E36
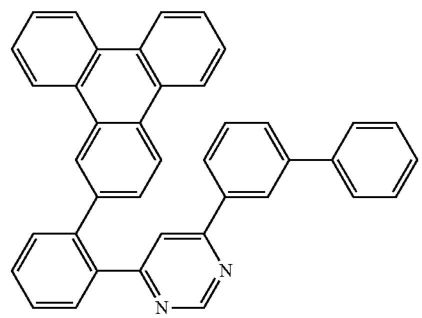
H-E37
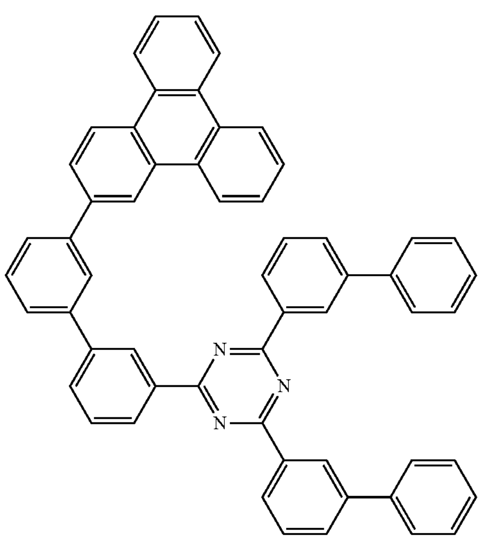
H-E38
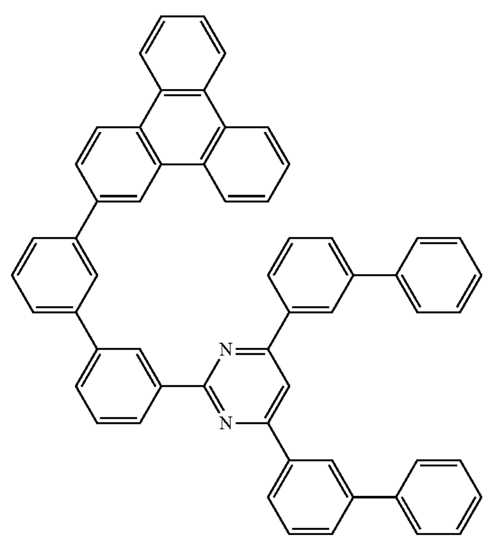

-continued
H-E39
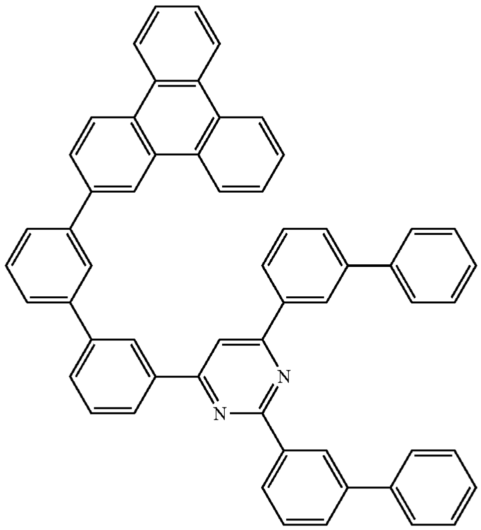
H-E40
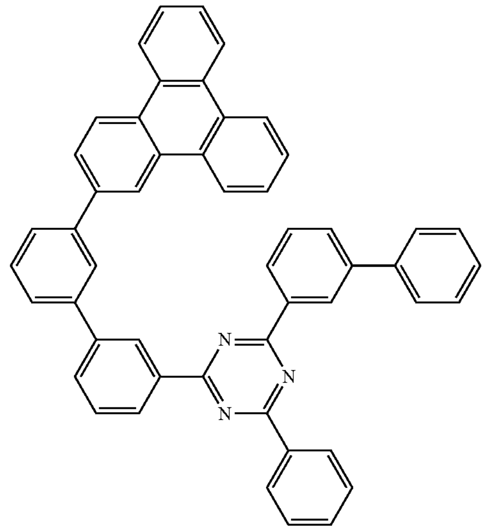
H-E41
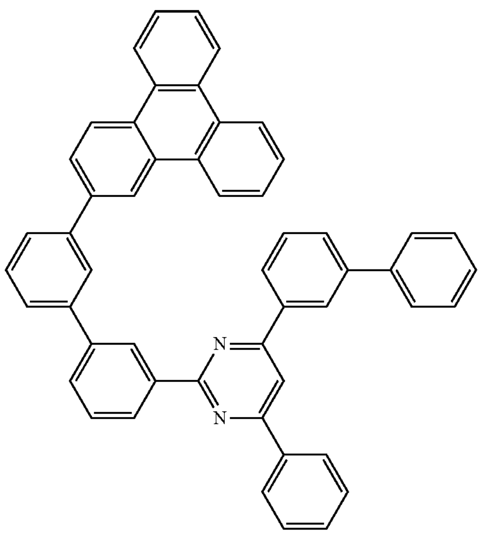
H-E42
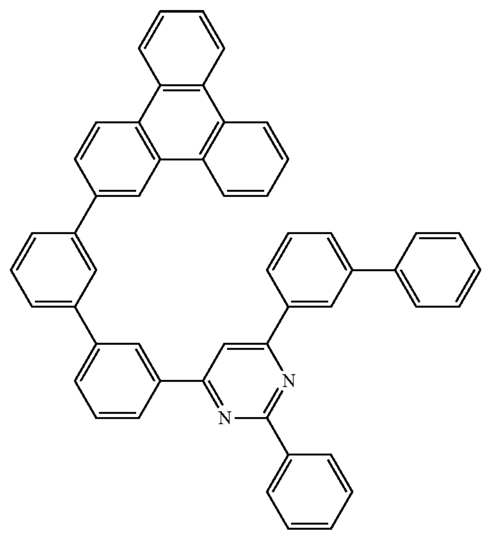
H-E43
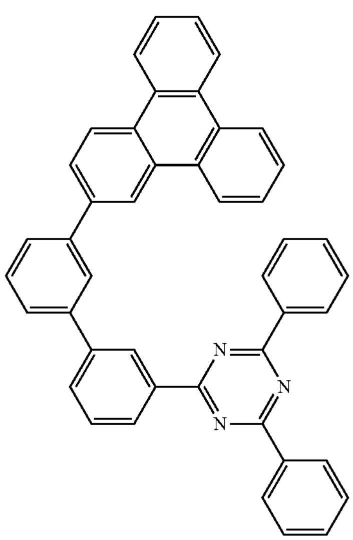
H-E44
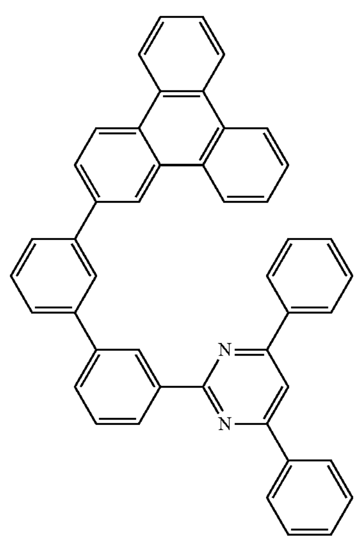

-continued
H-E45
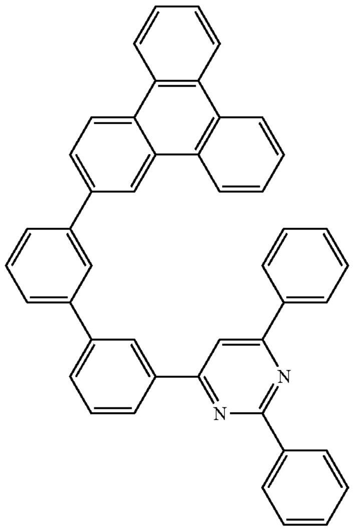
H-E46
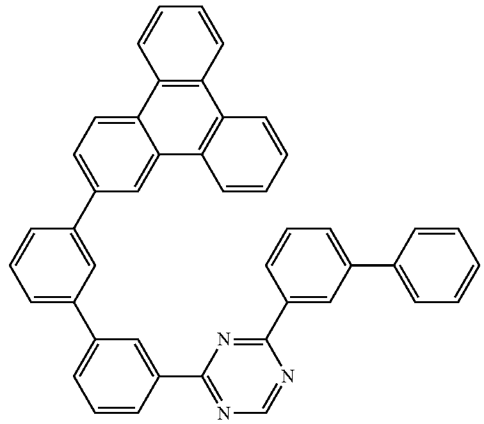
H-E47
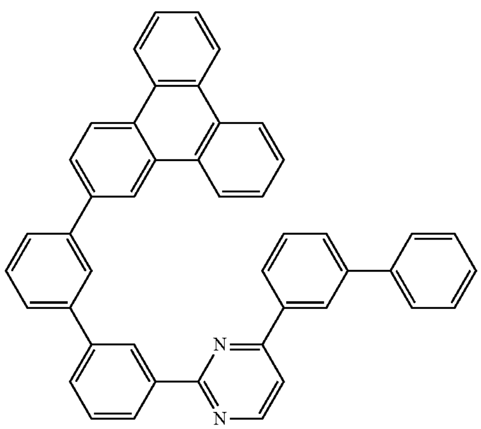
H-E48
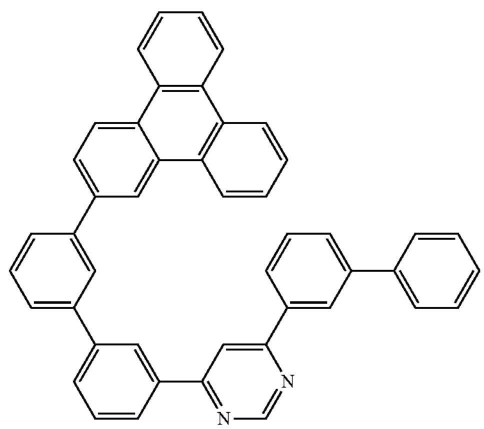
H-E49
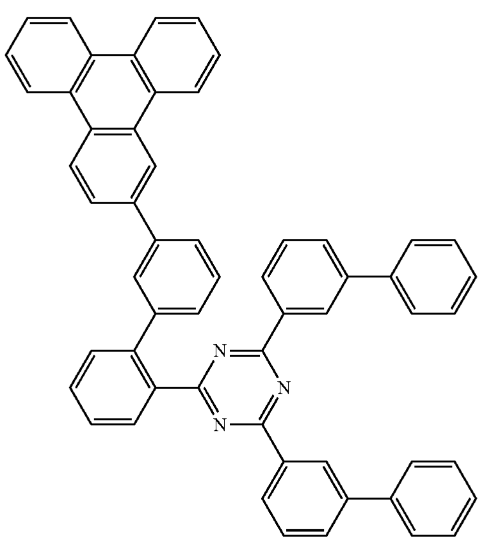
H-E50
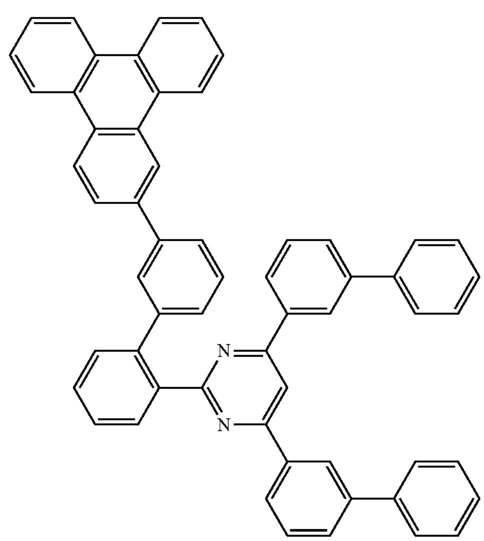

-continued
H-E51
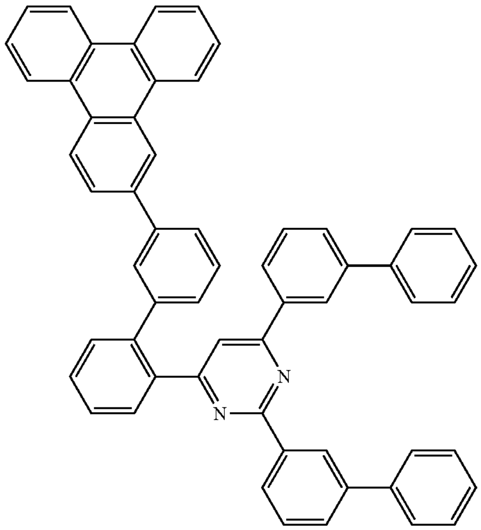
H-E52
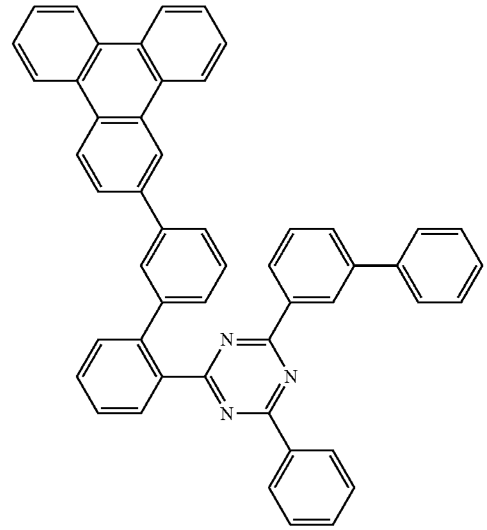
H-E53
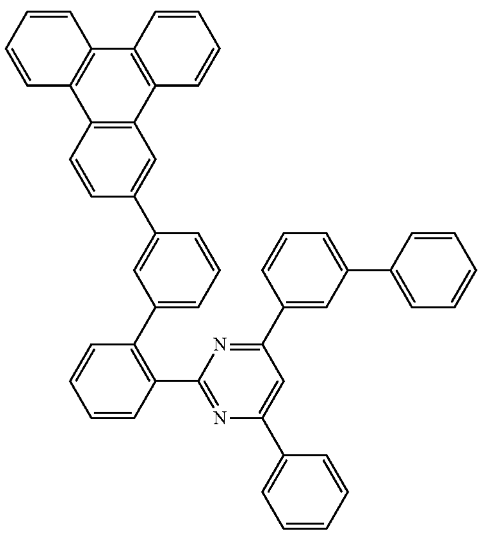
H-E54
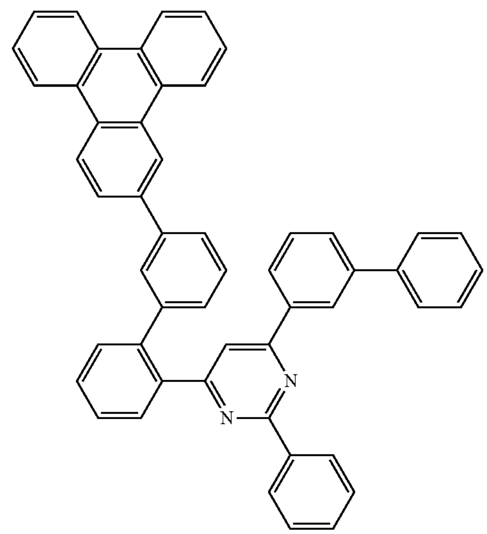
H-E55
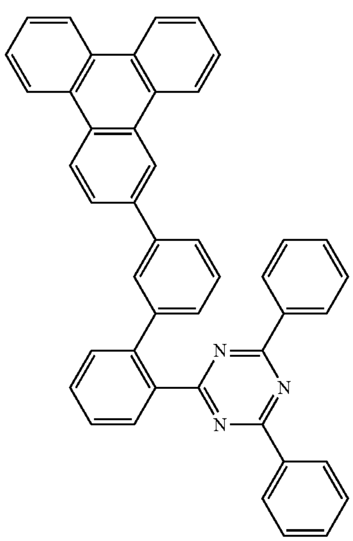
H-E56
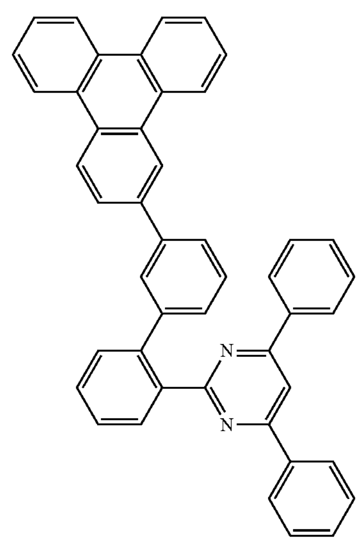

-continued
H-E57
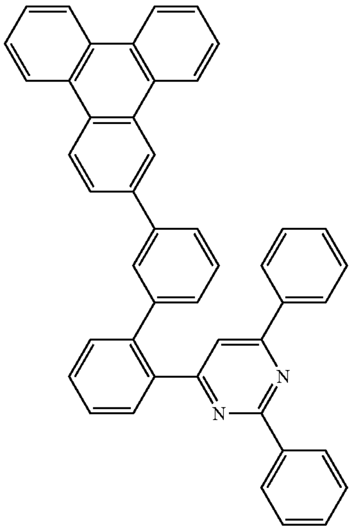
H-E58
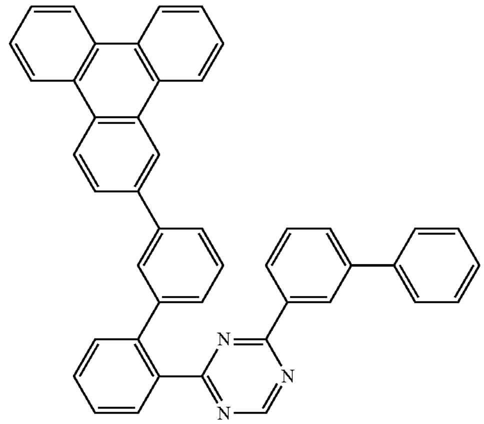
H-E59
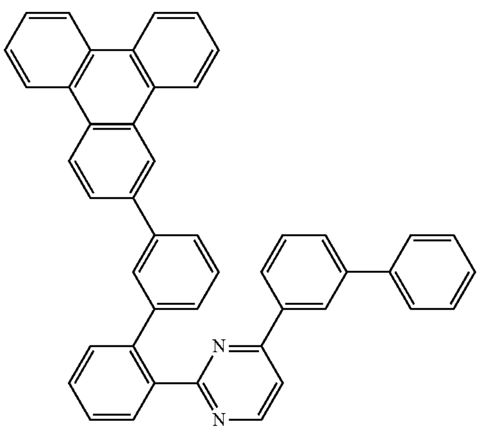
H-E60
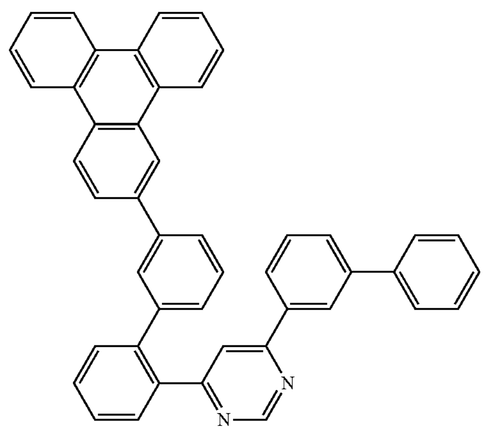
H-E61
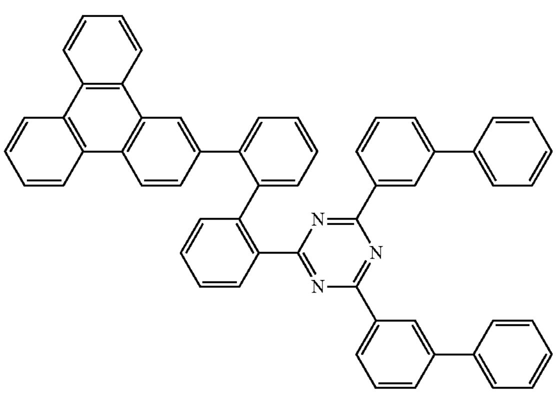
H-E62
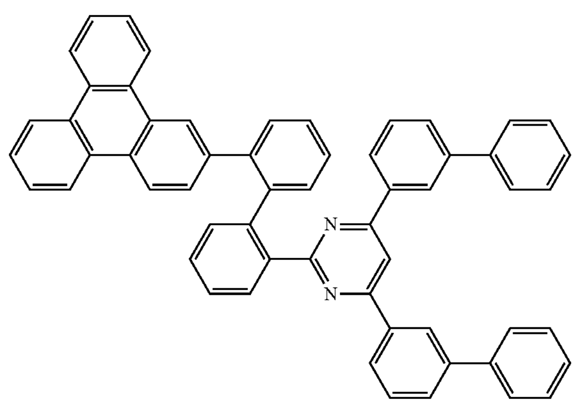

-continued
H-E63
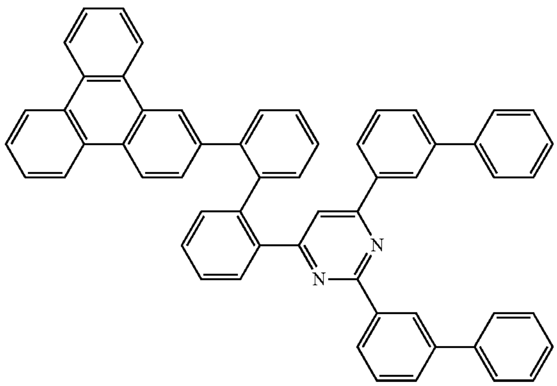
H-E64
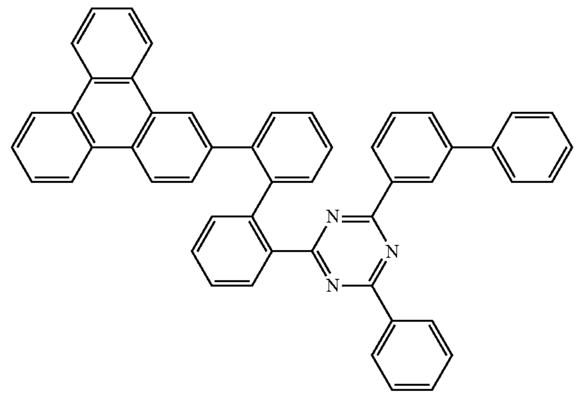
H-E65
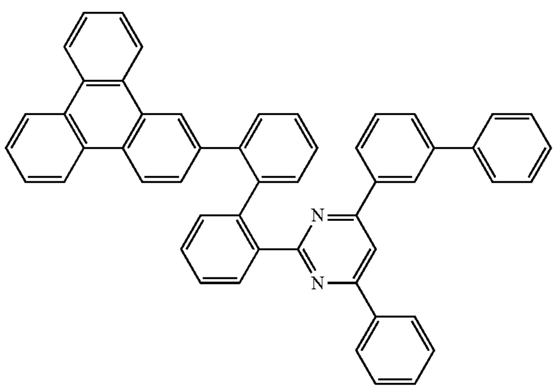
H-E66
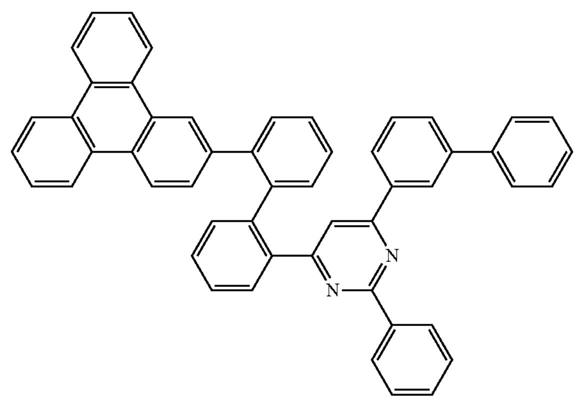
H-E67
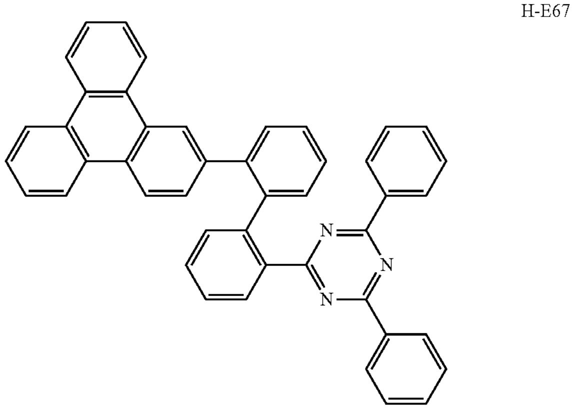
H-E68
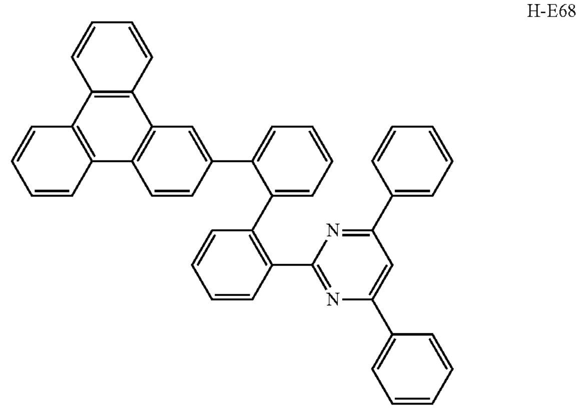
H-E69
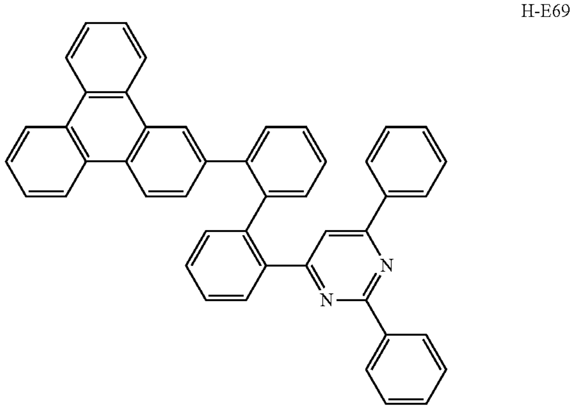
H-E70
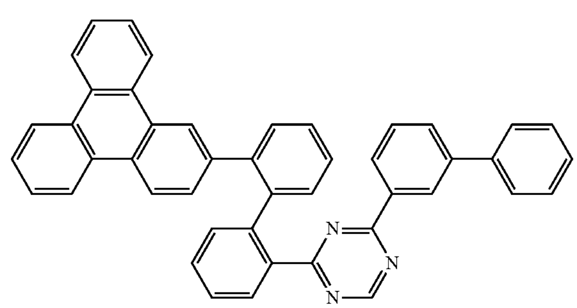

-continued
H-E71
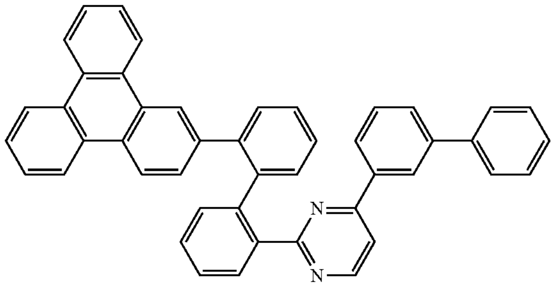
H-E72
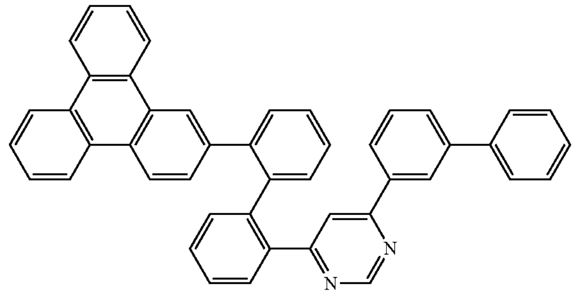
H-E73
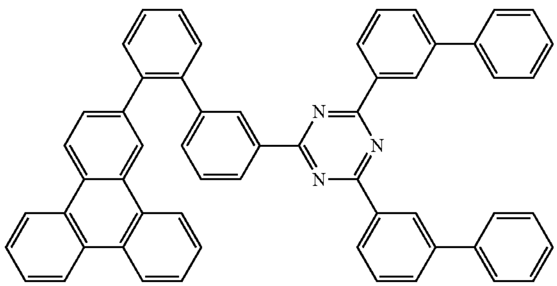
H-E74
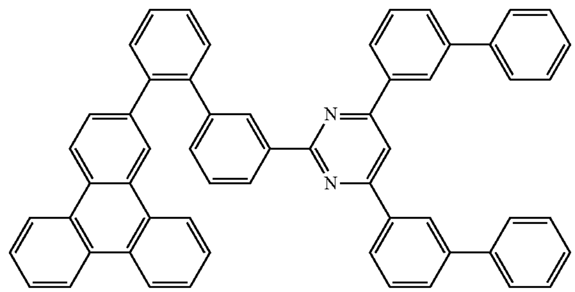
H-E75
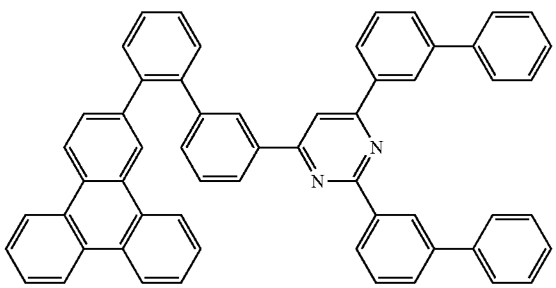
H-E76
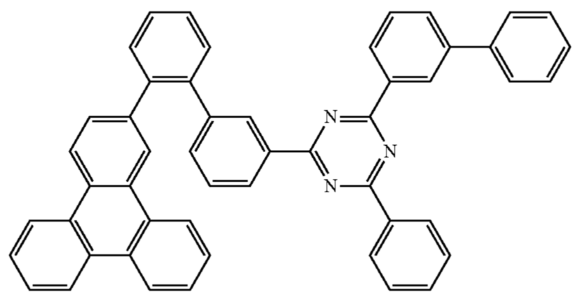
H-E77
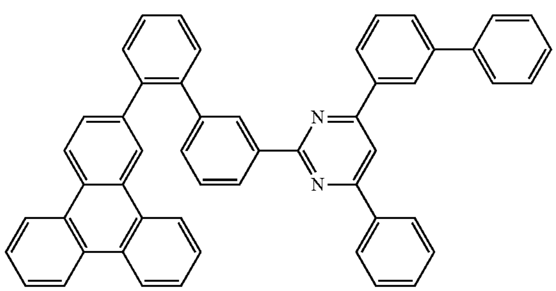
H-E78
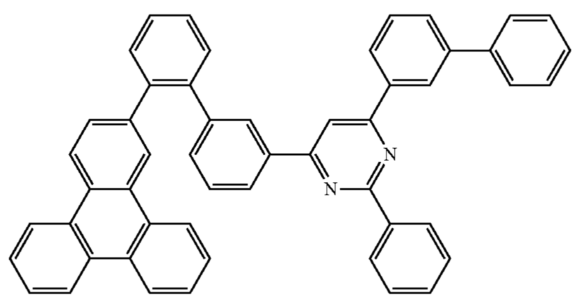
H-E79
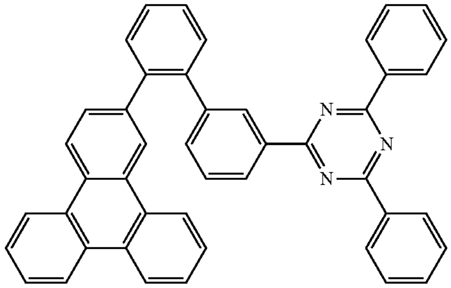
H-E80
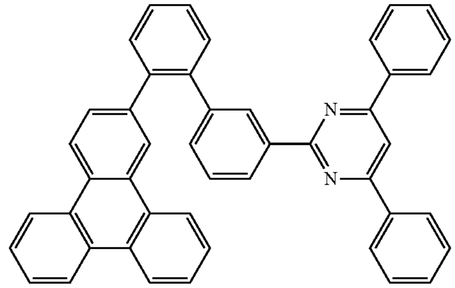

-continued
H-E81
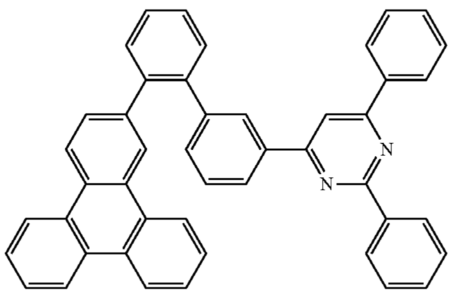
H-E82
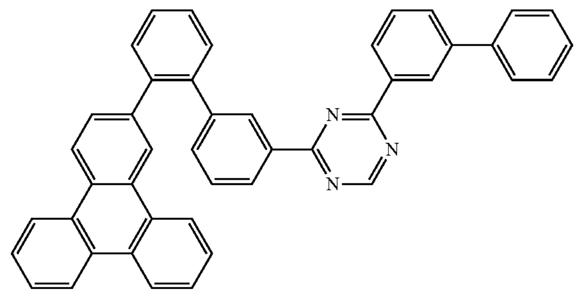
H-E83
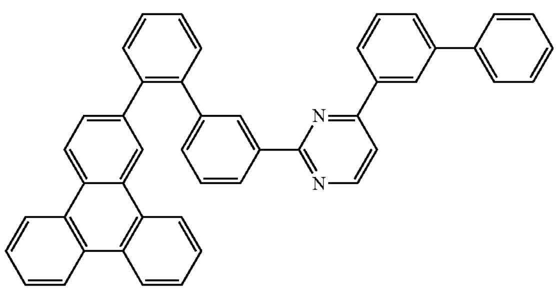
H-E84
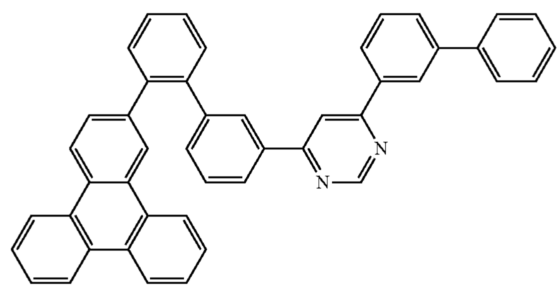
.
H-E(1)
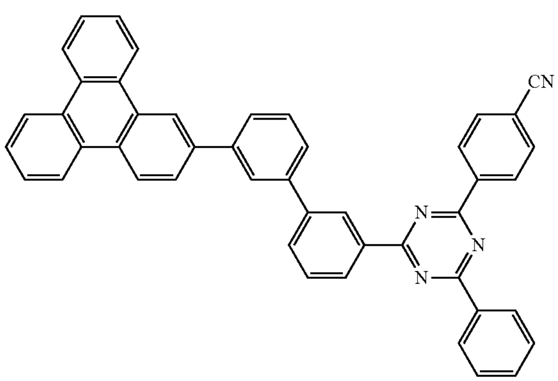
H-E(2)
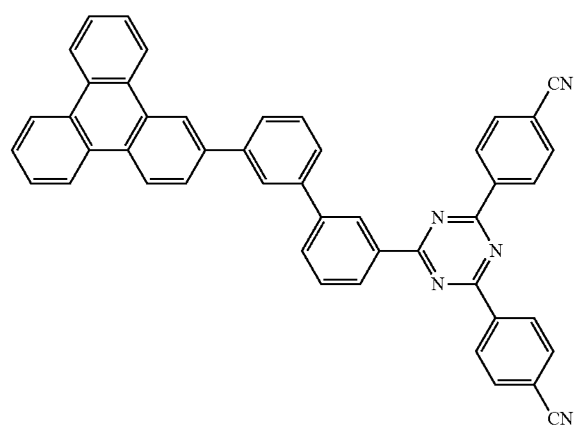
H-E(3)
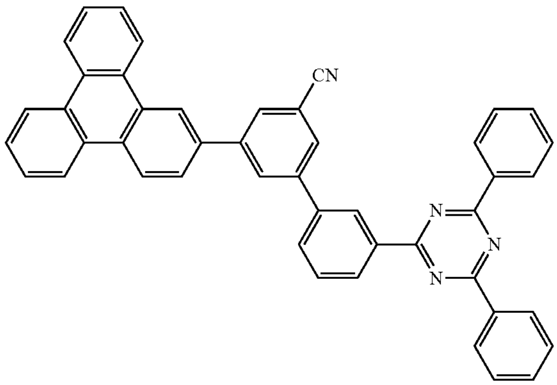
H-E(4)
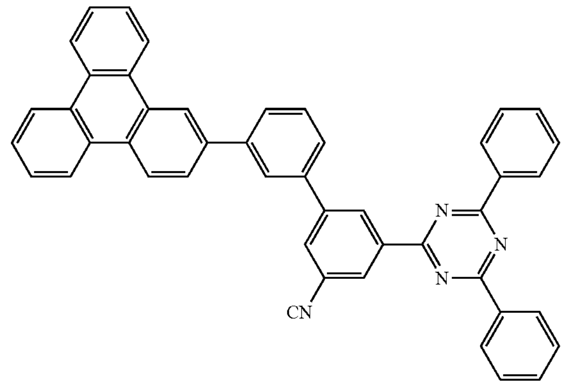

-continued
A-1
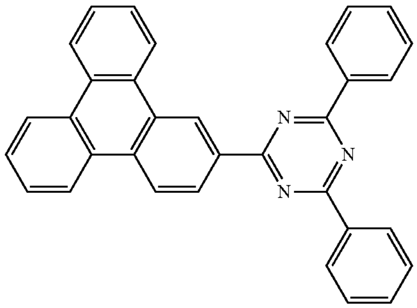
A-2
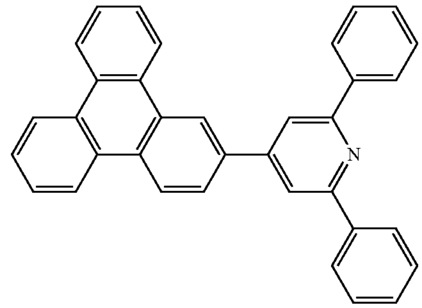
A-3
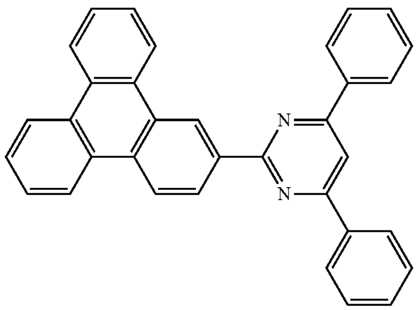
A-4
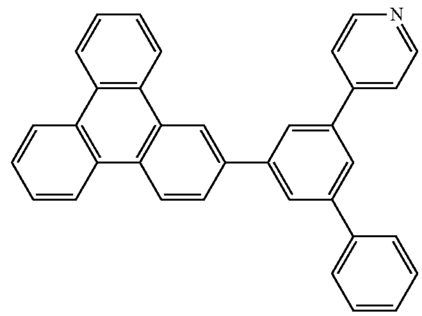
A-5
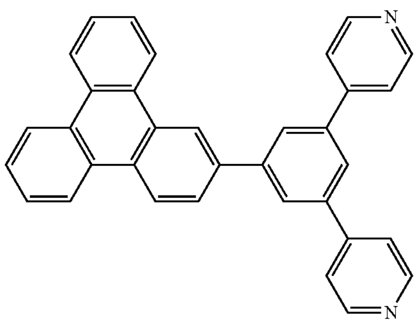
A-6
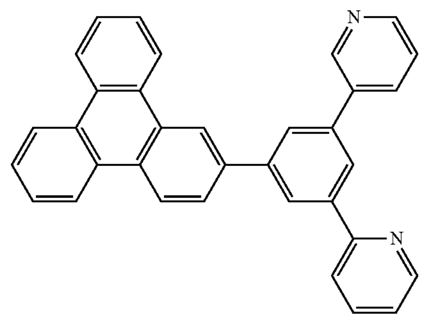
A-7
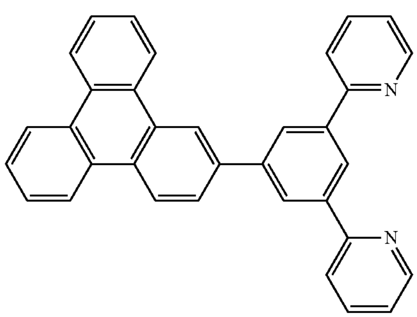
A-8
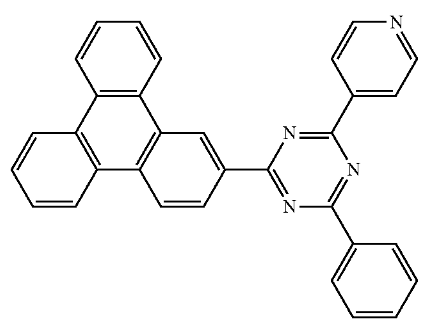
A-9
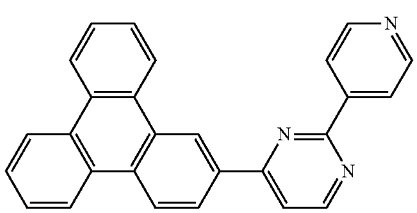
A-10
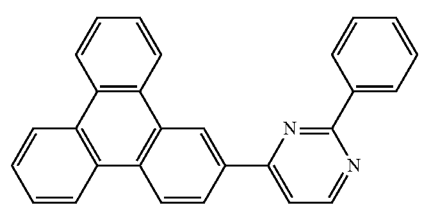

-continued
A-11
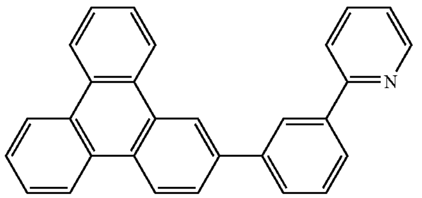
A-12
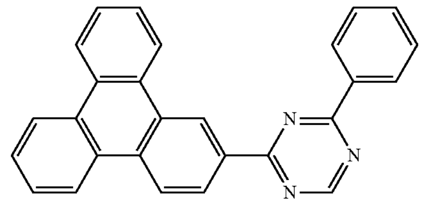
A-13
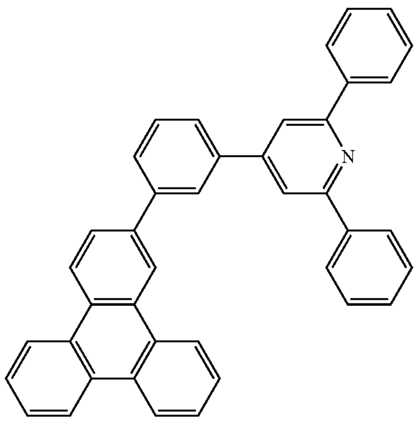
A-14
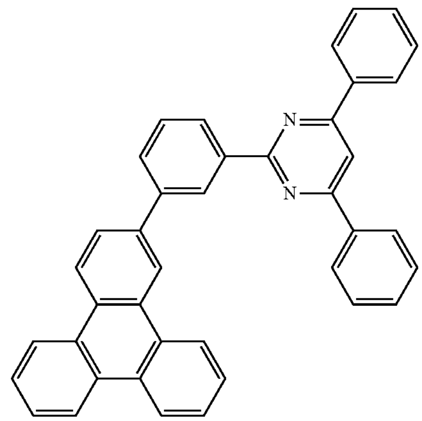
A-15
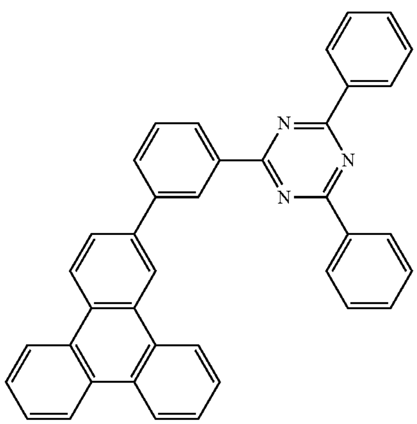
A-16
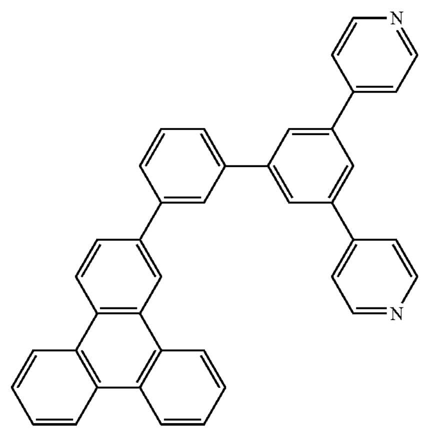
A-17
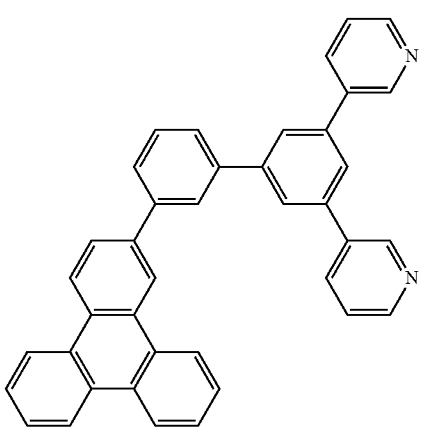
A-18
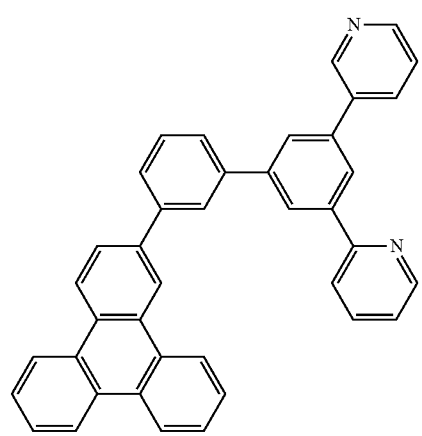

-continued
A-19
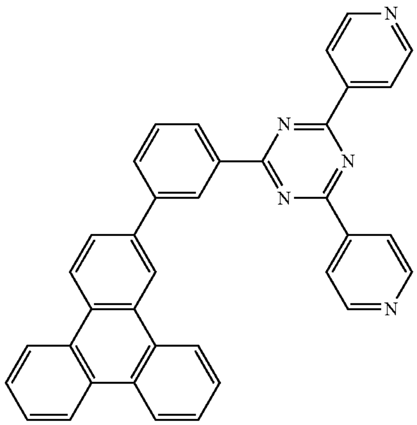
A-20
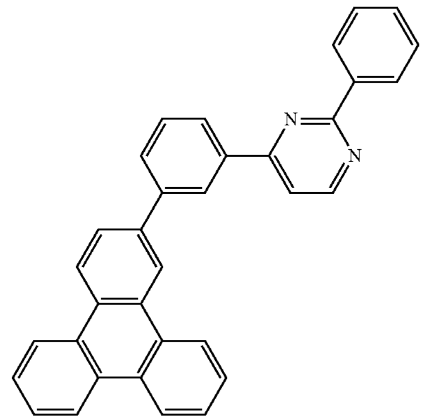
A-21
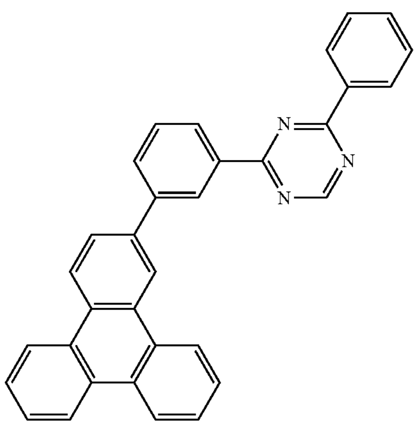
A-22
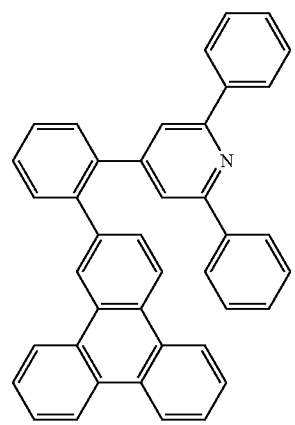
A-23
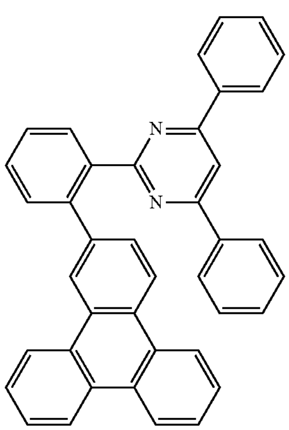
A-24
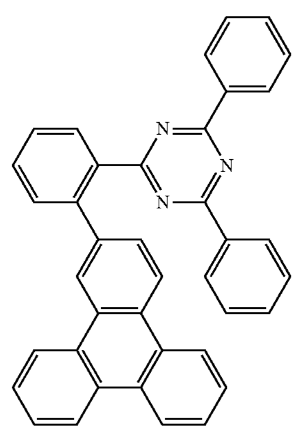

-continued
A-25
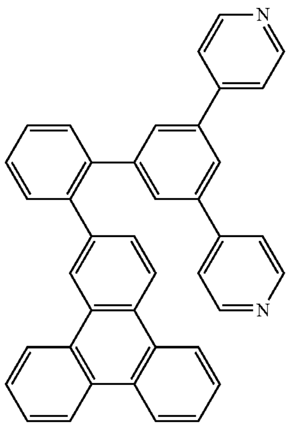
A-26
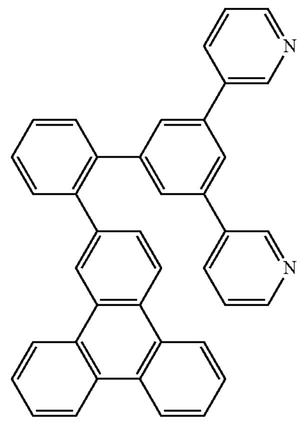
A-27
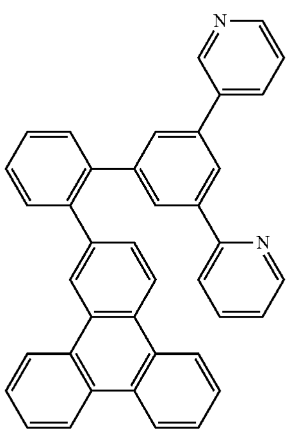
A-28
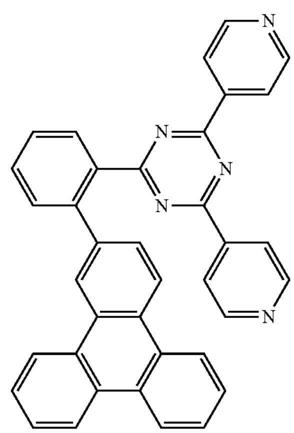
A-29
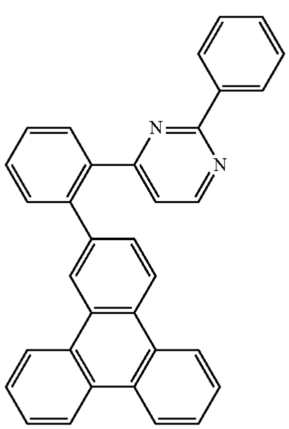
A-30
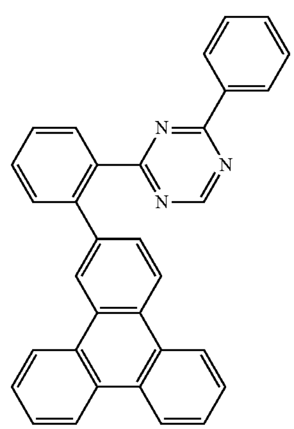

-continued
A-31
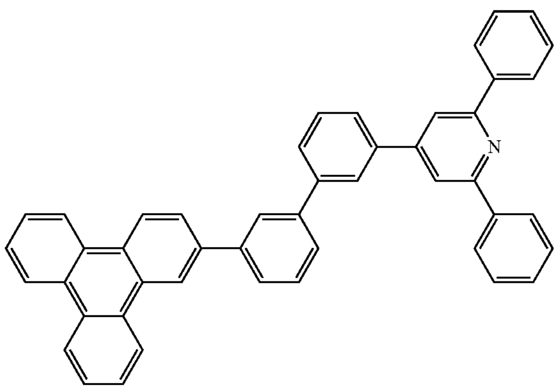
A-32
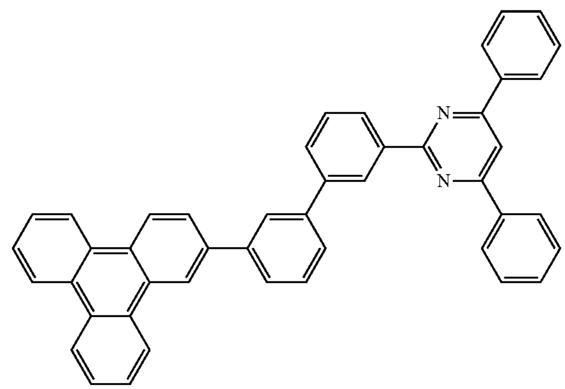
A-33
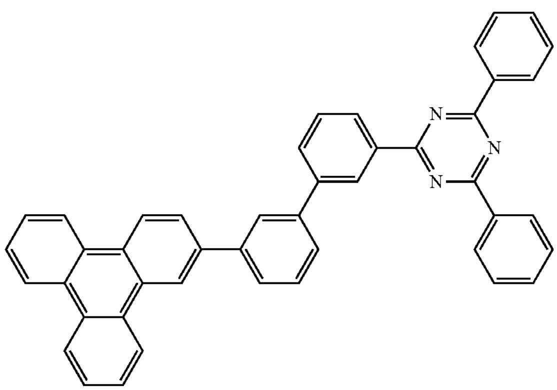
A-34
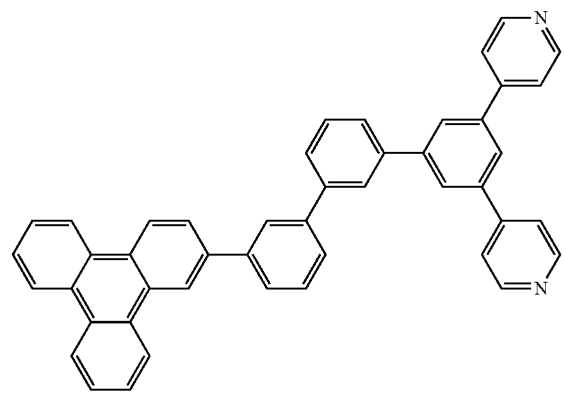
A-35
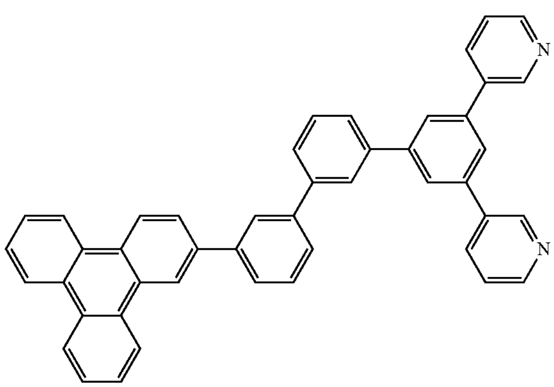
A-36
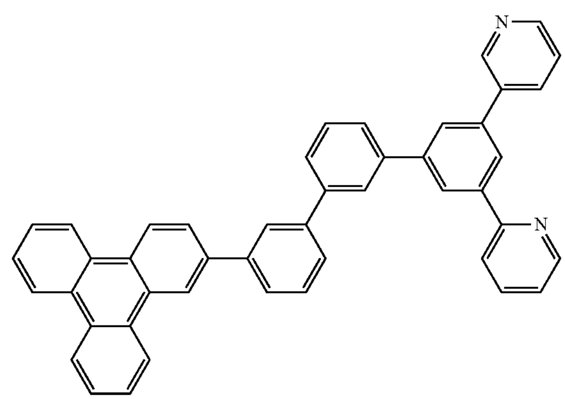
A-37
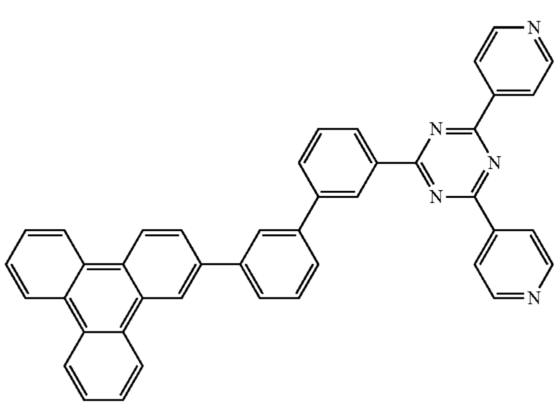
A-38
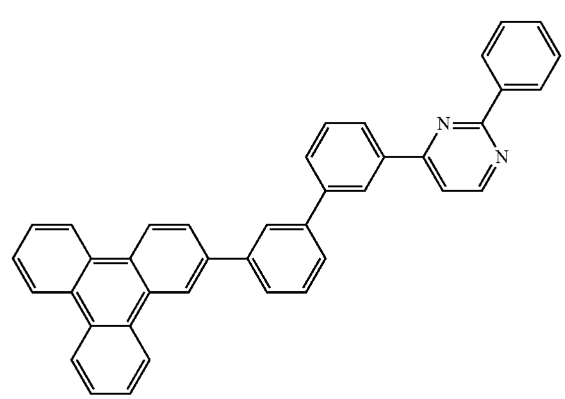

-continued
A-39
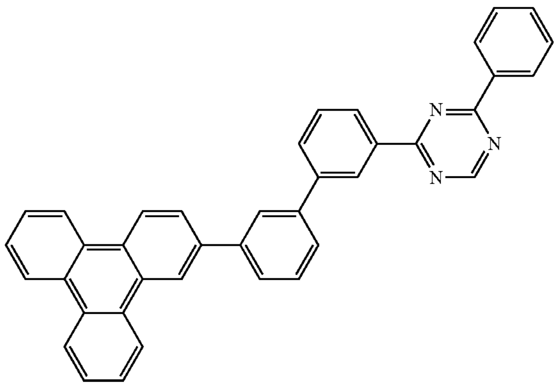
A-40
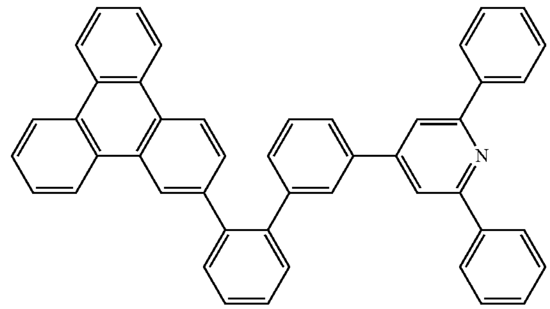
A-41
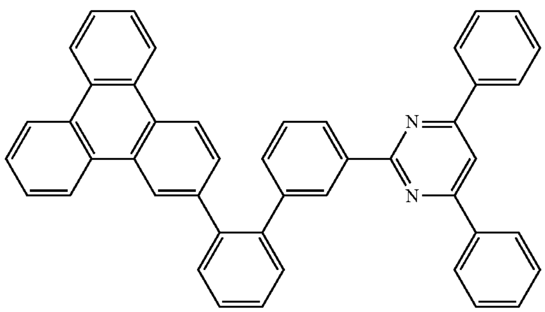
A-42
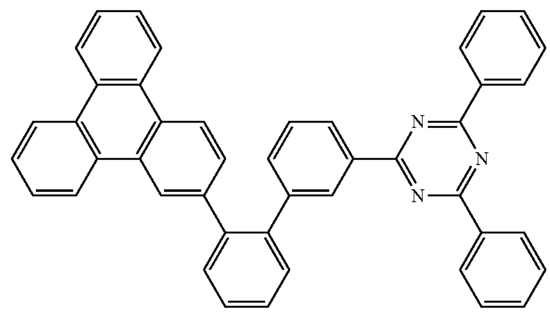
A-43
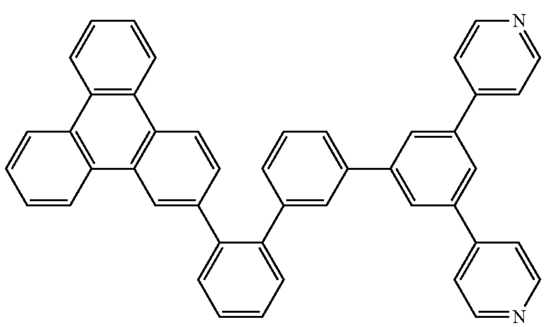
A-44
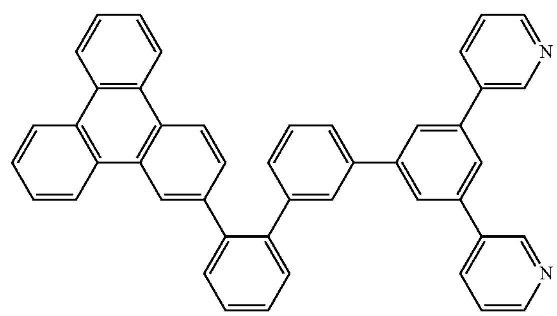
A-45
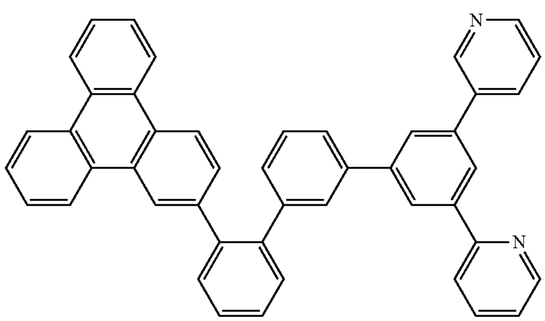
A-46
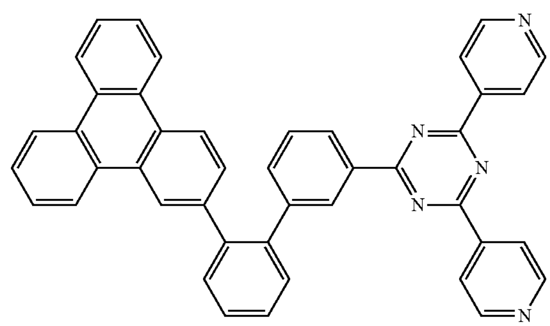

-continued
A-47
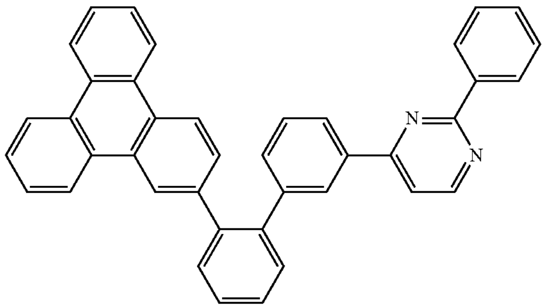
A-48
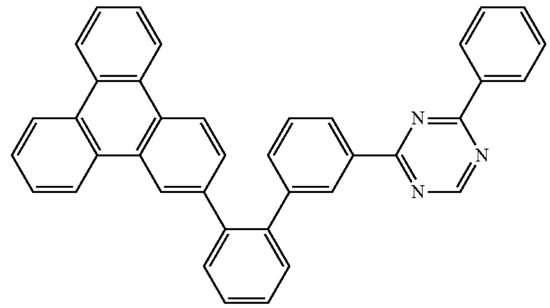
A-49
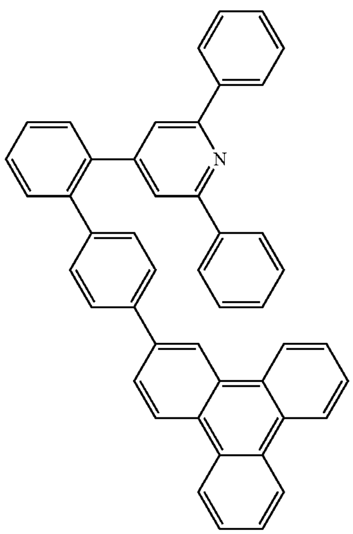
A-50
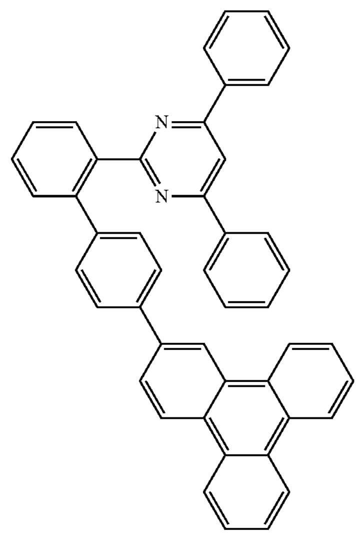
A-51
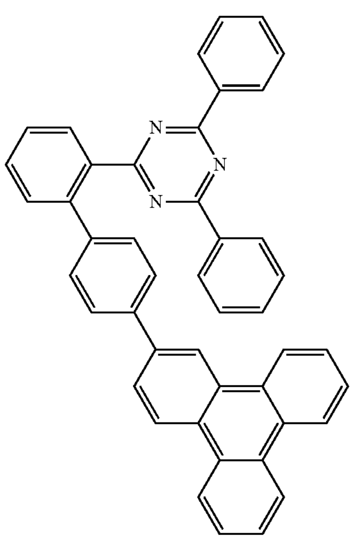
A-52
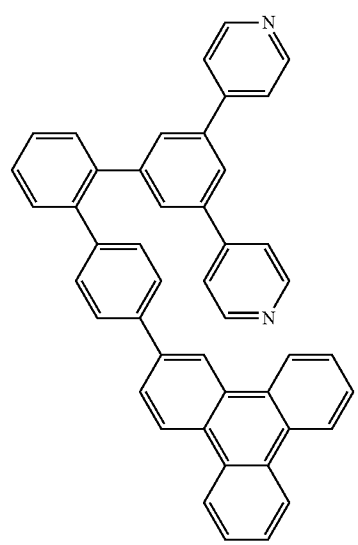

-continued
A-53
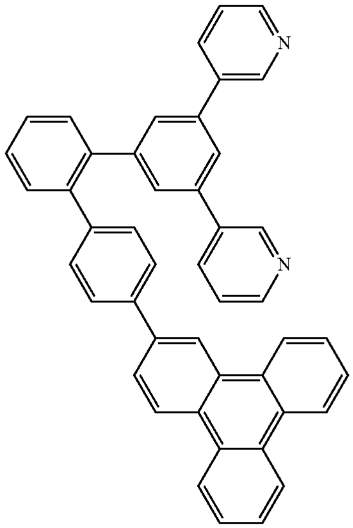
A-54
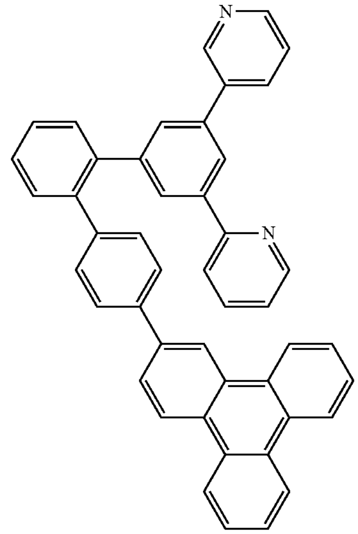
A-55
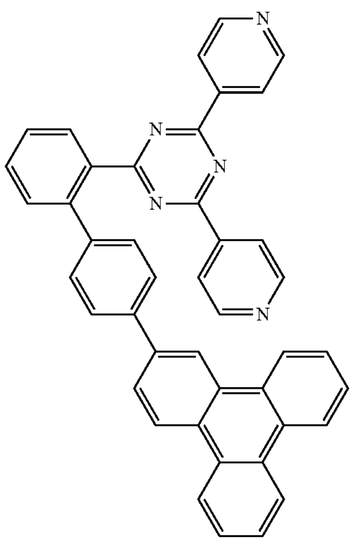
A-56
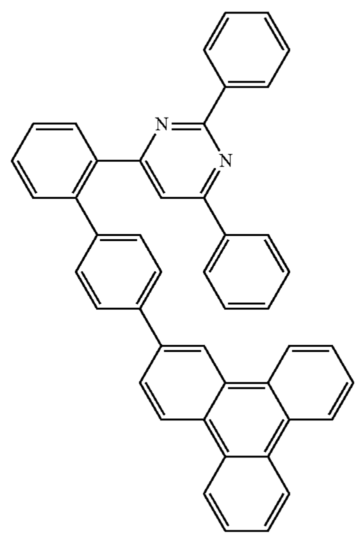
A-57
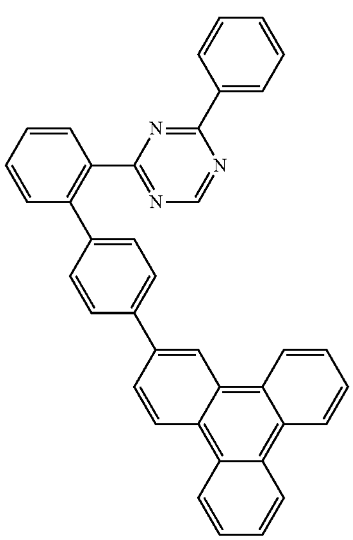
A-58
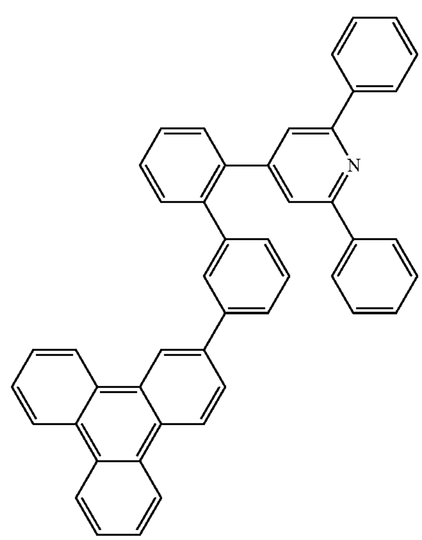

-continued
A-59
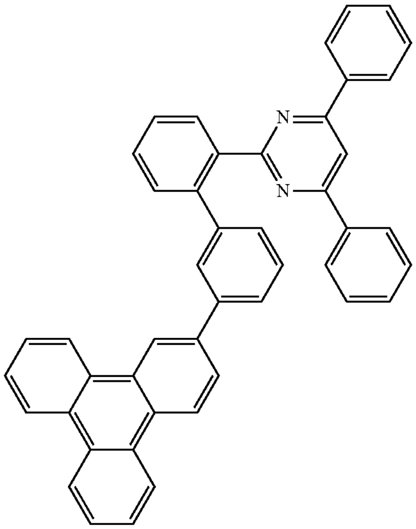
A-60
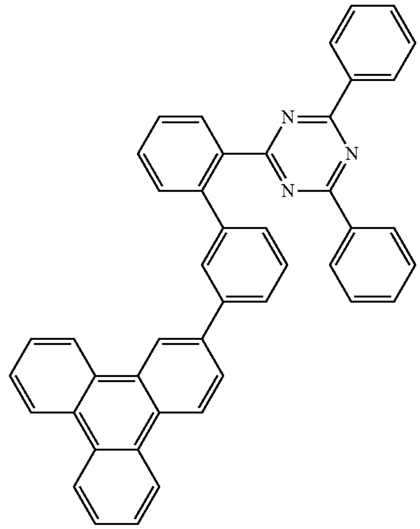
A-61
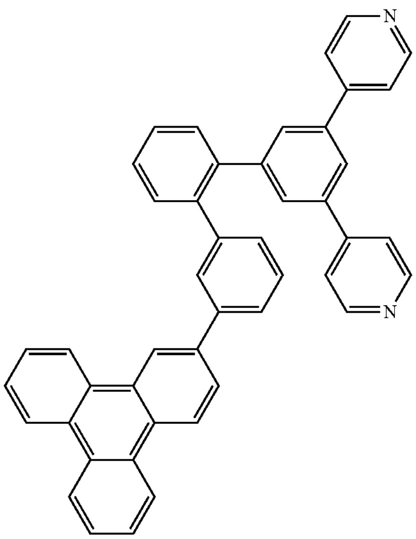
A-62
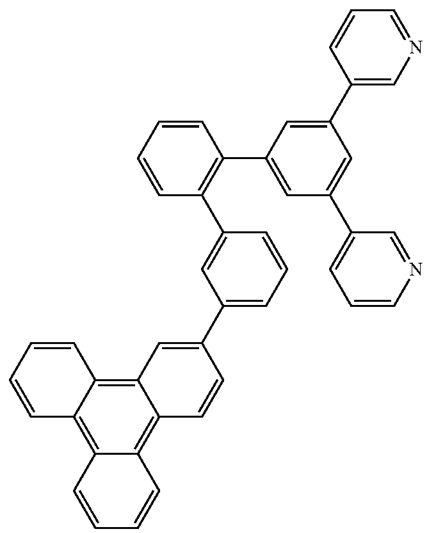
A-63
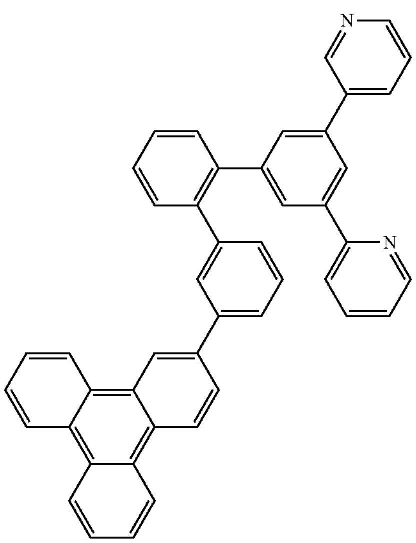
A-64
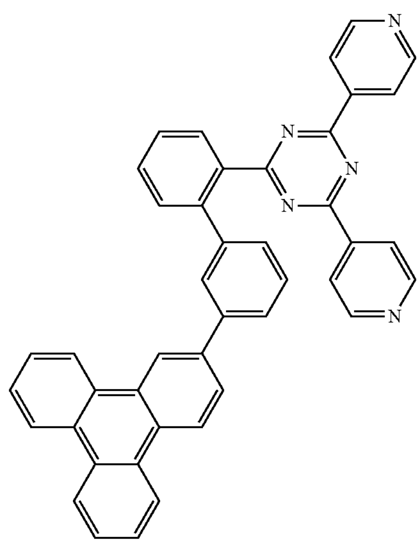

-continued
A-65
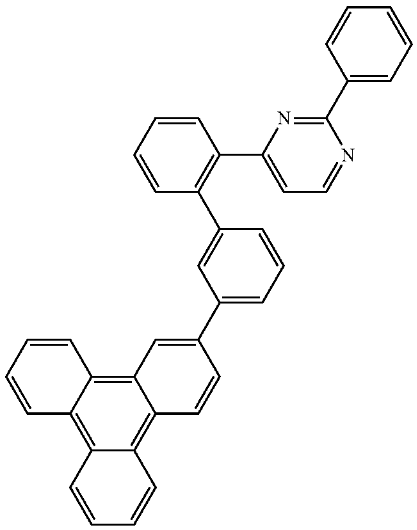
A-66
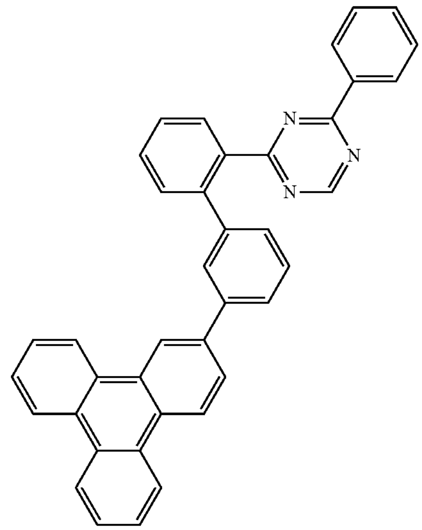
A-67
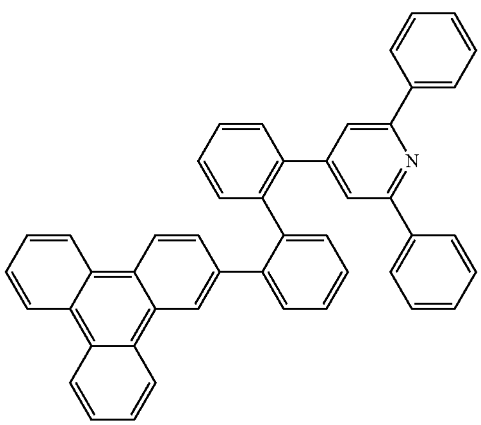
A-68
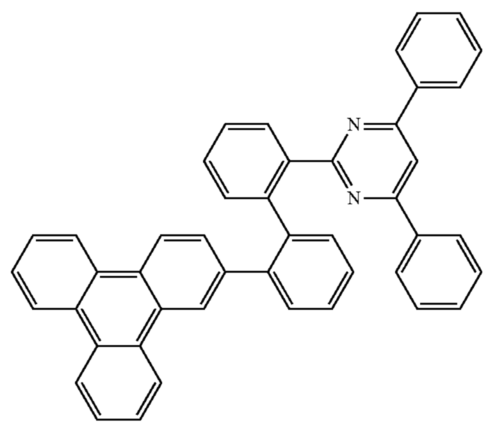
A-69
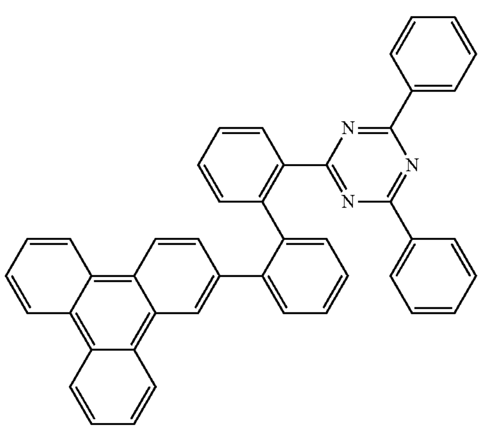
A-70
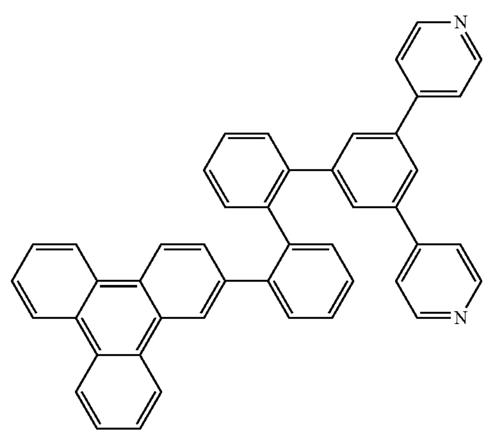

-continued
A-71
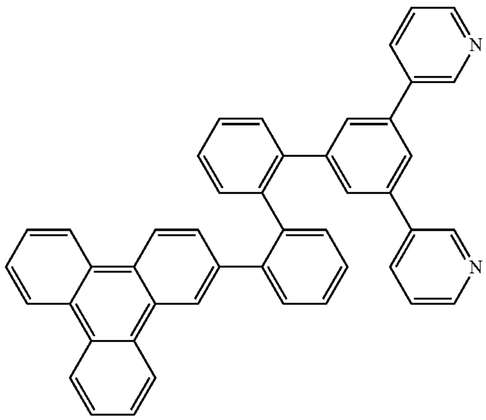
A-72
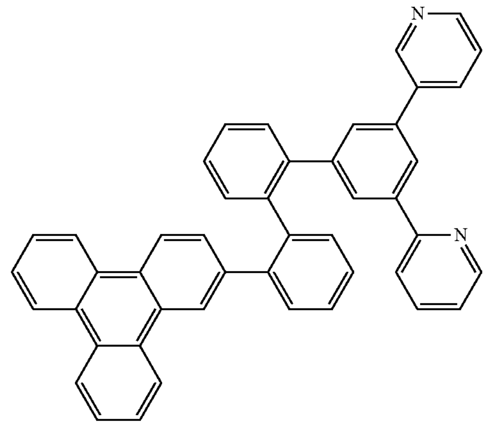
A-73
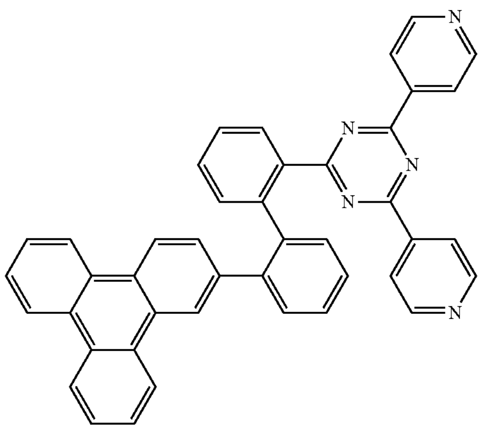
A-74
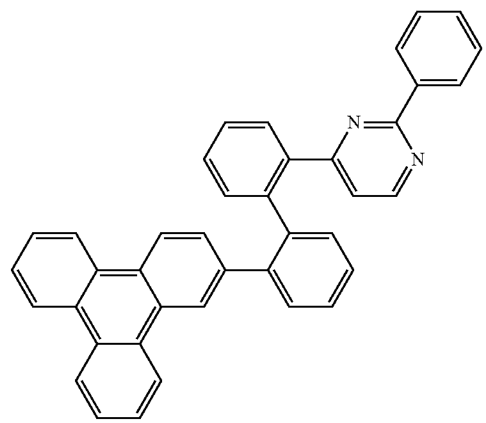
A-75
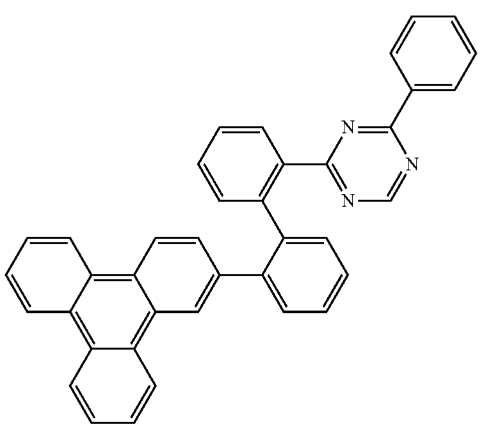
A-76
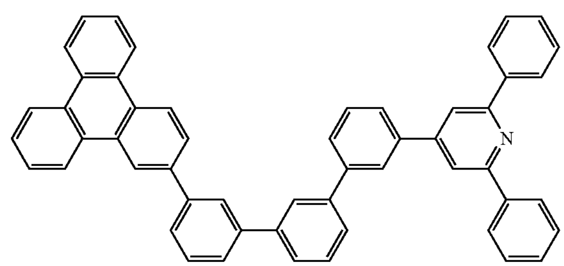
A-77
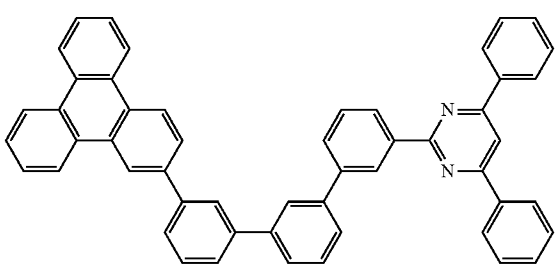
A-78
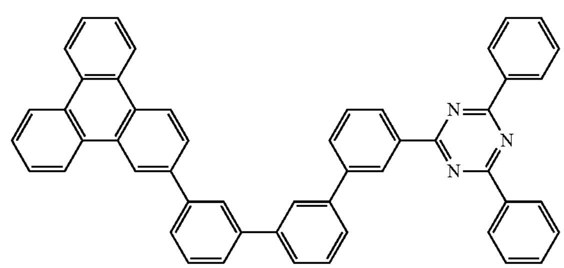

-continued
A-79
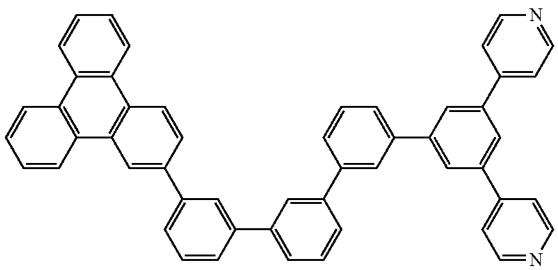
A-80
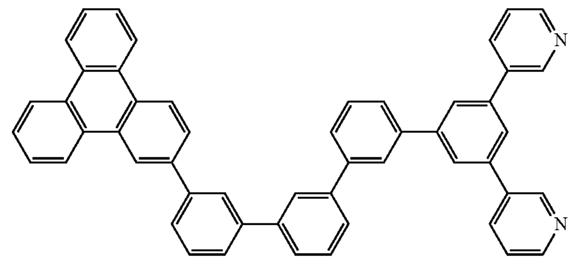
A-81
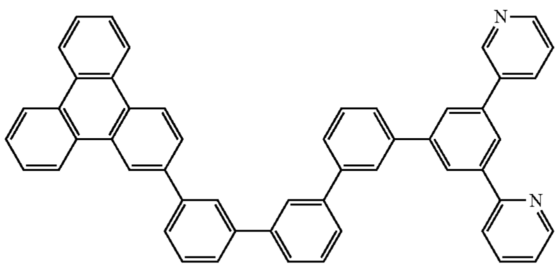
A-82
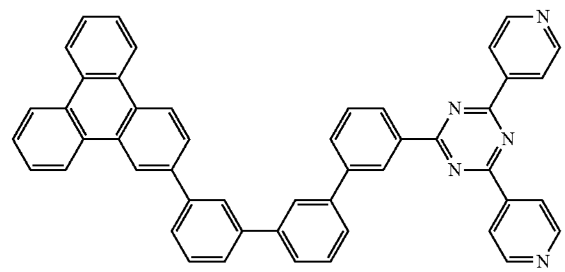
A-83
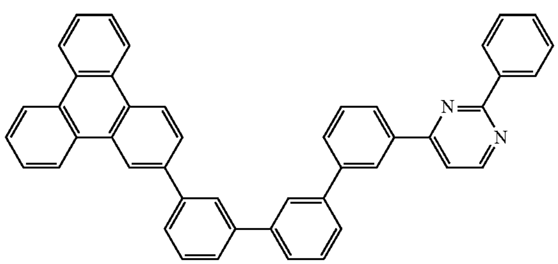
A-84
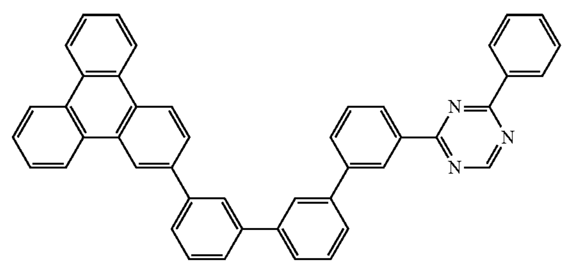
A-85
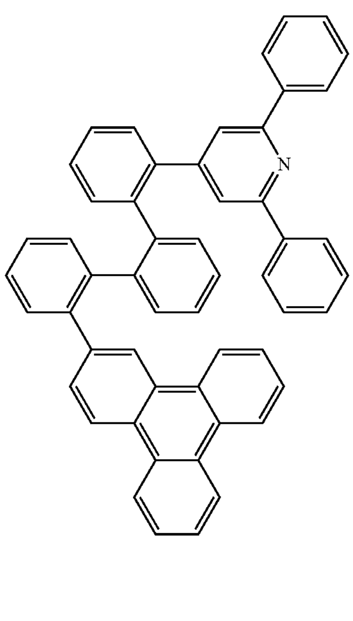
A-86
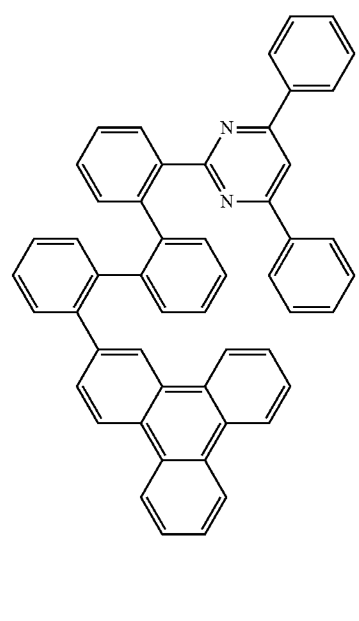

-continued
A-87
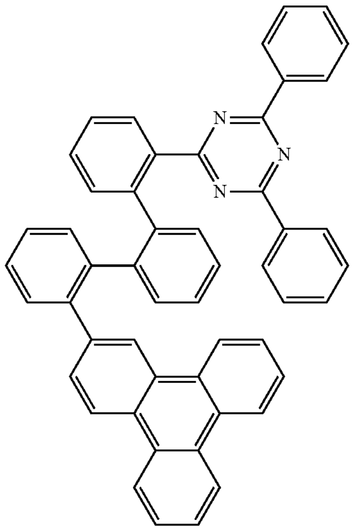
A-88
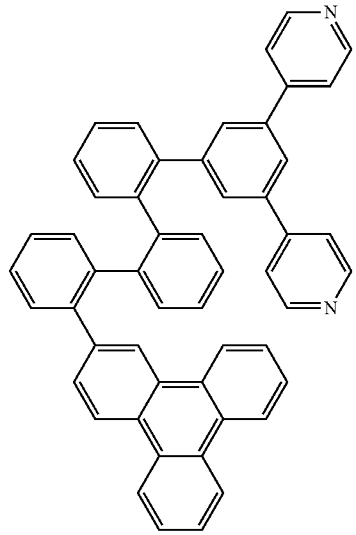
A-89
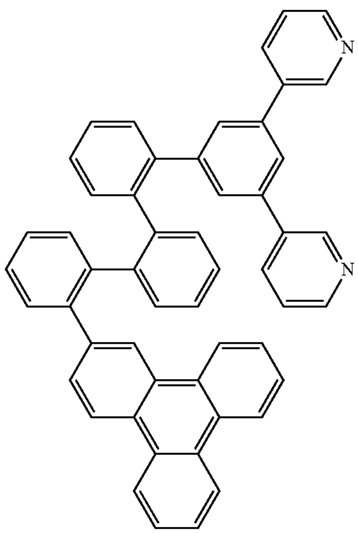
A-90
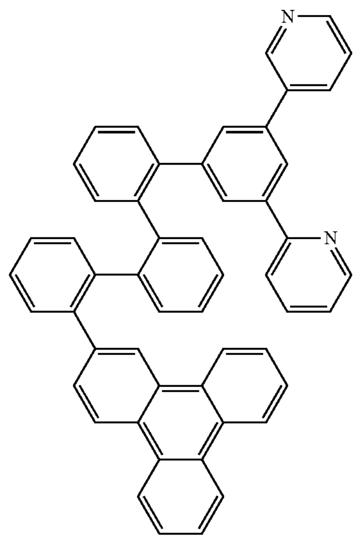
A-91
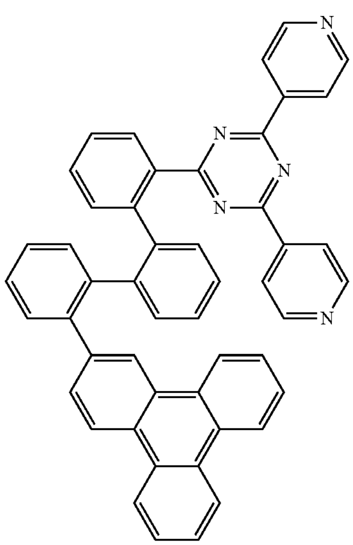
A-92
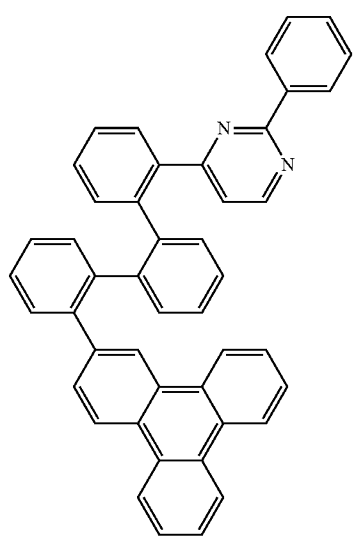

-continued
A-93
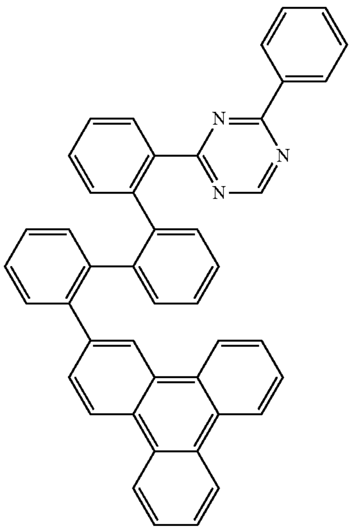
A-94
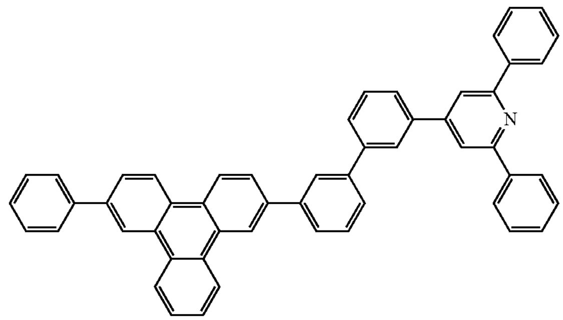
A-95
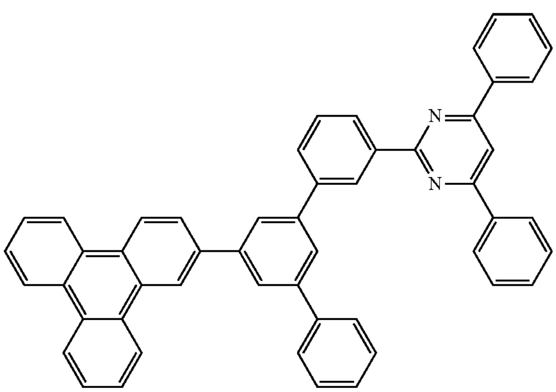
A-96
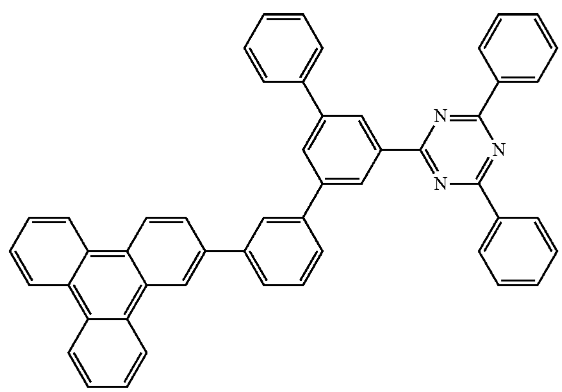
A-97
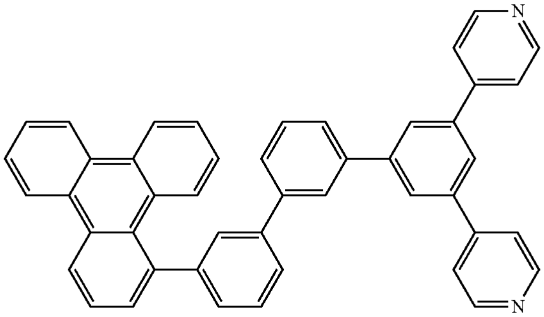
A-98
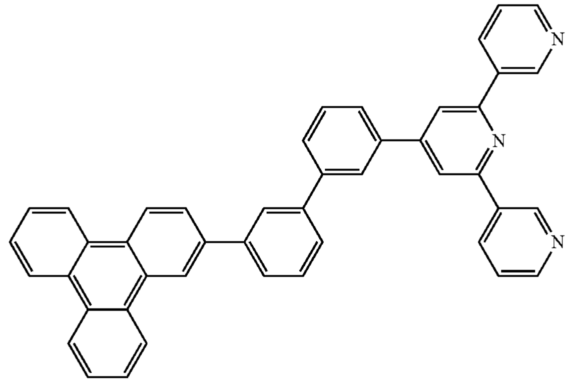

-continued
A-99
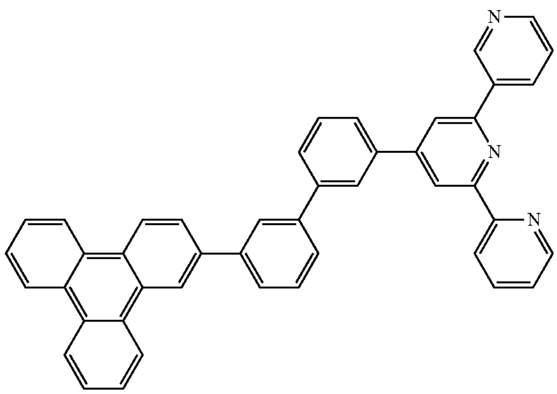
A-100
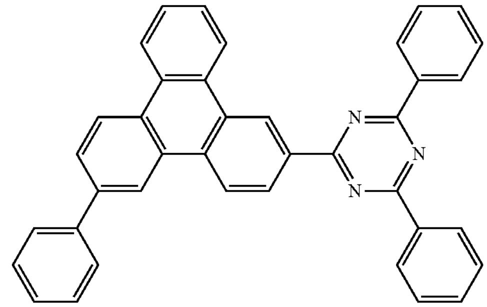
A-101
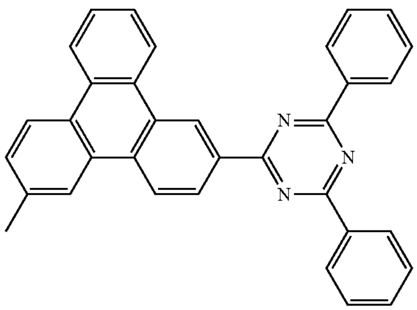
A-102
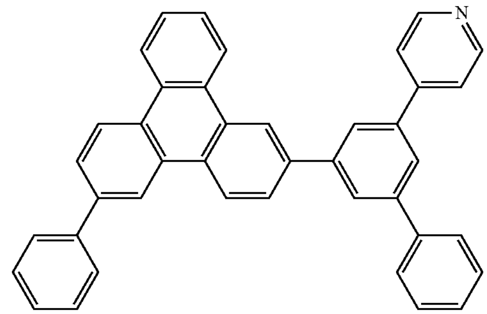
A-103
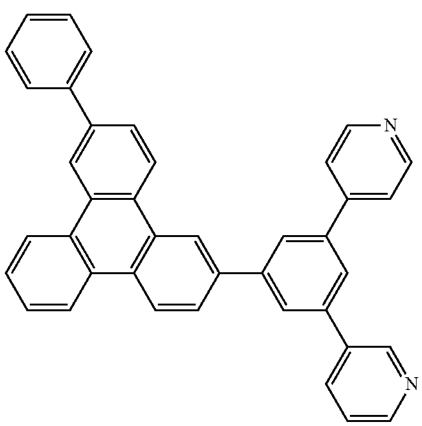
A-104
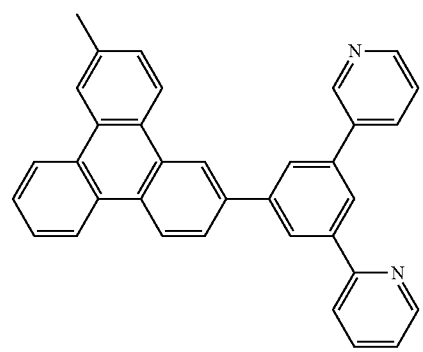
A-105
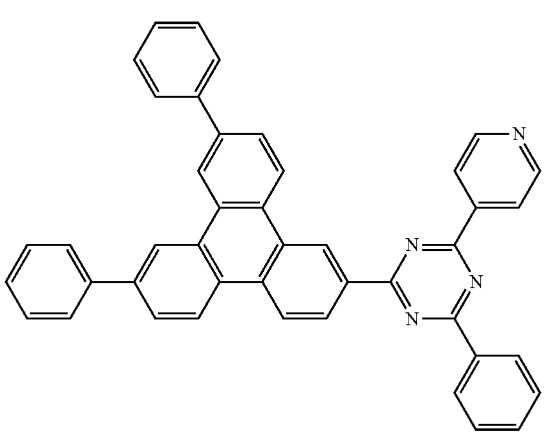
A-106
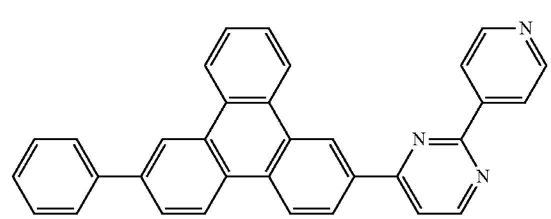

-continued
A-107
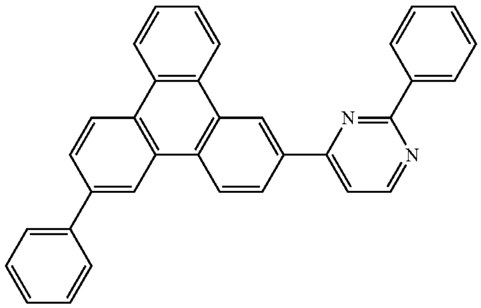
A-108
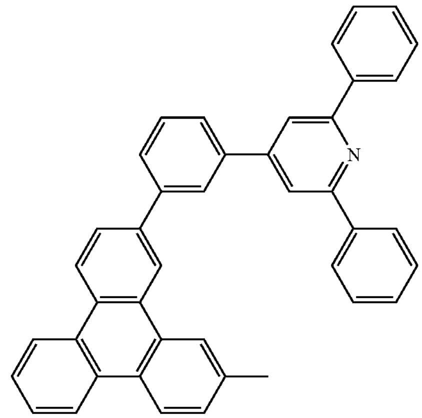
A-109
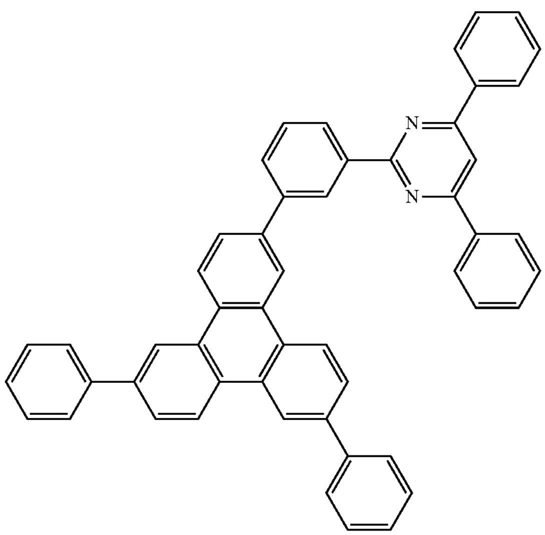
A-110
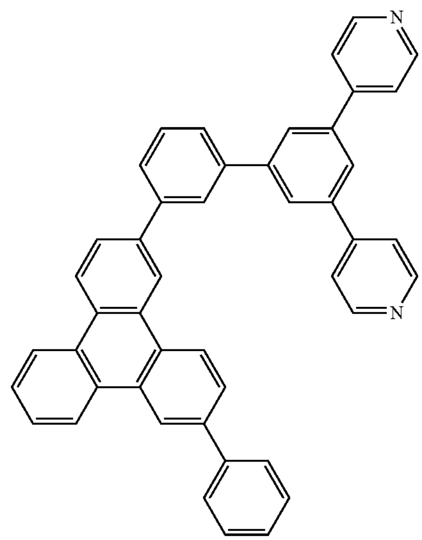
A-111
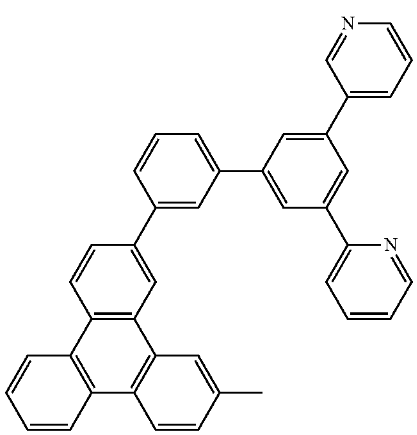
A-112
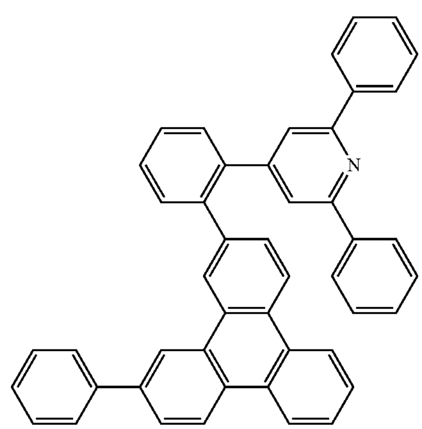

-continued
A-113
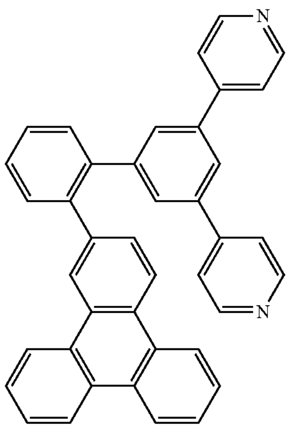
A-114
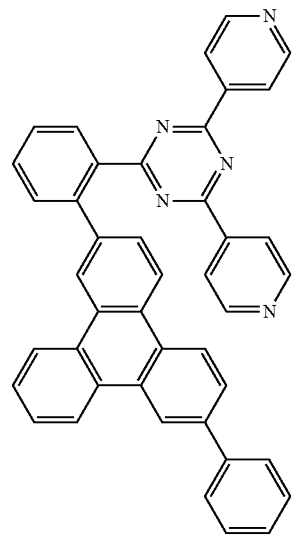
A-115
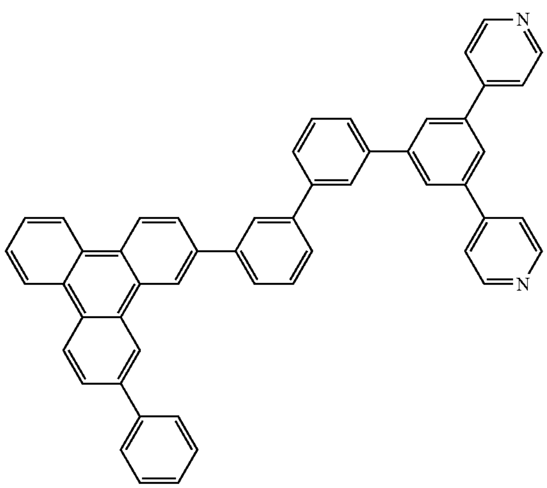
A-116
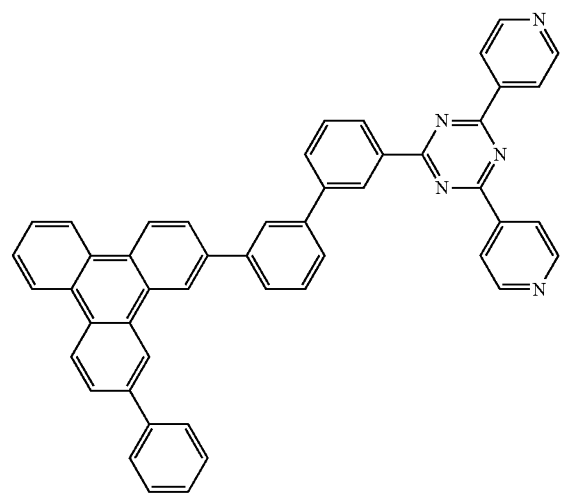
A-117
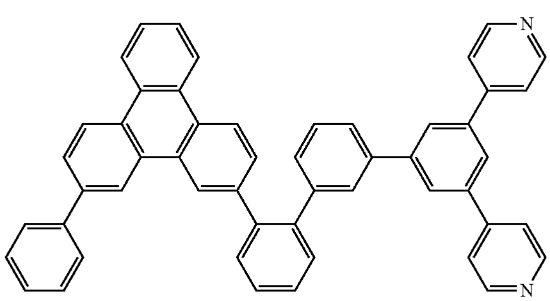
A-118
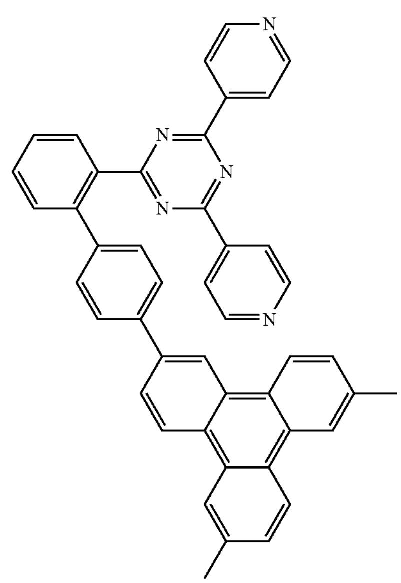

-continued
A-119
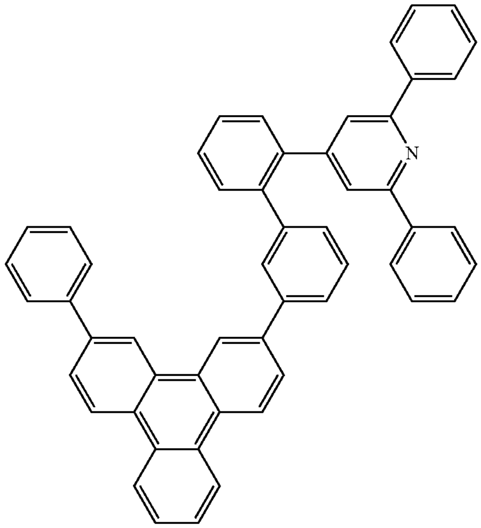
A-120
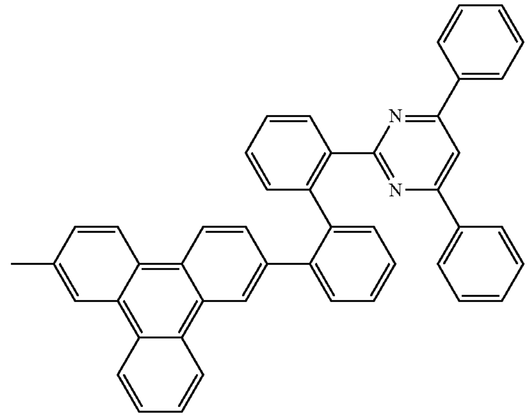
A-121
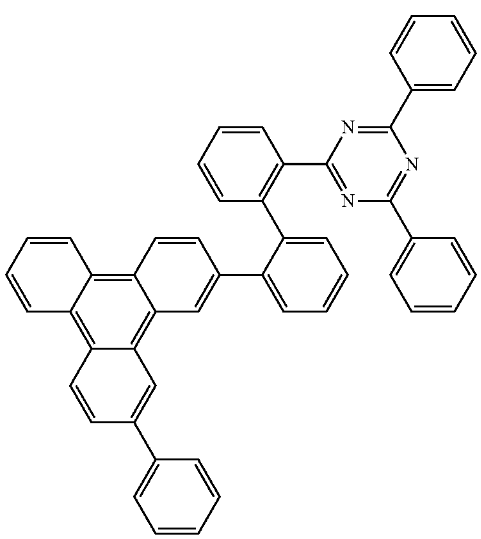
A-122
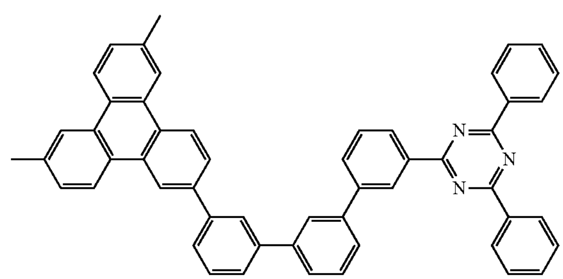

-continued
A-123
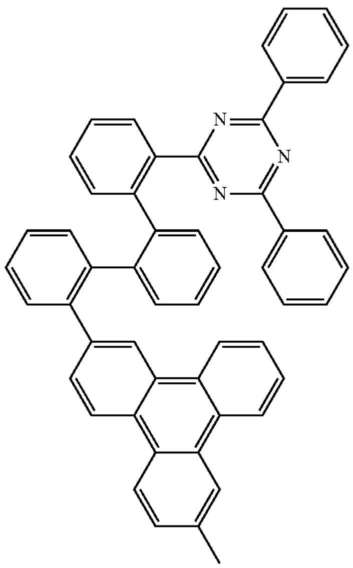
A-124
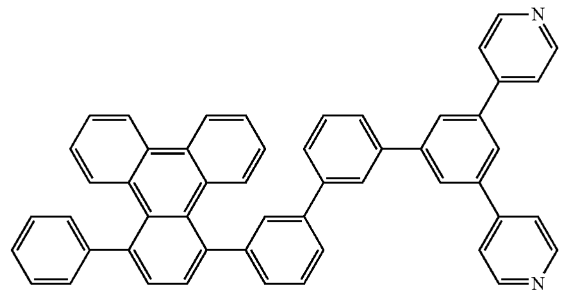
A-125
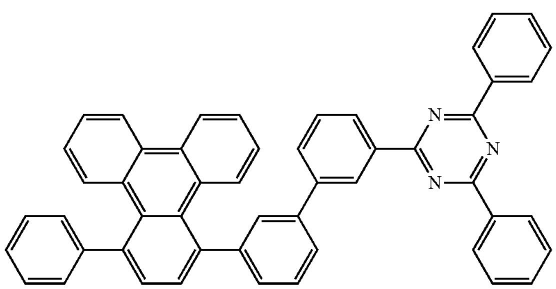
A(1)
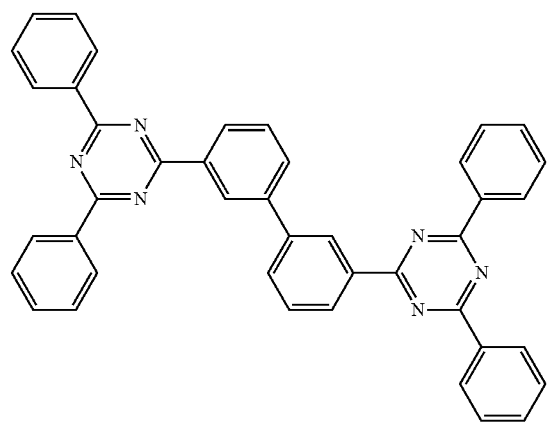
A(2)
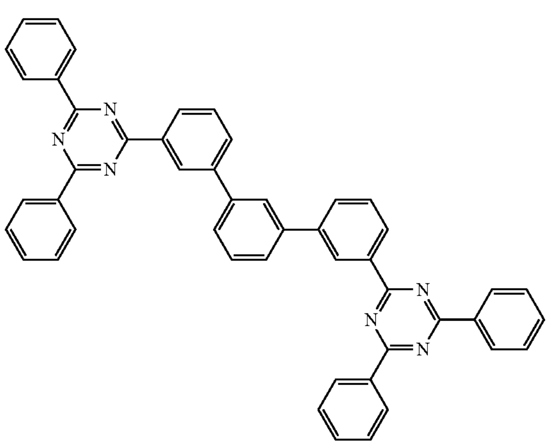
A(3)
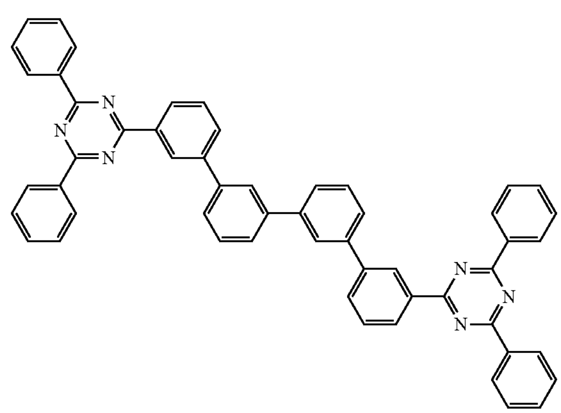

-continued
A(4)
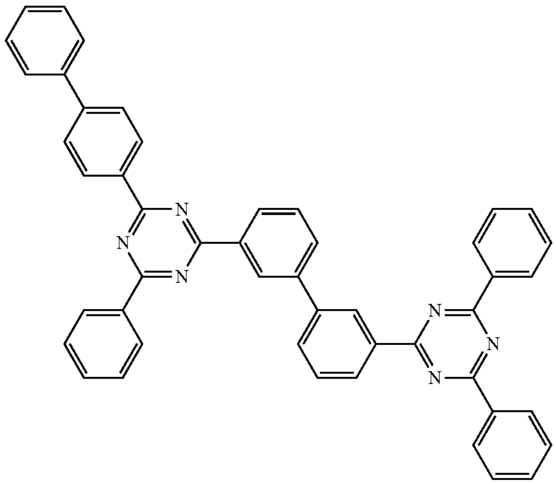
A(5)
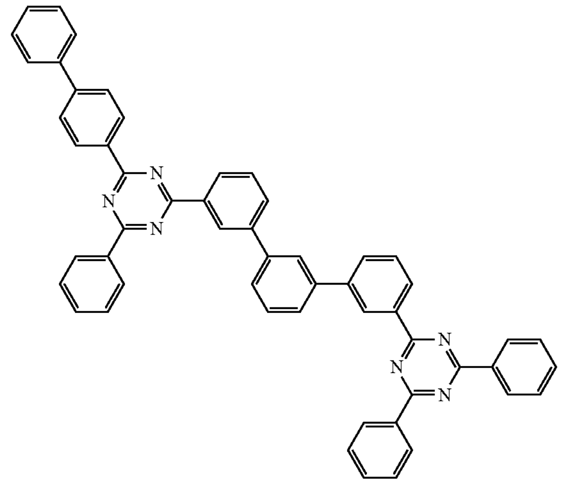
A(6)
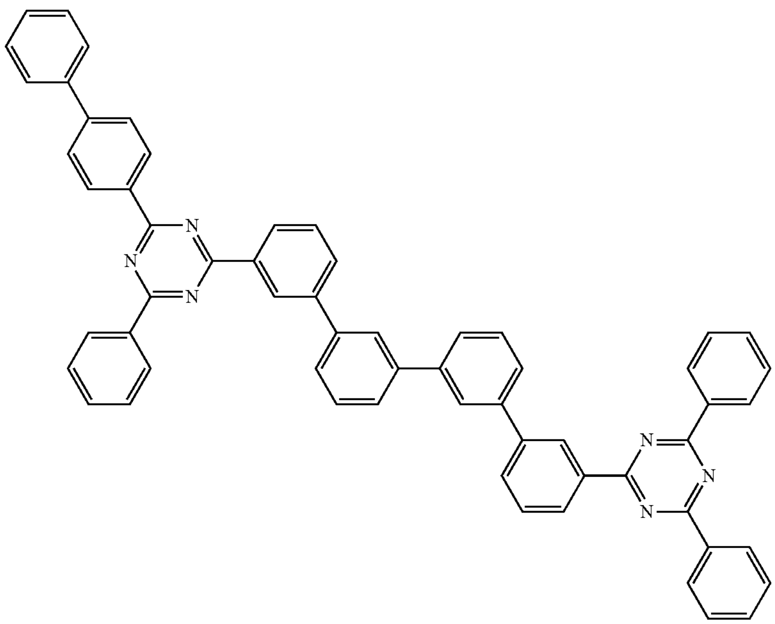
A(7)
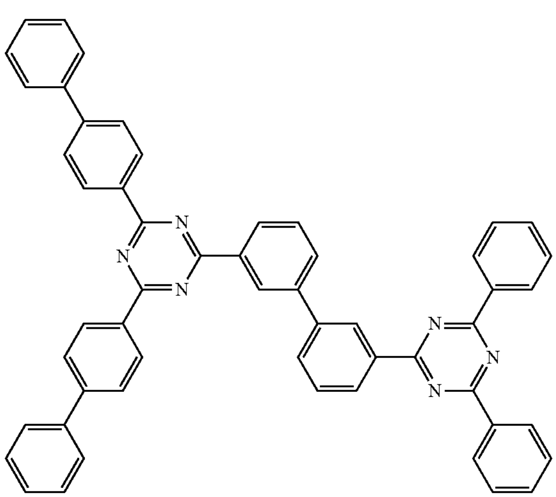
A(8)
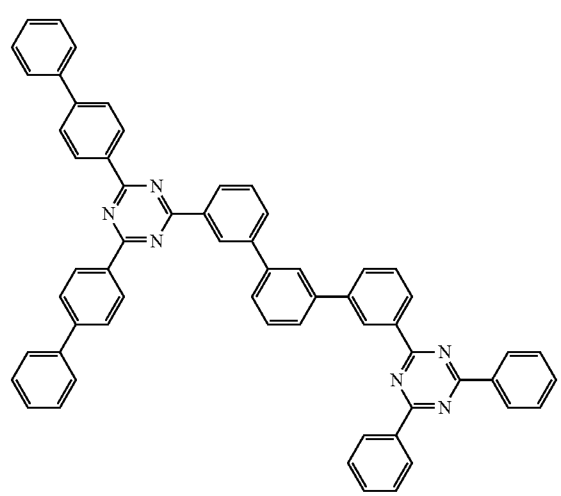

-continued
A(9)
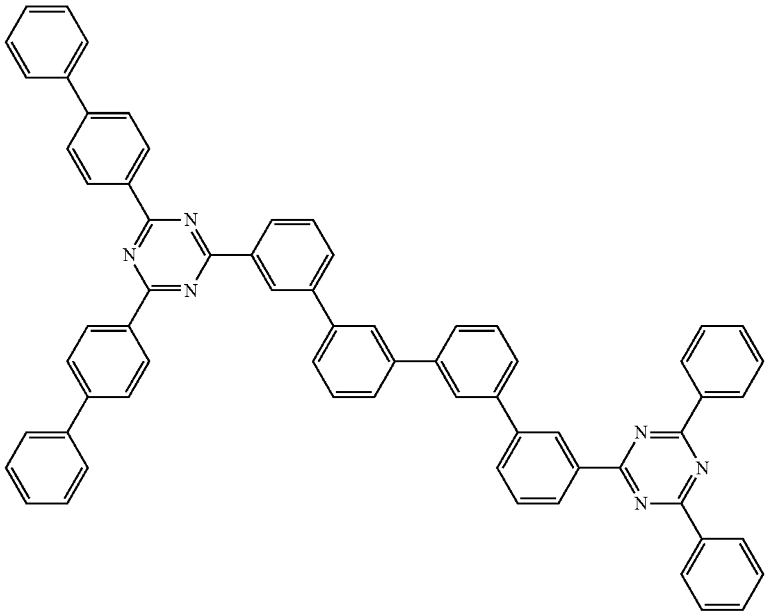
A(10)
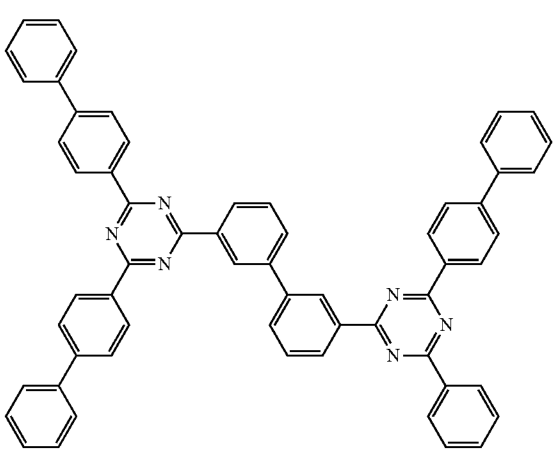
A(11)
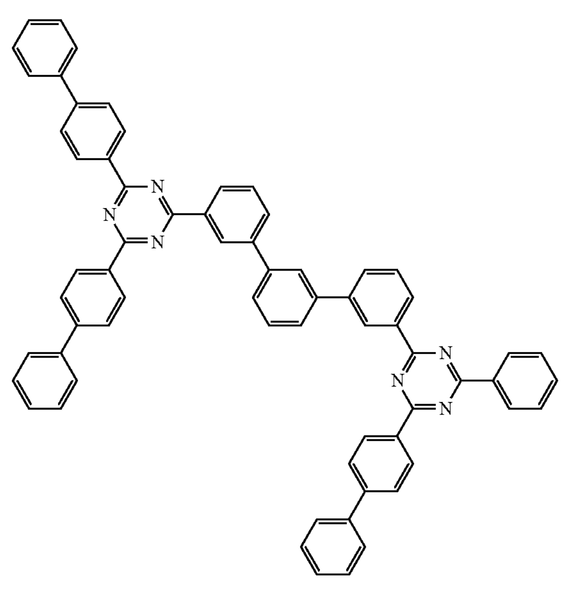

-continued
A(12)
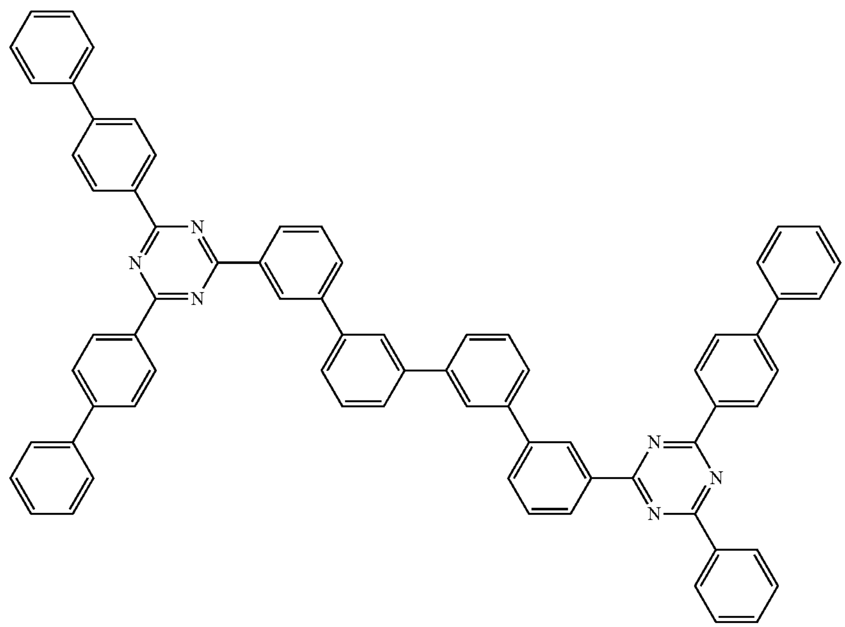
A(13)
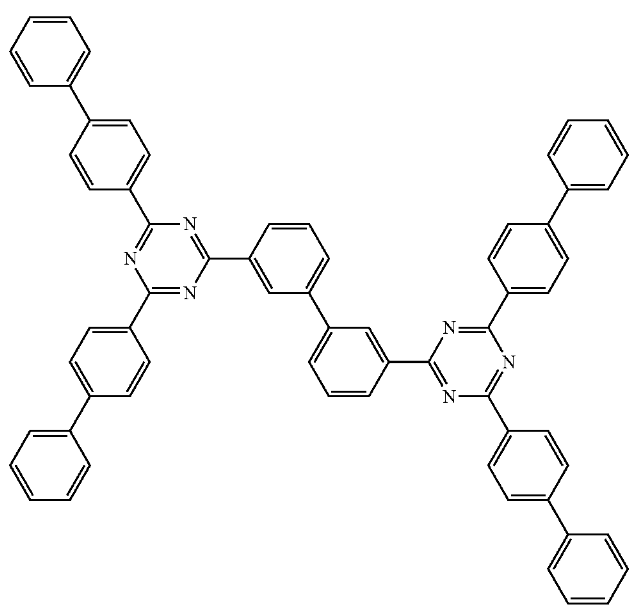

-continued
A(14)
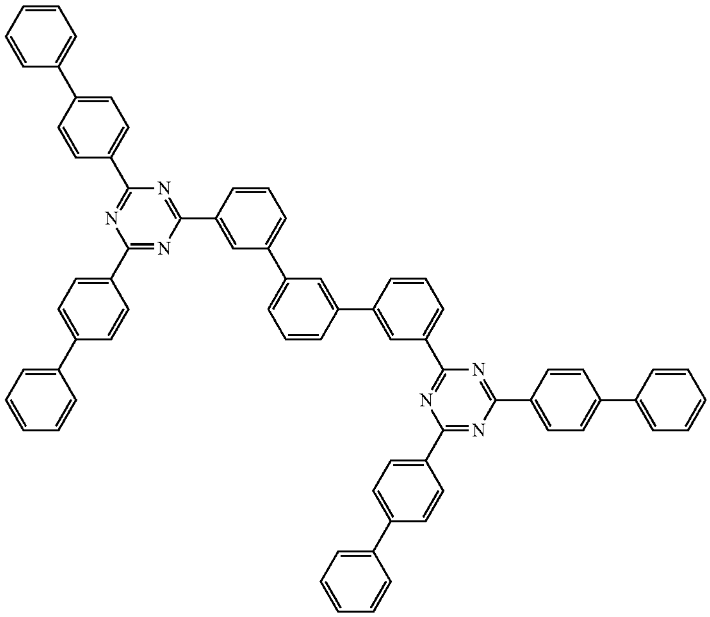
A(15)
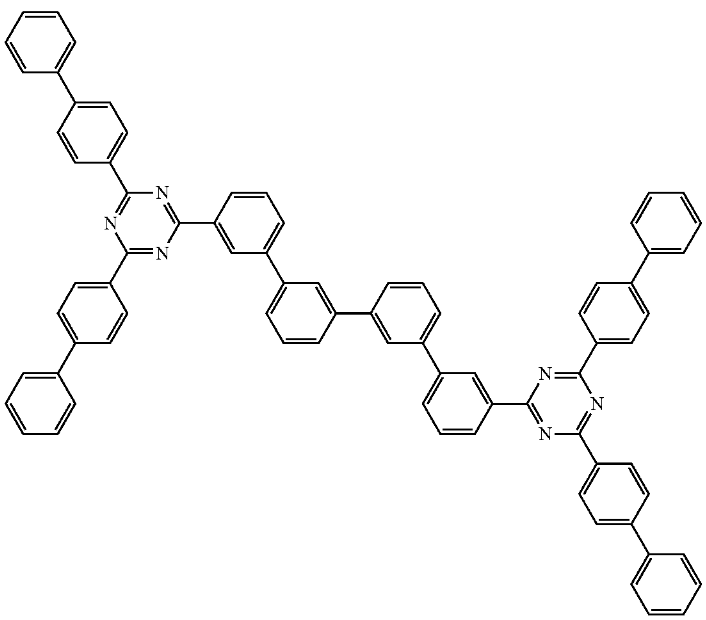
A(16)
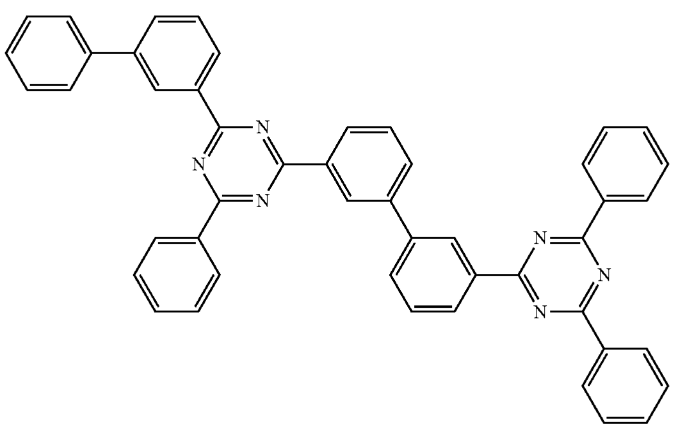

-continued
A(17)
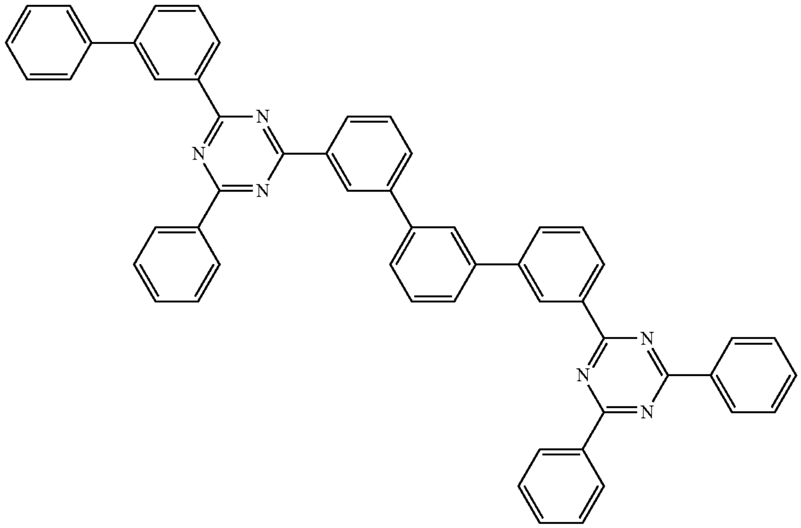
A(18)
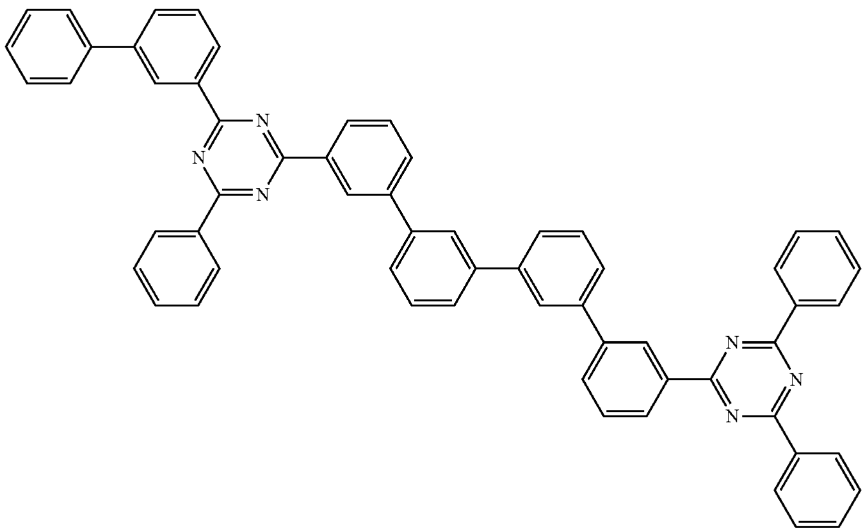
A(19)
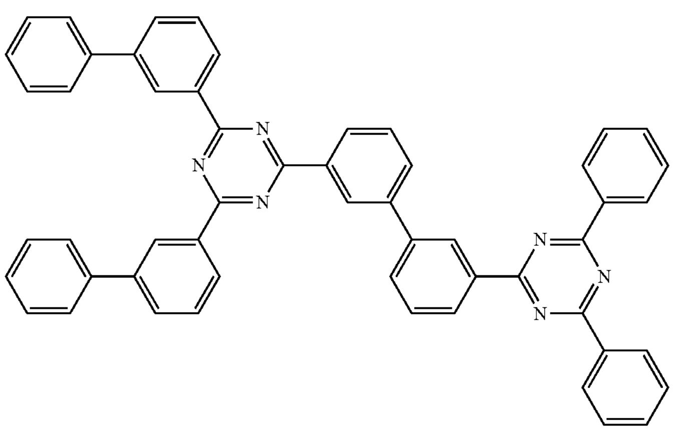

-continued
A(20)
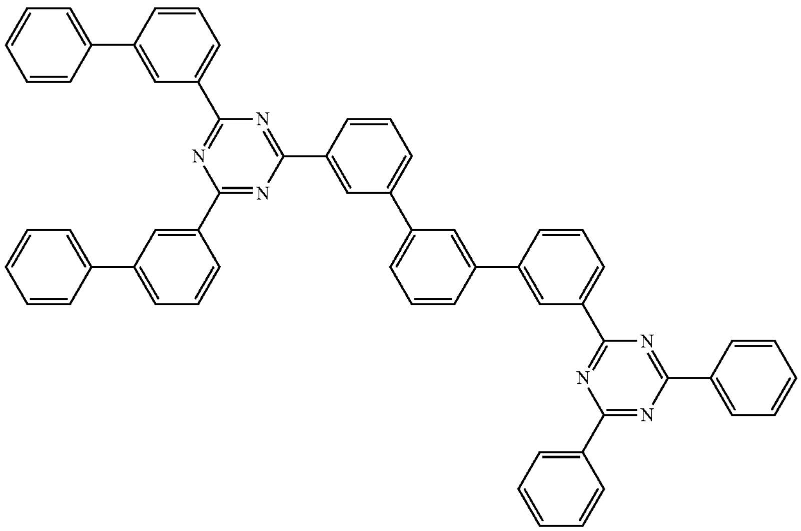
A(21)
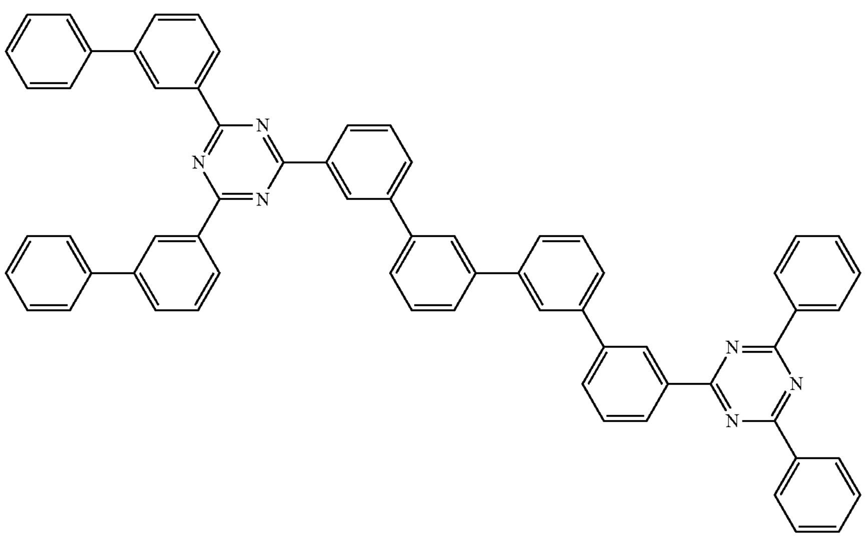
A(22)
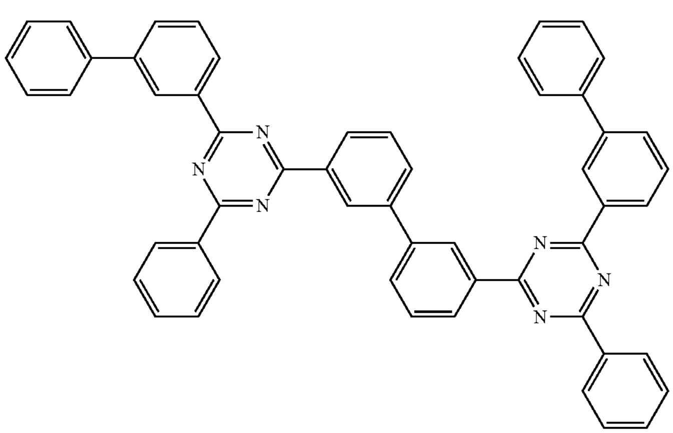

-continued
A(23)
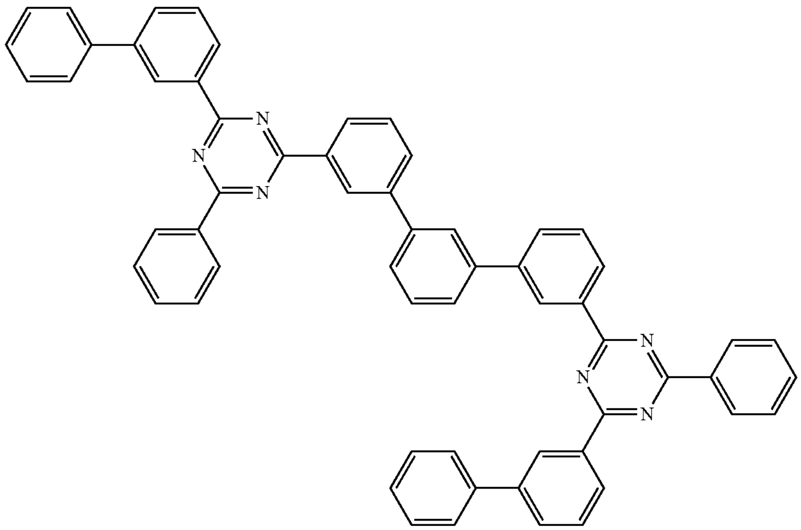
A(24)
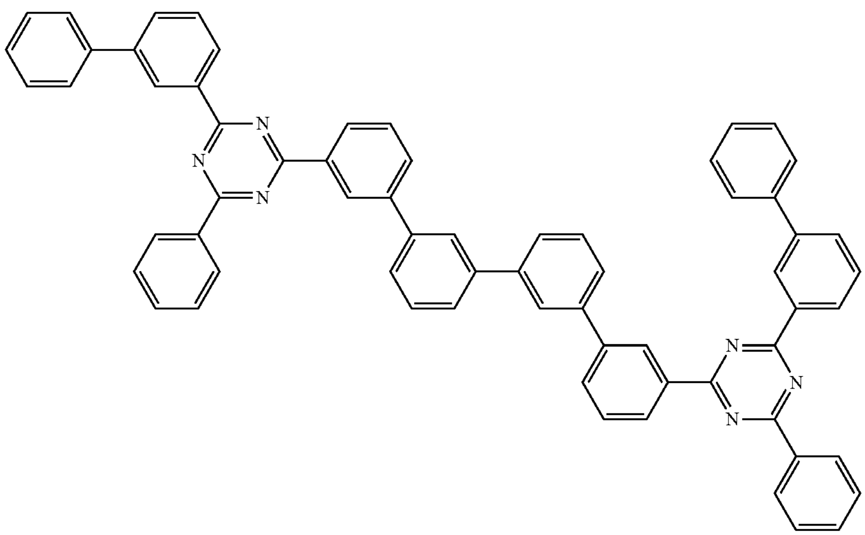
A(25)
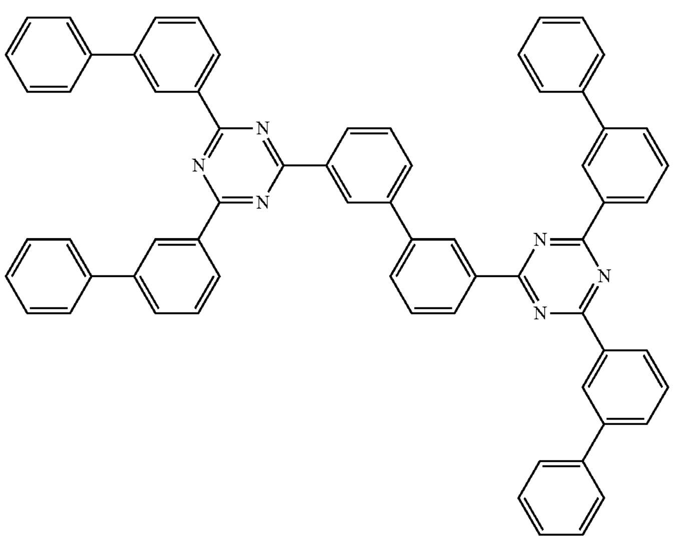

-continued
A(26)
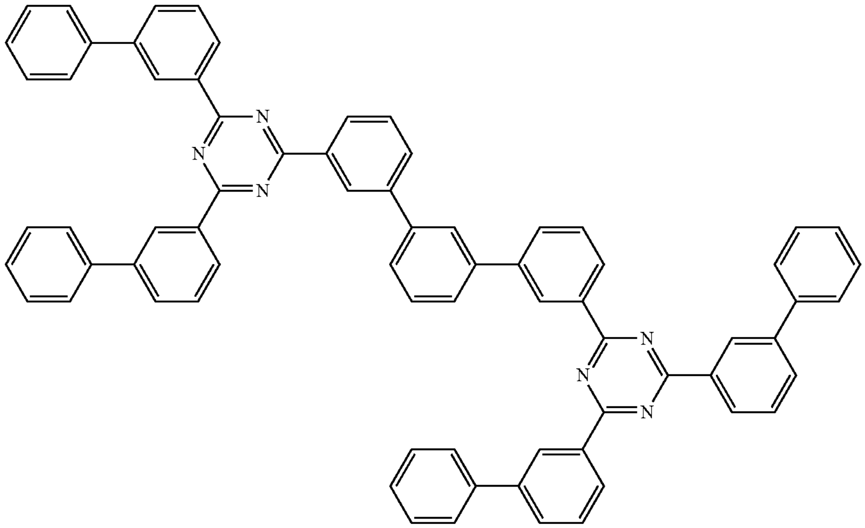
A(27)
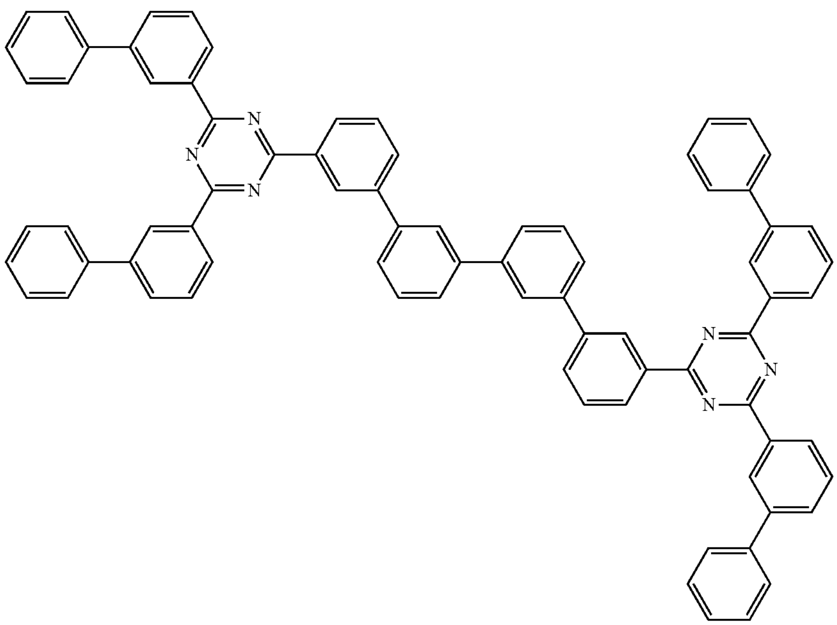
A(28)
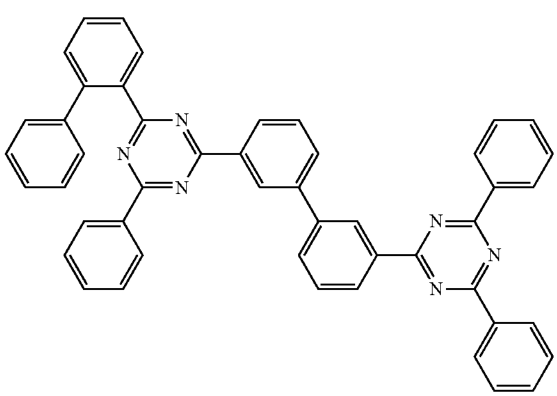
A(29)
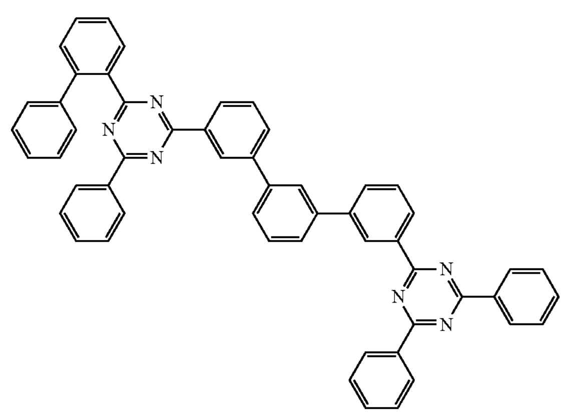

-continued
A(30)
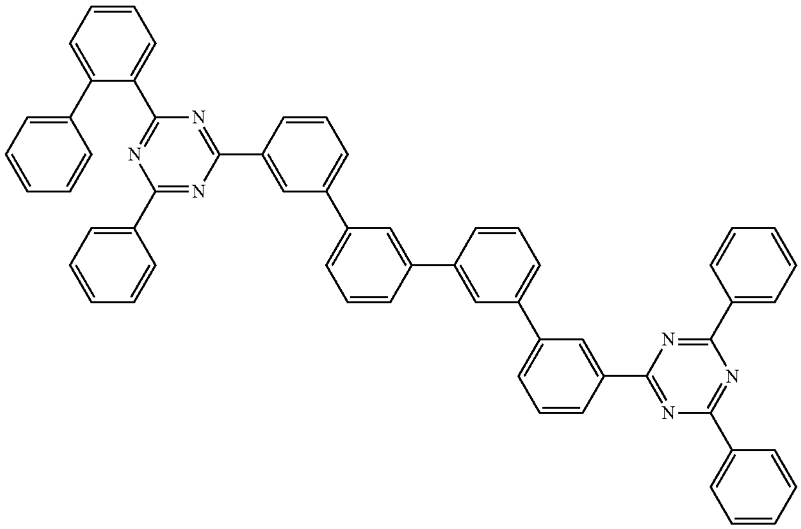
A(31)
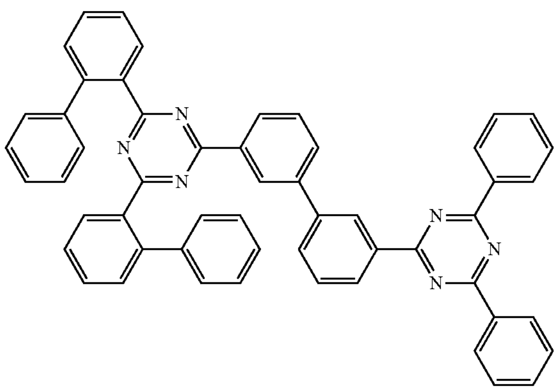
A(32)
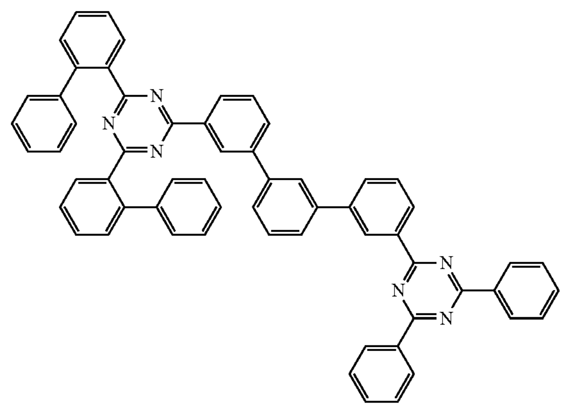
A(33)
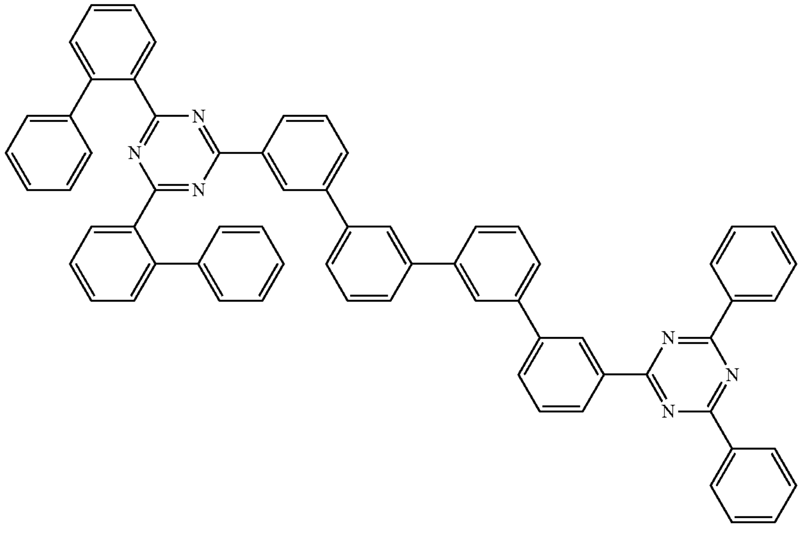

-continued
A(34)
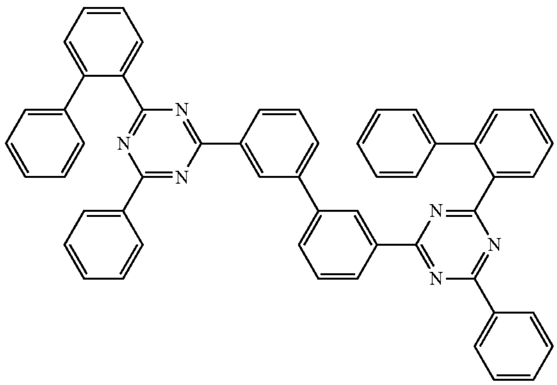
A(35)
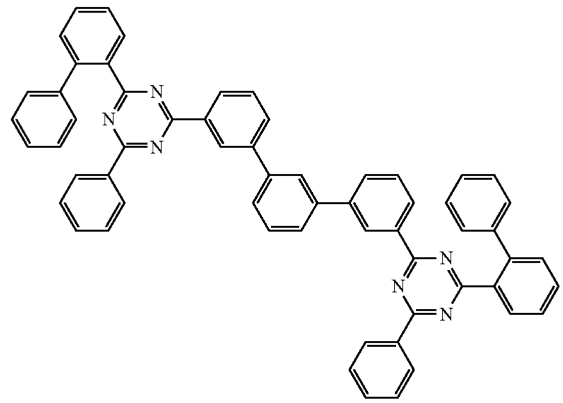
A(36)
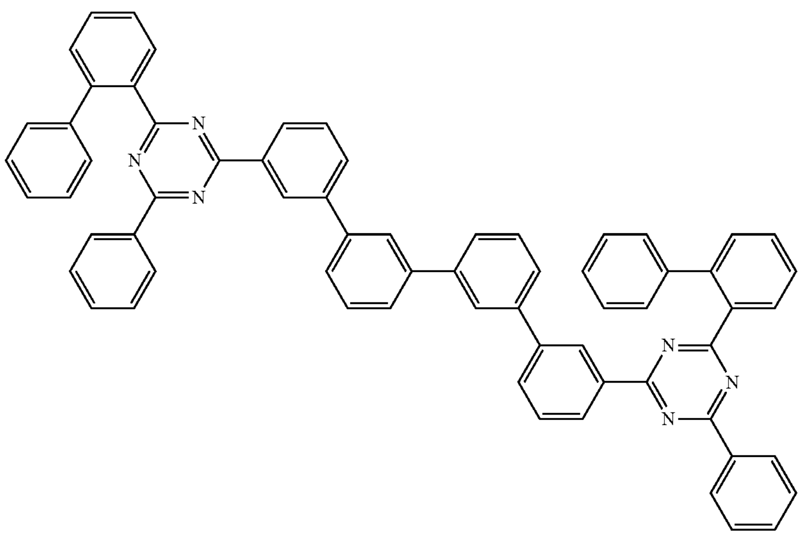
A(37)
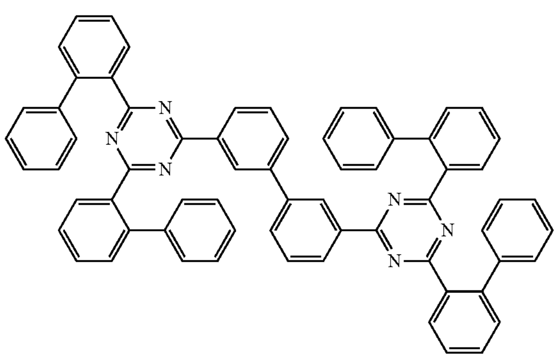
A(38)
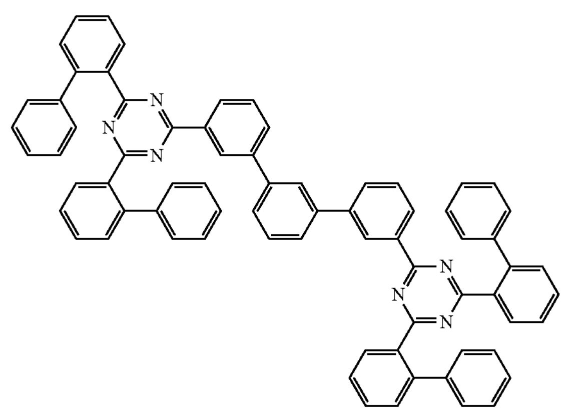

-continued
A(39)
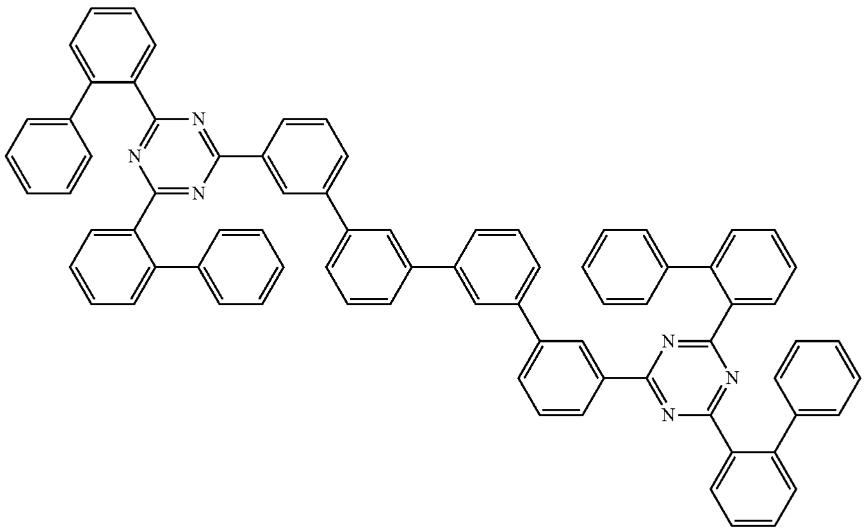
A(40)
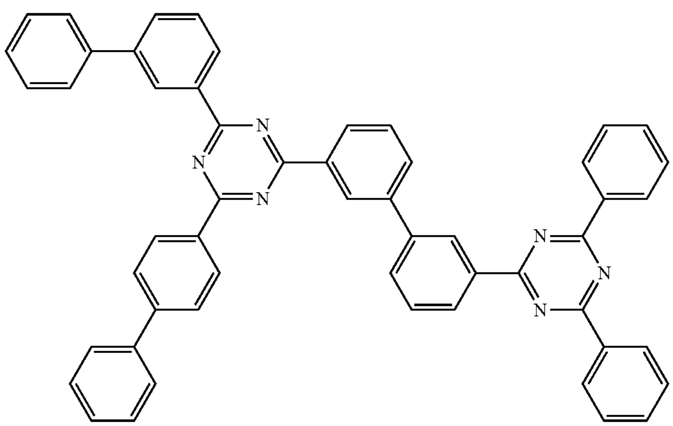
A(41)
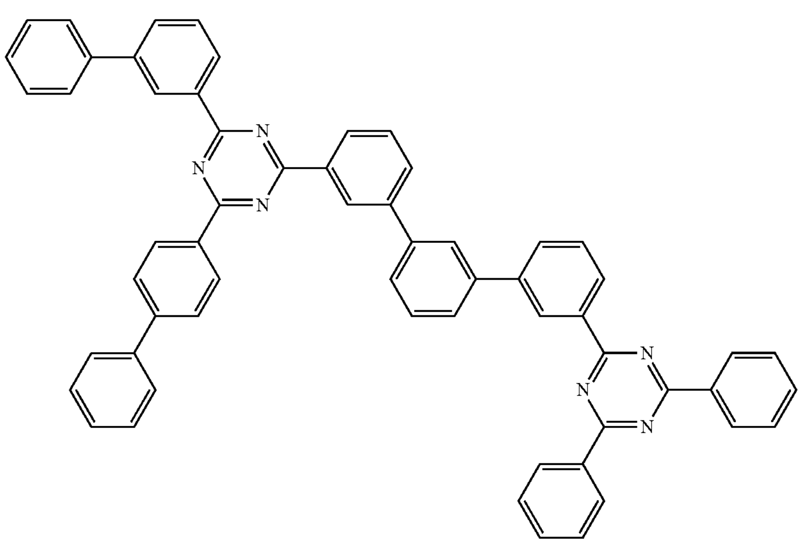

-continued
A(42)
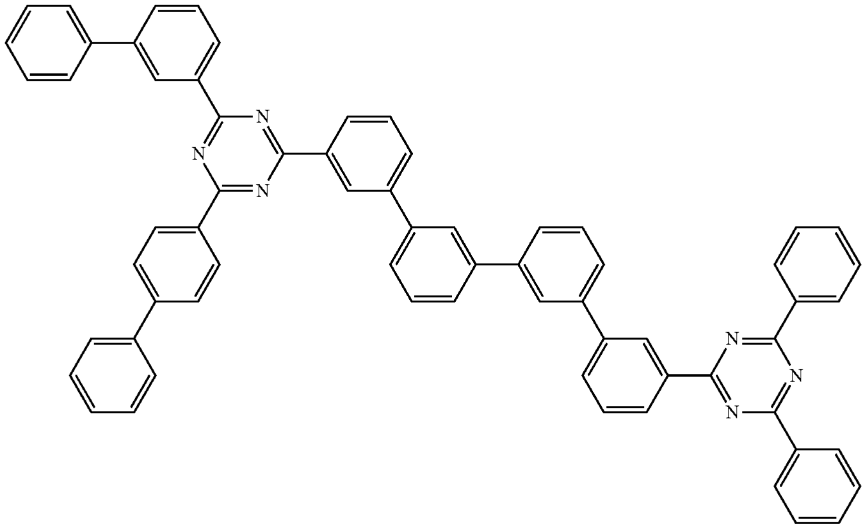
A(43)
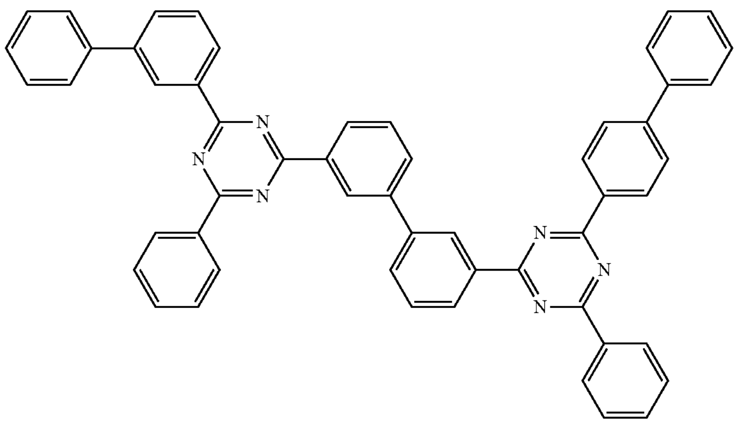
A(44)
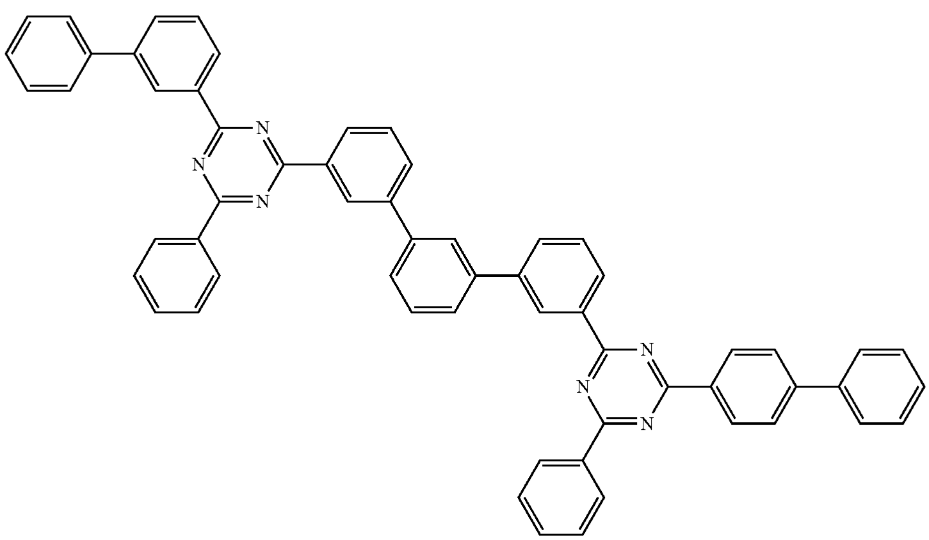

-continued
A(45)
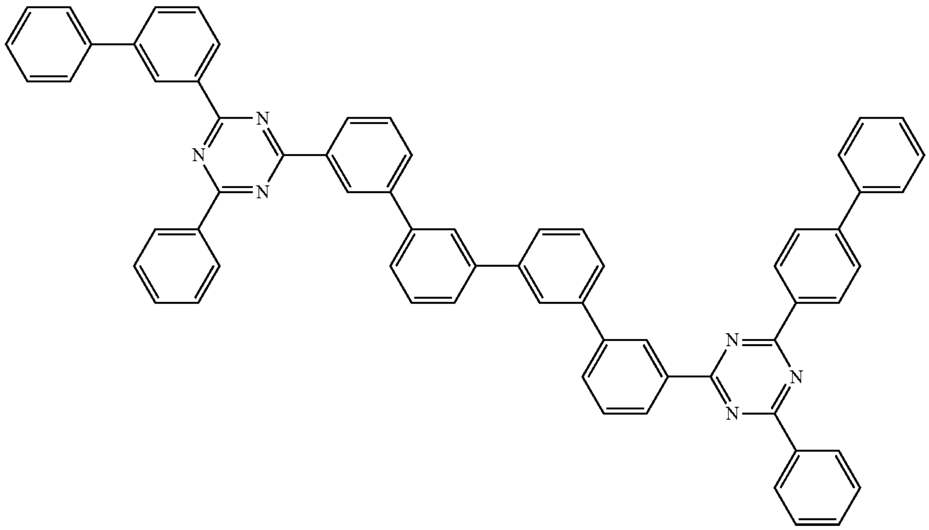
A(46)
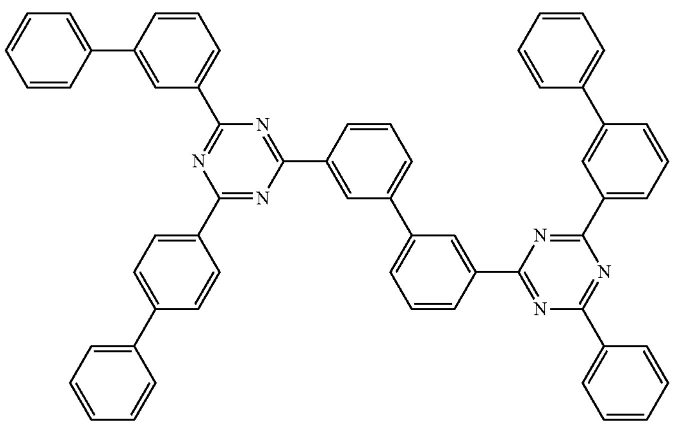
A(47)
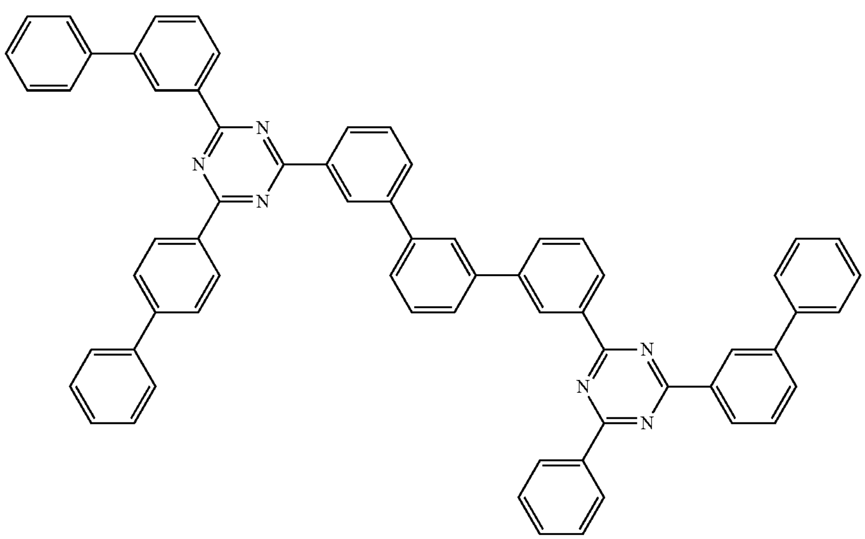

-continued
A(48)
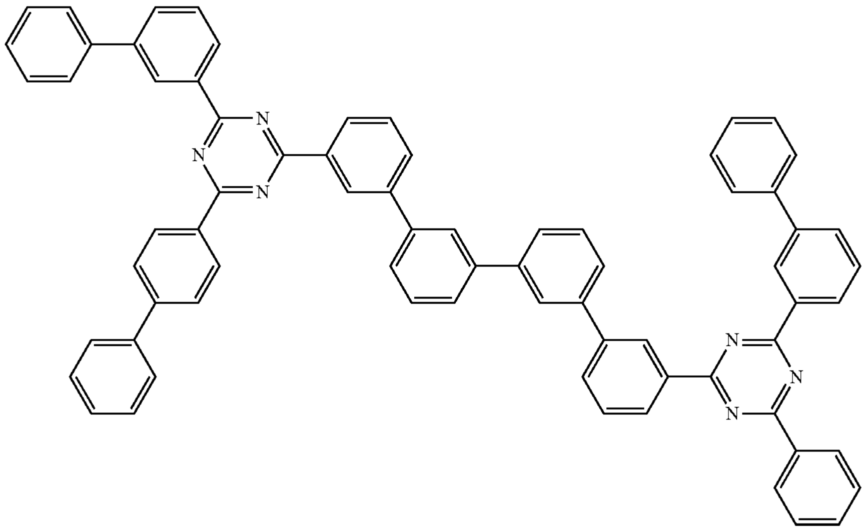
A(49)
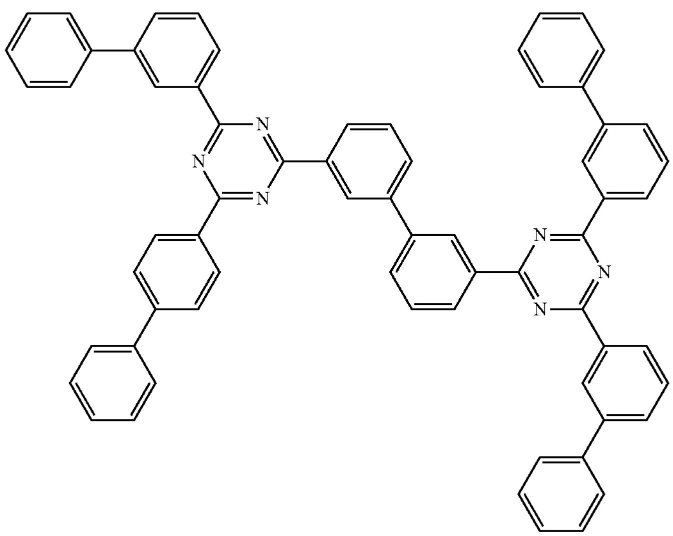
A(50)
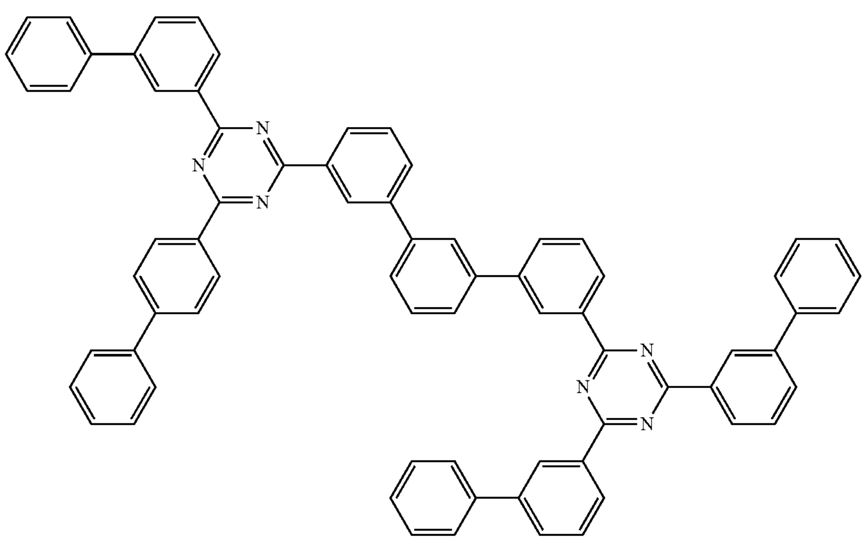

-continued
A(51)
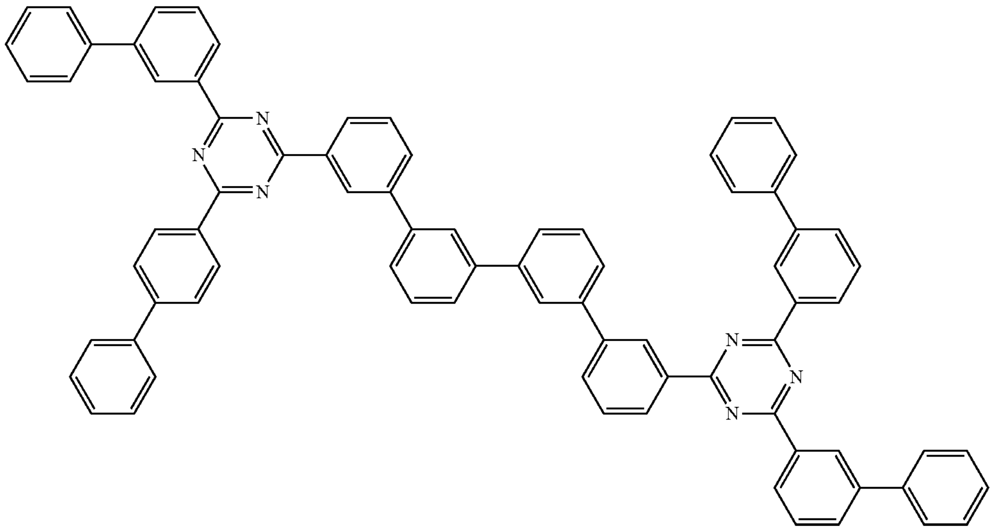
A(52)
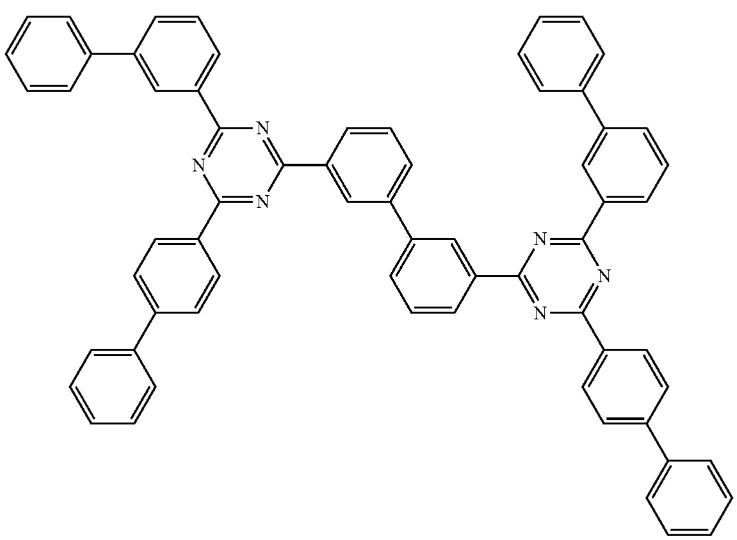

-continued
A(53)
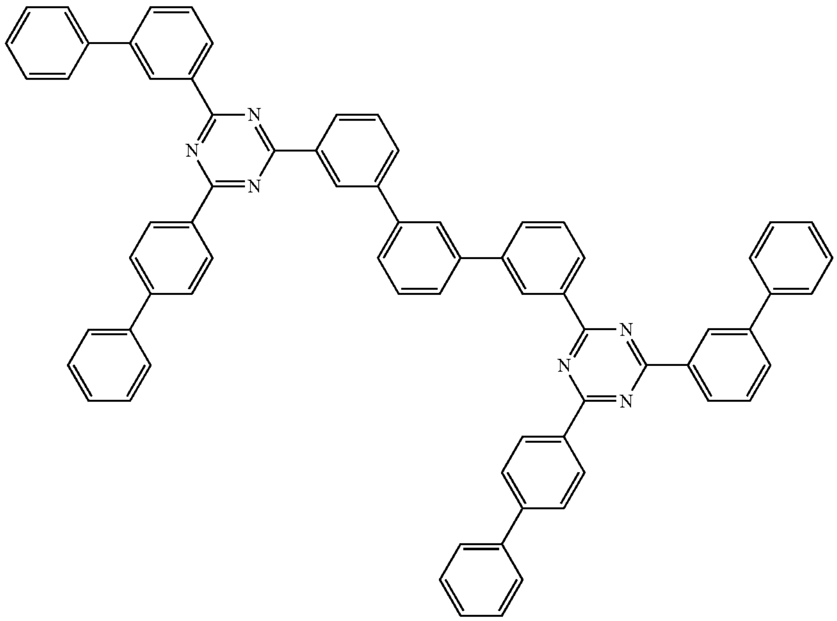
A(54)
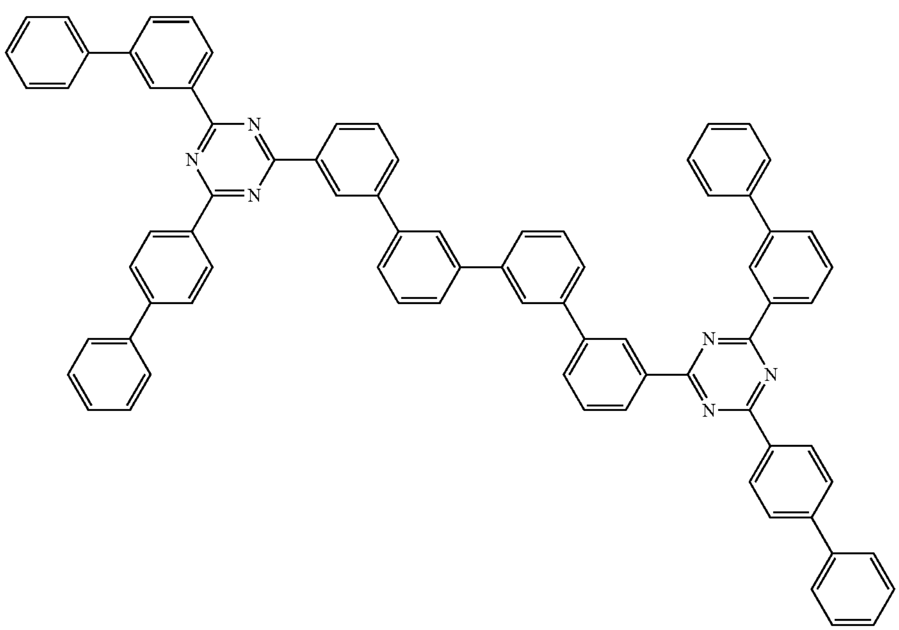

-continued
A(55)
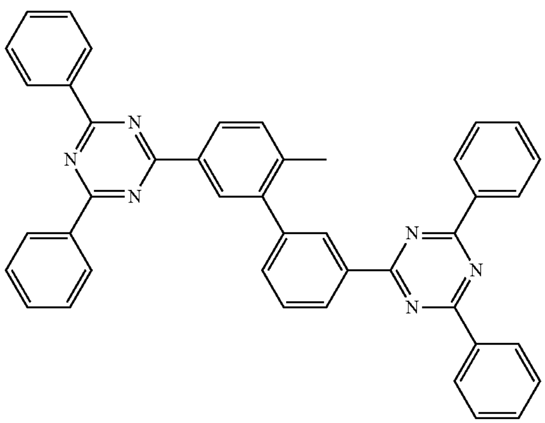
A(56)
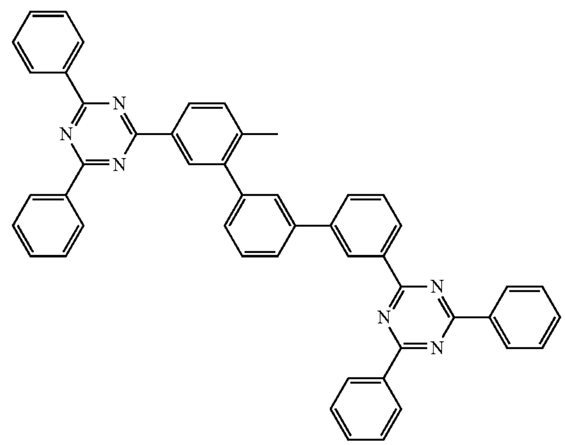
A(57)
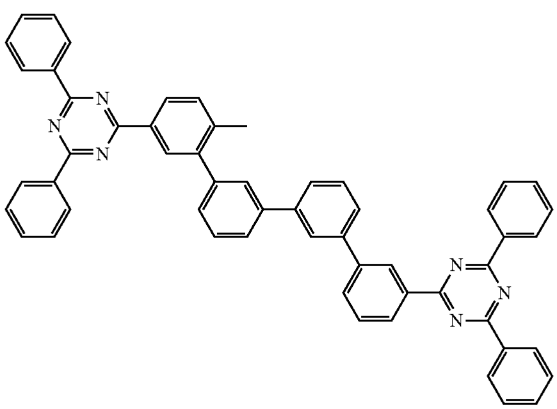
A(58)
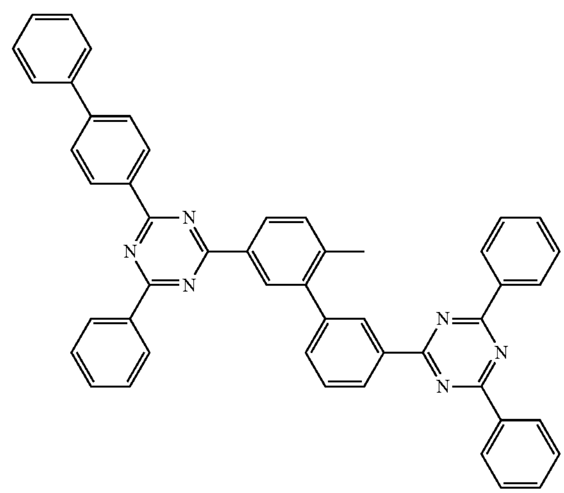
A(59)
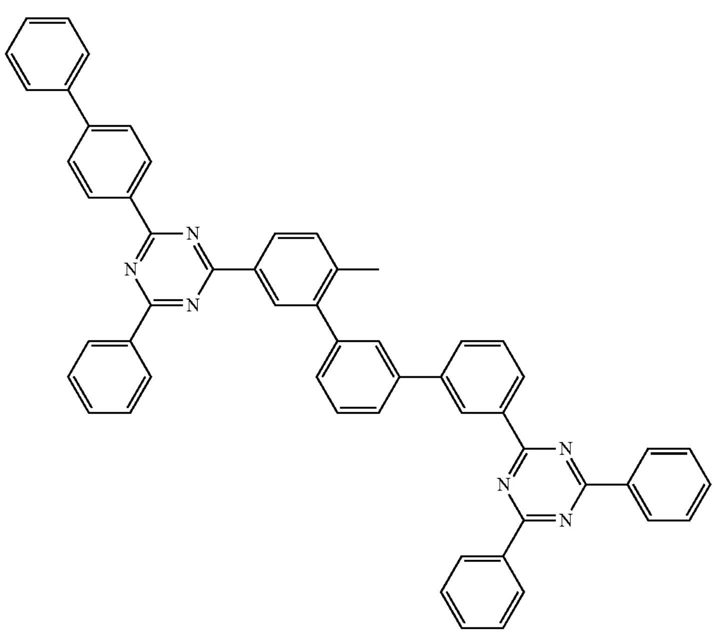

-continued
A(60)
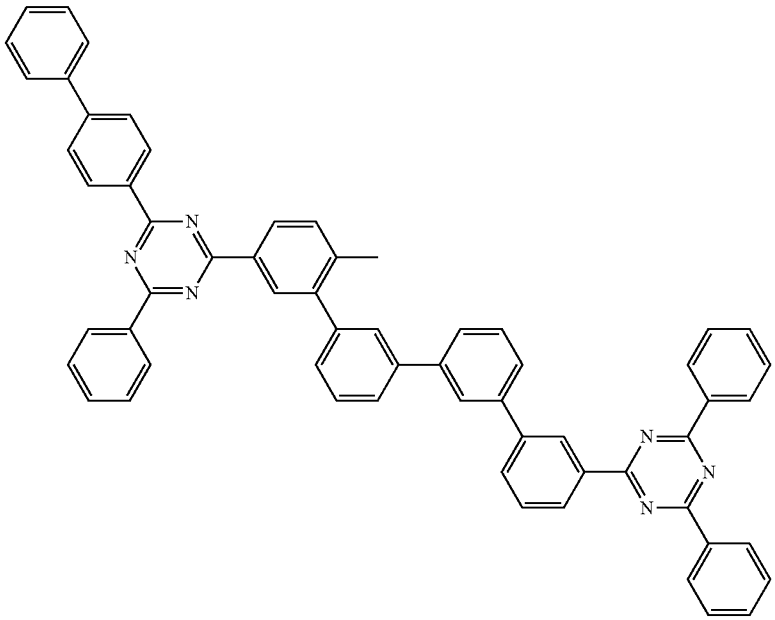
A(61)
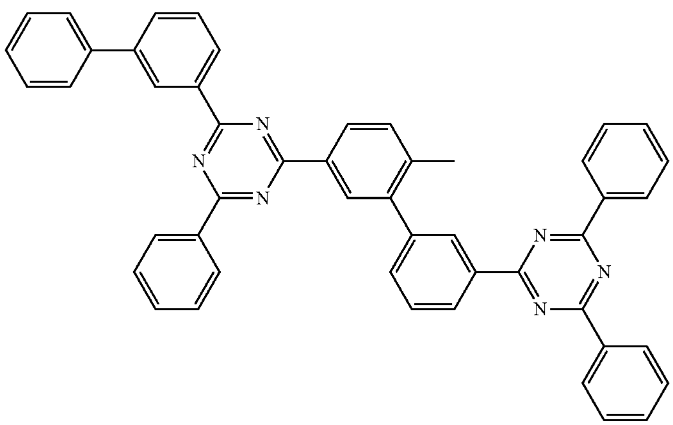
A(62)
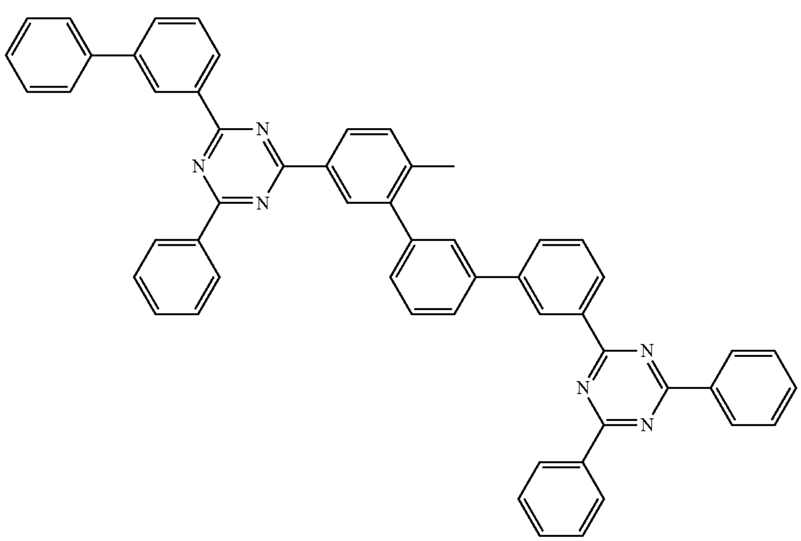

-continued
A(63)
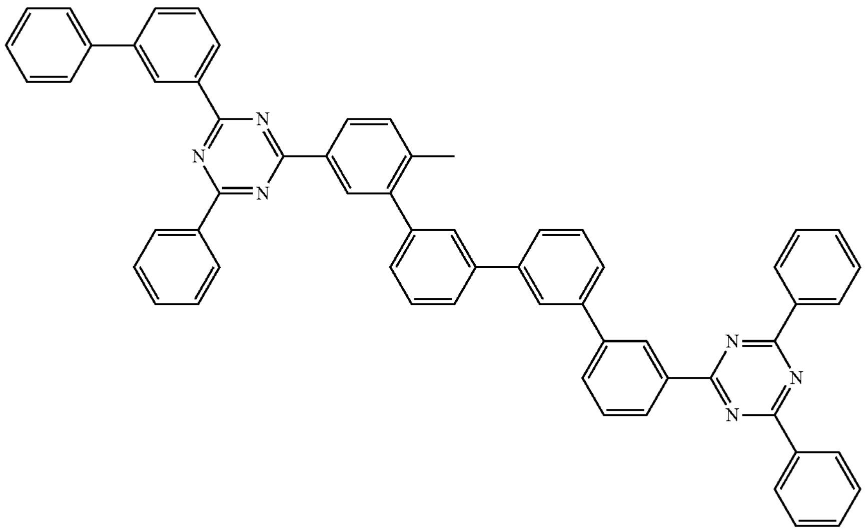
A(64)
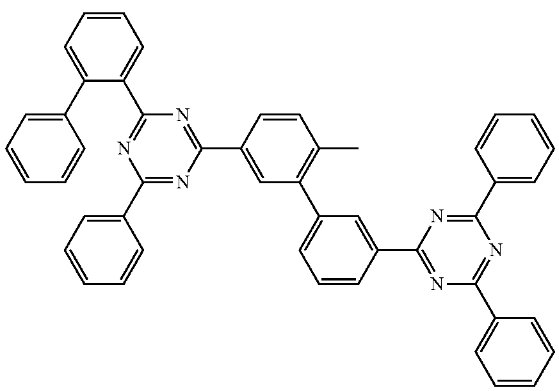
A(65)
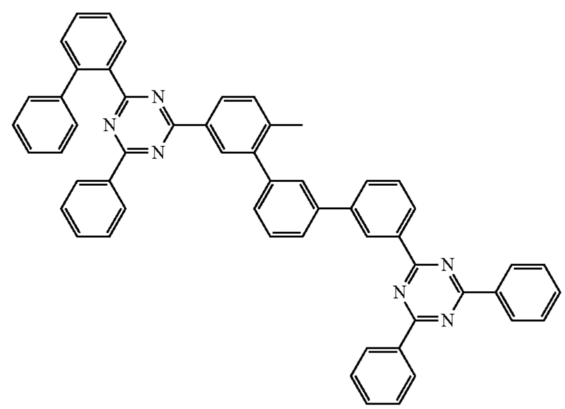
A(66)
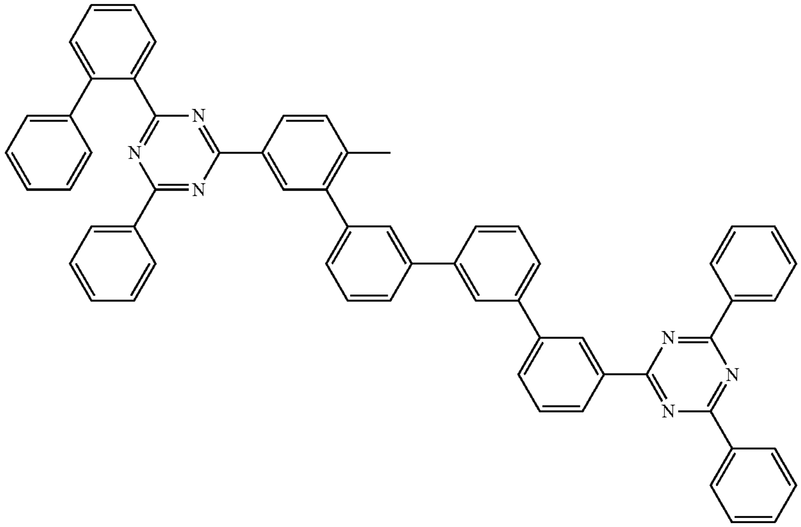

-continued
A(67)
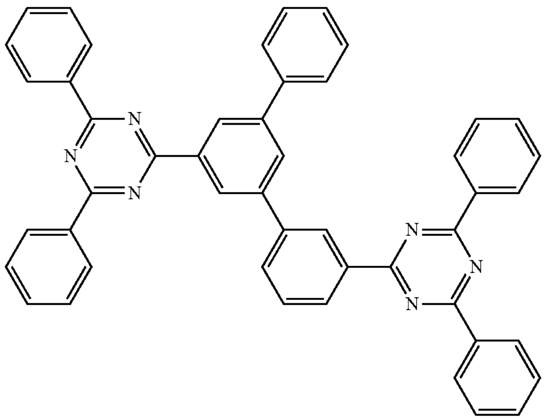
A(68)
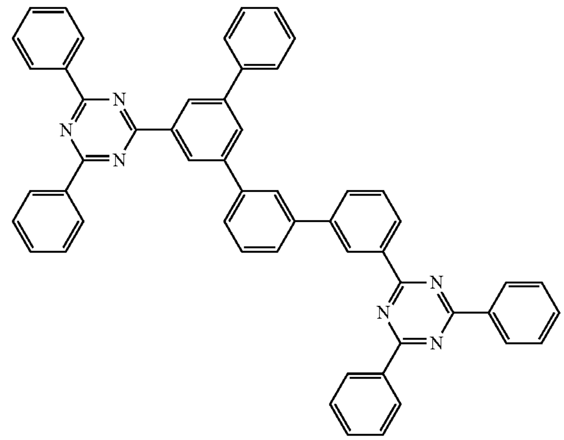
A(69)
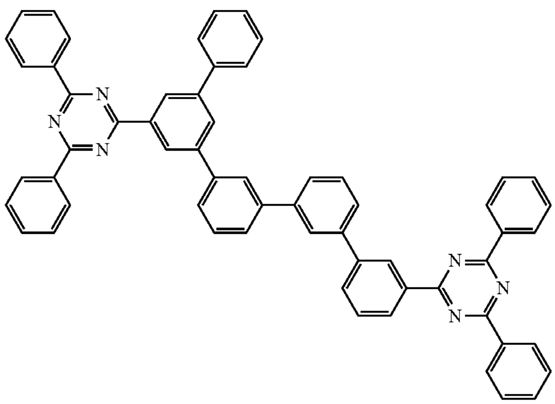
A(70)
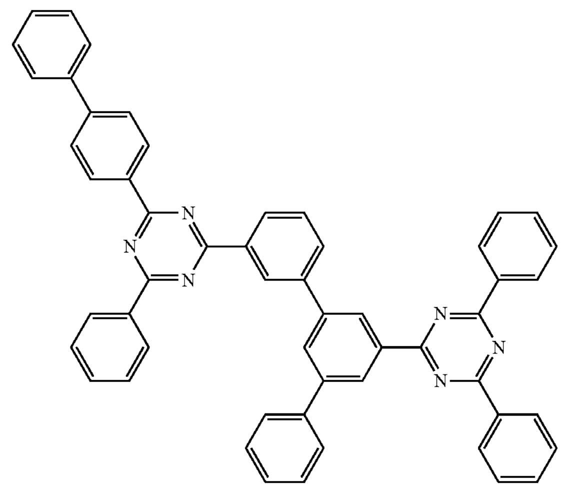
A(71)
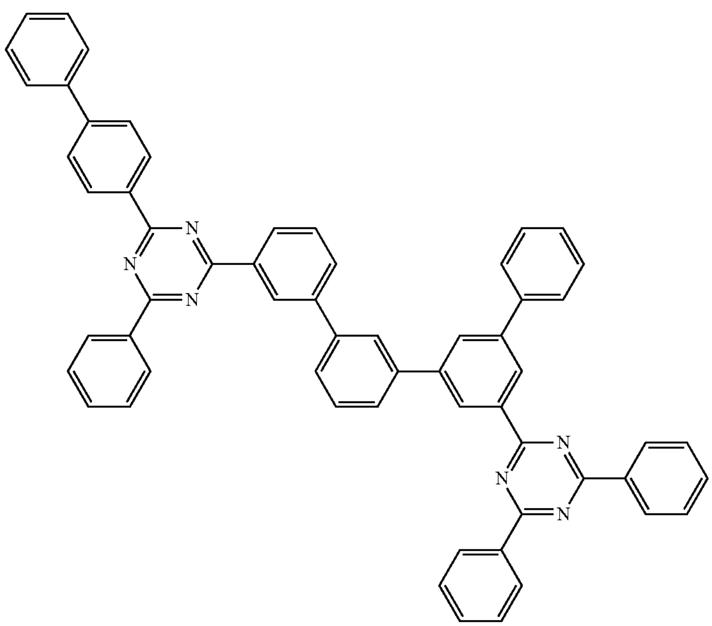

-continued
A(72)
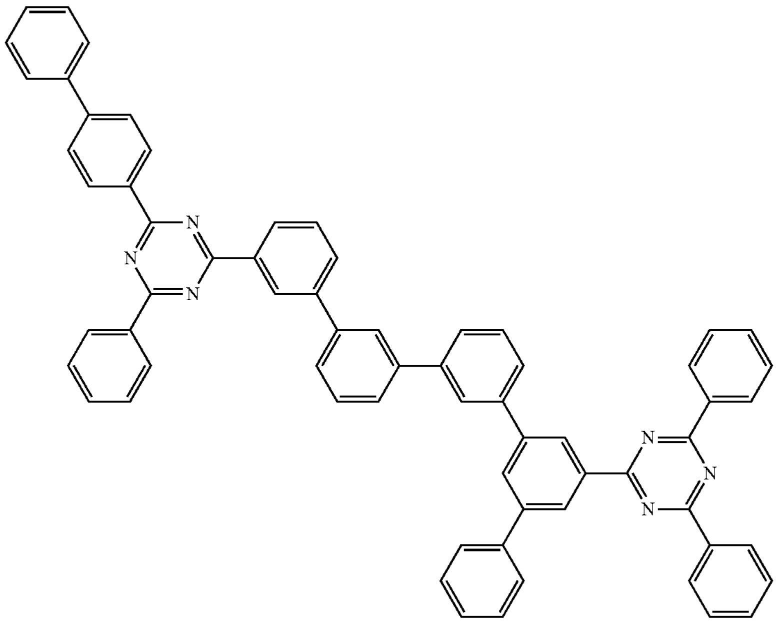
A(73)
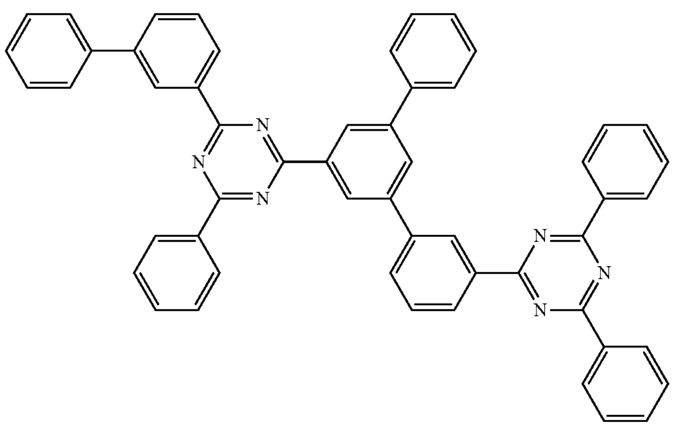
A(74)
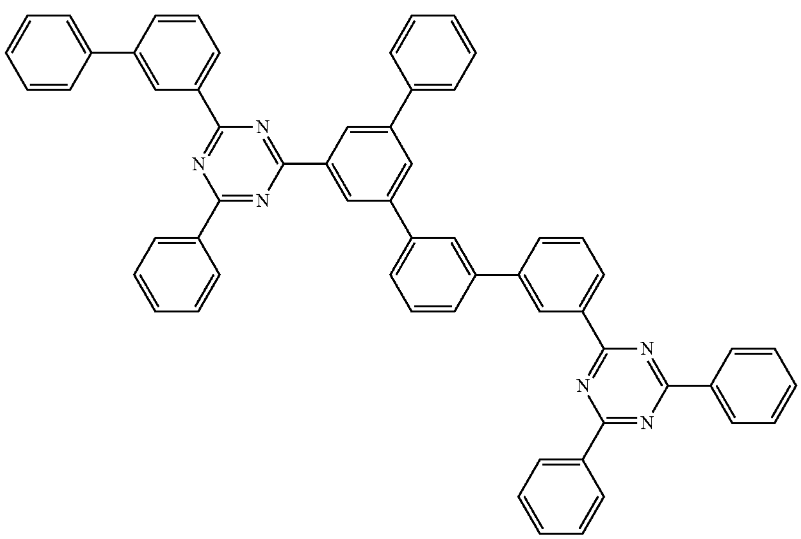

-continued
A(75)
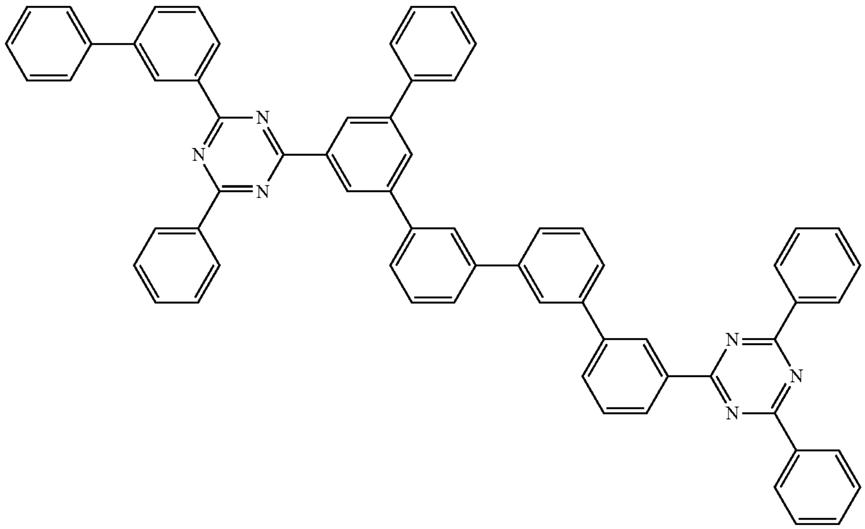
A(76)
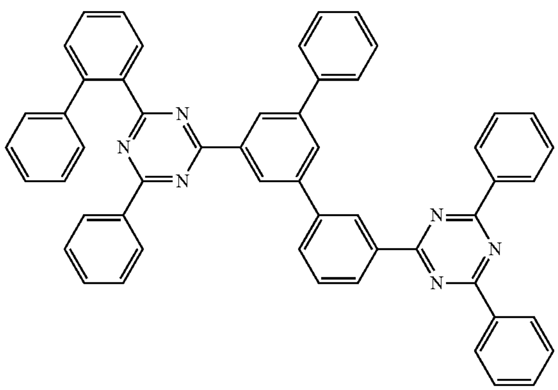
A(77)
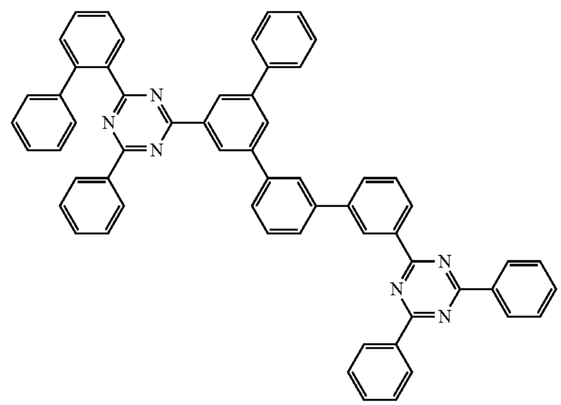
A(78)
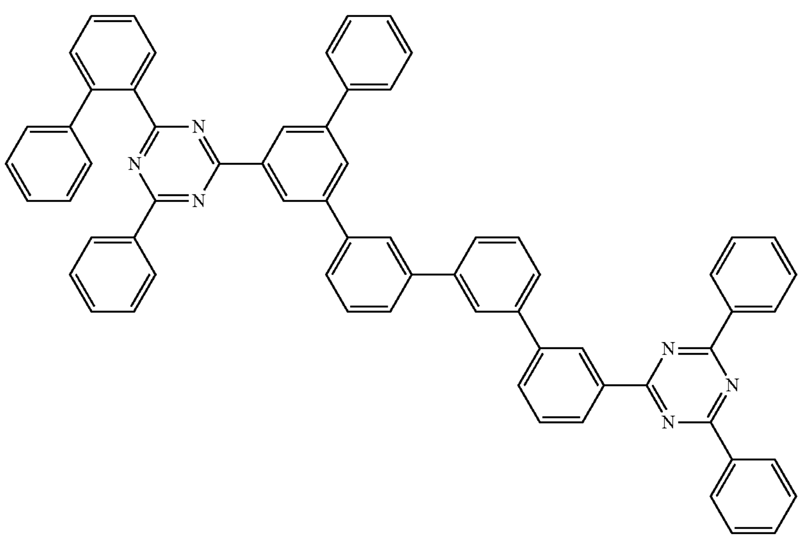

-continued
A(79)
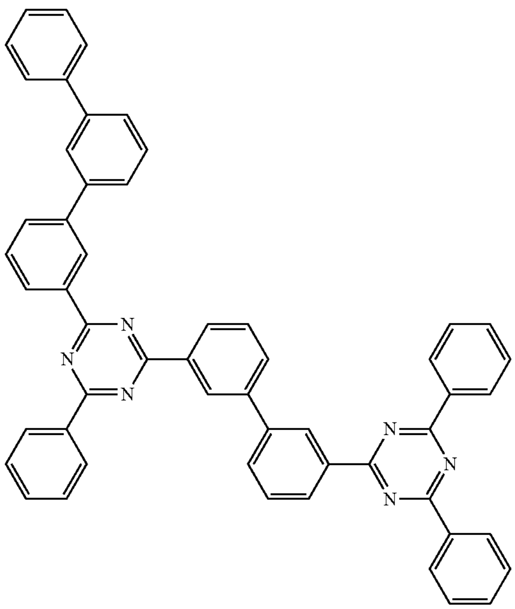
A(80)
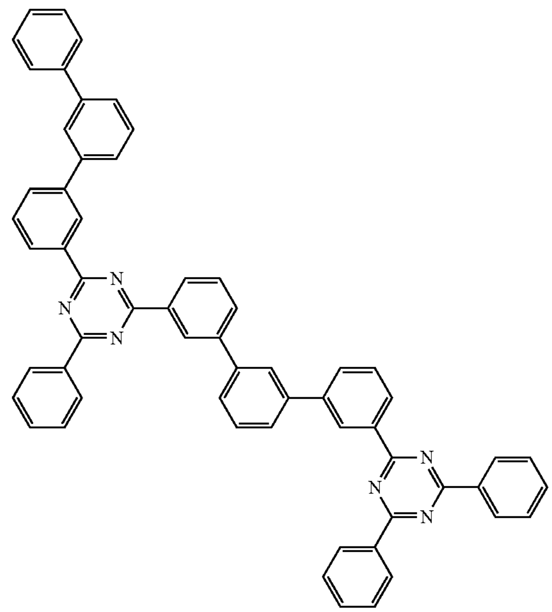
A(81)
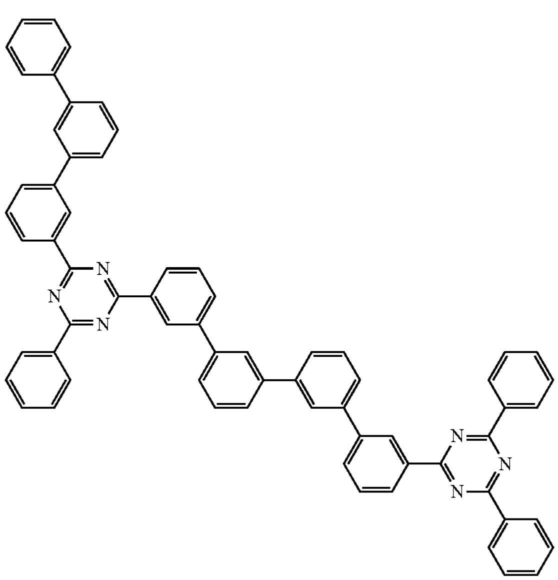
A(82)
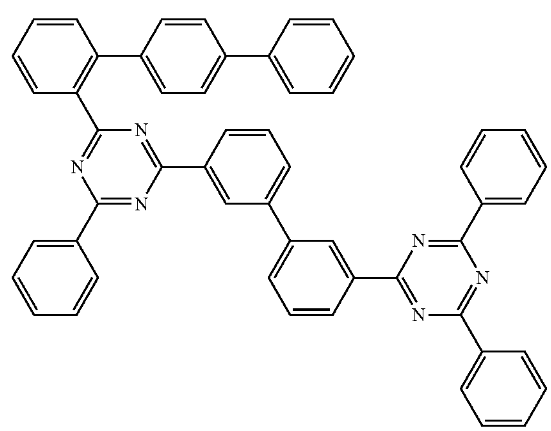

-continued
A(83)
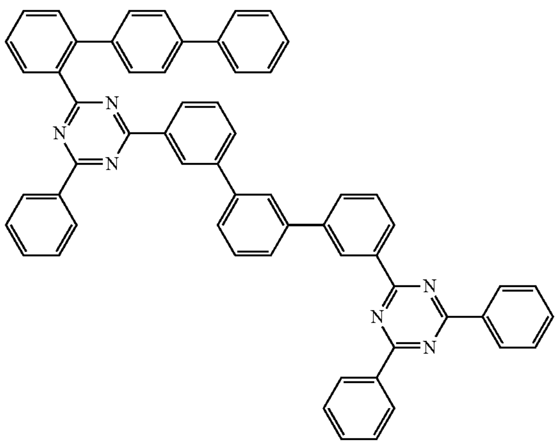
A(84)
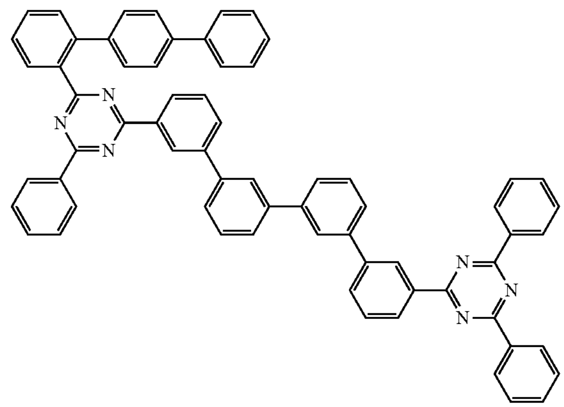
A(85)
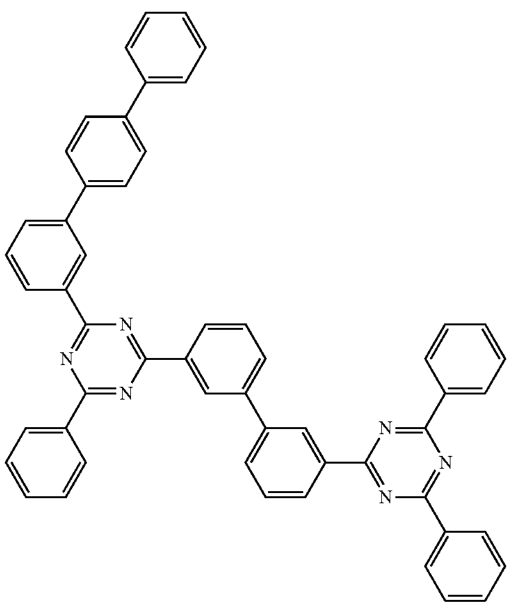
A(86)
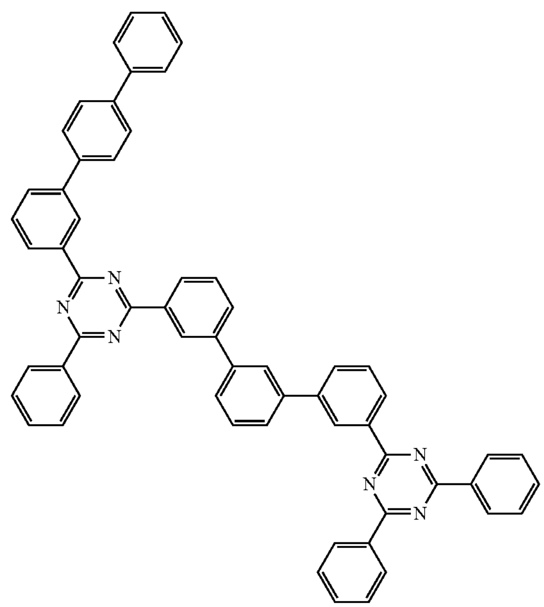
A(87)
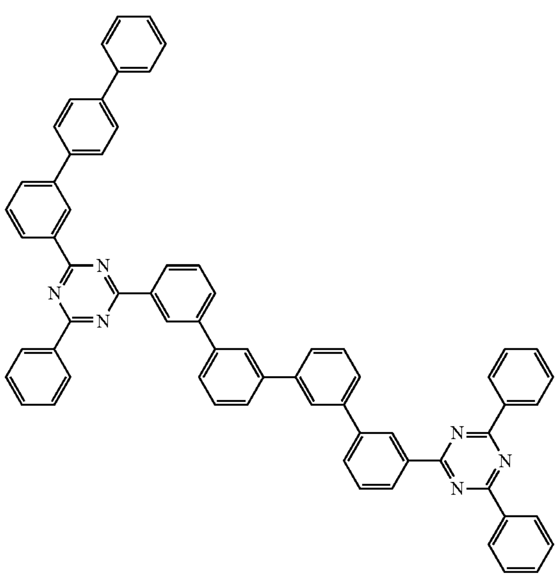
A(88)
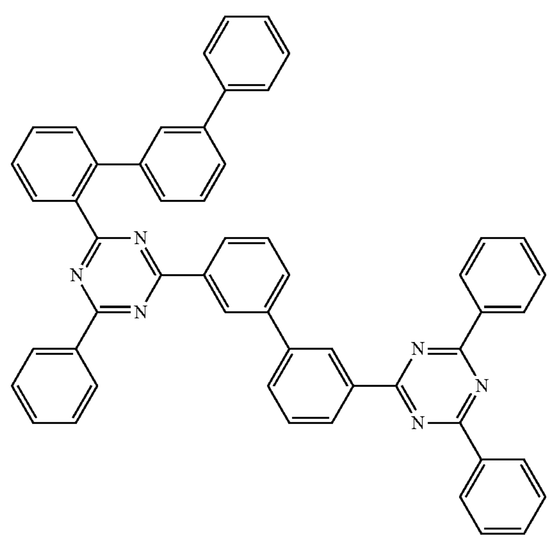

-continued
A(89)
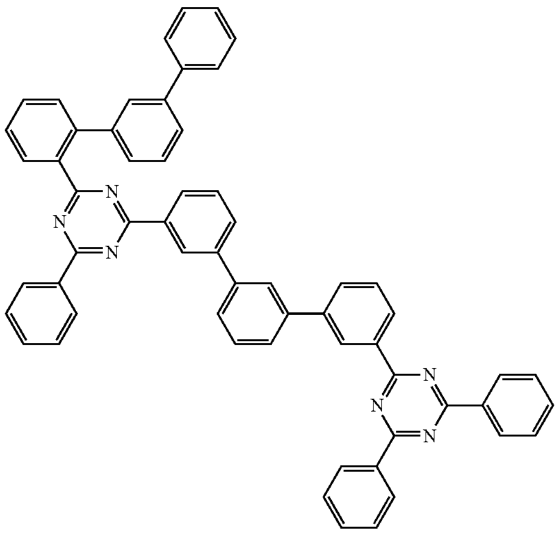
A(90)
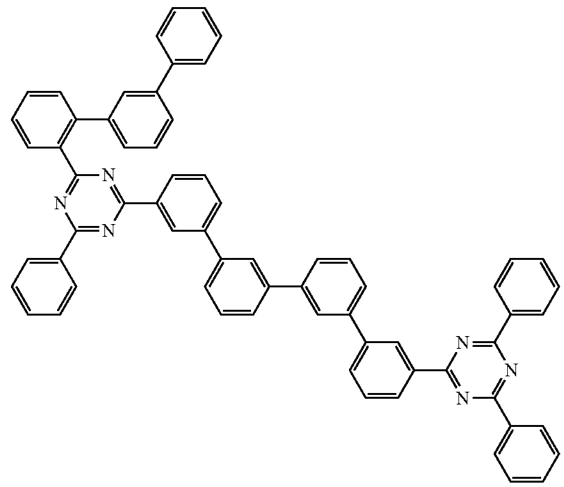
A(91)
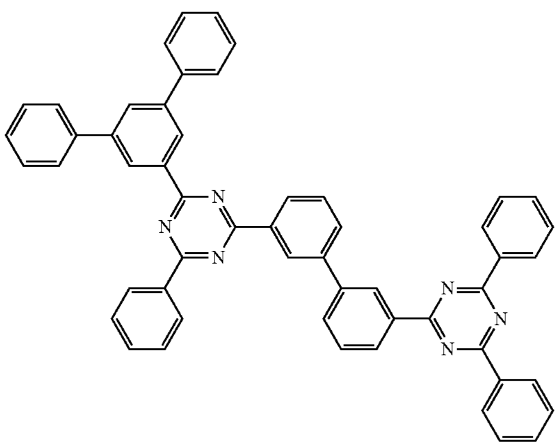
A(92)
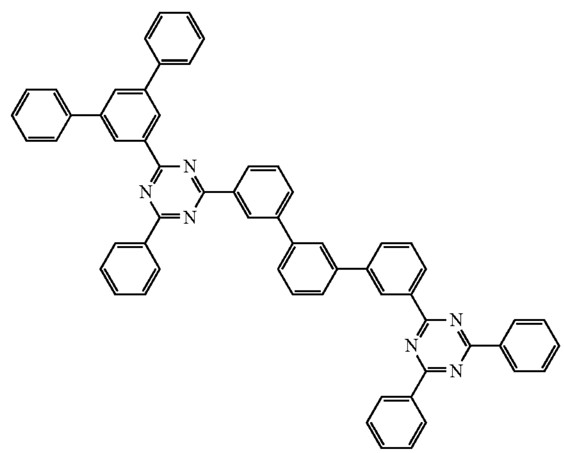
A(93)
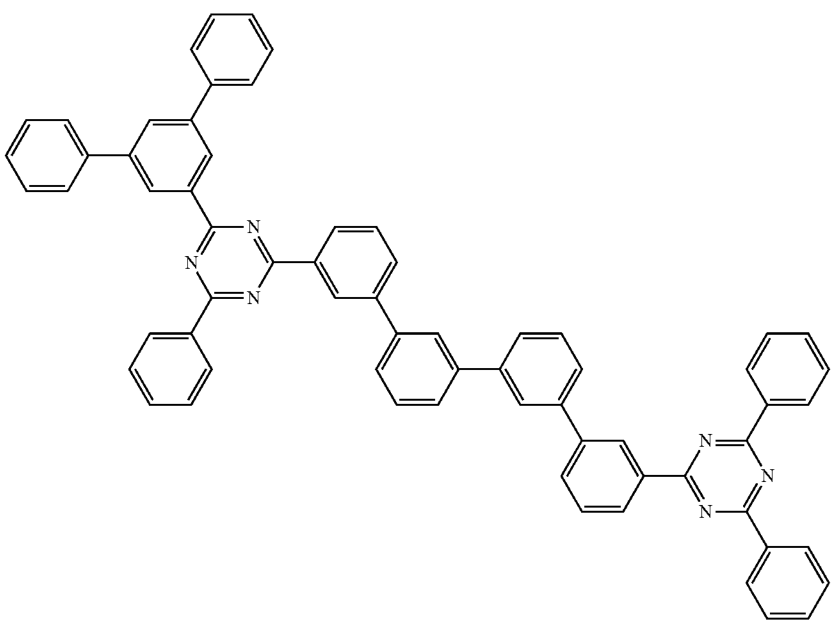

-continued
A(94)
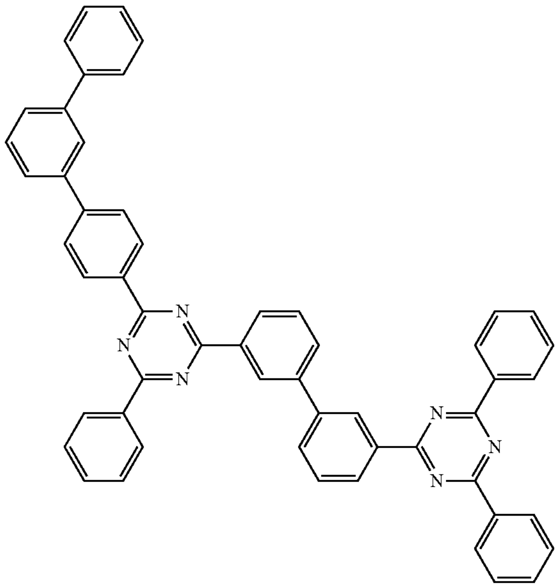
A(95)
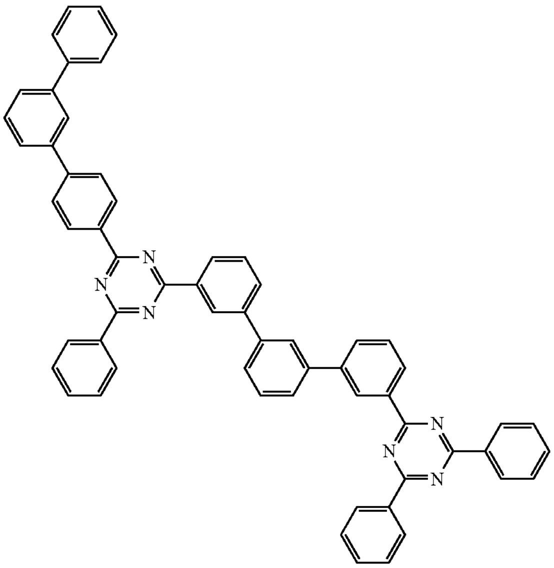
A(96)
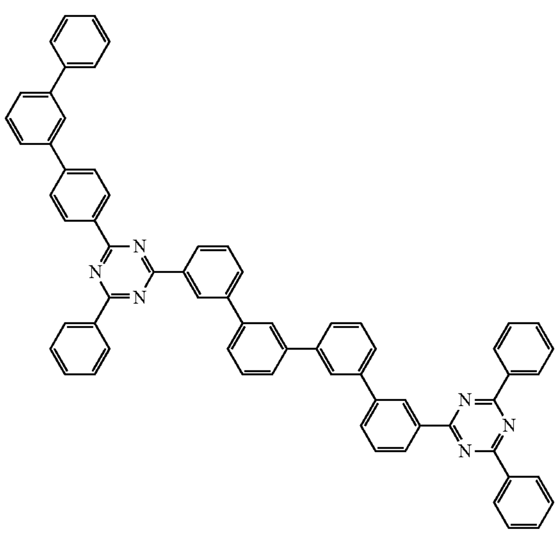
A(97)
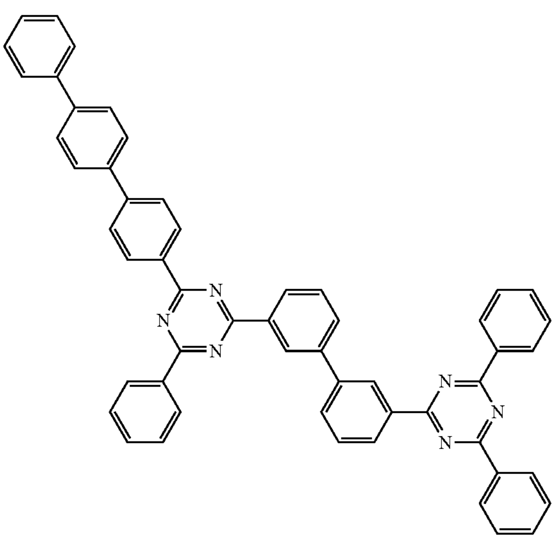

-continued
A(98)
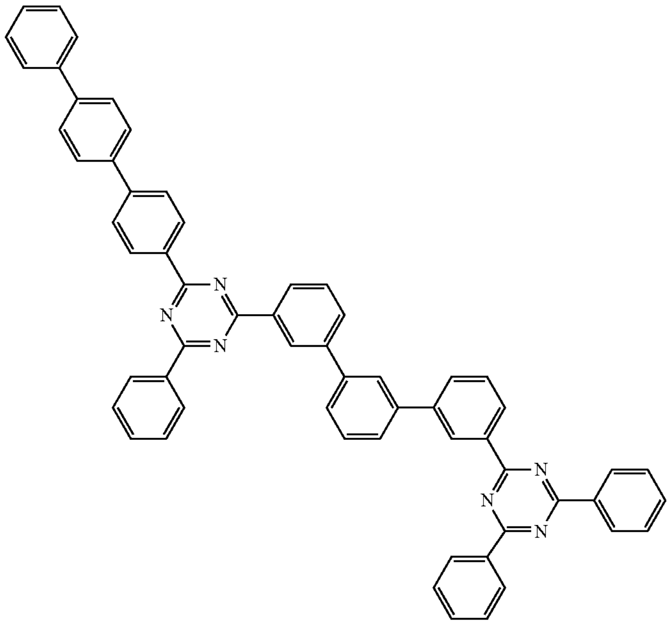
A(99)
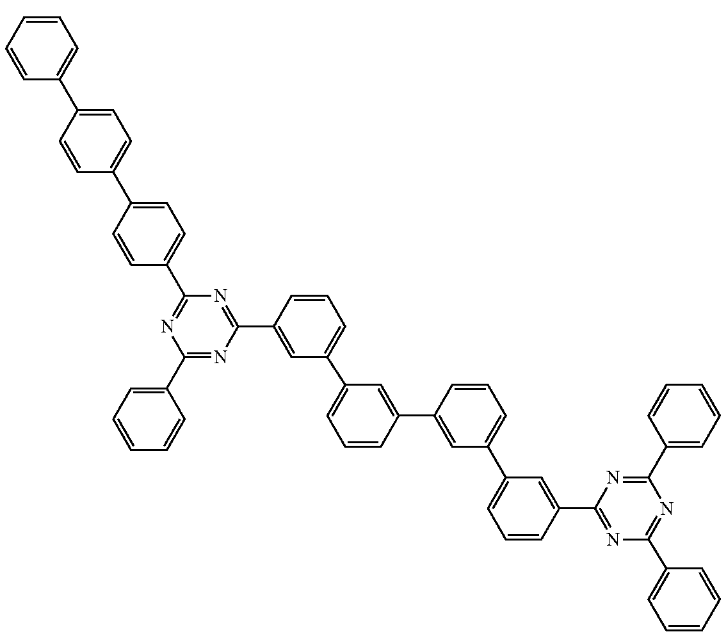

-continued
A(100)
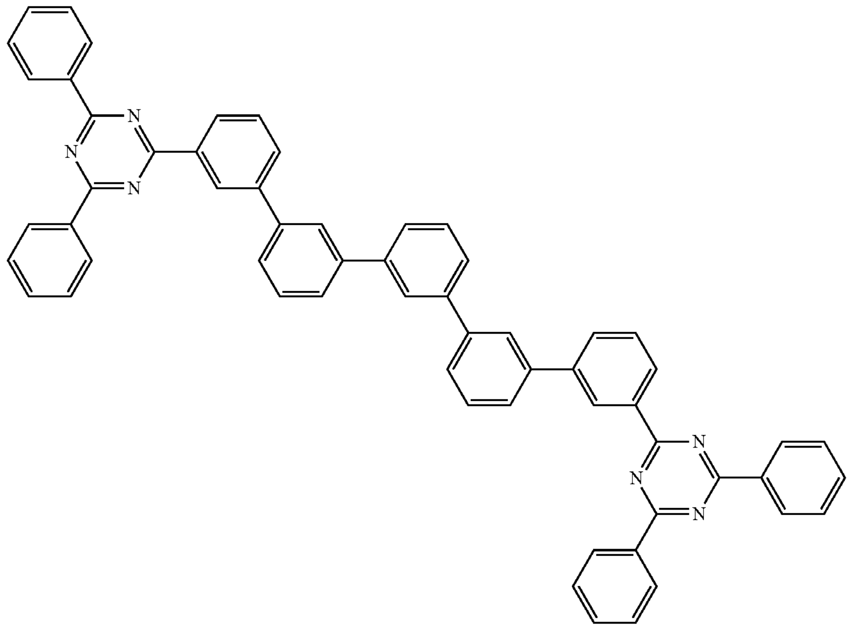
A(101)
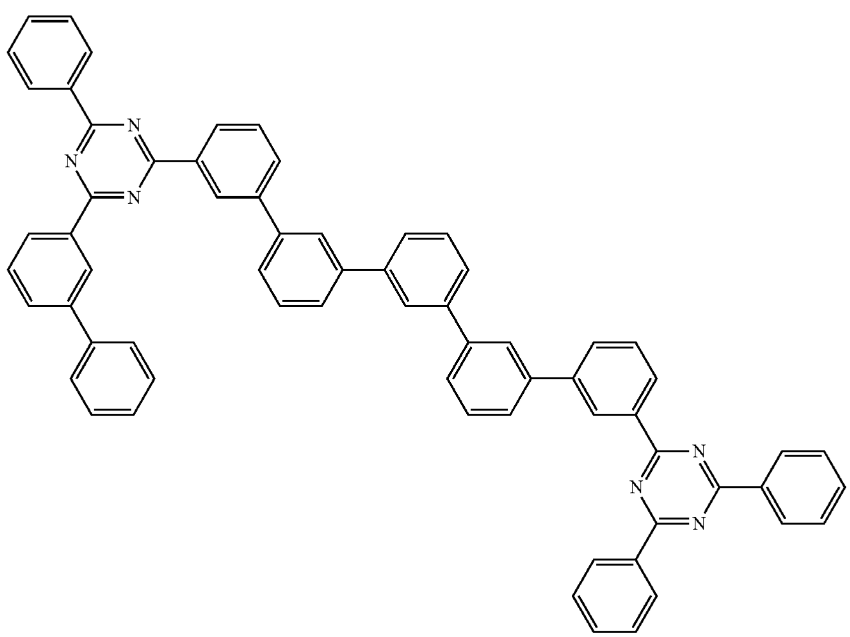

-continued
A(102)
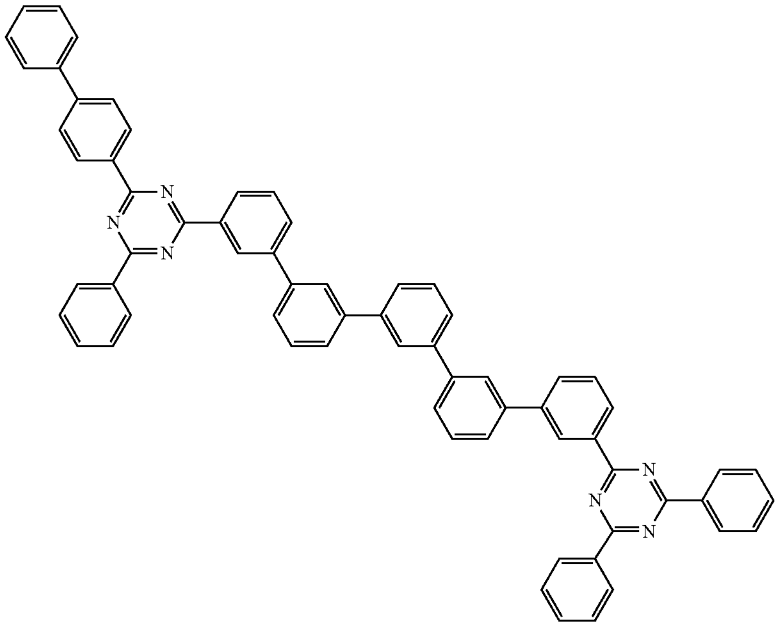
A(103)
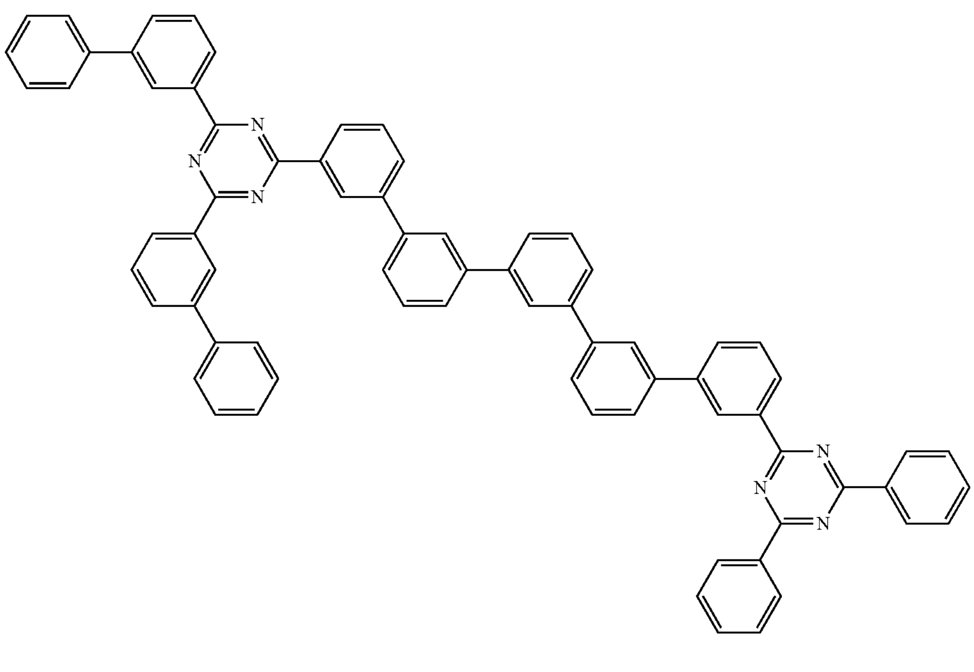

-continued
A(104)
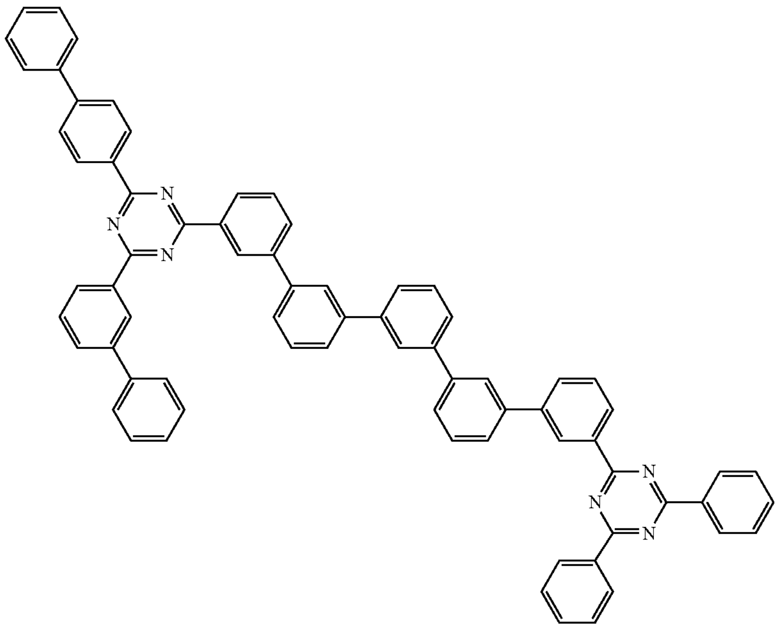
A(105)
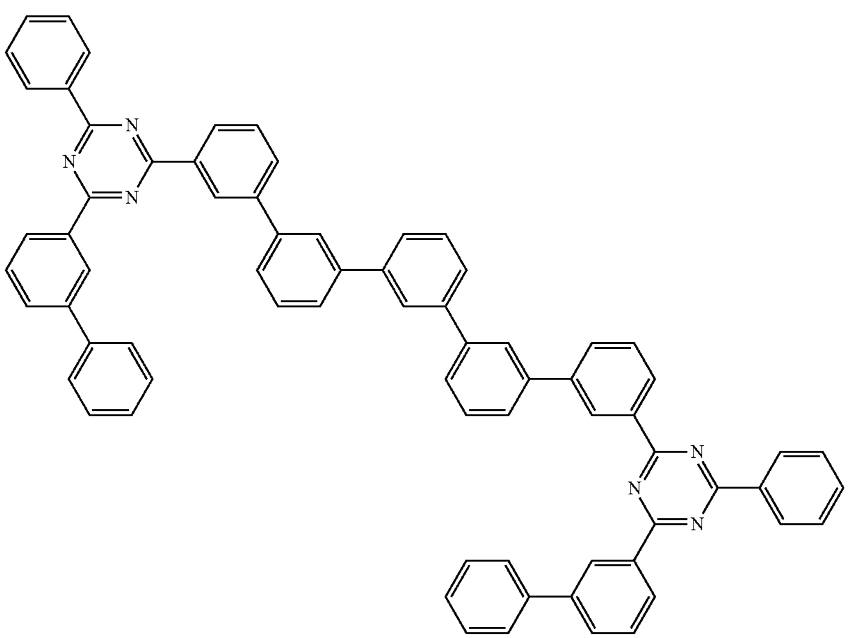

-continued
A(106)
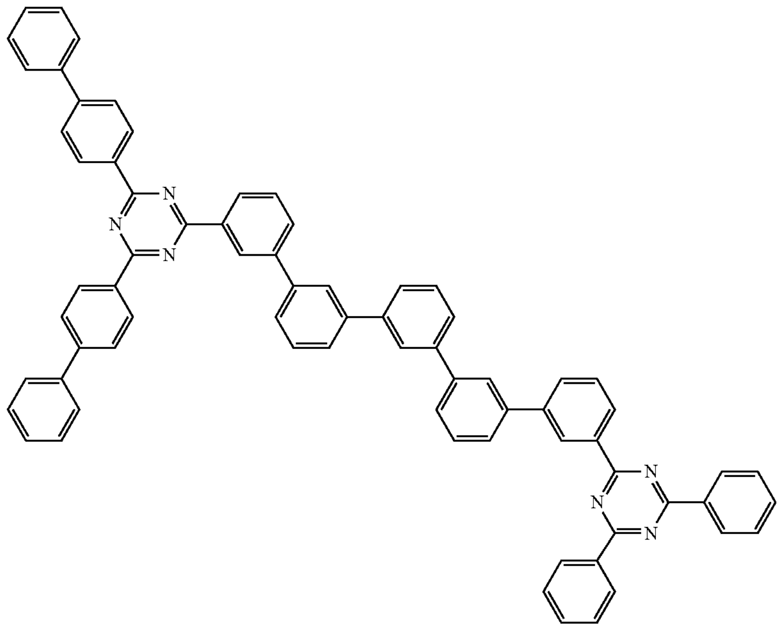
A(107)
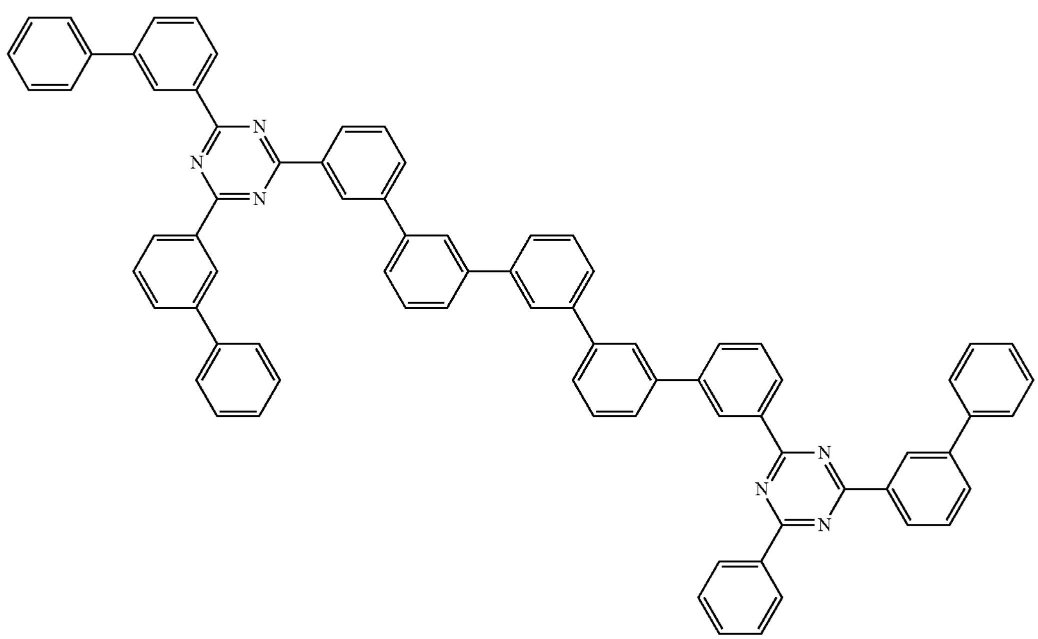

-continued
A(108)
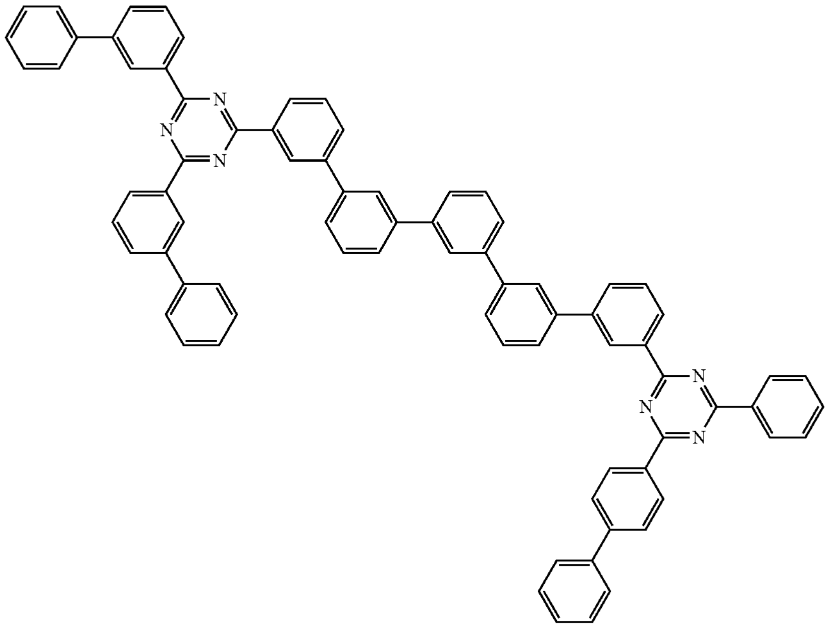
A(109)
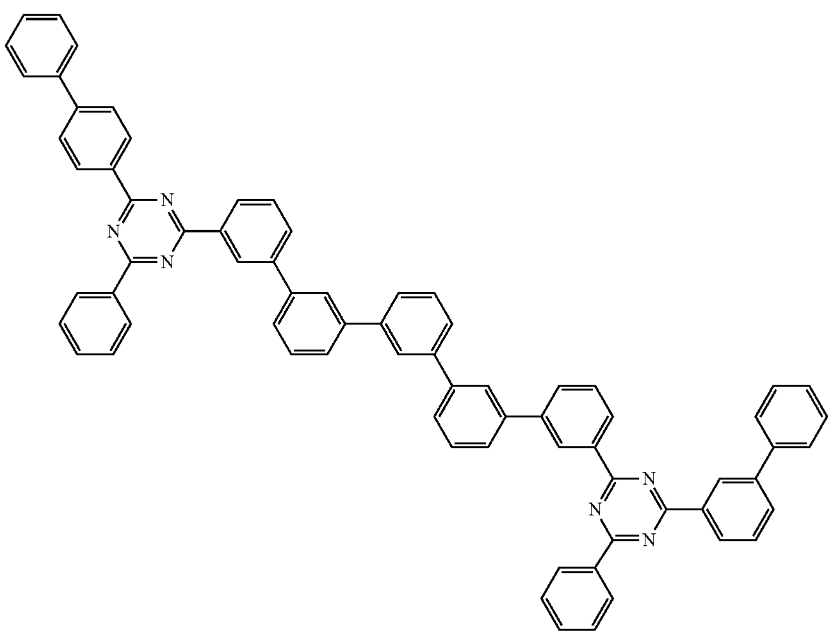

-continued
A(110)
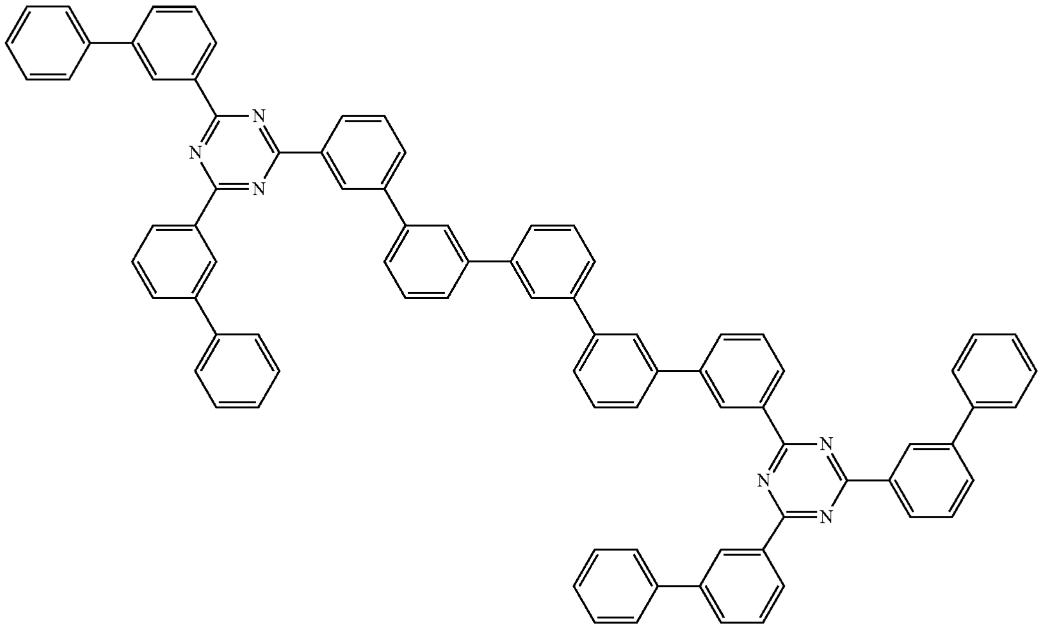
A(111)
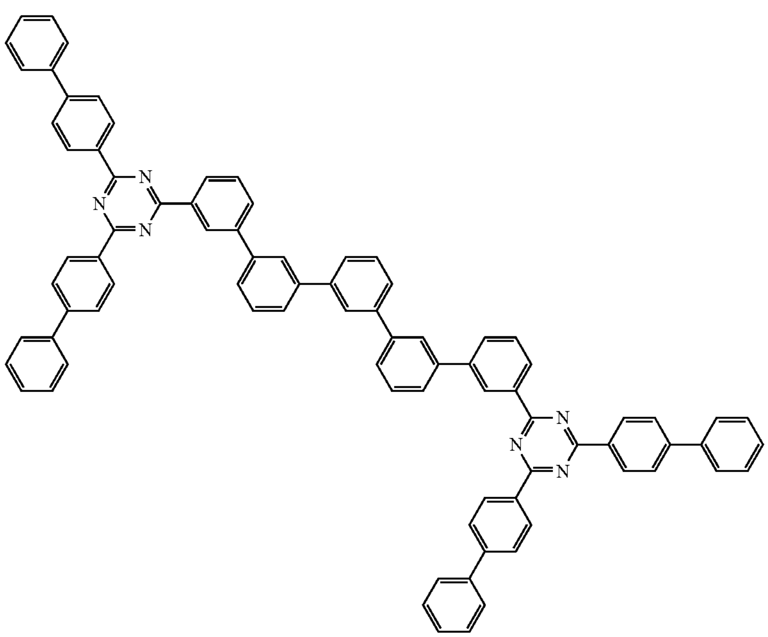

-continued
A(112)
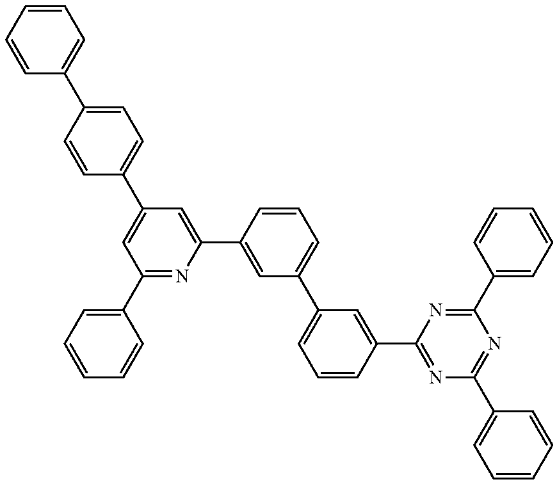
A(113)
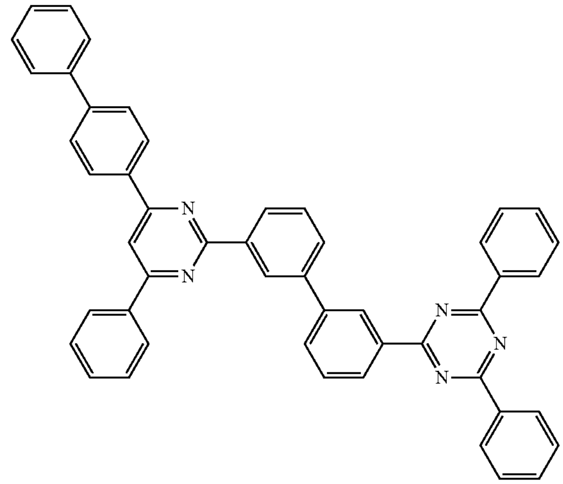
A(114)
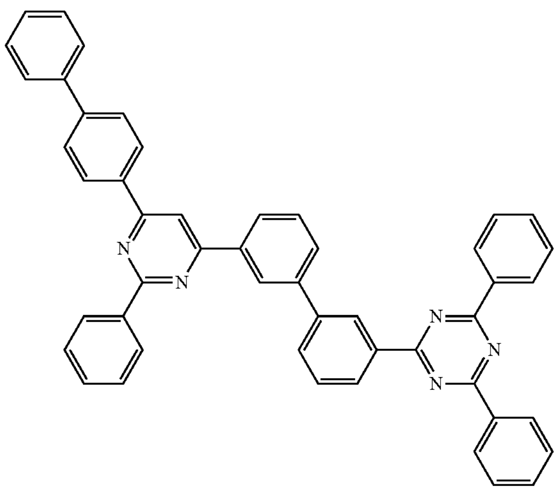
A(115)
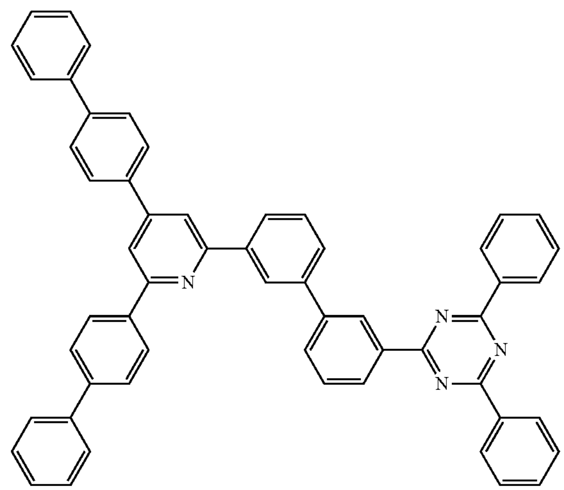
A(116)
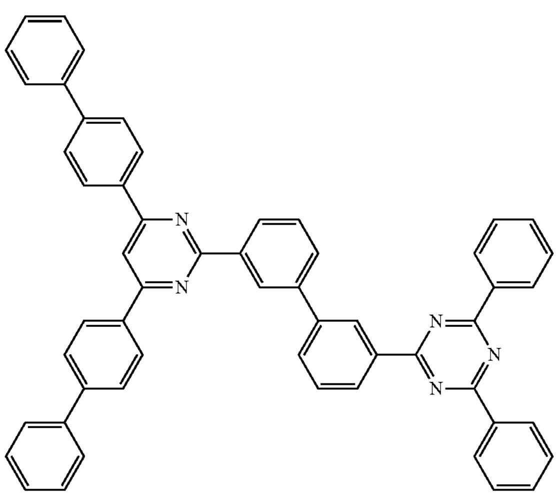
A(117)
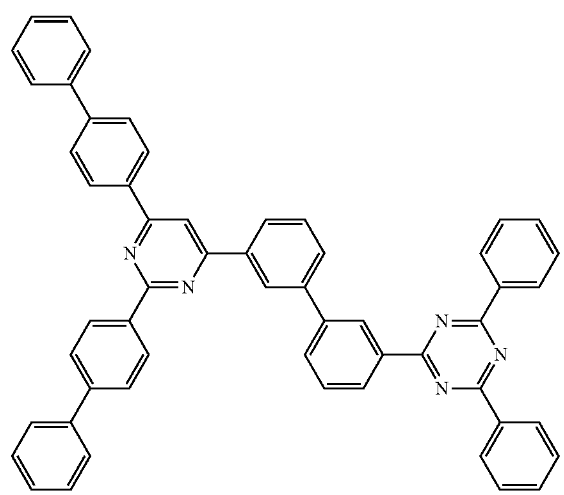

-continued
A(118)
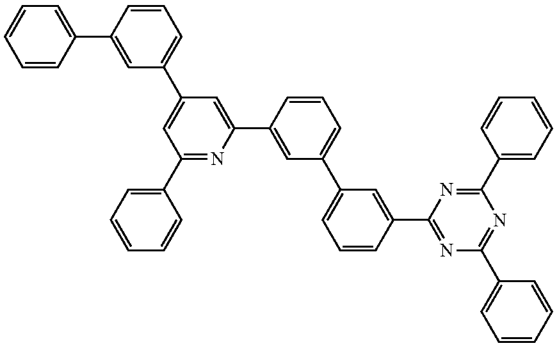
A(119)
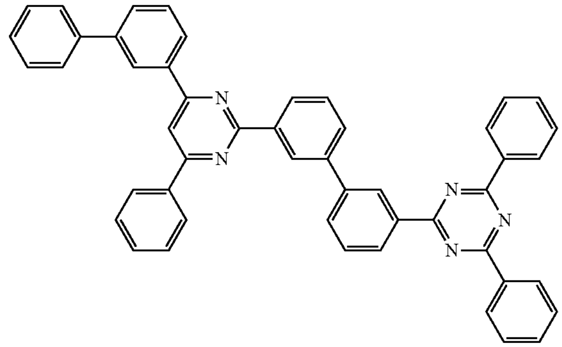
A(120)
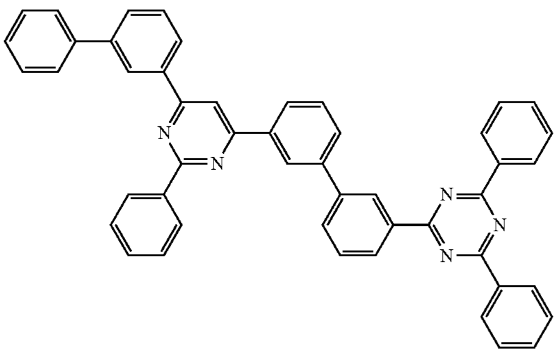
A(121)
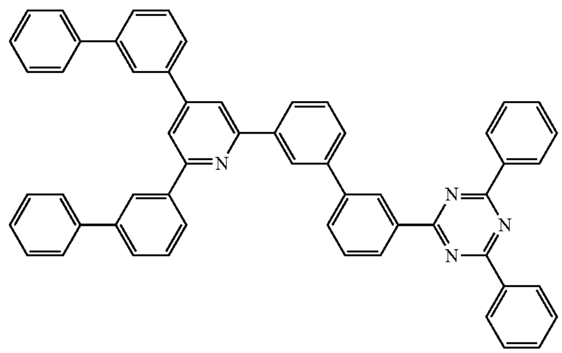
A(122)
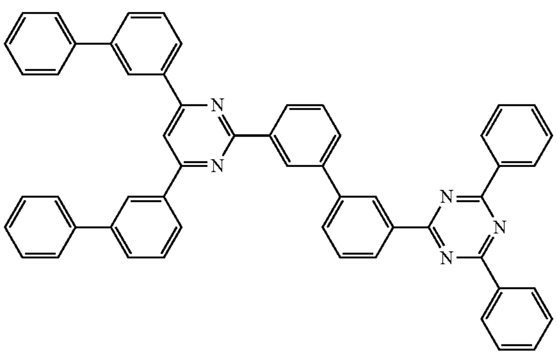
A(123)
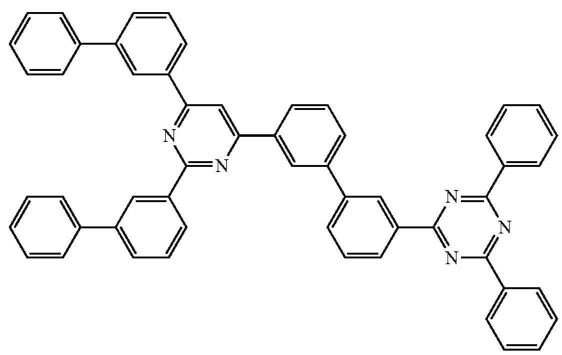
A(124)
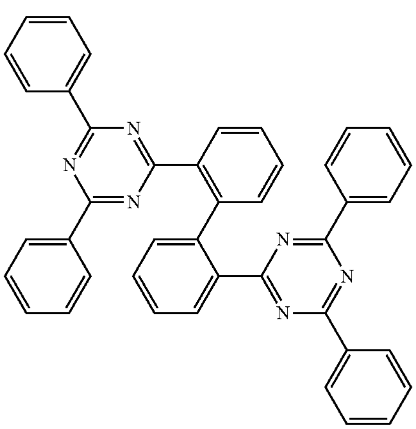
A(125)
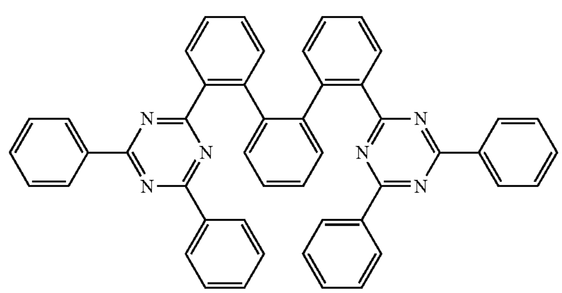

-continued
A(126)
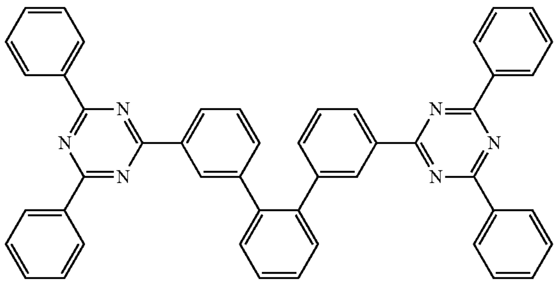
A(127)
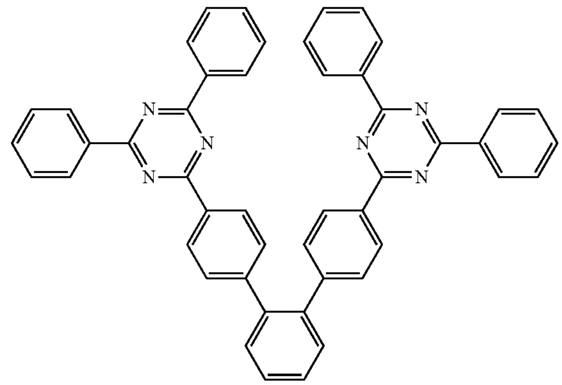
A(128)
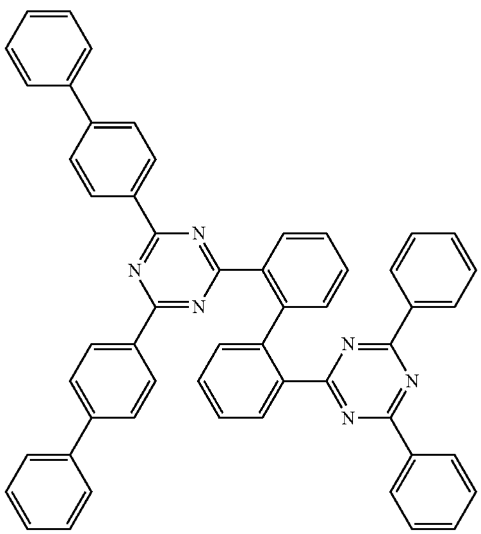
A(129)
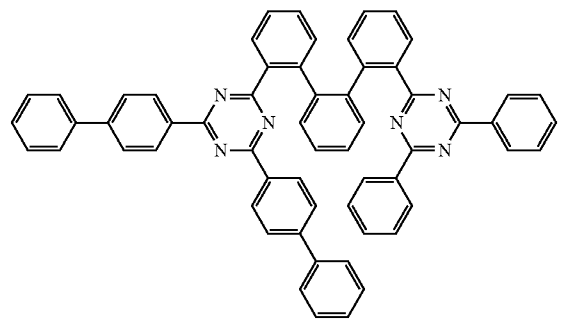
A(130)
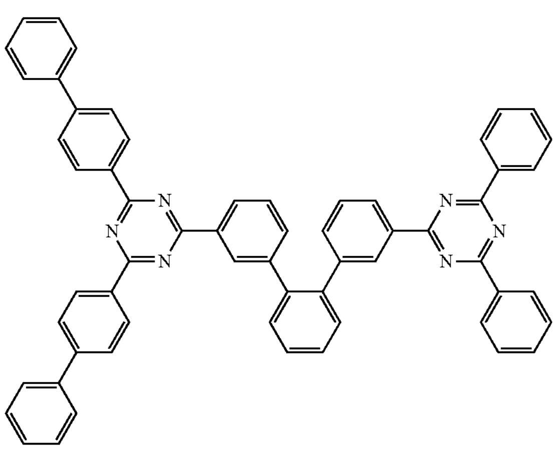
A(131)
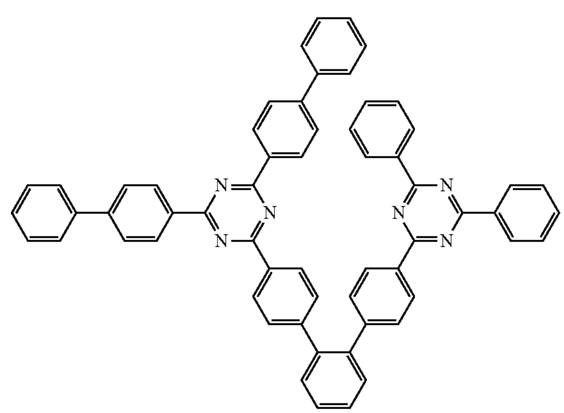

-continued
A(132)
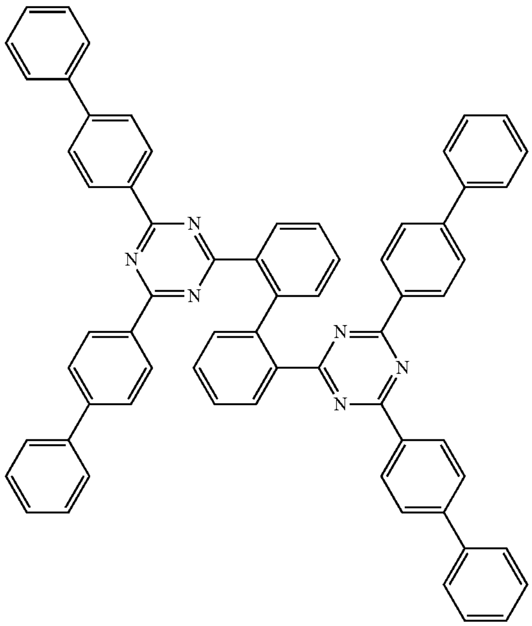
A(133)
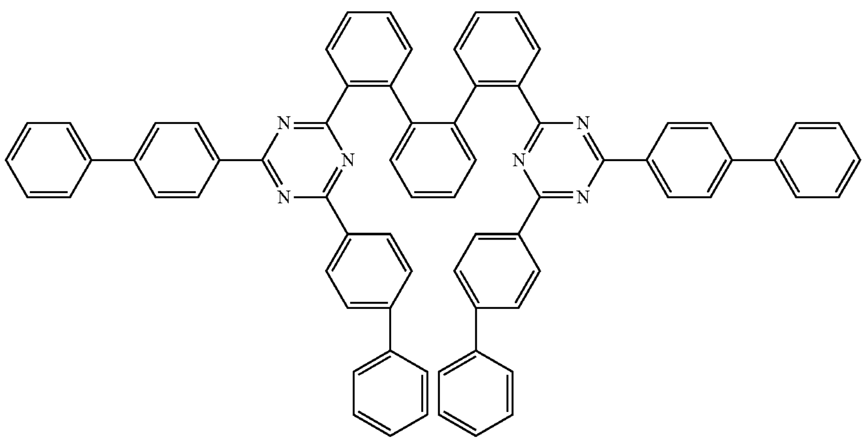
A(134)
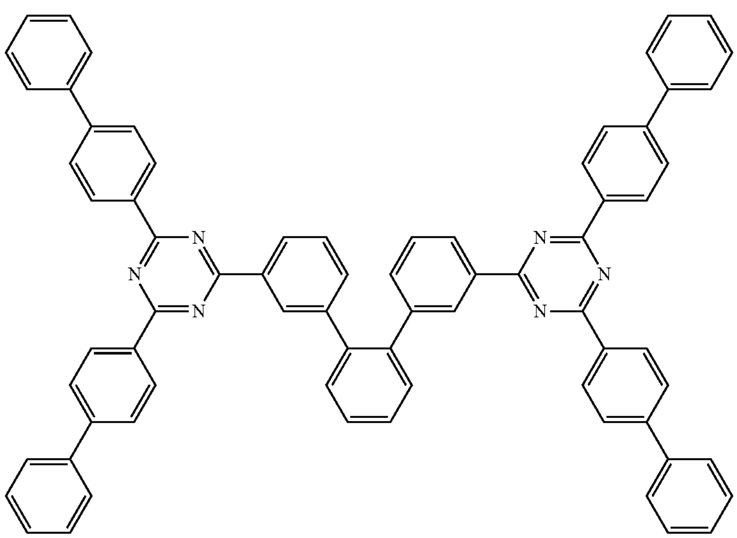

-continued
A(135)
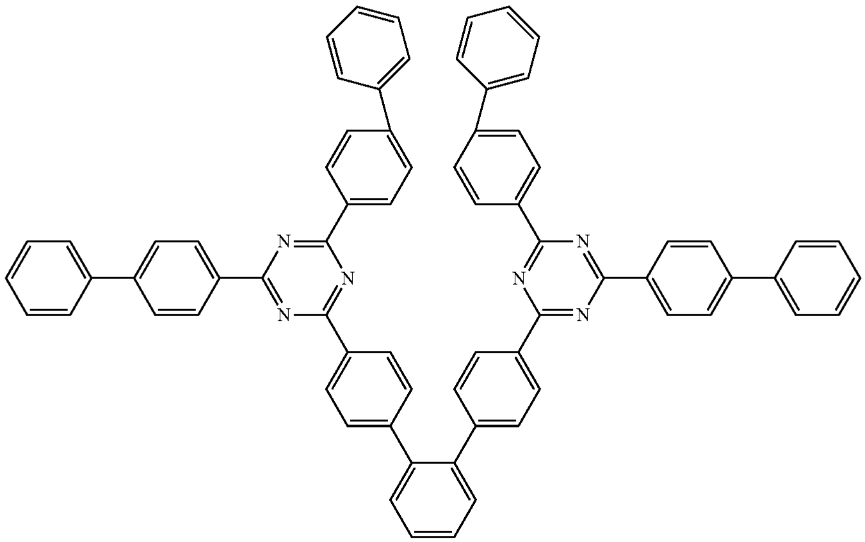
A(136)
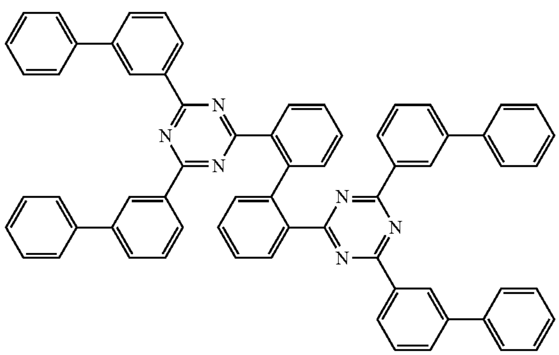
A(137)
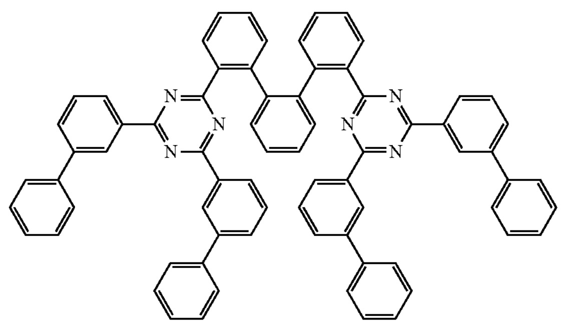
A(138)
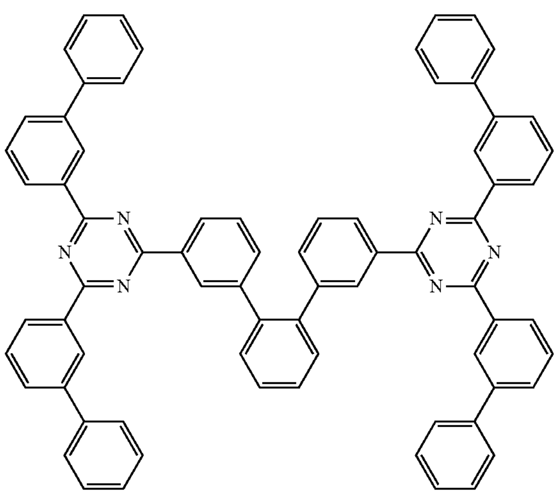
A(139)
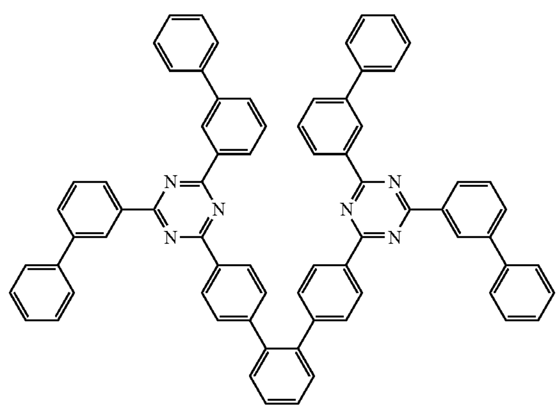

-continued
A(140)
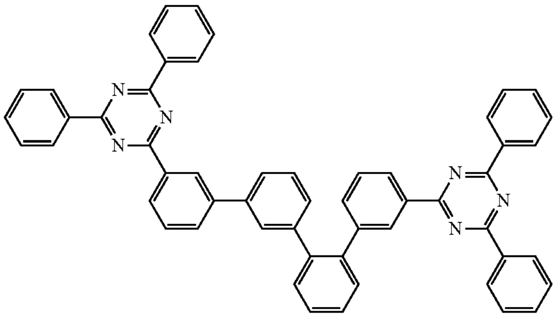
A(141)
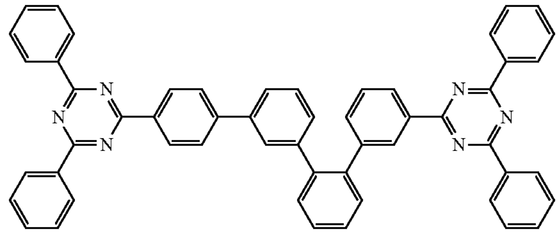
A(142)
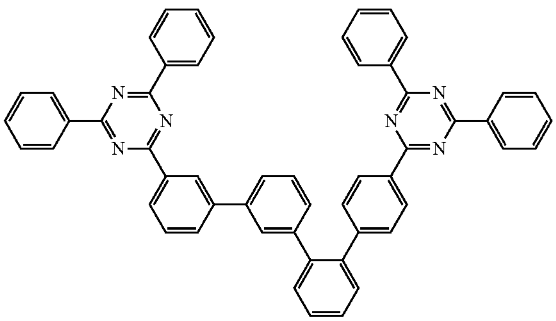
A(143)
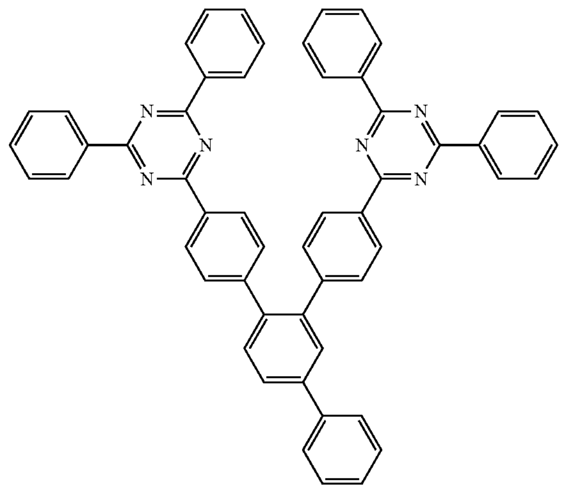
A(144)
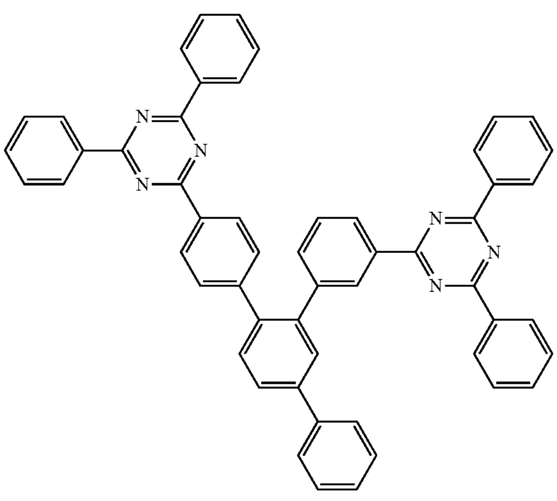
A(145)
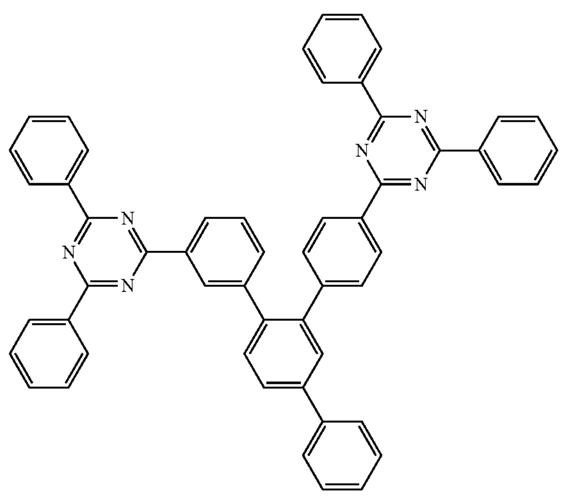

-continued
A(146)
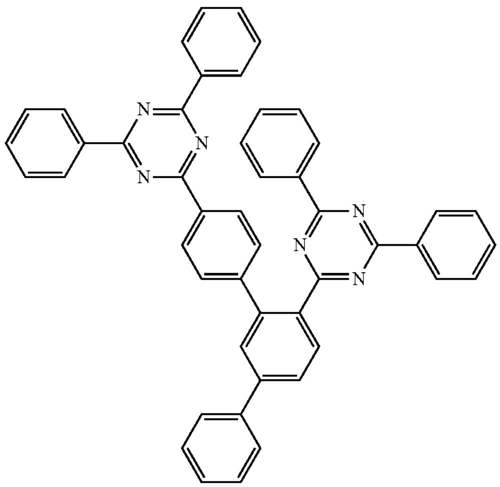
A(147)
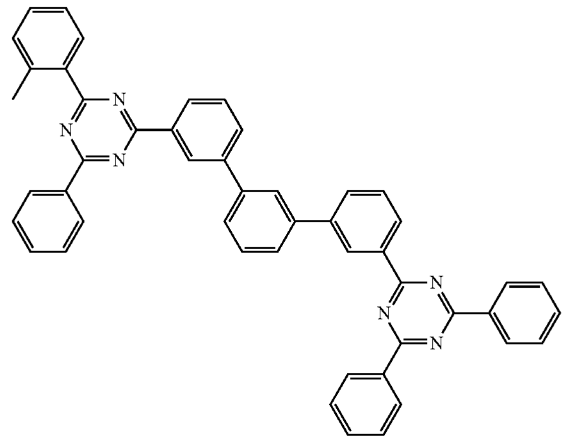
A(148)
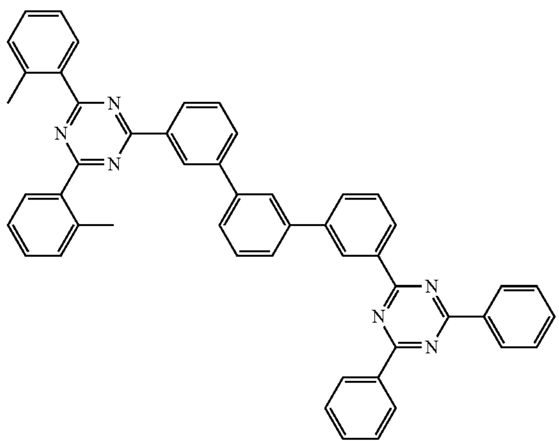
A(149)
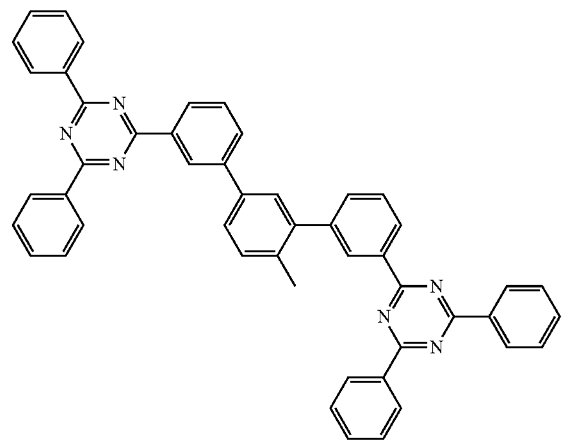
A(150)
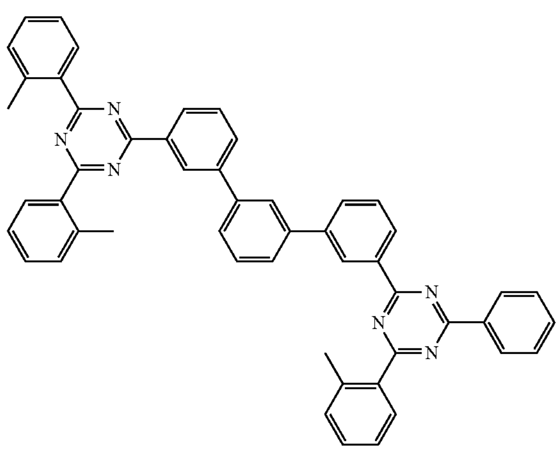
A(151)
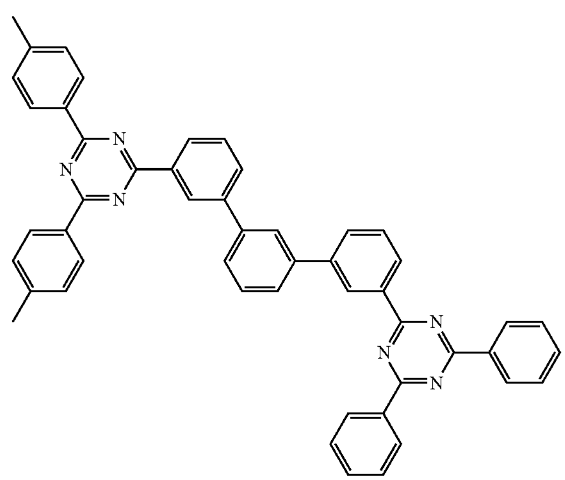

-continued
A(152)
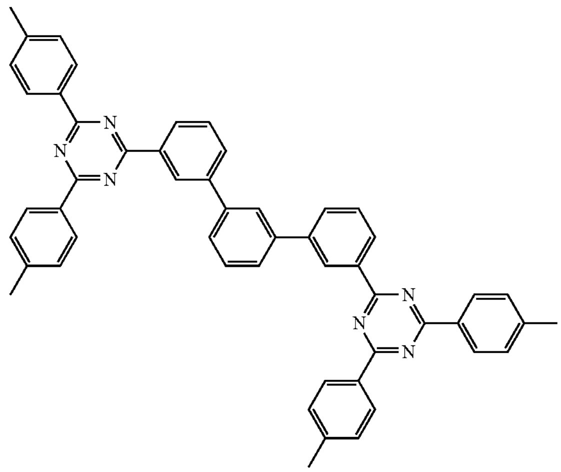
A(153)
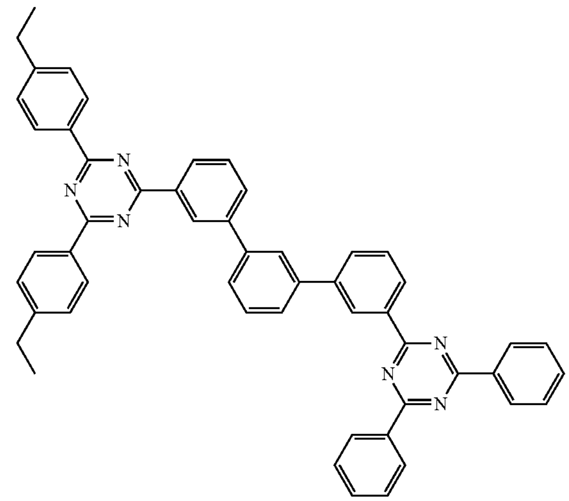
A(154)
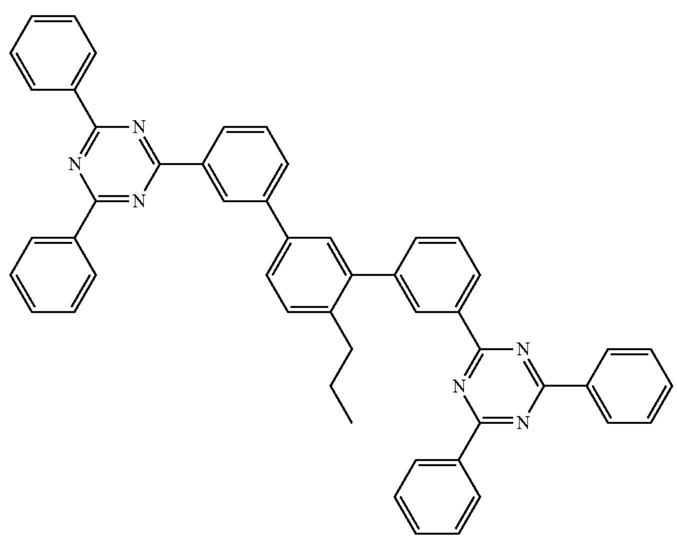
.

In some embodiments, the hole transporting host may be selected from Compounds H-H1 to H-H103, but embodiments are not limited thereto:
H-H1
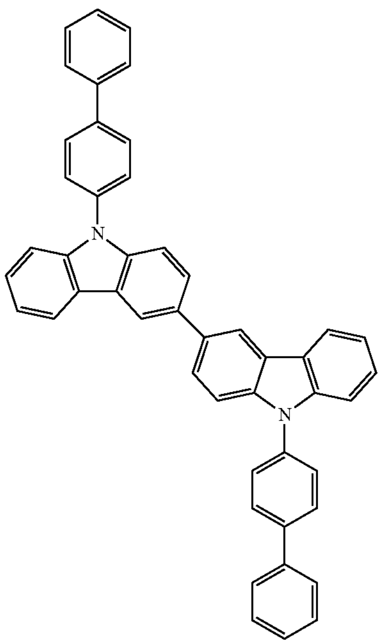
H-H2
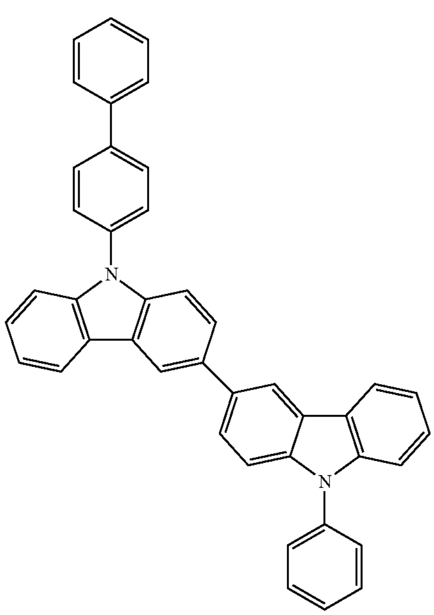
-continued
H-H3
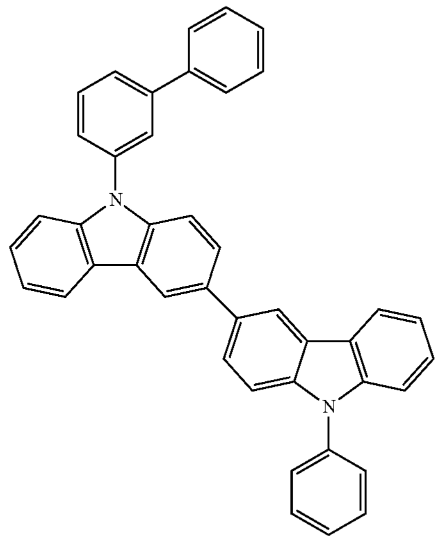
H-H4
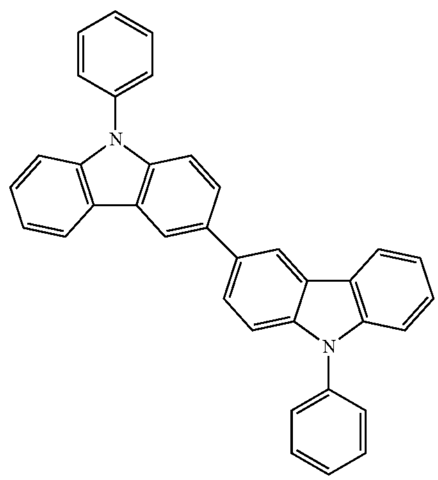
H-H5
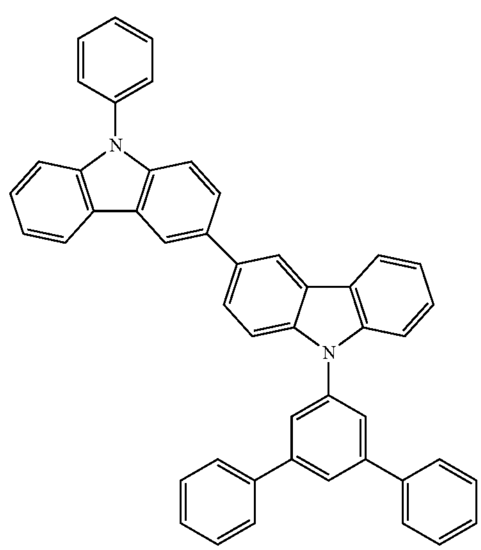

H-H6
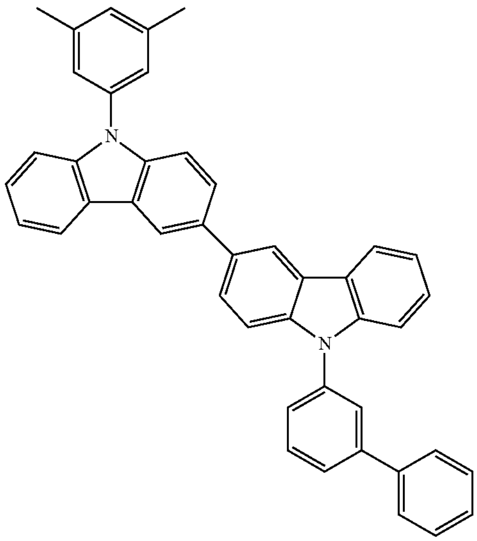
H-H7
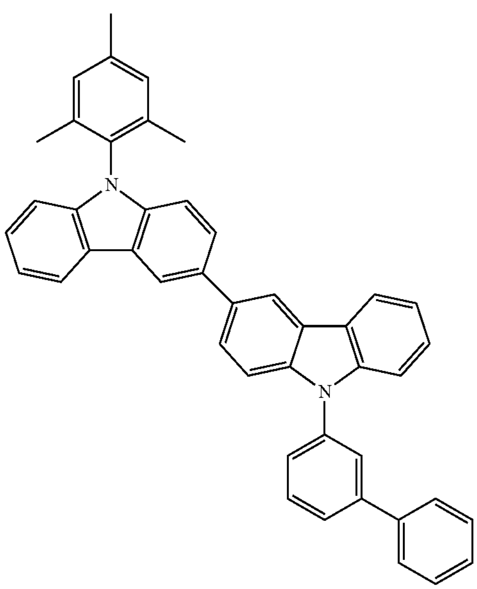
H-H8
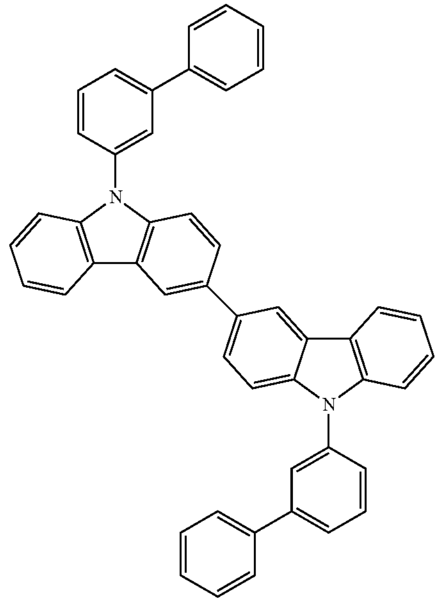
H-H9
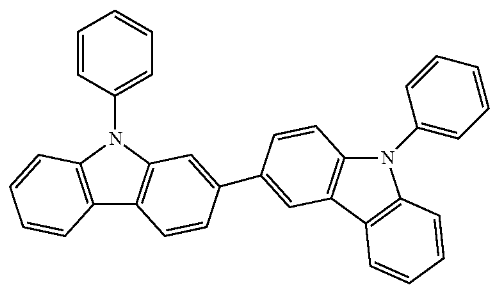
H-H10
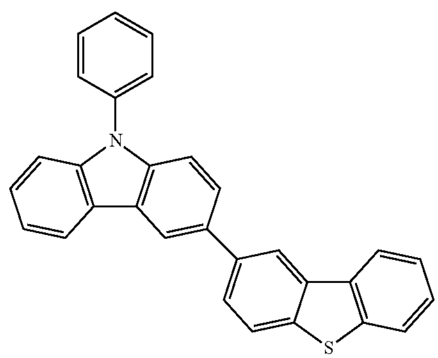
H-H11
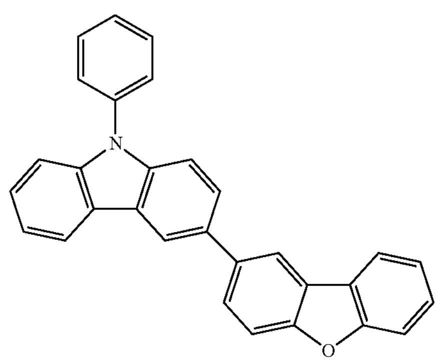

-continued
H-H12
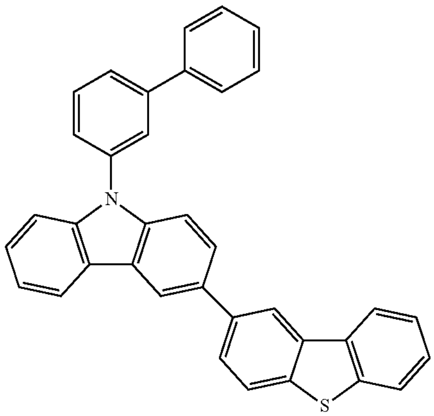
H-H13
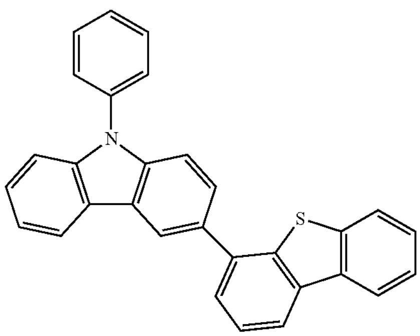
H-H14
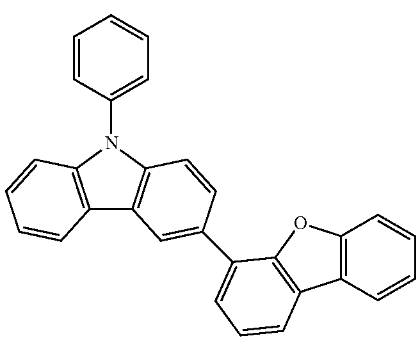
H-H15
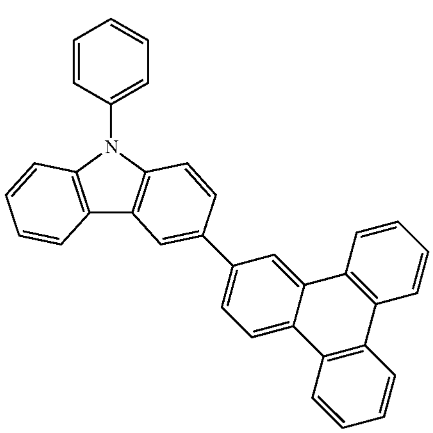
-continued
H-H16
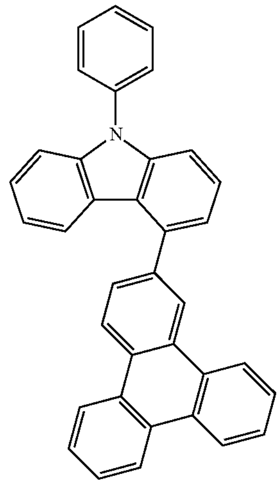
H-H17
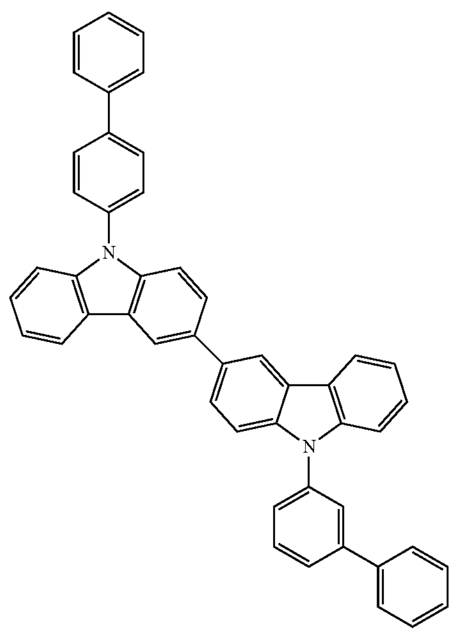
H-H18
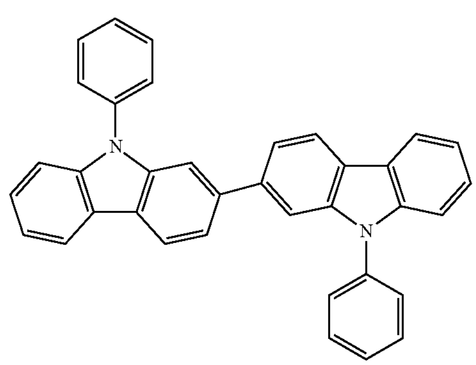

H-H19
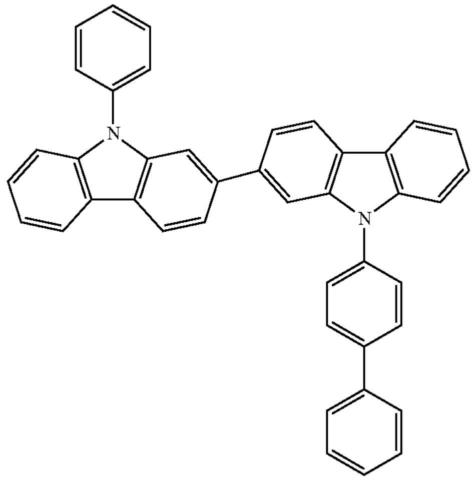
H-H20
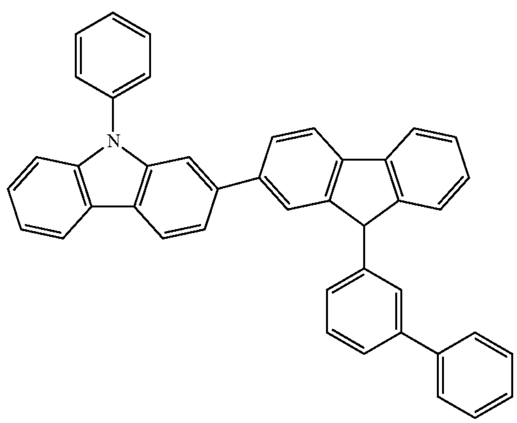
H-H21
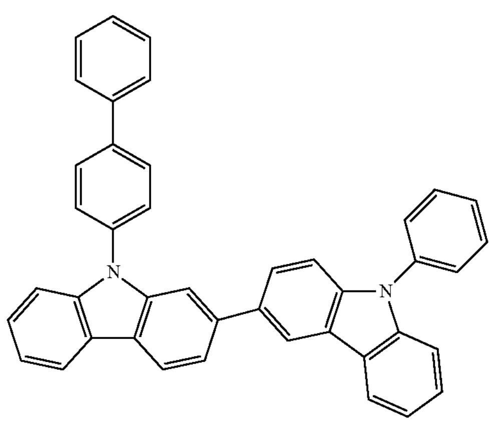
H-H22
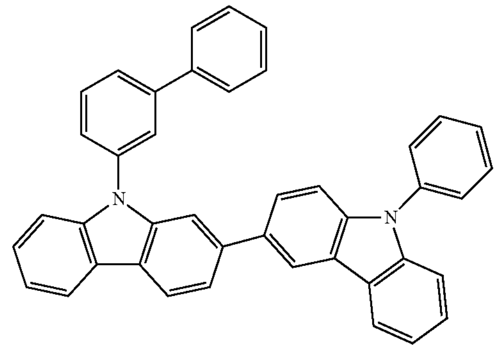
H-H23
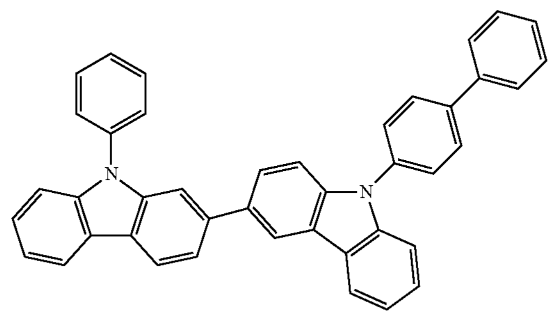
H-H24
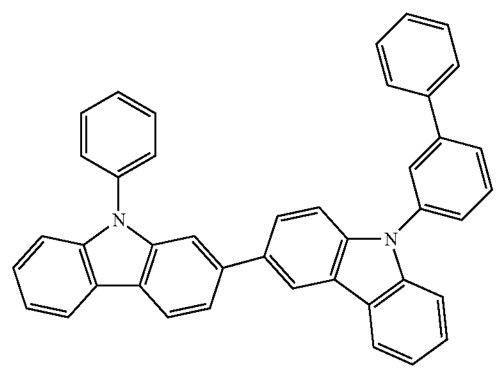
H-H25
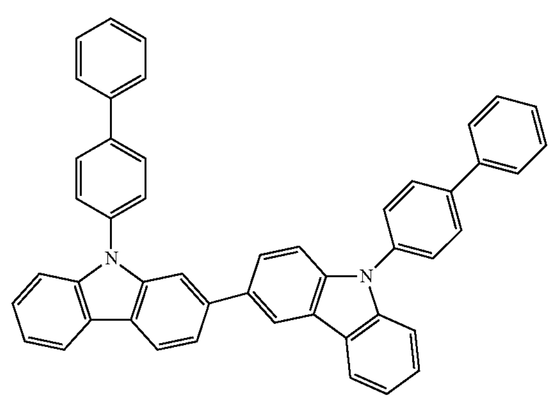

-continued
H-H26
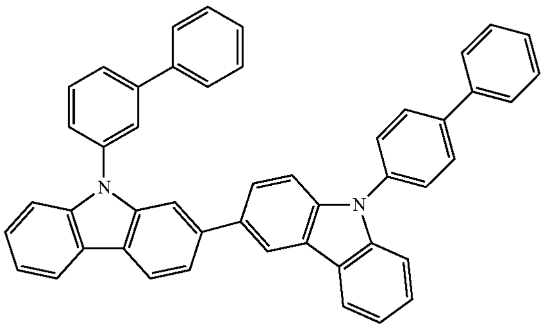
H-H27
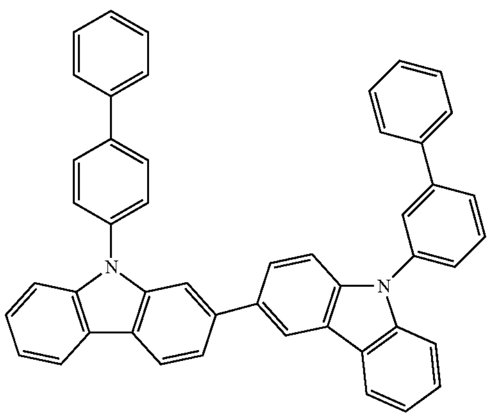
H-H28
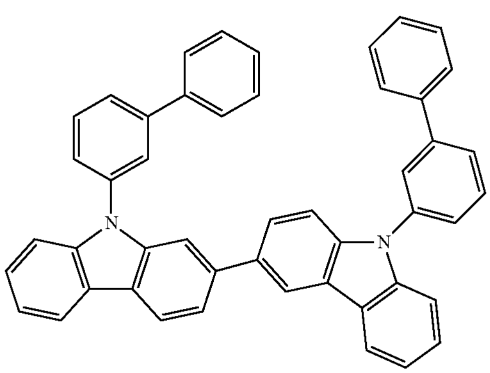
-continued
H-H29
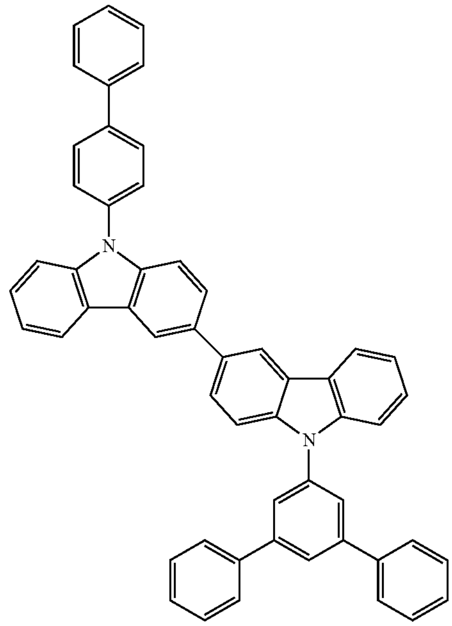
H-H30
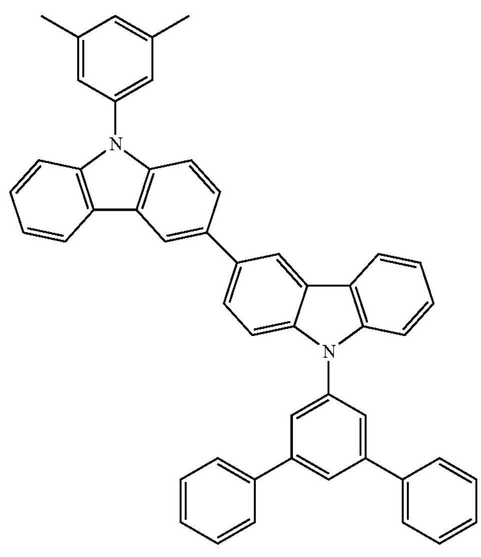

-continued
H-H31
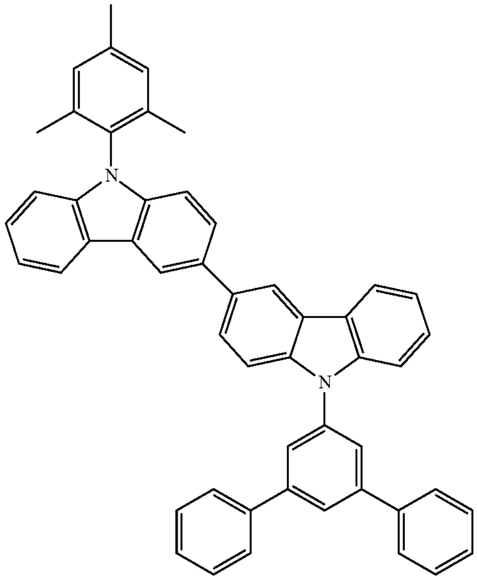
H-H32
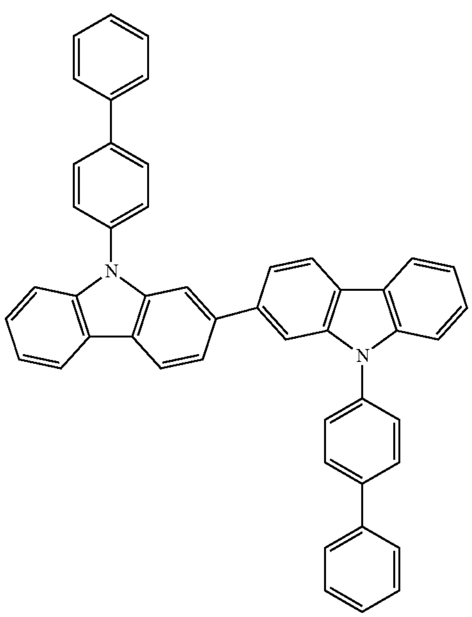
-continued
H-H33
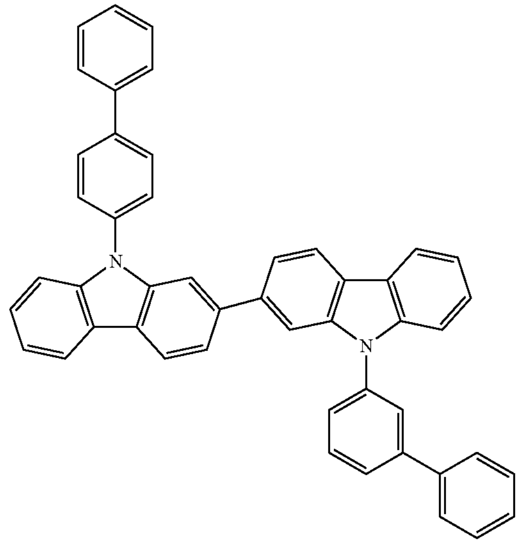
H-H34
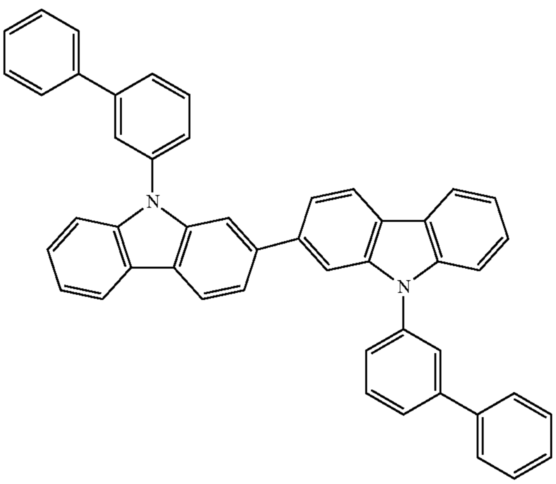
H-H35
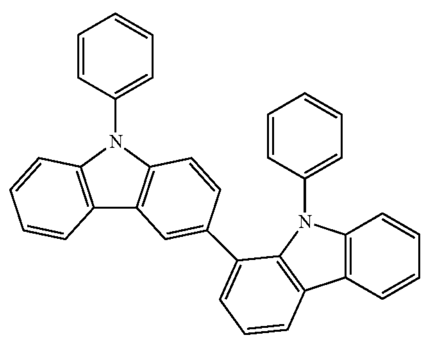

-continued
H-H36
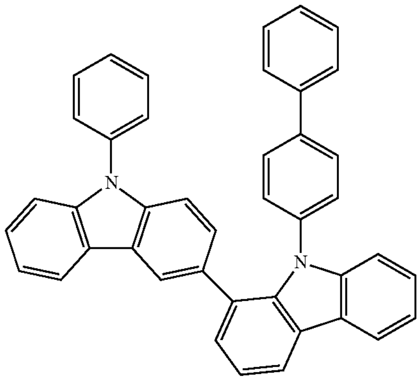
H-H37
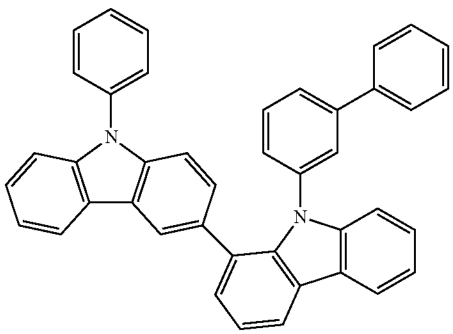
H-H38
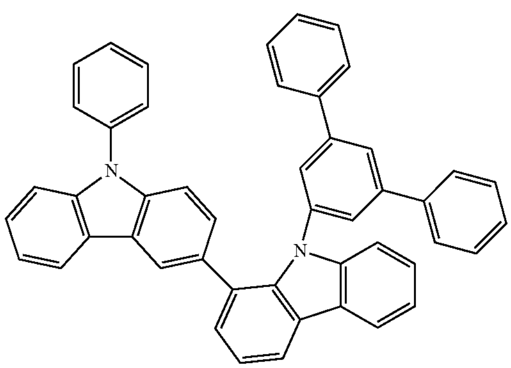
H-H39
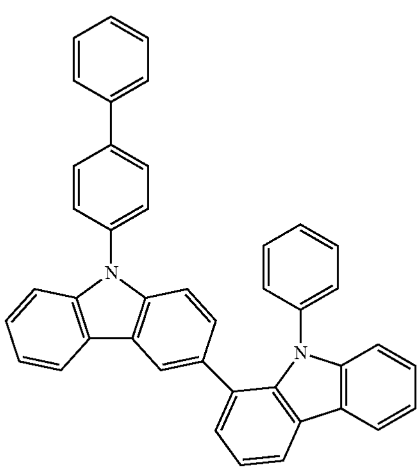
-continued
H-H40
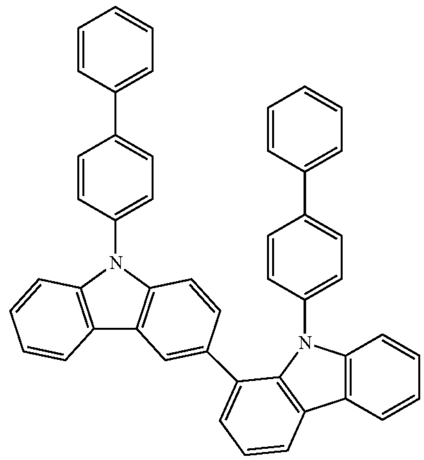
H-H41
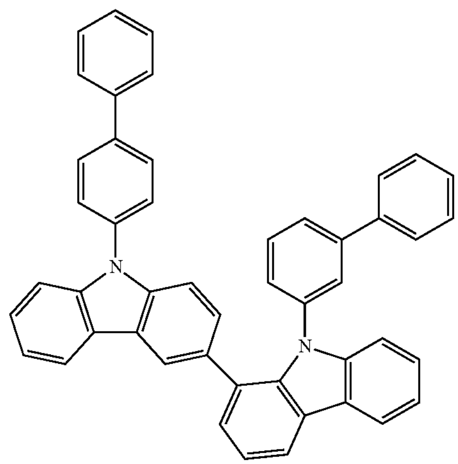
H-H42
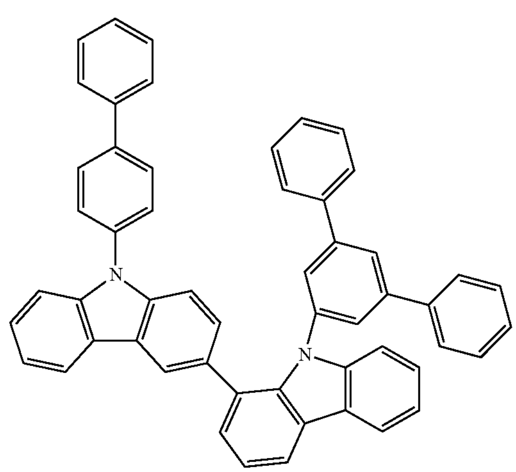

H-H43
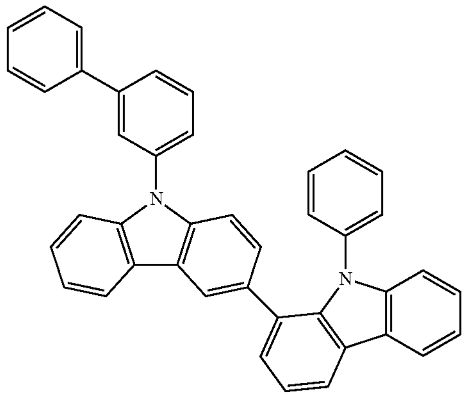
H-H44
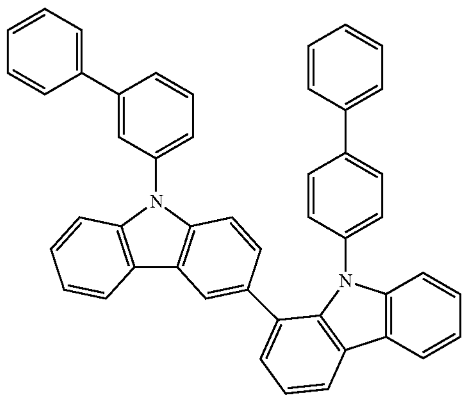
H-H45
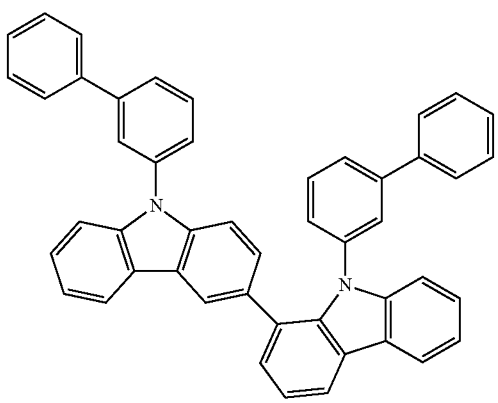
H-H46
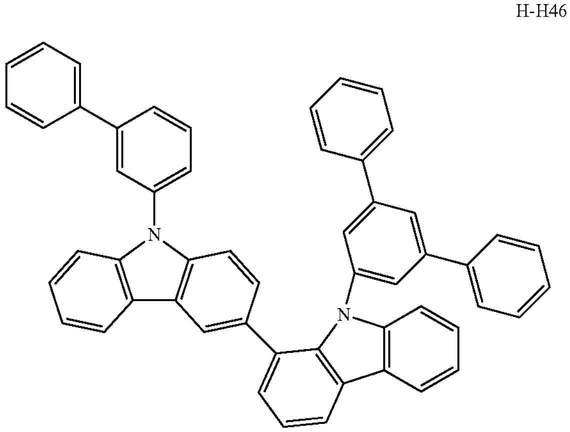
H-H47
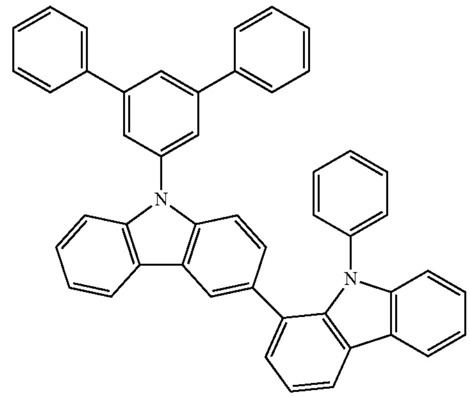
H-H48
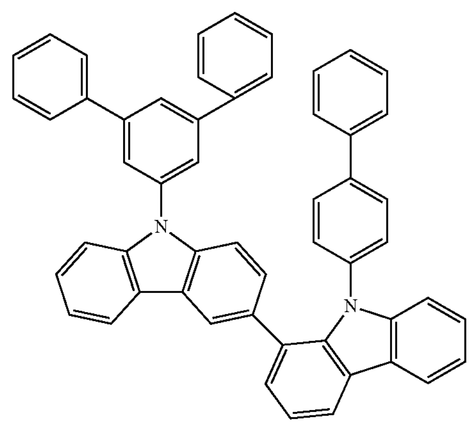
H-H49
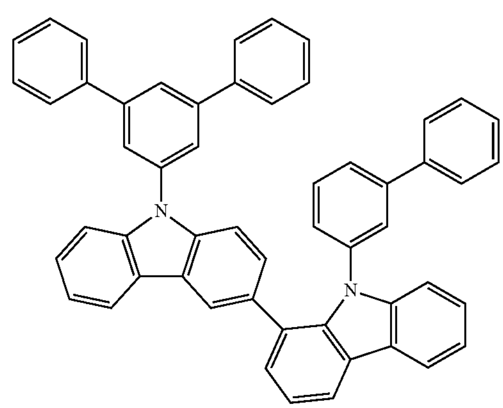

-continued
H-H50
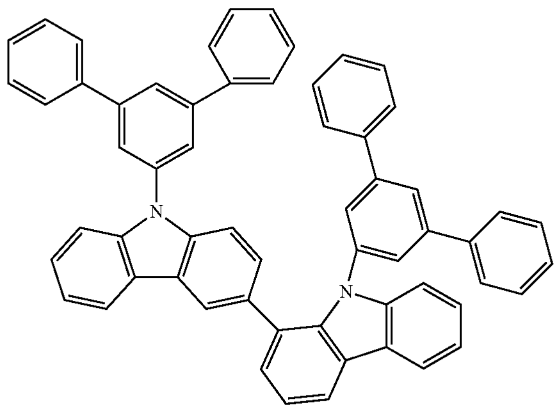
H-H51
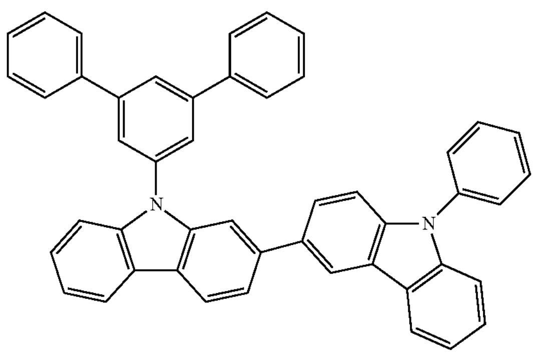
H-H52
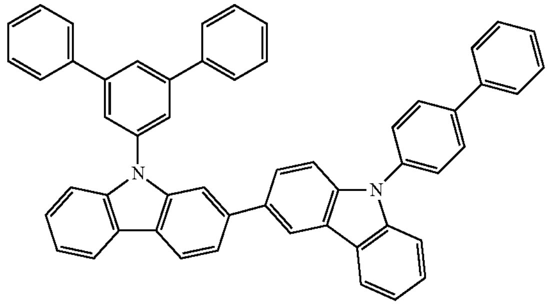
H-H53
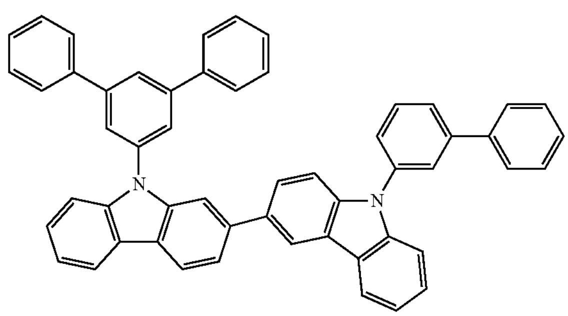
-continued
H-H54
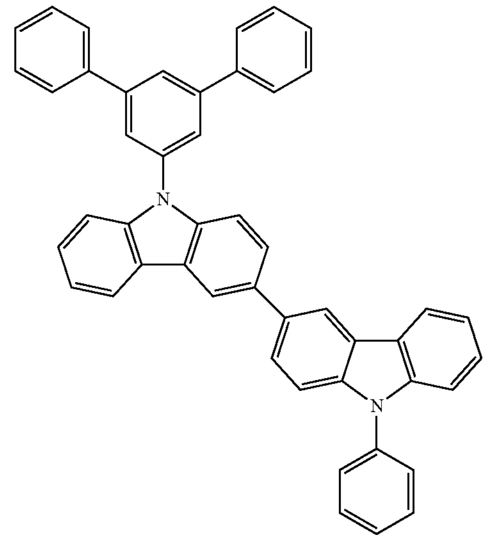
H-H55
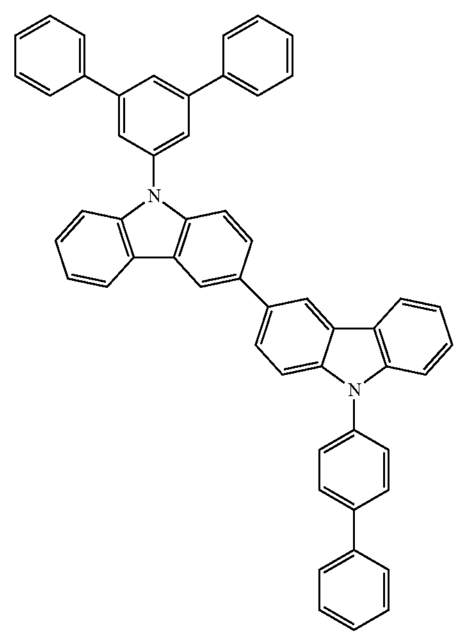

-continued
H-H56
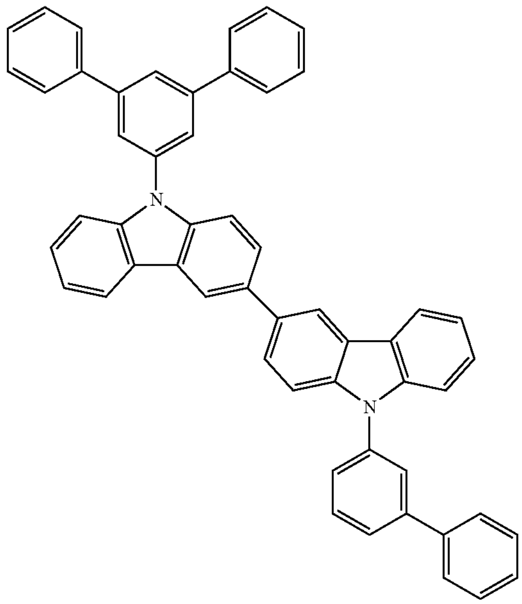
H-H57
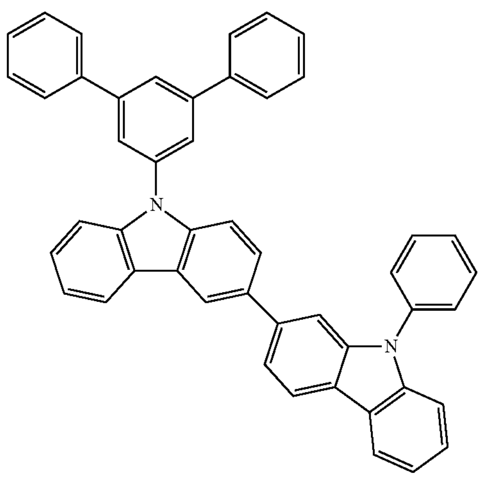
H-H58
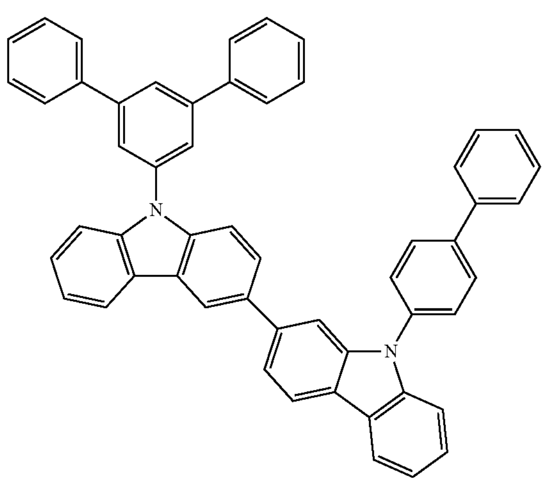
-continued
H-H59
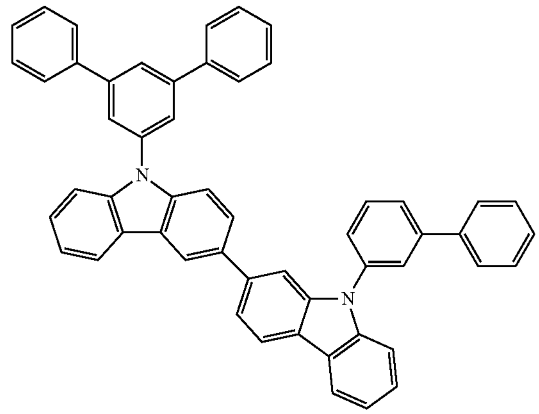
H-H60
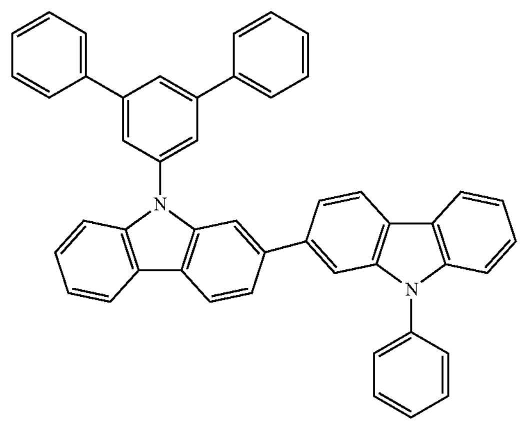
H-H61
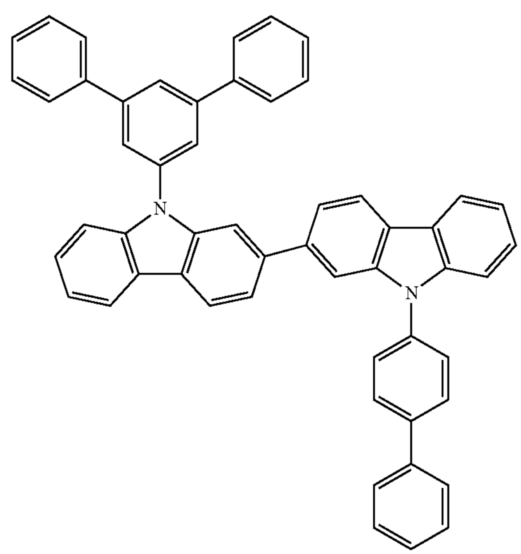

-continued
H-H62
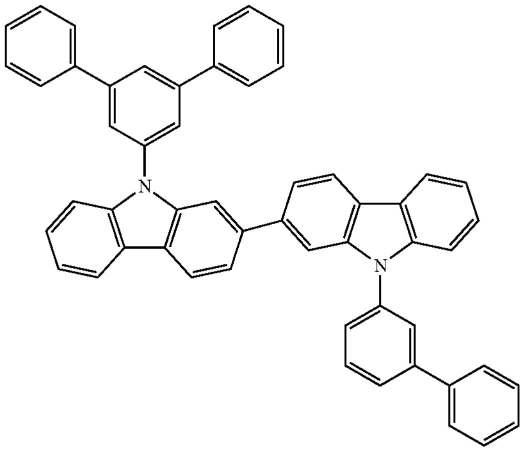
H-H63
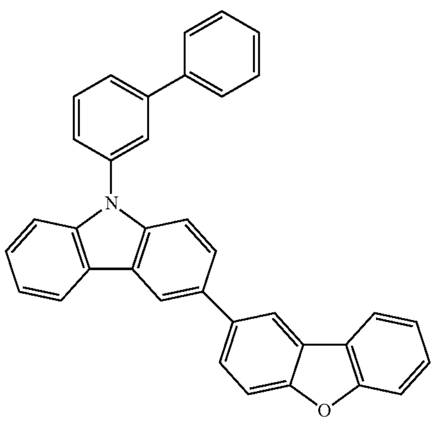
H-H64
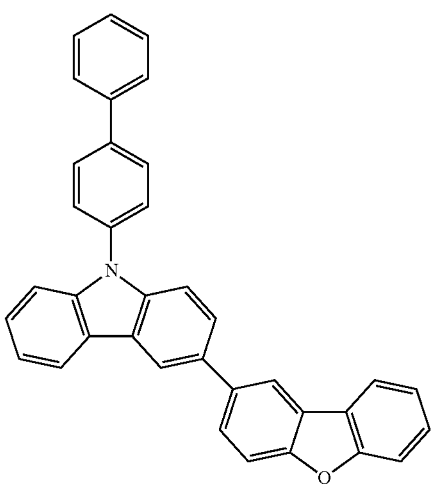
-continued
H-H65
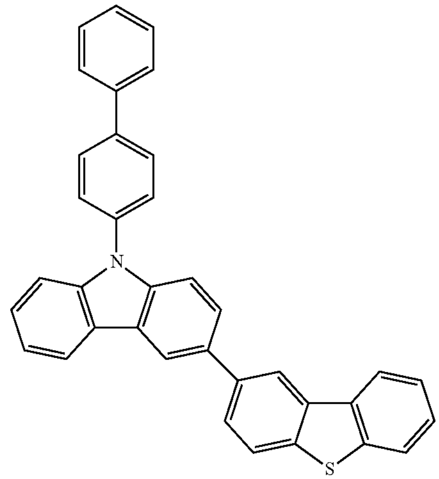
H-H66
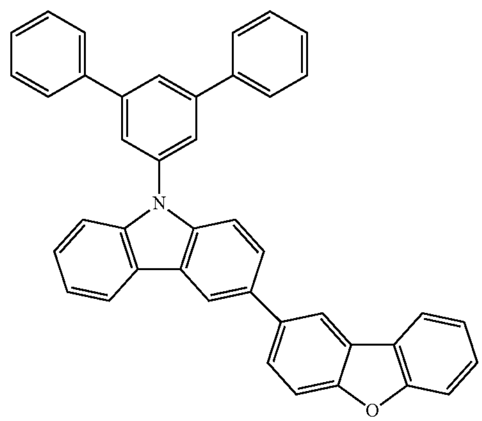
H-H67
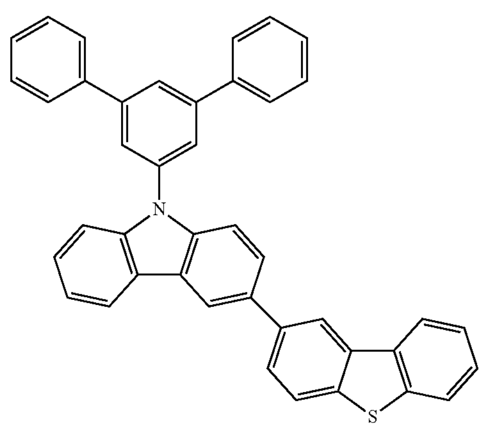

-continued
H-H68
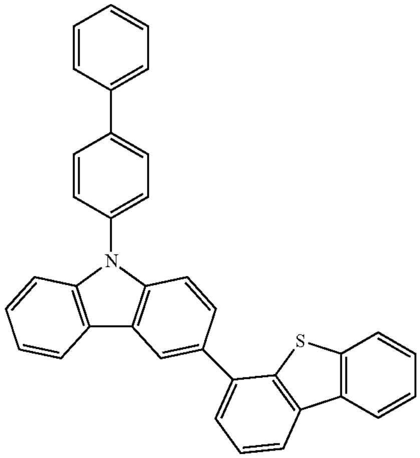
H-H69
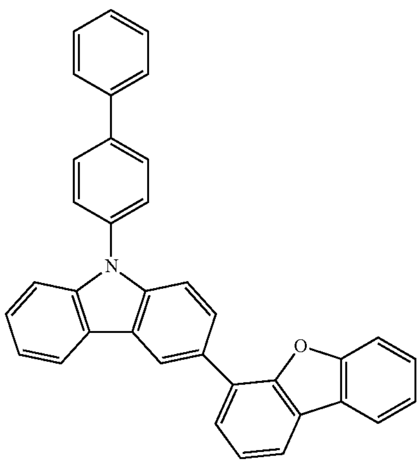
H-H70
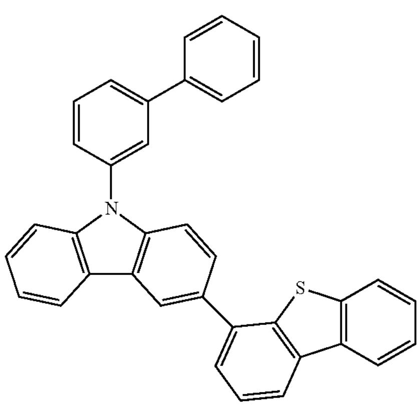
-continued
H-H71
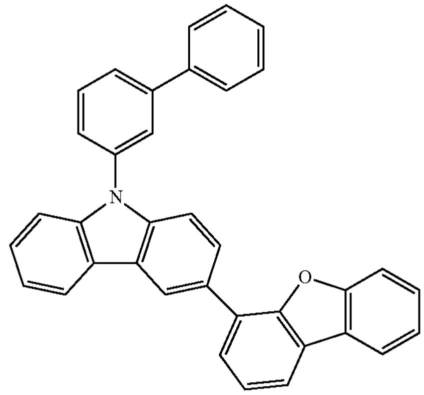
H-H72
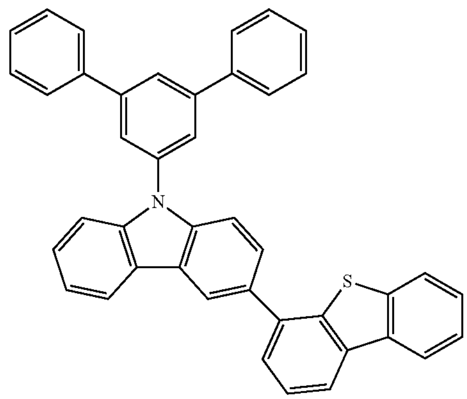
H-H73
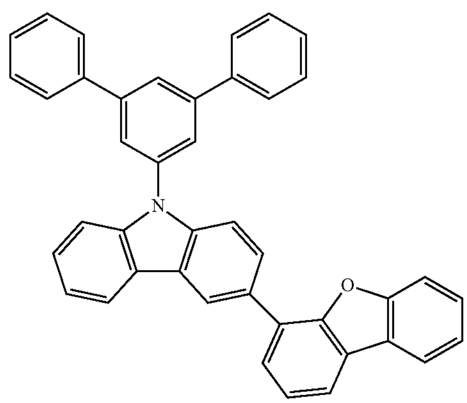
H-H74
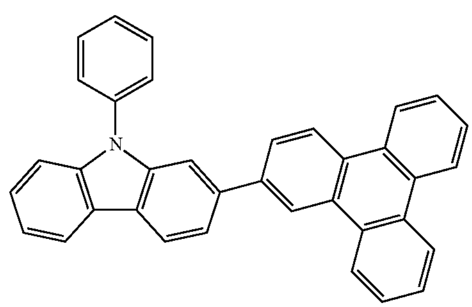

H-H75
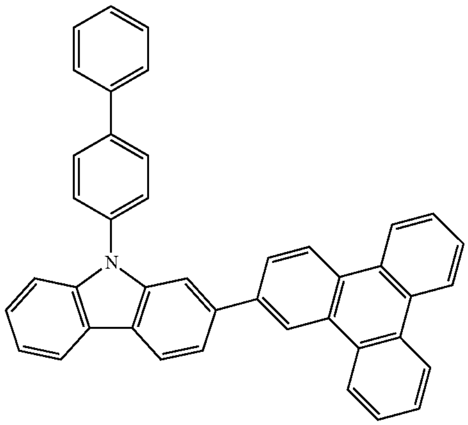
H-H76
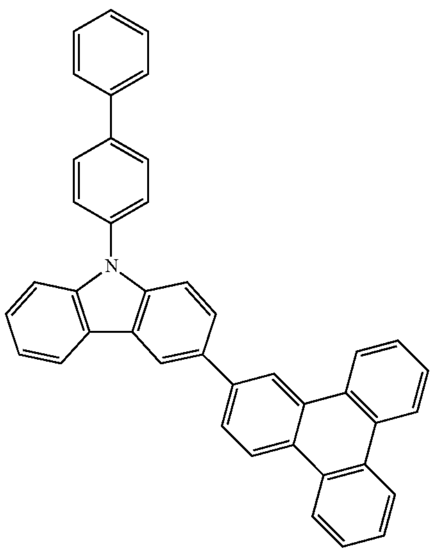
H-H77
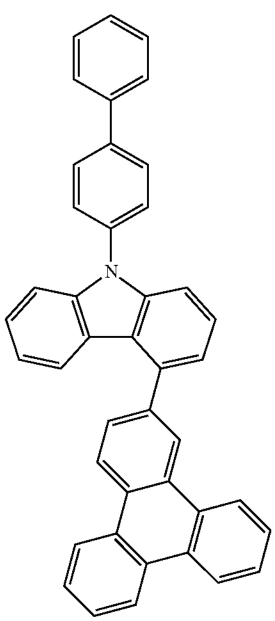
H-H78
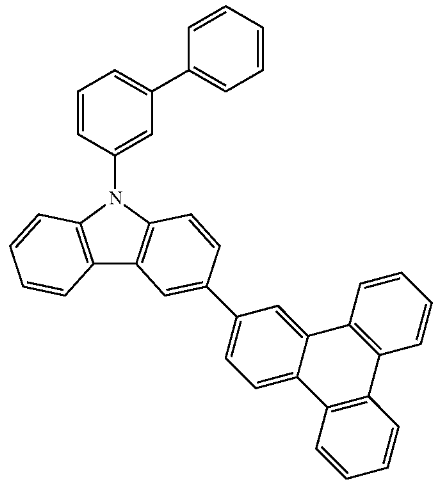
H-H79
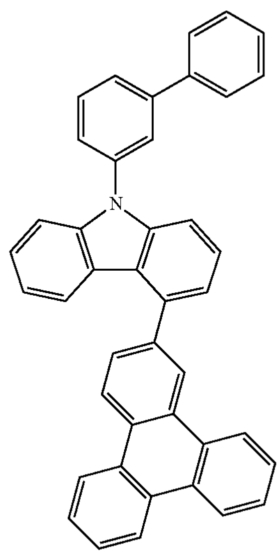
H-H80
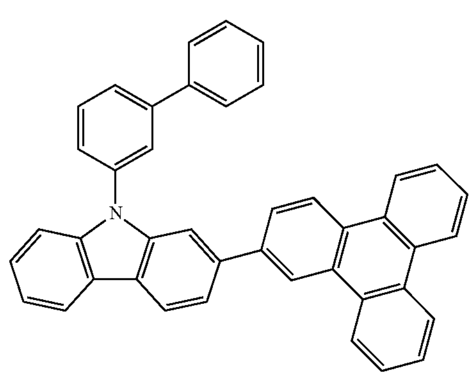

-continued
H-H81
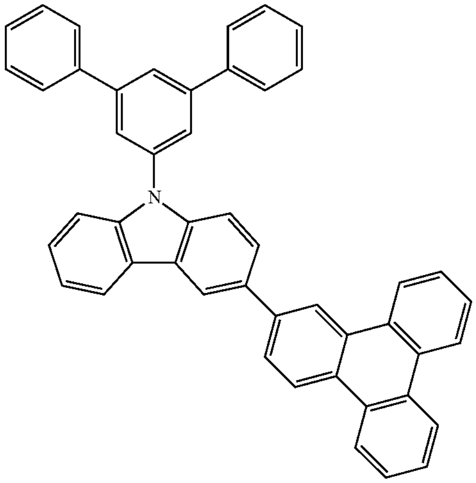
H-H82
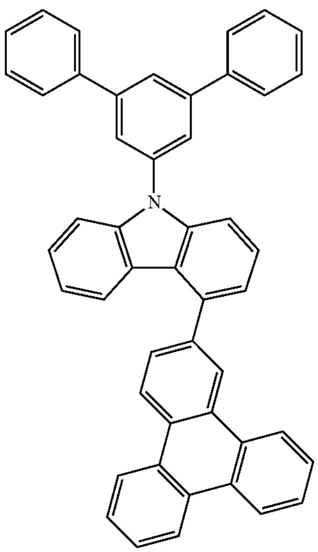
H-H83
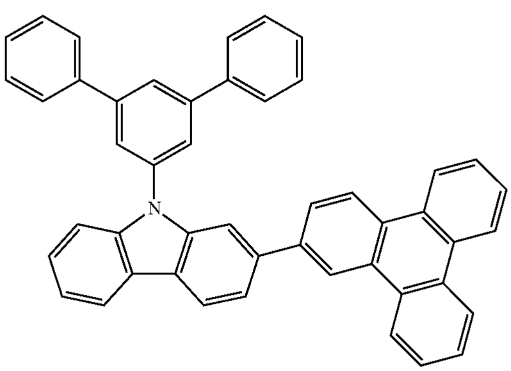
-continued
H-H84
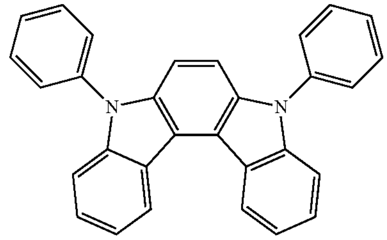
H-H85
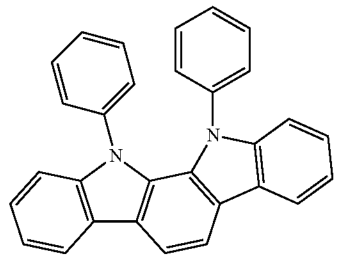
H-H86
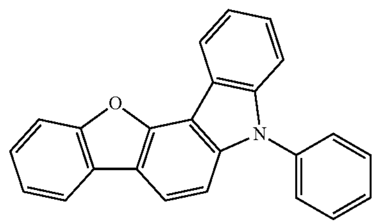
H-H87
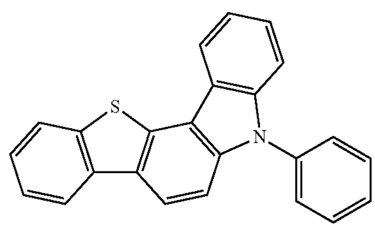
H-H88
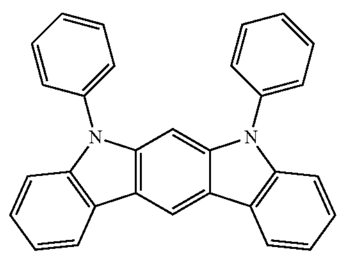
H-H89
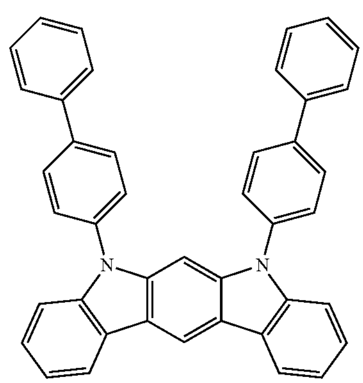

-continued
H-H90
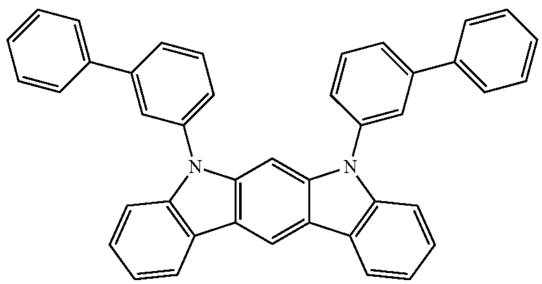
H-H91
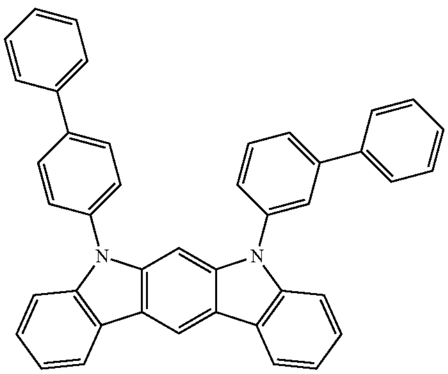
H-H92
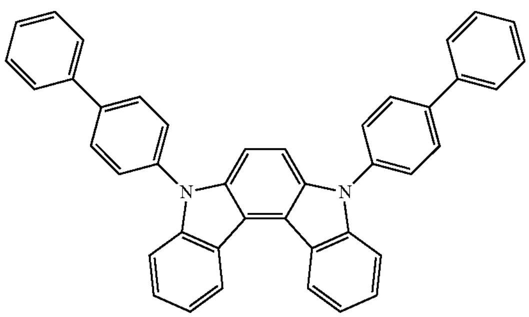
H-H93
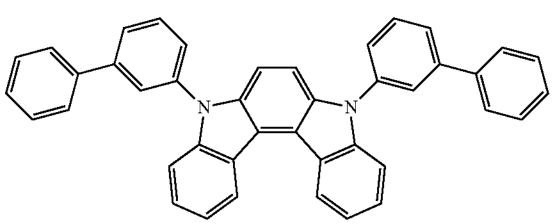
H-H94
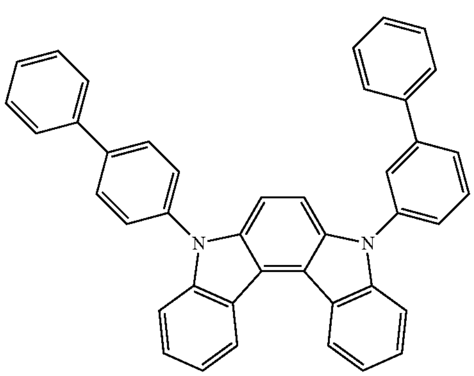
-continued
H-H95
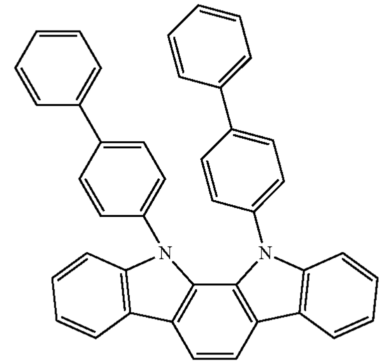
H-H96
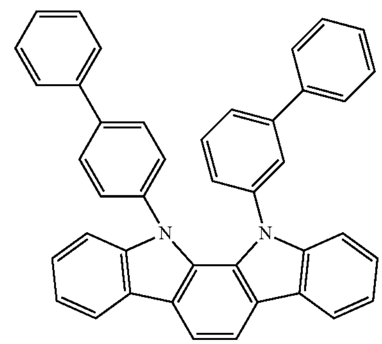
H-H97
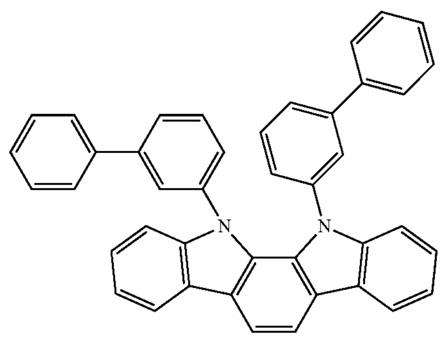
H-H98
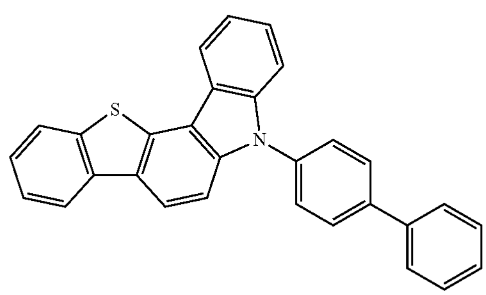
H-H99
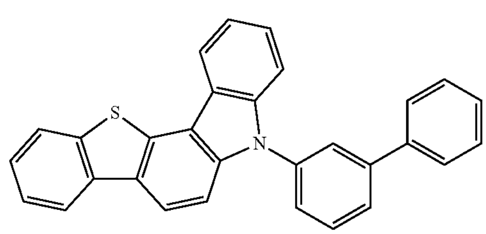

-continued

H-H100

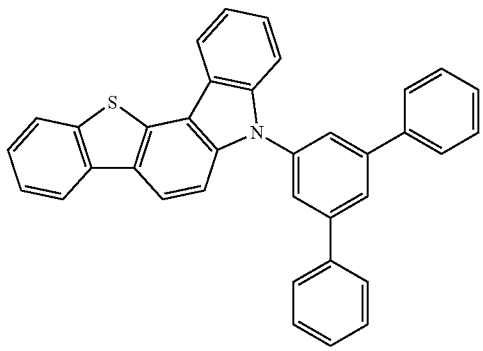

H-H101

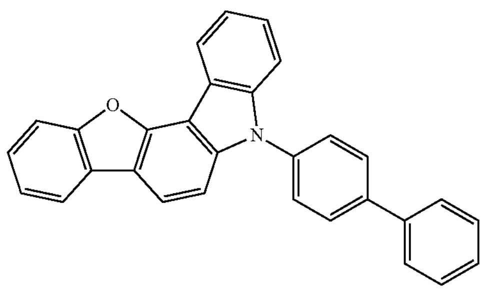

H-H102

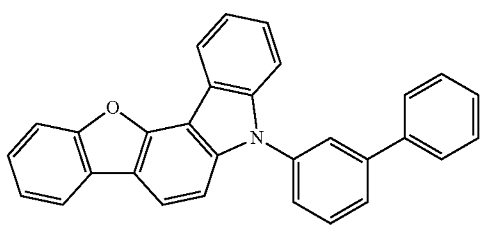

H-H103

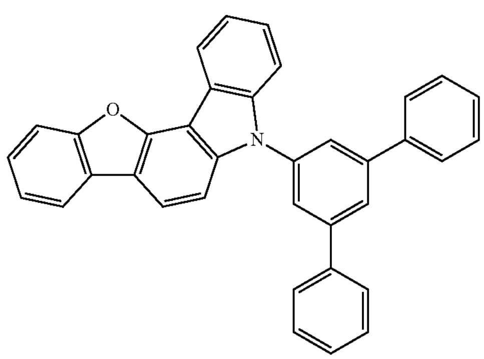

When the host is a mixture of an electron transporting host and a hole transporting host, a weight ratio of the electron transporting host to the hole transporting host may be in a range of about 1:9 to about 9:1, for example, about 2:8 to about 8:2, or for example, about 4:6 to about 6:4. When a weight ratio of the electron transporting host to the hole transporting host is within any of these ranges, holes and electrons transport balance into the emission layer 15 may be achieved.

In an embodiment, the electron transporting host may not be BCP, Bphene, B3PYMPM, 3P-T2T, BmPyPb, TPBi, 3TPYMB, and BSFM:

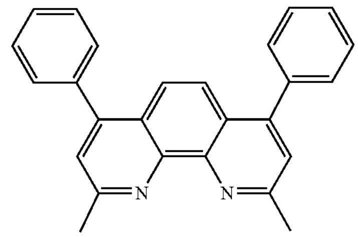

BCP

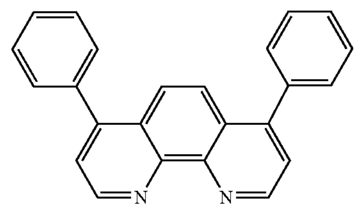

Bphen

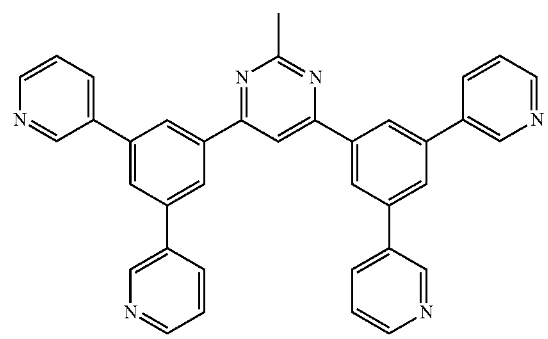

B3PYMPM

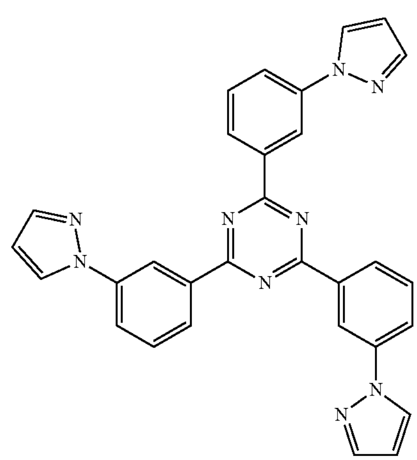

3P-T2T

-continued

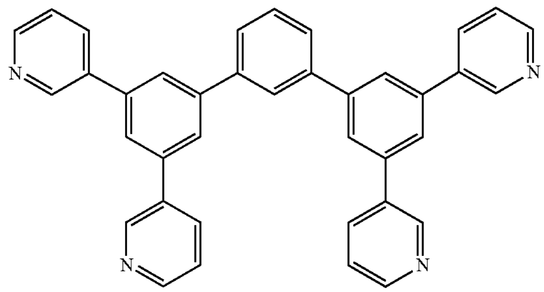

BmPyPb

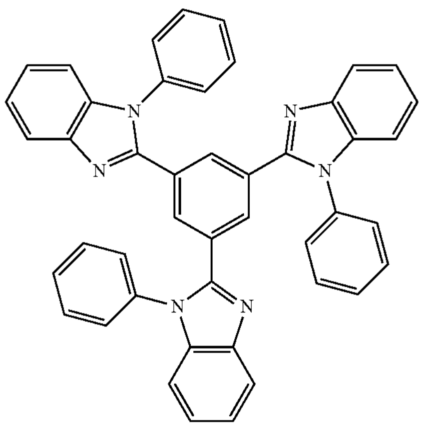

TPBi

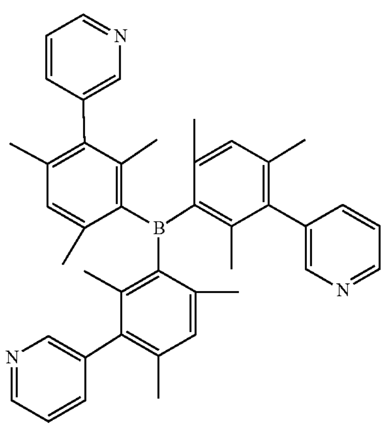

3TPYMB

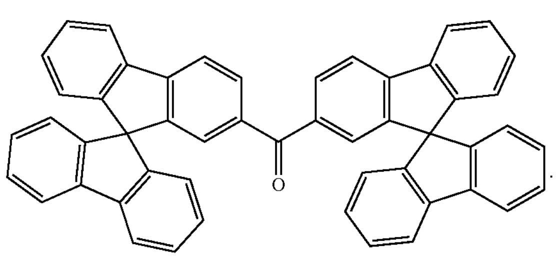

BSFM

In one or more embodiments, the hole transporting host may not be mCP, CBP and an amine-containing compound:

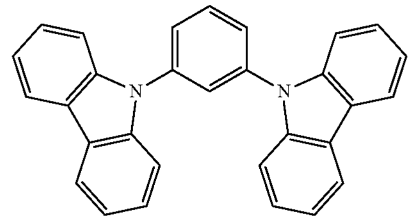

mCP

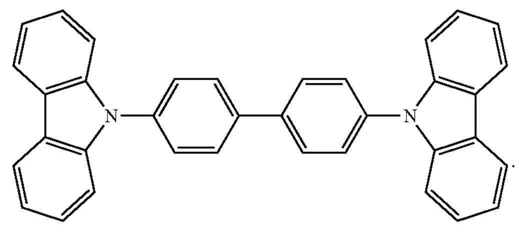

CBP

Hole transport region 12

In the organic light-emitting device 10, the hole transport region 12 may be disposed between the first electrode 11 and the emission layer 15.

The hole transport region 12 may have a single-layered structure or a multi-layered structure.

For example, the hole transport region 12 may have a structure of hole injection layer, a structure of hole transport layer, a structure of hole injection layer/hole transport layer, a structure of hole injection layer/first hole transport layer/second hole transport layer, a structure of hole transport layer/intermediate layer, a structure of hole injection layer/hole transport layer/intermediate layer, a structure of hole transport layer/electron blocking layer, or a structure of hole injection layer/hole transport layer/electron blocking layer, but embodiments are not limited thereto.

The hole transport region 12 may include a compound having hole transport characteristics.

For example, the hole transport region 12 may include an amine-based compound.

In an embodiment, the hole transport region 12 may include at least one compound selected from compounds represented by Formulae 201 to 205, but embodiments are not limited thereto:

Formula 201

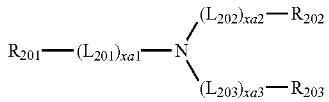

Formula 202

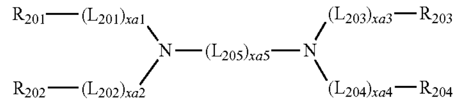

Formula 203

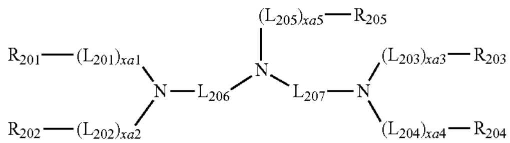

Formula 204

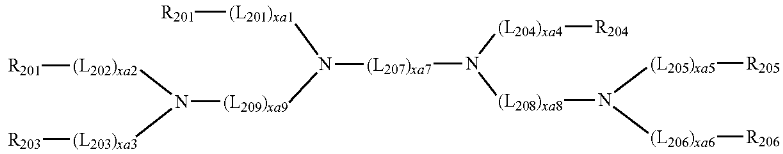

Formula 205

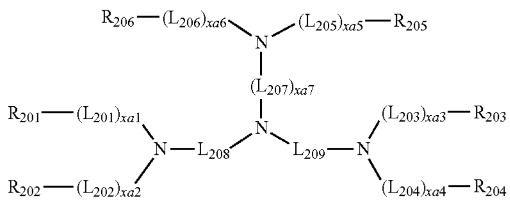

wherein in Formulae 201 to 205, $L_{201}$ to $L_{200}$ may each independently be selected from *—O—*', *—S—*', a substituted or unsubstituted $C_5$-$C_{60}$ carbocyclic group and a substituted or unsubstituted $C_1$-$C_{60}$ heterocyclic group, xa1 to xa9 may each independently be an integer from 0 to 5, $R_{201}$ to $R_{206}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, and a substituted or unsubstituted monovalent non-aromatic condensed heteropolycyclic group, and two adjacent groups selected from $R_{201}$ to $R_{206}$ may optionally be bound via a single bond, a dimethyl-methylene group, or a diphenyl-methylene group.

In some embodiments, $L_{201}$ to $L_{200}$ may be selected from a benzene group, a heptalene group, an indene group, a naphthalene group, an azulene group, a an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and —$Si(Q_{11})(Q_{12})(Q_{13})$, xa1 to xa9 may be each independently selected from 0, 1, and 2, and $R_{201}$ to $R_{206}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indenocarbazolyl group, an indolocarbazolyl group, a benzofurocarbazolyl group, and a benzothienocarbazolyl group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{11}$ to $Q_{13}$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

According to an embodiment, the hole transport region 12 may include a carbazole-containing amine-based compound.

In one or more embodiments, the hole transport region 12 may include a carbazole-containing amine-based compound and a carbazole-free amine-based compound.

The carbazole-containing amine-based compound may be, for example, selected from compounds represented by Formula 201 including a carbazole group and further including at least one selected from a dibenzofuran group, a dibenzothiophene group, a fluorene group, a spiro-bifluorene group, an indenocarbazole group, an indolocarbazole group, a benzofurocarbazole group, and a benzothienocarbazole group.

The carbazole-free amine-based compound may be, for example, selected from compounds represented by Formula 201 not including a carbazole group and including at least one selected from a dibenzofuran group, a dibenzothiophene group, a fluorene group, and a spiro-bifluorene group.

In one or more embodiments, the hole transport region 12 may include at least one of Compounds represented by Formula 201 or 202.

In an embodiment, the hole transport region 12 may include at least one selected from Compounds represented by Formulae 201-1, 202-1 and 201-2, but embodiments are not limited thereto:

Formula 201-1

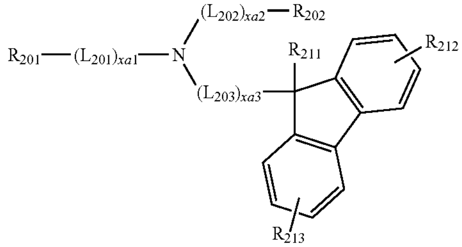

-continued

Formula 202-1

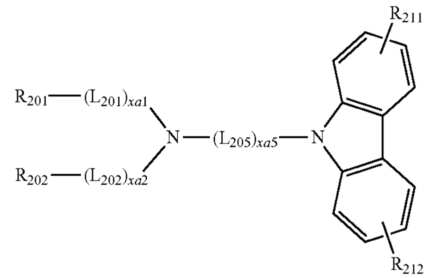

Formula 201-2

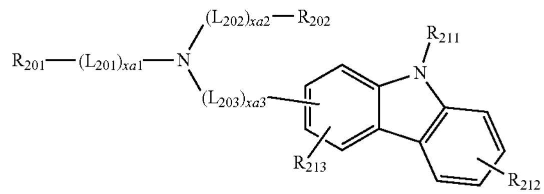

wherein in Formulae 201-1, 202-1, and 201-2, $L_{201}$ to $L_{203}$, $L_{205}$, xa1 to xa3, xa5, $R_{201}$, and $R_{202}$ may each be understood by referring to the descriptions for those provided herein, and $R_{211}$ to $R_{213}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a dimethylfluorenyl group, a diphenylfluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In some embodiments, the hole transport region 12 may include at least one selected from Compounds HT1 to HT39, but embodiments are not limited thereto:

HT1

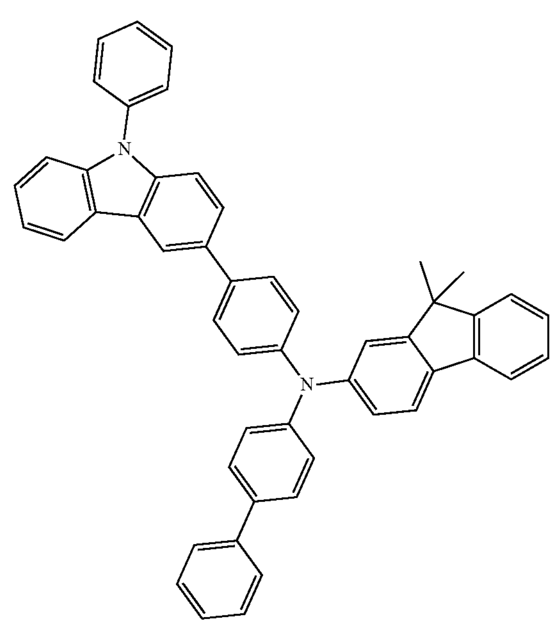

-continued
HT2
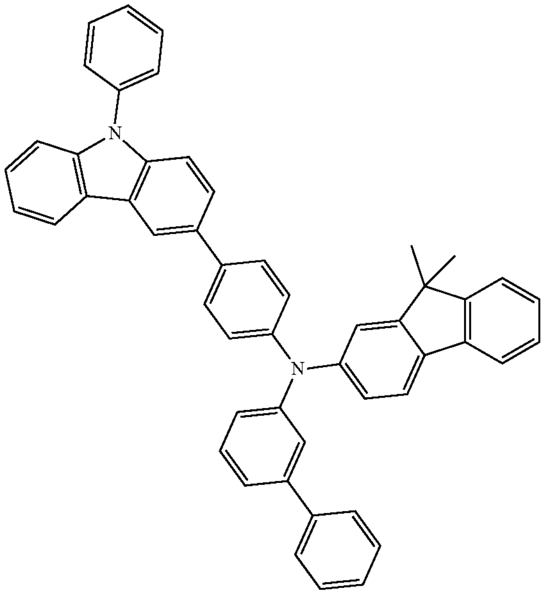
HT3
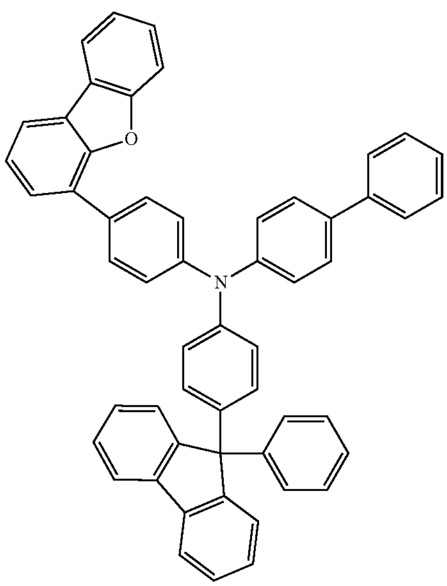
-continued
HT4
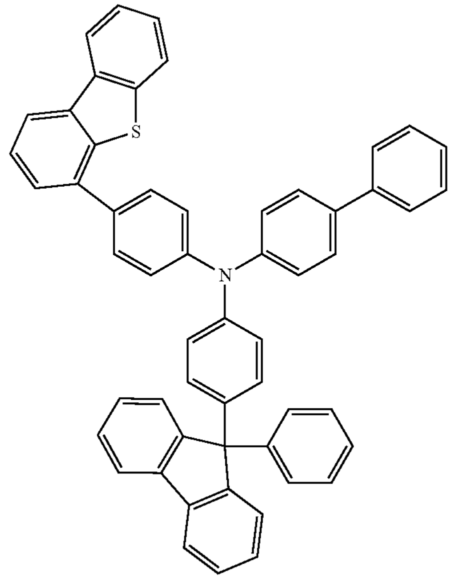
HT5
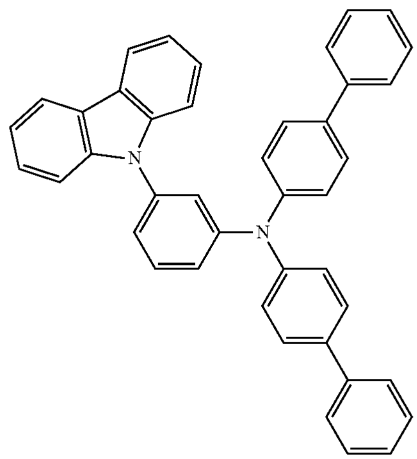
HT6
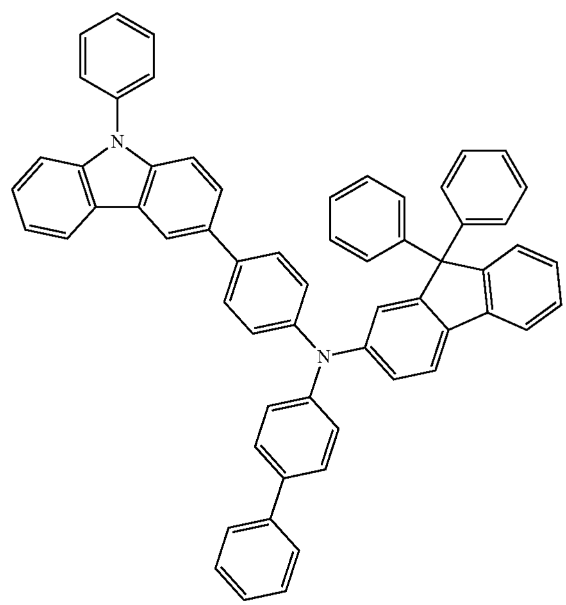

-continued
HT7
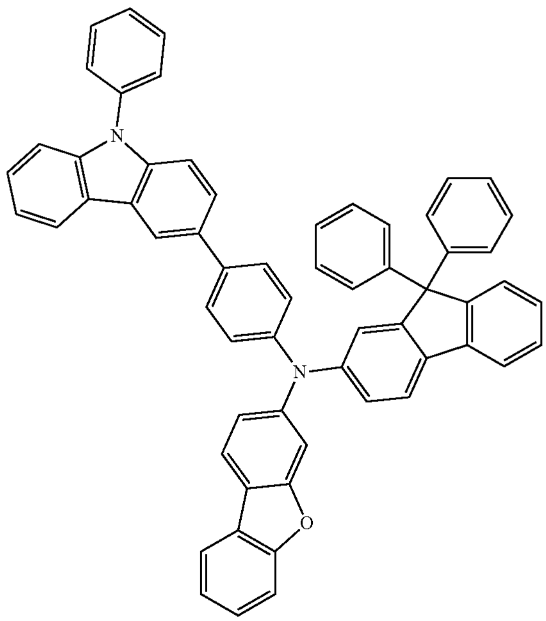
HT8
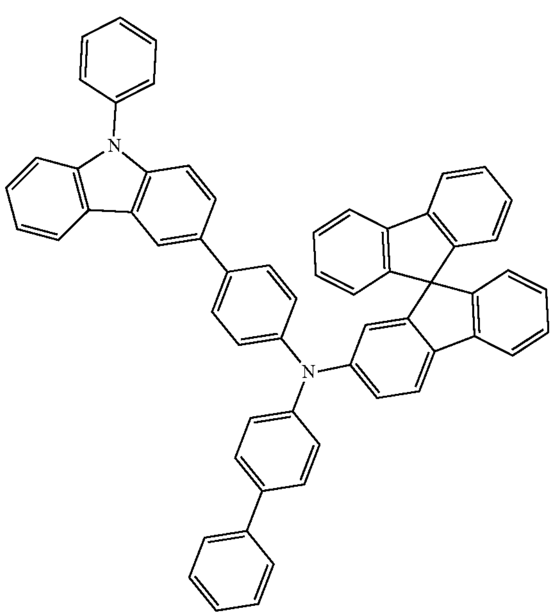
-continued
HT9
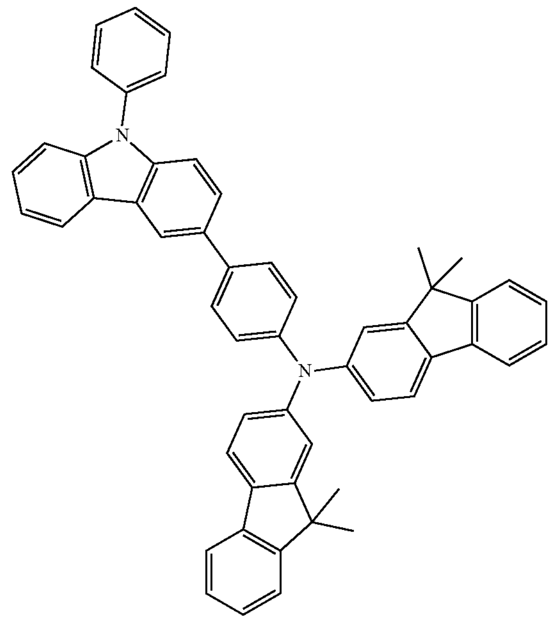
HT10
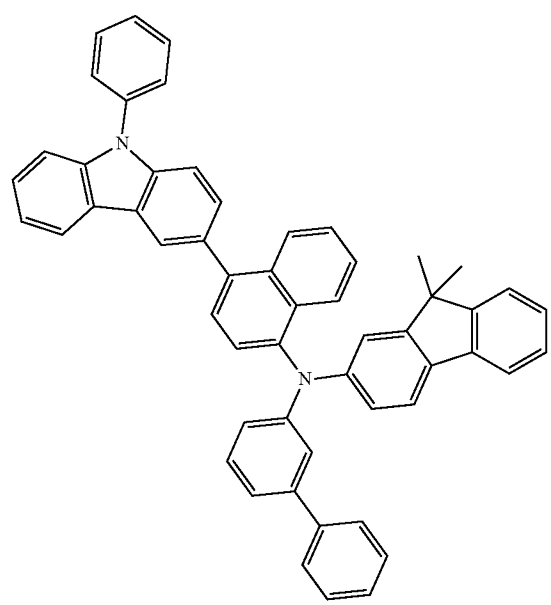

-continued
HT11
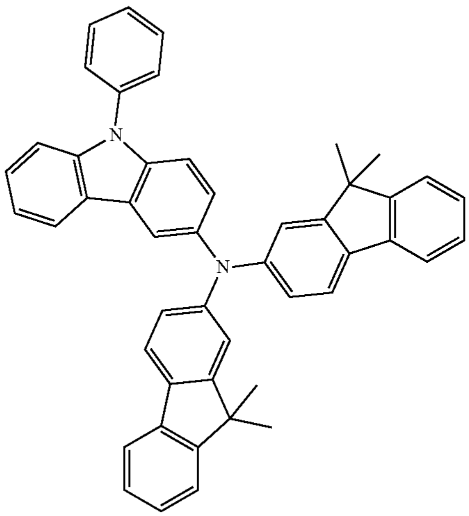
-continued
HT12
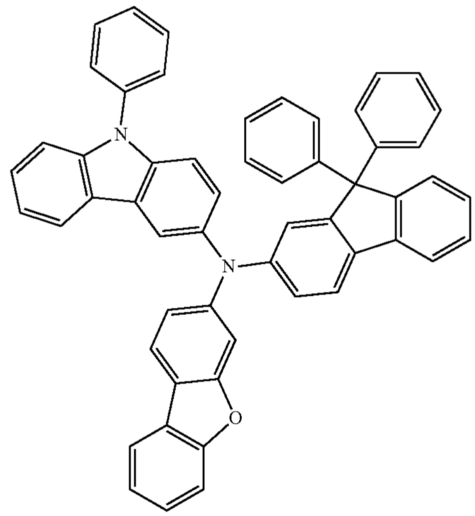
HT13
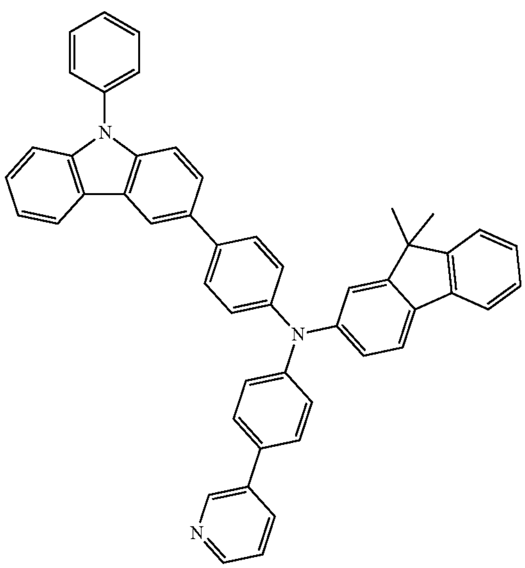
HT14
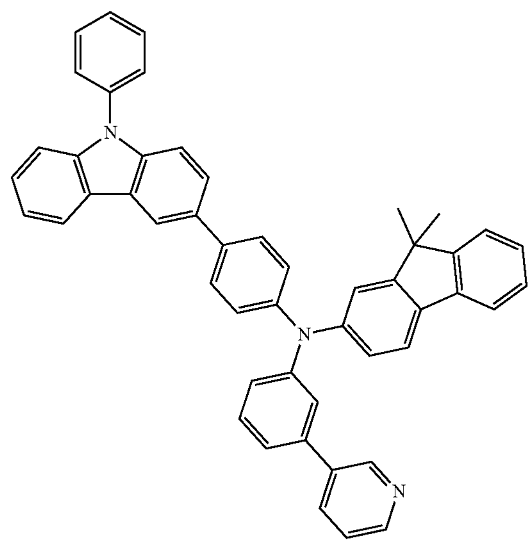
HT15
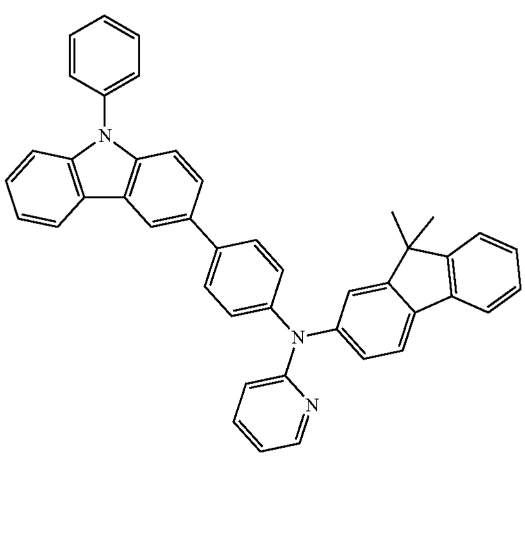
HT16
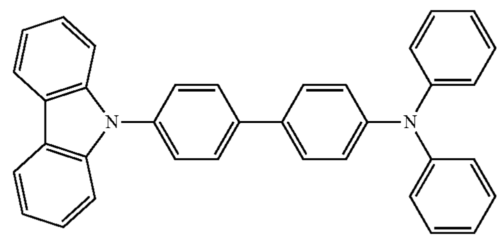

-continued
HT17
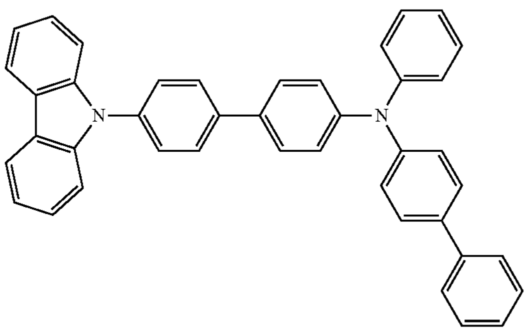
HT18
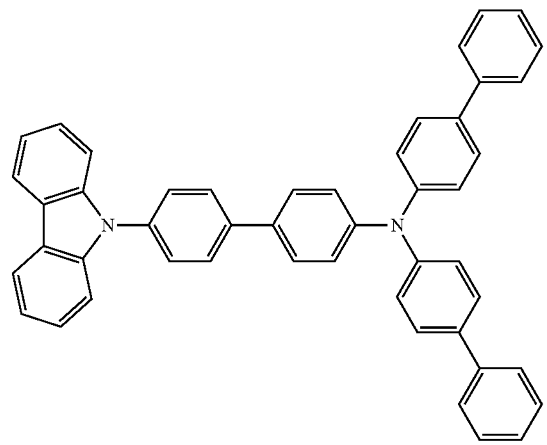
HT19
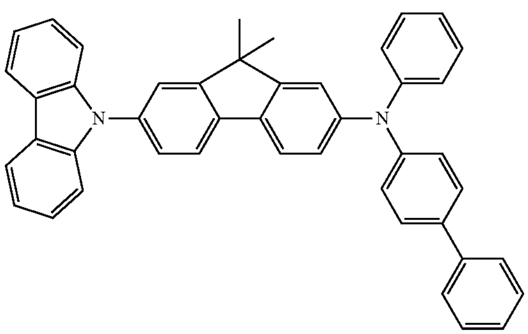
HT20
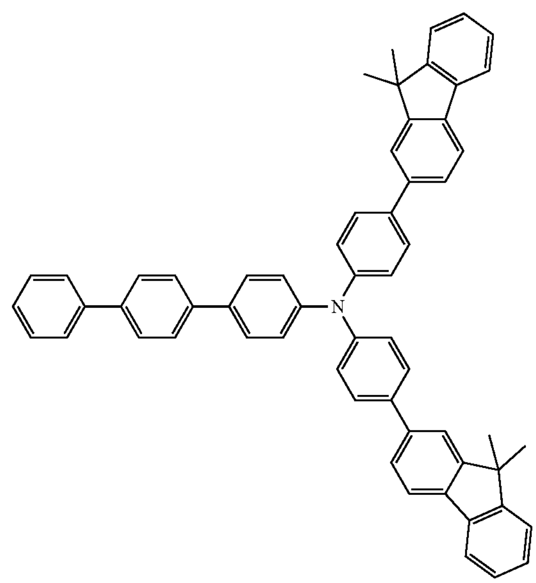
HT21
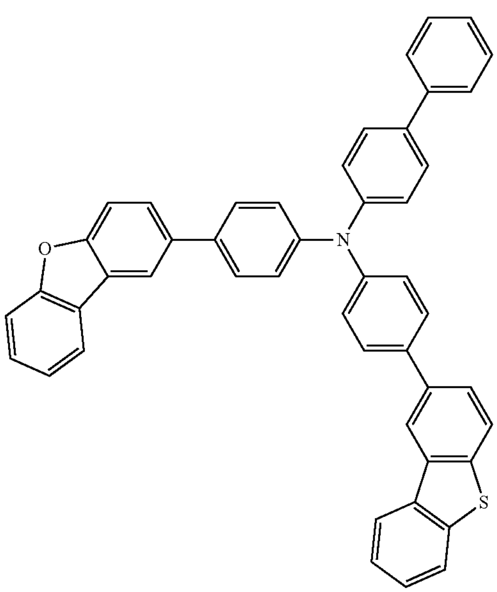
HT22
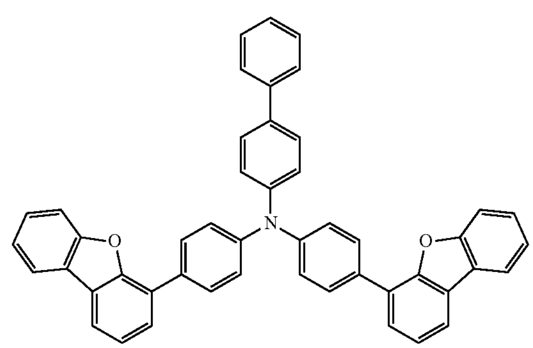

-continued
HT23
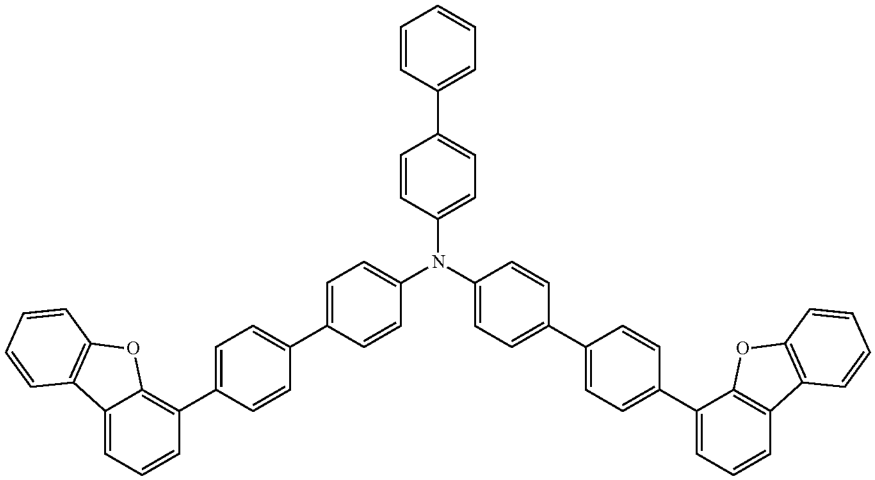
HT24
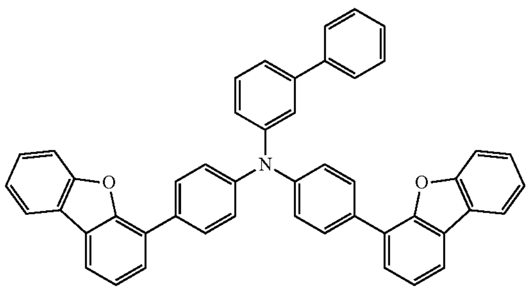
HT25
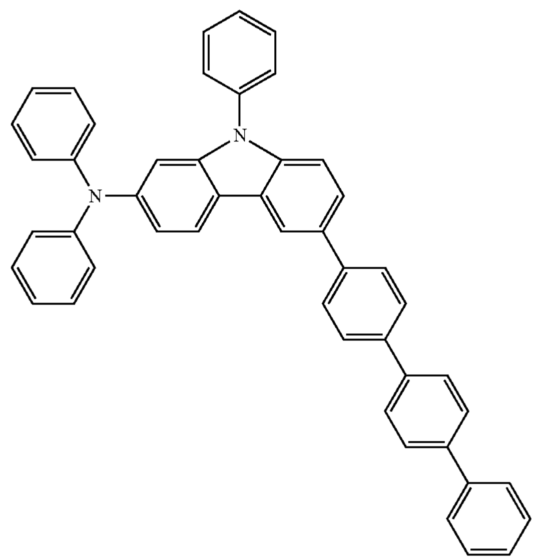
HT26
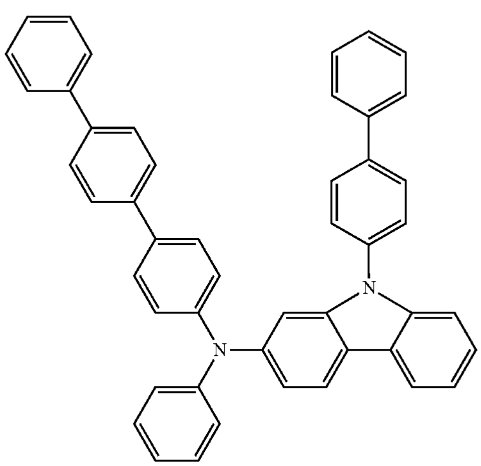
HT27
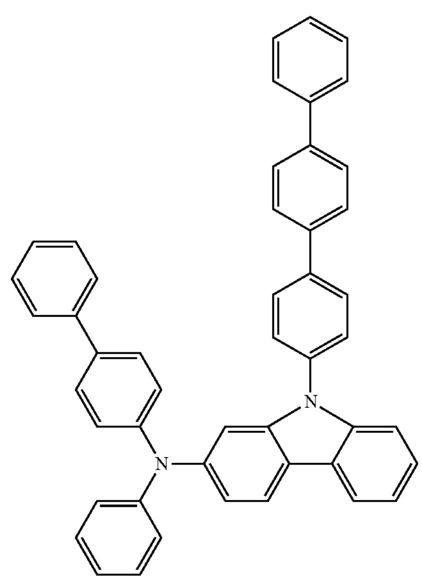

-continued
HT28
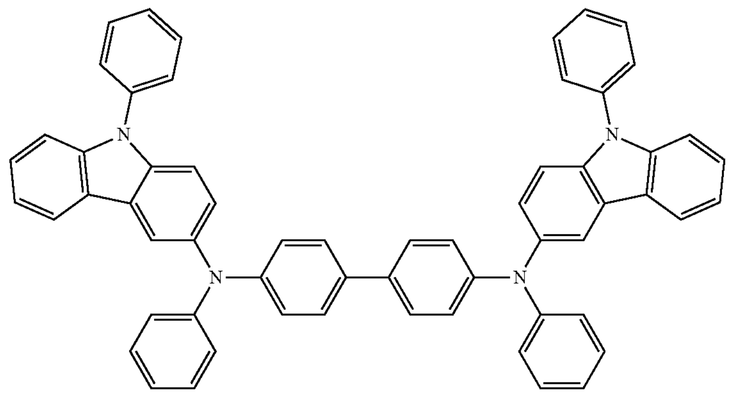
HT29
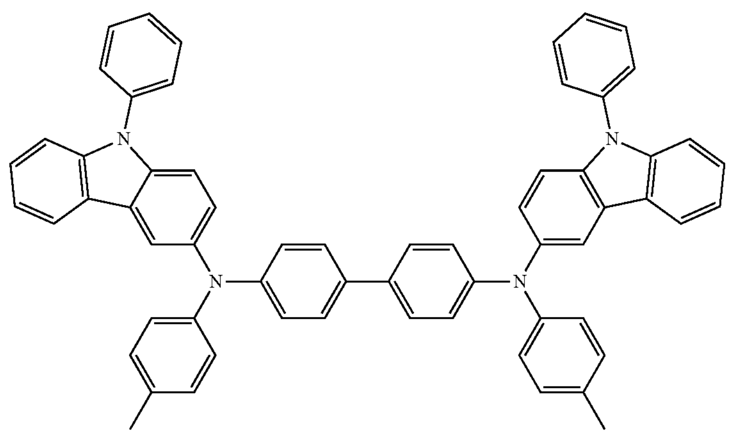
HT30
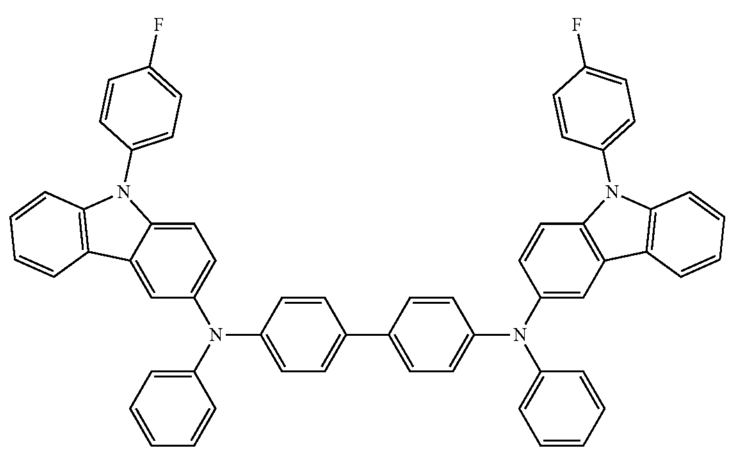

-continued
HT31
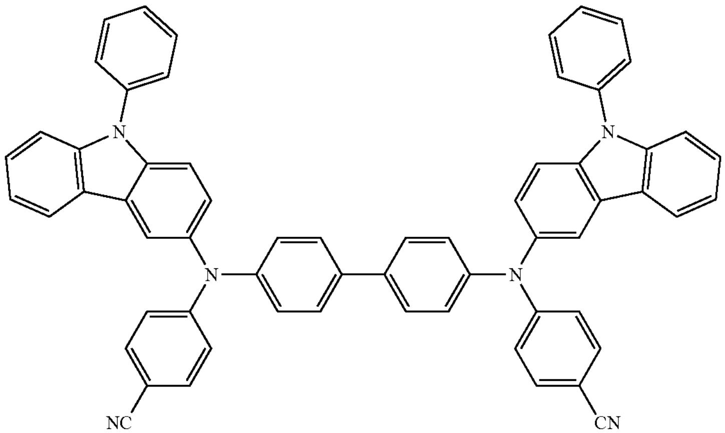
HT32
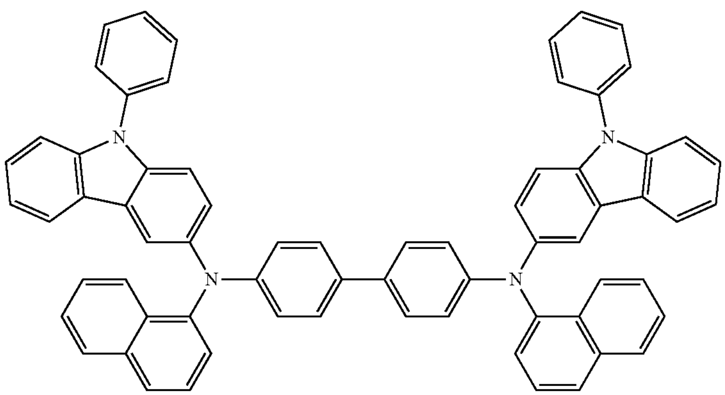
HT33
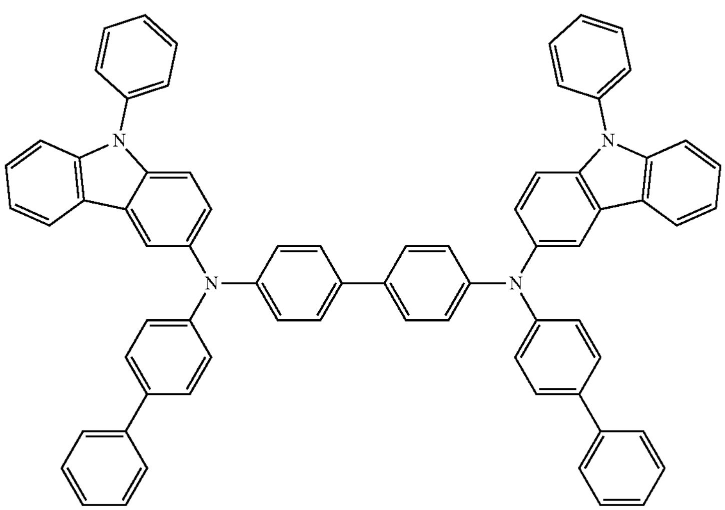

-continued

HT34

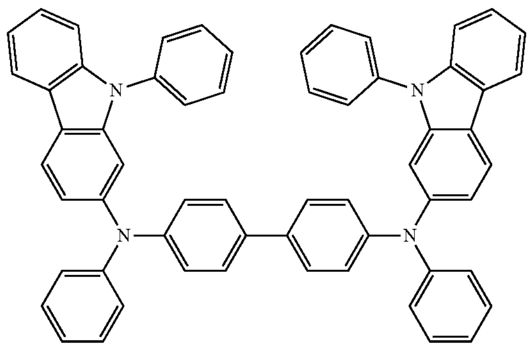

HT35

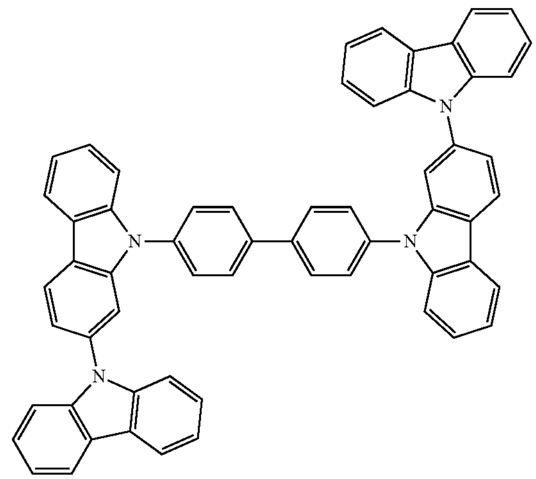

HT36

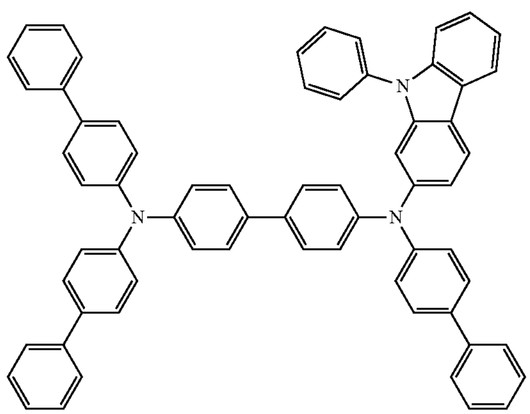

HT37

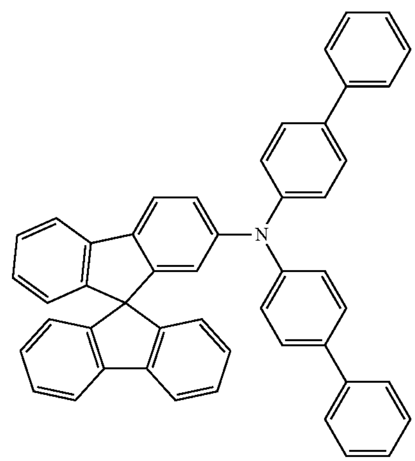

HT38

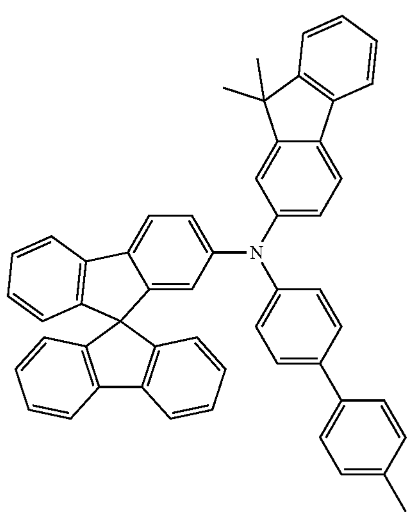

HT39

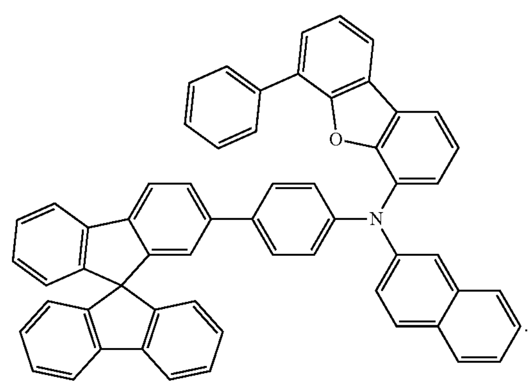

The hole transport region 12 of the organic light-emitting device 10 may further include a p-dopant. When the hole transport region 12 further includes a p-dopant, the hole transport region 12 may have a structure including a matrix (for example, at least one compound represented by Formulae 201 to 205) and a p-dopant included in the matrix. The p-dopant may be homogeneously or non-homogeneously doped in the hole transport region 12.

In some embodiments, a LUMO energy level of the p-dopant may be −3.5 eV or less.

The p-dopant may include at least one selected from a quinone derivative, a metal oxide, and a cyano group-containing compound, but embodiments are not limited thereto.

In some embodiments, the p-dopant may include at least one selected from a quinone derivative such as tetracyanoquinodimethane (TCNQ), 2,3,5,6-tetrafluoro-7,7,8,8-tetracyanoquinodimethane (F4-TCNQ), and F6-TCNNQ;

a metal oxide, such as tungsten oxide or molybdenum oxide;

1,4,5,8,9,12-hexaazatriphenylene-hexacarbonitrile (HAT-CN); and a compound represented by Formula 221, but embodiments are not limited thereto:

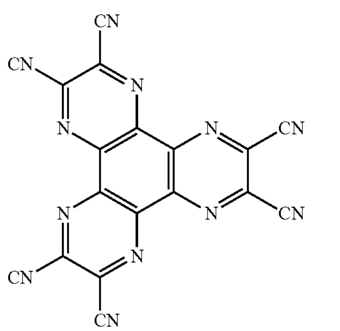

HAT-CN

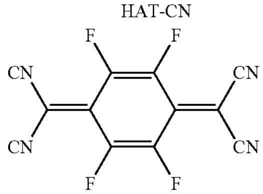

F4-TCNQ

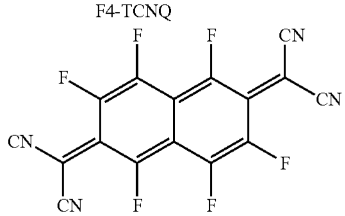

F6-TCNNQ

Formula 221

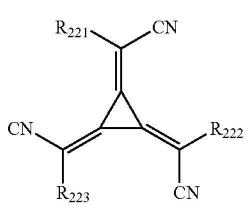

wherein, in Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, provided that at least one selected from $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

A thickness of the hole transport region 12 may be in a range of about 100 Angstroms (Å) to about 10,000 Å, for example, about 400 Å to about 2,000 Å, and a thickness of the emission layer 15 may be in a range of about 100 Å to about 3,000 Å, for example, about 300 Å to about 1,000 Å. While not wishing to be bound by theory, it is understood that when the thicknesses of the hole transport region 12 and the emission layer 15 are within any of these ranges, satisfactory hole transporting characteristics and/or luminescence characteristics may be obtained without a substantial increase in driving voltage.

Electron Transport Region 17

In the organic light-emitting device 10, the electron transport region 17 may be disposed between the emission layer 15 and the second electrode 19.

The electron transport region 17 may have a single-layered structure or a multi-layered structure.

For example, the electron transport region 17 may have a structure of electron transport layer, a structure of electron transport layer/electron injection layer, a structure of buffer layer/electron transport layer, a structure of hole blocking layer/electron transport layer, a structure of buffer layer/electron transport layer/electron injection layer, or a structure of hole blocking layer/electron transport layer/electron injection layer, but embodiments are not limited thereto. The electron transport region 17 may also include an electron control layer.

The electron transport region 17 may include a known electron transport material.

The electron transport region 17 (for example, the buffer layer, the hole blocking layer, the electron control layer, or the electron transport layer in the electron transport region 17) may include a metal-free compound including at least one π electron-depleted nitrogen-containing cyclic group. The π electron-depleted nitrogen-containing cyclic group may be understood by referring to the description for those provided herein. The electron transport region 17 may also include an electron control layer.

In some embodiments, the electron transport region may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a substituted or unsubstituted $C_5$-$C_{60}$ carbocyclic group or a substituted or unsubstituted $C_1$-$C_{60}$ heterocyclic group, xe11 may be 1, 2, or 3, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(═O)($Q_{601}$), —S(═O)$_2$($Q_{601}$), and —P(═O)($Q_{601}$)($Q_{602}$), wherein $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one selected from groups $Ar_{601}$ in the number of xe11 and groups $R_{601}$ in the number of xe21 may include the π electron-depleted nitrogen-containing cyclic group.

In an embodiment, ring $Ar_{601}$ and $L_{601}$ in Formula 601 may be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(═O)$_2$($Q_{31}$), and —P(═O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or greater, at least two groups $Ar_{601}$ may be linked via a single bond.

In one or more embodiments, $Ar_{601}$ in Formula 601 may be an anthracene group.

In some embodiments, the compound represented by Formula 601 may be represented by Formula 601-1:

Formula 601-1

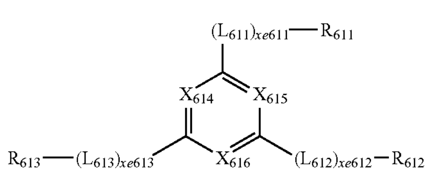

wherein, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each be understood by referring to the descriptions for $L_{601}$ provided herein, $xe_{611}$ to $xe_{613}$ may each be understood by referring to the descriptions for xe1 provided herein, $R_{611}$ to $R_{613}$ may each be understood by referring to the descriptions for $R_{601}$ provided herein, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, in Formulae 601 and 601-1, xe1 and xe611 to xe613, may each independently be 0, 1, or 2.

In one or more embodiments, in Formulae 601 and 601-1, $R_{601}$ and $R_{611}$ to $R_{613}$ may each independently be selected from a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(═O)$_2$(Q$_{601}$) and —P(═O)(Q$_{601}$)(Q$_{602}$), wherein Q$_{601}$ and Q$_{602}$ may each be understood by referring to the descriptions for those provided herein.

The electron transport region may include at least one compound selected from Compounds ET1 to ET36, but embodiments are not limited thereto:

ET1

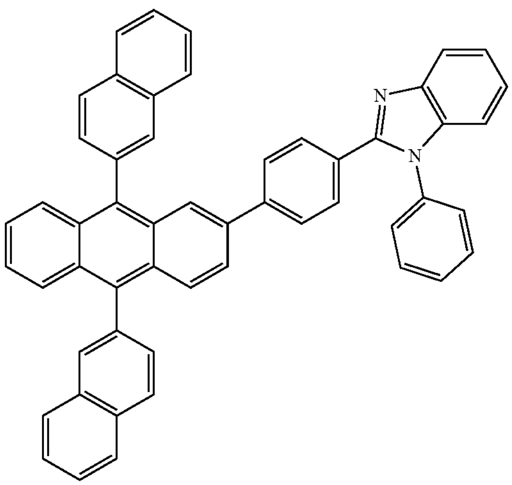

ET2

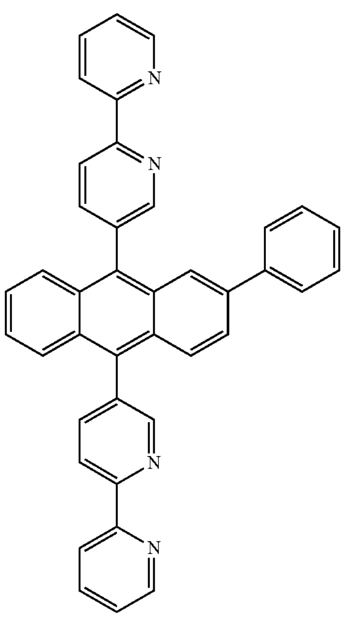

-continued

ET3

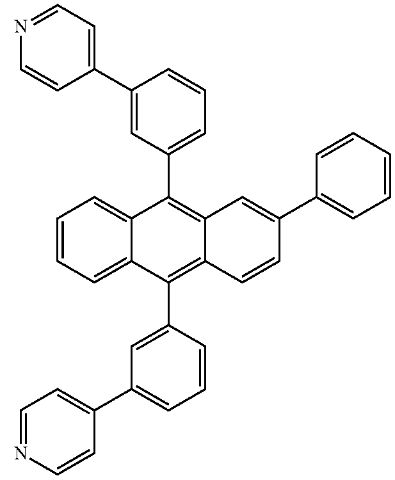

ET4

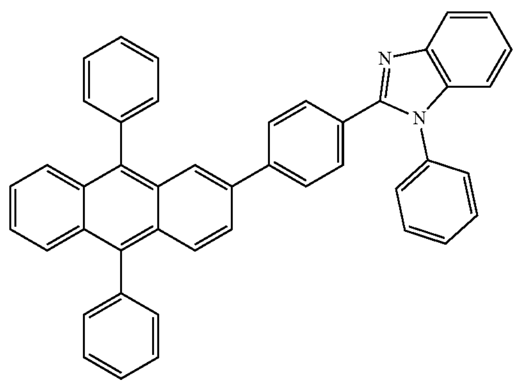

ET5

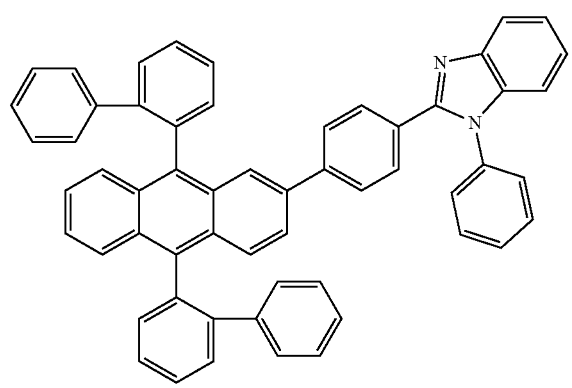

-continued
ET6
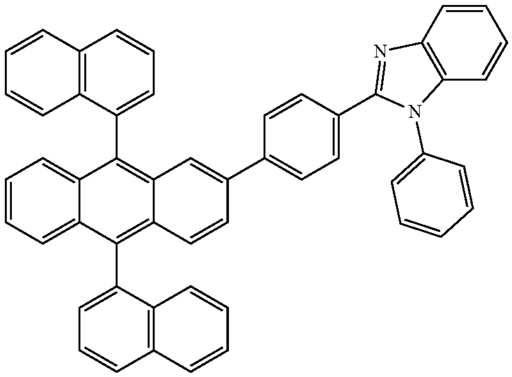
ET7
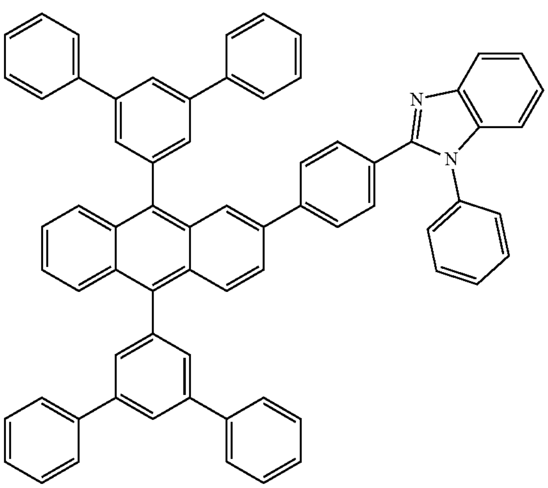
-continued
ET8
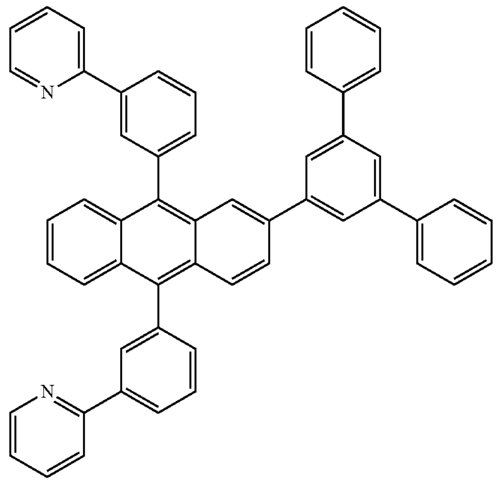
ET9
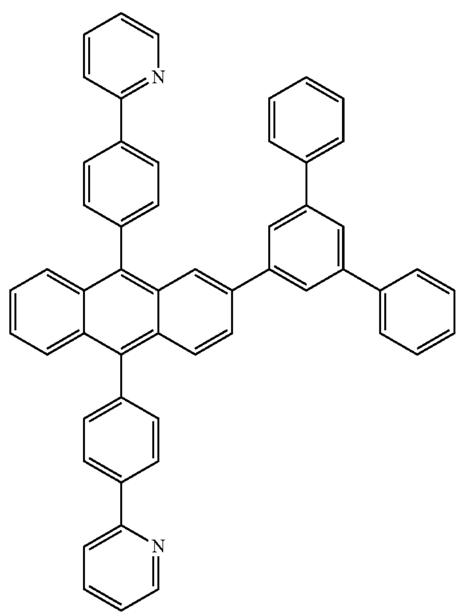

ET10
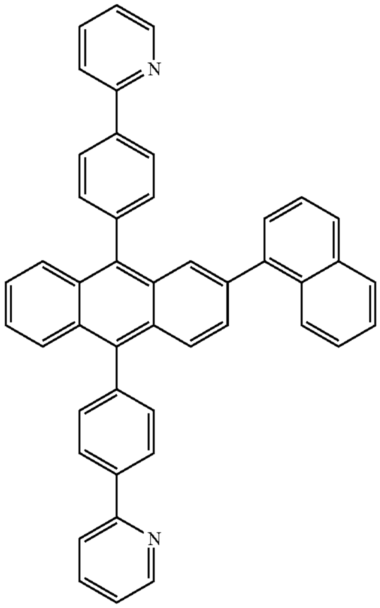
ET11
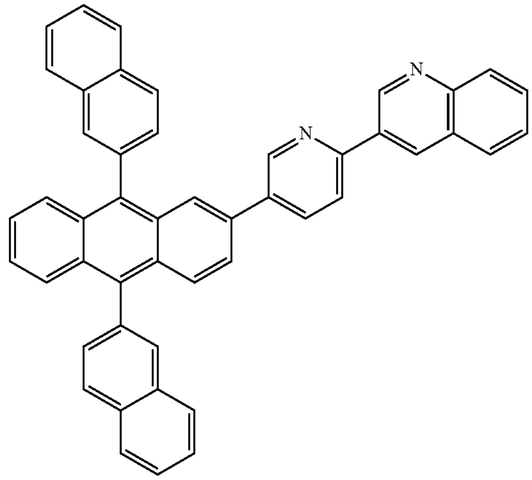
ET12
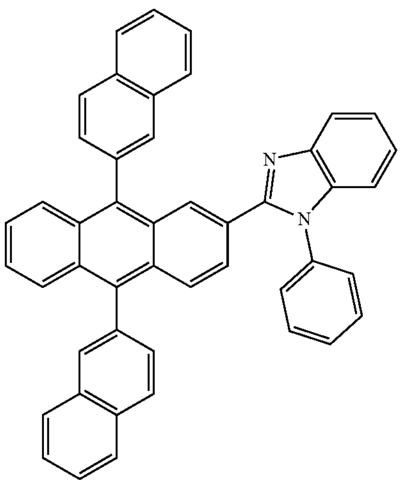
ET13
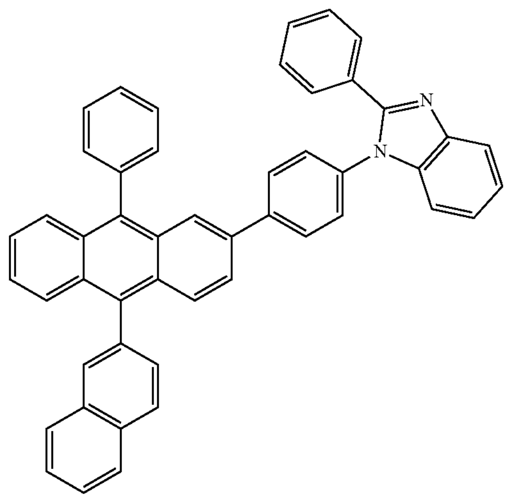
ET14
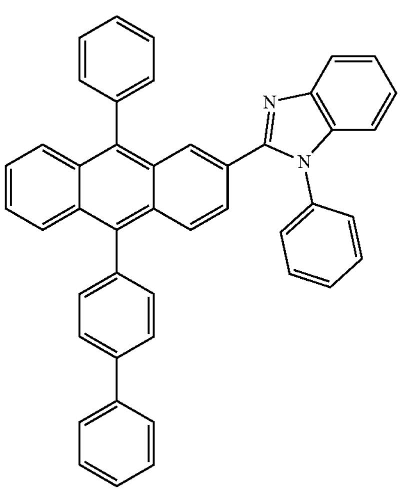
ET15
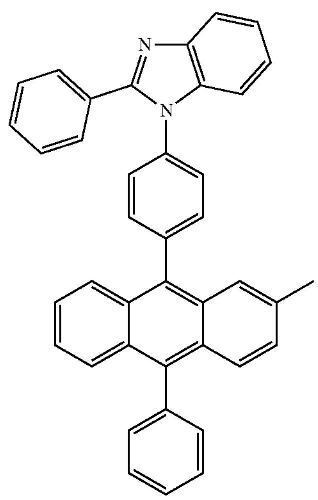

-continued
ET16
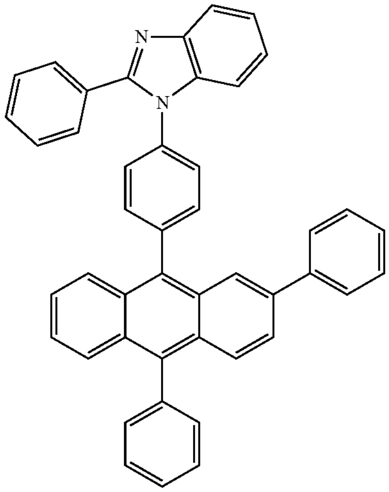
ET17
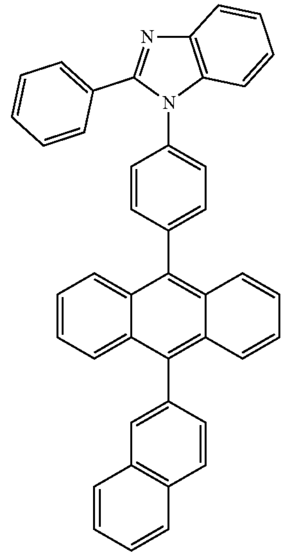
ET18
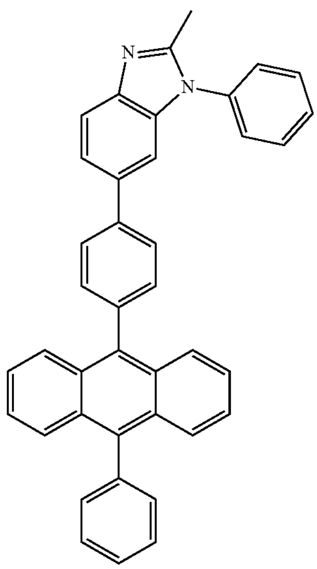
ET19
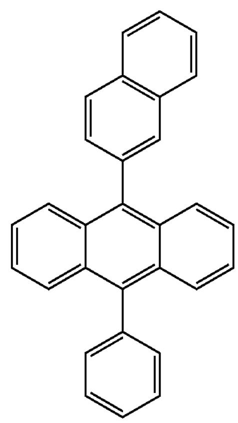
ET20
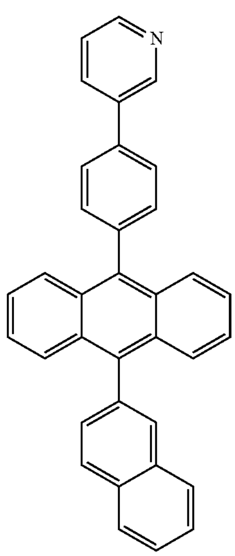
ET21
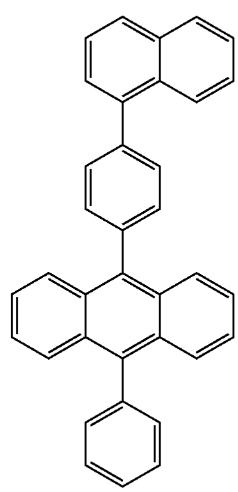

-continued
ET22
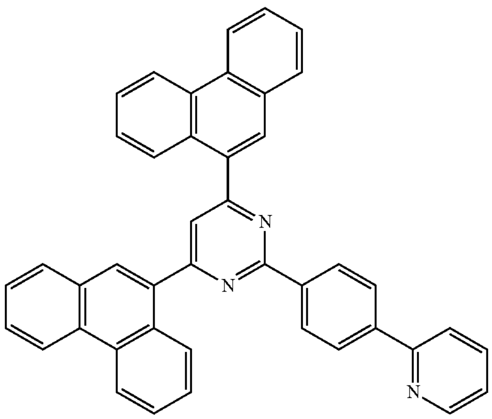
ET23
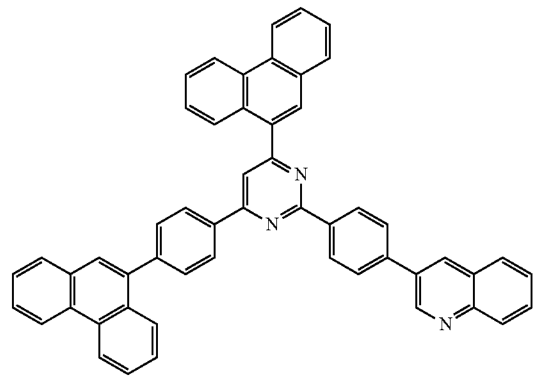
ET24
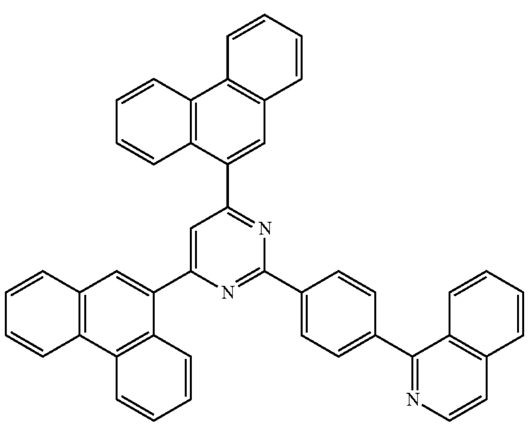
ET25
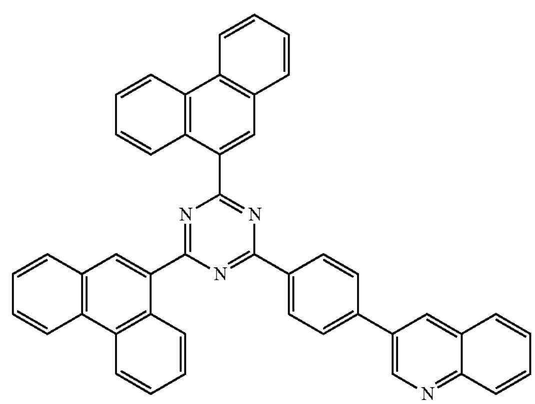
ET26
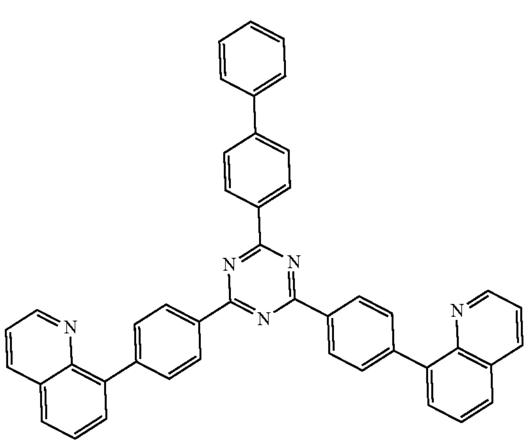
ET27
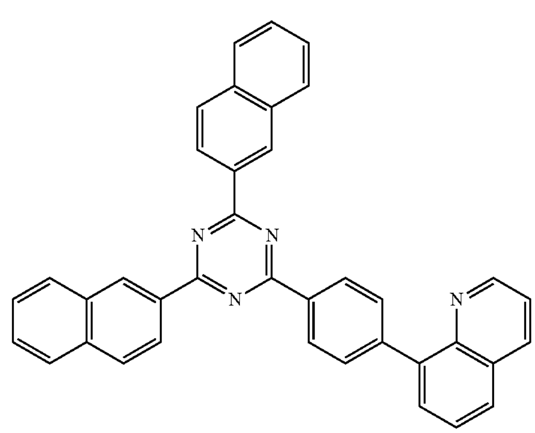

-continued
ET28
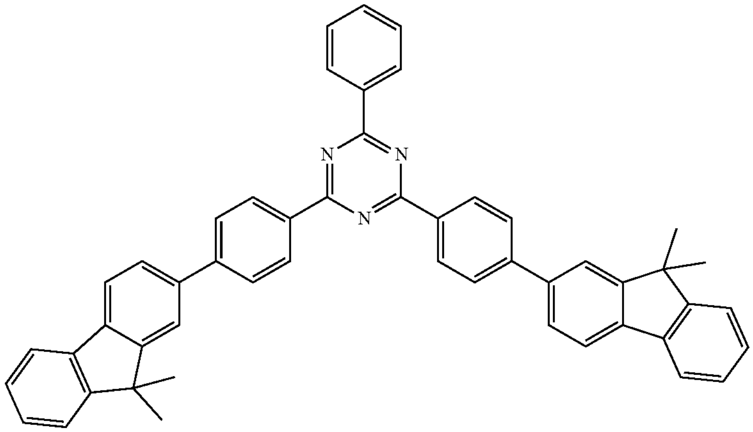
ET29
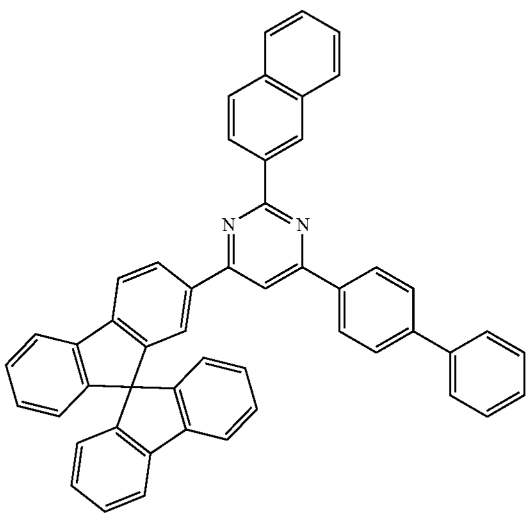
ET30
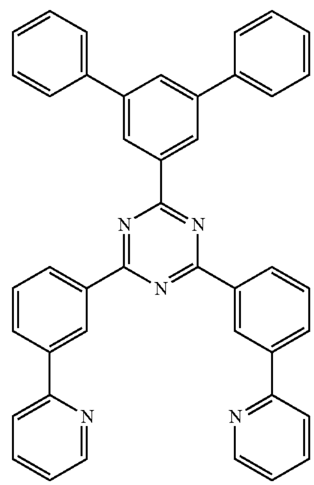
ET31
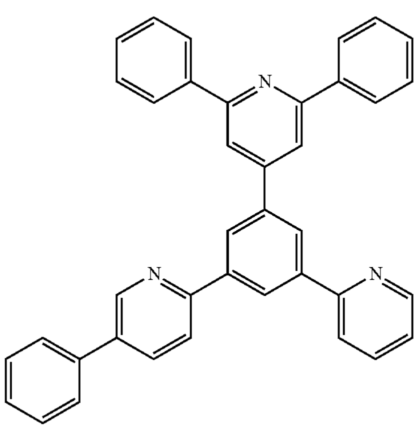
ET32
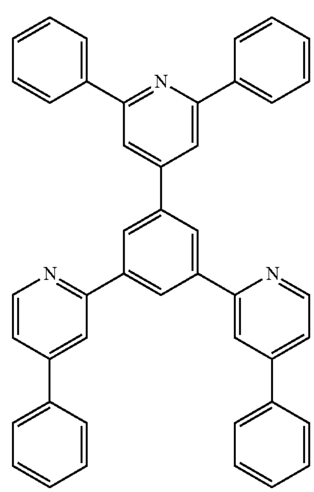

-continued
ET33
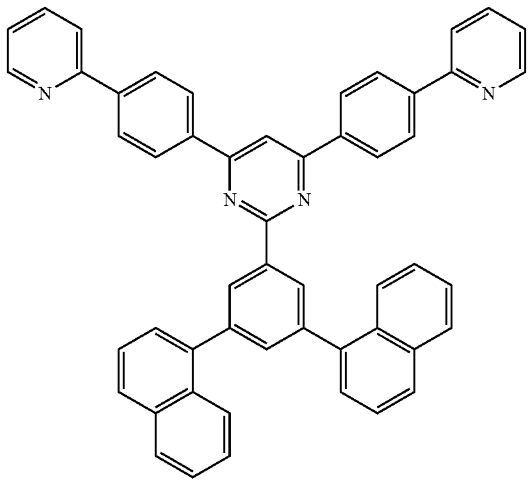
ET34
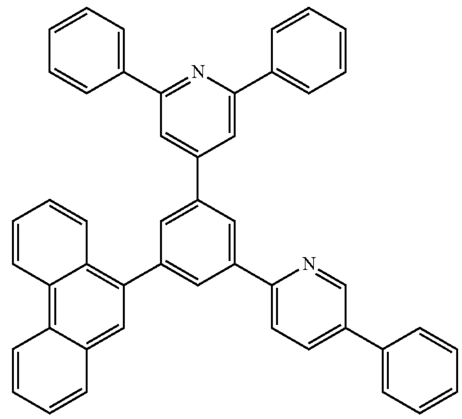
ET35
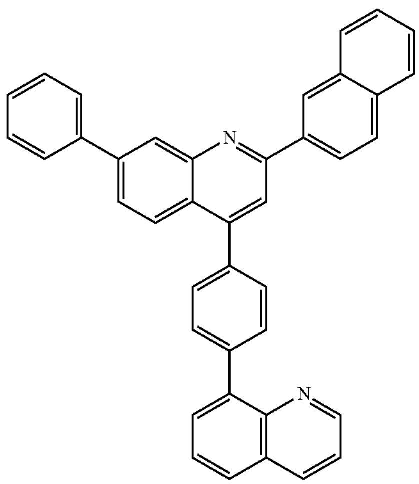
ET36
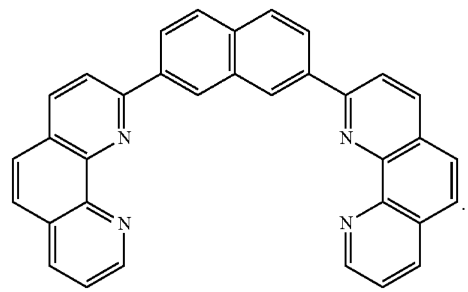
In one or more embodiments, the electron transport region may include at least one selected from 2,9-dimethyl-4,7-diphenyl-1,10-phenanthroline (BCP), 4,7-dphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ:
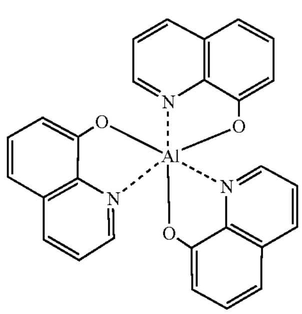
$Alq_3$
-continued
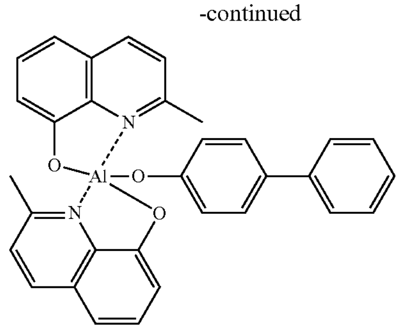
BAlq
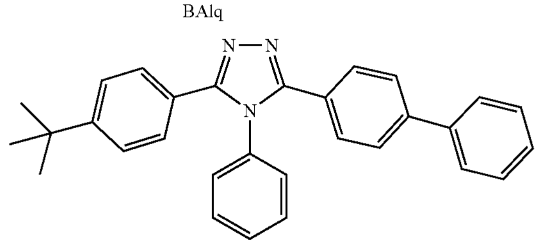
TAZ -continued

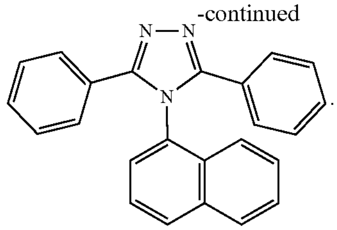

NTAZ

The thicknesses of the buffer layer, the hole blocking layer, or the electron control layer may each independently be in a range of about 20 Å to about 1,000 Å, and in some embodiments, about 30 Å to about 300 Å. While not wishing to be bound by theory, it is understood that when the thicknesses of the buffer layer, the hole blocking layer or the electron control layer are within any of these ranges, excellent hole blocking characteristics or excellent electron controlling characteristics may be obtained without a substantial increase in driving voltage.

The thickness of the electron transport layer may be in a range of about 100 Å to about 1,000 Å, and in some embodiments, about 150 Å to about 500 Å. While not wishing to be bound by theory, it is understood that when the thickness of the electron transport layer is within any of these ranges, excellent electron transport characteristics may be obtained without a substantial increase in driving voltage.

The electron transport region 17 (e.g., the electron transport layer in the electron transport region 17) may further include, in addition to the materials described above, a material including metal.

The material including metal may include at least one selected from an alkali metal complex and an alkaline earth metal complex. The alkali metal complex may include a metal ion selected from a lithium (Li) ion, a sodium (Na) ion, a potassium (K) ion, a rubidium (Rb) ion, and a cesium (Cs) ion. The alkaline earth metal complex may include a metal ion selected from a beryllium (Be) ion, a magnesium (Mg) ion, a calcium (Ca) ion, an strontium (Sr) ion, and a barium (Ba) ion. Each ligand coordinated with the metal ion of the alkali metal complex and the alkaline earth metal complex may independently be selected from a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, but embodiments are not limited thereto.

For example, the material including metal may include a Li complex. The Li complex may include, e.g., Compound ET-D1 (lithium 8-hydroxyquinolate, LiQ) or Compound ET-D2:

ET-D1

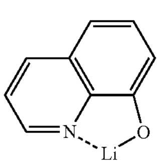

-continued

ET-D2

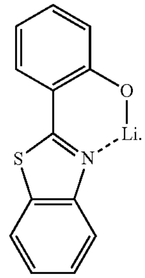

The electron transport region 17 may include an electron injection layer that facilitates injection of electrons from the second electrode 19. The electron injection layer may be in direct contact with the second electrode 19.

The electron injection layer may have i) a single-layered structure including a single layer including a single material, ii) a single-layered structure including a single layer including a plurality of different materials, or iii) a multi-layered structure having a plurality of layers, each including a plurality of different materials.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

The alkali metal may be selected from Li, Na, K, Rb, and Cs. In an embodiment, the alkali metal may be Li, Na, or Cs. In one or more embodiments, the alkali metal may be Li or Cs, but embodiments are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth metal compound, and the rare earth metal compound may each independently be selected from oxides and halides (e.g., fluorides, chlorides, bromides, or iodines) of the alkali metal, the alkaline earth metal, and the rare earth metal, respectively.

The alkali metal compound may be selected from alkali metal oxides, such as $Li_2O$, $Cs_2O$, or $K_2O$, and alkali metal halides, such as LiF, NaF, CsF, KF, LiI, NaI, CsI, KI, or RbI. In an embodiment, the alkali metal compound may be selected from LiF, $Li_2O$, NaF, LiI, NaI, CsI, and KI, but embodiments are not limited thereto.

The alkaline earth metal compound may be selected from alkaline earth metal compounds such as BaO, SrO, CaO, $Ba_xSr_{1-x}O$ (wherein $0<x<1$), and $Ba_xCa_{1-x}O$ (wherein $0<x<1$). In an embodiment, the alkaline earth metal compound may be selected from BaO, SrO, and CaO, but embodiments are not limited thereto.

The rare earth metal compound may be selected from $YbF_3$, $ScF_3$, $ScO_3$, $Y_2O_3$, $Ce_2O_3$, $GdF_3$, and $TbF_3$. In an embodiment, the rare earth metal compound may be selected from $YbF_3$, $ScF_3$, $TbF_3$, $YbI_3$, $ScI_3$, and $TbI_3$, but embodiments are not limited thereto.

The alkali metal complex, the alkaline earth metal complex, and the rare earth metal complex may each include ions of the above-described alkali metal, alkaline earth metal, and rare earth metal. Each ligand coordinated with the metal ion of the alkali metal complex, the alkaline earth metal complex, and the rare earth metal complex may independently be selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, but embodiments are not limited thereto.

The electron injection layer may consist of an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof, as described above. In some embodiments, the electron injection layer may further include an organic material. When the electron injection layer further includes an organic material, the alkali metal, the alkaline earth metal, the rare earth metal, the alkali metal compound, the alkaline earth metal compound, the rare earth metal compound, the alkali metal complex, the alkaline earth metal complex, the rare earth metal complex, or a combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. While not wishing to be bound by theory, it is understood that when the thickness of the electron injection layer is within any of these ranges, excellent electron injection characteristics may be obtained without a substantial increase in driving voltage.

Second Electrode 19

The second electrode 19 may be on the organic layer 10A. In an embodiment, the second electrode 19 may be a cathode that is an electron injection electrode. In this embodiment, a material for forming the second electrode 19 may be a material having a low work function, for example, a metal, an alloy, an electrically conductive compound, or a combination thereof.

The second electrode 19 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments are not limited thereto. The second electrode 19 may be a transmissive electrode, a semi-transmissive electrode, or a reflective electrode.

The second electrode 19 may have a single-layered structure, or a multi-layered structure including two or more layers.

Figure 3:
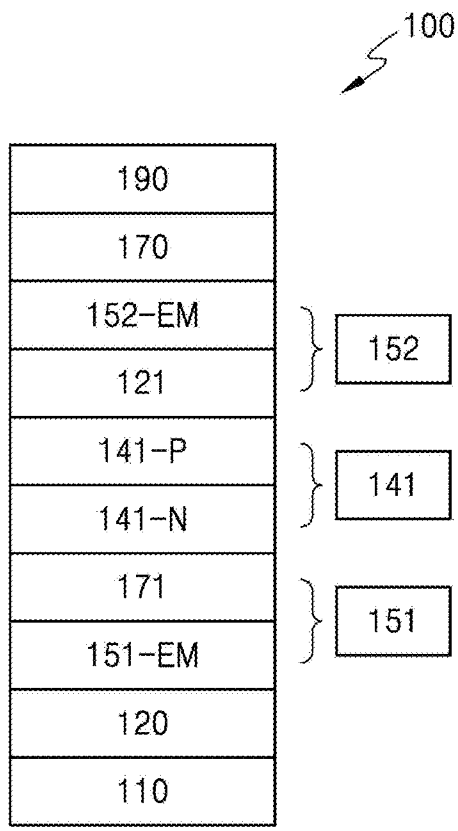
FIG. 3 is a schematic view of an organic light-emitting device 100 according to another embodiment.

Description of FIG. 3

FIG. 3 is a schematic view of an organic light-emitting device 100 according to an embodiment.

The organic light-emitting device 100 in FIG. 3 includes a first electrode 110, a second electrode 190 facing the first electrode 110, and a first light-emitting unit 151 and a second light-emitting unit 152 disposed between the first electrode 100 and the second electrode 190. A charge generating layer 141 may be disposed between the first light-emitting unit 151 and the second light-emitting unit 152, and the charge generating layer 141 may include an n-type charge generating layer 141-N and a p-type charge generating layer 141-P. The charge generating layer 141 is a layer serving to generate charges and supply the generated charges to the adjacent light-emitting unit, and may include a known material.

The first light-emitting unit 151 may include a first emission layer 151-EM, and the second light-emitting unit 152 may include a second emission layer 152-EM. A maximum emission wavelength of light emitted by the first light-emitting unit 151 may be different from a maximum emission wavelength of light emitted by the second light-emitting unit 152. For example, mixed light of the light emitted by the first light-emitting unit 151 and the light emitted by the second light-emitting unit 152 may be white light, but embodiments are not limited thereto.

A hole transport region 120 may be disposed between the first light-emitting unit 151 and the first electrode 110, and the second light-emitting unit 152 may include a first hole transport region 121 toward the first electrode 110.

An electron transport region 170 may be disposed between the second light-emitting unit 152 and the second electrode 190, and the first light-emitting unit 151 may include a first electron transport region 171 disposed between the charge generating layer 141 and the first emission layer 151-EM.

The first emission layer 151-EM may include a host and a dopant, the first emission layer 151-EM may emit a phosphorescent light, and the dopant may be an organometallic compound. In this regard, a PLQY of the dopant included in the first emission layer 151-EM may be about 0.8 or greater and about 1.0 or less; a decay time of the dopant included in the first emission layer 151-EM may be about 0.1 μs or greater and about 2.9 μs or less; and the host and the dopant included in the first emission layer 151-EM may satisfy 0.1 eV≤0.5 HOMO (dopant)−HOMO (host)≤0.4 eV, provided that the HOMO (dopant) represents a HOMO energy level (expressed in electron volts) of the dopant, and the HOMO (host) represents, in a case where the host included in the first emission layer 151-EM includes one type of host (for example, the host included in the first emission layer 151-EM consists of one type of host), a HOMO energy level (expressed in electron volts) of the one type of host; or in a case where the host included in the first emission layer 151-EM is a mixture of two or more different types of host, a highest HOMO energy level from among HOMO energy levels (expressed in electron volts) of the two or more different types of host. Evaluation methods of a PLQY of the dopant, a decay time of the dopant, HOMO (dopant), and HOMO (host) may be understood by referring to the descriptions for those provided herein. For example, an emission energy of a maximum emission wavelength of an emission spectrum of the dopant included in the first emission layer 151-EM may be about 2.31 eV or greater and about 2.48 eV or less and an evaluation method of an emission energy of a maximum emission wavelength of an emission spectrum of the dopant may be understood by referring to the descriptions for those provided herein.

The second emission layer 152-EM may include a host and a dopant, the second emission layer 152-EM may emit a phosphorescent light, and the dopant may be an organometallic compound. In this regard, a PLQY of the dopant included in the second emission layer 152-EM may be about 0.8 or greater and about 1.0 or less; a decay time of the dopant included in the second emission layer 152-EM may be about 0.1 μs or greater and about 2.9 μs or less; and the host and the dopant included in the second emission layer 152-EM may satisfy 0.1 eV≤HOMO (dopant)−HOMO (host)≤0.4 eV, provided that the HOMO (dopant) represents a HOMO energy level (expressed in electron volts) of the dopant, and the HOMO (host) represents, in a case where the host included in the second emission layer 152-EM includes one type of host (for example, the host included in the second emission layer 152-EM consists of one type of host), a HOMO energy level (expressed in electron volts) of the one type of host; or in a case where the host included in the second emission layer 152-EM is a mixture of two or more different types of host, a highest HOMO energy level from among HOMO energy levels (expressed in electron volts) of the two or more different types of host. Evaluation methods of a PLQY of the dopant, a decay time of the dopant, HOMO (dopant), and HOMO (host) may be understood by referring to the descriptions for those provided herein. For example, an emission energy of a maximum emission wavelength of an emission spectrum of the dopant included in the second emission layer 152-EM may be about 2.31 eV or greater and about 2.48 eV or less and an evaluation method of an emission energy of a maximum emission wavelength of an emission spectrum of the dopant may be understood by referring to the descriptions for those provided herein.

As described above, each of the first emission layer 151-EM and the second emission layer 152-EM of the organic light-emitting device 100 may satisfy "all" of the PLQY range of the dopant, the decay time range of the dopant, and the HOMO (dopant)−HOMO (host) range, described herein, "at the same time". Thus, relatively low current driving conditions may be selected to achieve a high luminance of the organic light-emitting device 100, a diffusion length of excitons in the first emission layer 151-EM and the second emission layer 152-EM may be decreased, and a density of excitons in the first emission layer 151-EM and the second emission layer 152-EM may be decreased. Therefore, the organic light-emitting device 100 may have significantly long lifespan characteristics. Additionally, each of the first emission layer 151-EM and the second emission layer 152-EM of the organic light-emitting device 100 may additionally satisfy the emission energy range of a maximum emission wavelength of an emission spectrum of the dopant. Thus, possibility of decomposition of the host and/or the dopant included in the first emission layer 151-EM and the second emission layer 152-EM may be reduced. Therefore, the organic light-emitting device 100 may have significantly longer lifespan characteristics.

In FIG. 3, the first electrode 110 and the second electrode 190 may each be understood by referring to the descriptions for the first electrode 11 and the second electrode 19 in FIG. 1, respectively.

In FIG. 3, the first emission layer 151-EM and the second emission layer 152-EM may each be understood by referring to the descriptions for the emission layer 15 in FIG. 1.

In FIG. 3, the hole transport region 120 and the first hole transport region 121 may each be understood by referring to the descriptions for the hole transport region 12 in FIG. 1.

In FIG. 3, the electron transport region 170 and the first electron transport region 171 may each be understood by referring to the descriptions for the electron transport region 17 in FIG. 1.

Hereinbefore, by referring to FIG. 3, the organic light-emitting device 100 has been described in which the first light-emitting unit 151 and the second light-emitting unit 152 both satisfy the PLQY range of the dopant, the decay time range of the dopant, and the HOMO (dopant)−HOMO (host) range, described herein. However, the organic light-emitting device 100 in FIG. 3 may be subjected to various modifications, for example, at least one of the first light-emitting unit 151 and the second light-emitting unit 152 of the organic light-emitting device 100 in FIG. 3 may be replaced by any suitable known light-emitting unit, or three or more light-emitting units may be included.

Figure 4:
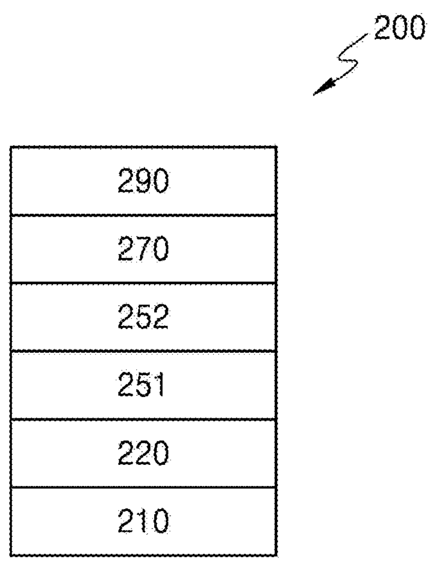
FIG. 4 is a schematic view of an organic light-emitting device 200 according to still another embodiment.

Description of FIG. 4

FIG. 4 is a schematic view of an organic light-emitting device 200 according to an embodiment.

The organic light-emitting device 100 in FIG. 4 includes a first electrode 210, a second electrode 290 facing the first electrode 210, and a first emission layer 251 and a second emission layer 252 disposed between the first electrode 210 and the second electrode 290.

A maximum emission wavelength of light emitted by the first emission layer 251 may be different from a maximum emission wavelength of light emitted by the second emission layer 252. For example, mixed light of the light emitted by the first emission layer 251 and the light emitted by the second emission layer 252 may be white light, but embodiments are not limited thereto.

A hole transport region 220 may be disposed between the first emission layer 251 and the first electrode 210, and an electron transport region 270 may be disposed between the second emission layer 252 and the second electrode 290.

The first emission layer 251 may include a host and a dopant, the first emission layer 251 may emit a phosphorescent light, and the dopant may be an organometallic compound. In this regard, a PLQY of the dopant included in the first emission layer 251 may be about 0.8 or greater and about 1.0 or less; a decay time of the dopant included in the first emission layer 251 may be about 0.1 μs or greater and about 2.9 μs or less; and the host and the dopant included in the first emission layer 251 may satisfy 0.1 eV≤HOMO (dopant)−HOMO (host)≤0.4 eV, provided that the HOMO (dopant) represents a HOMO energy level (expressed in electron volts) of the dopant, and the HOMO (host) represents, in a case where the host included in the first emission layer 251 includes one type of host (for example, the host included in the first emission layer 251 consists of one type of host), a HOMO energy level (expressed in electron volts) of the one type of host; or in a case where the host included in the first emission layer 251 is a mixture of two or more different types of host, a highest HOMO energy level from among HOMO energy levels (expressed in electron volts) of the two or more different types of host. Evaluation methods of a PLQY of the dopant, a decay time of the dopant, HOMO (dopant), and HOMO (host) may be understood by referring to the descriptions for those provided herein. For example, an emission energy of a maximum emission wavelength of an emission spectrum of the dopant included in the first emission layer 251 may be about 2.31 eV or greater and about 2.48 eV or less and an evaluation method of an emission energy of a maximum emission wavelength of an emission spectrum of the dopant may be understood by referring to the descriptions for those provided herein.

The second emission layer 252 may include a host and a dopant, the second emission layer 252 may emit a phosphorescent light, and the dopant may be an organometallic compound. In this regard, a PLQY of the dopant included in the second emission layer 252 may be about 0.8 or greater and about 1.0 or less; a decay time of the dopant included in the second emission layer 252 may be about 0.1 μs or greater and about 2.9 μs or less; and the host and the dopant included in the second emission layer 252 may satisfy 0.1 eV≤HOMO (dopant)−HOMO (host)≤0.4 eV, provided that the HOMO (dopant) represents a HOMO energy level (expressed in electron volts) of the dopant, and the HOMO (host) represents, in a case where the host included in the second emission layer 252 includes one type of host (for example, the host included in the second emission layer 252 consists of one type of host), a HOMO energy level (expressed in electron volts) of the one type of host; or in a case where the host included in the second emission layer 252 is a mixture of two or more different types of host, a highest HOMO energy level from among HOMO energy levels (expressed in electron volts) of the two or more different types of host. Evaluation methods of a PLQY of the dopant, a decay time of the dopant, HOMO (dopant), and HOMO (host) may be understood by referring to the descriptions for those provided herein. For example, an emission energy of a maximum emission wavelength of an emission spectrum of the dopant included in the second emission layer 252 may be about 2.31 eV or greater and about 2.48 eV or less and an evaluation methods of an emission energy of a maximum emission wavelength of an emission spectrum of the dopant may be understood by referring to the descriptions for those provided herein.

As described above, each of the first emission layer 251 and the second emission layer 252 of the organic light-emitting device 200 may satisfy "all" of the PLQY range of the dopant, the decay time range of the dopant, and the HOMO (dopant)–HOMO (host) range, described herein, "at the same time". Thus, relatively low current driving conditions may be selected to achieve a high luminance of the organic light-emitting device 200, a diffusion length of excitons in the first emission layer 251 and the second emission layer 252 may be decreased, and a density of excitons in the first emission layer 251 and the second emission layer 252 may be decreased. Therefore, the organic light-emitting device 200 may have significantly improved lifespan characteristics. Additionally, each of the first emission layer 251 and the second emission layer 252 of the organic light-emitting device 200 may additionally satisfy the emission energy range of a maximum emission wavelength of an emission spectrum of the dopant. Thus, possibility of decomposition of the host and/or the dopant included in the first emission layer 251 and the second emission layer 252 may be reduced. Therefore, the organic light-emitting device 200 may have significantly improved lifespan characteristics.

In FIG. 4, the first electrode 210, the hole transport region 220, and the second electrode 290 may each be understood by referring to the descriptions for the first electrode 11, the hole transport region 12, and the second electrode 19 in FIG. 1, respectively.

In FIG. 4, the first emission layer 251 and the second emission layer 252 may each be understood by referring to the descriptions for the emission layer 15 in FIG. 1.

In FIG. 4, the electron transport region 170 may be understood by referring to the descriptions for the electron transport region 17 in FIG. 1.

Hereinbefore, by referring to FIG. 4, the organic light-emitting device 200 has been described in which the first emission layer 251 and the second emission layer 252 both satisfy the PLQY range of the dopant, the decay time range of the dopant, and the HOMO (dopant)–HOMO (host) range, described herein. However, the organic light-emitting device in FIG. 4 may be subjected to various modifications, for example, one of the first emission layer 251 and the second emission layer 252 may be replaced by a known layer, three or more emission layers may be included, or an intermediate layer may be further located between neighboring emission layers.

Description of Terms

The term "$C_1$-$C_{60}$ alkyl group" as used herein refers to a linear or branched saturated aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having substantially the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_2$-$C_{60}$ alkenyl group" as used herein refers to a group formed by including at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a group formed by including at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_3$-$C_{10}$ cycloalkyl group" as used herein refers to a monovalent saturated monocyclic saturated hydrocarbon group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, P, Si, and S as a ring-forming atom and 1 to 10 carbon atoms. Examples thereof include a tetrahydrofuranyl group and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group including 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, P, Si, and S as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and a $C_6$-$C_{60}$ arylene group each include at least two rings, the at least two rings may be fused.

The term "$C_1$-$C_{60}$ heteroaryl group" as used herein refers to a monovalent group having a heterocyclic aromatic system having at least one heteroatom selected from N, O, P, Si, and S as a ring-forming atom and 1 to 60 carbon atoms. The term "$C_1$-$C_{60}$ heteroarylene group" as used herein refers to a divalent group having a heterocyclic aromatic system having at least one heteroatom selected from N, O, P, Si, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include at least two rings, the at least two rings may be fused.

The term "$C_6$-$C_{60}$ aryloxy group" as used herein indicates —$OA_{102}$ (wherein $A_{102}$ is a $C_6$-$C_{60}$ aryl group). The term "$C_6$-$C_{60}$ arylthio group" as used herein indicates —$SA_{103}$ (wherein $A_{103}$ is a $C_6$-$C_{60}$ aryl group). The term "$C_7$-$C_{60}$ arylalkyl group" as used herein indicates -$A_{104}A_{105}$ (wherein $A_{105}$ is the $C_6$-$C_{59}$ aryl group and $A_{104}$ is the $C_1$-$C_{53}$ alkylene group).

The term "$C_1$-$C_{60}$ heteroaryloxy group" as used herein refers to —$OA_{106}$ (wherein $A_{106}$ is the $C_2$-$C_{60}$ heteroaryl group). The term "$C_1$-$C_{60}$ heteroarylthio group" as used herein indicates —$SA_{107}$ (wherein $A_{107}$ is the $C_1$-$C_{60}$ heteroaryl group). The term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, and S and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group.

The term "$C_1$-$C_{30}$ heterocyclic group" as used herein refers to saturated or unsaturated cyclic group including 1 to 30 carbon atoms and at least one heteroatom selected from N, O, P, Si, and S as ring-forming atoms. The $C_1$-$C_3O$ heterocyclic group may be a monocyclic group or a polycyclic group.

In the present specification, at least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{13}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(═O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(═O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium; a $C_1$-$C_{60}$ alkyl group; and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium; a $C_1$-$C_{60}$ alkyl group; and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

The terms "a biphenyl group, a terphenyl group, and a tetraphenyl group" as used herein each refer to a monovalent group having two, three, and four phenyl groups linked via a single bond, respectively.

The terms "a cyano group-containing phenyl group, a cyano group-containing biphenyl group, a cyano group-containing terphenyl group, and a cyano group-containing tetraphenyl group" as used herein each refer to a phenyl group, a biphenyl group, a terphenyl group, and a tetraphenyl group, each substituted with at least one cyano group. In "the cyano group-containing phenyl group, the cyano group-containing biphenyl group, the cyano group-containing terphenyl group, and the cyano group-containing tetraphenyl group", a cyano group may be substituted at any position, and "the cyano group-containing phenyl group, the cyano group-containing biphenyl group, the cyano group-containing terphenyl group, and the cyano group-containing tetraphenyl group" may further include a substituent in addition to a cyano group. For example, 'a phenyl group substituted with a cyano group' and 'a phenyl group substituted with a methyl group' all belong to "a cyano group-containing phenyl group".

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an amount of B used was identical to an amount of A used in terms of molar equivalents.

EXAMPLES

Synthesis Example 1: Synthesis of Compound 1-8

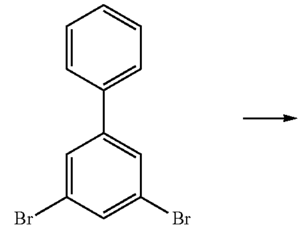

1-8(6)

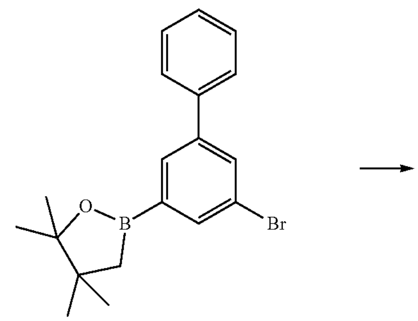

1-8(5)

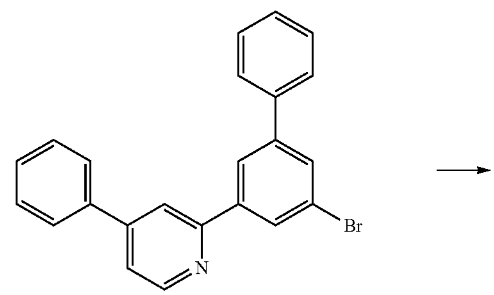

1-8(4)

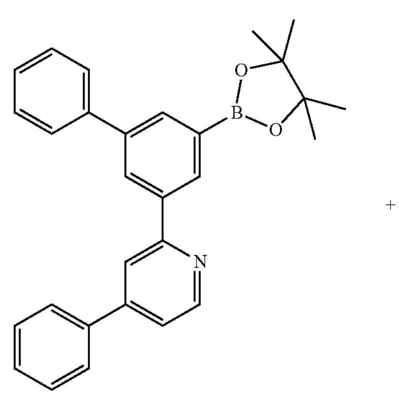

1-8(3)

-continued

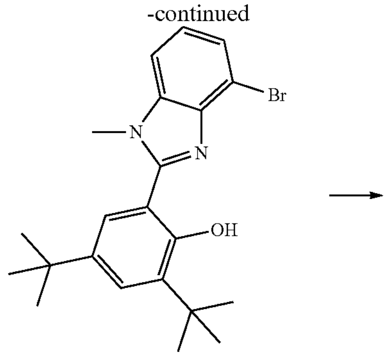

1-8(2)

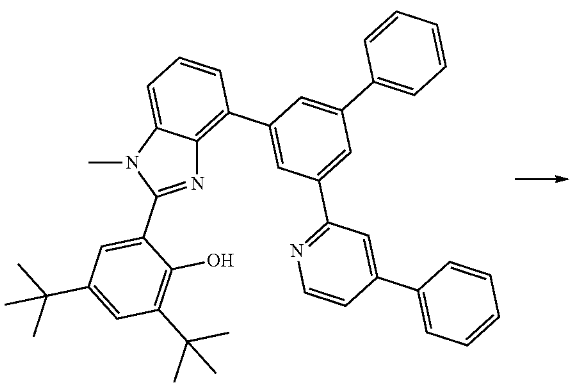

1-8(1)

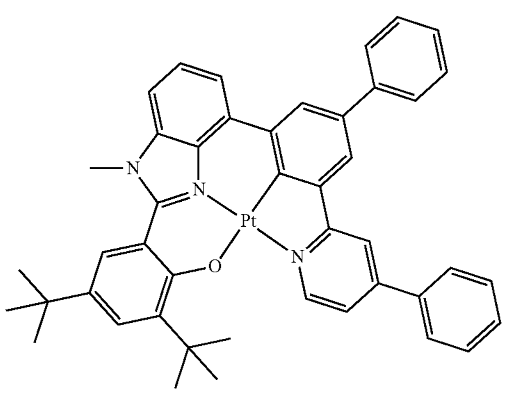

1-8

Synthesis of Intermediate 1-8(5)

0.024 moles (mol) of Starting Material 1-8(6) and 9.0 grams (g, 0.036 mol, 1.5 equivalents, equiv.) of bispinacolato diboron were added into a flask. 4.6 g (0.048 mol, 2 equiv.) of potassium acetate and 0.96 g (0.05 equiv.) of $PdCl_2$(dppf) were added thereto followed by addition of 100 milliliters (mL) of toluene, and the resulting mixture was refluxed at a temperature of 100° C. overnight. The resulting product was cooled to room temperature, and a precipitate was filtered to obtain a filtrate. The obtained filtrate was washed with ethyl acetate (EA) and $H_2O$, and purified by column chromatography to obtain Intermediate 1-8(5).

Synthesis of Intermediate 1-8(4)

0.014 mol (1.2 equiv.) of Intermediate 1-8(5) and 0.012 mol (1 equiv.) of 2-bromo-4-phenylpyridine, 0.61 g (0.001 mol, 0.07 equiv.) of tetrakis(triphenylphosphine)palladium (0), and 3.1 g (0.036 mol, 3 equiv.) of potassium carbonate were dissolved in a solvent (25 mL, 0.8 molar (M)) prepared by mixing tetrahydrofuran (THF) with distilled water ($H_2O$) at a ratio of 3:1, and the resulting mixture was refluxed for 12 hours. The resulting product was cooled to room temperature, and a precipitate was filtered to obtain a filtrate. The obtained filtrate was washed with ethyl acetate (EA) and $H_2O$, and purified by column chromatography (while increasing a rate of methylene chloride (MC)/hexane to between 25% and 50%) to obtain Intermediate 1-8(4).

Synthesis of Intermediate 1-8(3)

0.009 mol of Intermediate 1-8(4) and 3.6 g (0.014 mol, 1.5 equiv.) of bispinacolato diboron were added to a flask, followed by addition of 1.9 g (0.019 mol, 2 equiv.) of potassium acetate, 0.39 g (0.05 equiv.) of $PdCl_2$(dppf), and 32 mL of toluene, and the resulting mixture was refluxed at a temperature of 100° C. overnight. The resulting product was cooled to room temperature, and a precipitate was filtered to obtain a filtrate. The obtained filtrate was washed with ethyl acetate (EA) and $H_2O$, and purified by column chromatography to obtain Intermediate 1-8(3).

Synthesis of Intermediate 1-8(1)

0.005 mol (1.2 equiv.) of Intermediate 1-8(3) and 0.004 mol (1 equiv.) of Intermediate 1-8(2), 0.35 g (0.001 mol, 0.07 equiv.) of tetrakis(triphenylphosphine)palladium(0), and 1.8 g (0.013 mol, 3 equiv.) of potassium carbonate were dissolved in a solvent prepared by mixing THF with distilled water ($H_2O$) at a ratio of 3:1, and the resulting mixture was refluxed for 12 hours. The resulting product was cooled to room temperature, and a precipitate was filtered to obtain a filtrate. The obtained filtrate was washed with EA and $H_2O$, and purified by column chromatography (while increasing a rate of EA/hexane to between 20% and 35%) to obtain Intermediate 1-8(1).

Synthesis of Compound 1-8

2.5 mmol of Intermediate 1-8(1) and 1.23 g (3 mmol, 1.2 equiv.) of $K_2PtCl_4$ were dissolved in 25 mL of a solvent prepared by mixing 20 mL of AcOH with 5 mL of $H_2O$, and the resulting mixture was refluxed for 16 hours. The resulting product was cooled to room temperature, and a precipitate was filtered to obtain a filtrate. The obtained filtrate was dissolved in MC, washed with $H_2O$, and purified by column chromatography to obtain Compound 1-8.

Synthesis Example 2: Synthesis Compound 1-12

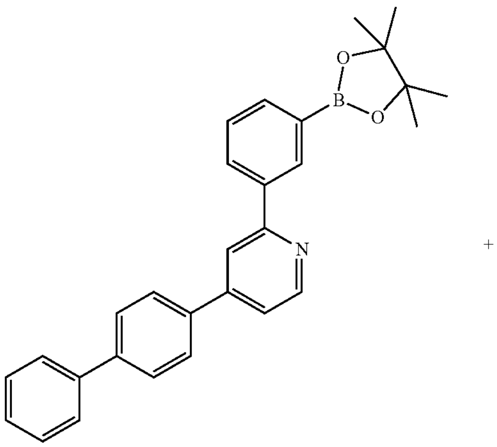

1-12(3)

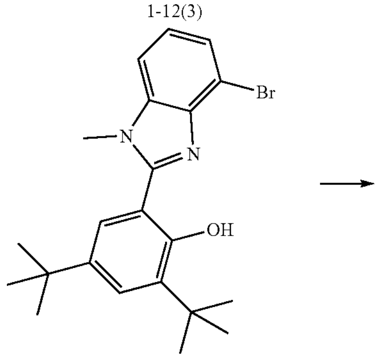

1-8(2)

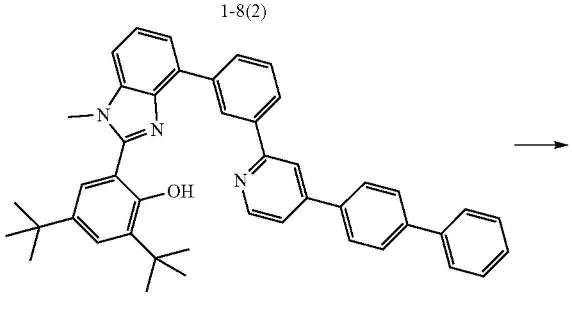

1-12(1)

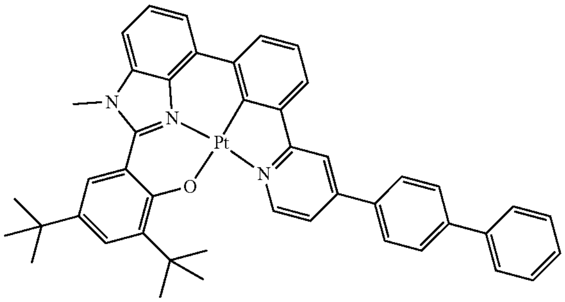

1-12

Synthesis of Intermediate 1-12(1)

Intermediate 1-12(1) was obtained in substantially the same manner as in Synthesis of Intermediate 1-8(1) in Synthesis Example 1, except that Intermediate 1-12(3) was used instead of Intermediate 1-8(3).

Synthesis of Compound 1-12

Compound 1-12 was obtained in substantially the same manner as in Synthesis of Compound 1-8 in Synthesis Example 1, except that Intermediate 1-12(1) was used instead of Intermediate 1-8(1).

Synthesis Example 3: Synthesis of Compound 1-89

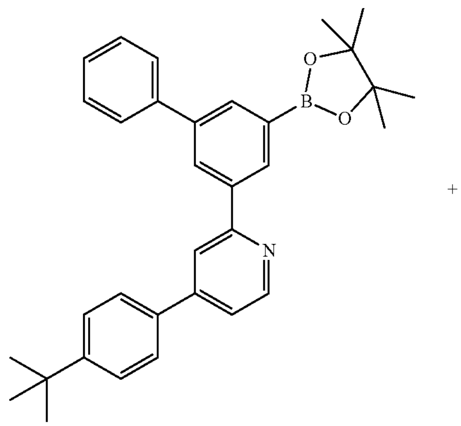

1-89(3)

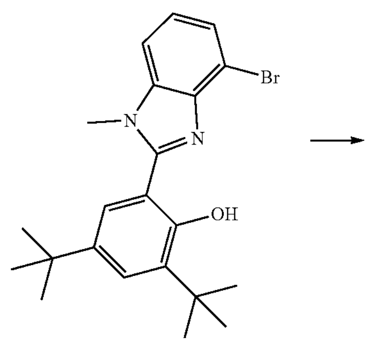

1-8(2)

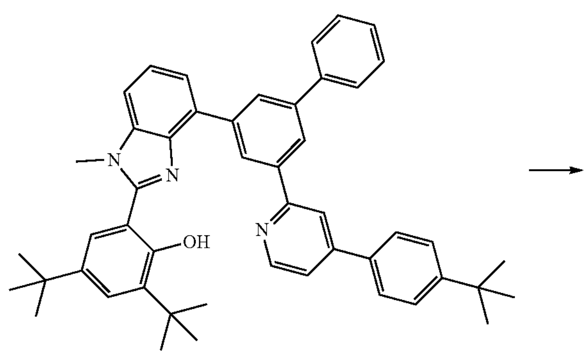

1-89(1)

-continued

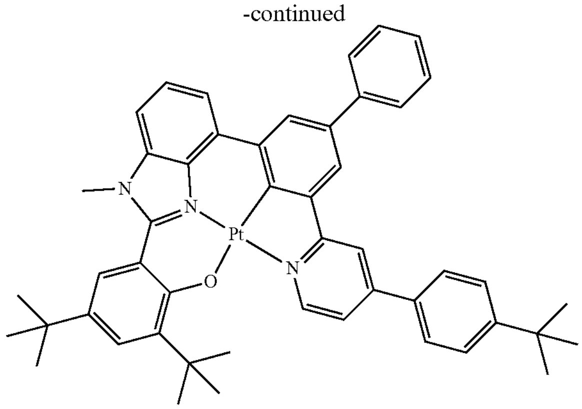

1-89

Synthesis of Intermediate 1-89(1)

Intermediate 1-89(1) was obtained in substantially the same manner as in Synthesis of Intermediate 1-8(1) in Synthesis Example 1, except that Intermediate 1-89(3) was used instead of Intermediate 1-8(3).

Synthesis of Compound 1-89

Compound 1-89 was obtained in substantially the same manner as in Synthesis of Compound 1-8 in Synthesis Example 1, except that Intermediate 1-89(1) was used instead of Intermediate 1-8(1).

Synthesis Example 4: Synthesis of Compound 3-225

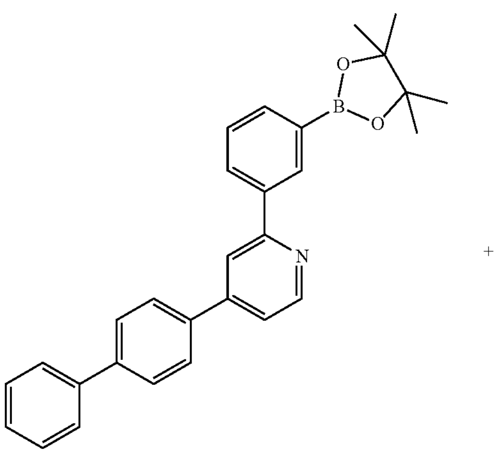

1-12(3)

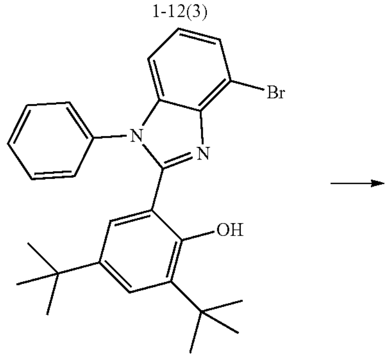

3-225(2)

-continued

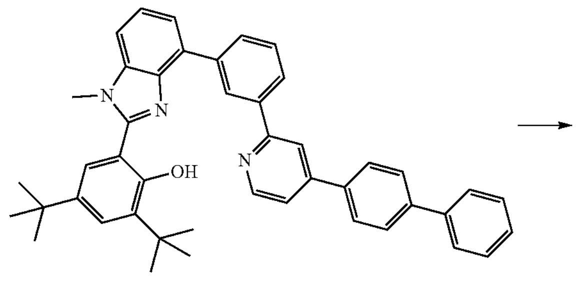

3-225(1)

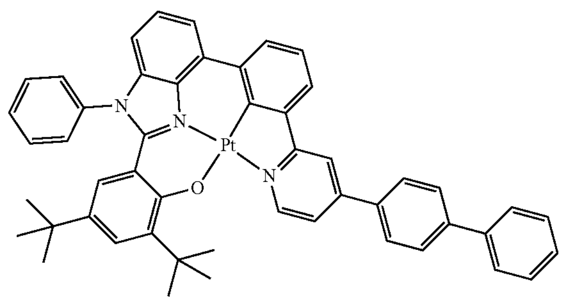

3-225

Synthesis of Intermediate 3-225(1)

Intermediate 3-225(1) was obtained in substantially the same manner as in Synthesis of Intermediate 1-8(1) in Synthesis Example 1, except that Intermediate 1-12(3) and Intermediate 3-225(2) were used instead of Intermediate 1-8(3) and Intermediate 1-8(2), respectively.

Synthesis of Compound 3-225

Compound 1-225 was obtained in substantially the same manner as in Synthesis of Compound 1-8 in Synthesis Example 1, except that Intermediate 3-225(1) was used instead of Intermediate 1-8(1).

Synthesis Example 5: Synthesis of Compound 1-90

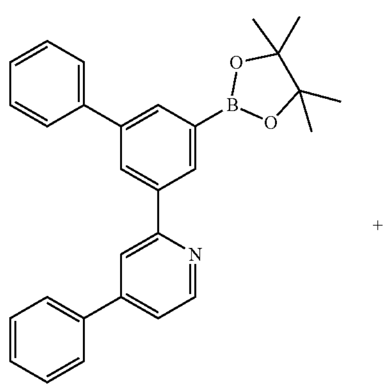

1-8(3)

-continued

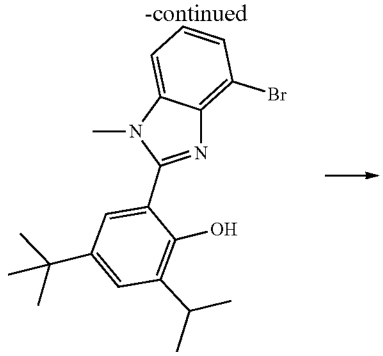

1-90(2)

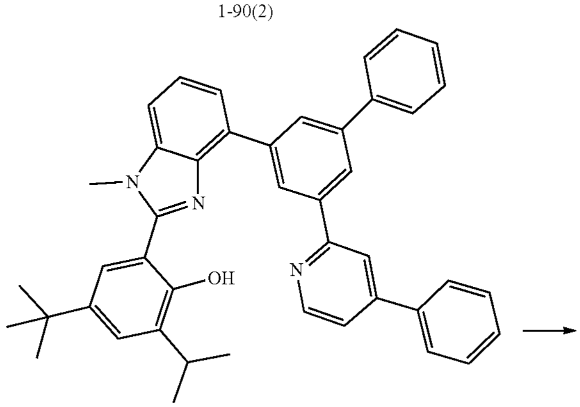

1-90(1)

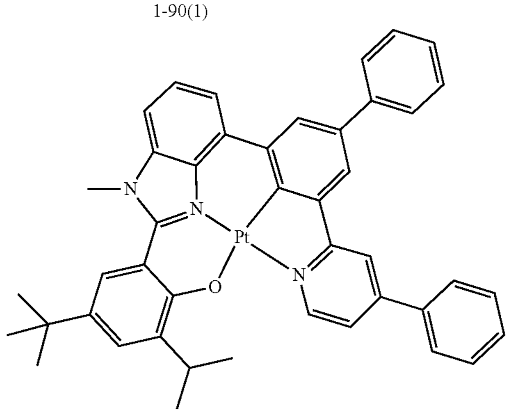

1-90

Synthesis of Intermediate 1-90(1)

Intermediate 1-90(1) was obtained in substantially the same manner as in Synthesis of Intermediate 1-8(1) in Synthesis Example 1, except that Intermediate 1-90(2) was used instead of Intermediate 1-8(2).

Synthesis of Compound 1-90

Compound 1-90 was obtained in substantially the same manner as in Synthesis of Compound 1-8 in Synthesis Example 1, except that Intermediate 1-90(1) was used instead of Intermediate 1-8(1).

Synthesis Example 6: Synthesis of Compound 1-91

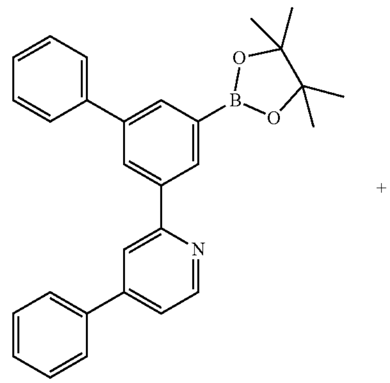

1-8(3)

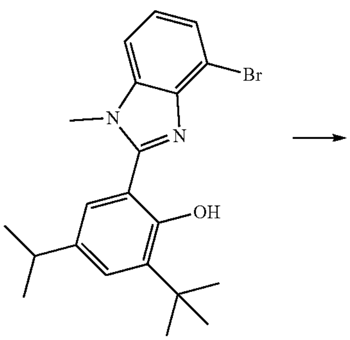

1-91(2)

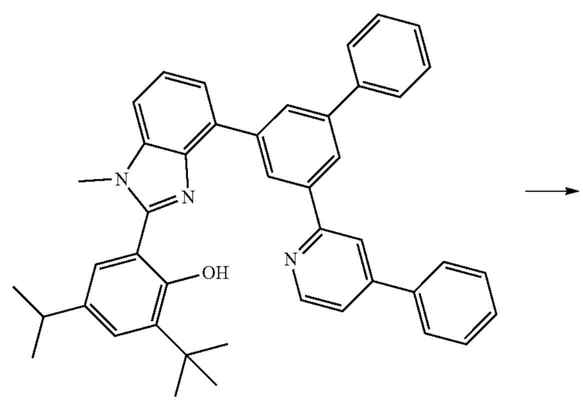

1-91(1)

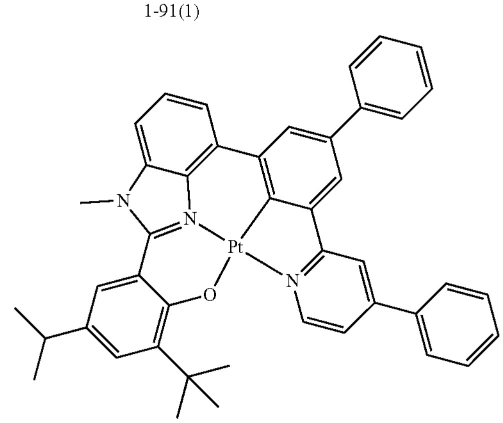

1-91

Synthesis of Intermediate 1-91(1)

Intermediate 1-91(1) was obtained in substantially the same manner as in Synthesis of Intermediate 1-8(1) in Synthesis Example 1, except that Intermediate 1-91(2) was used instead of Intermediate 1-8(2).

Synthesis of Compound 1-91

Compound 1-91 was obtained in substantially the same manner as in Synthesis of Compound 1-8 in Synthesis Example 1, except that Intermediate 1-91(1) was used instead of Intermediate 1-8(1).

Synthesis Example 7: Synthesis of Compound 1-36

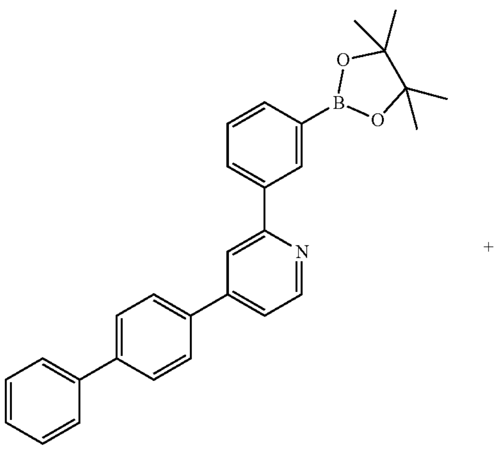

1-12(3)

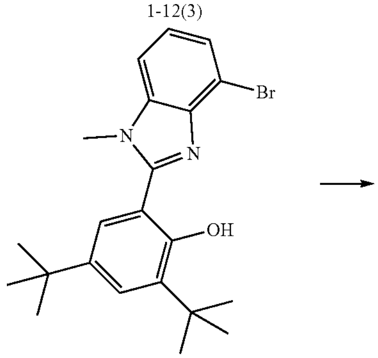

1-36(2)

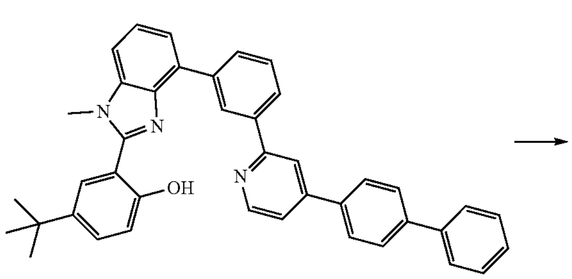

1-36(1)

-continued

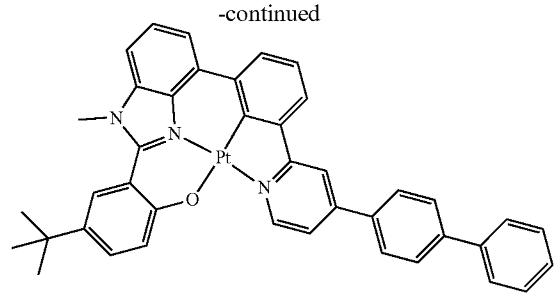

1-36

Synthesis of Intermediate 1-36(1)

Intermediate 1-36(1) was obtained in substantially the same manner as in Synthesis of Intermediate 1-8(1) in Synthesis Example 1, except that Intermediate 1-12(3) and Intermediate 1-36(2) were used instead of Intermediate 1-8(3) and Intermediate 1-8(2), respectively.

Synthesis of Compound 1-36

Compound 1-36 was obtained in substantially the same manner as in Synthesis of Compound 1-8 in Synthesis Example 1, except that Intermediate 1-36(1) was used instead of Intermediate 1-8(1).

Evaluation Example 1: Measurement of Emission Energy of Maximum Emission Wavelength and PLQY Each Compound shown in Table 1 was vacuum-co-deposited on a quartz substrate in a weight ratio shown in Table 1 at a vacuum degree of $10^{-7}$ torr to form Films A(1), B(1), C(1), D(1), E(1), F(1), G(1), 1-8(1), 1-12(1), 1-89(1), 3-225(1), 1-90(1), 1-91(1), and 1-36(1), each having a thickness of 40 nanometers (nm) and each Compound shown in Table 2 was vacuum-co-deposited on a quartz substrate in a weight ratio shown in Table 2 at a vacuum degree of $10^{-7}$ torr to form Films A(3), B(3), C(3), D(3), E(3), F(3), G(3), 1-8(3), 1-12(3), 1-89(3), 3-225(3), 1-90(3), 1-91(3), 1-36(3), and 1-8(4), each having a thickness of 40 nanometers (nm).

The emission spectrum of each of Films A(1), B(1), C(1), D(1), E(1), F(1), G(1), 1-8(1), 1-12(1), 1-89(1), 3-225(1), 1-90(1), 1-91(1), 1-36(1), A(3), B(3), C(3), D(3), E(3), F(3), G(3), 1-8(3), 1-12(3), 1-89(3), 3-225(3), 1-90(3), 1-91(3), 1-36(3), and 1-8(4) was measured by using a Hamamatsu Quantaurus-QY absolute PL quantum yield measurement system equipped with a xenon light source, a monochromator, a photonic multichannel analyzer, and an integrating sphere, and utilizing PLQY measurement software (Hamamatsu Photonics, Ltd., Shizuoka, Japan). For the measurements, an excitation wavelength was scanned and measured at every 10 nm interval from 320 nm to 380 nm, and from these measurements, a spectrum measured at the excitation wavelength of 340 nm was taken. Then, an emission energy of the maximum emission wavelength of the dopant included in each Film was measured and shown in Tables 1 and 2.

Subsequently, the PLQY of each of Films A(1), B(1), C(1), D(1), E(1), F(1), G(1), 1-8(1), 1-12(1), 1-89(1), 3-225 (1), 1-90(1), 1-91(1), 1-36(1), A(3), B(3), C(3), D(3), E(3), F(3), G(3), 1-8(3), 1-12(3), 1-89(3), 3-225(3), 1-90(3), 1-91(3), 1-36(3), and 1-8(4) was scanned and measured at an excitation wavelength of every 10 nm interval from 320 nm to 380 nm by using a Hamamatsu Quantaurus-QY absolute PL quantum yield measurement system. The PLQY of the dopant included in each Film measured is shown in Tables 1 and 2.

TABLE 1

| Film No. | Film composition (weight ratio) | Emission energy of maximum emission wavelength of dopant (eV) | PLQY of dopant |
|---|---|---|---|
| A(1) | H-H1:H-E1:A (45:45:10) | 2.39 | 0.939 |
| B(1) | H-H1:H-E1:B (45:45:10) | 2.35 | 0.919 |
| C(1) | H-H1:H-E1:C (45:45:10) | 2.37 | 0.888 |
| D(1) | H-H1:H-E1:D (45:45:10) | 2.43 | 0.828 |
| E(1) | H-H1:H-E1:E (45:45:10) | 2.44 | 0.921 |
| F(1) | H-H1:H-E1:F (45:45:10) | 2.38 | 0.986 |
| G(1) | H-H1:H-E1:G (45:45:10) | 2.39 | 0.943 |
| 1-8(1) | H-H1:H-E1:1-8 (45:45:10) | 2.34 | 0.980 |
| 1-12(1) | H-H1:H-E1:1-12 (45:45:10) | 2.35 | 0.980 |
| 1-89(1) | H-H1:H-E1:1-89 (45:45:10) | 2.33 | 0.979 |
| 3-225(1) | H-H:H-E1:3-225 (45:45:10) | 2.33 | 0.979 |
| 1-90(1) | H-H1:H-E1:1-90 (45:45:10) | 2.33 | 0.978 |
| 1-91(1) | H-H1:H-E1:1-91 (45:45:10) | 2.35 | 0.980 |
| 1-36(1) | H-H1:H-E1:1-36 (45:45:10) | 2.35 | 0.978 |

TABLE 2

| Film No. | Film composition (weight ratio) | Emission energy of maximum emission wavelength of dopant (eV) | PLQY of dopant |
|---|---|---|---|
| A(3) | H-H2:H-E43:A (45:45:10) | 2.39 | 0.925 |
| B(3) | H-H2:H-E43:B (45:45:10) | 2.35 | 0.867 |
| C(3) | H-H2:H-E43:C (45:45:10) | 2.37 | 0.879 |
| D(3) | H-H2:H-E43:D (45:45:10) | 2.43 | 0.805 |
| E(3) | H-H2:H-E43:E (45:45:10) | 2.44 | 0.869 |
| F(3) | H-H2:H-E43:F (45:45:10) | 2.38 | 0.927 |
| G(3) | H-H2:H-E43:G (45:45:10) | 2.39 | 0.889 |
| 1-8(3) | H-H2:H-E43:1-8 (45:45:10) | 2.34 | 0.942 |
| 1-12(3) | H-H2:H-E43:1-12 (45:45:10) | 2.35 | 0.951 |
| 1-89(3) | H-H2:H-E43:1-89 (45:45:10) | 2.33 | 0.935 |
| 3-225(3) | H-H2:H-E43:3-225 (45:45:10) | 2.33 | 0.967 |
| 1-90(3) | H-H2:H-E43:1-90 (45:45:10) | 2.33 | 0.970 |
| 1-91(3) | H-H2:H-E43:1-91 (45:45:10) | 2.35 | 0.924 |
| 1-36(3) | H-H2:H-E43:1-36 (45:45:10) | 2.35 | 0.955 |
| 1-8(4) | H-H17:H-E43:1-8 (45:45:10) | 2.34 | 0.985 |

H-H1

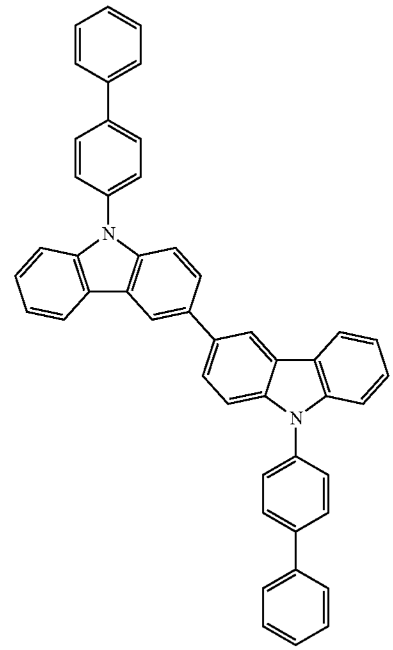

H-E1

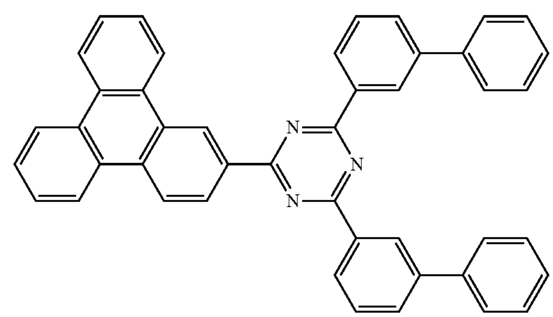

H-H2

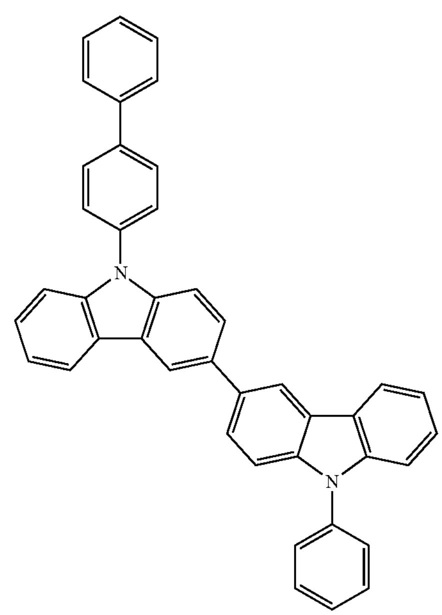

-continued
H-H17
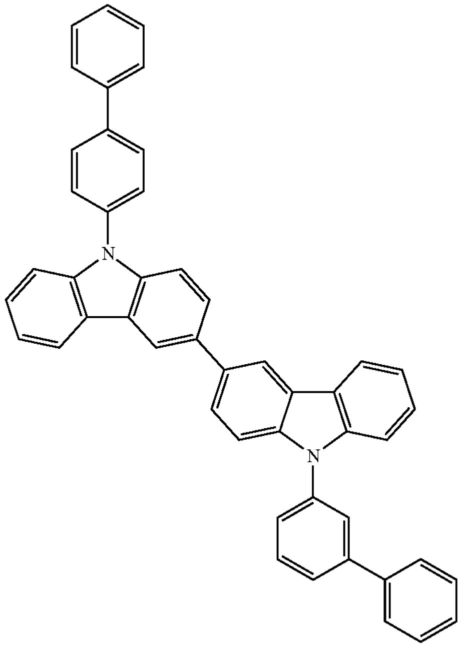
H-E43
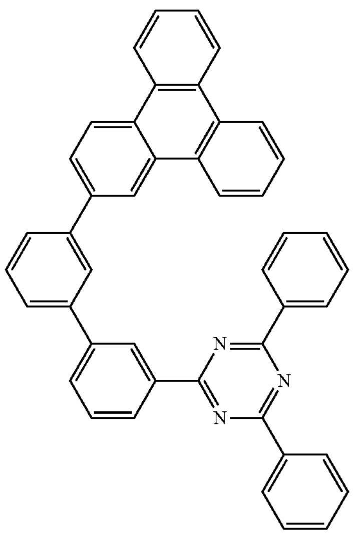
A
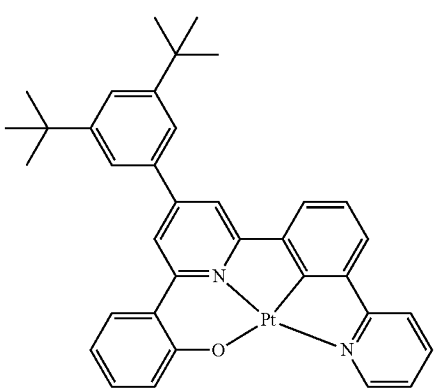
-continued
B
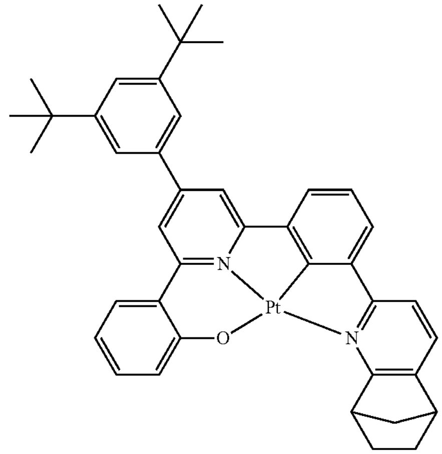
C
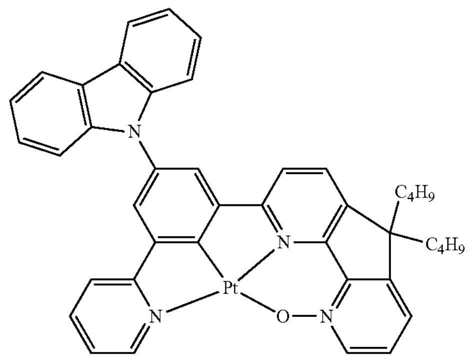
D
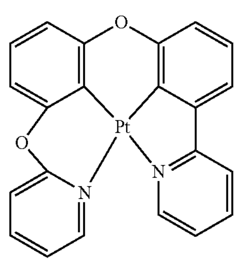
E
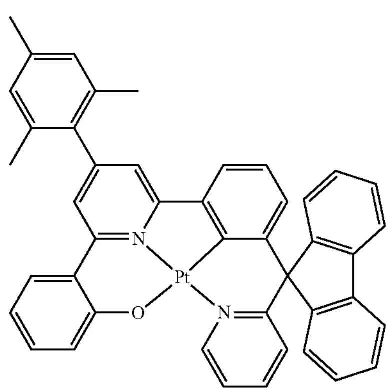

-continued
F
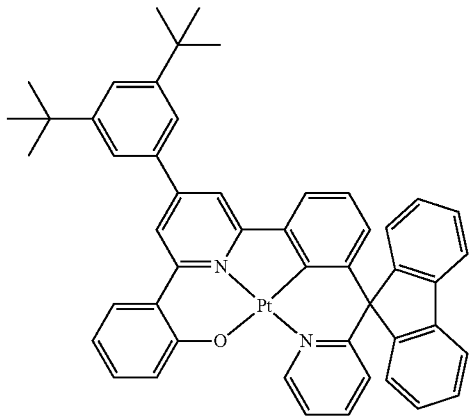
G
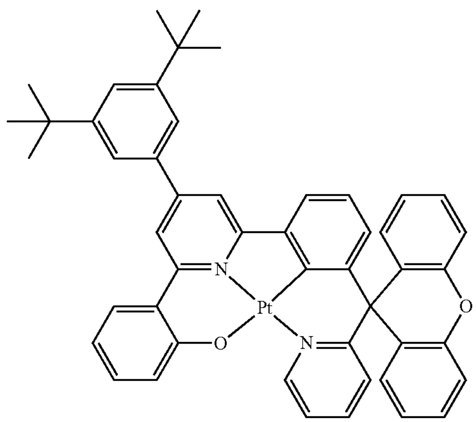
1-8
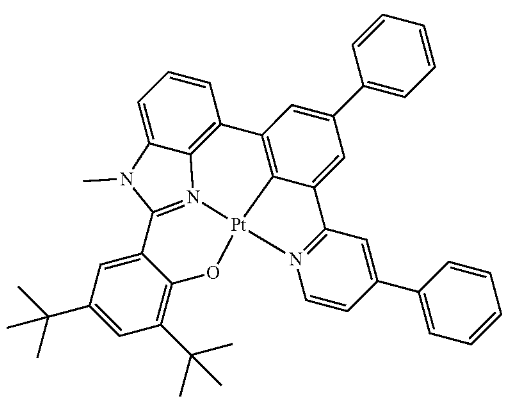
1-12
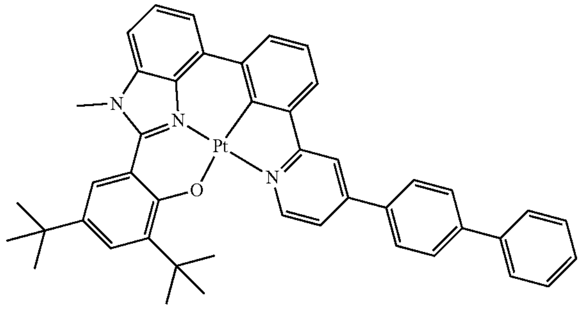
-continued
1-89
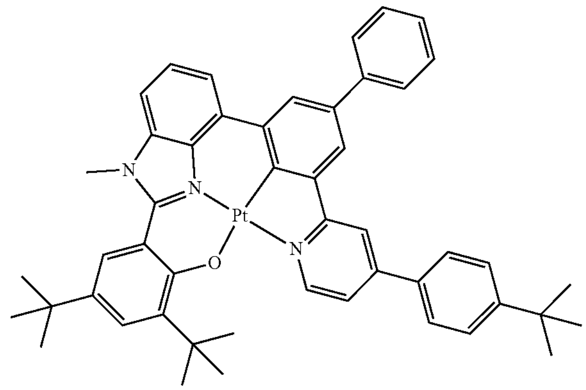
3-225
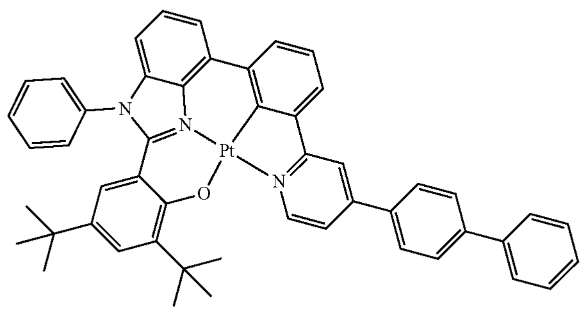
1-90
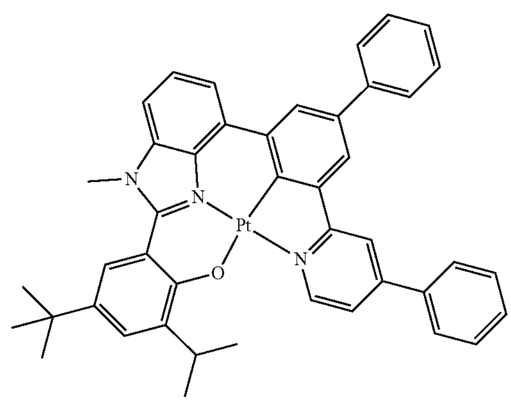
1-91
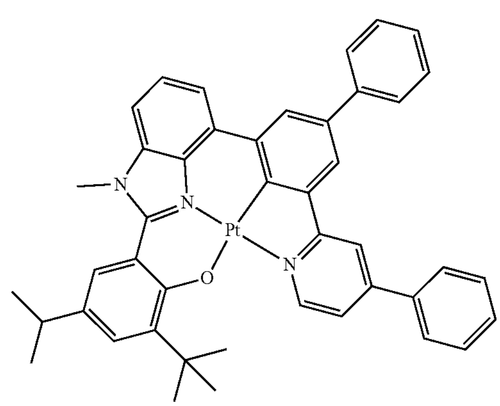

-continued 1-36

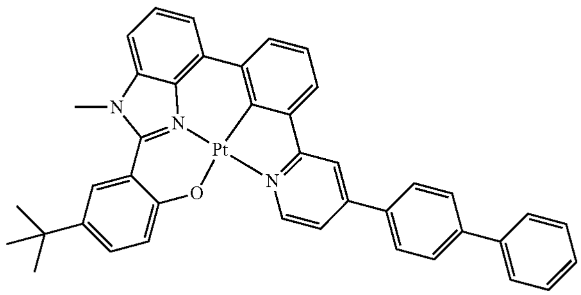

Evaluation Example 2: Measurement of Decay Time

Each of photoluminescence (PL) spectra of Films A(1), B(1), C(1), D(1), E(1), F(1), G(1), 1-8(1), 1-12(1), 1-89(1), 3-225(1), 1-90(1), 1-91(1), 1-36(1), A(3), B(3), C(3), D(3), E(3), F(3), G(3), 1-8(3), 1-12(3), 1-89(3), 3-225(3), 1-90(3), 1-91(3), 1-36(3) and 1-8(4) was evaluated at room temperature by using a time-resolved photoluminescence (TRPL) measurement system, FluoTime 300 (available from PicoQuant), and a pumping source, PLS340 (available from PicoQuant, excitation wavelength=340 nm, spectral width=20 nm). Then, a wavelength of the main peak in each PL spectrum was determined, and upon photon pulses (pulse width=500 picoseconds, μs) applied to the film by PLS340, the number of photons emitted at the wavelength of the main peak for each film was repeatedly measured over time by time-correlated single photon counting (TCSPC), thereby obtaining TRPL curves available for the sufficient fitting. Based on the results obtained therefrom, one or more exponential decay functions were set forth for the fitting, thereby obtaining a decay time $T_{decay}$ (Ex) for each of Films A(1), B(1), C(1), D(1), E(1), F(1), G(1), 1-8(1), 1-12(1), 1-89(1), 3-225(1), 1-90(1), 1-91(1), 1-36(1), A(3), B(3), C(3), D(3), E(3), F(3), G(3), 1-8(3), 1-12(3), 1-89(3), 3-225 (3), 1-90(3), 1-91(3), 1-36(3) and 1-8(4). The results thereof are shown in Tables 3 and 4. The functions used for the fitting are as described in Equation 20, and an average of each decay time $T_{decay}$ for each of the exponential decay functions used for the fitting was taken as $T_{decay}$(Ex), i.e., a decay time. Here, during the same measurement time as the measurement time for obtaining TRPL curves, the same measurement was repeated once more in a dark state (i.e., a state where a pumping signal incident on each of the films was blocked), thereby obtaining a baseline or a background signal curve available as a baseline for the fitting:

Equation 20

$$f(t) = \sum_{i=1}^{n} A_i \exp(-t / T_{decay,i})$$

TABLE 3

| Film No. | Film composition (weight ratio) | Decay time of dopant (μs) |
|---|---|---|
| A(1) | H-H1:H-E1:A (45:45:10) | 3.1 |
| B(1) | H-H1:H-E1:B (45:45:10) | 3.7 |
| C(1) | H-H1:H-E1:C (45:45:10) | 10.9 |
| D(1) | H-H1:H-E1:D (45:45:10) | 4.3 |
| E(1) | H-H1:H-E1:E (45:45:10) | 6.5 |
| F(1) | H-H1:H-E1:F (45:45:10) | 4.5 |
| G(1) | H-H1:H-E1:G (45:45:10) | 4.4 |
| 1-8(1) | H-H1:H-E1:1-8 (45:45:10) | 2.4 |
| 1-12(1) | H-H1:H-E1:1-12 (45:45:10) | 2.4 |
| 1-89(1) | H-H1:H-E1:1-89 (45:45:10) | 2.4 |
| 3-225(1) | H-H1:H-E1:3-225 (45:45:10) | 2.3 |
| 1-90(1) | H-H1:H-E1:1-90 (45:45:10) | 2.0 |
| 1-91(1) | H-H1:H-E1:1-91 (45:45:10) | 2.5 |
| 1-36(1) | H-H1:H-E1:1-36 (45:45:10) | 2.4 |

TABLE 4

| Film No. | Film composition (weight ratio) | Decay time of dopant (μs) |
|---|---|---|
| A(3) | H-H2:H-E43:A (45:45:10) | 3.1 |
| B(3) | H-H2:H-E43:B (45:45:10) | 3.6 |
| C(3) | H-H2:H-E43:C (45:45:10) | 11.1 |
| D(3) | H-H2:H-E43:D (45:45:10) | 4.3 |
| E(3) | H-H2:H-E43:E (45:45:10) | 6.3 |
| F(3) | H-H2:H-E43:F (45:45:10) | 4.4 |
| G(3) | H-H2:H-E43:G (45:45:10) | 4.2 |
| 1-8(3) | H-H2:H-E43:1-8 (45:45:10) | 2.5 |
| 1-12(3) | H-H2:H-E43:1-12 (45:45:10) | 2.5 |
| 1-89(3) | H-H2:H-E43:1-89 (45:45:10) | 2.3 |
| 3-225(3) | H-H2:H-E43:3-225 (45:45:10) | 2.4 |
| 1-90(3) | H-H2:H-E43:1-90 (45:45:10) | 2.0 |
| 1-91(3) | H-H2:H-E43:1-91 (45:45:10) | 2.4 |
| 1-36(3) | H-H2:H-E43:1-36 (45:45:10) | 2.4 |
| 1-8(4) | H-H17:H-E43:1-8 (45:45:10) | 2.3 |

Evaluation Example 3: Measurement of HOMO Energy Level

Each Compound shown in Table 5 was vacuum-(co)-deposited on an ITO substrate in a weight ratio shown in Table 5 at a vacuum degree of $10^{-7}$ torr to form Films A(2), B(2), C(2), D(2), E(2), F(2), G(2), 1-8(2), 1-12(2), 1-89(2), 3-225(2), 1-90(2), 1-91(2), 1-36(2), H-H1, H-E1, H-H2, H-H17 and H-E43 each having a thickness of 40 nm. The photoelectron emission of each Film was measured by using a photoelectron spectrometer AC3 (available from Riken Keiki Co., Ltd.) in an ambient atmosphere. During the measurement, the intensity of UV light source of AC-3 was fixed at 10 nanowatts (nW), and the photoelectron emission was measured at every 0.05 eV interval from −4.5 eV to −7.0 eV. The time for measuring each point was 10 seconds. In order to obtain the HOMO energy level, a photoelectron efficiency spectrum was obtained by applying a cube root to the measured photoelectron emission intensity value. Then, a tangent line was drawn for a first slope to obtain a point of contact between a baseline and the tangent line. The results thereof are shown in Table 3. Here, the baseline was modified using a light source modification function of AC3.

TABLE 5

| Film No. | Film composition (weight ratio) | HOMO energy level (eV) |
|---|---|---|
| A(2) | 1,4-Bis(triphenylsilyl)benzene:A (85:15) | −5.34 |
| B(2) | 1,4-Bis(triphenylsilyl)benzene:B (85:15) | −5.48 |
| C(2) | 1,4-Bis(triphenylsilyl)benzene:C (85:15) | −5.68 |

TABLE 5-continued

| Film No. | Film composition (weight ratio) | HOMO energy level (eV) |
|---|---|---|
| D(2) | 1,4-Bis(triphenylsilyl)benzene:D (85:15) | −5.38 |
| E(2) | 1,4-Bis(triphenylsilyl)benzene:E (85:15) | −5.62 |
| F(2) | 1,4-Bis(triphenylsilyl)benzene:F (85:15) | −5.55 |
| G(2) | 1,4-Bis(triphenylsilyl)benzene:G (85:15) | −5.58 |
| 1-8(2) | 1,4-Bis(triphenylsilyl)benzene:1-8 (85:15) | −5.38 |
| 1-12(2) | 1,4-Bis(triphenylsilyl)benzene:1-12 (85:15) | −5.39 |
| 1-89(2) | 1,4-Bis(triphenylsilyl)benzene:1-89 (85:15) | −5.35 |
| 3-225(2) | 1,4-Bis(triphenylsilyl)benzene:3-225 (85:15) | −5.34 |
| 1-90(2) | 1,4-Bis(triphenylsilyl)benzene:1-90 (85:15) | −5.36 |
| 1-91(2) | 1,4-Bis(triphenylsilyl)benzene:1-91 (85:15) | −5.37 |
| 1-36(2) | 1,4-Bis(triphenylsilyl)benzene:1-36 (85:15) | −5.36 |
| H-H1 | H-H1 (100 wt %) | −5.57 |
| H-E1 | H-E1 (100 wt %) | −6.07 |
| H-H2 | H-H2 (100 wt %) | −5.59 |
| H-H17 | H-H17 (100 wt %) | −5.55 |
| H-E43 | H-E43 (100 wt %) | −6.08 |

Comparative Example A

An ITO glass substrate was cut to a size of 50 millimeters (mm)×50 mm×0.5 mm. Then, the glass substrate was sonicated in acetone iso-propyl alcohol and pure water for about 15 minutes each, and cleaned by exposure to ultraviolet rays and ozone for 30 minutes.

F6-TCNNQ was deposited on the ITO electrode (anode) on the glass substrate to form a hole injection layer having a thickness of 100 Å, and then HT1 was deposited on the hole injection layer to form a hole transport layer having a thickness of 1,260 Å, thereby forming a hole transport region.

Then, a hole transporting host H-H1 and an electron transporting host H-E1 (where a weight ratio of the hole transporting host to the electron transporting host was 5:5) as a host and Compound A as a dopant were co-deposited on the hole transport region (where a weight ratio of the host to the dopant was 90:10), thereby forming an emission layer having a thickness of 400 Å.

Subsequently, Compound ET1 and Liq were co-deposited on a weight ratio of 5:5 on the emission layer to form an electron transport layer having a thickness of 360 Å. Then, LiF was deposited on the electron transport layer to form an electron injection layer having a thickness of 5 Å. Then, Al was vacuum-deposited on the electron injection layer to form a second electrode (cathode) having a thickness of 800 Å, thereby completing the manufacture of an organic light-emitting device having a structure of ITO/F6-TCNNQ (100 Å)/HT1 (1,260 Å)/(H-H1+H-E1):Compound A (10 weight %) (400 Å)/ET1:Liq (50 weight %) (360 Å)/LiF (5 Å)/Al (800 Å).

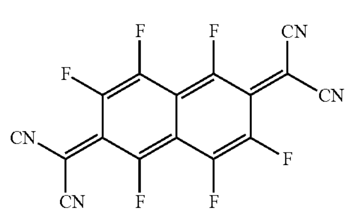

F6-TCNNQ

-continued

HT1

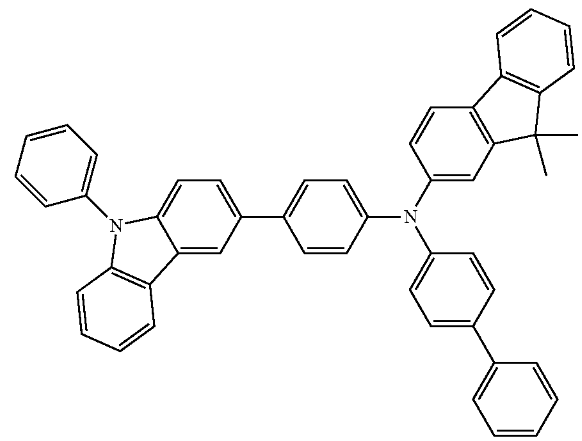

H-H1

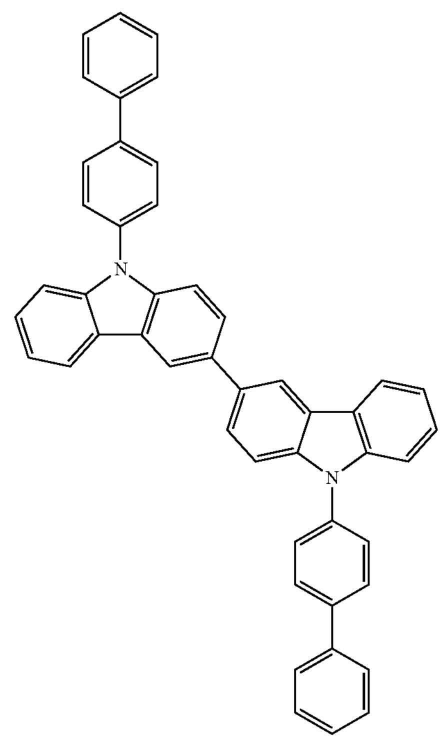

H-E1

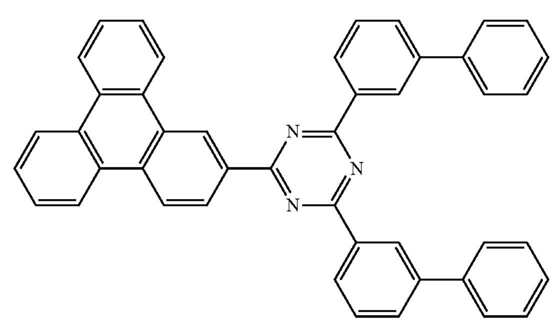

-continued

ET1

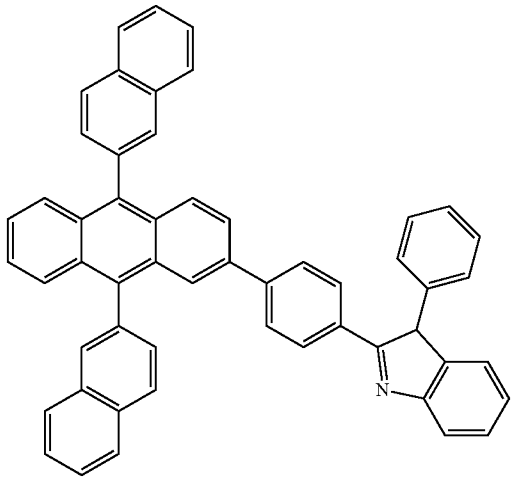

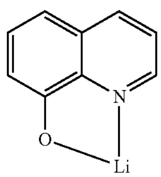

Liq

Comparative Examples B to G and Examples 1 to 7

Organic light-emitting devices were manufactured in substantially the same manner as in Comparative Example A, except that compounds shown in Table 6 as a hole transporting host, an electron transporting host and a dopant were used in the formation of the emission layer.

Comparative Examples 1A to 1G and Examples 11 to 18

Organic light-emitting devices were manufactured in substantially the same manner as in Comparative Example A, except that compounds shown in Table 7 as a hole transporting host, an electron transporting host and a dopant were used in the formation of the emission layer.

Evaluation Example 4: Measurement of OLED Lifespan

The lifespan ($T_{95}$) of each of the organic light-emitting devices manufactured in Comparative Examples A to G, Examples 1 to 7, Comparative Examples 1A to 1G and Examples 11 to 18 (at 6,000 candelas per square meter ($cd/m^2$)) was measured. The results thereof are shown in Tables 6 and 7. A luminance meter (Minolta Cs-1000A) was used in evaluation, and the lifespan (T95) refers to time required for the initial luminance of 6,000 nit of the organic light-emitting device to reduce by 95%. The lifespan ($T_{95}$) was shown in values (%) relative to that of the organic light-emitting device of Example 1 (in other words, the lifespan ($T_{95}$) of the organic light-emitting device of Example 1 is 100%).

TABLE 6

| | A hole transporting host | An electron transporting host | dopant | Emission energy of maximum emission wavelength of dopant (eV) | PLQY of dopant | Decay time of dopant (μs) | HOMO (dopant)-HOMO (host) (eV) | Lifespan ($T_{95}$) (%) |
|---|---|---|---|---|---|---|---|---|
| Comparative Example A | H-H1 | H-E1 | A | 2.39 | 0.939 | 3.1 | 0.23 | 8.2 |
| Comparative Example B | H-H1 | H-E1 | B | 2.35 | 0.919 | 3.7 | 0.09 | 20 |
| Comparative Example C | H-H1 | H-E1 | C | 2.37 | 0.888 | 10.9 | −0.11 | 1.3 |
| Comparative Example D | H-H1 | H-E1 | D | 2.43 | 0.828 | 4.3 | 0.19 | 4.0 |
| Comparative Example E | H-H1 | H-E1 | E | 2.44 | 0.921 | 6.5 | −0.05 | 0.4 |
| Comparative Example F | H-H1 | H-E1 | F | 2.38 | 0.986 | 4.5 | 0.02 | 2.5 |
| Comparative Example G | H-H1 | H-E1 | G | 2.39 | 0.943 | 4.4 | −0.01 | 1.6 |
| Example 1 | H-H1 | H-E1 | 1-8 | 2.34 | 0.980 | 2.4 | 0.19 | 100 |
| Example 2 | H-H1 | H-E1 | 1-12 | 2.35 | 0.980 | 2.4 | 0.18 | 70 |
| Example 3 | H-H1 | H-E1 | 1-89 | 2.33 | 0.979 | 2.4 | 0.22 | 84 |
| Example 4 | H-H1 | H-E1 | 3-225 | 2.33 | 0.979 | 2.3 | 0.23 | 72 |
| Example 5 | H-H1 | H-E1 | 1-90 | 2.33 | 0.978 | 2.0 | 0.21 | 86 |
| Example 6 | H-H1 | H-E1 | l-91 | 2.35 | 0.980 | 2.5 | 0.20 | 76 |
| Example 7 | H-H1 | H-E1 | 1-36 | 2.35 | 0.978 | 2.4 | 0.21 | 70 |

TABLE 7

| | A hole transporting host | An electron transporting host | dopant | Emission energy of maximum emission wavelength of dopant (eV | PLQY of dopant | Decay time of dopant (μs) | HOMO (dopant)-HOMO (host) (eV) | Lifespan ($T_{95}$) (%) |
|---|---|---|---|---|---|---|---|---|
| Comparative Example 1A | H-H2 | H-E43 | A | 2.39 | 0.925 | 3.1 | 0.25 | 4.3 |
| Comparative Example 1B | H-H2 | H-E43 | B | 2.35 | 0.867 | 3.6 | 0.11 | 12 |
| Comparative Example 1C | H-H2 | H-E43 | C | 2.37 | 0.879 | 11.1 | −0.09 | 0.8 |
| Comparative Example 1D | H-H2 | H-E43 | D | 2.43 | 0.805 | 4.3 | 0.21 | 2.8 |
| Comparative Example 1E | H-H2 | H-E43 | E | 2.44 | 0.869 | 6.3 | −0.03 | 0.2 |
| Comparative Example 1F | H-H2 | H-E43 | F | 2.38 | 0.927 | 4.4 | 0.04 | 1.5 |
| Comparative Example 1G | H-H2 | H-E43 | G | 2.39 | 0.889 | 4.2 | 0.01 | 0.8 |
| Example 11 | H-H2 | H-E43 | 1-8 | 2.34 | 0.942 | 2.5 | 0.21 | 78 |
| Example 12 | H-H2 | H-E43 | 1-12 | 2.35 | 0.951 | 2.5 | 0.20 | 72 |
| Example 13 | H-H2 | H-E43 | 1-89 | 2.33 | 0.935 | 2.3 | 0.24 | 60 |
| Example 14 | H-H2 | H-E43 | 3-225 | 2.33 | 0.967 | 2.4 | 0.25 | 50 |
| Example 15 | H-H2 | H-E43 | 1-90 | 2.33 | 0.970 | 2.0 | 0.23 | 82 |
| Example 16 | H-H2 | H-E43 | 1-91 | 2.35 | 0.924 | 2.4 | 0.22 | 41 |
| Example 17 | H-H2 | H-E43 | 1-36 | 2.35 | 0.955 | 2.4 | 0.23 | 34 |
| Example 18 | H-H17 | H-E43 | 1-8 | 2.34 | 0.985 | 2.3 | 0.17 | 120 |

H-H1

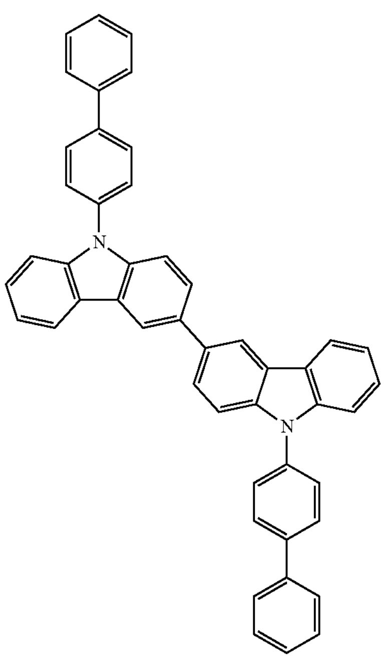

-continued

H-E1

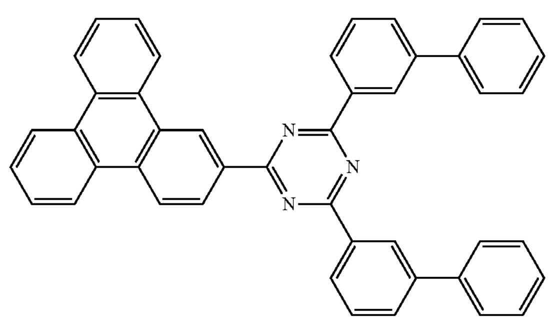

-continued
H-H2
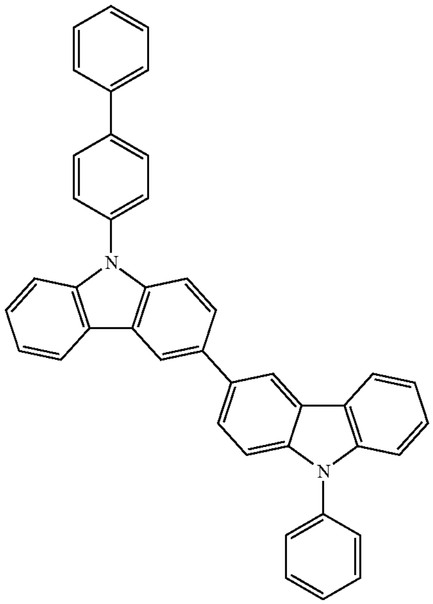
H-H17
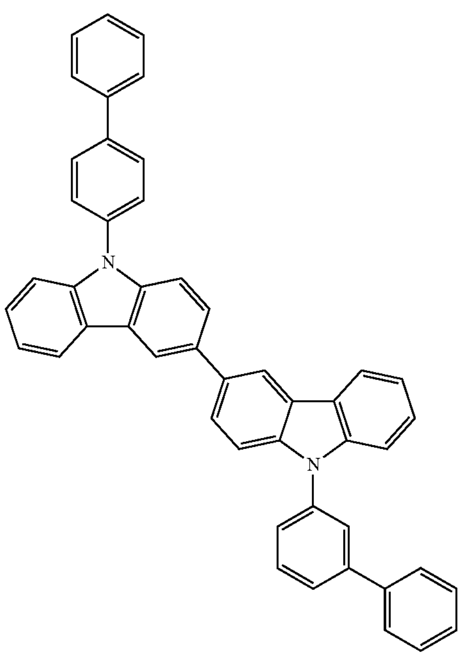
-continued
H-E43
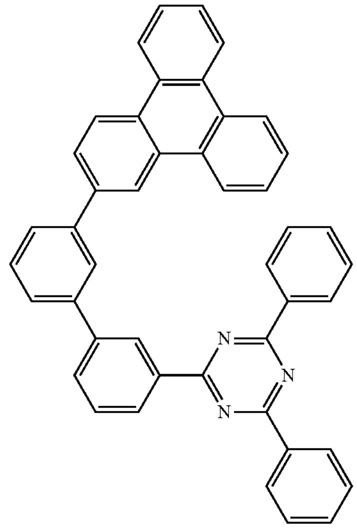
A
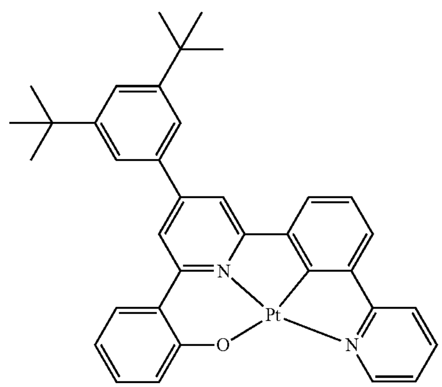
B
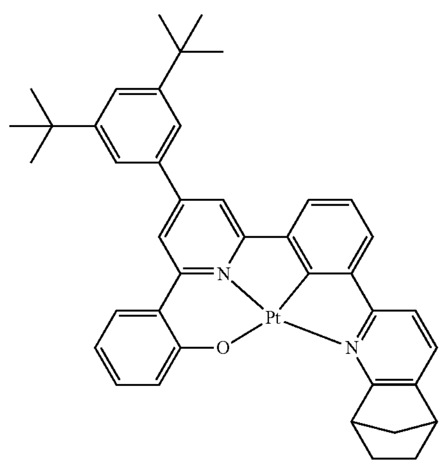

-continued
C
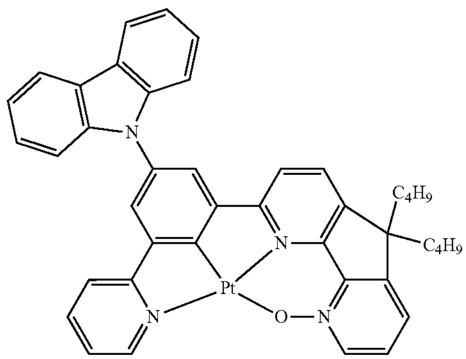
D
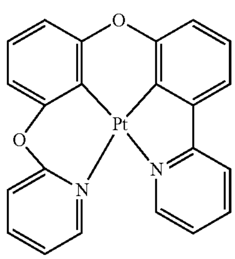
E
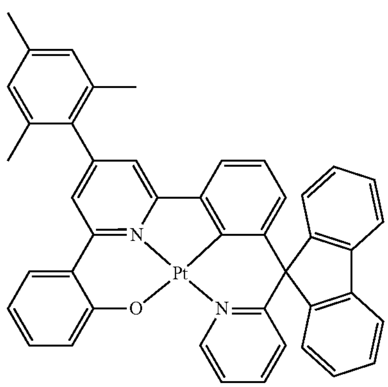
F
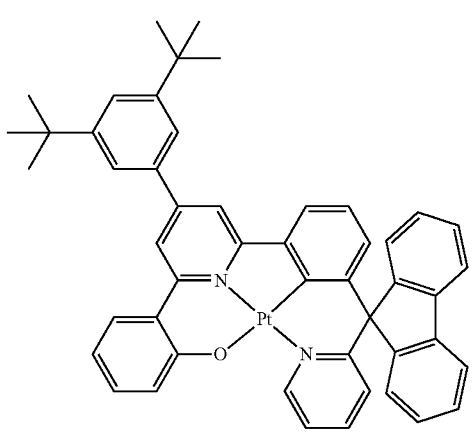
-continued
G
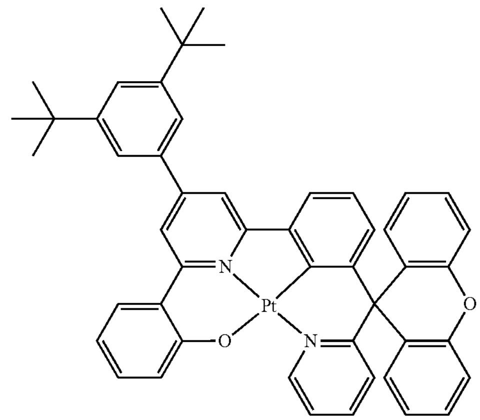
1-8
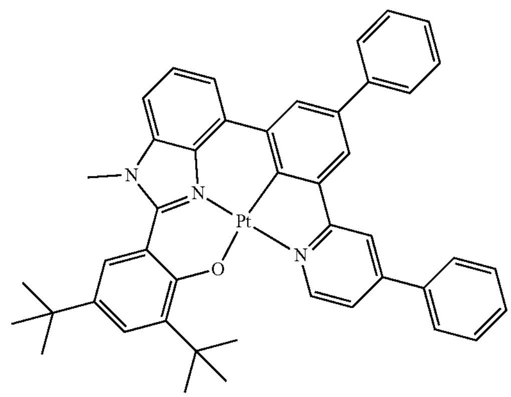
1-12
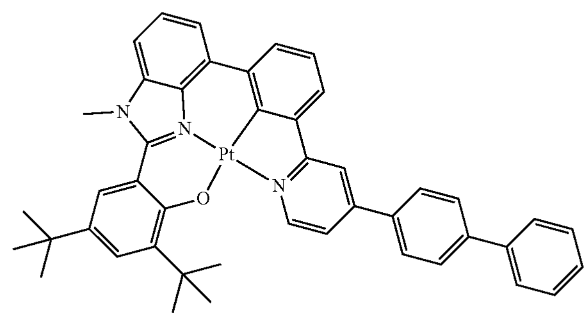
1-89
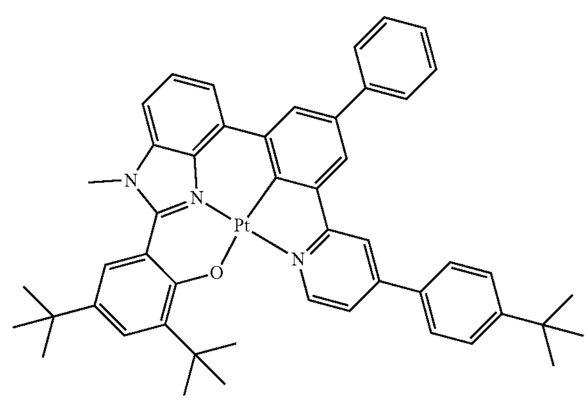

-continued 3-225

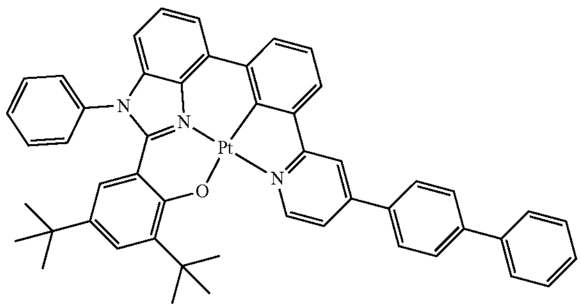

1-90

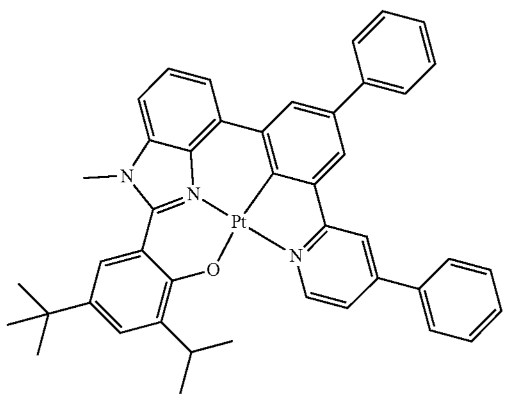

1-91

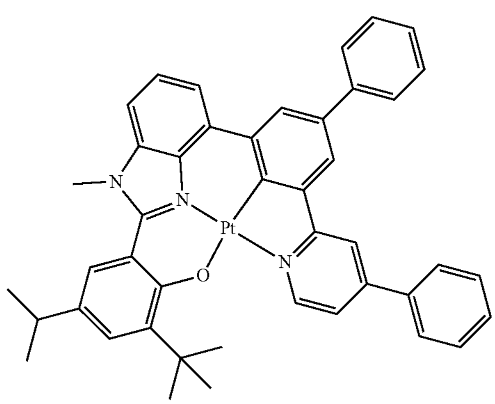

1-36

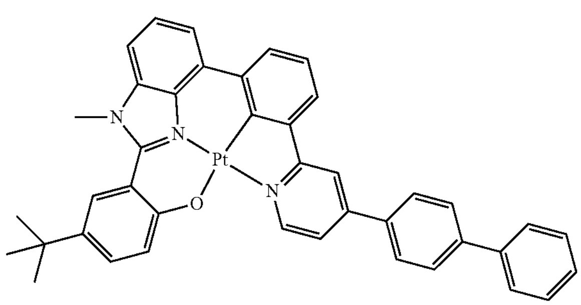

Referring to Table 6, it was found that the organic light-emitting devices of Examples 1 to 7 have improved lifespan characteristics, as compared with the organic light-emitting devices of Comparative Examples A to G and referring to Table 7, it was found that the organic light-emitting devices of Examples 11 to 18 have improved lifespan characteristics, as compared with the organic light-emitting devices of Comparative Examples 1A to 1G.

As apparent from the foregoing description, an organic light-emitting device satisfying certain parameters may have long lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. An organic light-emitting device comprising:

a first electrode;

a second electrode facing the first electrode; and an emission layer disposed between the first electrode and the second electrode, wherein the emission layer comprises a host and a dopant, the emission layer emits a phosphorescent light, the dopant is an organometallic compound, a photoluminescence quantum yield (PLQY) of the dopant is about 0.8 or greater and about 1.0 or less, a decay time of the dopant is about 0.1 microseconds or greater and about 2.9 microseconds or less, 0.1 electron volts $\leq$ HOMO (dopant) $-$ HOMO (host) $\leq$ about 0.4 electron volts, wherein the HOMO (dopant) represents a highest occupied molecular orbital (HOMO) energy level (expressed in electron volts) of the dopant, and the HOMO (host) represents, in a case where the host comprised in the emission layer comprises one type of host, a HOMO energy level (expressed in electron volts) of the one type of host; or in a case where the host comprised in the emission layer is a mixture of two or more different types of host, a highest HOMO energy level from among HOMO energy levels (expressed in electron volts) of the two or more different types of host, the PLQY of the dopant is a PLQY of Film 1, the decay time of the dopant is calculated from a time-resolved photoluminescence (TRPL) spectrum with respect to Film 1, Film 1 has a thickness of 40 nanometers obtained by vacuum-deposition of the host and the dopant comprised in the emission layer in a weight ratio of 90:10 on a quartz substrate at a vacuum degree of $10^{-7}$ torr, the HOMO (dopant) is a negative value measured by using a photoelectron spectrometer in an ambient atmosphere with respect to a film having a thickness of 40 nanometers obtained by vacuum-deposition of 1,4-bis(triphenylsilyl)benzene and the dopant comprised in the emission layer in a weight ratio of 85:15 on an ITO substrate at a vacuum degree of $10^{-7}$ torr, and the HOMO (host) is, i) in a case where the host comprises one type of host, a negative value measured by using a photoelectron spectrometer in an ambient atmosphere with respect to a film having a thickness of 40 nanometers obtained by vacuum-deposition of the one type of host on an ITO substrate at a vacuum degree of $10^{-7}$ torr; or ii) in a case where the host is a mixture of two or more different types of host, a largest negative value from among negative values measured by using a photoelectron spectrometer in an ambient atmosphere with respect to films having a thickness of 40 nanometers obtained by vacuum-deposition of each of the two or more different types of host on an ITO substrate at a vacuum degree of $10^{-7}$ torr.

2. The organic light-emitting device of claim 1, wherein the emission energy of a maximum emission wavelength of an emission spectrum of the dopant is about 2.31 electron volts or greater and about 2.48 electron volts or less and the emission energy of a maximum emission wavelength of an emission spectrum of the dopant is calculated from a maximum emission wavelength of an emission spectrum with respect to Film 1.

3. The organic light-emitting device of claim 1, wherein the PLQY of the dopant is about 0.9 or greater and about 1.0 or less.

4. The organic light-emitting device of claim 1, wherein a decay time of the dopant is about 1.0 microseconds or greater and about 2.9 microseconds or less.

5. The organic light-emitting device of claim 1, wherein 0.1 electron volts≤HOMO (dopant)−HOMO (host)≤about 0.25 electron volts.

6. The organic light-emitting device of claim 1, wherein
the PLQY of the dopant is about 0.975 or greater and about 1.0 or less,
the decay time of the dopant is about 2.0 microseconds or greater and about 2.5 microseconds or less, and
0.15 electron volts≤HOMO (dopant)−HOMO (host) ≤about 0.25 electron volts.

7. The organic light-emitting device of claim 1, wherein the dopant is an iridium-free organometallic compound.

8. The organic light-emitting device of claim 1, wherein the dopant is an organometallic compound comprising platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au).

9. The organic light-emitting device of claim 1, wherein the dopant is an organometallic compound comprising platinum.

10. The organic light-emitting device of claim 1, wherein the dopant has a square-planar coordination structure.

11. The organic light-emitting device of claim 1, wherein the dopant comprises a metal M and an organic ligand, wherein the metal M and the organic ligand are capable of together forming one, two, or three cyclometalated rings.

12. The organic light-emitting device of claim 1, wherein
the dopant comprises a metal M and a tetradentate organic ligand, wherein the metal M and the tetradentate organic ligand are capable of together forming three or four cyclometalated rings,
the metal M is platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au), and
the tetradentate organic ligand comprises a benzimidazole group and a pyridine group.

13. The organic light-emitting device of claim 1, wherein
the host comprises an electron transporting host and a hole transporting host,
the electron transporting host comprises at least one electron transporting moiety,
the hole transporting host does not comprise an electron transporting moiety, and
the at least one electron transporting moiety is selected from a cyano group, a π electron-depleted nitrogen-containing cyclic group, and a group represented by one of following Formulae:

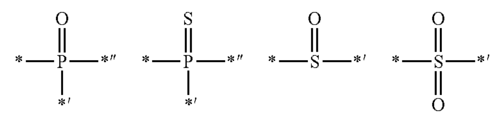

wherein, in the Formulae above, *, *', and *" each indicate a binding site to an adjacent atom.

14. The organic light-emitting device of claim 13, wherein
the electron transporting host comprises at least one π electron-depleted nitrogen-free cyclic group and at least one electron transporting moiety,
the hole transporting host comprises at least one π electron-depleted nitrogen-free cyclic group and does not comprise an electron transporting moiety, and
the at least one electron transporting moiety is a cyano group or a π electron-depleted nitrogen-containing cyclic group.

15. The organic light-emitting device of claim 14, wherein
the π electron-depleted nitrogen-containing cyclic group is an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinolic group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, or a condensed ring group in which at least one of the foregoing groups is condensed with at least one cyclic group, and
the π electron-depleted nitrogen-free cyclic group is a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, or a triindolobenzene group.

16. The organic light-emitting device of claim 13, wherein the electron transporting host comprises i) at least one selected from a cyano group, a pyrimidine group, a pyrazine group, and a triazine group and ii) a triphenylene group, and the hole transporting host comprises a carbazole group.

17. The organic light-emitting device of claim 13, wherein the electron transporting host comprises at least one cyano group.

18. The organic light-emitting device of claim 1, wherein a hole transport region is disposed between the first electrode and the emission layer, and the hole transport region comprises an amine-containing compound.

19. An organic light-emitting device comprising:

a first electrode;

a second electrode facing the first electrode;

emission units in the number of m stacked between the first electrode and the second electrode and comprising at least one emission layer; and charge generating layers in the number of m−1 disposed between each two adjacent emission units from among the m emission units, the each m−1 charge generating layers comprising an n-type charge generating layer and a p-type charge generating layer, wherein m is an integer of 2 or greater, a maximum emission wavelength of light emitted from at least one of the emission units in the number of m differs from that of light emitted from at least one of the other emission units, the emission layer comprises a host and a dopant, the emission layer emits a phosphorescent light, the dopant is an organometallic compound, a photoluminescence quantum yield (PLOY) of the dopant is about 0.8 or greater and about 1.0 or less, a decay time of the dopant is about 0.1 microseconds or greater and about 2.9 microseconds or less, 0.1 electron volts≤HOMO (dopant)−HOMO (host)≤about 0.4 electron volts, wherein the HOMO (dopant) represents a highest occupied molecular orbital (HOMO) energy level (expressed in electron volts) of the dopant, and the HOMO (host) represents, in a case where the host comprised in the emission layer comprises one type of host, a HOMO energy level (expressed in electron volts) of the one type of host; or in a case where the host comprised in the emission layer is a mixture of two or more different types of host, a highest HOMO energy level from among HOMO energy levels (expressed in electron volts) of the two or more different types of host, the PLQY of the dopant is a PLQY of Film 1, the decay time of the dopant is calculated from a time-resolved photoluminescence (TRPL) spectrum with respect to Film 1, Film 1 is a film having a thickness of 40 nanometers obtained by vacuum-deposition of the host and the dopant comprised in the emission layer in a weight ratio of 90:10 on a quartz substrate at a vacuum degree of $10^{-7}$ torr, the HOMO (dopant) is a negative value measured by using a photoelectron spectrometer in an ambient atmosphere with respect to a film having a thickness of 40 nanometers obtained by vacuum-deposition of 1,4-bis (triphenylsilyl)benzene and the dopant comprised in the emission layer in a weight ratio of 85:15 on an ITO substrate at a vacuum degree of $10^{-7}$ torr, and the HOMO (host) is, i) in a case where the host comprises one type of host, a negative value measured by using a photoelectron spectrometer in an ambient atmosphere with respect to a film having a thickness of 40 nanometers obtained by vacuum-deposition of the one type of host on an ITO substrate at a vacuum degree of $10^{-7}$ torr; or ii) in a case where the host is a mixture of two or more different types of host, a largest negative value from among negative values measured by using a photoelectron spectrometer in an ambient atmosphere with respect to films having a thickness of 40 nanometers obtained by vacuum-deposition of each of the two or more different types of host on an ITO substrate at a vacuum degree of $10^{-7}$ torr.

20. An organic light-emitting device comprising:

a first electrode;

a second electrode facing the first electrode; and emission layers in the number of m stacked between the first electrode and the second electrode, wherein m is an integer of 2 or greater, a maximum emission wavelength of light emitted from at least one of the emission layers in the number of m differs from that of light emitted from at least one of the other emission layers, the emission layer comprises a host and a dopant, the emission layer emits a phosphorescent light, the dopant is an organometallic compound, a photoluminescence quantum yield (PLOY) of the dopant is about 0.8 or greater and about 1.0 or less, a decay time of the dopant is about 0.1 microseconds or greater and about 2.9 microseconds or less, 0.1 electron volts≤HOMO (dopant)−HOMO (host)≤about 0.4 electron volts, wherein the HOMO (dopant) represents a highest occupied molecular orbital (HOMO) energy level (expressed in electron volts) of the dopant, and the HOMO (host) represents, in a case where the host comprised in the emission layer comprises one type of host, a HOMO energy level (expressed in electron volts) of the one type of host; or in a case where the host comprised in the emission layer is a mixture of two or more different types of host, a highest HOMO energy level from among HOMO energy levels (expressed in electron volts) of the two or more different types of host, the PLQY of the dopant is a PLQY of Film 1, the decay time of the dopant is calculated from a time-resolved photoluminescence (TRPL) spectrum with respect to Film 1, Film 1 is a film having a thickness of 40 nm obtained by vacuum-deposition of the host and the dopant comprised in the emission layer in a weight ratio of 90:10 on a quartz substrate at a vacuum degree of $10^{-7}$ torr, the HOMO (dopant) is a negative value measured by using a photoelectron spectrometer in an ambient atmosphere with respect to a film having a thickness of 40 nanometers obtained by vacuum-deposition of 1,4-bis (triphenylsilyl)benzene and the dopant comprised in the emission layer in a weight ratio of 85:15 on an ITO substrate at a vacuum degree of $10^{-7}$ torr, and the HOMO (host) is, i) in a case where the host comprises one type of host, a negative value measured by using a photoelectron spectrometer in an ambient atmosphere with respect to a film having a thickness of 40 nanometers obtained by vacuum-deposition of the one type of host on an ITO substrate at a vacuum degree of $10^{-7}$ torr; or ii) in a case where the host is a mixture of two or more different types of host, a largest negative value from among negative values measured by using a photoelectron spectrometer in an ambient atmosphere with respect to films having a thickness of 40 nanometers obtained by vacuum-deposition of each of the two or more different types of host on an ITO substrate at a vacuum degree of $10^{-7}$ torr.

* * * * *